US009479234B2

(12) United States Patent
Murakami et al.

(10) Patent No.: US 9,479,234 B2
(45) Date of Patent: Oct. 25, 2016

(54) DATA PROCESSING METHOD, PRECODING METHOD, AND COMMUNICATION DEVICE

(71) Applicant: Panasonic Intellectual Property Corporation of America, Torrance, CA (US)

(72) Inventors: Yutaka Murakami, Kanagawa (JP); Tomohiro Kimura, Osaka (JP); Mikihiro Ouchi, Osaka (JP)

(73) Assignee: SUN PATENT TRUST, New York, NY (US)

( * ) Notice: Subject to any disclaimer, the term of this patent is extended or adjusted under 35 U.S.C. 154(b) by 0 days.

(21) Appl. No.: 14/859,737

(22) Filed: Sep. 21, 2015

(65) Prior Publication Data

US 2016/0013840 A1 Jan. 14, 2016

Related U.S. Application Data

(63) Continuation of application No. 14/382,879, filed as application No. PCT/JP2013/007687 on Dec. 27, 2013, now Pat. No. 9,178,650.

(30) Foreign Application Priority Data

Jan. 11, 2013 (JP) ................................ 2013-003905
Feb. 22, 2013 (JP) ................................ 2013-033353
Sep. 20, 2013 (JP) ................................ 2013-195166

(51) Int. Cl.
*H04B 7/02* (2006.01)
*H04B 7/04* (2006.01)
(Continued)

(52) U.S. Cl.
CPC ......... *H04B 7/0413* (2013.01); *H03M 13/255* (2013.01); *H04L 1/003* (2013.01);
(Continued)

(58) Field of Classification Search
CPC ... H04L 1/003; H04L 1/0057; H04L 1/0071; H04B 7/0413; H03M 13/255
USPC .......................................................... 375/267
See application file for complete search history.

(56) References Cited

U.S. PATENT DOCUMENTS 5,436,918 A 7/1995 Kato et al.
8,385,460 B2 2/2013 Ko et al.
(Continued)

FOREIGN PATENT DOCUMENTS

EP 1 804 453 7/2007
JP 2009-33696 2/2009
(Continued)

OTHER PUBLICATIONS

Extended European Search Report issued Nov. 25, 2015 in European Application No. 13870553.8.
(Continued)

*Primary Examiner* — Juan A Torres
(74) *Attorney, Agent, or Firm* — Wenderoth, Lind & Ponack, L.L.P.

(57) ABSTRACT

An encoder outputs a first bit sequence having N bits. A mapper generates a first complex signal s1 and a second complex signal s2 with use of bit sequence having X+Y bits included in an input second bit sequence, where X indicates the number of bits used to generate the first complex signal s1, and Y indicates the number of bits used to generate the second complex signal s2. A bit length adjuster is provided after the encoder, and performs bit length adjustment on the first bit sequence such that the second bit sequence has a bit length that is a multiple of X+Y, and outputs the first bit sequence after the bit length adjustment as the second bit sequence. As a result, a problem between a codeword length of a block code and the number of bits necessary to perform mapping by a set of modulation schemes is solved.

8 Claims, 133 Drawing Sheets

(51) Int. Cl.
*H03M 13/25* (2006.01)
*H04L 1/00* (2006.01)
*H04L 1/08* (2006.01)

(52) U.S. Cl.
CPC .......... *H04L 1/0003* (2013.01); *H04L 1/0057* (2013.01); *H04L 1/0067* (2013.01); *H04L 1/0071* (2013.01); *H04L 1/08* (2013.01)

(56) References Cited

U.S. PATENT DOCUMENTS

| | | | |
|---|---|---|---|
| 2003/0112888 A1 | 6/2003 | Takano et al. |
| 2007/0258641 A1 | 11/2007 | Srinivasan et al. |
| 2009/0138785 A1 | 5/2009 | Sakai et al. |
| 2010/0070828 A1 | 3/2010 | Murakami et al. |
| 2013/0159816 A1 | 6/2013 | Murakami et al. |

FOREIGN PATENT DOCUMENTS

| | | |
|---|---|---|
| JP | 2010-504012 | 2/2010 |
| JP | 2013-5124 | 1/2013 |
| WO | 00/03486 | 1/2000 |
| WO | 02/065723 | 8/2002 |
| WO | 2006/114126 | 11/2006 |
| WO | 2008/035133 | 3/2008 |

OTHER PUBLICATIONS

Ken-ichi Konishi et al., "Error-Rate Performance of Block-Coded *M*-ary Modulation and Hard Decision Decoding Systems on Rayleigh Fading Channel", Electronics and Communications in Japan, Part 1, vol. 74, No. 6, Jun. 1, 1991, pp. 97-106, XP000275285.

International Search Report issued Jan. 28, 2014 in International (PCT) Application No. PCT/JP2013/007687.

R. G. Gallager, "Low-Density Parity-Check Codes", IRE Transactions on Information Theory, IT-8, pp. 21-28, 1962.

Ben Lu et al., "Performance Analysis and Design Optimization of LDPC-Coded MIMO OFDM Systems", IEEE Transactions on Signal Processing, vol. 52, No. 2, pp. 348-361, Feb. 2004.

Catherine Douillard et al., "Turbo Codes With Rate-m/(m+1) Constituent Convolutional Codes", IEEE Transactions on Communications, vol. 53, No. 10, pp. 1630-1638, Oct. 2005.

Claude Berrou, "The Ten-Year-Old Turbo Codes are Entering into Service", IEEE Communications Magazine, vol. 41, No. 8, pp. 110-116, Aug. 2003.

DVB Document A122, Frame structure channel coding and modulation for a second generation digital terrestrial television broadcasting system (DVB-T2), Jun. 2008.

David J. C. MacKay, "Good Error-Correcting Codes Based on Very Sparse Matrices", IEEE Transactions on Information Theory, vol. 45, No. 2, pp. 399-431, Mar. 1999.

Siavash M. Alamouti, "A Simple Transmit Diversity Technique for Wireless Communications", IEEE Journal on Select Areas in Communications, vol. 16, No. 8, pp. 1451-1458, Oct. 1998.

Vahid Tarokh et al., "Space-Time Block Coding for Wireless Communications: Performance Results", IEEE Journal on Selected Areas in Communications, vol. 17, No. 3, pp. 451-460, Mar. 1999.

DATA PROCESSING METHOD, PRECODING METHOD, AND COMMUNICATION DEVICE

CROSS REFERENCE TO RELATED APPLICATION

This application is based on application No. 2013-003905 filed in Japan on Jan. 11, 2013, on application No. 2013-033353 filed in Japan on Feb. 22, 2013, and on application No. 2013-195166 filed in Japan on Sep. 20, 2013, the disclosure of which, including the specification, drawings and claims, is incorporated hereby by reference its entirety.

TECHNICAL FIELD

The present invention relates to a data processing scheme, a precoding scheme, and a communication device.

BACKGROUND ART

Conventionally, a communication scheme called MIMO (Multiple-Input Multiple-Output) has been for example used as a multi-antenna communication method.

According to multi-antenna communication method as typified by the MIMO, transmission data of one or more sequences is modulated, and modulated signals are transmitted from different antennas at the same time at the same (shared/common) frequency. This increases data reception quality and/or increases the data transfer rate (per unit time).

FIG. 72 illustrates an outline of a spatial multiplexing MIMO scheme. The MIMO scheme in the figure shows an example of configuration of a transmission device and a reception device in the case where two transmission antennas TX1 and TX2, two reception antennas RX1 and RX2, and two transmission modulated signals (transmission streams) are used.

The transmission device includes a signal generator and a wireless processing unit.

The signal generator performs channel coding on data and MIMO precoding process on the data, and thereby generates two transmission signals z1(*t*) and z2(*t*) that are transmittable at the same time at the same (shared/common) frequency. The wireless processing unit multiplexes transmission signals in the frequency domain as necessary, in other words, performs multicarrier processing on the transmission signals (by an OFDM scheme for example). Also, the wireless processing unit inserts pilot signals for the reception device to estimate channel distortion, frequency offset, phase distortion, and so on. (Note that the pilot signals may be inserted for estimation of other distortion and so on, and alternatively the pilot signals may be used by the reception device for detection of signals. The use case of the pilot signals in the reception device is not limited to these.) The two transmission antennas TX1 and TX2 transmit the transmission signals z1(*t*) and z2(*t*), respectively.

The reception device includes the reception antennas RX1 and RX2, a wireless processing unit, a channel variation estimator, and a signal processing unit. The reception antenna RX1 receives the transmitted signals which are transmitted from the two transmission antennas TX1 and TX2. The channel variation estimator estimates channel variation values using the pilot signals, and transfers the estimated channel variation values to the signal processing unit. The signal processing unit restores data included in the transmission signals z1(*t*) and z2(*t*) based on the signals received by the two reception antennas and the estimated channel variation value, and thereby obtains a single piece of reception data. Note that the reception data may have a hard-decision value of 0 or 1, and alternatively may have a soft-decision value such as a log-likelihood and a log-likelihood ratio.

Also, various types of coding schemes have been used such as turbo coding and LDPC (Low-Density Parity-Check) coding (Non-Patent Literature 1 and Non-Patent Literature 2).

CITATION LIST

Non-Patent Literature

[Non-Patent Literature 1]R. G. Gallager, “Low-density parity-check codes,” IRE Trans. Inform. Theory, IT-8, pp. 21-28, 1962

[Non-Patent Literature 2]“Performance analysis and design optimization of LDPC-coded MIMO OFDM systems” IEEE Trans. Signal Processing, vol. 52, no. 2, pp. 348-361, February 2004.

[Non-Patent Literature 3]C. Douillard, and C. Berrou, “Turbo codes with rate-m/(m+1) constituent convolutional codes”, IEEE Trans. Commun., vol. 53, no. 10, pp. 1630-1638, October 2005.

[Non-Patent Literature 4]C. Berrou, “The ten-year-old turbo codes are entering into service”, IEEE Communication Magazine, vol. 41, no. 8, pp. 110-116, August 2003.

[Non-Patent Literature 5] DVB Document A122, Frame structure, channel coding and modulation for a second generation digital terrestrial television broadcasting system (DVB-T2), June 2008.

[Non-Patent Literature 6]D. J. C. Mackay, “Good error-correcting codes based on very sparse matrices”, IEEE Trans. Inform. Theory, vol. 45, no. 2, pp. 399-431. March 1999.

[Non-Patent Literature 7]S. M. Alamouti, “A simple transmit diversity technique for wireless communications”, IEEE J. Select. Areas Commun., vol. 16, no. 8, pp. 1451-1458, October 1998.

[Non-Patent Literature 8]V. Tarokh, H. Jafarkhani, and A. R. Calderbank, “Space-time block coding for wireless communications: Performance results”, IEEE J. Select. Areas Commun., vol. 17, no. 3, pp. 451-460, March 1999.

SUMMARY OF INVENTION

Technical Problem

The present invention aims to solve a problem to implement the MIMO scheme in the case where a coding scheme such as the LDPC coding is applied.

Solution to Problem

A data processing scheme relating to the present invention comprising: an encoding step of outputting a first bit sequence that is an N-bit codeword from a K-bit information bit sequence; a mapping step of generating a first complex signal s1 and a second complex signal s2 with use of a bit sequence having X+Y bits included in an input second bit sequence, where X indicates the number of bits used to generate the first complex signal s1, and Y indicates the number of bits used to generate the second complex signal s2; and a bit length adjustment step of after the encoding step and before the mapping step, performing bit length adjustment on the first bit sequence such that the second bit sequence has a bit length that is a multiple of X+Y, and outputting the first bit sequence after the bit length adjustment as the second bit sequence.

Advantageous Effects of Invention

According to the data processing scheme relating to the present invention, it is possible to contribute to the problem to implement the MIMO scheme in the case where a coding scheme such as the LDPC coding is applied.

BRIEF DESCRIPTION OF DRAWINGS

FIG. 120 shows an example of constellation of signal points for 64QAM in the I-Q plane.

FIG. 121 shows an example of constellation of signal points for 256QAM in the I-Q plane.

FIG. 122 shows an example of configuration of a transmission device.

FIG. 123 shows an example of frame structure.

FIG. 124 shows an example of configuration of a reception device.

FIG. 125 shows an example of configuration of a transmission device.

FIG. 126 shows an example of frame structure.

FIG. 127 shows an example of configuration of a reception device.

FIG. 128 illustrates a transmission scheme that uses space-time block codes.

FIG. 129 shows an example of configuration of a transmission device.

FIG. 130 shows an example of configuration of a transmission device.

FIG. 131 shows an example of configuration of a transmission device.

Figure 132:
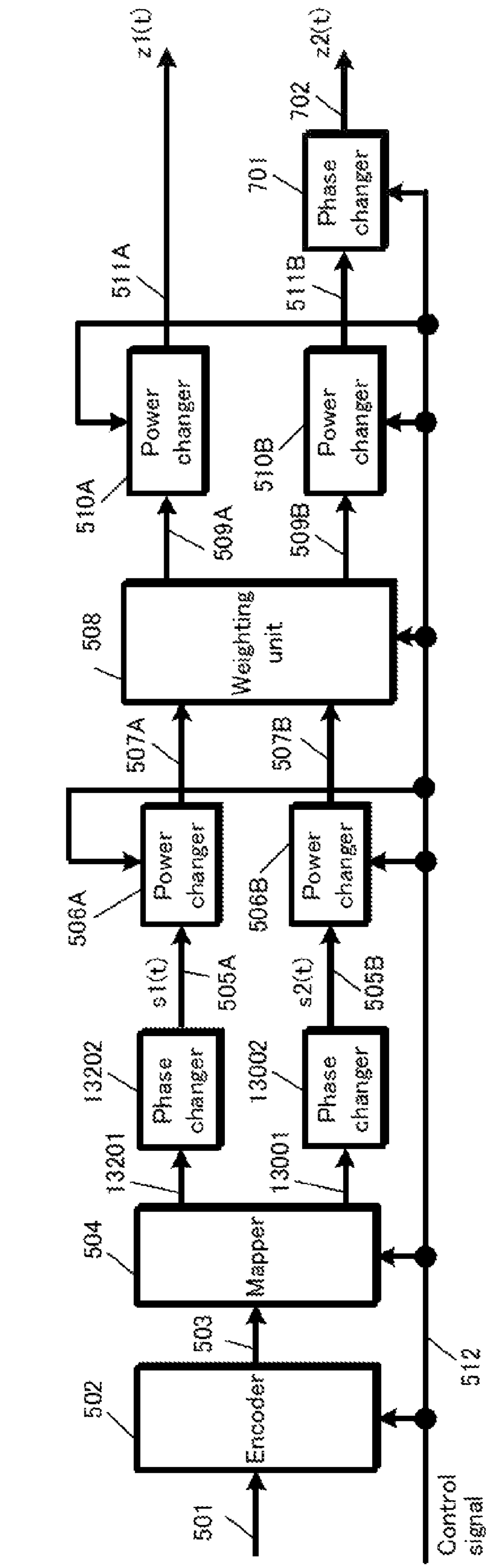

FIG. 132 shows an example of configuration of a transmission device.

Figure 133:
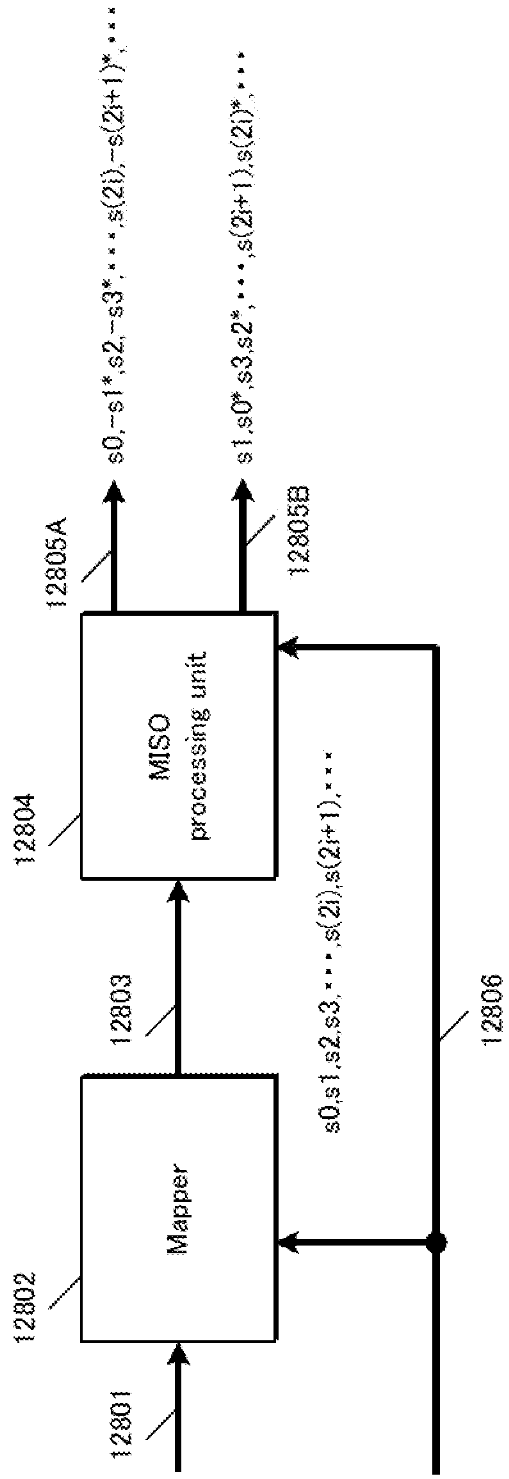

FIG. 133 illustrates a transmission scheme that uses space-time block codes.

DESCRIPTION OF EMBODIMENTS

Prior to explanation of each embodiment of the invention of the present application, the following describes a transmission scheme and a reception scheme to which the invention described later in each embodiment is applicable, and examples of configurations of a transmission device and a reception device using the schemes.

Configuration Example R1

Figure 5:
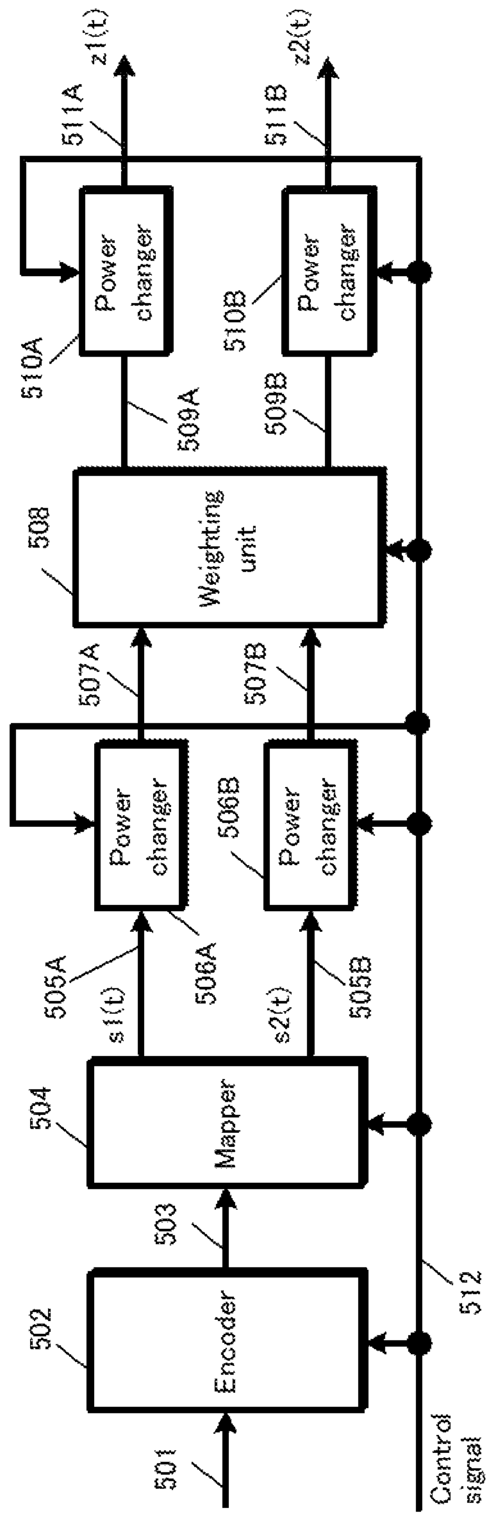
FIG. 5 shows an example of configuration of a transmission device.

FIG. 5 shows one example of a configuration of a part of a transmission device in a base station (e.g. a broadcasting station and an access point) for generating modulated signals when a transmission scheme is switchable.

In this configuration example, a transmission scheme for transmitting two streams (a MIMO (Multiple Input Multiple Output) scheme) is used as one transmission scheme that is switchable.

A transmission scheme used when the transmission device in the base station (e.g. the broadcasting station and the access point) transmits two streams is described with use of FIG. 5.

An encoder 502 in FIG. 5 receives information 501 and a control signal 512 as inputs, performs encoding based on information on a coding rate and a code length (block length) included in the control signal 512, and outputs encoded data 503.

A mapper 504 receives the encoded data 503 and the control signal 512 as inputs. The control signal 512 is assumed to designate the transmission scheme for transmitting two streams. In addition, the control signal 512 is assumed to designate modulation schemes $\alpha$ and $\beta$ as modulation schemes for modulating the two streams. The modulation schemes $\alpha$ and $\beta$ are modulation schemes for modulating x-bit data and y-bit data, respectively (for example, a modulation scheme for modulating 4-bit data in the case of using 16QAM (16 Quadrature Amplitude Modulation), and a modulation scheme for modulating 6-bit data in the case of using 64QAM (64 Quadrature Amplitude Modulation)).

The mapper 504 modulates x-bit data of (x+y)-bit data by using the modulation scheme $\alpha$ to generate a baseband signal $s_1(t)$ (505A), and outputs the baseband signal $s_1(t)$. The mapper 504 modulates remaining y-bit data of the (x+y)-bit data by using the modulation scheme $\beta$, and outputs a baseband signal $s_2(t)$ (505B) (In FIG. 5, the number of mappers is one. As another configuration, however, a mapper for generating $s_1(t)$ and a mapper for generating $s_2(t)$ may separately be provided. In this case, the encoded data 503 is distributed to the mapper for generating $s_1(t)$ and the mapper for generating $s_2(t)$).

Note that $s_1(t)$ and $s_2(t)$ are expressed in complex numbers ($s_1(t)$ and $s_2(t)$, however, may be either complex numbers or real numbers), and t is a time. When a transmission scheme, such as OFDM (Orthogonal Frequency Division Multiplexing), of using multi-carriers is used, $s_1$ and $s_2$ may be considered as functions of a frequency f, which are expressed as $s_1(f)$ and $s_2(f)$, and as functions of the time t and the frequency f, which are expressed as $s_1(t,f)$ and $s_2(t,f)$.

Hereinafter, the baseband signals, precoding matrices, and phase changes are described as functions of the time t, but may be considered as the functions of the frequency for the functions of the time t and the frequency f.

Thus, the baseband signals, the precoding matrices, and the phase changes can also be described as functions of a symbol number i, but, in this case, may be considered as the functions of the time t, the functions of the frequency f, or the functions of the time t and the frequency f. That is to say, symbols and baseband signals may be generated and arranged in a time domain, and may be generated and arranged in a frequency domain. Alternatively, symbols and baseband signals may be generated and arranged in the time domain and in the frequency domain.

A power changer 506A (a power adjuster 506A) receives the baseband signal $s_1(t)$ (505A) and the control signal 512 as inputs, sets a real number $P_1$ based on the control signal 512, and outputs $P_1 \times s_1(t)$ as a power-changed signal 507A (although $P_1$ is described as a real number, $P_1$ may be a complex number).

Similarly, a power changer 506B (a power adjuster 506B) receives the baseband signal $s_2(t)$ (505B) and the control signal 512 as inputs, sets a real number $P_2$, and outputs $P_2 \times s_2(t)$ as a power-changed signal 507B (although $P_2$ is described as a real number, $P_2$ may be a complex number).

A weighting unit 508 receives the power-changed signals 507A and 507B, and the control signal 512 as inputs, and sets a precoding matrix F or F(i) based on the control signal 512. Letting a slot number (symbol number) be i, the weighting unit 508 performs the following calculation.

[Math. 1]

$$\begin{pmatrix} u_1(i) \\ u_2(i) \end{pmatrix} = F\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(formula R1)}$$

Here, a(i), b(i), c(i), and d(i) can be expressed in complex numbers (may be real numbers), and the number of zeros among a(i), b(i), c(i), and d(i) should not be three or more. The precoding matrix may or may not be the function of i. When the precoding matrix is the function of i, the precoding matrix is switched for each slot number (symbol number).

The weighting unit 508 outputs $u_1(i)$ in formula R1 as a weighted signal 509A, and outputs $u_2(i)$ in formula R1 as a weighted signal 509B.

A power changer 510A receives the weighted signal 509A ($u_1(i)$) and the control signal 512 as inputs, sets a real number $Q_1$ based on the control signal 512, and outputs $Q_1 \times u_1(t)$ as a power-changed signal 511A ($z_1(i)$) (although $Q_1$ is described as a real number, $Q_1$ may be a complex number).

Similarly, a power changer 510B receives the weighted signal 509B ($u_2(i)$) and the control signal 512 as inputs, sets a real number $Q_2$ based on the control signal 512, and outputs $Q_2 \times u_2(t)$ as a power-changed signal 511B ($z_2(i)$) (although $Q_2$ is described as a real number, $Q_2$ may be a complex number).

Thus, the following formula is satisfied.

[Math. 2]

$$\begin{pmatrix} z_1(i) \\ z_2(i) \end{pmatrix} = \begin{pmatrix} Q_1 & 0 \\ 0 & Q_2 \end{pmatrix} F\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 \times s_1(i) \\ P_2 \times s_2(i) \end{pmatrix} = \begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 & 0 \\ 0 & P_2 \end{pmatrix}\begin{pmatrix} s_1(i) \\ s_2(i) \end{pmatrix} \quad \text{(formula R2)}$$

Figure 6:
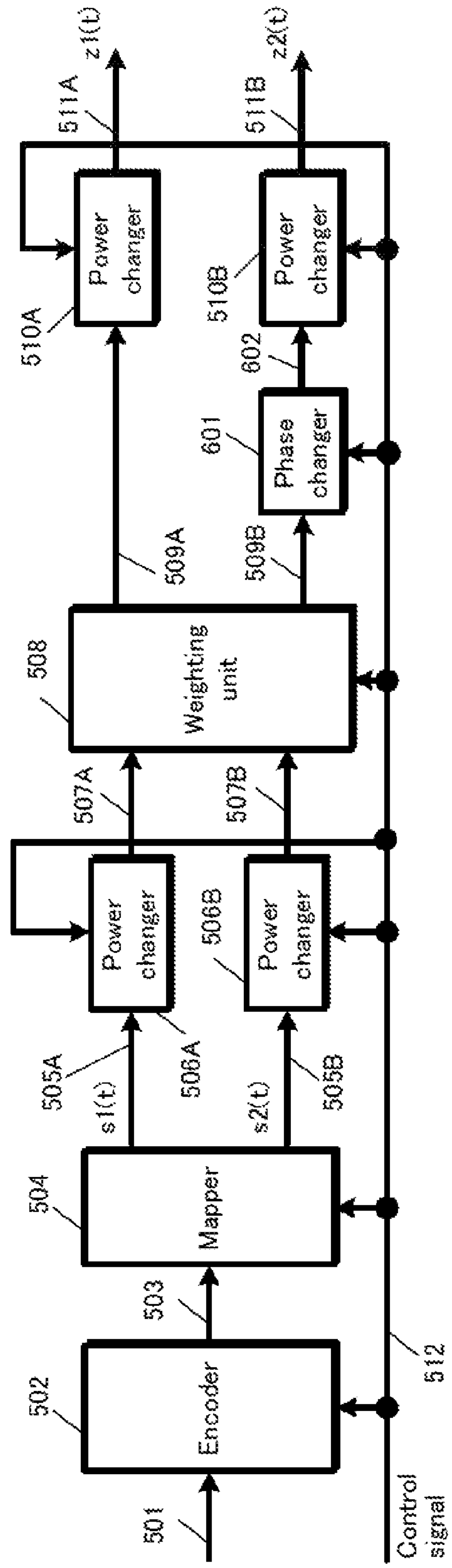
FIG. 6 shows an example of configuration of a transmission device.

A different transmission scheme for transmitting two streams than that shown in FIG. 5 is described next, with use of FIG. 6. In FIG. 6, components operating in a similar manner to those shown in FIG. 5 bear the same reference signs.

A phase changer 601 receives $u_2(i)$ in formula R1, which is the weighted signal 509B, and the control signal 512 as inputs, and performs phase change on $u_2(i)$ in formula R1, which is the weighted signal 509B, based on the control signal 512. A signal obtained after phase change on $u_2(i)$ in formula R1, which is the weighted signal 509B, is thus expressed as $e^{j\theta(i)}\times u_2(i)$, and a phase changer 601 outputs $e^{j\theta(i)}\times u_2(i)$ as a phase-changed signal 602 (j is an imaginary unit). A characterizing portion is that a value of changed phase is a function of i, which is expressed as θ(i).

The power changers 510A and 510B in FIG. 6 each perform power change on an input signal. Thus, $z_1(i)$ and $z_2(i)$, which are respectively outputs of the power changers 510A and 510B in FIG. 6, are expressed by the following formula.

[Math. 3]

$$\begin{aligned}\begin{pmatrix} z_1(i) \\ z_2(i) \end{pmatrix} &= \begin{pmatrix} Q_1 & 0 \\ 0 & Q_2 \end{pmatrix}\begin{pmatrix} 1 & 0 \\ 0 & e^{j\theta(i)} \end{pmatrix} F\begin{pmatrix} P_1\times s_1(i) \\ P_2\times s_2(i) \end{pmatrix} \\ &= \begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a(i) & b(i) \\ c(i) & d(i) \end{pmatrix}\begin{pmatrix} P_1\times s_1(i) \\ P_2\times s_2(i) \end{pmatrix} \\ &= \begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a(i) & b(i) \\ c(i) & d(i) \end{pmatrix}\begin{pmatrix} P_1 & 0 \\ 0 & P_2 \end{pmatrix} \\ &\quad \begin{pmatrix} s_1(i) \\ s_2(i) \end{pmatrix}\end{aligned} \quad \text{(formula R3)}$$

Figure 7:
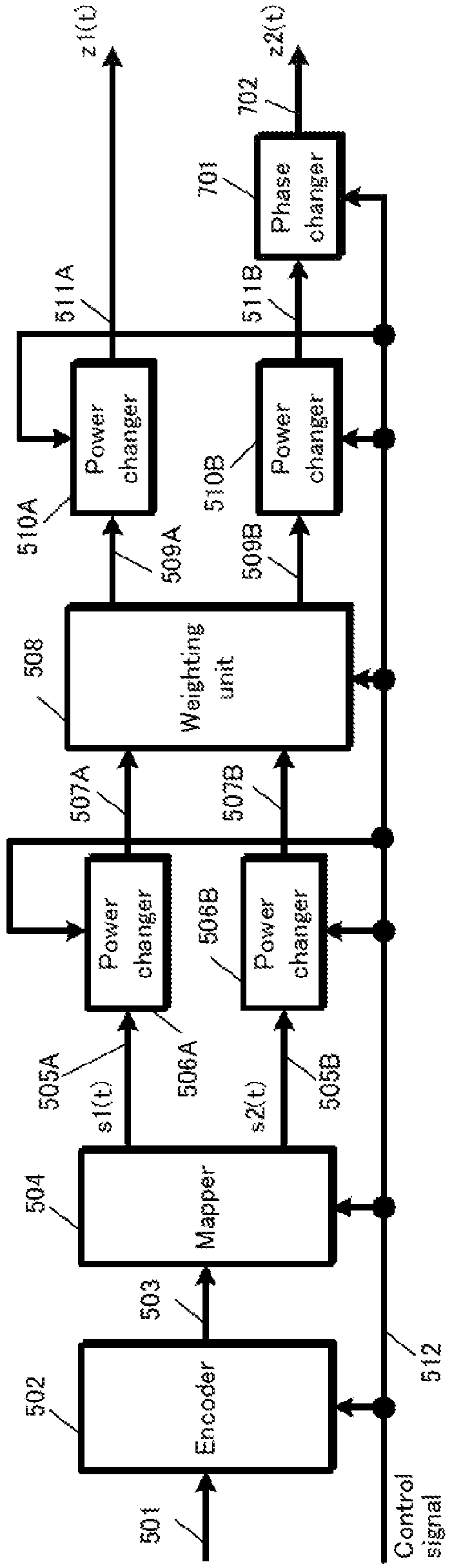
FIG. 7 shows an example of configuration of a transmission device.

FIG. 7 shows a different scheme for achieving formula R3 than that shown in FIG. 6. FIG. 7 differs from FIG. 6 in that the order of the power changer and the phase changer is switched. In other words, the phase changer 701 receives, as inputs, a power-changed signal 511B and a control signal 512, performs phase change on the power-changed signal 511B, and outputs a phase-changed signal 702 (the functions to perform power change and phase change themselves remain unchanged). In this case, $z_1(i)$ and $z_2(i)$ are expressed by the following formula.

[Math. 4]

$$\begin{aligned}\begin{pmatrix} z_1(i) \\ z_2(i) \end{pmatrix} &= \begin{pmatrix} 1 & 0 \\ 0 & e^{j\theta(i)} \end{pmatrix}\begin{pmatrix} Q_1 & 0 \\ 0 & Q_2 \end{pmatrix} F\begin{pmatrix} P_1\times s_1(i) \\ P_2\times s_2(i) \end{pmatrix} \\ &= \begin{pmatrix} 1 & 0 \\ 0 & e^{j\theta(i)} \end{pmatrix}\begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1\times s_1(i) \\ P_2\times s_2(i) \end{pmatrix} \\ &= \begin{pmatrix} 1 & 0 \\ 0 & e^{j\theta(i)} \end{pmatrix}\begin{pmatrix} Q_1 & 0 \\ 0 & Q_2 \end{pmatrix}\begin{pmatrix} a(i) & b(i) \\ c(i) & d(i) \end{pmatrix}\begin{pmatrix} P_1 & 0 \\ 0 & P_2 \end{pmatrix} \\ &\quad \begin{pmatrix} s_1(i) \\ s_2(i) \end{pmatrix}\end{aligned} \quad \text{(formula R4)}$$

Note that $z_1(i)$ in formula R3 is equal, to $z_1(i)$ in formula R4, and $z_2(i)$ in formula R3 is equal to $z_2(i)$ in formula R4.

When a value θ(i) of changed phase in formulas R3 and R4 is set such that θ(i+1)−θ(i) is a fixed value, for example, reception devices are likely to obtain high data reception quality in a radio-wave propagation environment where direct waves are dominant. How to give the value θ(i) of changed phase, however, is not limited to the above-mentioned example.

Figure 8:
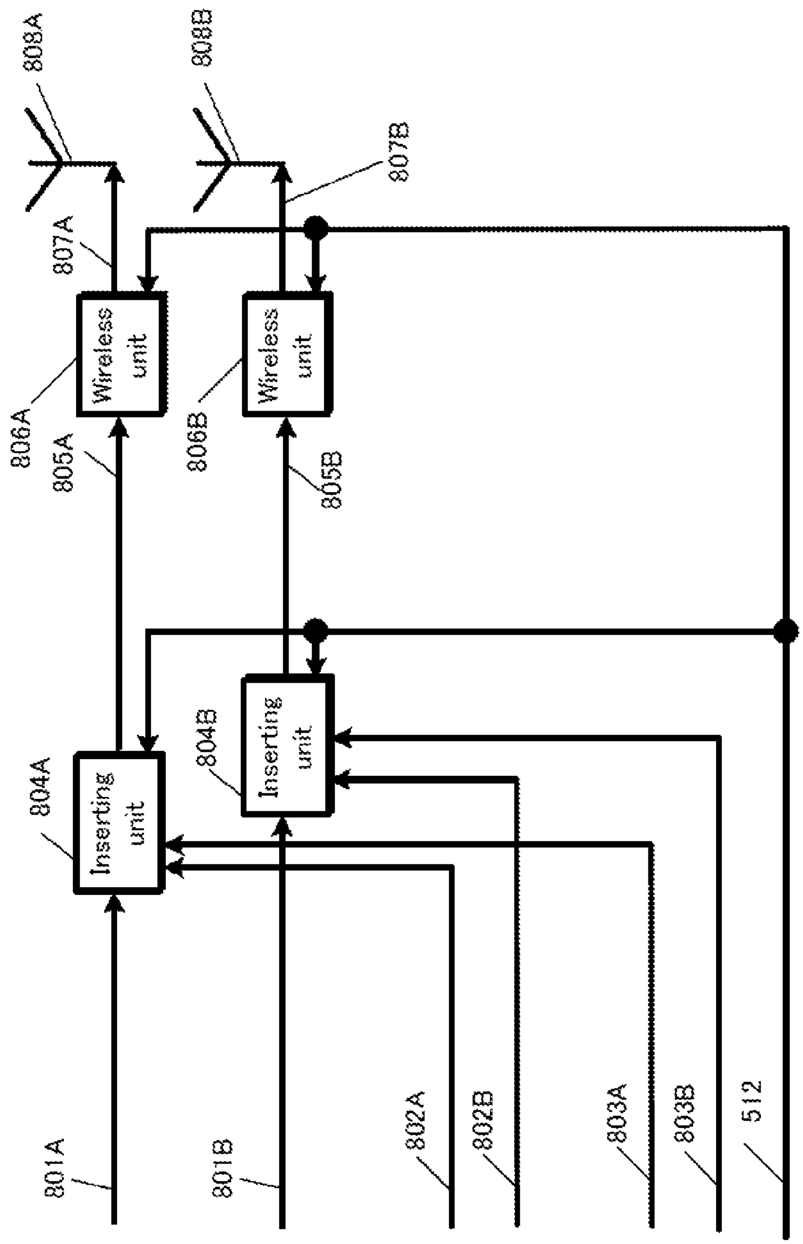
FIG. 8 shows an example of configuration of a signal processor.

FIG. 8 shows one example of a configuration of a signal processing unit for performing processing on the signals $z_1(i)$ and $z_2(i)$, which are obtained in FIGS. 5-7.

An inserting unit 804A receives the signal $z_1(i)$ (801A), a pilot symbol 802A, a control information symbol 803A, and the control signal 512 as inputs, inserts the pilot symbol 802A and the control information symbol 803A into the signal (symbol) $z_1(i)$ (801A) in accordance with a frame structure included in the control signal 512, and outputs a modulated signal 805A in accordance with the frame structure.

The pilot symbol 802A and the control information symbol 803A are symbols having been modulated by using a modulation scheme such as BPSK (Binary Phase Shift Keying) and QPSK (Quadrature Phase Shift Keying). Note that the other modulation schemes may be used.

The wireless unit 806A receives the modulated signal 805A and the control signal 512 as inputs, performs processing such as frequency conversion and amplification on the modulated signal 805A based on the control signal 512 (processing such as inverse Fourier transformation is performed when the OFDM scheme is used), and outputs the transmission signal 807A. The transmission signal 807A is output from the antenna 808A as a radio wave.

An inserting unit 804B receives the signal $z_2(i)$ (801B), a pilot symbol 802B, a control information symbol 803B, and the control signal 512 as inputs, inserts the pilot symbol 802B and the control information symbol 803B into the signal (symbol) $z_2(i)$ (801B) in accordance with a frame structure included in the control signal 512, and outputs a modulated signal 805B in accordance with the frame structure.

The pilot symbol 802B and the control information symbol 803B are symbols having been modulated by using a modulation scheme such as BPSK (Binary Phase Shift Keying) and QPSK (Quadrature Phase Shift Keying). Note that the other modulation schemes may be used.

A wireless unit 806B receives the modulated signal 805B and the control signal 512 as inputs, performs processing such as frequency conversion and amplification on the modulated signal 805B based on the control signal 512 (processing such as inverse Fourier transformation is performed when the OFDM scheme is used), and outputs a transmission signal 807B. The transmission signal 807B is output from an antenna 808B as a radio wave.

In this case, when i is set to the same number in the signal $z_1(i)$ (801A) and the signal $z_2(i)$ (801B), the signal $z_1(i)$ (801A) and the signal $z_2(i)$ (801B) are transmitted from different antennas at the same (shared/common) frequency at the same time (i.e., transmission is performed by using the MIMO scheme).

The pilot symbol 802A and the pilot symbol 802B are each a symbol for performing signal detection, frequency offset estimation, gain control, channel estimation, etc. in the reception device. Although referred to as a pilot symbol, the pilot symbol may be referred to as a reference symbol, or the like.

The control information symbol 803A and the control information symbol 803B are each a symbol for transmitting, to the reception device, information on a modulation scheme, a transmission scheme, a precoding scheme, an error correction coding scheme, and a coding rate and a block length (code length) of an error correction code each used by the transmission device. The control information symbol may be transmitted by using only one of the control information symbol 803A and the control information symbol 803B.

Figure 9:
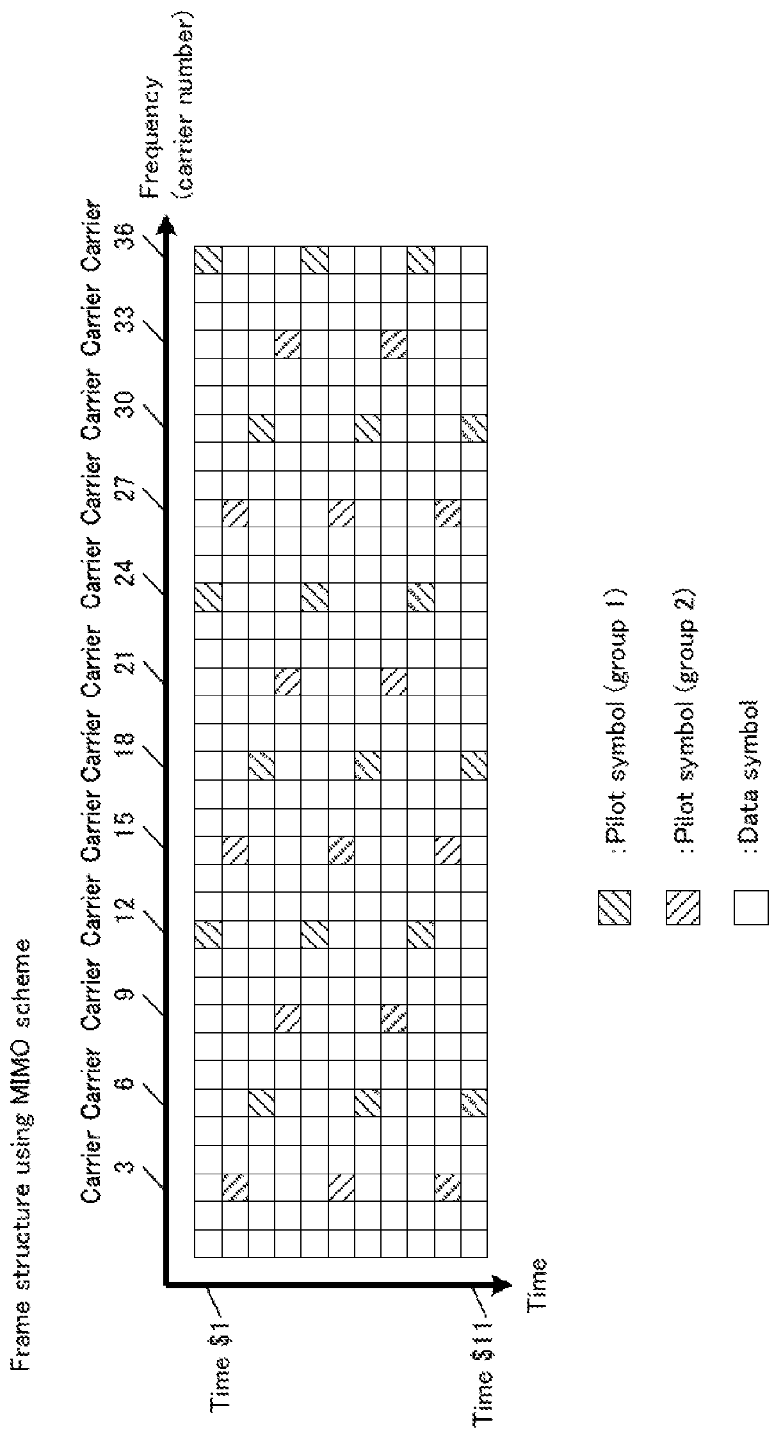
FIG. 9 shows an example of frame structure.

FIG. 9 shows one example of a frame structure in a time-frequency domain when two streams are transmitted. In FIG. 9, the horizontal and vertical axes respectively represent a frequency and a time. FIG. 9 shows the structure of symbols in a range of carrier 1 to carrier 38 and time $1 to time $11.

FIG. 9 shows the frame structure of the transmission signal transmitted from the antenna 806A and the frame structure of the transmission signal transmitted from the antenna 808B in FIG. 8 together.

In FIG. 9, in the case of a frame of the transmission signal transmitted from the antenna 806A in FIG. 8, a data symbol corresponds to the signal (symbol) $z_1(i)$. A pilot symbol corresponds to the pilot symbol 802A.

In FIG. 9, in the case of a frame of the transmission signal transmitted from the antenna 806B in FIG. 8, a data symbol corresponds to the signal (symbol) $z_2(i)$. A pilot symbol corresponds to the pilot symbol 802B.

Therefore, as set forth above, when i is set to the same number in the signal $z_1(i)$ (801A) and the signal $z_2(i)$ (801B), the signal $z_1(i)$ (801A) and the signal $z_2(i)$ (801B) are transmitted from different antennas at the same (shared/common) frequency at the same time. The structure of the pilot symbols is not limited to that shown in FIG. 9. For example, time intervals and frequency intervals of the pilot symbols are not limited to those shown in FIG. 9. The frame structure in FIG. 9 is such that pilot symbols are transmitted from the antennas 806A and 806B in FIG. 8 at the same time at the same frequency (the same (sub)carrier). The frame structure, however, is not limited to that shown in FIG. 9. For example, the frame structure may be such that pilot symbols are arranged at the antenna 806A in FIG. 8 and no pilot symbols are arranged at the antenna 806B in FIG. 8 at a time A at a frequency a ((sub)carrier a), and no pilot symbols are arranged at the antenna 806A in FIG. 8 and pilot symbols are arranged at the antenna 806B in FIG. 8 at a time B at a frequency b ((sub)carrier b).

Although only data symbols and pilot symbols are shown in FIG. 9, other symbols, such as control information symbols, may be included in a frame.

Description has been made so far on a case where one or more (or all) of the power changers exist, with use of FIGS. 5-7. However, there are cases where one or more of the power changers do not exist.

For example, in FIG. 5, when the power changer (power adjuster) 506A and the power changer (power adjuster) 506B do not exist, $z_1(i)$ and $z_2(i)$ are expressed as follows.

[Math. 5]

$$\begin{pmatrix} z_1(i) \\ z_2(i) \end{pmatrix} = \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula R5)}$$

In FIG. 5, when the power changer (power adjuster) 510A and the power changer (power adjuster) 510B do not exist, $z_1(i)$ and $z_2(i)$ are expressed as follows.

[Math. 6]

$$\begin{pmatrix} z_1(i) \\ z_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula R6)}$$

In FIG. 5, when the power changer (power adjuster) 506A, the power changer (power adjuster) 506B, the power changer (power adjuster) 510A, and the power changer (power adjuster) 510B do not exist, $z_1(i)$ and $z_2(i)$ are expressed as follows.

[Math. 7]

$$\begin{pmatrix} z_1(i) \\ z_2(i) \end{pmatrix} = \begin{pmatrix} a(i) & b(i) \\ c(i) & d(i) \end{pmatrix} \begin{pmatrix} s_1(i) \\ s_2(i) \end{pmatrix} \quad \text{(formula R7)}$$

For example, in FIGS. 6 and 7, when the power changer (power adjuster) 506A and the power changer (power adjuster) 506B do not exist, $z_1(i)$ and $z_2(i)$ are expressed as follows.

[Math. 8]

$$\begin{aligned} \begin{pmatrix} z_1(i) \\ z_2(i) \end{pmatrix} &= \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \\ &= \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \end{aligned} \quad \text{(formula R8)}$$

In FIGS. 6 and 7, when the power changer (power adjuster) 510A and the power changer (power adjuster) 510B do not exist, $z_1(i)$ and $z_2(i)$ are expressed as follows.

[Math. 9]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula R9)}$$

In FIGS. 6 and 7, when the power changer (power adjuster) 506A, the power changer (power adjuster) 506B, the power changer (power adjuster) 510A, and the power changer (power adjuster) 510B do not exist, $z_1(i)$ and $z_2(i)$ are expressed as follows.

[Math. 10]

$$\begin{pmatrix} z_1(i) \\ Z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula R10)}$$

The following describes a mapping scheme for QPSK, 16QAM, 64QAM, and 256QAM, as an example of a mapping scheme in a modulation scheme for generating the baseband signal $s_1(t)$ (505A) and the baseband signal $s_2(t)$ (505B).

Figure 1:
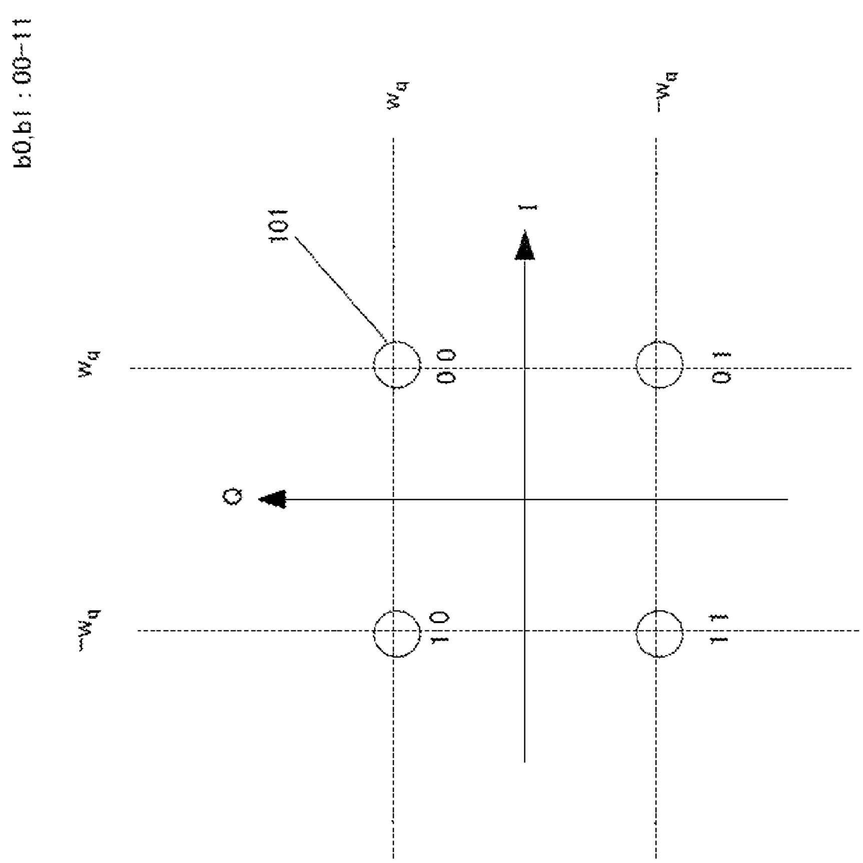
FIG. 1 shows an example of constellation of signal points for QPSK in an I-Q plane.

A mapping scheme for QPSK is described below. FIG. 1 shows an example of signal point constellation for QPSK in an I (in-phase)-Q (quadrature(-phase)) plane. In FIG. 1, four circles represent signal points for QPSK, and the horizontal and vertical axes respectively represent I and Q.

Coordinates of the four signal points (i.e., the circles in FIG. 1) for QPSK in the I (in-phase)-Q (quadrature(-phase)) plane are $(w_q, w_q)$, $(-w_q, w_q)$, $(w_q, -w_q)$, and $(-w_q, -w_q)$, where $w_q$ is a real number greater than 0.

Here, transmitted bits (input bits) are represented by b0 and b1. For example, when (b0, b1)=(0, 0) for the transmitted bits, mapping is performed to a signal point 101 in FIG. 1. When an in-phase component and a quadrature component of a baseband signal obtained as a result of mapping are respectively represented by I and Q, $(I, Q)=(w_q, w_q)$ is satisfied.

That is to say, the in-phase component I and the quadrature component Q of the baseband signal obtained as a result of mapping (at the time of QPSK modulation) are determined based on the transmitted bits (b0, b1). One example of a relationship between values (00-11) of a set of b0 and b1 and coordinates of signal points is as shown in FIG. 1. The values 00-11 of the set of b0 and b1 are shown directly below the four signal points (i.e., the circles in FIG. 1) for QPSK, which are $(w_q,w_q)$, $(-w_q,w_q)$, $(w_q,-w_q)$, and $(-w_q,-w_q)$. Coordinates, in the I (in-phase)-Q (quadrature (-phase)) plane, of the signal points (i.e., the circles) directly above the values 00-11 of the set of b0 and b1 indicate the in-phase component I and the quadrature component Q of the baseband signal obtained as a result of mapping. The relationship between the values (00-11) of the set of b0 and b1 for QPSK and coordinates of the signal points is not limited to that shown in FIG. 1. Values obtained by expressing the in-phase component I and the quadrature component Q of the baseband signal obtained as a result of mapping (at the time of QPSK modulation) in complex numbers correspond to the baseband signal ($s_1(t)$ or $s_2(t)$).

Figure 2:
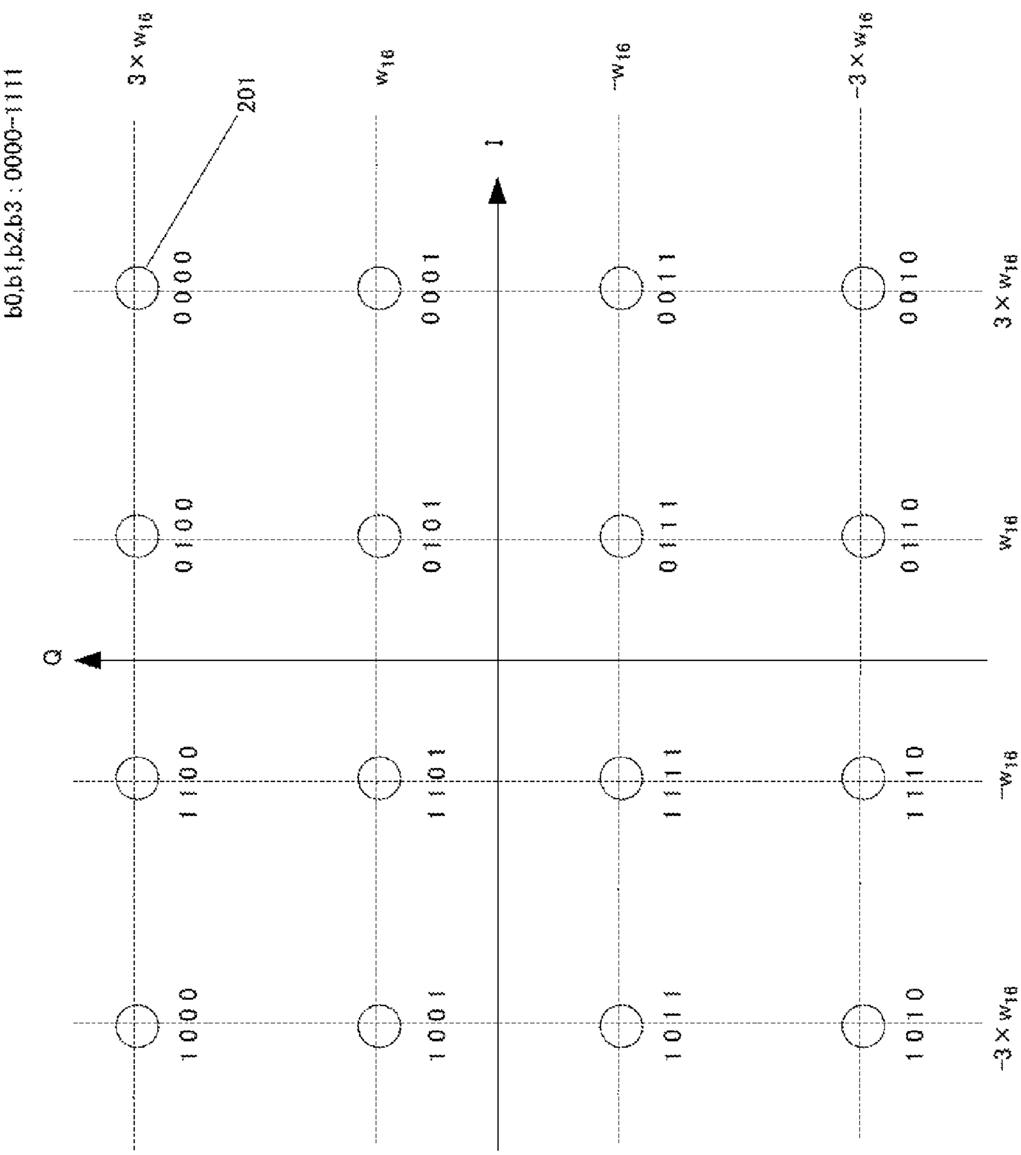
FIG. 2 shows an example of constellation of signal points for 16QAM in the I-Q plane.

A mapping scheme for 16QAM is described below. FIG. 2 shows an example of signal point constellation for 16QAM in the I (in-phase)-Q (quadrature(-phase)) plane. In FIG. 2, 16 circles represent signal points for 16QAM, and the horizontal and vertical axes respectively represent I and Q.

Coordinates of the 16 signal points (i.e., the circles in FIG. 2) for 16QAM in the I (in-phase)-Q (quadrature(-phase)) plane are $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$, where $w_{16}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to a signal point 201 in FIG. 2. When an in-phase component and a quadrature component of the baseband signal obtained as a result of mapping are respectively represented by I and Q, $(I, Q)=(3w_{16}, 3w_{16})$ is satisfied.

That is to say, the in-phase component I and the quadrature component Q of the baseband signal obtained as a result of mapping (at the time of using 16QAM) are determined based on the transmitted bits (b0, b1, b2, b3). One example of a relationship between values (0000-1111) of a set of b0, b1, b2, and b3 and coordinates of signal points is as shown in FIG. 2. The values 0000-1111 of the set of b0, b1, b2, and b3 are shown directly below the 16 signal points (i.e., the circles in FIG. 2) for 16QAM, which are $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$. Coordinates, in the I (in-phase)-Q (quadrature(-phase)) plane, of the signal points (i.e., the circles) directly above the values 0000-1111 of the set of b0, b1, b2, and b3 indicate the in-phase component I and the quadrature component Q of the baseband signal obtained as a result of mapping. The relationship between the values (0000-1111) of the set of b0, b1, b2, and b3 for 16QAM and coordinates of signal points is not limited to that shown in FIG. 2. Values obtained by expressing the in-phase component I and the quadrature component Q of the baseband signal obtained as a result of mapping (at the time of using 16QAM) in complex numbers correspond to the baseband signal ($s_1(t)$ or $s_2(t)$).

Figure 3:
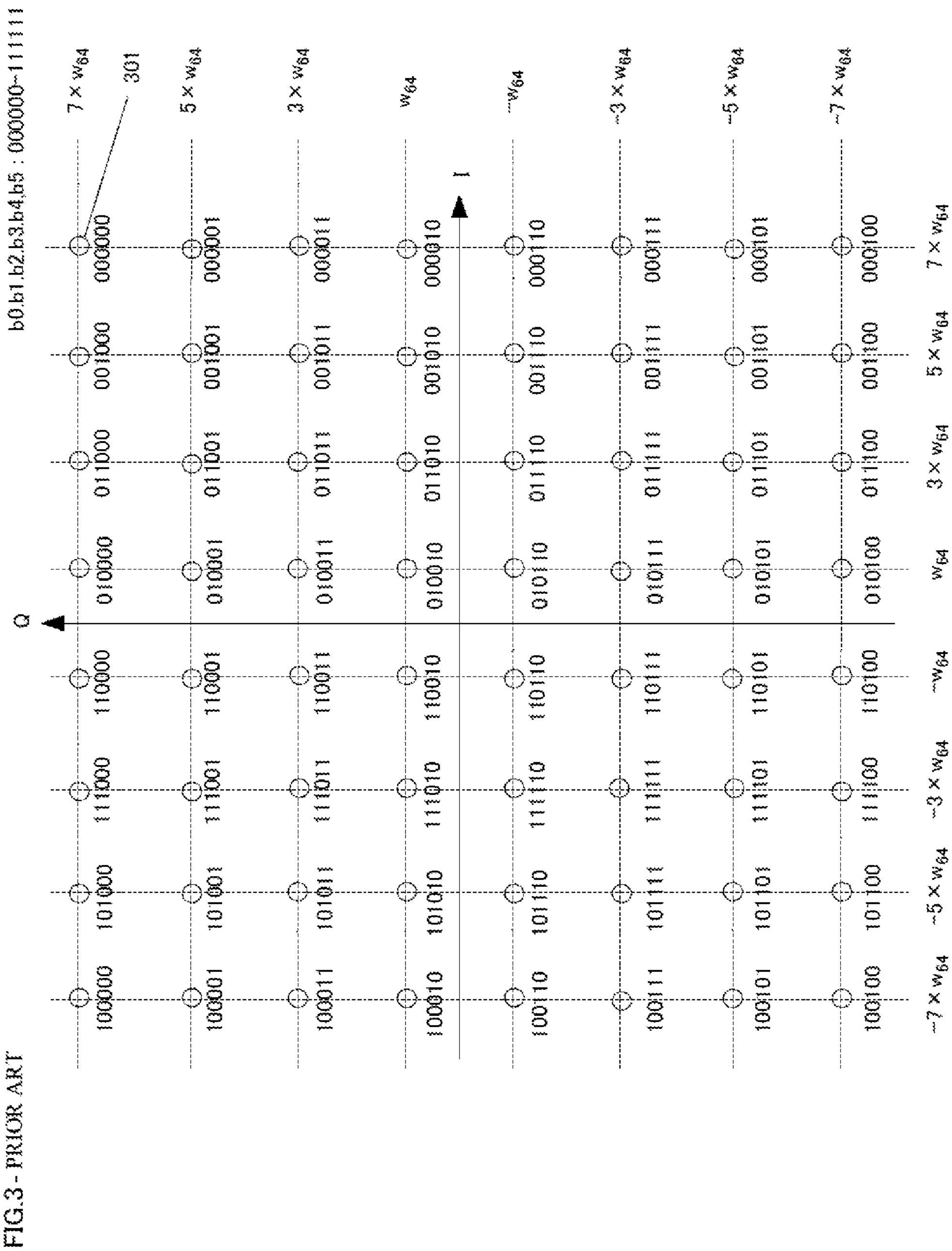
FIG. 3 shows an example of constellation of signal points for 64QAM in the I-Q plane.

A mapping scheme for 64QAM is described below. FIG. 3 shows an example of signal point constellation for 64QAM in the I (in-phase)-Q (quadrature(-phase)) plane. In FIG. 3, 64 circles represent signal points for 64QAM, and the horizontal and vertical axes respectively represent I and Q.

Coordinates of the 64 signal points (i.e., the circles in FIG. 3) for 64QAM in the I (in-phase)-Q (quadrature(-phase)) plane are $(7w_{64},7w_{64})$, $(7w_{64},5w_{64})$, $(7w_{64},3w_{64})$, $(7w_{64},w_{64})$, $(7w_{64}-w_{64})$, $(7w_{64},-3w_{64})$, $(7w_{64},-5w_{64})$, $(7w_{64},-7w_{64})$, $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$, $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$, $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$, $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$, $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$, $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$, $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$, where $w_{64}$ is a real number greater than 0.

Here, transmitted bits (input bits) are represented by b0, b1, b2, b3, b4, and b5. For example, when (b0, b1, b2, b3, b4, b5)=(0, 0, 0, 0, 0, 0) for the transmitted bits, mapping is performed to a signal point 301 in FIG. 3. When an in-phase component and a quadrature component of the baseband signal obtained as a result of mapping are respectively represented by I and Q, $(I, Q)=(7w_{64}, 7w_{64})$ is satisfied.

That is to say, the in-phase component I and the quadrature component Q of the baseband signal obtained as a result of mapping (at the time of using 64QAM) are determined based on the transmitted bits (b0, b1, b2, b3, b4, b5). One example of a relationship between values (000000-111111) of a set of b0, b1, b2, b3, b4, and b5 and coordinates of signal points is as shown in FIG. 3. The values 000000-111111 of the set of b0, b1, b2, b3, b4, and b5 are shown directly below the 64 signal points (i.e., the circles in FIG. 3) for 64QAM, which are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$, $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$, $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$, $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$, $(-w_{64},7w_{64})$, $(-w_{64},5w_{64})$, $(-w_{64}3w_{64})$, $(-w_{64},w_{64})$ $(-w_{64},-w_{64})$, $(-w_{64},-3w_{64})$, $(-w_{64},-5w_{64})$, $(-w_{64},-7w_{64})$, $(-3w_{64},7w_{64})$, $(-3w_{64},5w_{64})$, $(-3w_{64},3w_{64})$, $(-3w_{64},-w_{64})$, $(-3w_{64},-3w_{64})$, $(-3w_{64},-5w_{64})$, $(-3w_{64},-7w_{64})$, $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$, $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$. Coordinates, in the I (in-phase)-Q (quadrature(-phase)) plane, of the signal points (i.e., the circles)

directly above the values 000000-111111 of the set of b0, b1, b2, b3, b4, and b5 indicate the in-phase component I and the quadrature component Q of the baseband signal obtained as a result of mapping. The relationship between the values (000000-111111) of the set of b0, b1, b2, b3, b4, and b5 for 64QAM and coordinates of signal points is not limited to that shown in FIG. 3. Values obtained by expressing the in-phase component I and the quadrature component Q of the baseband signal obtained as a result of mapping (at the time of using 64QAM) in complex numbers correspond to the baseband signal ($s_1(t)$ or $s_2(t)$).

Figure 4:
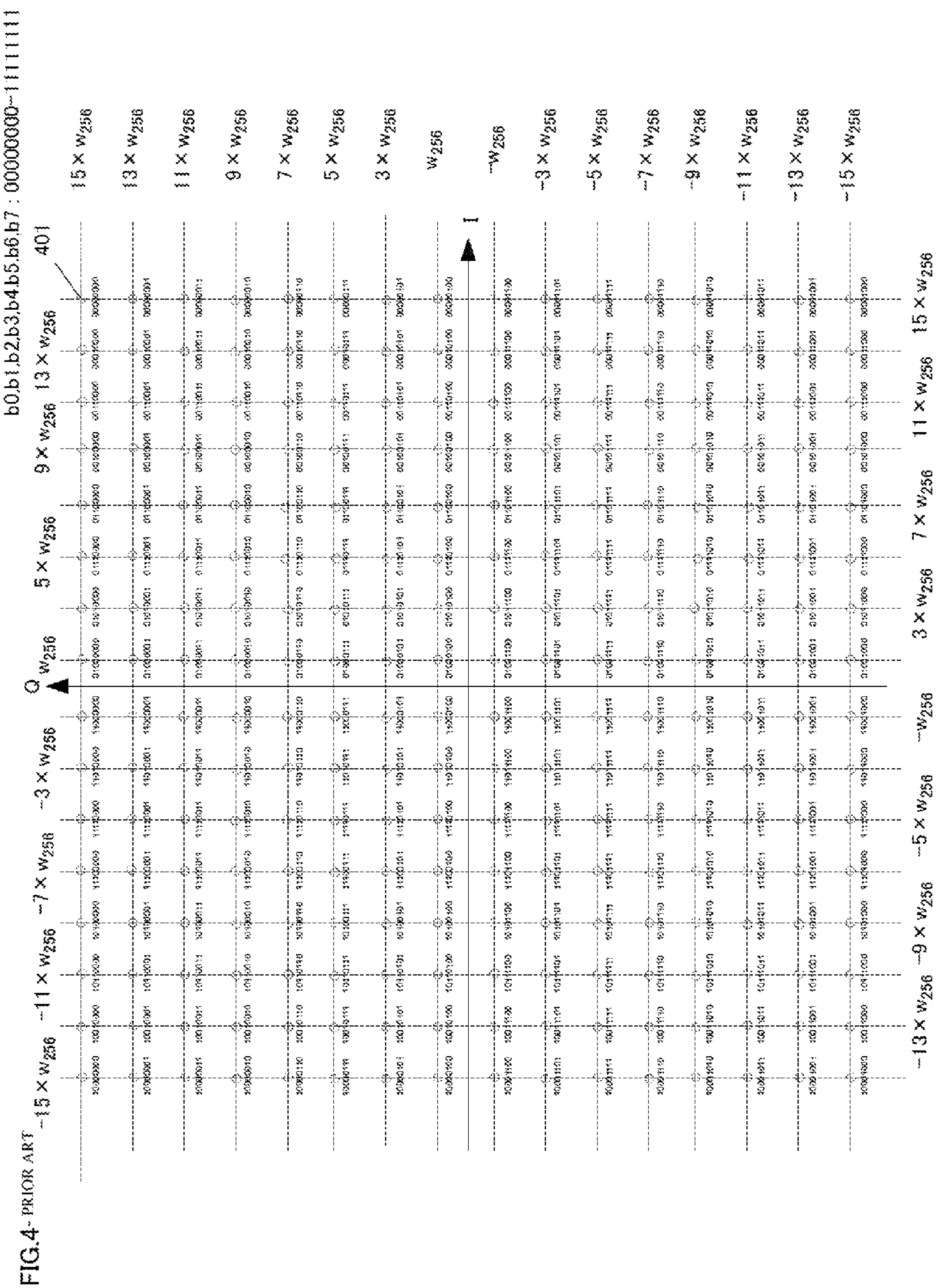
FIG. 4 shows an example of constellation of signal points for 256QAM in the I-Q plane.

A mapping scheme for 256QAM is described below. FIG. 4 shows an example of signal point constellation for 256QAM in the I (in-phase)-Q (quadrature(-phase)) plane. In FIG. 4, 256 circles represent signal points for 256QAM.

Coordinates of the 256 signal points (i.e., the circles in FIG. 4) for 256QAM in the I (in-phase)-Q (quadrature (-phase)) plane are $(15w_{256},15w_{256}), (15w_{256},13w_{256}), (15w_{256},11w_{256}), (15w_{256},9w_{256}), (15w_{256},7w_{256}), (15w_{256},5w_{256}), (15w_{256},3w_{256}), (15w_{256},w_{256}), (15w_{256},-15w_{256}), (15w_{256},-13w_{256}), (15w_{256},-11w_{256}), (15w_{256},-9w_{256}), (15w_{256},-7w_{256}), (15w_{256},-5w_{256}), (15w_{256},-3w_{256}), (15w_{256},-w_{256})$, $(13w_{256},15w_{256}), (13w_{256},13w_{256}), (13w_{256}11w_{256}), (13w_{256}-,9w_{256}) (13w_{256},7w_{256}), (13w_{256},5w_{256}), (13w_{256},3w_{256}), (13w_{256},w_{256}), (13w_{256},-15w_{256}), (13w_{256},-13w_{256}), (13w_{256},-11w_{256}), (13w_{256},-9w_{256}), (13w_{256},-7w_{256}), (13w_{256},-5w_{256}), (13w_{256},-3w_{256}), (13w_{256},-w_{256})$, $(11w_{256},15w_{256}), (11w_{256},13w_{256}), (11w_{256},11w_{256}), (11w_{256},9w_{256}), (11w_{256},7w_{256}), (11w_{256},5w_{256}), (11w_{256},3w_{256}), (11w_{256},w_{256}), (11w_{256},-15w_{256}), (11w_{256},-13w_{256}), (11w_{256},-11w_{256}), (11w_{256},-9w_{256}) (11w_{256},-7w_{256}), (11w_{256}-5w_{256}), (11w_{256}-3w_{256}), (11w_{256},-w_{256})$, $(9w_{256},15w_{256}), (9w_{256},13w_{256}), (9w_{256},11w_{256}), (9w_{256},9w_{256}), (9w_{256},7w_{256}), (9w_{256},5w_{256}), (9w_{256},3w_{256}), (9w_{256},w_{256}), (9w_{256},-15w_{256}), (9w_{256},-13w_{256}), (9w_{256},-11w_{256}), (9w_{256},-9w_{256}), (9w_{256},-7w_{256}), (9w_{256},-5w_{256}), (9w_{256},-3w_{256}), (9w_{256},-w_{256})$, $(7w_{256},15w_{256}), (7w_{256},13w_{256}), (7w_{256},11w_{256}), (7w_{256},9w_{256}), (7w_{256},7w_{256}), (7w_{256},5w_{256}), (7w_{256},3w_{256}), (7w_{256},w_{256}), (7w_{256},-15w_{256}), (7w_{256},-13w_{256}), (7w_{256},-11w_{256}), (7w_{256},-9w_{256}), (7w_{256},-7w_{256}), (7w_{256},-5w_{256}), (7w_{256},-3w_{256}), (7w_{256}-w_{256})$, $(5w_{256},15w_{255}), (5w_{256},13w_{256}), (5w_{256},11w_{256}), (5w_{256},9w_{256}), (5w_{256},7w_{256}), (5w_{256},5w_{256}), (5w_{256},3w_{256}), (5w_{256},w_{256}), (5w_{256},-15w_{256}), (5w_{256},-13w_{256}), (5w_{256},-11w_{256}), (5w_{256},-9w_{256}), (5w_{256},-7w_{256}), (5w_{256},-5w_{256}), (5w_{256},-3w_{256}), (5w_{256},-w_{256})$, $(3w_{256}15w_{256}), (3w_{256},13w_{256}), (3w_{256},11w_{256}), (3w_{256},9w_{256}), (3w_{256},7w_{256}), (3w_{256},5w_{256}), (3w_{256},3w_{256}), (3w_{256},w_{256}), (3w_{256},-15w_{256}), (3w_{256},-13w_{256}), (3w_{256},-11w_{256}), (3w_{256},-9w_{256}), (3w_{256},-7w_{256}), (3w_{256}-5w_{256}), (3w_{256},-3w_{256}), (3w_{256},-w_{256})$, $(w_{256},15w_{256}), (w_{256},13w_{256}), (w_{256},11w_{256}), (w_{256},9w_{256}), (w_{256},7w_{256}), (w_{256},5w_{256}), (w_{256},3w_{256}), (w_{256},w_{256}), (w_{256},-15w_{256}), (w_{256},-13w_{256}), (w_{256},-11w_{256}), (w_{256},-9w_{256}), (w_{256},-7w_{256}), (w_{256},-5w_{256}), (w_{256},-3w_{256}), (w_{256},-w_{256})$, $(-15w_{256},15w_{256}), (-15w_{256},13w_{256}), (-15w_{256},11w_{256}), (-15w_{256},9w_{256}), (-15w_{256},7w_{256}), (-15w_{256},5w_{256}), (-15w_{256},3w_{256}), (-15w_{256},w_{256}), (-15w_{256},-15w_{256}), (-15w_{256},-13w_{256}), (-15w_{256},-11w_{256}), (-15w_{256},-9w_{256}), (-15w_{256},-7w_{256}), (-15w_{256},-5w_{256}), (-15w_{256},-3w_{256}), (-15w_{256},-w_{256})$, $(-13w_{256},15w_{256}), (-13w_{256},13w_{256}), (-13w_{256},11w_{256}), (-13w_{256},9w_{256}), (-13w_{256},7w_{256}), (-13w_{256},5w_{256}), (-13w_{256},3w_{256}), (-13w_{256},w_{256}), (-13w_{256},-15w_{256}), (-13w_{256},-13w_{256}), (-13w_{256},-11w_{256}), (-13w_{256},-9w_{256}), (-13w_{256},-7w_{256}), (-13w_{256},-5w_{256}), (-13w_{256},-3w_{256}), (-13w_{256},-w_{256})$, $(-11w_{256},15w_{256}), (-11w_{256},13w_{256}), (-11w_{256},11w_{256}), (-11w_{256},9w_{256}), (-11w_{256},7w_{256}), (-11w_{256},5w_{256}), (-11w_{256},3w_{256}), (-11w_{256},w_{256}), (-11w_{256},-15w_{256}), (-11w_{256},-13w_{256}), (-11w_{256},-11w_{256}), (-11w_{256},-9w_{256}), (-11w_{256},-7w_{256}), (-11w_{256},-5w_{256}), (-11w_{256},-3w_{256}), (-11w_{256},-w_{256})$, $(-9w_{256},15w_{256}), (-9w_{256},13w_{256}), (-9w_{256},11w_{256}), (-9w_{256},9w_{256}), (-9w_{256},7w_{256}), (-9w_{256},5w_{256}), (-9w_{256},3w_{256}), (-9w_{256},w_{256}), (-9w_{256},-15w_{256}), (-9w_{256},-13w_{256}), (-9w_{256},-11w_{256}), (-9w_{256},-9w_{256}), (-9w_{256},-7w_{256}), (-9w_{256},-5w_{256}), (-9w_{256},-3w_{256}), (-9w_{256},w_{256})$, $(-7w_{256},15w_{256}), (-7w_{256},13w_{256}), (-7w_{256},11w_{256}), (-7w_{256},9w_{256}), (-7w_{256},7w_{256}), (-7w_{256},5w_{256}), (-7w_{256},3w_{256}), (-7w_{256},w_{256}), (-7w_{256},-15w_{256}), (-7w_{256},-13w_{256}), (-7w_{256},-11w_{256}), (-7w_{256},-9w_{256}), (-7w_{256},-7w_{256}), (-7w_{256},-5w_{256}), (-7w_{256},-3w_{256}), (-7w_{256},-w_{256})$, $(-5w_{256},15w_{256}), (-5w_{256},13w_{256}), (-5w_{256},11w_{256}), (-5w_{256},9w_{256}), (-5w_{256},7w_{256}), (-5w_{256},5w_{256}), (-5w_{256},3w_{256}), (-5w_{256},w_{256}), (-5w_{256},-15w_{256}), (-5w_{256},-13w_{256}), (-5w_{256},-11w_{256}), (-5w_{256},-9w_{256}), (-5w_{256},-7w_{256}), (-5w_{256},-5w_{256}), (-5w_{256},-3w_{256}), (-7w_{256},-w_{256})$, $(-3w_{256},15w_{256}), (-3w_{256},13w_{256}), (-3w_{256},11w_{256}), (-3w_{256},9w_{256}), (-3w_{256},7w_{256}), (-3w_{256},5w_{256}), (-3w_{256},3w_{256}), (-3w_{256},w_{256}), (-3w_{256},-15w_{256}), (-3w_{256},-13w_{256}), (-3w_{256},-11w_{256}), (-3w_{256},-9w_{256}), (-3w_{256},-7w_{256}), (-3w_{256},-5w_{256}), (-3w_{256},-3w_{256}), (-3w_{256},-w_{256})$, $(-w_{256},15w_{256}), (-w_{256},13w_{256}), (-w_{256},11w_{256}), (-w_{256},9w_{256}), (-w_{256},7w_{256}), (-w_{256},5w_{256}), (-w_{256},3w_{256}), (-w_{256},w_{256}), (-w_{256},-15w_{256}), (-w_{256},-13w_{256}), (-w_{256},-11w_{256}), (-w_{256},-9w_{256}), (-w_{256},-7w_{256}), (-w_{256},-5w_{256}), (-w_{256},-3w_{256})$, and $(-w_{256},-w_{256})$, where $w_{256}$ is a real number greater than 0.

Here, transmitted bits (input bits) are represented by b0, b1, b2, b3, b4, b5, b6, and b7. For example, when (b0, b1, b2, b3, b4, b5, b6, b7)=(0, 0, 0, 0, 0, 0, 0, 0) for the transmitted bits, mapping is performed to a signal point 401 in FIG. 4. When an in-phase component and a quadrature component of the baseband signal obtained as a result of mapping are respectively represented by I and Q, (I, Q)=$(15w_{256},15w_{256})$ is satisfied.

That is to say, the in-phase component I and the quadrature component Q of the baseband signal obtained as a result of mapping (at the time of using 256QAM) are determined based on the transmitted bits (b0, b1, b2, b3, b4, b5, b6, b7). One example of a relationship between values (00000000-11111111) of a set of b0, b1, b2, b3, b4, b5, b6, and b7 and coordinates of signal points is as shown in FIG. 4. The values 00000000-11111111 of the set of b0, b1, b2, b3, b4, b5, b6, and b7 are shown directly below the 256 signal points (i.e., the circles in FIG. 4) for 256QAM, which are $(15w_{256},15w_{256}), (15w_{256},13w_{256}), (15w_{256},11w_{256}), (15w_{256},9w_{256}), (15w_{256},7w_{256}), (15w_{256},5w_{256}), (15w_{256},3w_{256}), (15w_{256},w_{256}), (15w_{256},-15w_{256}), (15w_{256},-13w_{256}), (15w_{256},-11w_{256}), (15w_{256},-9w_{256}), (15w_{256},-7w_{256}), (15w_{256},-5w_{256}), (15w_{256},-3w_{256}), (15w_{256},-w_{256})$, $(13w_{256},15w_{256})$, $(13w_{256},13w_{256})$, $(13w_{256},11w_{256})$, $(13w_{256},9w_{256})$, $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$, $(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$, $(11w_{256},-7w_{256})$, $(11w_{256},-5w_{256})$, $(11w_{256},-3w_{256})$, $(11w_{256},-w_{256})$, $(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$, $(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$, $(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$, $(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256},-w_{256})$, $(5w_{256},15w_{256})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$, $(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256}-5w_{256})$, $(5w_{256},-3w_{256})$, $(5w_{256}-w_{256})$, $(3w_{256},15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$, $(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256},-5w_{256})$, $(3w_{256},-3w_{256})$, $(3w_{256},-w_{256})$, $(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$, $(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$, $(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$, $(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$, $(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$, $(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$, $(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},w_{256})$, $(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$, $(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-5w_{256},-w_{256})$, $(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$, $(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-13w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, and $(-w_{256},-w_{256})$. Coordinates, in the I (in-phase)-Q (quadrature(-phase)) plane, of the signal points (i.e., the circles) directly above the values 00000000-11111111 of the set of b0, b1, b2, b3, b4, b5, b6, and b7 indicate the in-phase component I and the quadrature component Q of the baseband signal obtained as a result of mapping.

The relationship between the values (00000000-11111111) of the set of b0, b1, b2, b3, b4, b5, b6, and b7 for 256QAM and coordinates of signal points is not limited to that shown in FIG. 4. Values obtained by expressing the in-phase component I and the quadrature component Q of the baseband signal obtained as a result of mapping (at the time of using 256QAM) in complex numbers correspond to the baseband signal ($s_1(t)$ or $s_2(t)$).

In this case, the baseband signal 505A ($s_1(t)$ ($s_1(i)$)) and the baseband signal 505B ($s_2(t)$ ($s_2(i)$)), which are outputs of the mapper 504 shown in FIGS. 5-7, are typically set to have an equal average power. Thus, the following formulas are satisfied for the coefficients $w_q$, $w_{16}$, $w_{64}$, and $w_{256}$ described in the above-mentioned explanations on the mapping schemes for QPSK, 16QAM, 64QAM, and 256QAM, respectively.

[Math. 11]

$$w_q = \frac{z}{\sqrt{2}} \quad \text{(formula R11)}$$

[Math. 12]

$$w_{16} = \frac{z}{\sqrt{10}} \quad \text{(formula R12)}$$

[Math. 13]

$$w_{64} = \frac{z}{\sqrt{42}} \quad \text{(formula R13)}$$

[Math. 14]

$$w_{256} = \frac{z}{\sqrt{170}} \quad \text{(formula R14)}$$

When a modulated signal #1 and a modulated signal #2 are transmitted from two antennas in the MIMO system, the modulated signal #1 and the modulated signal #2 are set to have different average transmission powers in some cases in the DVB standard. For example, in formulas R2, R3, R4, R5, and R8 shown above, $Q_1 \neq Q_2$ is satisfied.

The following describes more specific examples.

<1> Case where, in formula R2, the precoding matrix F or F(i) is expressed by any of the following formulas

[Math. 15]

$$F=\begin{pmatrix}\beta\times e^{j0} & \beta\times\alpha\times e^{j0}\\ \beta\times\alpha\times e^{j0} & \beta\times e^{j\pi}\end{pmatrix} \quad \text{(formula R15)}$$

or

[Math. 16]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix} \quad \text{(formula R16)}$$

or

[Math. 17]

$$F=\begin{pmatrix}\beta\times e^{j0} & \beta\times\alpha\times e^{j\pi}\\ \beta\times\alpha\times e^{j0} & \beta\times e^{j0}\end{pmatrix} \quad \text{(formula R17)}$$

or

[Math. 18]

$$F=\frac{1}{\sqrt{\alpha^2+1}}\begin{pmatrix}e^{j0} & \alpha\times e^{j\pi}\\ \alpha\times e^{j0} & e^{j0}\end{pmatrix} \quad \text{(formula R18)}$$

or

[Math. 19]

$$F=\begin{pmatrix}\beta\times\alpha\times e^{j0} & \beta\times e^{j\pi}\\ \beta\times e^{j0} & \beta\times\alpha\times e^{j0}\end{pmatrix} \quad \text{(formula R19)}$$

or

[Math. 20]

$$F=\frac{1}{\sqrt{\alpha^2+1}}\begin{pmatrix}\alpha\times e^{j0} & e^{j\pi}\\ e^{j0} & \alpha\times e^{j0}\end{pmatrix} \quad \text{(formula R20)}$$

or

[Math. 21]

$$F=\begin{pmatrix}\beta\times\alpha\times e^{j0} & \beta\times e^{j0}\\ \beta\times e^{j0} & \beta\times\alpha\times e^{j\pi}\end{pmatrix} \quad \text{(formula R21)}$$

or

[Math. 22]

$$F=\frac{1}{\sqrt{\alpha^2+1}}\begin{pmatrix}\alpha\times e^{j0} & e^{j0}\\ e^{j0} & \alpha\times e^{j\pi}\end{pmatrix} \quad \text{(formula R22)}$$

In formulas R15, R16, R17, R18, R19, R20, R21, and R22, α may be either a real number or an imaginary number, and β may be either a real number or an imaginary number. However, α is not 0 (zero). Similarly, β is not 0 (zero).

or

[Math. 23]

$$F=\begin{pmatrix}\beta\times\cos\theta & \beta\times\sin\theta\\ \beta\times\sin\theta & -\beta\times\cos\theta\end{pmatrix} \quad \text{(formula R23)}$$

or

-continued

[Math. 24]

$$F=\begin{pmatrix}\cos\theta & \sin\theta\\ \sin\theta & -\cos\theta\end{pmatrix} \quad \text{(formula R24)}$$

or

[Math. 25]

$$F=\begin{pmatrix}\beta\times\cos\theta & -\beta\times\sin\theta\\ \beta\times\sin\theta & \beta\times\cos\theta\end{pmatrix} \quad \text{(formula R25)}$$

or

[Math. 26]

$$F=\begin{pmatrix}\cos\theta & -\sin\theta\\ \sin\theta & \cos\theta\end{pmatrix} \quad \text{(formula R26)}$$

or

[Math. 27]

$$F=\begin{pmatrix}\beta\times\sin\theta & -\beta\times\cos\theta\\ \beta\times\cos\theta & \beta\times\sin\theta\end{pmatrix} \quad \text{(formula R27)}$$

or

[Math. 28]

$$F=\begin{pmatrix}\sin\theta & -\cos\theta\\ \cos\theta & \sin\theta\end{pmatrix} \quad \text{(formula R28)}$$

or

[Math. 29]

$$F=\begin{pmatrix}\beta\times\sin\theta & \beta\times\cos\theta\\ \beta\times\cos\theta & -\beta\times\sin\theta\end{pmatrix} \quad \text{(formula R29)}$$

or

[Math. 30]

$$F=\begin{pmatrix}\sin\theta & \cos\theta\\ \cos\theta & -\sin\theta\end{pmatrix} \quad \text{(formula R30)}$$

In formulas R23, R25, R27, and R29, β may be either a real number or an imaginary number. However, β is not 0 (zero).

or

[Math. 31]

$$F(i)=\begin{pmatrix}\beta\times e^{j\theta_{11}(i)} & \beta\times\alpha\times e^{j(\theta_{11}(i)+\lambda)}\\ \beta\times\alpha\times e^{j\theta_{21}(i)} & \beta\times e^{j(\theta_{21}(i)+\lambda+\pi)}\end{pmatrix} \quad \text{(formula R31)}$$

or

[Math. 32]

$$F(i)=\frac{1}{\sqrt{\alpha^2+1}}\begin{pmatrix}e^{j\theta_{11}(i)} & \alpha\times e^{j(\theta_{11}(i)+\lambda)}\\ \alpha\times e^{j\theta_{21}(i)} & e^{j(\theta_{21}(i)+\lambda+\pi)}\end{pmatrix} \quad \text{(formula R32)}$$

or

-continued

[Math. 33]

$$F(i)=\begin{pmatrix}\beta\times\alpha\times e^{j\theta_{21}(i)} & \beta\times e^{j(\theta_{21}(i)+\lambda+\pi)}\\ \beta\times e^{j\theta_{11}(i)} & \beta\times\alpha\times e^{j(\theta_{11}(i)+\lambda)}\end{pmatrix} \quad \text{(formula R33)}$$

or

[Math. 34]

$$f(i)=\frac{1}{\sqrt{\alpha^2+1}}\begin{pmatrix}\alpha\times e^{j\theta_{21}(i)} & e^{j(\theta_{21}(i)+\lambda+\pi)}\\ e^{j\theta_{11}(i)} & \alpha\times e^{j(\theta_{11}(i)+\lambda)}\end{pmatrix} \quad \text{(formula R34)}$$

However, $\theta_{11}(i)$ and $\theta_{21}(i)$ are each the function of i (time or frequency), λ is a fixed value, α may be either a real number or an imaginary number, and β may be either a real number or an imaginary number. However, α is not 0 (zero). Similarly, β is not 0 (zero).

<2> Case where, in formula R3, the precoding matrix F or F(i) is expressed by any of formulas 15-30

<3> Case where, in formula R4, the precoding matrix F or F(i) is expressed by any of formulas 15-30

<4> Case where, in formula R5, the precoding matrix F or F(i) is expressed by any of formulas 15-34

<5> Case where, in formula R8, the precoding matrix F or F(i) is expressed by any of formulas 15-30

In <1>-<5>, a modulation scheme for generating $s_1(t)$ and a modulation scheme for generating $s_2(t)$ (a modulation scheme for generating $s_1(i)$ and a modulation scheme for generating $s_2(i)$) are different.

The following describes an important point of this configuration example. The point described below is especially important in the precoding schemes in <1>-<5>, but may be implemented when precoding matrices other than precoding matrices shown in formulas 15-34 are used in the precoding schemes in <1>-<5>.

The modulation level (the number of signal points in the I (in-phase)-Q (quadrature(-phase)) plane: 16 for 16QAM, for example) of the modulation scheme for generating $s_1(t)$ ($s_1(i)$) (i.e., the baseband signal 505A) in <1>-<5> is represented by $2^g$ (g is an integer equal to or greater than one), and the modulation level (the number of signal points in the I (in-phase)-Q (quadrature(-phase)) plane: 64 for 64QAM, for example) of the modulation scheme for generating $s_2(t)$ ($s_2(i)$) (i.e., the baseband signal 505B) in <1>-<5> is represented by $2^h$ (h is an integer equal to or greater than one). Note that g≠h is satisfied.

In this case, g-bit data is transmitted in one symbol of $s_1(t)$ ($s_1(i)$), and h-bit data is transmitted in one symbol of $s_2(t)$ ($s_2(i)$). This means that (g+h)-bit data is transmitted in one slot composed of one symbol of $s_1(t)$ ($s_1(i)$) and one symbol of $s_2(t)$ ($s_2(i)$). In this case, it is important to satisfy the following condition to obtain a high spatial diversity gain.

<Condition R-1>

When precoding (including processing other than precoding) shown in any of formulas R2, R3, R4, R5, and R8 is performed, the number of candidate signal points in the I (in-phase)-Q (quadrature(-phase)) plane in one symbol of the signal $z_1(t)$ ($z_1(i)$) on which processing such as precoding has been performed is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, the number of candidate signal points in the I (in-phase)-Q (quadrature(-phase)) plane in one symbol of the signal $z_2(t)$ ($z_2(i)$) on which processing such as precoding has been performed is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

The following describes an alternative expression of Condition R-1, and additional conditions for each of formulas R2, R3, R4, R5, and R8.

(Case 1)

Case where processing in formula R2 is performed by using a fixed precoding matrix:

The following formula is considered as a formula obtained in the middle of calculation in formula R2.

[Math. 35]

$$\begin{pmatrix}u_1(i)\\u_2(i)\end{pmatrix}=F\begin{pmatrix}P_1\times s_1(i)\\P_2\times s_2(i)\end{pmatrix}=\begin{pmatrix}a(i)&b(i)\\c(i)&d(i)\end{pmatrix}\begin{pmatrix}P_1\times s_1(i)\\P_2\times s_2(i)\end{pmatrix}=\begin{pmatrix}a(i)&b(i)\\c(i)&d(i)\end{pmatrix}\begin{pmatrix}P_1&0\\0&P_2\end{pmatrix}\begin{pmatrix}s_1(i)\\s_2(i)\end{pmatrix} \quad \text{(formula R35)}$$

In Case 1, the precoding matrix F is a fixed precoding matrix. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and g≠h is satisfied.

In this case, a high spatial diversity gain can be obtained when the following condition is satisfied.

<Condition R-2>

The number of candidate signal points in the I (in-phase)-Q (quadrature(-phase)) plane in one symbol of a signal $u_1(t)$ ($u_1(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, the number of candidate signal points in the I (in-phase)-Q (quadrature(-phase)) plane in one symbol of a signal $u_2(t)$ ($u_2(i)$) in formula R35 is $2^{g+h}$ (when signal points are generated in the I (in-phase)-Q (quadrature (-phase)) plane for each of values that the (g+h)-bit data can take in one symbol, $2^{g+h}$ signal points can be generated. This is the number of candidate signal points).

The following condition is considered when $|Q_1|>|Q_2|$ (the absolute value of $Q_1$ is greater than the absolute value of $Q_2$) is satisfied in formula R2.

<Condition R-3>

The number of candidate signal points in the I (in-phase)-Q (quadrature(-phase)) plane in one symbol of a signal $u_1(t)$ ($u_1(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1 \geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2 \geq 0$). When $D_2$ is equal to 0 (zero), there are signal points, from among $2^{g+h}$ signal points, that exist in the same position in the I (in-phase)-Q (quadrature(-phase)) plane).

In this case, $D_1 > D_2$ ($D_1$ is greater than $D_2$) is satisfied.

Figure 53:
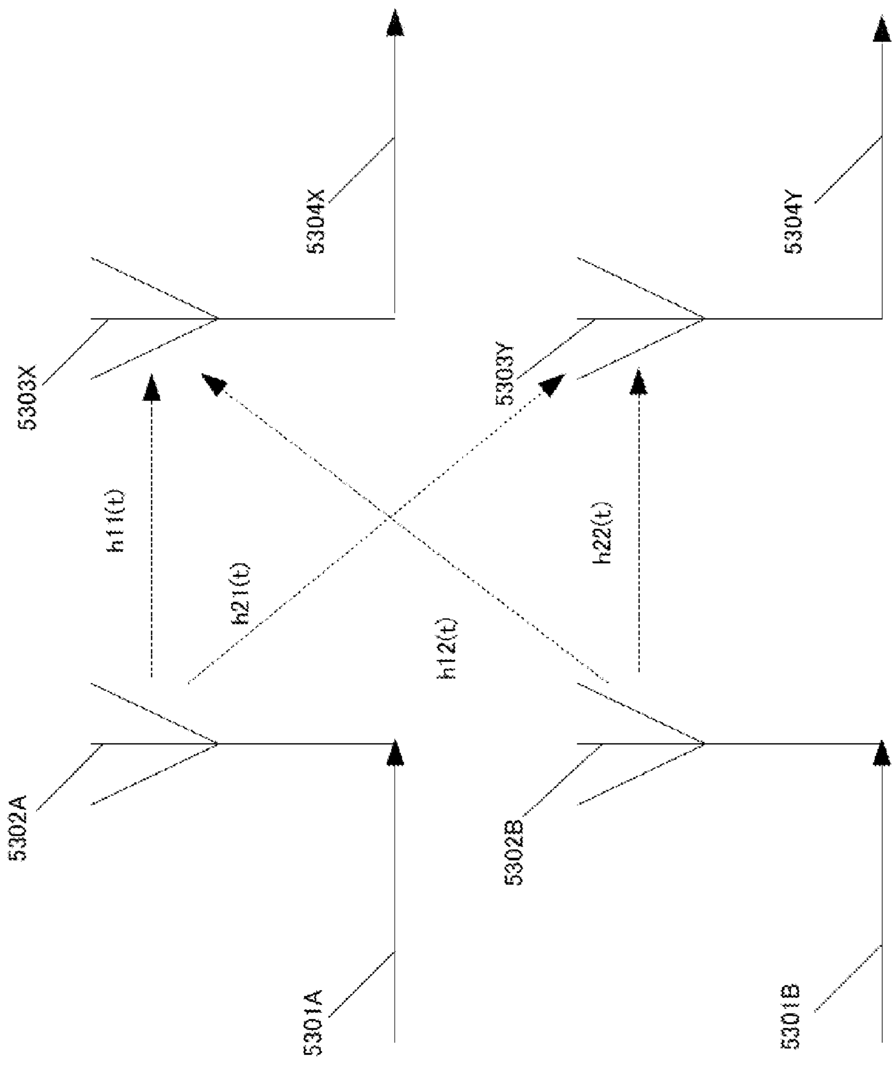
FIG. 53 shows relationship between a transmit antenna and a receive antenna.

FIG. 53 shows a relationship between a transmit antenna and a receive antenna. A modulated signal #1 (5301A) is transmitted from a transmit antenna #1 (5302A) in the transmission device, and a modulated signal #2 (5301B) is transmitted from a transmit antenna #2 (5302B) in the transmission device. In this case, $z_1(t)$ ($z_1(i)$) (i.e., $u_1(t)$ ($u_1(i)$)) is transmitted from the transmit antenna #1 (5302A), and $z_2(t)$ ($z_2(i)$) (i.e., $u_2(t)$ ($u_2(i)$)) is transmitted from the transmit antenna #2 (5302B).

The receive antenna #1 (5303X) and the receive antenna #2 (5303Y) in the reception device receive the modulated signals transmitted by the transmission device (obtain received signals 5304X and 5304Y). In this case, a propagation coefficient from the transmit antenna #1 (5302A) to the receive antenna #1 (5303X) is represented by $h_{11}(t)$, a propagation coefficient from the transmit antenna #1 (5302A) to the receive antenna #2 (5303Y) is represented by $h_{21}(t)$, a propagation coefficient from the receive antenna #2 (5302B) to the transmit antenna #1 (5303X) is represented by $h_{12}(t)$, and a propagation coefficient from the transmit antenna #2 (5302B) to the receive antenna #2 (5303Y) is represented by $h_{22}(t)$ (t is time).

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-3 is satisfied.

For a similar reason, it is desirable that Condition R-3' be satisfied when $|Q_1|<|Q_2|$ is satisfied.

<Condition R-3'>

The number of candidate signal points in the I (in-phase)-Q (quadrature(-phase)) plane in one symbol of the signal $u_1(t)$ ($u_1(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1 \geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2 \geq 0$). When $D_2$ is equal to 0 (zero), there are signal points, from among $2^{g+h}$ signal points, that exist in the same position in the I (in-phase)-Q (quadrature(-phase)) plane).

In this case, $D_1 < D_2$ is satisfied ($D_1$ is smaller than $D_2$).

In Case 1, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 2)

Case where processing in formula R2 is performed by using a precoding matrix shown in any of formulas R15-R30:

Formula R35 is considered as a formula obtained in the middle of calculation in formula R2. In Case 2, the precoding matrix F is a fixed precoding matrix, and expressed by any of formulas R15-R30. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^{g+h}$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g \neq h$ is satisfied.

In this case, a high spatial diversity gain can be obtained when Condition R-2 is satisfied.

As in Case 1, the following describes a case where Condition R-3 is satisfied when $|Q_1|>|Q_2|$ (the absolute value of $Q_1$ is greater than the absolute value of $Q_2$) is satisfied in formula R2.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-3 is satisfied.

The reception device is likely to obtain high data reception quality when the following condition is satisfied.

<Condition R-3">

Condition R-3 is satisfied, and $P_1^2=P_2$ is satisfied in formula R2.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-3" is satisfied.

For a similar reason, it is desirable that Condition R-3' be satisfied when $|Q_1|<|Q_2|$ is satisfied.

For a similar reason, the reception device is also likely to obtain high data reception quality if the following condition is satisfied when $|Q_1|<|Q_2|$ is satisfied.

<Condition R-3'">

Condition R-3' is satisfied, and $P_1^2=P_2$ is satisfied in formula R2.

In Case 2, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 3)

Case where processing in formula R2 is performed by using a precoding matrix shown in any of formulas R31-R34:

Formula R35 is considered as a formula obtained in the middle of calculation in formula R2. In Case 3, the precoding matrix F is switched depending on a time (or a frequency). The precoding matrix F (F(i)) is expressed by any of formulas R31-R34.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g \neq h$ is satisfied.

In this case, a high spatial diversity gain can be obtained when the following Condition R-4 is satisfied.

<Condition R-4>

When the symbol number i is in a range of N to M inclusive (N and M are each an integer, and N<M (M is smaller than N) is satisfied), the modulation scheme for generating $s_1(t)$ ($s_1(i)$) (i.e., the baseband signal 505A) is set to be fixed (not switched), and the modulation scheme for generating $s_2(t)$ ($s_2(i)$) (i.e., the baseband signal 505B) is set to be fixed (not switched).

For each value of the symbol number i when the symbol number i is in a range of N to M inclusive, the number of candidate signal points in the I (in-phase)-Q (quadrature (-phase)) plane in one symbol of the signal $u_1(t)$ ($u_1(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, for each value of the symbol number i when the symbol number i is in a range of N to M inclusive, the number of candidate signal points in the I (in-phase)-Q (quadrature(-phase)) plane in one symbol of the signal $u_2(t)$ ($u_2(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

Considered is a case where Condition R-5 is satisfied when $|Q_1|>|Q_2|$ (the absolute value of $Q_1$ is greater than the absolute value of $Q_2$) is satisfied in formula R2.

<Condition R-5>

When the symbol number i is in a range of N to M inclusive (N and M are each an integer, and N<M (M is smaller than N) is satisfied), the modulation scheme for generating $s_1(t)$ ($s_1(i)$) (i.e., the baseband signal 505A) is set to be fixed (not switched), and the modulation scheme for generating $s_2(t)$ ($s_2(i)$) (i.e., the baseband signal 505B) is set to be fixed (not switched).

For each value of the symbol number i when the symbol number i is in a range of N to M inclusive, the number of candidate signal points in the I (in-phase)-Q (quadrature (-phase)) plane in one symbol of the signal $u_1(t)$ ($u_1(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In the symbol number i, a minimum Euclidian distance between $2^{g+h}$ candidate signal points for $u_1(t)$ ($u_1(i)$) in the I (in-phase)-Q (quadrature(-phase)) plane is represented by $D_1(i)$ ($D_1(i)$ is a real number equal to or greater than 0 (zero) ($D_1(i) \geq 0$). When $D_1(i)$ is equal to 0 (zero), there are signal points, from among $2^{g+h}$ signal points, that exist in the same position in the I (in-phase)-Q (quadrature(-phase)) plane).

For each value of the symbol number i when the symbol number i is in a range of N to M inclusive, the number of candidate signal points in the I (in-phase)-Q (quadrature (-phase)) plane in one symbol of the signal $u_2(t)$ ($u_2(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). In the symbol number i, a minimum Euclidian distance between $2^{g+h}$ candidate signal points for $u_2(t)$ ($u_2(i)$) in the I (in-phase)-Q (quadrature(-phase)) plane is represented by $D_2(i)$ ($D_2(i)$ is a real number equal to or greater than 0 (zero) ($D_2(i) \geq 0$). When $D_2(i)$ is equal to 0 (zero), there are signal points, from among $2^{g+h}$ signal points, that exist in the same position in the I (in-phase)-Q (quadrature(-phase)) plane).

In this case, for each value of the symbol number i when the symbol number i is in a range of N to M inclusive, $D_1(i)>D_2(i)$ ($D_1(i)$ is greater than $D_2(i)$) is satisfied.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-5 is satisfied.

The reception device is likely to obtain high data reception quality when the following condition is satisfied.

<Condition R-5'>

Condition R-5 is satisfied, and $P_1^2=P_2$ is satisfied in formula R2.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-5' is satisfied.

For a similar reason, it is desirable that Condition R-5''' be satisfied when $|Q_1|<|Q_2|$ is satisfied.

<Condition R-5">

When the symbol number i is in a range of N to M inclusive (N and M are each an integer, and N<M (M is smaller than N) is satisfied), the modulation scheme for generating $s_1(t)$ ($s_1(i)$) (i.e., the baseband signal 505A) is set to be fixed (not switched), and the modulation scheme for generating $s_2(t)$ ($s_2(i)$) (i.e., the baseband signal 505B) is set to be fixed (not switched).

For each value of the symbol number i when the symbol number i is in a range of N to M inclusive, the number of candidate signal points in the I (in-phase)-Q (quadrature (-phase)) plane in one symbol of the signal $u_1(t)$ ($u_1(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In the symbol number i, a minimum Euclidian distance between $2^{g+h}$ candidate signal points for $u_1(t)$ ($u_1(i)$) in the I (in-phase)-Q (quadrature(-phase)) plane is represented by $D_1(i)$ ($D_1(i)$ is a real number equal to or greater than 0 (zero) ($D_1(i) \geq 0$). When $D_1(i)$ is equal to 0 (zero), there are signal points, from among $2^{g+h}$ signal points, that exist in the same position in the I (in-phase)-Q (quadrature(-phase)) plane).

For each value of the symbol number i when the symbol number i is in a range of N to M inclusive, the number of candidate signal points in the I (in-phase)-Q (quadrature (-phase)) plane in one symbol of the signal $u_2(t)$ ($u_2(i)$) in formula R35 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). In the symbol number i, a minimum Euclidian distance between $2^{g+h}$ candidate signal points for $u_2(t)$ ($u_2(i)$) in the I (in-phase)-Q (quadrature(-phase)) plane is represented by $D_2(i)$ ($D_2(i)$ is a real number equal to or greater than 0 (zero) ($D_2(i) \geq 0$). When $D_2(i)$ is equal to 0 (zero), there are signal points, from among $2^{g+h}$ signal points, that exist in the same position in the I (in-phase)-Q (quadrature(-phase)) plane).

In this case, for each value of the symbol number i when the symbol number i is in a range of N to M inclusive, $D_1(i) < D_2(i)$ ($D_1(i)$ is smaller than $D_2(i)$) is satisfied.

For a similar reason, the reception device is also likely to obtain high data reception quality if the following condition is satisfied when $|Q_1| < |Q_2|$ is satisfied.

<Condition R-5'''>

Condition R-5" is satisfied, and $P_1^2 = P_2$ is satisfied in formula R2.

In Case 3, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 4)

Case where processing in formula R3 is performed by using a fixed precoding matrix:

The following formula is considered as a formula obtained in the middle of calculation in formula R3.

[Math. 36]

$$\begin{pmatrix} u_1(i) \\ u_2(i) \end{pmatrix} = \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} = \begin{pmatrix} a(i) & b(i) \\ c(i) & d(i) \end{pmatrix} \begin{pmatrix} P_1 \times s_1(i) \\ P_2 \times s_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula R36)}$$

In Case 4, the precoding matrix F is a fixed precoding matrix. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g \neq h$ is satisfied.

In this case, a high spatial diversity gain can be obtained when the following condition is satisfied.

<Condition R-6>

The number of candidate signal points in the I (in-phase)-Q (quadrature(-phase)) plane in one symbol of the signal $u_1(t)$ ($u_1(i)$) in formula R36 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, the number of candidate signal points in the I (in-phase)-Q (quadrature(-phase)) plane in one symbol of the signal $u_2(t)$ ($u_2(i)$) in formula R36 is $2^{g+h}$ (when signal points are generated in the I (in-phase)-Q (quadrature (-phase)) plane for each of values that the (g+h)-bit data can take in one symbol, $2^{g+h}$ signal points can be generated. This is the number of candidate signal points).

The following condition is considered when $|Q_1| > |Q_2|$ (the absolute value of $Q_1$ is greater than the absolute value of $Q_2$) is satisfied in formula R3.

<Condition R-7>

The number of candidate signal points in the I (in-phase)-Q (quadrature(-phase)) plane in one symbol of the signal $u_1(t)$ ($u_1(i)$) in formula R36 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1 \geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R36 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2 \geq 0$). When $D_2$ is equal to 0 (zero), there are signal points, from among $2^{g+h}$ signal points, that exist in the same position in the I (in-phase)-Q (quadrature(-phase)) plane).

In this case, $D_1 > D_2$ ($D_1$ is greater than $D_2$) is satisfied.

FIG. 53 shows the relationship between the transmit antenna and the receive antenna. The modulated signal #1 (5301A) is transmitted from the transmit antenna #1 (5302A) in the transmission device, and the modulated signal #2 (5301B) is transmitted from the transmit antenna #2 (5302B) in the transmission device. In this case, $z_1(t)$ ($z_1(i)$) (i.e., $u_1(t)$ ($u_1(i)$)) is transmitted from the transmit antenna #1 (5302A), and $z_2(t)$ ($z_2(i)$) (i.e., $u_2(t)$ ($u_2(i)$)) is transmitted from the transmit antenna #2 (5302B).

The receive antenna #1 (5303X) and the receive antenna #2 (5303Y) in the reception device receive the modulated signals transmitted by the transmission device (obtain received signals 5304X and 5304Y). In this case, the propagation coefficient from the transmit antenna #1 (5302A) to the receive antenna #1 (5303X) is represented by $h_{11}(t)$, the propagation coefficient from the transmit antenna #1 (5302A) to the receive antenna #2 (5303Y) is represented by $h_{21}(t)$, the propagation coefficient from the receive antenna #2 (5302B) to the transmit antenna #1 (5303X) is represented by $h_{12}(t)$, and the propagation coefficient from the transmit antenna #2 (5302B) to the receive antenna #2 (5303Y) is represented by $h_{22}(t)$ (t is time).

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-7 is satisfied.

For a similar reason, it is desirable that Condition R-7' be satisfied when $|Q_1|<|Q_2|$ is satisfied.

<Condition R-7'>

The number of candidate signal points in the I (in-phase)-Q (quadrature(-phase)) plane in one symbol of the signal $u_1(t)$ ($u_1(i)$) in formula R36 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1 \geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R36 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2 \geq 0$). When $D_2$ is equal to 0 (zero), there are signal points, from among $2^{g+h}$ signal points, that exist in the same position in the I (in-phase)-Q (quadrature(-phase)) plane).

In this case, $D_1<D_2$ is satisfied ($D_1$ is smaller than $D_2$).

In Case 4, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 5)

Case where processing in formula R3 is performed by using a precoding matrix shown in any of formulas R15-R30:

Formula R36 is considered as a formula obtained in the middle of calculation in formula R3. In Case 5, the precoding matrix F is a fixed precoding matrix, and expressed by any of formulas R15-R30. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g \neq h$ is satisfied.

In this case, a high spatial diversity gain can be obtained when Condition R-6 is satisfied.

As in Case 4, the following describes a case where Condition R-7 is satisfied when $|Q_1|>|Q_2|$ (the absolute value of $Q_1$ is greater than the absolute value of $Q_2$) is satisfied in formula R3.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-7 is satisfied.

The reception device is likely to obtain high data reception quality when the following condition is satisfied.

<Condition R-7">

Condition R-7 is satisfied, and $P_1^2=P_2$ is satisfied in formula R3.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-7" is satisfied.

For a similar reason, it is desirable that Condition R-7' be satisfied when $|Q_1|<|Q_2|$ is satisfied.

For a similar reason, the reception device is also likely to obtain high data reception quality if the following condition is satisfied when $|Q_1|<|Q_2|$ is satisfied.

<Condition R-7'">

Condition R-7' is satisfied, and $P_1^2=P_2$ is satisfied in formula R3.

In Case 5, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 6)

Case where processing in formula R4 is performed by using a fixed precoding matrix:

The following formula is considered as a formula obtained in the middle of calculation in formula R4.

[Math. 37]

$$\begin{pmatrix} u_1(i) \\ u_2(i) \end{pmatrix} = \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} = \begin{pmatrix} a(i) & b(i) \\ c(i) & d(i) \end{pmatrix} \begin{pmatrix} P_1 \times s_1(i) \\ P_2 \times s_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula R37)}$$

In Case 6, the precoding matrix F is a fixed precoding matrix. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g \neq h$ is satisfied.

In this case, a high spatial diversity gain can be obtained when the following condition is satisfied.

<Condition R-8>

The number of candidate signal points in the I (in-phase)-Q (quadrature(-phase)) plane in one symbol of the signal $u_1(t)$ ($u_1(i)$) in formula R37 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, the number of candidate signal points in the I (in-phase)-Q (quadrature(-phase)) plane in one symbol of the signal $u_2(t)$ ($u_2(i)$) in formula R37 is $2^{g+h}$ (when signal points are generated in the I (in-phase)-Q (quadrature (-phase)) plane for each of values that the (g+h)-bit data can take in one symbol, $2^{g+h}$ signal points can be generated. This is the number of candidate signal points).

The following condition is considered when $|Q_1|>|Q_2|$ (the absolute value of $Q_1$ is greater than the absolute value of $Q_2$) is satisfied in formula R4.

<Condition R-9>

The number of candidate signal points in the I (in-phase)-Q (quadrature(-phase)) plane in one symbol of the signal $u_1(t)$ ($u_1(i)$) in formula R37 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1\geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R37 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2\geq 0$). When $D_2$ is equal to 0 (zero), there are signal points, from among $2^{g+h}$ signal points, that exist in the same position in the I (in-phase)-Q (quadrature(-phase)) plane).

In this case, $D_1>D_2$ ($D_1$ is greater than $D_2$) is satisfied.

FIG. 53 shows the relationship between the transmit antenna and the receive antenna. The modulated signal #1 (5301A) is transmitted from the transmit antenna #1 (5302A) in the transmission device, and the modulated signal #2 (5301B) is transmitted from the transmit antenna #2 (5302B) in the transmission device. In this case, $z_1(t)$ ($z_1(i)$) (i.e., $u_1(t)$ ($u_1(i)$) is transmitted from the transmit antenna #1 (5302A), and $z_2(t)$ ($z_2(i)$) (i.e., $u_2(t)$ ($u_2(i)$) is transmitted from the transmit antenna #2 (5302B).

The receive antenna #1 (5303X) and the receive antenna #2 (5303Y) in the reception device receive the modulated signals transmitted by the transmission device (obtain received signals 5304X and 5304Y). In this case, the propagation coefficient from the transmit antenna #1 (5302A) to the receive antenna #1 (5303X) is represented by $h_{11}(t)$, the propagation coefficient from the transmit antenna #1 (5302A) to the receive antenna #2 (5303Y) is represented by $h_{21}(t)$, the propagation coefficient from the receive antenna #2 (5302B) to the transmit antenna #1 (5303X) is represented by $h_{12}(t)$, and the propagation coefficient from the transmit antenna #2 (5302B) to the receive antenna #2 (5303Y) is represented by $h_{22}(t)$ (t is time).

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-9 is satisfied.

For a similar reason, it is desirable that Condition R-9' be satisfied when $|Q_1|<|Q_2|$ is satisfied.

<Condition R-9'>

The number of candidate signal points in the I (in-phase)-Q (quadrature(-phase)) plane in one symbol of the signal $u_1(t)$ ($u_1(i)$) in formula R37 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1\geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R37 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2\geq 0$). When $D_2$ is equal to 0 (zero), there are signal points, from among $2^{g+h}$ signal points, that exist in the same position in the I (in-phase)-Q (quadrature(-phase)) plane).

In this case, $D_1<D_2$ is satisfied ($D_1$ is smaller than $D_2$).

In Case 6, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 7)

Case where processing in formula R4 is performed by using a precoding matrix shown in any of formulas R15-R30:

Formula R37 is considered as a formula obtained in the middle of calculation in formula R4. In Case 7, the precoding matrix F is a fixed precoding matrix, and expressed by any of formulas R15-R30. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g\neq h$ is satisfied.

In this case, a high spatial diversity gain can be obtained when Condition R-8 is satisfied.

As in Case 6, the following describes a case where Condition R-9 is satisfied when $|Q_1|>|Q_2|$ (the absolute value of $Q_1$ is greater than the absolute value of $Q_2$) is satisfied in formula R4.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-9 is satisfied.

The reception device is likely to obtain high data reception quality when the following condition is satisfied.

<Condition R-9">

Condition R-9 is satisfied, and $P_1^2=P_2$ is satisfied in formula R4.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-9" is satisfied.

For a similar reason, it is desirable that Condition R-9' be satisfied when $|Q_1|<|Q_2|$ is satisfied.

For a similar reason, the reception device is also likely to obtain high data reception quality if the following condition is satisfied when $|Q_1|<|Q_2|$ is satisfied.

<Condition R-9'">

Condition R-9' is satisfied, and $P_1^2=P_2$ is satisfied in formula R4.

In Case 7, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 8)

Case where processing in formula R5 is performed by using a fixed precoding matrix:

The following formula is considered as a formula obtained in the middle of calculation in formula R5.

[Math. 38]

$$\begin{pmatrix} u_1(i) \\ u_2(i) \end{pmatrix} = F\begin{pmatrix} s_1(i) \\ s_2(i) \end{pmatrix} = \begin{pmatrix} a(i) & b(i) \\ c(i) & d(i) \end{pmatrix}\begin{pmatrix} s_1(i) \\ s_2(i) \end{pmatrix} \quad \text{(formula R38)}$$

In Case 8, the precoding matrix F is a fixed precoding matrix. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g\neq h$ is satisfied.

In this case, a high spatial diversity gain can be obtained when the following condition is satisfied.

<Condition R-10>

The number of candidate signal points in the I (in-phase)-Q (quadrature(-phase)) plane in one symbol of the signal $u_1(t)$ ($u_1(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, the number of candidate signal points in the I (in-phase)-Q (quadrature(-phase)) plane in one symbol of the signal $u_2(t)$ ($u_2(i)$) in formula R38 is $2^{g+h}$ (when signal points are generated in the I (in-phase)-Q (quadrature (-phase)) plane for each of values that the (g+h)-bit data can take in one symbol, $2^{g+h}$ signal points can be generated. This is the number of candidate signal points).

The following condition is considered when $|Q_1|>|Q_2|$ (the absolute value of $Q_1$ is greater than the absolute value of $Q_2$) is satisfied in formula R5.

<Condition R-11>

The number of candidate signal points in the I (in-phase)-Q (quadrature(-phase)) plane in one symbol of the signal $u_1(t)$ ($u_1(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1\geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2\geq 0$). When $D_2$ is equal to 0 (zero), there are signal points, from among $2^{g+h}$ signal points, that exist in the same position in the I (in-phase)-Q (quadrature(-phase)) plane).

In this case, $D_1\geq D_2$ ($D_1$ is greater than $D_2$) is satisfied.

FIG. 53 shows the relationship between the transmit antenna and the receive antenna. The modulated signal #1 (5301A) is transmitted from the transmit antenna #1 (5302A) in the transmission device, and the modulated signal #2 (5301B) is transmitted from the transmit antenna #2 (5302B) in the transmission device. In this case, $z_1(t)$ ($z_1(i)$) (i.e., $u_1(t)$ ($u_1(i)$) is transmitted from the transmit antenna #1 (5302A), and $z_2(t)$ ($z_2(i)$) (i.e., $u_2(t)$ ($u_2(i)$) is transmitted from the transmit antenna #2 (5302B).

The receive antenna #1 (5303X) and the receive antenna #2 (5303Y) in the reception device receive the modulated signals transmitted by the transmission device (obtain received signals 5304X and 5304Y). In this case, the propagation coefficient from the transmit antenna #1 (5302A) to the receive antenna #1 (5303X) is represented by $h_{11}(t)$, the propagation coefficient from the transmit antenna #1 (5302A) to the receive antenna #2 (5303Y) is represented by $h_{21}(t)$, the propagation coefficient from the receive antenna #2 (5302B) to the transmit antenna #1 (5303X) is represented by $h_{12}(t)$, and the propagation coefficient from the transmit antenna #2 (5302B) to the receive antenna #2 (5303Y) is represented by $h_{22}(t)$ (t is time).

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-11 is satisfied.

For a similar reason, it is desirable that Condition R-11' be satisfied when $|Q_1|<|Q_2|$ is satisfied.

<Condition R-11'>

The number of candidate signal points in the I (in-phase)-Q (quadrature(-phase)) plane in one symbol of the signal $u_1(t)$ ($u_1(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1 \geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2 \geq 0$). When $D_2$ is equal to 0 (zero), there are signal points, from among $2^{g+h}$ signal points, that exist in the same position in the I (in-phase)-Q(quadrature(-phase)) plane).

In this case, $D_1<D_2$ ($D_1$ is smaller than $D_2$) is satisfied.

In Case 8, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 9)

Case where processing in formula R5 is performed by using a precoding matrix shown in any of formulas R15-R30:

Formula R38 is considered as a formula obtained in the middle of calculation in formula R5. In Case 9, the precoding matrix F is a fixed precoding matrix, and expressed by any of formulas R15-R30. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g \neq h$ is satisfied.

In this case, a high spatial diversity gain can be obtained when Condition R-10 is satisfied.

As in Case 8, the following describes a case where Condition R-11 is satisfied when $|Q_1|>|Q_2|$ (the absolute value of $Q_1$ is greater than the absolute value of $Q_2$) is satisfied in formula R5.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-11 is satisfied.

For a similar reason, it is desirable that Condition R-11' be satisfied when $|Q_1|<|Q_2|$ is satisfied.

In Case 9, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 10)

Case where processing in formula R5 is performed by using a precoding matrix shown in any of formulas R31-R34:

Formula R38 is considered as a formula obtained in the middle of calculation in formula R5. In Case 10, the precoding matrix F is switched depending on a time (or a frequency). The precoding matrix F (F(i)) is expressed by any of formulas R31-R34.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g \neq h$ is satisfied.

In this case, a high spatial diversity gain can be obtained when the following Condition R-12 is satisfied.

<Condition R-12>

When the symbol number i is in a range of N to M inclusive (N and M are each an integer, and N<M (M is smaller than N) is satisfied), the modulation scheme for generating $s_1(t)$ ($s_1(i)$) (i.e., the baseband signal 505A) is set to be fixed (not switched), and the modulation scheme for generating $s_2(t)$ ($s_2(i)$) (i.e., the baseband signal 505B) is set to be fixed (not switched).

For each value of the symbol number i when the symbol number i is in a range of N to M inclusive, the number of candidate signal points in the I (in-phase)-Q (quadrature (-phase)) plane in one symbol of the signal $u_1(t)$ ($u_1(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, for each value of the symbol number i when the symbol number i is in a range of N to M inclusive, the number of candidate signal points in the I (in-phase)-Q (quadrature(-phase)) plane in one symbol of the signal $u_2(t)$ ($u_2(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

Considered is a case where Condition R-13 is satisfied when $|Q_1|>|Q_2|$ (the absolute value of $Q_1$ is greater than the absolute value of $Q_2$) is satisfied in formula R5.

<Condition R-13>

When the symbol number i is in a range of N to M inclusive (N and M are each an integer, and N<M (M is smaller than N) is satisfied), the modulation scheme for generating $s_1(t)$ ($s_1(i)$) (i.e., the baseband signal 505A) is set to be fixed (not switched), and the modulation scheme for generating $s_2(t)$ ($s_2(i)$) (i.e., the baseband signal 505B) is set to be fixed (not switched).

For each value of the symbol number i when the symbol number i is in a range of N to M inclusive, the number of candidate signal points in the I (in-phase)-Q (quadrature (-phase)) plane in one symbol of the signal $u_1(t)$ ($u_1(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In the symbol number i, a minimum Euclidian distance between $2^{g+h}$ candidate signal points for $u_1(t)$ ($u_1(i)$) in the I (in-phase)-Q (quadrature(-phase)) plane is represented by $D_1(i)$ ($D_1(i)$ is a real number equal to or greater than 0 (zero) ($D_1(i)\geq 0$). When $D_1(i)$ is equal to 0 (zero), there are signal points, from among $2^{g+h}$ signal points, that exist in the same position in the I (in-phase)-Q (quadrature(-phase)) plane).

For each value of the symbol number i when the symbol number i is in a range of N to M inclusive, the number of candidate signal points in the I (in-phase)-Q (quadrature (-phase)) plane in one symbol of the signal $u_2(t)$ ($u_2(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). In the symbol number i, a minimum Euclidian distance between $2^{g+h}$ candidate signal points for $u_2(t)$ ($u_2(i)$) in the I (in-phase)-Q (quadrature(-phase)) plane is represented by $D_2(i)$ ($D_2(i)$ is a real number equal to or greater than 0 (zero) ($D_2(i)\geq 0$). When $D_2(i)$ is equal to 0 (zero), there are signal points, from among $2^{g+h}$ signal points, that exist in the same position in the I (in-phase)-Q (quadrature(-phase)) plane).

In this case, for each value of the symbol number i when the symbol number is in a range of N to M inclusive. $D_1(i)>D_2(i)$ ($D_1(i)$ is greater than $D_2(i)$) is satisfied.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-13 is satisfied.

The reception device is likely to obtain high data reception quality when the following condition is satisfied.

For a similar reason, it is desirable that Condition R-13" be satisfied when $|Q_1|<|Q_2|$ is satisfied.

<Condition R-13">

When the symbol number i is in a range of N to M inclusive (N and M are each an integer, and N<M (M is smaller than N) is satisfied), the modulation scheme for generating $s_1(t)$ ($s_1(i)$) (i.e., the baseband signal 505A) is set to be fixed (not switched), and the modulation scheme for generating $s_2(t)$ ($s_2(i)$) (i.e., the baseband signal 505B) is set to be fixed (not switched).

For each value of the symbol number i when the symbol number i is in a range of N to M inclusive, the number of candidate signal points in the I (in-phase)-Q (quadrature (-phase)) plane in one symbol of the signal $u_1(t)$ ($u_1(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In the symbol number i, a minimum Euclidian distance between $2^{g+h}$ candidate signal points for $u_1(t)$ ($u_1(i)$) in the I (in-phase)-Q (quadrature(-phase)) plane is represented by $D_1(i)$ ($D_1(i)$ is a real number equal to or greater than 0 (zero) ($D_1(i)\geq 0$). When $D_1(i)$ is equal to 0 (zero), there are signal points, from among $2^{g+h}$ signal points, that exist in the same position in the I (in-phase)-Q (quadrature(-phase)) plane).

For each value of the symbol number i when the symbol number i is in a range of N to M inclusive, the number of candidate signal points in the I (in-phase)-Q (quadrature (-phase)) plane in one symbol of the signal $u_2(t)$ ($u_2(i)$) in formula R38 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). In the symbol number i, a minimum Euclidian distance between $2^{g+h}$ candidate signal points for $u_2(t)$ ($u_2(i)$) in the I (in-phase)-Q (quadrature(-phase)) plane is represented by $D_2(i)$ ($D_2(i)$ is a real number equal to or greater than 0 (zero) ($D_2(i)\geq 0$). When $D_2(i)$ is equal to 0 (zero), there are signal points, from among $2^{g+h}$ signal points, that exist in the same position in the I (in-phase)-Q (quadrature(-phase)) plane).

In this case, for each value of the symbol number i when the symbol number i is in a range of N to M inclusive, $D_1(i)<D_2(i)$ ($D_1(i)$ is smaller than $D_2(i)$) is satisfied.

In Case 10, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 11)

Case where processing in formula R8 is performed by using a fixed precoding matrix:

The following formula is considered as a formula obtained in the middle of calculation in formula R8.

[Math. 39]

$$\begin{pmatrix} u_1(i) \\ u_2(i) \end{pmatrix} = F\begin{pmatrix} s_1(i) \\ s_2(i) \end{pmatrix} = \begin{pmatrix} a(i) & b(i) \\ c(i) & d(i) \end{pmatrix}\begin{pmatrix} s_1(i) \\ s_2(i) \end{pmatrix} \qquad \text{(formula R39)}$$

In Case 11, the precoding matrix F is a fixed precoding matrix. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g\neq h$ is satisfied.

In this case, a high spatial diversity gain can be obtained when the following condition is satisfied.

<Condition R-14>

The number of candidate signal points in the I (in-phase)-Q (quadrature(-phase)) plane in one symbol of the signal $u_1(t)$ ($u_1(i)$) in formula R39 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points).

In addition, the number of candidate signal points in the I (in-phase)-Q (quadrature(-phase)) plane in one symbol of the signal $u_2(t)$ ($u_2(i)$) in formula R39 is $2^{g+h}$ (when signal points are generated in the I (in-phase)-Q (quadrature (-phase)) plane for each of values that the (g+h)-bit data can take in one symbol, $2^{g+h}$ signal points can be generated. This is the number of candidate signal points).

The following condition is considered when $|Q_1|>|Q_2|$ (the absolute value of $Q_1$ is greater than the absolute value of $Q_2$) is satisfied in formula R8.

<Condition R-15>

The number of candidate signal points in the I (in-phase)-Q (quadrature(-phase)) plane in one symbol of the signal $u_1(t)$ ($u_1(i)$) in formula R39 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1\geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R39 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2\geq 0$). When $D_2$ is equal to 0 (zero), there are signal points, from among $2^{g+h}$ signal points, that exist in the same position in the I (in-phase)-Q (quadrature(-phase)) plane).

In this case, $D_1>D_2$ ($D_1$ is greater than $D_2$) is satisfied.

FIG. 53 shows the relationship between the transmit antenna and the receive antenna. The modulated signal #1 (5301A) is transmitted from the transmit antenna #1 (5302A) in the transmission device, and the modulated signal #2 (5301B) is transmitted from the transmit antenna #2 (5302B) in the transmission device. In this case, $z_1(t)$ ($z_1(i)$) (i.e., $u_1(t)$ ($u_1(i)$)) is transmitted from the transmit antenna #1 (5302A), and $z_2(t)$ ($z_2(i)$) (i.e., $u_2(t)$ ($u_2(i)$)) is transmitted from the transmit antenna #2 (5302B).

The receive antenna #1 (5303X) and the receive antenna #2 (5303Y) in the reception device receive the modulated signals transmitted by the transmission device (obtain received signals 5304X and 5304Y). In this case, the propagation coefficient from the transmit antenna #1 (5302A) to the receive antenna #1 (5303X) is represented by $h_{11}(t)$, the propagation coefficient from the transmit antenna #1 (5302A) to the receive antenna #2 (5303Y) is represented by $h_{21}(t)$, the propagation coefficient from the receive antenna #2 (5302B) to the transmit antenna #1 (5303X) is represented by $h_{12}(t)$, and the propagation coefficient from the transmit antenna #2 (5302B) to the receive antenna #2 (5303Y) is represented by $h_{22}(t)$ (t is time).

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-15 is satisfied.

For a similar reason, it is desirable that Condition R-15' be satisfied when $|Q_1|<|Q_2|$ is satisfied.

<Condition R-15'>

The number of candidate signal points in the I (in-phase)-Q (quadrature(-phase)) plane in one symbol of the signal $u_1(t)$ ($u_1(i)$) in formula R39 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between $2^{g+h}$ candidate signal points for $u_1(t)$ ($u_1(i)$) in the I (in-phase)-Q (quadrature(-phase)) plane is represented by $D_1$ ($D_1$ is a real number equal to or greater than 0 (zero) ($D_1\geq 0$). When $D_1$ is equal to 0 (zero), there are signal points, from among $2^{g+h}$ signal points, that exist in the same position in the I (in-phase)-Q (quadrature(-phase)) plane).

The number of candidate signal points in the I (in-phase)-Q (quadrature(-phase)) plane in one symbol of the signal $u_2(t)$ ($u_2(i)$) in formula R39 is $2^{g+h}$ (when signal points are generated in the I (in-phase)-Q (quadrature(-phase)) plane for each of values that the (g+h)-bit data can take in one symbol, $2^{g+h}$ signal points can be generated. This is the number of candidate signal points). A minimum Euclidian distance between 2 candidate signal points for $u_2(t)$ ($u_2(i)$) in the I (in-phase)-Q (quadrature(-phase)) plane is represented by $D_2$ ($D_2$ is a real number equal to or greater than 0 (zero) ($D_2\geq 0$). When $D_2$ is equal to 0 (zero), there are signal points, from among $2^{g+h}$ signal points, that exist in the same position in the I (in-phase)-Q (quadrature(-phase)) plane).

In this case, $D_1<D_2$ ($D_1$ is smaller than $D_2$) is satisfied.

In Case 11, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

(Case 12)

Case where processing in formula R8 is performed by using a precoding matrix shown in any of formulas R15-R30:

Formula R39 is considered as a formula obtained in the middle of calculation in formula R8. In Case 12, the precoding matrix F is a fixed precoding matrix, and expressed by any of formulas R15-R30. The precoding matrix, however, may be switched when the modulation scheme for generating $s_1(t)$ ($s_1(i)$) and/or the modulation scheme for generating $s_2(t)$ ($s_2(i)$) are/is switched.

The modulation level of the modulation scheme for generating $s_1(t)$ ($s_1(i)$) (i.e., the baseband signal 505A) is represented by $2^g$ (g is an integer equal to or greater than one), the modulation level of the modulation scheme for generating $s_2(t)$ ($s_2(i)$) (i.e., the baseband signal 505B) is represented by $2^h$ (h is an integer equal to or greater than one), and $g\neq h$ is satisfied.

In this case, a high spatial diversity gain can be obtained when Condition R-14 is satisfied.

As in Case 11, the following describes a case where Condition R-15 is satisfied when $|Q_1|>|Q_2|$ (the absolute value of $Q_1$ is greater than the absolute value of $Q_2$) is satisfied in formula R8.

In this case, since $|Q_1|>|Q_2|$ is satisfied, a reception status of the modulated signal for $z_1(t)$ ($z_1(i)$) (i.e., $u_1(t)$ ($u_1(i)$)) can be a dominant factor of reception quality of the received data. Therefore, the reception device is likely to obtain high data reception quality when Condition R-15 is satisfied.

For a similar reason, it is desirable that Condition R-15' be satisfied when $|Q_1|<|Q_2|$ is satisfied.

In Case 12, QPSK, 16QAM, 64QAM, and 256QAM are applied, for example, as the modulation scheme for generating $s_1(t)$ ($s_1(i)$) and the modulation scheme for generating $s_2(t)$ ($s_2(i)$) as described above. A specific mapping scheme in this case is as described above in this configuration example. However, modulation schemes other than QPSK, 16QAM, 64QAM, and 256QAM are also applicable.

As described above in this configuration example, in the transmission scheme of transmitting, from different antennas, two modulated signals on which precoding has been performed, the reception device is more likely to obtain high data reception quality by increasing the minimum Euclidian distance in the I (in-phase)-Q (quadrature(-phase)) plane between signal points corresponding to one of the modulated signals having a higher average transmission power.

Each of the transmit antenna and the receive antenna described above in this configuration example may be composed of a plurality of antennas. The different antennas for transmitting the respective two modulated signals on which precoding has been performed may be used so as to simultaneously transmit one modulated signal at another time.

The precoding scheme described above is implemented in a similar manner when it is applied to a single carrier scheme, a multicarrier scheme, such as an OFDM scheme and an OFDM scheme using wavelet transformation, and a spread spectrum scheme.

Specific examples pertaining to the present embodiment are described in detail later in embodiments, and an operation of the reception device is also described later.

Configuration Example S1

In this configuration example, a more specific example of the precoding scheme when two transmission signals have different average transmission powers, which is described in Configuration Example R1, is described.

FIG. 5 shows one example of the configuration of the part of the transmission device in the base station (e.g. the broadcasting station and the access point) for generating modulated signals when the transmission scheme is switchable.

The transmission device in the base station (e.g. the broadcasting station and the access point) is described with use of FIG. 5.

The encoder 502 in FIG. 5 receives the information 501 and the control signal 512 as inputs, performs encoding based on information on the coding rate and the code length (block length) included in the control signal 512, and outputs the encoded data 503.

The mapper 504 receives the encoded data 503 and the control signal 512 as inputs. The control signal 512 is assumed to designate the transmission scheme for transmitting two streams. In addition, the control signal 512 is assumed to designate modulation schemes α and β as modulation schemes for modulating two streams. The modulation schemes α and β are modulation schemes for modulating x-bit data and y-bit data, respectively (for example, the modulation scheme for modulating 4-bit data in the case of using 16QAM (16 Quadrature Amplitude Modulation), and the modulation scheme for modulating 6-bit data in the case of using 64QAM (64 Quadrature Amplitude Modulation)).

The mapper 504 modulates x-bit data of (x+y)-bit data by using the modulation scheme α to generate the baseband signal $s_1(t)$ (505A), and outputs the baseband signal $s_1(t)$. The mapper 504 modulates remaining y-bit data of the (x+y)-bit data by using the modulation scheme β, and outputs the baseband signal $s_2(t)$ (505B) (In FIG. 5, the number of mappers is one. As another configuration, however, a mapper for generating $s_1(t)$ and a mapper for generating $s_2(t)$ may separately be provided. In this case, the encoded data 503 is distributed to the mapper for generating $s_1(t)$ and the mapper for generating $s_2(t)$).

Note that $s_1(t)$ and $s_2(t)$ are expressed in complex numbers ($s_1(t)$ and $s_2(t)$, however, may be either complex numbers or real numbers), and t is a time. When a transmission scheme, such as OFDM (Orthogonal Frequency Division Multiplexing), of using multi-carriers is used, $s_1$ and $s_2$ may be considered as functions of a frequency f, which are expressed as $s_1(f)$ and $s_2(f)$, and as functions of the time t and the frequency f, which are expressed as $s_1(t,f)$ and $s_2(t,f)$.

Hereinafter, the baseband signals, precoding matrices, and phase changes are described as functions of the time t, but may be considered as the functions of the frequency for the functions of the time t and the frequency f.

The baseband signals, precoding matrices, and phase changes are thus also described as functions of a symbol number i, but, in this case, may be considered as the functions of the time t, the functions of the frequency f, or the functions of the time t and the frequency f. That is to say, symbols and baseband signals may be generated in the time domain and arranged, and may be generated in the frequency domain and arranged. Alternatively, symbols and baseband signals may be generated in the time domain and in the frequency domain and arranged.

The power changer 506A (the power adjuster 506A) receives the baseband signal $s_1(t)$ (505A) and the control signal 512 as inputs, sets the real number $P_1$ based on the control signal 512, and outputs $P_1 \times s_1(t)$ as the power-changed signal 507A (although $P_1$ is described as a real number, $P_1$ may be a complex number).

Similarly, the power changer 506B (the power adjuster 506B) receives the baseband signal $s_2(t)$ (505B) and the control signal 512 as inputs, sets the real number $P_2$, and outputs $P_2 \times s_2(t)$ as the power-changed signal 507B (although $P_2$ is described as a real number, $P_2$ may be a complex number).

The weighting unit 508 receives the power-changed signals 507A and 507B, and the control signal 512 as inputs, and sets the precoding matrix F (or F(i)) based on the control signal 512. Letting a slot number (symbol number) be i, the weighting unit 508 performs the following calculation.

[Math. 40]

$$\begin{aligned}\begin{pmatrix}u_1(i)\\u_2(i)\end{pmatrix} &= F\begin{pmatrix}P_1\times s_1(i)\\P_2\times s_2(i)\end{pmatrix}\\ &= \begin{pmatrix}a(i)&b(i)\\c(i)&d(i)\end{pmatrix}\begin{pmatrix}P_1\times s_1(i)\\P_2\times s_2(i)\end{pmatrix}\\ &= \begin{pmatrix}a(i)&b(i)\\c(i)&d(i)\end{pmatrix}\begin{pmatrix}P_1&0\\0&P_2\end{pmatrix}\begin{pmatrix}s_1(i)\\s_2(i)\end{pmatrix}\end{aligned} \quad \text{(formula S1)}$$

Herein, a(i), b(i), c(i), and d(i) can be expressed in complex numbers (may be real numbers), and the number of zeros among a(i), b(i), c(i), and d(i) should not be three or more. The precoding matrix may or may not be the function of i. When the precoding matrix is the function of i, the precoding matrix is switched depending on the slot number (symbol number).

The weighting unit 508 outputs $u_1(i)$ in formula S1 as the weighted signal 509A, and outputs $u_2(i)$ in formula S1 as the weighted signal 509B.

The power changer 510A receives the weighted signal 509A ($u_1(i)$) and the control signal 512 as inputs, sets the real number $Q_1$ based on the control signal 512, and outputs $Q_1 \times u_1(t)$ as the power-changed signal 511A ($z_1(i)$) (although $Q_1$ is described as a real number, $Q_1$ may be a complex number).

Similarly, the power changer 510B receives the weighted signal 509B ($u_2(i)$) and the control signal 512 as inputs, sets the real number $Q_2$ based on the control signal 512, and outputs $Q_2 \times u_2(t)$ as the power-changed signal 511A ($z_2(i)$) (although $Q_2$ is described as a real number, $Q_2$ may be a complex number).

Thus, the following formula is satisfied.

[Math. 41]

$$\begin{aligned}\begin{pmatrix} z_1(i) \\ z_2(i) \end{pmatrix} &= \begin{pmatrix} Q_1 & 0 \\ 0 & Q_2 \end{pmatrix} F \begin{pmatrix} P_1 \times s_1(i) \\ P_2 \times s_2(i) \end{pmatrix} \\ &= \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix} \\ &= \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix}\end{aligned} \quad \text{(formula S2)}$$

A different transmission scheme for transmitting two streams than that shown in FIG. 5 is described next, with use of FIG. 6. In FIG. 6, components operating in a similar manner to those shown in FIG. 5 bear the same reference signs.

The phase changer 601 receives $u_2(i)$ in formula S1, which is the weighted signal 509B, and the control signal 512 as inputs, and performs phase change on $u_2(i)$ in formula S1, which is the weighted signal 509B, based on the control signal 512. Thus, a signal obtained by performing phase change on $u_2(i)$ in formula S1, which is the weighted signal 509B, is expressed as $e^{j\theta(i)} \times u_2(i)$, and the phase changer 601 outputs $e^{j\theta(i)} \times u_2(i)$ as the phase-changed signal 602 (j is an imaginary unit). The characterizing portion is that a value of changed phase is a function of i, which is expressed as θ(i).

The power changers 510A and 510B in FIG. 6 each perform power change on an input signal. Thus, $z_1(i)$ and $z_2(i)$, which are respectively outputs of the power changers 510A and 510B in FIG. 6, are expressed by the following formula.

[Math. 42]

$$\begin{aligned}\begin{pmatrix} z_1(i) \\ z_2(i) \end{pmatrix} &= \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} \\ &= \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix} \\ &= \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix}\end{aligned} \quad \text{(formula S3)}$$

FIG. 7 shows a different scheme for achieving formula S3 than that shown in FIG. 6. FIG. 7 differs from FIG. 6 in that the order of the power changer and the phase changer is switched (the functions to perform power change and phase change themselves remain unchanged). In this case, $z_1(i)$ and $z_2(i)$ are expressed by the following formula.

[Math. 43]

$$\begin{aligned}\begin{pmatrix} z_1(i) \\ z_2(i) \end{pmatrix} &= \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} \\ &= \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 \times s_1(i) \\ P_2 \times s_2(i) \end{pmatrix} \\ &= \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix}\end{aligned} \quad \text{(formula S4)}$$

Note that $z_1(i)$ in formula S3 is equal to $z_1(i)$ in formula S4, and $z_2(i)$ in formula S3 is equal to $z_2(i)$ in formula S4.

When a value of changed phase θ(i) in formulas S3 and S4 is set such that θ(i+1)−θ(i) is a fixed value, for example, reception devices are likely to obtain high data reception quality in a radio-wave propagation environment where direct waves are dominant. How to give the value of changed phase θ(i), however, is not limited to the above-mentioned example.

FIG. 8 shows one example of a configuration of a signal processing unit for performing processing on the signals $z_1(i)$ and $z_2(i)$, which are obtained in FIGS. 5-7.

The inserting unit 804A receives the signal $z_1(i)$ (801A), the pilot symbol 802A, the control information symbol 803A, and the control signal 512 as inputs, inserts the pilot symbol 802A and the control information symbol 803A into the signal (symbol) $z_1(i)$ (801A) in accordance with the frame structure included in the control signal 512, and outputs the modulated signal 805A in accordance with the frame structure.

The pilot symbol 802A and the control information symbol 803A are symbols having been modulated by using a modulation scheme such as BPSK (Binary Phase Shift Keying) and QPSK (Quadrature Phase Shift Keying). Note that the other modulation schemes may be used.

The wireless unit 806A receives the modulated signal 805A and the control signal 512 as inputs, performs processing such as frequency conversion and amplification on the modulated signal 805A based on the control signal 512 (processing such as inverse Fourier transformation is performed when the OFDM scheme is used), and outputs the transmission signal 807A. The transmission signal 807A is output from the antenna 808A as a radio wave.

The inserting unit 804B receives the signal $z_2(i)$ (801B), the pilot symbol 802B, the control information symbol 803B, and the control signal 512 as inputs, inserts the pilot symbol 802B and the control information symbol 803B into the signal (symbol) $z_2(i)$ (801B) in accordance with a frame structure included in the control signal 512, and outputs the modulated signal 805A in accordance with the frame structure.

The pilot symbol 802B and the control information symbol 803B are symbols having been modulated by using a modulation scheme such as BPSK (Binary Phase Shift Keying) and QPSK (Quadrature Phase Shift Keying). Note that the other modulation schemes may be used.

The wireless unit 806B receives the modulated signal 805B and the control signal 512 as inputs, performs processing such as frequency conversion and amplification on the modulated signal 805B based on the control signal 512 (processing such as inverse Fourier transformation is performed when the OFDM scheme is used), and outputs the transmission signal 807B. The transmission signal 807B is output from the antenna 808B as a radio wave.

In this case, when i is set to the same number in the signal $z_1(i)$ (801A) and the signal $z_2(i)$ (801B), the signal $z_1(i)$ (801A) and the signal $z_2(i)$ (801B) are transmitted from different antennas at the same (shared/common) frequency at the same time (i.e., transmission is performed by using the MIMO scheme).

The pilot symbol 802A and the pilot symbol 802B are each a symbol for performing signal detection, frequency offset estimation, gain control, channel estimation. etc. in the reception device. Although referred to as a pilot symbol, the pilot symbol may be referred to as a reference symbol, or the like.

The control information symbol 803A and the control information symbol 803B are each a symbol for transmitting, to the reception device, information on a modulation scheme, a transmission scheme, a precoding scheme, an error correction coding scheme, and a coding rate and a block length (code length) of an error correction code each used by the transmission device. The control information symbol may be transmitted by using only one of the control information symbol 803A and the control information symbol 803B.

FIG. 9 shows one example of the frame structure in the time-frequency domain when two streams are transmitted. In FIG. 9, the horizontal and vertical axes respectively represent a frequency and a time. FIG. 9 shows the structure of symbols in a range of carrier 1 to carrier 38 and time $1 to time $11.

FIG. 9 shows the frame structure of the transmission signal transmitted from the antenna 806A and the frame structure of the transmission signal transmitted from the antenna 808B in FIG. 8 together.

In FIG. 9, in the case of a frame of the transmission signal transmitted from the antenna 806A in FIG. 8, a data symbol corresponds to the signal (symbol) $z_1(i)$. A pilot symbol corresponds to the pilot symbol 802A.

In FIG. 9, in the case of a frame of the transmission signal transmitted from the antenna 806B in FIG. 8, a data symbol corresponds to the signal (symbol) $z_2(i)$. A pilot symbol corresponds to the pilot symbol 802B.

Therefore, as set forth above, when i is set to the same number in the signal $z_1(i)$ (801A) and the signal $z_2(i)$ (801B), the signal $z_1(i)$ (801A) and the signal $z_2(i)$ (801B) are transmitted from different antennas at the same (shared/common) frequency at the same time. The structure of the pilot symbols is not limited to that shown in FIG. 9. For example, time intervals and frequency intervals of the pilot symbols are not limited to those shown in FIG. 9. The frame structure in FIG. 9 is such that pilot symbols are transmitted from the antennas 806A and 806B in FIG. 8 at the same time at the same frequency (the same (sub)carrier). The frame structure, however, is not limited to that shown in FIG. 9. For example, the frame structure may be such that pilot symbols are arranged at the antenna 806A in FIG. 8 at the time A at the frequency a ((sub)carrier a) and no pilot symbols are arranged at the antenna 806B in FIG. 8 at the time A at the frequency a ((sub)carrier a), and no pilot symbols are arranged at the antenna 806A in FIG. 8 at the time B at the frequency b ((sub)carrier b) and pilot symbols are arranged at the antenna 806B in FIG. 8 at the time B at the frequency b ((sub)carrier b).

Although only data symbols and pilot symbols are shown in FIG. 9, other symbols, such as control information symbols, may be included in a frame.

Description has been made so far on a case where one or more (or all) of the power changers exist, with use of FIGS. 5-7. However, there are cases where one or more of the power changers do not exist.

For example, in FIG. 5, when the power changer (power adjuster) 506A and the power changer (power adjuster) 506B do not exist, $z_1(i)$ and $z_2(i)$ are expressed as follows.

[Math. 44]

$$\begin{pmatrix} z_1(i) \\ z_2(i) \end{pmatrix} = \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula S5)}$$

In FIG. 5, when the power changer (power adjuster) 510A and the power changer (power adjuster) 510B do not exist, $z_1(i)$ and $z_2(i)$ are expressed as follows.

[Math. 45]

$$\begin{pmatrix} z_1(i) \\ z_2(i) \end{pmatrix} = \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S6)}$$

In FIG. 5, when the power changer (power adjuster) 506A, the power changer (power adjuster) 506B, the power changer (power adjuster) 510A, and the power changer (power adjuster) 510B do not exist, $z_1(i)$ and $z_2(i)$ are expressed as follows.

[Math. 46]

$$\begin{pmatrix} z_1(i) \\ z_2(i) \end{pmatrix} = \begin{pmatrix} a(i) & b(i) \\ c(i) & d(i) \end{pmatrix} \begin{pmatrix} s_1(i) \\ s_2(i) \end{pmatrix} \quad \text{(formula S7)}$$

For example, in FIGS. 6 and 7, when the power changer (power adjuster) 506A and the power changer (power adjuster) 506B do not exist, $z_1(i)$ and $z_2(i)$ are expressed as follows.

[Math. 47]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula S8)}$$

In FIGS. 6 and 7, when the power changer (power adjuster) 510A and the power changer (power adjuster) 510B do not exist, $z_1(i)$ and $z_2(i)$ are expressed as follows.

[Math. 48]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S9)}$$

In FIGS. 6 and 7, when the power changer (power adjuster) 506A, the power changer (power adjuster) 506B, the power changer (power adjuster) 510A, and the power changer (power adjuster) 510B do not exist, $z_1(i)$ and $z_2(i)$ are expressed as follows.

[Math. 49]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula S10)}$$

The following describes a more specific example of the precoding scheme when two transmission signals have different average transmission powers, which is described in Configuration Example R1, at the time of using the above-mentioned transmission scheme for transmitting two streams (the MIMO (Multiple Input Multiple Output) scheme).

Example 1

In the following description, in the mapper 504 in FIGS. 5-7, 16QAM and 64QAM are applied as a modulation scheme for obtaining $s_1(t)$ ($s_1(i)$) and a modulation scheme for obtaining $s_2(t)$ ($s_2(i)$), respectively. The following describes examples of the structure of the precoding matrix (F) and conditions regarding power change when precoding shown in any of formulas S2, S3, S4, S5, and S8 and/or power change are/is performed.

Figure 10:
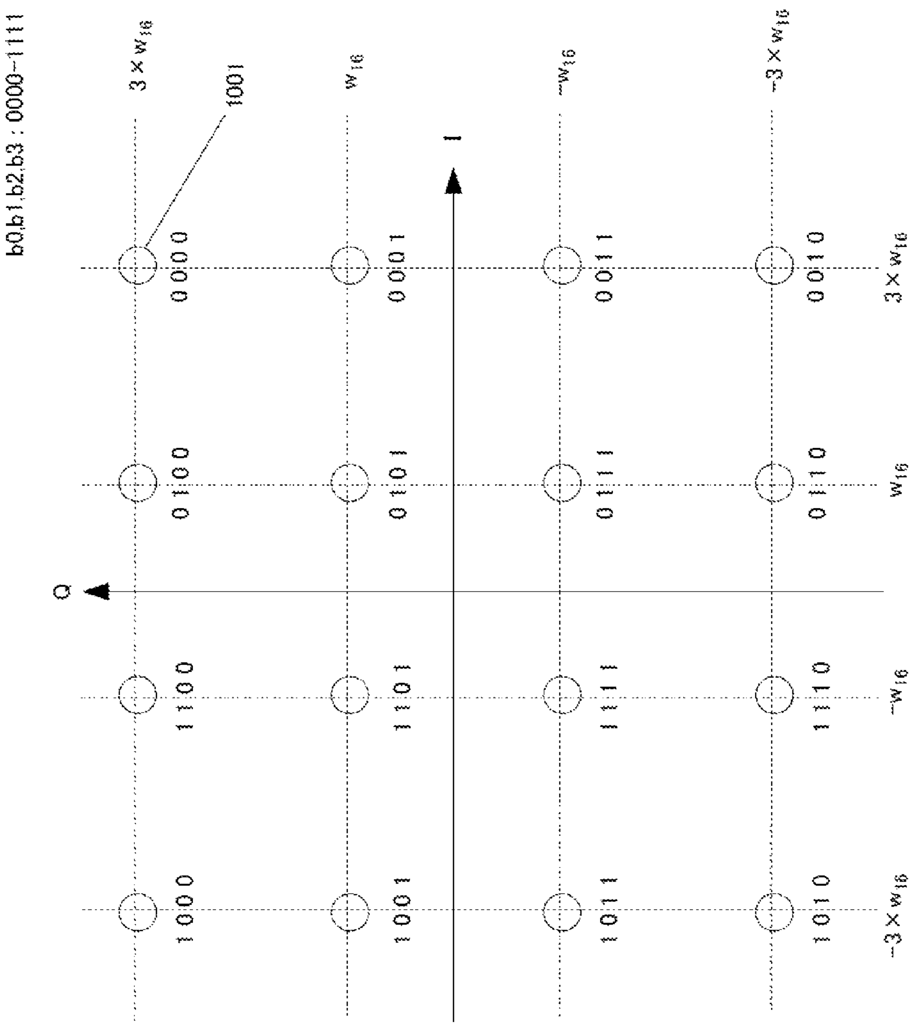
FIG. 10 shows an example of constellation of signal points for 16QAM in the I-Q plane.

A mapping scheme for 16QAM is described first below. FIG. 10 shows an example of signal point constellation for 16QAM in the I (in-phase)-Q (quadrature(-phase)) plane. In FIG. 10, 16 circles represent signal points for 16QAM, and the horizontal and vertical axes respectively represent I and Q.

Coordinates of the 16 signal points (i.e., the circles in FIG. 10) for 16QAM in the I (in-phase)-Q (quadrature(-phase)) plane are $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$, where $w_{16}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to a signal point 1001 in FIG. 10. When an in-phase component and a quadrature component of the baseband signal obtained as a result of mapping are respectively represented by I and Q, $(I, Q)=(3w_{16}, 3w_{16})$ is satisfied.

That is to say, the in-phase component I and the quadrature component Q of the baseband signal obtained as a result of mapping (at the time of using 16QAM) are determined based on the transmitted bits (b0, b1, b2, b3). One example of a relationship between values (0000-1111) of a set of b0, b1, b2, and b3 and coordinates of signal points is as shown in FIG. 10. The values 0000-1111 of the set of b0, b1, b2, and b3 are shown directly below the 16 signal points (i.e., the circles in FIG. 10) for 16QAM, which are $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$. Coordinates, in the I (in-phase)-Q (quadrature(-phase)) plane, of the signal points (i.e., the circles) directly above the values 0000-1111 of the set of b0, b1, b2, and b3 indicate the in-phase component I and the quadrature component Q of the baseband signal obtained as a result of mapping. The relationship between the values (0000-1111) of the set of b0, b1, b2, and b3 for 16QAM and coordinates of signal points is not limited to that shown in FIG. 10. Values obtained by expressing the in-phase component I and the quadrature component Q of the baseband signal obtained as a result of mapping (at the time of using 16QAM) in complex numbers correspond to the baseband signal ($s_1(t)$ or $s_2(t)$) in FIGS. 5-7.

Figure 11:
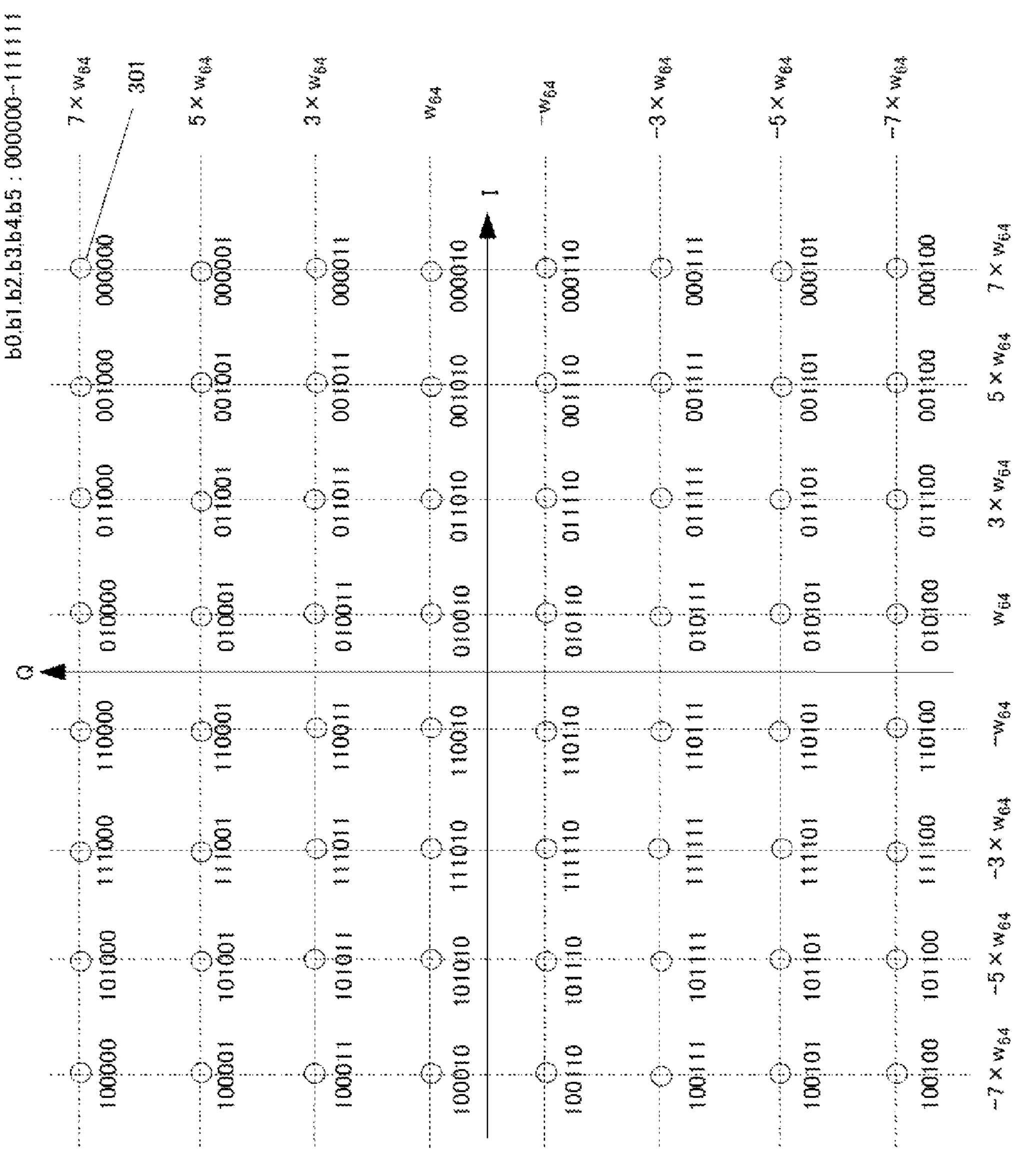
FIG. 11 shows an example of constellation of signal points for 64QAM in the I-Q plane.

A mapping scheme for 64QAM is described below. FIG. 11 shows an example of signal point constellation for 64QAM in the I (in-phase)-Q (quadrature(-phase)) plane. In FIG. 11, 64 circles represent signal points for 64QAM, and the horizontal and vertical axes respectively represent I and Q.

Coordinates of the 64 signal points (i.e., the circles in FIG. 11) for 64QAM in the I (in-phase)-Q (quadrature(-phase)) plane are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$,
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$,
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$,
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$,
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$, where $w_{64}$ is a real number greater than 0.

Here, transmitted bits (input bits) are represented by b0, b1, b2, b3, b4, and b5. For example, when (b0, b1, b2, b3, b4, b5)=(0, 0, 0, 0, 0) for the transmitted bits, mapping is performed to a signal point 1101 in FIG. 11. When an in-phase component and a quadrature component of the baseband signal obtained as a result of mapping are respectively represented by I and Q, $(I, Q)=(7w_{64}, 7w_{64})$ is satisfied.

That is to say, the in-phase component I and the quadrature component Q of the baseband signal obtained as a result of mapping (at the time of using 64QAM) are determined based on the transmitted bits (b0, b1, b2, b3, b4, b5). One example of a relationship between values (000000-111111) of a set of b0, b1, b2, b3, b4, and b5 and coordinates of signal points is as shown in FIG. 11. The values 000000-111111 of the set of b0, b1, b2, b3, b4, and b5 are shown directly below the 64 signal points (i.e., the circles in FIG. 11) for 64QAM, which are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$,
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$,
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$, $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$, $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$. Coordinates, in the I (in-phase)-Q (quadrature(-phase)) plane, of the signal points (i.e., the circles) directly above the values 000000-111111 of the set of b0, b1, b2, b3, b4, and b5 indicate the in-phase component I and the quadrature component Q of the baseband signal obtained as a result of mapping. The relationship between the values (000000-111111) of the set of b0, b1, b2, b3, b4, and b5 for 64QAM and coordinates of signal points is not limited to that shown in FIG. 11. Values obtained by expressing the in-phase component I and the quadrature component Q of the baseband signal obtained as a result of mapping (at the time of using 64QAM) in complex numbers correspond to the baseband signal ($s_1(t)$ or $s_2(t)$) in FIGS. 5-7.

This example shows the structure of the precoding matrix when 16QAM and 64QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, in FIGS. 5-7.

In this case, the baseband signal 505A ($s_1(t)$ ($s_1(i)$)) and the baseband signal 505B ($s_2(t)$ ($s_2(i)$)), which are outputs of the mapper 504 shown in FIGS. 5-7, are typically set to have an equal average power. Thus, the following formulas are satisfied for the coefficients $w_{16}$ and $w_{64}$ described in the above-mentioned explanations on the mapping schemes for 16QAM and 64QAM, respectively.

[Math. 50]

$$w_{16} = \frac{z}{\sqrt{10}} \quad \text{(formula S11)}$$

[Math. 51]

$$w_{64} = \frac{z}{\sqrt{42}} \quad \text{(formula S12)}$$

In formulas S11 and S12, z is a real number greater than 0. The following describes the precoding matrix F used when calculation in the following cases is performed.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 52]

$$F = \begin{pmatrix} a(i) & b(i) \\ c(i) & d(i) \end{pmatrix} \quad \text{(formula S13)}$$

The structure of the above-mentioned precoding matrix F and the relationship between $Q_1$ and $Q_2$ are described in detail below in Example 1-1 to Example 1-8.

Example 1-1

In any of the above-mentioned cases <1> to <5>, the precoding matrix F is set to the precoding matrix F in any of the following formulas.

[Math. 53]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S14)}$$

or

[Math. 54]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{(formula S15)}$$

or

[Math. 55]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S16)}$$

or

[Math. 56]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{(formula S17)}$$

In formulas S14, S15, S16, and S17, α may be either a real number or an imaginary number, and β may be either a real number or an imaginary number. However, α is not 0 (zero). Similarly, β is not 0 (zero).

In this configuration example (common to the other examples in the present description), a unit of phase, such as argument, in the complex plane is expressed in "radian" (when "degree" is exceptionally used, it indicates the unit).

Use of the complex plane allows for display of complex numbers in polar form in the polar coordinate system. When a point (a, b) in the complex plane is associated with a complex number z=a+jb (a and b are each a real number, and j is an imaginary unit), and this point is expressed as [r, θ] in the polar coordinate system, $$a = r \times \cos\theta,$$

$$b = r \times \sin\theta, \text{ and}$$

formula 49 are satisfied.

Herein, r is the absolute value of z (r=|z|), and θ is argument. Thus, z=a+jb is expressed as $re^{j\theta}$. Although shown as $e^{j\pi}$ in formulas S14 to S17, for example, the unit of argument π is "radian".

In this case, values of α that allow the reception device to obtain high data reception quality are considered.

The values of α that allow the reception device to obtain high data reception quality when attention is focused on the signal $z_1(t)$ ($z_1(i)$) in formulas S2, S3, S4, S5, and S8 are as follows.

When α is a real number:

[Math. 57]

$$\alpha = \frac{\sqrt{42}}{\sqrt{10}} \times \frac{5}{4} \quad \text{(formula S18)}$$

or

[Math. 58]

$$\alpha = -\frac{\sqrt{42}}{\sqrt{10}} \times \frac{5}{4} \quad \text{(formula S19)}$$

When $\alpha$ is an imaginary number:

[Math. 59]

$$\alpha = \frac{\sqrt{42}}{\sqrt{10}} \times \frac{5}{4} \times e^{j\frac{\pi}{2}} \quad \text{(formula S20)}$$

or

[Math. 60]

$$\alpha = \frac{\sqrt{42}}{\sqrt{10}} \times \frac{5}{4} \times e^{j\frac{3\pi}{2}} \quad \text{(formula S21)}$$

In the meantime, 16QAM and 64QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively. Therefore, when precoding (as well as phase change and power change) is performed as described above to transmit a modulated signal from each antenna, the total number of bits in symbols transmitted from the antennas 808A and 808B in FIG. 8 at the (unit) time u at the frequency (carrier) v is 10 bits, which is the sum of 4 bits (transmitted by using 16QAM) and 6 bits (transmitted by using 64QAM).

When input bits used to perform mapping for 16QAM are represented by $b_{0,16}$, $b_{1,16}$, $b_{2,16}$, and $b_{3,16}$, and input bits used to perform mapping for 64QAM are represented by $b_{0,64}$, $b_{11,64}$, $b_{2,64}$, $b_{3,64}$, $b_{4,64}$, and $b_{5,64}$, even if $\alpha$ is set to $\alpha$ in any of formulas S18, S19, S20, and S21, concerning the signal $z_1(t)$ ($z_1(i)$), signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1) exist in the I (in-phase)-Q (quadrature(-phase)) plane.

Similarly, concerning the signal $z_2(t)$ ($z_2(i)$), signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) exist in the I (in-phase)-Q (quadrature(-phase)) plane.

Formulas S18 to S21 are shown above as "the values of $\alpha$ that allow the reception device to obtain high data reception quality when attention is focused on the signal $z_1(t)$ ($z_1(i)$) in formulas S2, S3, S4, S5, and S8". Description is made on this point.

Concerning the signal $z_1(t)$ ($z_1(i)$), signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) exist in the I (in-phase)-Q (quadrature(-phase)) plane. It is desirable that these $2^{10}$=1024 signal points exist without overlapping one another in the I (in-phase)-Q (quadrature (-phase)) plane.

The reason is as follows. When the modulated signal transmitted from the antenna for transmitting the signal $z_2(t)$ ($z_2(i)$) does not reach the reception device, the reception device performs detection and error correction decoding by using the signal $z_1(t)$ ($z_1(i)$). In this case, it is desirable that "1024 signal points exist without overlapping one another" in order for the reception device to obtain high data reception quality.

Figure 12:
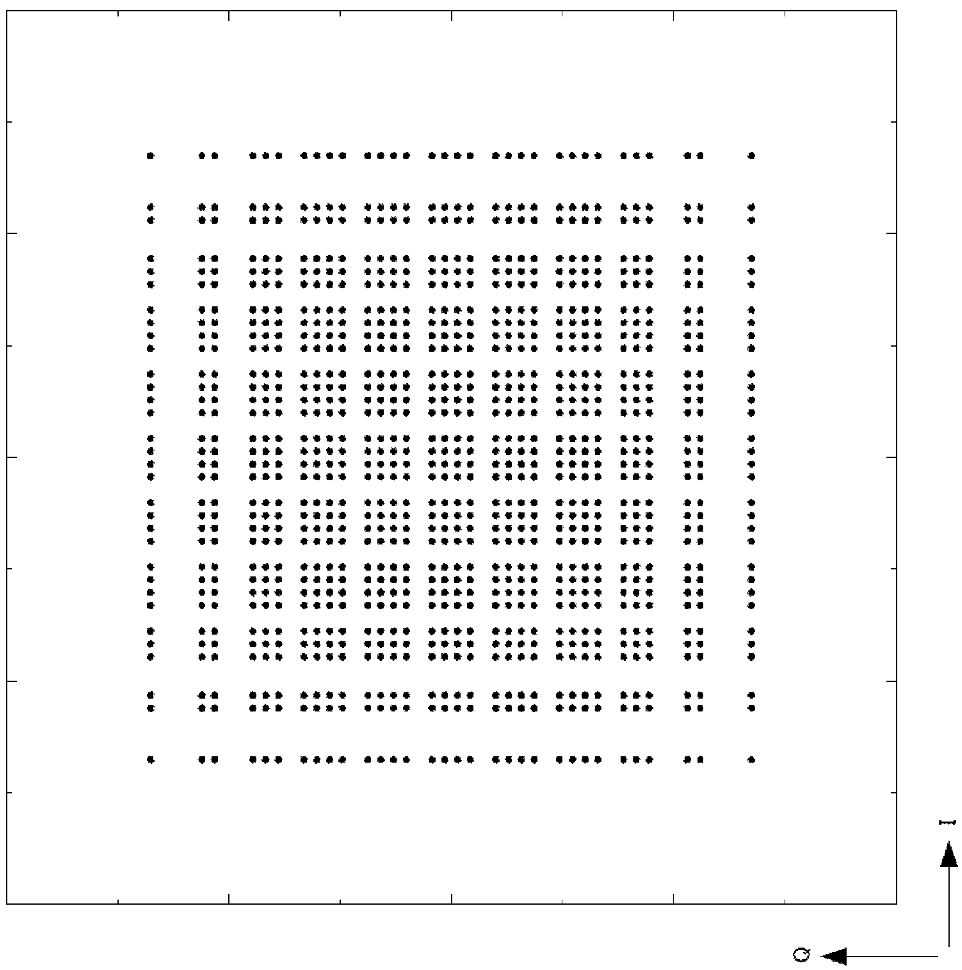
FIG. 12 shows an example of constellation of signal points in the I-Q plane.

When the precoding matrix F is set to the precoding matrix F in any of formulas S14, S15, S16, and S17, and $\alpha$ is set to $\alpha$ in any of formulas S18, S19, S20, and S21, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1, 1) are arranged in the I (in-phase)-Q (quadrature(-phase)) plane as shown in FIG. 12. In FIG. 12, the horizontal and vertical axes respectively represent I and Q, and black circles represent the signal points.

As can be seen from FIG. 12, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

Figure 13:
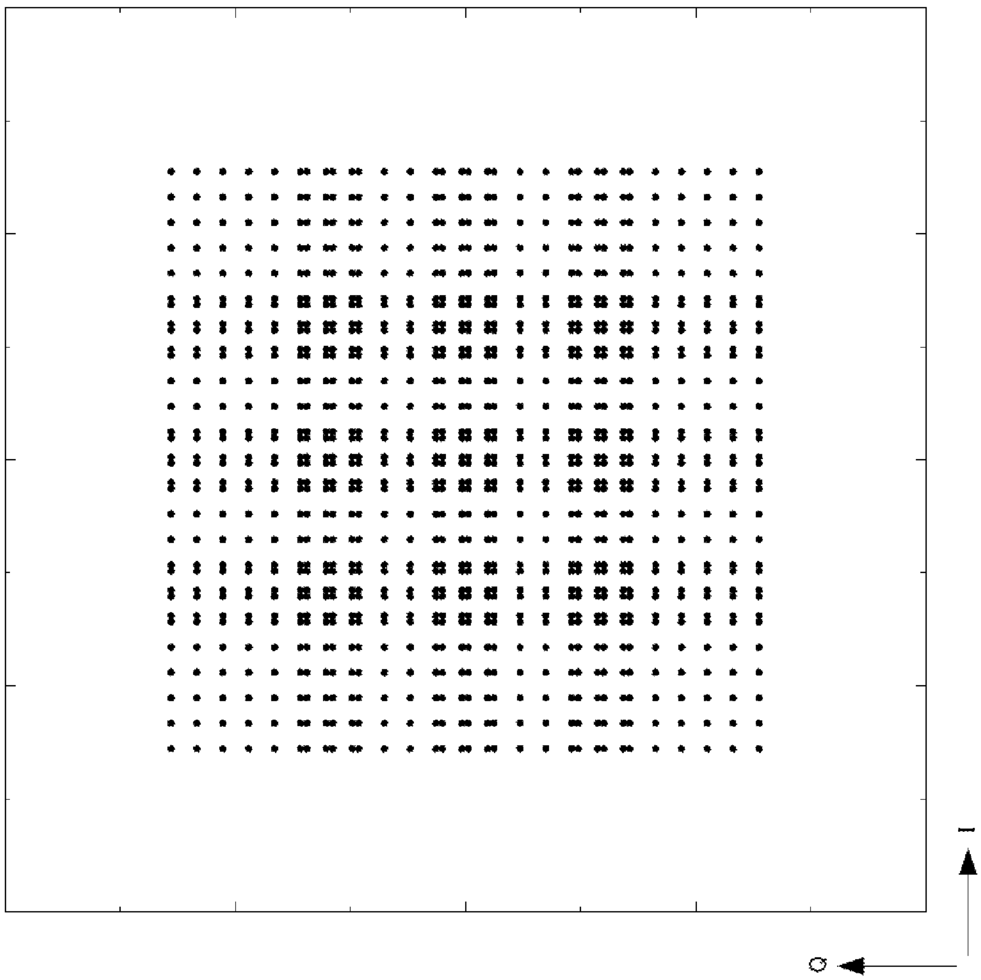
FIG. 13 shows an example of constellation of signal points in the I-Q plane.

When the precoding matrix F is set to the precoding matrix F in any of formulas S14, S15, S16, and S17, and $\alpha$ is set to $\alpha$ in any of formulas S18, S19, S20, and S21, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 13. In FIG. 13, the horizontal and vertical axes respectively represent I and Q, and black circles represent the signal points.

As can be seen from FIG. 13, 1024 signal points exist without overlapping one another. As a result, the reception device is likely to obtain high reception quality.

The minimum Euclidian distance between 1024 signal points in FIG. 12 is represented by $D_1$, and the minimum Euclidian distance between 1024 signal points in FIG. 13 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 1-2

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 61]

$$F = \begin{pmatrix} \beta \times \cos\theta & \beta \times \sin\theta \\ \beta \times \sin\theta & -\beta \times \cos\theta \end{pmatrix} \quad \text{(formula S22)}$$

or

-continued

[Math. 62]

$$F=\begin{pmatrix}\cos\theta & \sin\theta\\ \sin\theta & -\cos\theta\end{pmatrix} \quad \text{(formula S23)}$$

or

[Math. 63]

$$F=\begin{pmatrix}\beta\times\cos\theta & -\beta\times\sin\theta\\ \beta\times\sin\theta & \beta\times\cos\theta\end{pmatrix} \quad \text{(formula S24)}$$

or

[Math. 64]

$$F=\begin{pmatrix}\cos\theta & -\sin\theta\\ \sin\theta & \cos\theta\end{pmatrix} \quad \text{(formula S25)}$$

In formulas S22 and S24, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_1(t)$ $(z_1(i))$ in formulas S2, S3, S4, S5, and S8 are as follows.

[Math. 65]

$$\theta=\tan^{-1}\left(\frac{\sqrt{42}}{\sqrt{10}}\times\frac{5}{4}\right) \text{ or } \tan^{-1}\left(\frac{\sqrt{42}}{\sqrt{10}}\times\frac{5}{4}\right)+2n\pi \text{ (radian)} \quad \text{(formula S26)}$$

or

[Math. 66]

$$\theta=\pi+\tan^{-1}\left(\frac{\sqrt{42}}{\sqrt{10}}\times\frac{5}{4}\right) \text{ or } \pi+\tan^{-1}\left(\frac{\sqrt{42}}{\sqrt{10}}\times\frac{5}{4}\right)+2n\pi \text{ (radian)} \quad \text{(formula S27)}$$

or

[Math. 67]

$$\theta=\tan^{-1}\left(-\frac{\sqrt{42}}{\sqrt{10}}\times\frac{5}{4}\right) \text{ or } \tan^{-1}\left(-\frac{\sqrt{42}}{\sqrt{10}}\times\frac{5}{4}\right)+2n\pi \text{ (radian)} \quad \text{(formula S28)}$$

or

[Math. 68]

$$\theta=\pi+\tan^{-1}\left(-\frac{\sqrt{42}}{\sqrt{10}}\times\frac{5}{4}\right) \text{ or } \pi+\tan^{-1}\left(-\frac{\sqrt{42}}{\sqrt{10}}\times\frac{5}{4}\right)+2n\pi \text{ (radian)} \quad \text{(formula S29)}$$

In formulas S26, S27, S28, and S29, $\tan^{-1}(x)$ is an inverse trigonometric function (an inverse function of the trigonometric function with appropriately restricted domains), and satisfies the following formula.

[Math. 69]

$$-\frac{\pi}{2}\text{ (radian)}<\tan^{-1}(x)<\frac{\pi}{2}\text{ (radian)} \quad \text{(formula S30)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S22, S23, S24, and S25, and θ is set to θ in any of formulas S26, S27, S28, and S29, concerning the signal $u_1(t)$ $(u_1(i))$ described in Configuration Example R1, signal points from a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(0, 0, 0, 0, 0, 0, 0, 0, 0, 0)$ to a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(1, 1, 1, 1, 1, 1, 1, 1, 1, 1)$ are arranged in the I (in-phase)-Q (quadrature(-phase)) plane as shown in FIG. 12, similarly to the above. In FIG. 12, the horizontal and vertical axes respectively represent I and Q, and black circles represent the signal points.

As can be seen from FIG. 12, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S22, S23, S24, and S25, and θ is set to θ in any of formulas S26, S27, S28, and S29, concerning the signal $u_2(t)$ $(u_2(i))$ described in Configuration Example R1, signal points from a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(0, 0, 0, 0, 0, 0, 0, 0, 0, 0)$ to a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(1, 1, 1, 1, 1, 1, 1, 1, 1, 1)$ are arranged in the I (in-phase)-Q (quadrature(-phase)) plane as shown in FIG. 13, similarly to the above. In FIG. 13, the horizontal and vertical axes respectively represent I and Q, and black circles represent the signal points.

As can be seen from FIG. 13, 1024 signal points exist without overlapping one another. As a result, the reception device is likely to obtain high reception quality.

The minimum Euclidian distance between 1024 signal points in FIG. 12 is represented by $D_1$, and the minimum Euclidian distance between 1024 signal points in FIG. 13 is represented by $D_2$. In this case, $D_1>D_2$ is satisfied. Accordingly, as described in Configuration Example R1, it is desirable that $Q_1>Q_2$ be satisfied when $Q_1\neq Q_2$ is satisfied in formulas S2, S3, S4, S5, and S8.

Example 1-3

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 70]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S31)}$$

or

[Math. 71]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{(formula S32)}$$

or

[Math. 72]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S33)}$$

or

[Math. 73]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{(formula S34)}$$

In formulas S31, S32, S33, and S34, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_1(t)$ ($z_1(i)$) in formulas S2, S3, S4, S5, and S8 are as follows.

When α is a real number:

[Math. 74]

$$\alpha = \frac{\sqrt{42}}{\sqrt{10}} \times \frac{4}{5} \quad \text{(formula S35)}$$

or

[Math. 75]

$$\alpha = \frac{\sqrt{42}}{\sqrt{10}} \times \frac{4}{5} \quad \text{(formula S36)}$$

When α is an imaginary number:

[Math. 76]

$$\alpha = \frac{\sqrt{42}}{\sqrt{10}} \times \frac{4}{5} \times e^{j\frac{\pi}{2}} \quad \text{(formula S37)}$$

or

[Math. 77]

$$\alpha = \frac{\sqrt{42}}{\sqrt{10}} \times \frac{4}{5} \times e^{j\frac{3\pi}{2}} \quad \text{(formula S38)}$$

Figure 14:
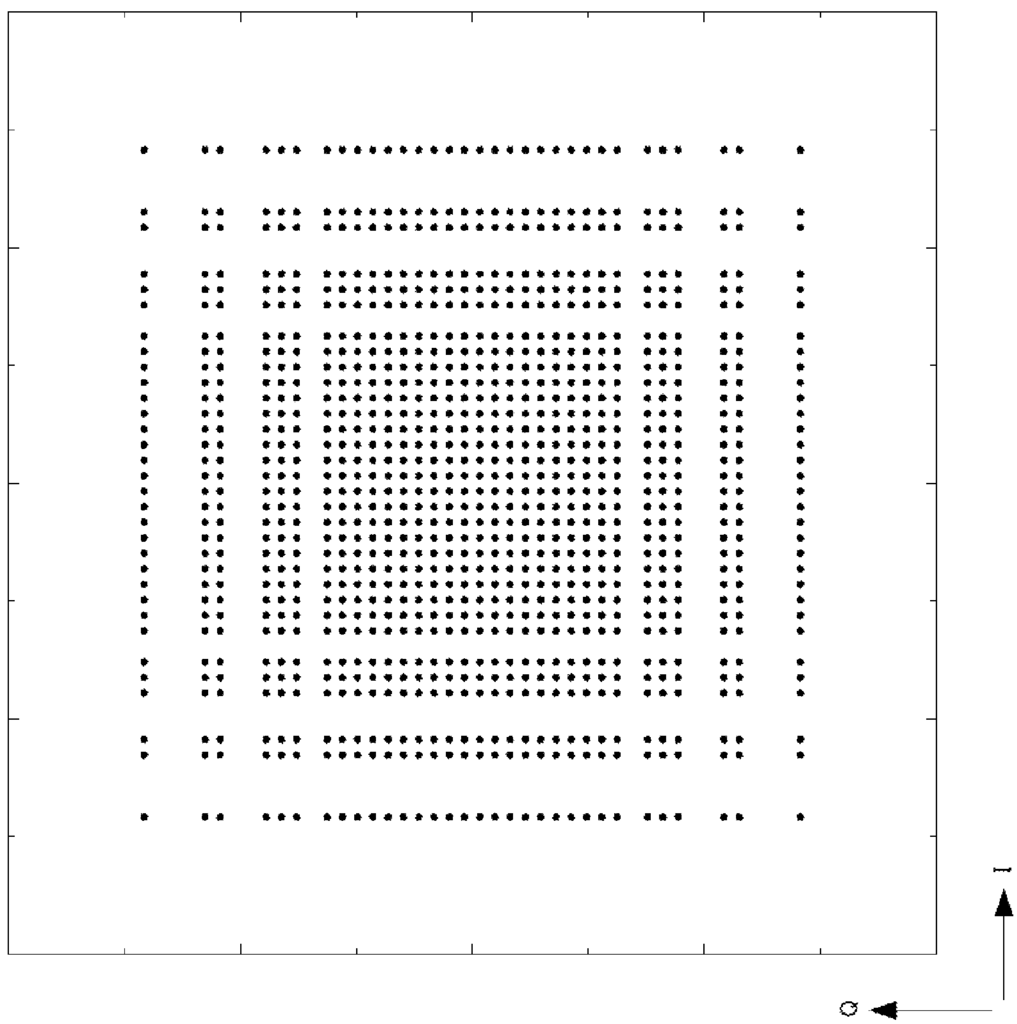
FIG. 14 shows an example of constellation of signal points in the I-Q plane.

When the precoding matrix F is set to the precoding matrix F in any of formulas S31, S32, S33, and S34, and α is set to α in any of formulas S35, S36, S37, and S38, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 14 similarly to the above. In FIG. 14, the horizontal and vertical axes respectively represent I and Q, and black circles represent the signal points.

As can be seen from FIG. 14, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

Figure 15:
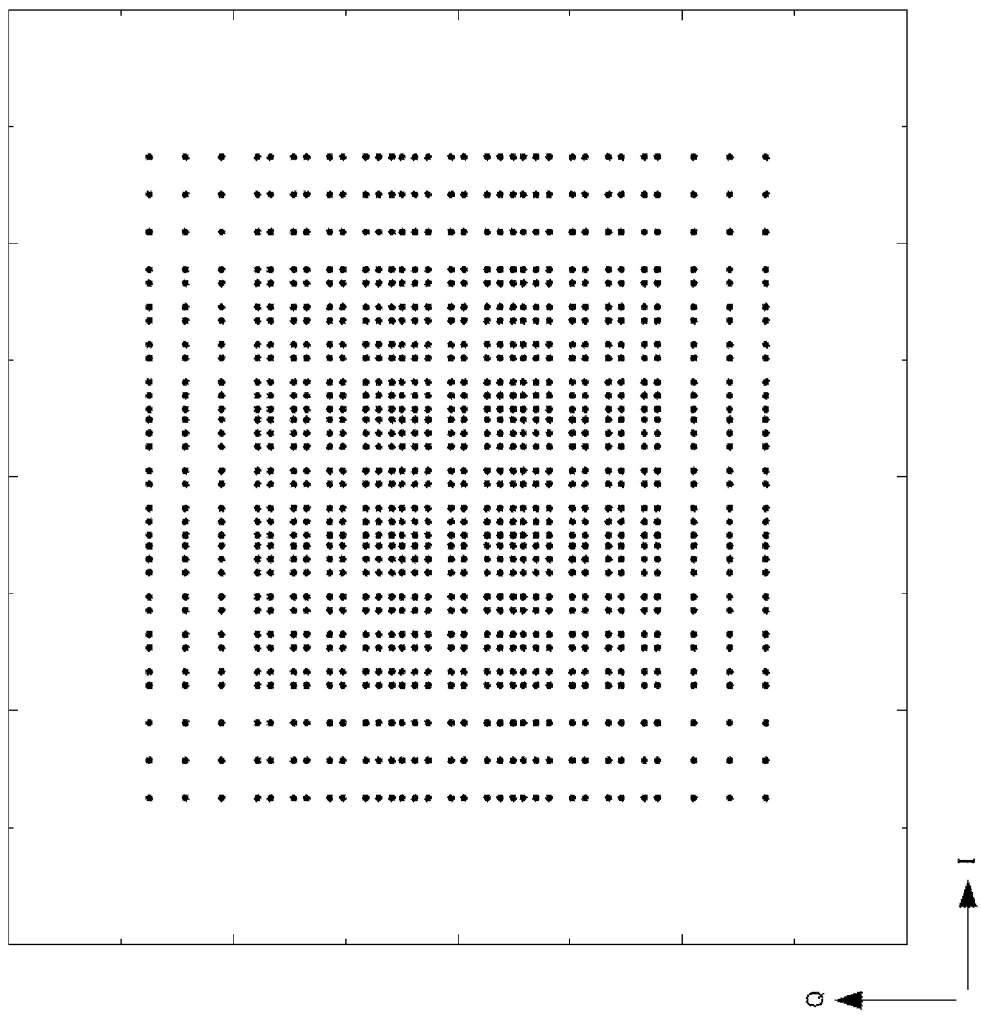
FIG. 15 shows an example of constellation of signal points in the I-Q plane.

When the precoding matrix F is set to the precoding matrix F in any of formulas S31, S32, S33, and S34, and α is set to α in any of formulas S35, S36, S37, and S38, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 15 similarly to the above. In FIG. 15, the horizontal and vertical axes respectively represent I and Q, and black circles represent the signal points.

As can be seen from FIG. 15, 1024 signal points exist without overlapping one another. As a result, the reception device is likely to obtain high reception quality.

The minimum Euclidian distance between 1024 signal points in FIG. 14 is represented by $D_1$, and the minimum Euclidian distance between 1024 signal points in FIG. 15 is represented by $D_2$. In this case, $D_1 > D_2$ is satisfied. Accordingly, as described in Configuration Example R1, it is desirable that $Q_1 > Q_2$ be satisfied when $Q_1 \neq Q_2$ is satisfied in formulas S2, S3, S4, S5, and S8.

Example 1-4

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2 = P_2^2$ is satisfied in formula S2

<2> Case where $P_1^2 = P_2^2$ is satisfied in formula S3

<3> Case where $P_1^2 = P_2^2$ is satisfied in formula S4

<4> Case in formula S5

<5> Case in formula S8

[Math. 78]

$$F = \begin{pmatrix} \beta \times \cos\theta & \beta \times \sin\theta \\ \beta \times \sin\theta & -\beta \times \cos\theta \end{pmatrix} \quad \text{(formula S39)}$$

or

-continued

[Math. 79]

$$F=\begin{pmatrix}\cos\theta & \sin\theta\\ \sin\theta & -\cos\theta\end{pmatrix}\quad\text{(formula S40)}$$

or

[Math. 80]

$$F=\begin{pmatrix}\beta\times\cos\theta & -\beta\times\sin\theta\\ \beta\times\sin\theta & \beta\times\cos\theta\end{pmatrix}\quad\text{(formula S41)}$$

or

[Math. 81]

$$F=\begin{pmatrix}\cos\theta & -\sin\theta\\ \sin\theta & \cos\theta\end{pmatrix}\quad\text{(formula S42)}$$

In formulas S39 and S41, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_1(t)$ $(z_1(i))$ in formulas S2, S3, S4, S5, and S8 are as follows.

[Math. 82]

$$\theta=\tan^{-1}\left(\frac{\sqrt{42}}{\sqrt{10}}\times\frac{4}{5}\right)\text{ or }\tan^{-1}\left(\frac{\sqrt{42}}{\sqrt{10}}\times\frac{4}{5}\right)+2n\pi\text{ (radian)}\quad\text{(formula S43)}$$

or

[Math. 83]

$$\theta=\pi+\tan^{-1}\left(\frac{\sqrt{42}}{\sqrt{10}}\times\frac{4}{5}\right)\text{ or }\pi+\tan^{-1}\left(\frac{\sqrt{42}}{\sqrt{10}}\times\frac{4}{5}\right)+2n\pi\text{ (radian)}\quad\text{(formula S44)}$$

or

[Math. 84]

$$\theta=\tan^{-1}\left(-\frac{\sqrt{42}}{\sqrt{10}}\times\frac{4}{5}\right)\text{ or }\tan^{-1}\left(-\frac{\sqrt{42}}{\sqrt{10}}\times\frac{4}{5}\right)+2n\pi\text{ (radian)}\quad\text{(formula S45)}$$

or

[Math. 85]

$$\theta=\pi+\tan^{-1}\left(-\frac{\sqrt{42}}{\sqrt{10}}\times\frac{4}{5}\right)\text{ or }\pi+\tan^{-1}\left(-\frac{\sqrt{42}}{\sqrt{10}}\times\frac{4}{5}\right)+2n\pi\text{ (radian)}\quad\text{(formula S46)}$$

In formulas S43, S44, S45, and S46, $\tan^{-1}(x)$ is an inverse trigonometric function (an inverse function of the trigonometric function with appropriately restricted domains), and satisfies the following formula.

[Math. 86]

$$-\frac{\pi}{2}\text{ (radian)}<\tan^{-1}(x)<\frac{\pi}{2}\text{ (radian)}\quad\text{(formula S47)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S39, S40, S41, and S42, and θ is set to θ in any of formulas S43, S44, S45, and S46, concerning the signal $u_1(t)$ $(u_1(i))$ described in Configuration Example R1, signal points from a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(0, 0, 0, 0, 0, 0, 0, 0, 0, 0)$ to a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(1, 1, 1, 1, 1, 1, 1, 1, 1, 1)$ are arranged in the I (in-phase)-Q (quadrature(-phase)) plane as shown in FIG. 14 similarly to the above.

In FIG. 14, the horizontal and vertical axes respectively represent I and Q, and black circles represent the signal points.

As can be seen from FIG. 14, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S39, S40, S41, and S42, and θ is set to θ in any of formulas S43, S44, S45, and S46, concerning the signal $u_2(t)$ $(u_2(i))$ described in Configuration Example R1, signal points from a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(0, 0, 0, 0, 0, 0, 0, 0, 0, 0)$ to a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(1, 1, 1, 1, 1, 1, 1, 1, 1, 1)$ are arranged in the I (in-phase)-Q (quadrature(-phase)) plane as shown in FIG. 15 similarly to the above. In FIG. 15, the horizontal and vertical axes respectively represent I and Q, and black circles represent the signal points.

As can be seen from FIG. 15, 1024 signal points exist without overlapping one another. As a result, the reception device is likely to obtain high reception quality.

The minimum Euclidian distance between 1024 signal points in FIG. 14 is represented by $D_1$, and the minimum Euclidian distance between 1024 signal points in FIG. 15 is represented by $D_2$. In this case, $D_1>D_2$ is satisfied. Accordingly, as described in Configuration Example R1, it is desirable that $Q_1>Q_2$ be satisfied when $Q_1\neq Q_2$ is satisfied in formulas S2, S3, S4, S5, and S8.

Example 1-5

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5
<5> Case in formula S8

[Math. 87]

$$F=\begin{pmatrix}\beta\times e^{j0} & \beta\times\alpha\times e^{j0}\\ \beta\times\alpha\times e^{j0} & \beta\times e^{j\pi}\end{pmatrix}\quad\text{(formula S48)}$$

or

[Math. 88]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix}\quad\text{(formula S49)}$$

or

[Math. 89]

$$F=\begin{pmatrix}\beta\times e^{j0} & \beta\times\alpha\times e^{j\pi}\\ \beta\times\alpha\times e^{j0} & \beta\times e^{j0}\end{pmatrix}\quad\text{(formula S50)}$$

or

[Math. 90]

$$F=\frac{1}{\sqrt{\alpha^2+1}}\begin{pmatrix}e^{j0} & \alpha\times e^{j\pi}\\ \alpha\times e^{j0} & e^{j0}\end{pmatrix}\quad\text{(formula S51)}$$

In formulas S48, S49, S50, and S51, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_2(t)$ ($z_2(i)$) in formulas S2, S3, S4, S5, and S8 are as follows.

When α is a real number:

[Math. 91]

$$\alpha=\frac{\sqrt{10}}{\sqrt{42}}\times\frac{5}{4}\quad\text{(formula S52)}$$

or

[Math. 92]

$$\alpha=\frac{\sqrt{10}}{\sqrt{42}}\times\frac{5}{4}\quad\text{(formula S53)}$$

When α is an imaginary number:

[Math. 93]

$$\alpha=\frac{\sqrt{10}}{\sqrt{42}}\times\frac{5}{4}\times e^{j\frac{\pi}{2}}\quad\text{(formula S54)}$$

or

[Math. 94]

$$\alpha=\frac{\sqrt{10}}{\sqrt{42}}\times\frac{5}{4}\times e^{j\frac{3\pi}{2}}\quad\text{(formula S55)}$$

Figure 16:
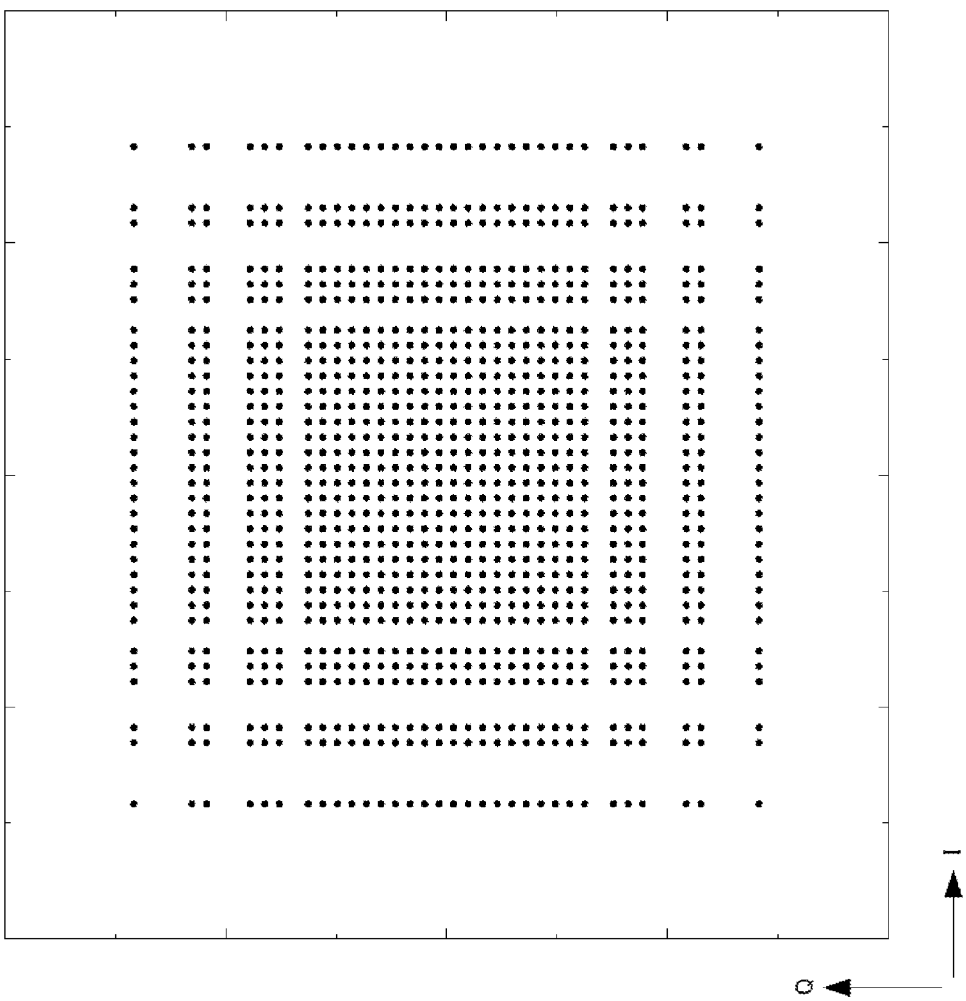
FIG. 16 shows an example of constellation of signal points in the I-Q plane.

When the precoding matrix F is set to the precoding matrix F in any of formulas S48, S49, S50, and S51, and α is set to α in any of formulas S52, S53, S54, and S55, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 16 similarly to the above. In FIG. 16, the horizontal and vertical axes respectively represent I and Q, and black circles represent the signal points.

As can be seen from FIG. 16, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

Figure 17:
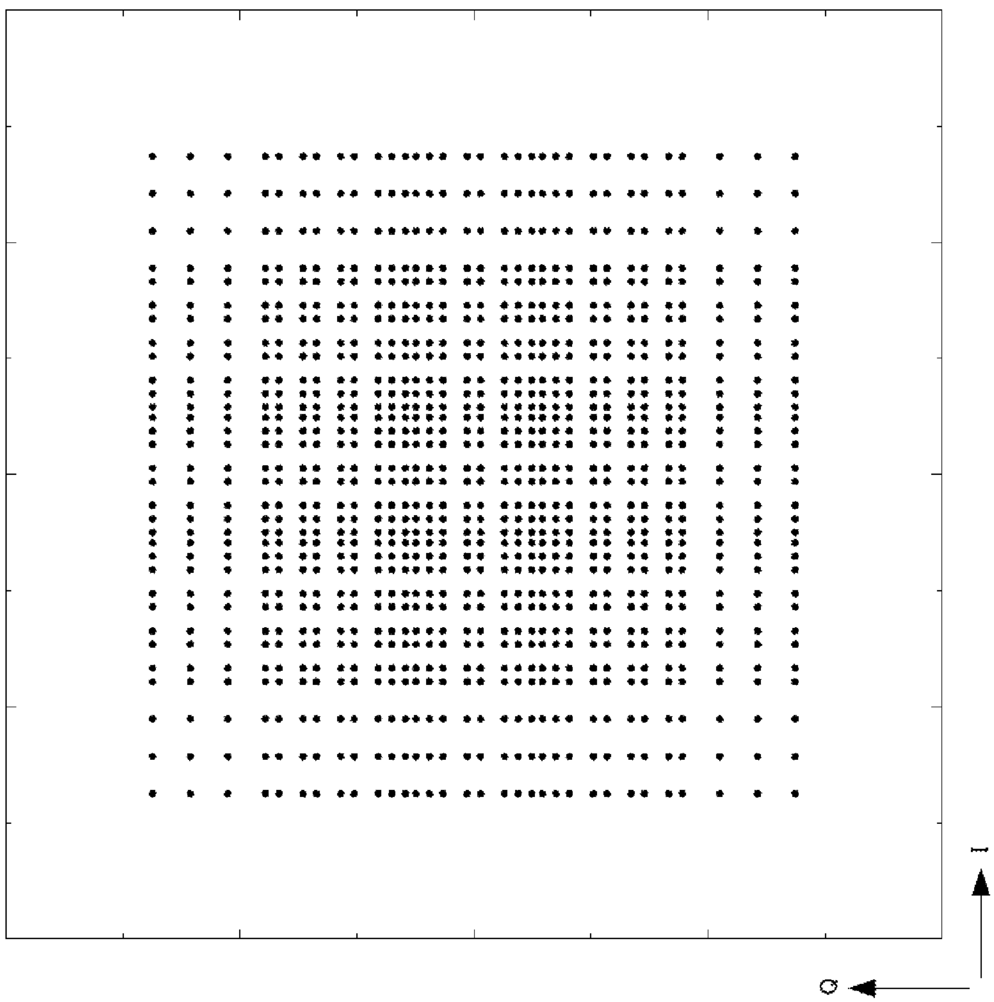
FIG. 17 shows an example of constellation of signal points in the I-Q plane.

When the precoding matrix F is set to the precoding matrix F in any of formulas S48, S49, S50, and S51, and α is set to α in any of formulas S52, S53, S54, and S55, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 17 similarly to the above. In FIG. 17, the horizontal and vertical axes respectively represent I and Q, and black circles represent the signal points.

As can be seen from FIG. 17. 1024 signal points exist without overlapping one another. As a result, the reception device is likely to obtain high reception quality.

The minimum Euclidian distance between 1024 signal points in FIG. 16 is represented by $D_2$, and the minimum Euclidian distance between 1024 signal points in FIG. 17 is represented by $D_1$. In this case, $D_1<D_2$ is satisfied. Accordingly, as described in Configuration Example R1, it is desirable that $Q_1<Q_2$ be satisfied when $Q_1\neq Q_2$ is satisfied in formulas S2, S3, S4, S5, and S8.

Example 1-6

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 95]

$$F=\begin{pmatrix}\beta\times\cos\theta & \beta\times\sin\theta\\ \beta\times\sin\theta & -\beta\times\cos\theta\end{pmatrix}\quad\text{(formula S56)}$$

or

-continued

[Math. 96]

$$F=\begin{pmatrix}\cos\theta & \sin\theta\\ \sin\theta & -\cos\theta\end{pmatrix} \quad \text{(formula S57)}$$

or

[Math. 97]

$$F=\begin{pmatrix}\beta\times\cos\theta & -\beta\times\sin\theta\\ \beta\times\sin\theta & \beta\times\cos\theta\end{pmatrix} \quad \text{(formula S58)}$$

or

[Math. 98]

$$F=\begin{pmatrix}\cos\theta & -\sin\theta\\ \sin\theta & \cos\theta\end{pmatrix} \quad \text{(formula S59)}$$

In formulas S56 and S58, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 99]

$$\theta=\tan^{-1}\left(\frac{\sqrt{10}}{\sqrt{42}}\times\frac{5}{4}\right)\text{ or } \tan^{-1}\left(\frac{\sqrt{10}}{\sqrt{42}}\times\frac{5}{4}\right)+2n\pi\text{ (radian)} \quad \text{(formula S60)}$$

or

[Math. 100]

$$\theta=\pi+\tan^{-1}\left(\frac{\sqrt{10}}{\sqrt{42}}\times\frac{5}{4}\right)\text{ or } \pi+\tan^{-1}\left(\frac{\sqrt{10}}{\sqrt{42}}\times\frac{5}{4}\right)+2n\pi\text{ (radian)} \quad \text{(formula S61)}$$

or

[Math. 101]

$$\theta=\tan^{-1}\left(-\frac{\sqrt{10}}{\sqrt{42}}\times\frac{5}{4}\right)\text{ or } \tan^{-1}\left(-\frac{\sqrt{10}}{\sqrt{42}}\times\frac{5}{4}\right)+2n\pi\text{ (radian)} \quad \text{(formula S62)}$$

or

[Math. 102]

$$\theta=\pi+\tan^{-1}\left(-\frac{\sqrt{10}}{\sqrt{42}}\times\frac{5}{4}\right)\text{ or } \pi+\tan^{-1}\left(-\frac{\sqrt{10}}{\sqrt{42}}\times\frac{5}{4}\right)+2n\pi\text{ (radian)} \quad \text{(formula S63)}$$

In formulas S60, S61, S62, and S63, $\tan^{-1}(x)$ is an inverse trigonometric function (an inverse function of the trigonometric function with appropriately restricted domains), and satisfies the following formula.

[Math. 103]

$$-\frac{\pi}{2}\text{ (radian)} < \tan^{-1}(x) < \frac{\pi}{2}\text{ (radian)} \quad \text{(formula S64)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S56, S57, S58, and S59, and θ is set to θ in any of formulas S60, S61, S62, and S63, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1) are arranged in the I (in-phase)-Q (quadrature(-phase)) plane as shown in FIG. 16 similarly to the above.

In FIG. 16, the horizontal and vertical axes respectively represent I and Q, and black circles represent the signal points.

As can be seen from FIG. 16, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S56, S57, S58, and S59, and θ is set to θ in any of formulas S60, S61, S62, and S63, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 17 similarly to the above. In FIG. 17, the horizontal and vertical axes respectively represent I and Q, and black circles represent the signal points.

As can be seen from FIG. 17, 1024 signal points exist without overlapping one another. As a result, the reception device is likely to obtain high reception quality.

The minimum Euclidian distance between 1024 signal points in FIG. 16 is represented by $D_2$, and the minimum Euclidian distance between 1024 signal points in FIG. 17 is represented by $D_1$. In this case, $D_1<D_2$ is satisfied. Accordingly, as described in Configuration Example R1, it is desirable that $Q_1<Q_2$ be satisfied when $Q_1\neq Q_2$ is satisfied in formulas S2, S3, S4, S5, and S8.

Example 1-7

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 104]

$$F=\begin{pmatrix}\beta\times e^{j0} & \beta\times\alpha\times e^{j0}\\ \beta\times\alpha\times e^{j0} & \beta\times e^{j\pi}\end{pmatrix}\quad\text{(formula S65)}$$

or

[Math. 105]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix}\quad\text{(formula S66)}$$

or

[Math. 106]

$$F=\begin{pmatrix}\beta\times e^{j0} & \beta\times\alpha\times e^{j\pi}\\ \beta\times\alpha\times e^{j0} & \beta\times e^{j0}\end{pmatrix}\quad\text{(formula S67)}$$

or

[Math. 107]

$$F=\frac{1}{\sqrt{\alpha^2+1}}\begin{pmatrix}e^{j0} & \alpha\times e^{j\pi}\\ \alpha\times e^{j0} & e^{j0}\end{pmatrix}\quad\text{(formula S68)}$$

In formulas S65, S66, S67, and S68, α may be either a real number or an imaginary number, and β may be either a real number or an imaginary number. However, α is not 0 (zero). Similarly β is not 0 (zero).

In this case, values of α that allow the reception device to obtain high data reception quality are considered.

The values of α that allow the reception device to obtain high data reception quality when attention is focused on the signal $z_2(t)$ ($z_2(i)$) in formulas S2, S3, S4, S5, and S8 are as follows.

When α is a real number:

[Math. 108]

$$\alpha=\frac{\sqrt{10}}{\sqrt{42}}\times\frac{4}{5}\quad\text{(formula S69)}$$

or

[Math. 109]

$$\alpha=\frac{\sqrt{10}}{\sqrt{42}}\times\frac{4}{5}\quad\text{(formula S70)}$$

When α is an imaginary number:

[Math. 110]

$$\alpha=\frac{\sqrt{10}}{\sqrt{42}}\times\frac{4}{5}\times e^{j\frac{\pi}{2}}\quad\text{(formula S71)}$$

or

[Math. 111]

$$\alpha=\frac{\sqrt{10}}{\sqrt{42}}\times\frac{4}{5}\times e^{j\frac{3\pi}{2}}\quad\text{(formula S72)}$$

Figure 18:
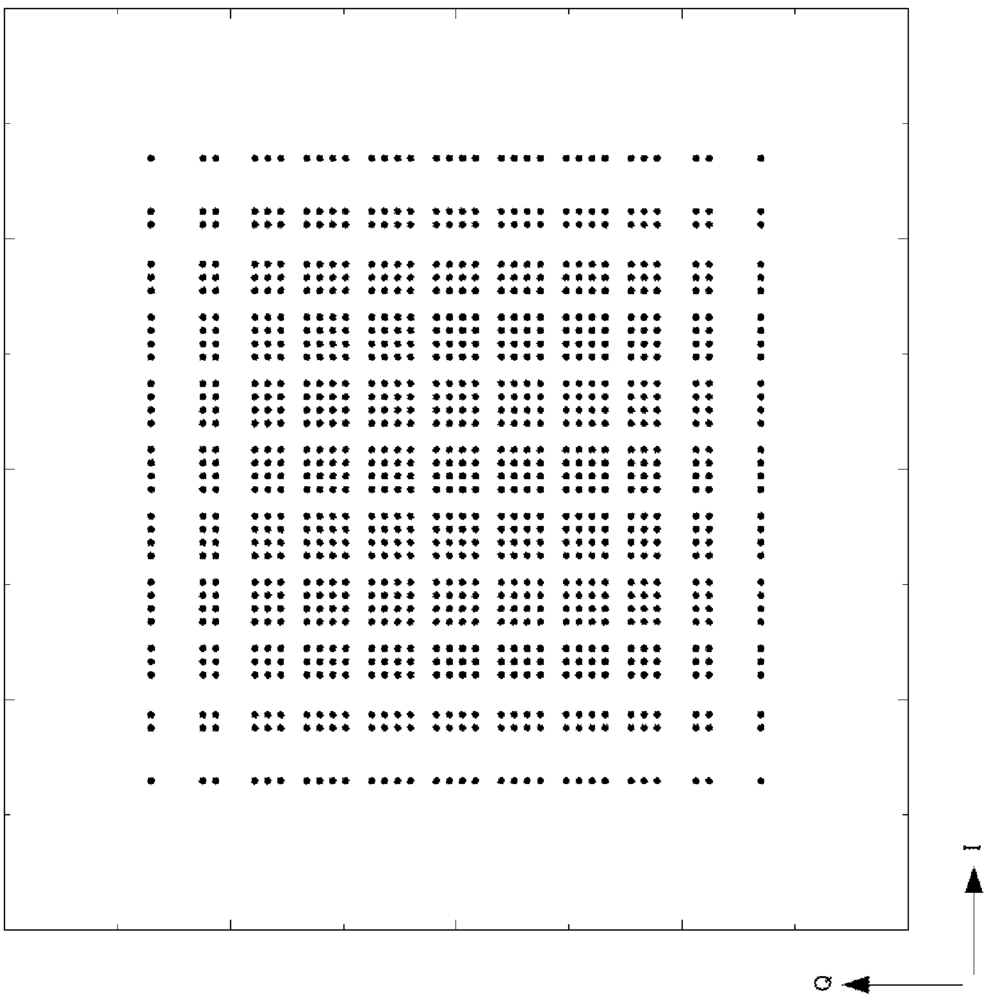
FIG. 18 shows an example of constellation of signal points in the I-Q plane.

When the precoding matrix F is set to the precoding matrix F in any of formulas S65, S66, S67, and S68, and α is set to α in any of formulas S69, S70, S71, and S72, concerning the signal $u_2(t)$ ($u_2(i)$) described in Configuration Example R1, signal points from a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(0, 0, 0, 0, 0, 0, 0, 0, 0, 0)$ to a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(1, 1, 1, 1, 1, 1, 1, 1, 1, 1)$ are arranged in the I (in-phase)-Q (quadrature(-phase)) plane as shown in FIG. 18 similarly to the above. In FIG. 18, the horizontal and vertical axes respectively represent I and Q, and black circles represent the signal points.

As can be seen from FIG. 18, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

Figure 19:
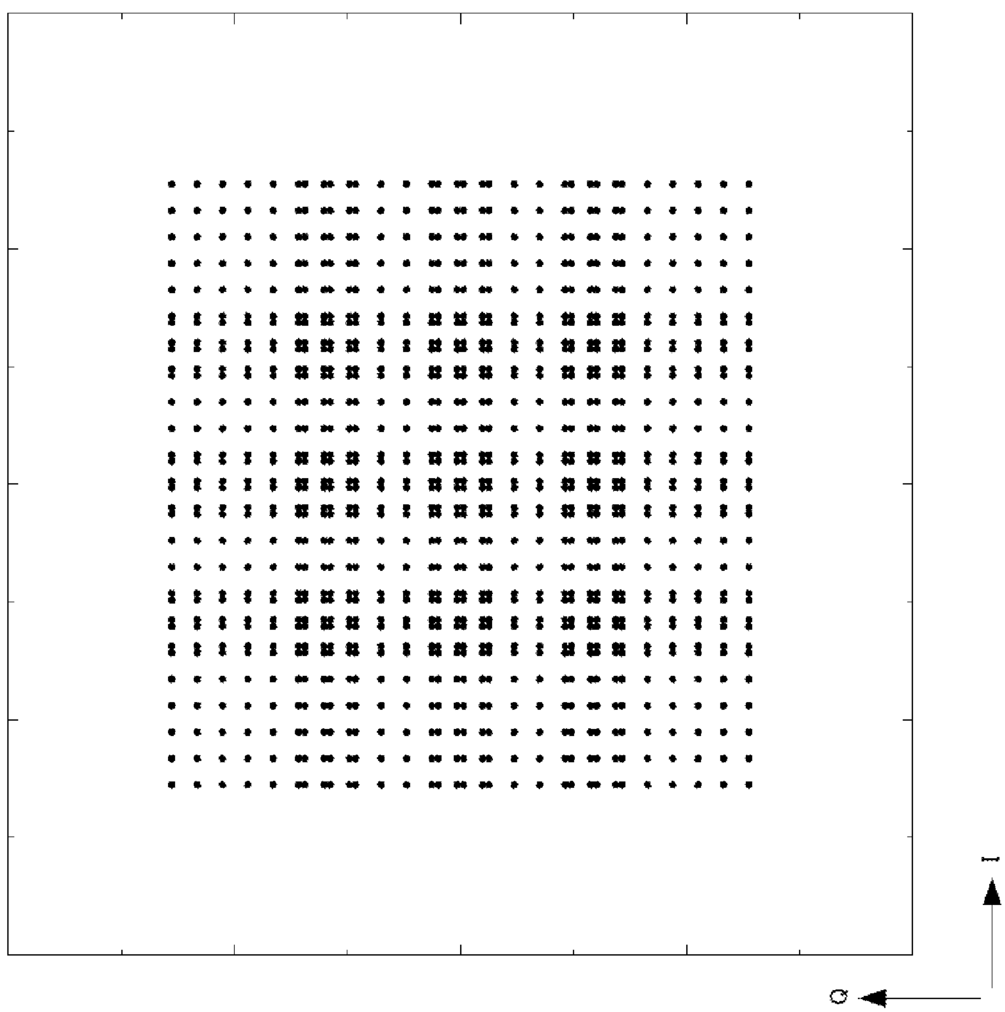
FIG. 19 shows an example of constellation of signal points in the I-Q plane.

When the precoding matrix F is set to the precoding matrix F in any of formulas S65, S66, S67, and S68, and α is set to α in any of formulas S69, S70, S71, and S72, concerning the signal $u_1(t)$ ($u_1(i)$) described in Configuration Example R1, signal points from a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(0, 0, 0, 0, 0, 0, 0, 0, 0, 0)$ to a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(1, 1, 1, 1, 1, 1, 1, 1, 1, 1)$ are arranged in the I (in-phase)-Q (quadrature(-phase)) plane as shown in FIG. 19 similarly to the above. In FIG. 19, the horizontal and vertical axes respectively represent I and Q, and black circles represent the signal points.

As can be seen from FIG. 19, 1024 signal points exist without overlapping one another. As a result, the reception device is likely to obtain high reception quality.

The minimum Euclidian distance between 1024 signal points in FIG. 18 is represented by $D_2$, and the minimum Euclidian distance between 1024 signal points in FIG. 19 is represented by $D_1$. In this case, $D_1<D_2$ is satisfied. Accordingly, as described in Configuration Example R1, it is desirable that $Q_1<Q_2$ be satisfied when $Q_1\neq Q_2$ is satisfied in formulas S2, S3, S4, S5, and S8.

Example 1-8

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 112]

$$F=\begin{pmatrix}\beta\times\cos\theta & \beta\times\sin\theta\\ \beta\times\sin\theta & -\beta\times\cos\theta\end{pmatrix}\quad\text{(formula S73)}$$

or

-continued

[Math. 113]

$$F=\begin{pmatrix}\cos\theta & \sin\theta\\ \sin\theta & -\cos\theta\end{pmatrix}\quad\text{(formula S74)}$$

or

[Math. 114]

$$F=\begin{pmatrix}\beta\times\cos\theta & -\beta\times\sin\theta\\ \beta\times\sin\theta & \beta\times\cos\theta\end{pmatrix}\quad\text{(formula S75)}$$

or

[Math. 115]

$$F=\begin{pmatrix}\cos\theta & -\sin\theta\\ \sin\theta & \cos\theta\end{pmatrix}\quad\text{(formula S76)}$$

In formulas S73 and S75, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 116]

$$\theta=\tan^{-1}\left(\frac{\sqrt{10}}{\sqrt{42}}\times\frac{4}{5}\right)\text{ or }\tan^{-1}\left(\frac{\sqrt{10}}{\sqrt{42}}\times\frac{4}{5}\right)+2n\pi\text{ (radian)}\quad\text{(formula S77)}$$

or

[Math. 117]

$$\theta=\pi+\tan^{-1}\left(\frac{\sqrt{10}}{\sqrt{42}}\times\frac{4}{5}\right)\text{ or }\pi+\tan^{-1}\left(\frac{\sqrt{10}}{\sqrt{42}}\times\frac{4}{5}\right)+2n\pi\text{ (radian)}\quad\text{(formula S78)}$$

or

[Math. 118]

$$\theta=\tan^{-1}\left(-\frac{\sqrt{10}}{\sqrt{42}}\times\frac{4}{5}\right)\text{ or }\tan^{-1}\left(-\frac{\sqrt{10}}{\sqrt{42}}\times\frac{4}{5}\right)+2n\pi\text{ (radian)}\quad\text{(formula S79)}$$

or

[Math. 119]

$$\theta=\pi+\tan^{-1}\left(-\frac{\sqrt{10}}{\sqrt{42}}\times\frac{4}{5}\right)\text{ or }\pi+\tan^{-1}\left(-\frac{\sqrt{10}}{\sqrt{42}}\times\frac{4}{5}\right)+2n\pi\text{ (radian)}\quad\text{(formula S80)}$$

In formulas S77, S78, S79, and S80, $\tan^{-1}(x)$ is an inverse trigonometric function (an inverse function of the trigonometric function with appropriately restricted domains), and satisfies the following formula.

[Math. 120]

$$-\frac{\pi}{2}\text{ (radian)}<\tan^{-1}(x)<\frac{\pi}{2}\text{ (radian)}\quad\text{(formula S81)}$$

Further, "$\tan^{-1}(x)$" may be expressed as "$\mathrm{Tan}^{-1}(x)$". "arctan(x)", and "Arctan(x)". Note that n is an integer.

When the precoding matrix F is set to the precoding matrix F in any of formulas S73, S74, S75, and S76, and θ is set to θ in any of formulas S77, S78, S79, and S80, concerning the signal u_(t) ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 18 similarly to the above. In FIG. 18, the horizontal and vertical axes respectively represent I and Q, and black circles represent the signal points.

As can be seen from FIG. 18, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S73, S74, S75, and S76, and θ is set to θ in any of formulas S77, S78, S79, and S80, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 19 similarly to the above. In FIG. 19, the horizontal and vertical axes respectively represent I and Q, and black circles represent the signal points.

As can be seen from FIG. 19, 1024 signal points exist without overlapping one another. As a result, the reception device is likely to obtain high reception quality.

The minimum Euclidian distance between 1024 signal points in FIG. 18 is represented by $D_2$, and the minimum Euclidian distance between 1024 signal points in FIG. 19 is represented by $D_1$. In this case, $D_1<D_2$ is satisfied. Accordingly, as described in Configuration Example R1, it is desirable that $Q_1<Q_2$ be satisfied when $Q_1\neq Q_2$ is satisfied in formulas S2, S3, S4, S5, and S8.

Example 1

Supplemental Remarks

Examples of the values of α and θ that allow for obtaining high data reception quality are shown in Example 1-1 to Example 1-8. Even when the values of α and θ are not equal to the values shown in these examples, however, high data reception quality can be obtained by satisfying the conditions shown in Configuration Example R1.

Example 2

In the following description, in the mapper 504 in FIGS. 5-7, 64QAM and 16QAM are applied as a modulation scheme for obtaining $s_1(t)$ ($s_1(i)$) and a modulation scheme for obtaining $s_2(t)$ ($s_2(i)$), respectively. The following describes examples of the structure of the precoding matrix (F) and conditions regarding power change when precoding shown in any of formulas S2, S3, S4, S5, and S8 and/or power change are/is performed.

A mapping scheme for 16QAM is described first below. FIG. 10 shows an example of signal point constellation for 16QAM in the I (in-phase)-Q (quadrature(-phase)) plane. In FIG. 10, 16 circles represent signal points for 16QAM, and the horizontal and vertical axes respectively represent I and Q.

Coordinates of the 16 signal points (i.e., the circles in FIG. 10) for 16QAM in the I (in-phase)-Q (quadrature(-phase)) plane are $(3w_{16},3w_{16})$, $(3w_{16}w_{16})$, $(3w_{16},-w_{16})$, $(3w_{16},-3w_{16})$, $(w_{16},3w_{16})$, $(W_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$, where $w_{16}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to the signal point 1001 in FIG. 10. When an in-phase component and a quadrature component of the baseband signal obtained as a result of mapping are respectively represented by I and Q, (I, Q)=$(3w_{16}, 3w_{16})$ is satisfied.

That is to say, the in-phase component I and the quadrature component Q of the baseband signal obtained as a result of mapping (at the time of using 16QAM) are determined based on the transmitted bits (b0, b1, b2, b3). One example of a relationship between values (0000-1111) of a set of b0, b1, b2, and b3 and coordinates of signal points is as shown in FIG. 10. The values 0000-1111 of the set of b0, b1, b2, and b3 are shown directly below the 16 signal points (i.e., the circles in FIG. 10) for 16QAM, which are $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},--w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$. Coordinates, in the I (in-phase)-Q (quadrature(-phase)) plane, of the signal points (i.e., the circles) directly above the values 0000-1111 of the set of b0, b1, b2, and b3 indicate the in-phase component I and the quadrature component Q of the baseband signal obtained as a result of mapping. The relationship between the values (0000-1111) of the set of b0, b1, b2, and b3 for 16QAM and coordinates of signal points is not limited to that shown in FIG. 10. Values obtained by expressing the in-phase component I and the quadrature component Q of the baseband signal obtained as a result of mapping (at the time of using 16QAM) in complex numbers correspond to the baseband signal ($s_1(t)$ or $s_2(t)$) in FIGS. 5-7.

A mapping scheme for 64QAM is described below. FIG. 11 shows an example of signal point constellation for 64QAM in the I (in-phase)-Q (quadrature(-phase)) plane. In FIG. 11, 64 circles represent signal points for 64QAM, and the horizontal and vertical axes respectively represent I and Q.

Coordinates of the 64 signal points (i.e., the circles in FIG. 11) for 64QAM in the I (in-phase)-Q (quadrature(-phase)) plane are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$,
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$,
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$,
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$,
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$,
where $w_{64}$ is a real number greater than 0.

Here, transmitted bits (input bits) are represented by b0, b1, b2, b3, b4, and b5. For example, when (b0, b1, b2, b3, b4, b5)=(0, 0, 0, 0, 0, 0) for the transmitted bits, mapping is performed to a signal point 1101 in FIG. 11. When an in-phase component and a quadrature component of the baseband signal obtained as a result of mapping are respectively represented by I and Q, (I, Q)=$(7w_{64}, 7w_{64})$ is satisfied.

That is to say, the in-phase component I and the quadrature component Q of the baseband signal obtained as a result of mapping (at the time of using 64QAM) are determined based on the transmitted bits (b0, b1, b2, b3, b4, b5). One example of a relationship between values (000000-111111) of a set of b0, b1, b2, b3, b4, and b5 and coordinates of signal points is as shown in FIG. 11. The values 000000-111111 of the set of b0, b1, b2, b3, b4, and b5 are shown directly below the 64 signal points (i.e., the circles in FIG. 11) for 64QAM, which are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$,
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$,
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$,
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$,
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$. Coordinates, in the I (in-phase)-Q (quadrature(-phase)) plane, of the signal points (i.e., the circles) directly above the values 000000-111111 of the set of b0, b1, b2, b3, b4, and b5 indicate the in-phase component I and the quadrature component Q of the baseband signal obtained as a result of mapping. The relationship between the values (000000-111111) of the set of b0, b1, b2, b3, b4, and b5 for 64QAM and coordinates of signal points is not limited to that shown in FIG. 11. Values obtained by expressing the in-phase component I and the quadrature component Q of the baseband signal obtained as a result of mapping (at the time of using 64QAM) in complex numbers correspond to the baseband signal ($s_1(t)$ or $s_2(t)$) in FIGS. 5-7.

This example shows the structure of the precoding matrix when 64QAM and 16QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, in FIGS. 5-7.

In this case, the baseband signal 505A ($s_1(t)$ ($s_1(i)$)) and the baseband signal 505B ($s_2(t)$ ($s_2(i)$)), which are outputs of the mapper 504 shown in FIGS. 5-7, are typically set to have an equal average power. Thus, the following formulas are satisfied for the coefficients $w_{16}$ and $w_{64}$ described in the above-mentioned explanations on the mapping schemes for 16QAM and 64QAM, respectively.

[Math. 121]

$$w_{16} = \frac{z}{\sqrt{10}} \quad \text{(formula S82)}$$

[Math. 122]

$$w_{64} = \frac{z}{\sqrt{42}} \quad \text{(formula S83)}$$

In formulas S82 and S83, z is a real number greater than 0. The following describes the precoding matrix F used when calculation in the following cases is performed.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 123]

$$F = \begin{pmatrix} a(i) & b(i) \\ c(i) & d(i) \end{pmatrix} \quad \text{(formula S84)}$$

The structure of the above-mentioned precoding matrix F and the relationship between $Q_1$ and $Q_2$ are described in detail below in Example 2-1 to Example 2-8.

Example 2-1

In any of the above-mentioned cases <1> to <5>, the precoding matrix F is set to the precoding matrix F in any of the following formulas.

[Math. 124

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S85)}$$

or

[Math. 125]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{(formula S86)}$$

or

[Math. 126]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S87)}$$

or

[Math. 127]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{(formula S88)}$$

In formulas S85, S86, S87, and S88, α may be either a real number or an imaginary number, and β may be either a real number or an imaginary number. However, α is not 0 (zero). Similarly, β is not 0 (zero).

In this case, values of α that allow the reception device to obtain high data reception quality are considered.

First, the values of α that allow the reception device to obtain high data reception quality when attention is focused on the signal $z_2(t)$ ($z_2(i)$) in formulas S2, S3, S4, S5, and S8 are as follows.

When α is a real number:

[Math. 128]

$$\alpha = \frac{\sqrt{42}}{\sqrt{10}} \times \frac{5}{4} \quad \text{(formula S89)}$$

or

[Math. 129]

$$\alpha = -\frac{\sqrt{42}}{\sqrt{10}} \times \frac{5}{4} \quad \text{(formula S90)}$$

When α is an imaginary number:

[Math. 130]

$$\alpha = \frac{\sqrt{42}}{\sqrt{10}} \times \frac{5}{4} \times e^{j\frac{\pi}{2}} \quad \text{(formula S91)}$$

or

[Math. 131]

$$\alpha = \frac{\sqrt{42}}{\sqrt{10}} \times \frac{5}{4} \times e^{j\frac{3\pi}{2}} \quad \text{(formula S92)}$$

In the meantime, 64QAM and 16QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively. Therefore, when precoding (as well as phase change and power change) is performed as described above to transmit a modulated signal from each antenna, the total number of bits in symbols transmitted from the antennas 808A and 808B in FIG. 8 at the (unit) time u at the frequency (carrier) v is 10 bits, which is the sun of 4 bits (transmitted by using 16QAM) and 6 bits (transmitted by using 64QAM).

When input bits used to perform mapping for 16QAM are represented by $b_{0,16}$, $b_{1,16}$, $b_{2,16}$, and $b_{3,16}$, and input bits used to perform mapping for 64QAM are represented by $b_{0,64}$, $b_{1,64}$, $b_{2,64}$, $b_{3,64}$ $b_{4,64}$, and $b_{5,64}$, even if α is set to α in any of formulas S89, S90, S91, and S92, concerning the signal $z_1(t)$ ($z_1(i)$), signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) exist in the I (in-phase)-Q (quadrature(-phase)) plane.

Similarly, concerning the signal $z_2(t)$ ($z_2(i)$), signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) exist in the I (in-phase)-Q (quadrature(-phase)) plane.

Formulas S89 to S92 are shown above as "the values of α that allow the reception device to obtain high data reception quality when attention is focused on the signal $z_2(t)$ ($z_2(i)$) in formulas S2, S3, S4, S5, and S8". Description is made on this point.

Concerning the signal $z_2(t)$ ($z_2(i)$), signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) exist in the I (in-phase)-Q (quadrature(-phase)) plane. It is desirable that these $2^{10}$=1024 signal points exist without overlapping one another in the I (in-phase)-Q (quadrature (-phase)) plane.

The reason is as follows. When the modulated signal transmitted from the antenna for transmitting the signal $z_1(t)$ ($z_1(i)$) does not reach the reception device, the reception device performs detection and error correction decoding by using the signal $z_2(t)$ ($z_2(i)$). In this case, it is desirable that "1024 signal points exist without overlapping one another" in order for the reception device to obtain high data reception quality.

When the precoding matrix F is set to the precoding matrix F in any of formulas S85, S86, S87, and S88, and α is set to α in any of formulas S89, S90, S91, and S92, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 16. In FIG. 16, the horizontal and vertical axes respectively represent I and Q, and black circles represent the signal points.

As can be seen from FIG. 16, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S85, S86, S87, and S88, and α is set to α in any of formulas S89, S90, S91, and S92, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 17. In FIG. 17, the horizontal and vertical axes respectively represent I and Q, and black circles represent the signal points.

As can be seen from FIG. 17, 1024 signal points exist without overlapping one another. As a result, the reception device is likely to obtain high reception quality.

The minimum Euclidian distance between 1024 signal points in FIG. 16 is represented by $D_2$, and the minimum Euclidian distance between 1024 signal points in FIG. 17 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 2-2

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 132]

$$F = \begin{pmatrix} \beta\times\cos\theta & \beta\times\sin\theta \\ \beta\times\sin\theta & -\beta\times\cos\theta \end{pmatrix} \quad \text{(formula S93)}$$

or

[Math. 133]

$$F = \begin{pmatrix} \cos\theta & \sin\theta \\ \sin\theta & -\cos\theta \end{pmatrix} \quad \text{(formula S94)}$$

or

[Math. 134]

$$F = \begin{pmatrix} \beta\times\cos\theta & -\beta\times\sin\theta \\ \beta\times\sin\theta & \beta\times\cos\theta \end{pmatrix} \quad \text{(formula S95)}$$

or

[Math. 135]

$$F = \begin{pmatrix} \cos\theta & -\sin\theta \\ \sin\theta & \cos\theta \end{pmatrix} \quad \text{(formula S96)}$$

In formulas S93 and S95, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 136]

$$\theta = \tan^{-1}\left(\frac{\sqrt{42}}{\sqrt{10}}\times\frac{5}{4}\right) \text{ or } \tan^{-1}\left(\frac{\sqrt{42}}{\sqrt{10}}\times\frac{5}{4}\right)+2n\pi \text{ (radian)} \quad \text{(formula S97)}$$

or

[Math. 137]

$$\theta = \pi+\tan^{-1}\left(\frac{\sqrt{42}}{\sqrt{10}}\times\frac{5}{4}\right) \text{ or } \pi+\tan^{-1}\left(\frac{\sqrt{42}}{\sqrt{10}}\times\frac{5}{4}\right)+2n\pi \text{ (radian)} \quad \text{(formula S98)}$$

or

-continued

[Math. 138]

$$\theta=\tan^{-1}\left(-\frac{\sqrt{42}}{\sqrt{10}}\times\frac{5}{4}\right)\text{ or }\tan^{-1}\left(-\frac{\sqrt{42}}{\sqrt{10}}\times\frac{5}{4}\right)+2n\pi\text{ (radian)}\qquad\text{(formula S99)}$$

or

[Math. 139]

$$\theta=\pi+\tan^{-1}\left(-\frac{\sqrt{42}}{\sqrt{10}}\times\frac{5}{4}\right)\text{ or }\pi+\tan^{-1}\left(-\frac{\sqrt{42}}{\sqrt{10}}\times\frac{5}{4}\right)+2n\pi\text{ (radian)}\qquad\text{(formula S100)}$$

In formulas S97, S98, S99, and S100, $\tan^{-1}(x)$ is an inverse trigonometric function (an inverse function of the trigonometric function with appropriately restricted domains), and satisfies the following formula.

[Math. 140]

$$-\frac{\pi}{2}\text{ (radian)}<\tan^{-1}(x)<\frac{\pi}{2}\text{ (radian)}\qquad\text{(formula S101)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S93, S94, S95, and S96, and θ is set to θ in any of formulas S97, S98, S99, and S100, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 16 similarly to the above. In FIG. 16, the horizontal and vertical axes respectively represent I and Q, and black circles represent the signal points.

As can be seen from FIG. 16, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S93, S94, S95, and S96, and θ is set to θ in any of formulas S97, S98, S99, and S100, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 17 similarly to the above. In FIG. 17, the horizontal and vertical axes respectively represent I and Q, and black circles represent the signal points.

As can be seen from FIG. 17, 1024 signal points exist without overlapping one another. As a result, the reception device is likely to obtain high reception quality.

The minimum Euclidian distance between 1024 signal points in FIG. 16 is represented by $D_2$, and the minimum Euclidian distance between 1024 signal points in FIG. 17 is represented by $D_1$. In this case, $D_1<D_2$ is satisfied. Accordingly, as described in Configuration Example R1, it is desirable that $Q_1<Q_2$ be satisfied when $Q_1\neq Q_2$ is satisfied in formulas S2, S3, S4, S5, and S8.

Example 2-3

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 141]

$$F=\begin{pmatrix}\beta\times e^{j0} & \beta\times\alpha\times e^{j0}\\ \beta\times\alpha\times e^{j0} & \beta\times e^{j\pi}\end{pmatrix}\qquad\text{(formula S102)}$$

or

[Math. 142]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix}\qquad\text{(formula S103)}$$

or

[Math. 143]

$$F=\begin{pmatrix}\beta\times e^{j0} & \beta\times\alpha\times e^{j\pi}\\ \beta\times\alpha\times e^{j0} & \beta\times e^{j0}\end{pmatrix}\qquad\text{(formula S104)}$$

or

[Math. 144]

$$F=\frac{1}{\sqrt{\alpha^2+1}}\begin{pmatrix}e^{j0} & \alpha\times e^{j\pi}\\ \alpha\times e^{j0} & e^{j0}\end{pmatrix}\qquad\text{(formula S105)}$$

In formulas S102, S103, S104, and S105, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_2(t)$ ($z_2(i)$) in formulas S2, S3, S4, S5, and S8 are as follows.

When α is a real number:

[Math. 145]

$$\alpha=\frac{\sqrt{42}}{\sqrt{10}}\times\frac{4}{5}\qquad\text{(formula S106)}$$

-continued

[Math. 146]

$$\alpha = -\frac{\sqrt{42}}{\sqrt{10}} \times \frac{4}{5} \quad \text{(formula S107)}$$

When α is an imaginary number:

[Math. 147]

$$\alpha = \frac{\sqrt{42}}{\sqrt{10}} \times \frac{4}{5} \times e^{j\frac{\pi}{2}} \quad \text{(formula S108)}$$

or

[Math. 148]

$$\alpha = \frac{\sqrt{42}}{\sqrt{10}} \times \frac{4}{5} \times e^{j\frac{3\pi}{2}} \quad \text{(formula S109)}$$

When the precoding matrix F is set to the precoding matrix F in any of formulas S102, S103, S104, and S105, and α is set to α in any of formulas S106, S107, S108, and S109, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 18 similarly to the above. In FIG. 18, the horizontal and vertical axes respectively represent I and Q, and black circles represent the signal points.

As can be seen from FIG. 18, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S102, S103, S104, and S105, and α is set to α in any of formulas S106, S107, S108, and S109, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 19 similarly to the above. In FIG. 19, the horizontal and vertical axes respectively represent I and Q, and black circles represent the signal points.

As can be seen from FIG. 19, 1024 signal points exist without overlapping one another. As a result, the reception device is likely to obtain high reception quality.

The minimum Euclidean distance between 1024 signal points in FIG. 18 is represented by $D_2$, and the minimum Euclidian distance between 1024 signal points in FIG. 19 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 2-4

The following describes a case where formulas S11 and S12 are satisfied for the coefficients $w_{16}$ and we described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 149]

$$F = \begin{pmatrix} \beta \times \cos\theta & \beta \times \sin\theta \\ \beta \times \sin\theta & -\beta \times \cos\theta \end{pmatrix} \quad \text{(formula S110)}$$

or

[Math. 150]

$$F = \begin{pmatrix} \cos\theta & \sin\theta \\ \sin\theta & -\cos\theta \end{pmatrix} \quad \text{(formula S111)}$$

or

[Math. 151]

$$F = \begin{pmatrix} \beta \times \cos\theta & -\beta \times \sin\theta \\ \beta \times \sin\theta & \beta \times \cos\theta \end{pmatrix} \quad \text{(formula S112)}$$

or

[Math. 152]

$$F = \begin{pmatrix} \cos\theta & -\sin\theta \\ \sin\theta & \cos\theta \end{pmatrix} \quad \text{(formula S113)}$$

In formulas S110 and S112, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 153]

$$\theta = \tan^{-1}\left(\frac{\sqrt{42}}{\sqrt{10}} \times \frac{4}{5}\right) \text{ or } \tan^{-1}\left(\frac{\sqrt{42}}{\sqrt{10}} \times \frac{4}{5}\right) + 2n\pi \text{ (radian)} \quad \text{(formula S114)}$$

or

[Math. 154]

$$\theta = \pi + \tan^{-1}\left(\frac{\sqrt{42}}{\sqrt{10}} \times \frac{4}{5}\right) \text{ or } \pi + \tan^{-1}\left(\frac{\sqrt{42}}{\sqrt{10}} \times \frac{4}{5}\right) + 2n\pi \text{ (radian)} \quad \text{(formula S115)}$$

or

-continued

[Math. 155]

$$\theta = \tan^{-1}\left(-\frac{\sqrt{42}}{\sqrt{10}} \times \frac{4}{5}\right) \text{ or } \tan^{-1}\left(-\frac{\sqrt{42}}{\sqrt{10}} \times \frac{4}{5}\right) + 2n\pi \text{ (radian)} \quad \text{(formula S116)}$$

or

[Math. 156]

$$\theta = \pi + \tan^{-1}\left(-\frac{\sqrt{42}}{\sqrt{10}} \times \frac{4}{5}\right) \text{ or } \pi + \tan^{-1}\left(-\frac{\sqrt{42}}{\sqrt{10}} \times \frac{4}{5}\right) + 2n\pi \text{ (radian)} \quad \text{(formula S117)}$$

In formulas S114, S115, S116, and S117, $\tan^{-1}(x)$ is an inverse trigonometric function (an inverse function of the trigonometric function with appropriately restricted domains), and satisfies the following formula.

[Math. 157]

$$-\frac{\pi}{2} \text{ (radian)} < \tan^{-1}(x) < \frac{\pi}{2} \text{ (radian)} \quad \text{(formula S118)}$$

Further, "$\tan^{-1}(x)$" may be expressed as "$\mathrm{Tan}^{-1}(x)$". "arctan(x)", and "Arctan(x)". Note that n is an integer.

When the precoding matrix F is set to the precoding matrix F in any of formulas S110, S111, S112, and S113, and θ is set to θ in any of formulas S114, S115, S116, and S117, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 18 similarly to the above. In FIG. 18, the horizontal and vertical axes respectively represent I and Q, and black circles represent the signal points.

As can be seen from FIG. 18, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S110, S111, S112, and S113, and θ is set to θ in any of formulas S114, S115, S116, and S117, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 19 similarly to the above. In FIG. 19, the horizontal and vertical axes respectively represent I and Q, and black circles represent the signal points.

As can be seen from FIG. 19, 1024 signal points exist without overlapping one another. As a result, the reception device is likely to obtain high reception quality.

The minimum Euclidian distance between 1024 signal points in FIG. 18 is represented by $D_2$, and the minimum Euclidian distance between 1024 signal points in FIG. 19 is represented by $D_1$. In this case, $D_1 < D_2$ is satisfied. Accordingly, as described in Configuration Example R1, it is desirable that $Q_1 < Q_2$ be satisfied when $Q_1 \neq Q_2$ is satisfied in formulas S2, S3, S4, S5, and S8.

Example 2-5

The following describes a case where formulas S11 and 812 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2 = P_2^2$ is satisfied in formula S2

<2> Case where $P_1^2 = P_2^2$ is satisfied in formula S3

<3> Case where $P_1^2 = P_2^2$ is satisfied in formula S4

<4> Case in formula S5

<5> Case in formula S8

[Math. 158]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S119)}$$

or

[Math. 159]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{(formula S120)}$$

or

[Math. 160]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S121)}$$

or

[Math. 161]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{(formula S122)}$$

In formulas S119, S120, S121, and S122, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_1(t)$ ($z_1(i)$) in formulas S2, S3, S4, S5, and S8 are as follows.

When α is a real number:

[Math. 162]

$$\alpha = \frac{\sqrt{10}}{\sqrt{42}} \times \frac{5}{4} \quad \text{(formula S123)}$$

or

-continued

[Math. 163]

$$\alpha = -\frac{\sqrt{10}}{\sqrt{42}} \times \frac{5}{4} \quad \text{(formula S124)}$$

When α is an imaginary number:

[Math. 164]

$$\alpha = \frac{\sqrt{10}}{\sqrt{42}} \times \frac{5}{4} \times e^{j\frac{\pi}{2}} \quad \text{(formula S125)}$$

or

[Math. 165]

$$\alpha = \frac{\sqrt{10}}{\sqrt{42}} \times \frac{5}{4} \times e^{j\frac{3\pi}{2}} \quad \text{(formula S126)}$$

When the precoding matrix F is set to the precoding matrix F in any of formulas S119, S120, S121, and S122, and α is set to α in any of formulas S123, S124, S125, and S126, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 12 similarly to the above. In FIG. 12, the horizontal and vertical axes respectively represent I and Q, and black circles represent the signal points.

As can be seen from FIG. 12, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S119, S120, S121, and S122, and α is set to α in any of formulas S123, S124, S125, and S126, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 13 similarly to the above. In FIG. 13, the horizontal and vertical axes respectively represent I and Q, and black circles represent the signal points.

As can be seen from FIG. 13, 1024 signal points exist without overlapping one another. As a result, the reception device is likely to obtain high reception quality.

The minimum Euclidian distance between 1024 signal points in FIG. 12 is represented by $D_1$, and the minimum Euclidian distance between 1024 signal points in FIG. 13 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 2-6

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 166]

$$F = \begin{pmatrix} \beta\times\cos\theta & \beta\times\sin\theta \\ \beta\times\sin\theta & -\beta\times\cos\theta \end{pmatrix} \quad \text{(formula S127)}$$

or

[Math. 167]

$$F = \begin{pmatrix} \cos\theta & \sin\theta \\ \sin\theta & -\cos\theta \end{pmatrix} \quad \text{(formula S128)}$$

or

[Math. 168]

$$F = \begin{pmatrix} \beta\times\cos\theta & -\beta\times\sin\theta \\ \beta\times\sin\theta & \beta\times\cos\theta \end{pmatrix} \quad \text{(formula S129)}$$

or

[Math. 169]

$$F = \begin{pmatrix} \cos\theta & -\sin\theta \\ \sin\theta & \cos\theta \end{pmatrix} \quad \text{(formula S130)}$$

In formulas S127 and S129, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_1(t)$ ($z_1(i)$) in formulas S2, S3, S4, S5, and S8 are as follows.

[Math. 170]

$$\theta = \tan^{-1}\left(\frac{\sqrt{10}}{\sqrt{42}} \times \frac{5}{4}\right) \text{ or } \tan^{-1}\left(\frac{\sqrt{10}}{\sqrt{42}} \times \frac{5}{4}\right) + 2n\pi \text{ (radian)} \quad \text{(formula S131)}$$

or

[Math. 171]

$$\theta = \pi + \tan^{-1}\left(\frac{\sqrt{10}}{\sqrt{42}} \times \frac{5}{4}\right) \text{ or } \pi + \tan^{-1}\left(\frac{\sqrt{10}}{\sqrt{42}} \times \frac{5}{4}\right) + 2n\pi \text{ (radian)} \quad \text{(formula S132)}$$

or

-continued

[Math. 172]

$$\theta = \tan^{-1}\left(-\frac{\sqrt{10}}{\sqrt{42}} \times \frac{5}{4}\right) \text{ or } \tan^{-1}\left(-\frac{\sqrt{10}}{\sqrt{42}} \times \frac{5}{4}\right) + 2n\pi \text{ (radian)} \quad \text{(formula S133)}$$

or

[Math. 173]

$$\theta = \pi + \tan^{-1}\left(-\frac{\sqrt{10}}{\sqrt{42}} \times \frac{5}{4}\right) \text{ or } \pi + \tan^{-1}\left(-\frac{\sqrt{10}}{\sqrt{42}} \times \frac{5}{4}\right) + 2n\pi \text{ (radian)} \quad \text{(formula S134)}$$

In formulas S131, S132, S133, and S134, $\tan^{-1}(x)$ is an inverse trigonometric function (an inverse function of the trigonometric function with appropriately restricted domains), and satisfies the following formula.

[Math. 174]

$$-\frac{\pi}{2} \text{ (radian)} < \tan^{-1}(x) < \frac{\pi}{2} \text{ (radian)} \quad \text{(formula S135)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S127, S128, S129, and S130, and θ is set to θ in any of formulas S131, S132, S133, and S134, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 12 similarly to the above. In FIG. 12, the horizontal and vertical axes respectively represent I and Q, and black circles represent the signal points.

As can be seen from FIG. 12, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S127, S128, S129, and S130, and θ is set to θ in any of formulas S131, S132, S133, and S134, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 13 similarly to the above. In FIG. 13, the horizontal and vertical axes respectively represent I and Q, and black circles represent the signal points.

As can be seen from FIG. 13, 1024 signal points exist without overlapping one another. As a result, the reception device is likely to obtain high reception quality.

The minimum Euclidian distance between 1024 signal points in FIG. 12 is represented by $D_1$, and the minimum Euclidian distance between 1024 signal points in FIG. 13 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 2-7

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 175]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S136)}$$

or

[Math. 176]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{(formula S137)}$$

or

[Math. 177]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S138)}$$

or

[Math. 178]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{(formula S139)}$$

In formulas S136, S137, S138, and S139, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_1(t)$ ($z_1(i)$) in formulas S2, S3, S4, S5, and S8 are as follows.

When α is a real number:

[Math. 179]

$$\alpha = \frac{\sqrt{10}}{\sqrt{42}} \times \frac{4}{5} \quad \text{(formula S140)}$$

or

-continued

[Math. 180]

$$\alpha = -\frac{\sqrt{10}}{\sqrt{42}} \times \frac{4}{5} \quad \text{(formula S141)}$$

When α is an imaginary number:

[Math. 181]

$$\alpha = \frac{\sqrt{10}}{\sqrt{42}} \times \frac{4}{5} \times e^{j\frac{\pi}{2}} \quad \text{(formula S142)}$$

or

[Math. 182]

$$\alpha = \frac{\sqrt{10}}{\sqrt{42}} \times \frac{4}{5} \times e^{j\frac{3\pi}{2}} \quad \text{(formula S143)}$$

When the precoding matrix F is set to the precoding matrix F in any of formulas S136, S137, S138, and S139, and α is set to α in any of formulas S140, S141, S142, and S143, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 14 similarly to the above. In FIG. 14, the horizontal and vertical axes respectively represent I and Q, and black circles represent the signal points.

As can be seen from FIG. 14, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S136, S137, S138, and S139, and α is set to α in any of formulas S140, S141, S142, and S143, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 15 similarly to the above. In FIG. 15, the horizontal and vertical axes respectively represent I and Q, and black circles represent the signal points.

As can be seen from FIG. 15, 1024 signal points exist without overlapping one another. As a result, the reception device is likely to obtain high reception quality.

The minimum Euclidian distance between 1024 signal points in FIG. 14 is represented by $D_1$, and the minimum Euclidian distance between 1024 signal points in FIG. 15 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 2-8

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 183]

$$F = \begin{pmatrix} \beta \times \cos\theta & \beta \times \sin\theta \\ \beta \times \sin\theta & -\beta \times \cos\theta \end{pmatrix} \quad \text{(formula S144)}$$

or

[Math. 184]

$$F = \begin{pmatrix} \cos\theta & \sin\theta \\ \sin\theta & -\cos\theta \end{pmatrix} \quad \text{(formula S145)}$$

or

[Math. 185]

$$F = \begin{pmatrix} \beta \times \cos\theta & -\beta \times \sin\theta \\ \beta \times \sin\theta & \beta \times \cos\theta \end{pmatrix} \quad \text{(formula S146)}$$

or

[Math. 186]

$$F = \begin{pmatrix} \cos\theta & -\sin\theta \\ \sin\theta & \cos\theta \end{pmatrix} \quad \text{(formula S147)}$$

In formulas S144 and S146, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_1(t)$ ($z_1(i)$) in formulas S2, S3, S4, S5, and S8 are as follows.

[Math. 187]

$$\theta = \tan^{-1}\left(\frac{\sqrt{10}}{\sqrt{42}} \times \frac{4}{5}\right) \text{ or } \tan^{-1}\left(\frac{\sqrt{10}}{\sqrt{42}} \times \frac{4}{5}\right) + 2n\pi \text{ (radian)} \quad \text{(formula S148)}$$

or

[Math. 188]

$$\theta = \pi + \tan^{-1}\left(\frac{\sqrt{10}}{\sqrt{42}} \times \frac{4}{5}\right) \text{ or } \pi + \tan^{-1}\left(\frac{\sqrt{10}}{\sqrt{42}} \times \frac{4}{5}\right) + 2n\pi \text{ (radian)} \quad \text{\{formula S149)}$$

or

-continued

[Math. 189]

$$\theta = \tan^{-1}\left(-\frac{\sqrt{10}}{\sqrt{42}} \times \frac{4}{5}\right) \text{ or } \tan^{-1}\left(-\frac{\sqrt{10}}{\sqrt{42}} \times \frac{4}{5}\right) + 2n\pi \text{ (radian)} \quad \text{(formula S150)}$$

or

[Math. 190]

$$\theta = \pi + \tan^{-1}\left(-\frac{\sqrt{10}}{\sqrt{42}} \times \frac{4}{5}\right) \text{ or } \pi + \tan^{-1}\left(-\frac{\sqrt{10}}{\sqrt{42}} \times \frac{4}{5}\right) + 2n\pi \text{ (radian)} \quad \text{(formula S151)}$$

In formulas S148, S149, S150, and S151, $\tan^{-1}(x)$ is an inverse trigonometric function (an inverse function of the trigonometric function with appropriately restricted domains), and satisfies the following formula.

[Math. 191]

$$-\frac{\pi}{2} \text{ (radian)} < \tan^{-1}(x) < \frac{\pi}{2} \text{ (radian)} \quad \text{(formula S152)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S144, S145, S146, and S147, and θ is set to θ in any of formulas S148, S149, S150, and S151, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 14 similarly to the above. In FIG. 14, the horizontal and vertical axes respectively represent I and Q, and black circles represent the signal points.

As can be seen from FIG. 14, 1024 signal points exist without overlapping one another. Furthermore, as for 1020 signal points, from among 1024 signal points, excluding four signal points located at the top right, bottom right, top left, and bottom left of the I (in-phase)-Q (quadrature (-phase)) plane, Euclidian distances between any pairs of signal points that are the closest to each other are equal. As a result, the reception device is likely to obtain high reception quality.

When the precoding matrix F is set to the precoding matrix F in any of formulas S144, S145, S146, and S147, and θ is set to θ in any of formulas S148, S149, S150, and S151, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 15 similarly to the above. In FIG. 15, the horizontal and vertical axes respectively represent I and Q, and black circles represent the signal points.

As can be seen from FIG. 15, 1024 signal points exist without overlapping one another. As a result, the reception device is likely to obtain high reception quality.

The minimum Euclidian distance between 1024 signal points in FIG. 14 is represented by $D_1$, and the minimum Euclidian distance between 1024 signal points in FIG. 15 is represented by $D_2$. In this case, $D_1 > D_2$ is satisfied. Accordingly, as described in Configuration Example R1, it is desirable that $Q_1 > Q_2$ be satisfied when $Q_1 \neq Q_2$ is satisfied in formulas S2, S3, S4, S5, and S8.

Example 2

Supplemental Remarks

Examples of the values of α and θ that allow for obtaining high data reception quality are shown in Example 2-1 to Example 2-8. Even when the values of α and θ are not equal to the values shown in these examples, however, high data reception quality can be obtained by satisfying the conditions shown in Configuration Example R1.

Example 3

In the following description, in the mapper 504 in FIGS. 5-7, 64QAM and 256QAM are applied as a modulation scheme for obtaining $s_1(t)$ ($s_1(i)$) and a modulation scheme for obtaining $s_2(t)$ ($s_2(i)$), respectively. The following describes examples of the structure of the precoding matrix (F) and conditions regarding power change when precoding shown in any of formulas S2, S3, S4, S5, and S8 and/or power change are/is performed.

A mapping scheme for 64QAM is described first below. FIG. 11 shows an example of signal point constellation for 64QAM in the I (in-phase)-Q (quadrature(-phase)) plane. In FIG. 11, 64 circles represent signal points for 64QAM, and the horizontal and vertical axes respectively represent I and Q.

Coordinates of the 64 signal points (i.e., the circles in FIG. 11) for 64QAM in the I (in-phase)-Q (quadrature(-phase)) plane are ($7w_{64}$,$7w_{64}$), ($7w_{64}$,$5w_{64}$), ($7w_{64}$,$3w_{64}$), ($7w_{64}$,$w_{64}$), ($7w_{64}$,$-w_{64}$), ($7w_{64}$,$-3w_{64}$), ($7w_{64}$,$-5w_{64}$), ($7w_{64}$,$-7w_{64}$), ($5w_{64}$,$7w_{64}$), ($5w_{64}$,$5w_{64}$), ($5w_{64}$,$3w_{64}$), ($5w_{64}$,$w_{64}$), ($5w_{64}$,$-w_{64}$), ($5w_{64}$,$-3w_{64}$), ($5w_{64}$,$-5w_{64}$), ($5w_{64}$,$-7w_{64}$), ($3w_{64}$,$7w_{64}$), ($3w_{64}$,$5w_{64}$), ($3w_{64}$,$3w_{64}$), ($3w_{64}$,$w_{64}$), ($3w_{64}$,$-w_{64}$), ($3w_{64}$,$-3w_{64}$), ($3w_{64}$,$-5w_{64}$), ($3w_{64}$,$-7w_{64}$), ($w_{64}$,$7w_{64}$), ($w_{64}$,$5w_{64}$), ($w_{64}$,$3w_{64}$), ($w_{64}$,$w_{64}$), ($w_{64}$,$-w_{64}$), ($w_{64}$,$-3w_{64}$), ($w_{64}$,$-5w_{64}$), ($w_{64}$,$-7w_{64}$), ($-w_{64}$,$7w_{64}$), ($-w_{64}$,$5w_{64}$), ($-w_{64}$,$3w_{64}$), ($-w_{64}$,$w_{64}$), ($-w_{64}$,$-w_{64}$), ($-w_{64}$,$-3w_{64}$), ($-w_{64}$,$-5w_{64}$), ($-w_{64}$,$-7w_{64}$), ($-3w_{64}$,$7w_{64}$), ($-3w_{64}$,$5w_{64}$), ($-3w_{64}$,$3w_{64}$), ($-3w_{64}$,$w_{64}$), ($-3w_{64}$,$-w_{64}$), ($-3w_{64}$,$-w_{64}$), ($-3w_{64}$,$-5w_{64}$), ($-3w_{64}$,$-7w_{64}$), ($-5w_{64}$,$7w_{64}$), ($-5w_{64}$,$5w_{64}$), ($-5w_{64}$,$3w_{64}$), ($-5w_{64}$,$w_{64}$), ($-5w_{64}$,$-w_{64}$), ($-5w_{64}$,$-3w_{64}$), ($-5w_{64}$,$-5w_{64}$), ($-5w_{64}$,$-7w_{64}$), ($-7w_{64}$,$7w_{64}$), ($-7w_{64}$,$5w_{64}$), ($-7w_{64}$,$3w_{64}$), ($-7w_{64}$,$w_{64}$), ($-7w_{64}$,$-w_{64}$), ($-7w_{64}$,$-3w_{64}$), ($-7w_{64}$,$-5w_{64}$), and ($-7w_{64}$,$-7w_{64}$), where $w_{64}$ is a real number greater than 0.

Here, transmitted bits (input bits) are represented by b0, b1, b2, b3, b4, and b5. For example, when (b0, b1, b2, b3, b4, b5)=(0, 0, 0, 0, 0, 0) for the transmitted bits, mapping is performed to a signal point 1101 in FIG. 11. When an in-phase component and a quadrature component of the baseband signal obtained as a result of mapping are respectively represented by I and Q, $(I, Q)=(7w_{64}, 7w_{64})$ is satisfied.

That is to say, the in-phase component I and the quadrature component Q of the baseband signal obtained as a result of mapping (at the time of using 64QAM) are determined based on the transmitted bits (b0, b1, b2, b3, b4, b5). One example of a relationship between values (000000-111111) of a set of b0, b1, b2, b3, b4, and b5 and coordinates of signal points is as shown in FIG. 11. The values 000000-111111 of the set of b0, b1, b2, b3, b4, and b5 are shown directly below the 64 signal points (i.e., the circles in FIG. 11) for 64QAM, which are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64}-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$,
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$,
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$,
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$,
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$. Coordinates, in the I (in-phase)-Q (quadrature(-phase)) plane, of the signal points (i.e., the circles) directly above the values 000000-111111 of the set of b0, b1, b2, b3, b4, and b5 indicate the in-phase component I and the quadrature component Q of the baseband signal obtained as a result of mapping. The relationship between the values (000000-111111) of the set of b0, b1, b2, b3, b4, and b5 for 64QAM and coordinates of signal points is not limited to that shown in FIG. 11. Values obtained by expressing the in-phase component I and the quadrature component Q of the baseband signal obtained as a result of mapping (at the time of using 64QAM) in complex numbers correspond to the baseband signal ($s_1(t)$ or $s_2(t)$) in FIGS. 5-7.

Figure 20:
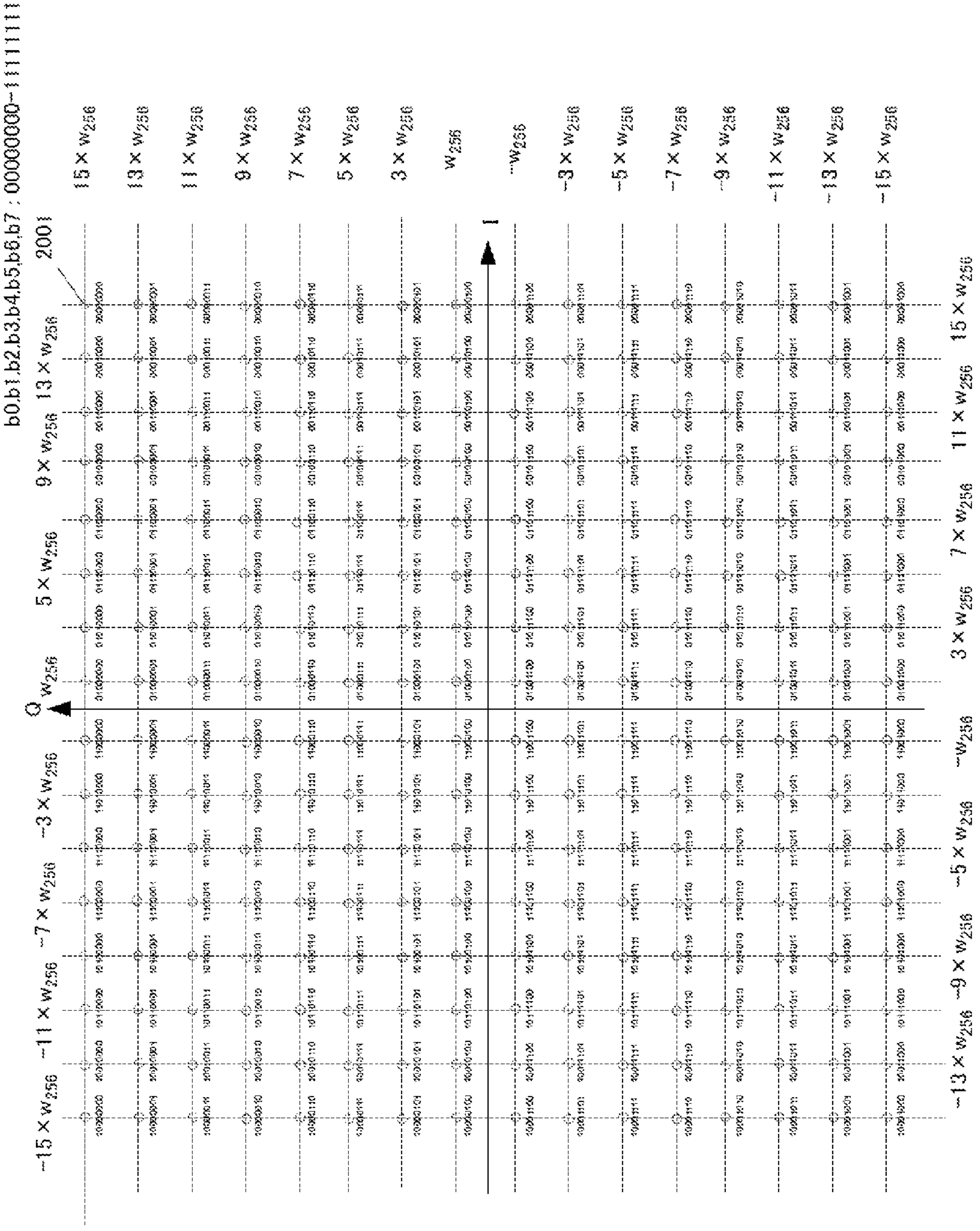
FIG. 20 shows an example of constellation of signal points in the I-Q plane.
Figure 21:
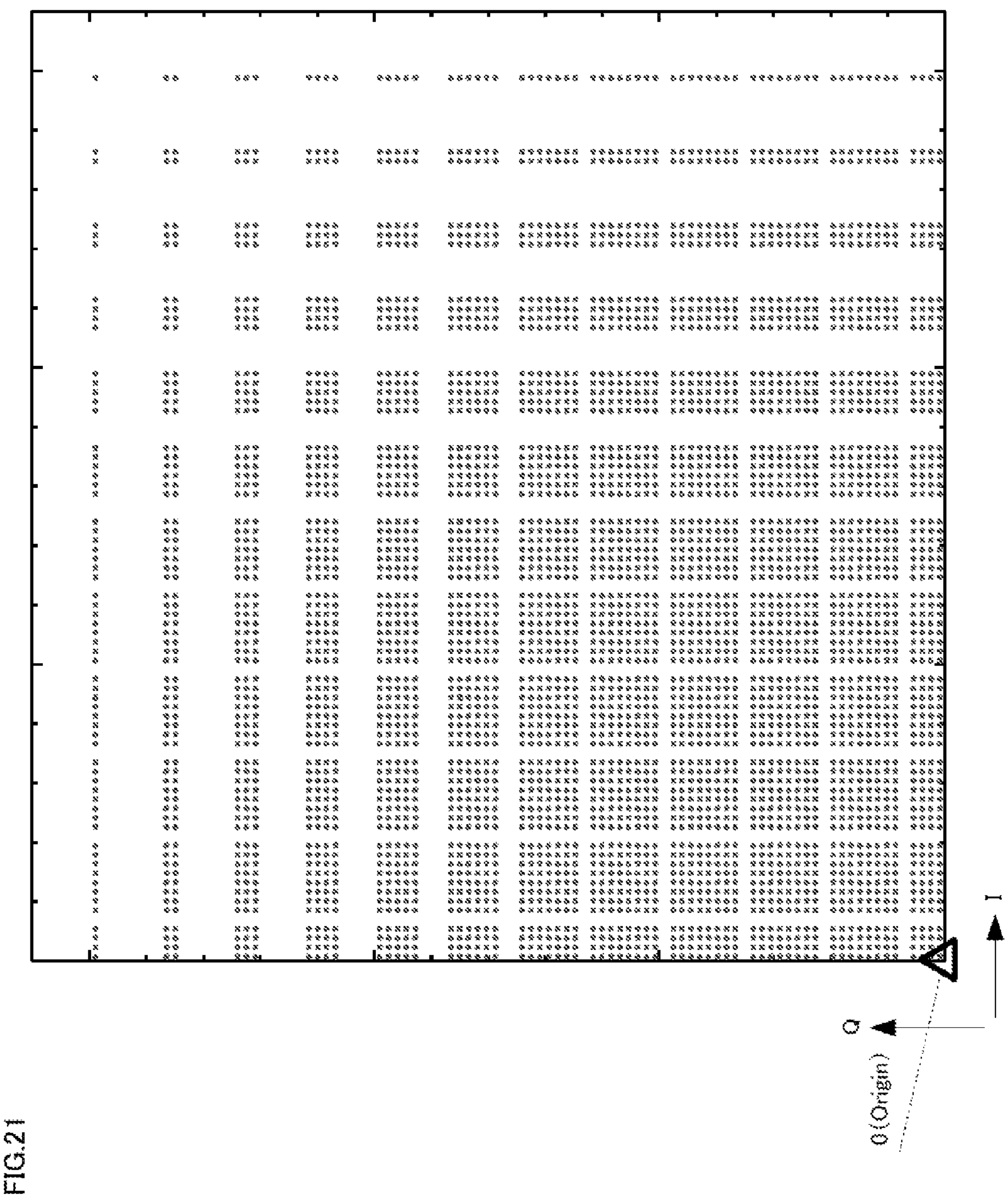
FIG. 21 shows an example of constellation of signal points existing in a first quadrant in the I-Q plane.
Figure 22:
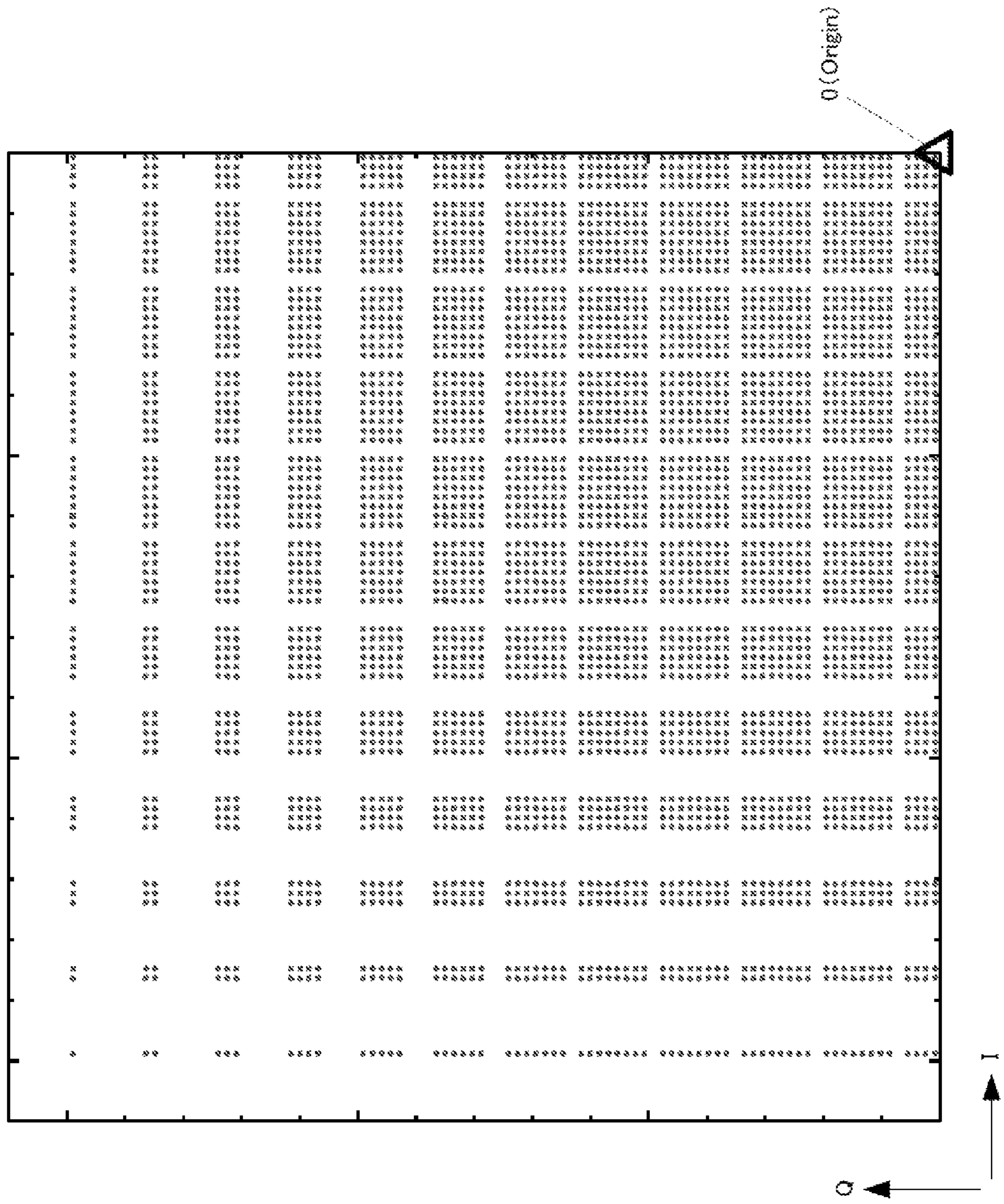
FIG. 22 shows an example of constellation of signal points existing in a second quadrant in the I-Q plane.
Figure 23:
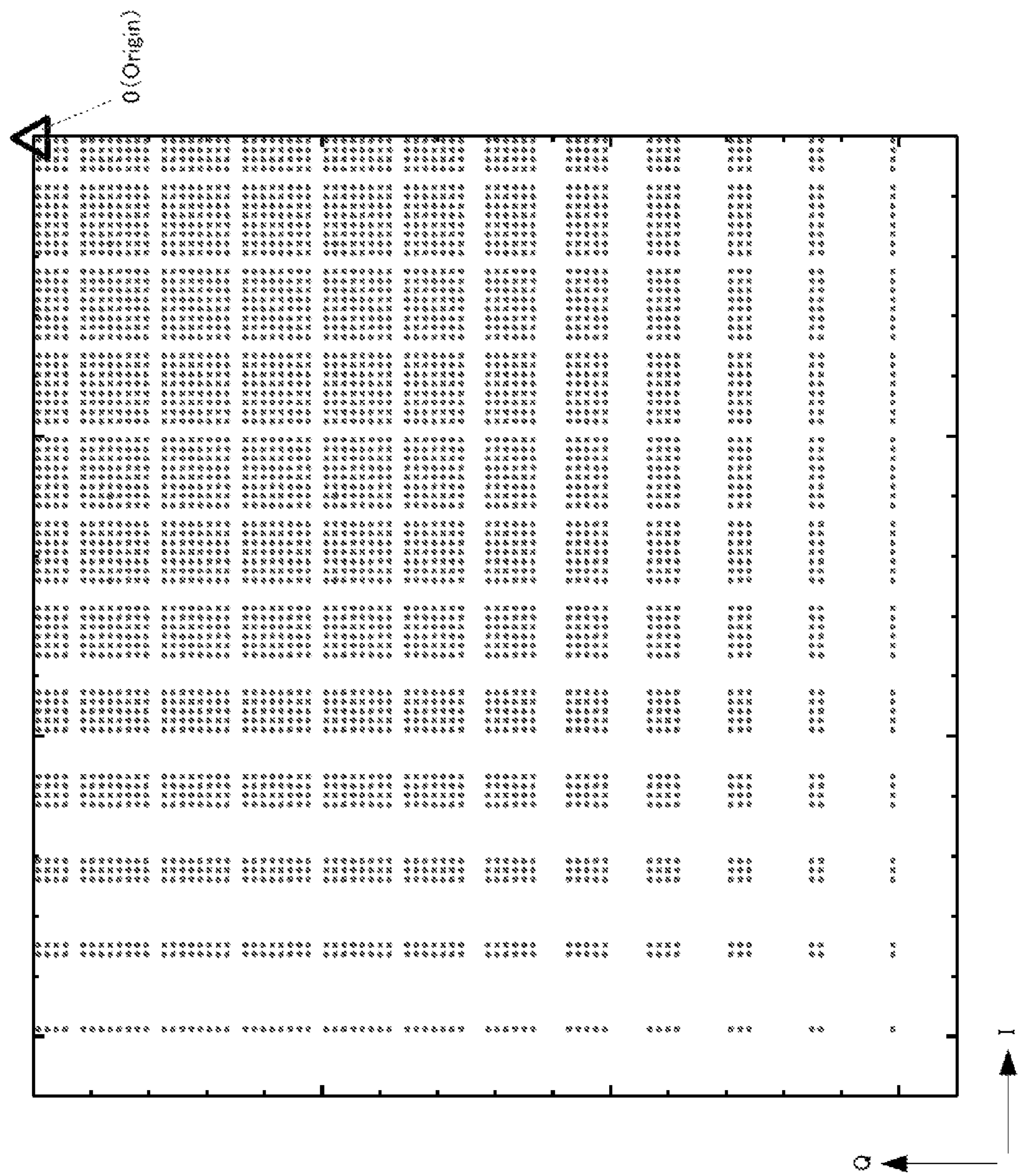
FIG. 23 shows an example of constellation of signal points existing in a third quadrant in the I-Q plane.
Figure 24:
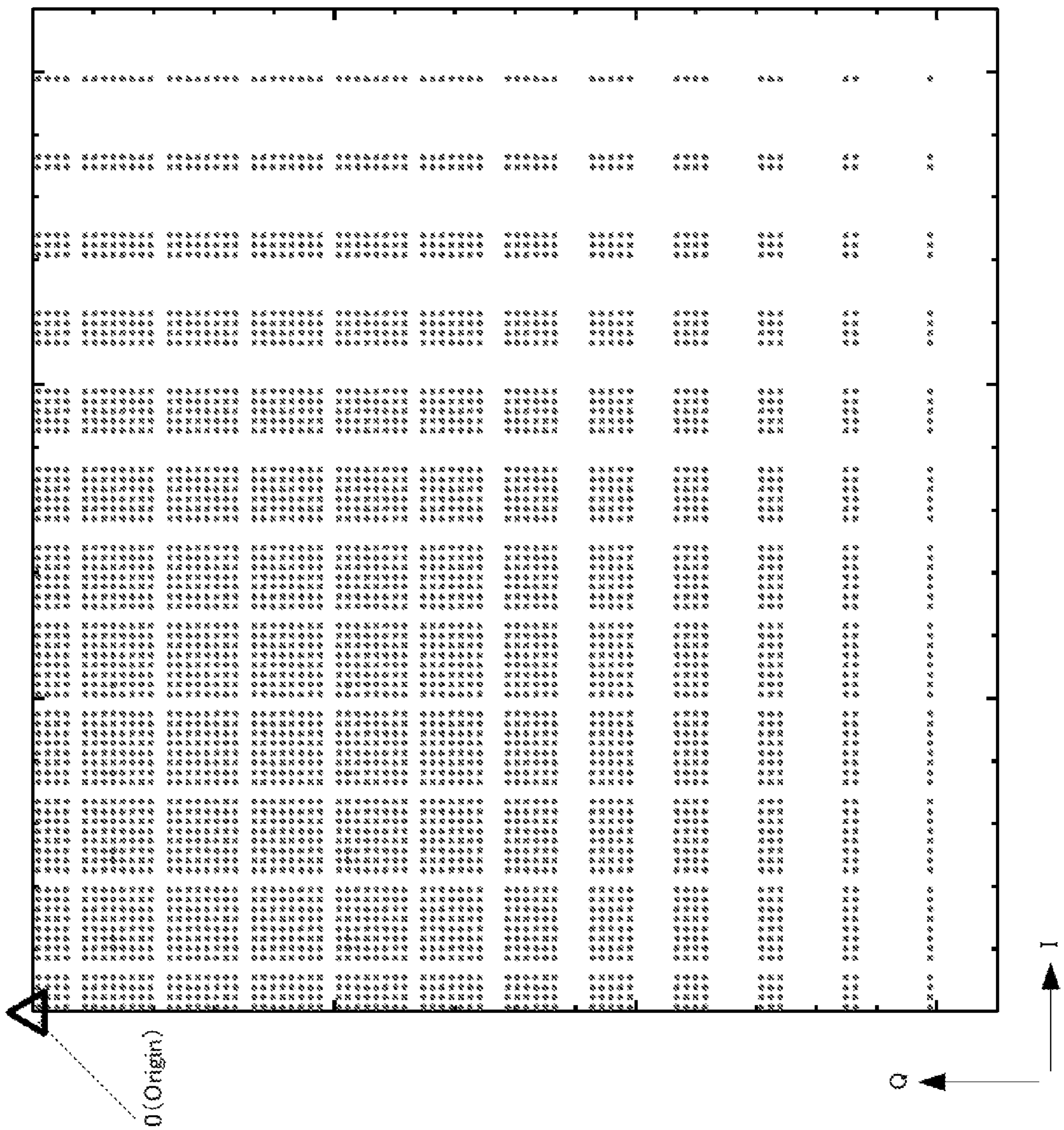
FIG. 24 shows an example of constellation of signal points existing in a fourth quadrant in the I-Q plane.
Figure 25:
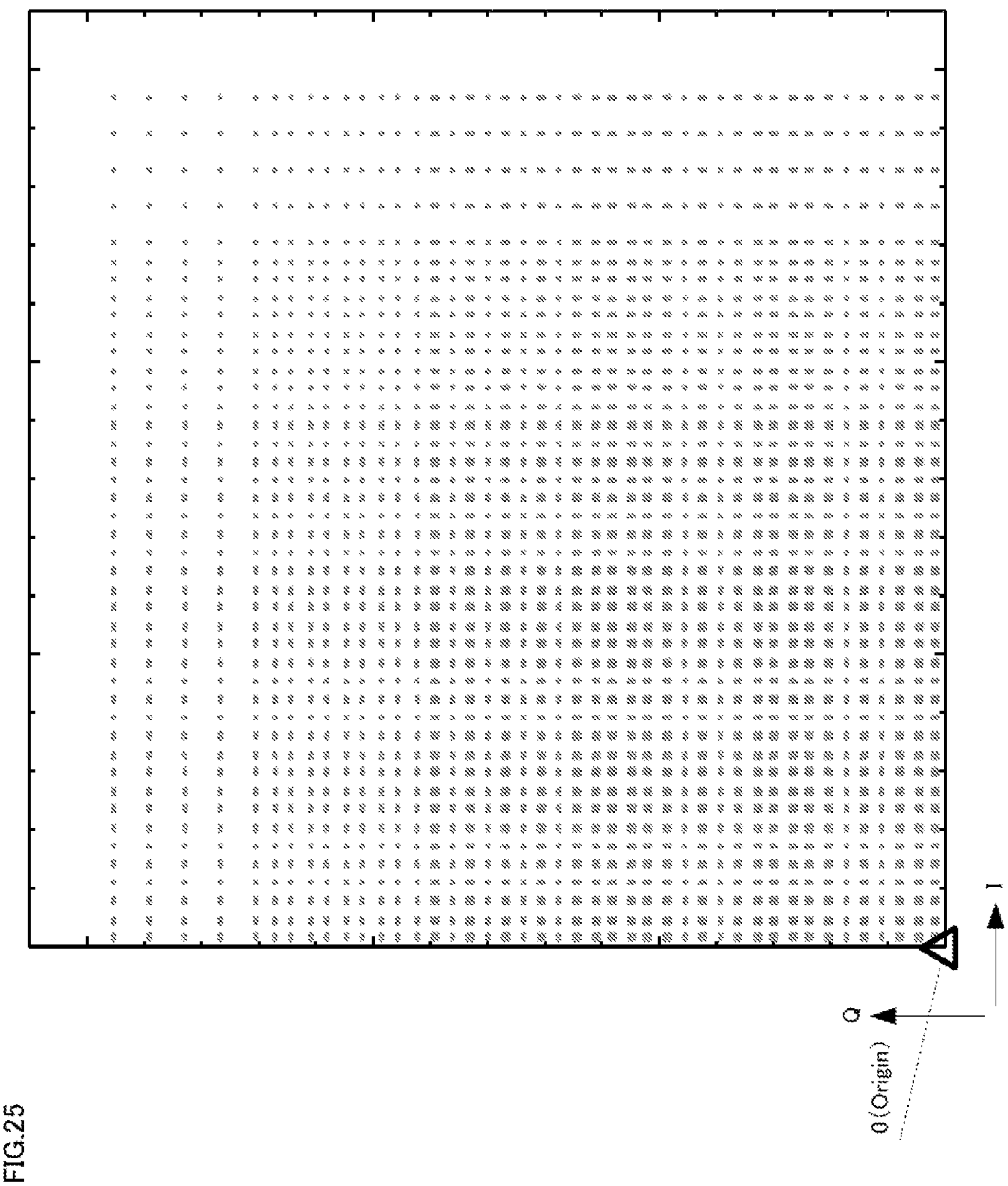
FIG. 25 shows an example of constellation of signal points existing in the first quadrant in the I-Q plane.
Figure 26:
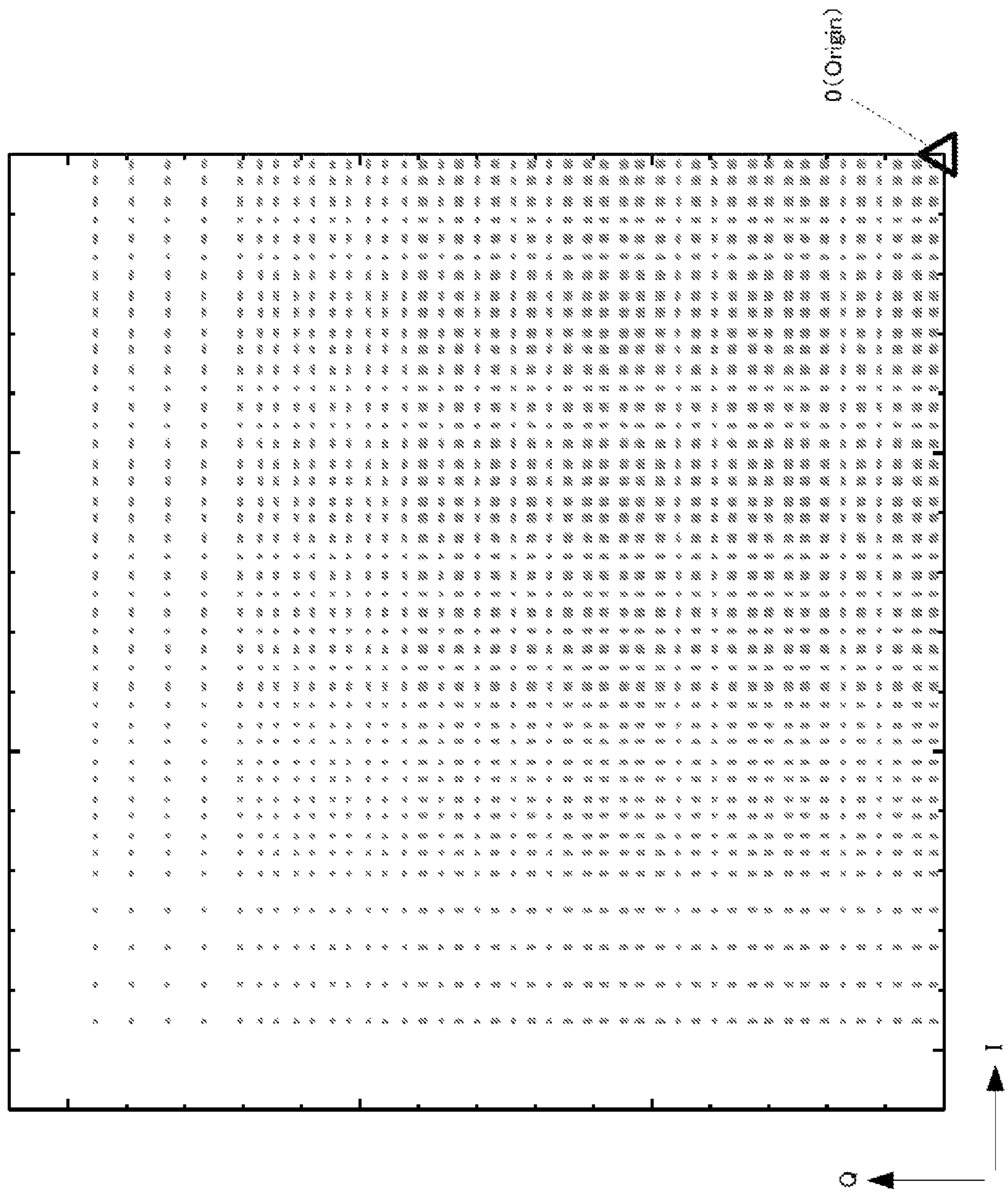
FIG. 26 shows an example of constellation of signal points existing in the second quadrant in the I-Q plane.
Figure 27:
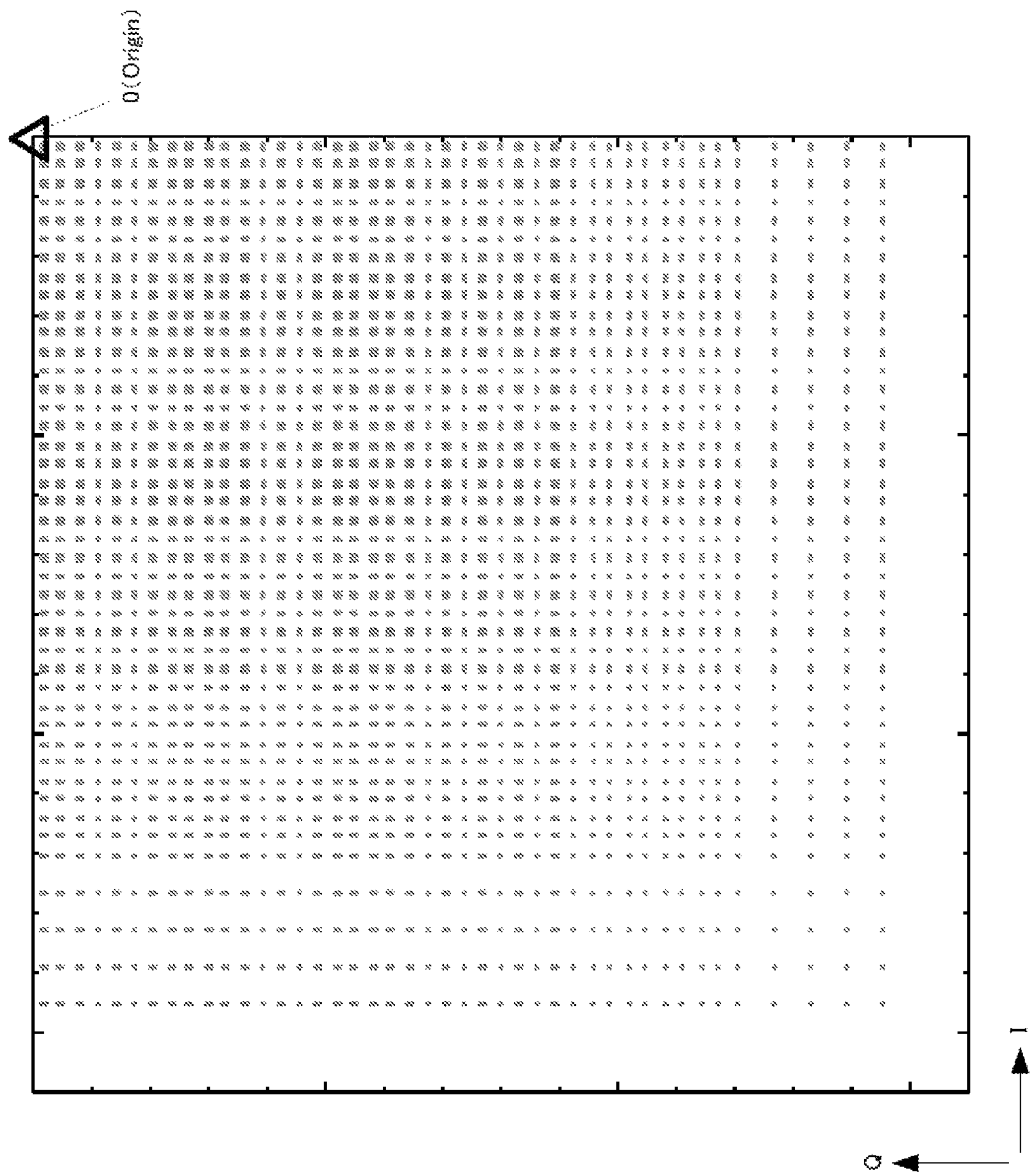
FIG. 27 shows an example of constellation of signal points existing in the third quadrant in the I-Q plane.
Figure 28:
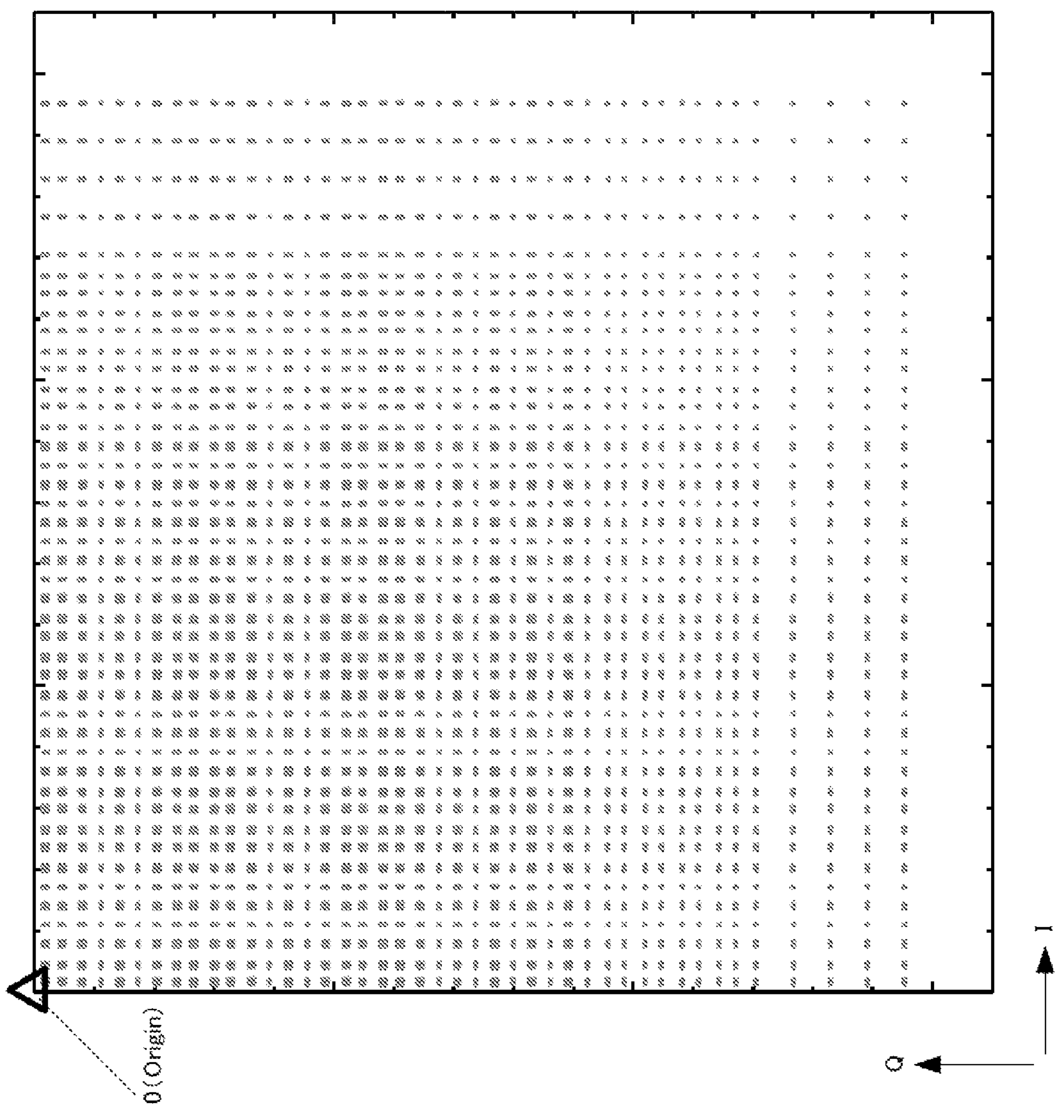
FIG. 28 shows an example of constellation of signal points existing in the fourth quadrant in the I-Q plane.
Figure 29:
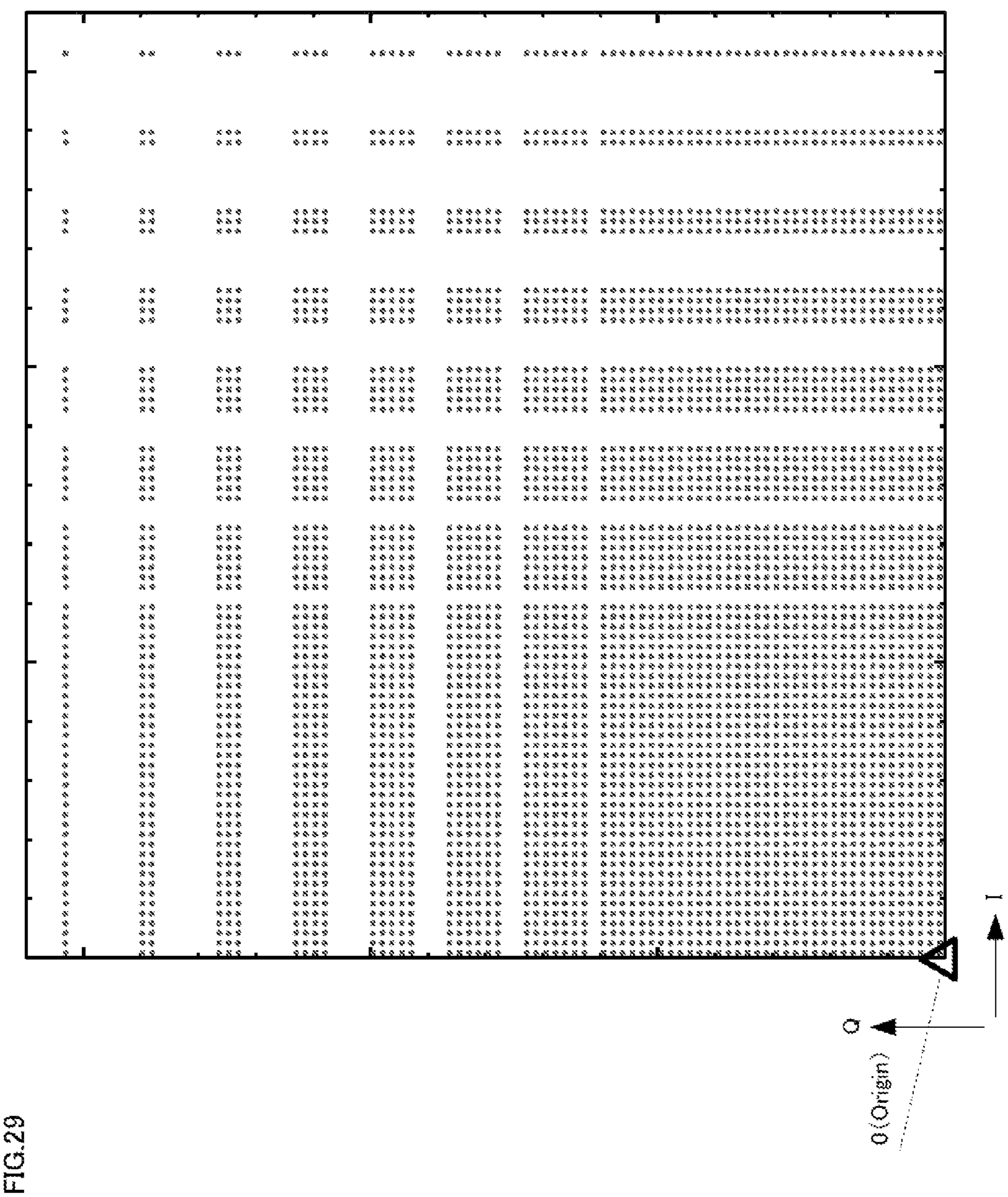
FIG. 29 shows an example of constellation of signal points existing in the first quadrant in the I-Q plane.
Figure 30:
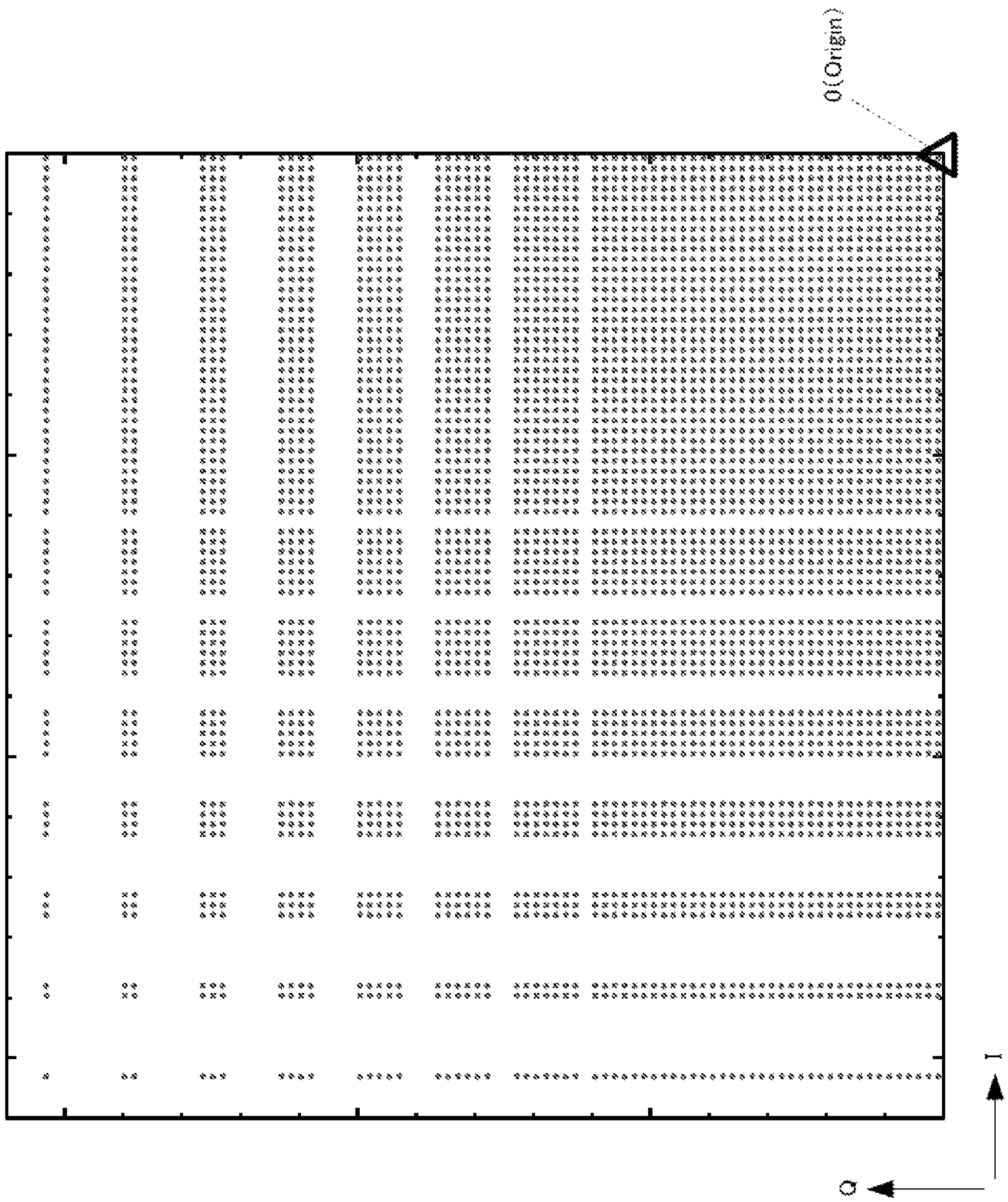
FIG. 30 shows an example of constellation of signal points existing in the second quadrant in the I-Q plane.
Figure 31:
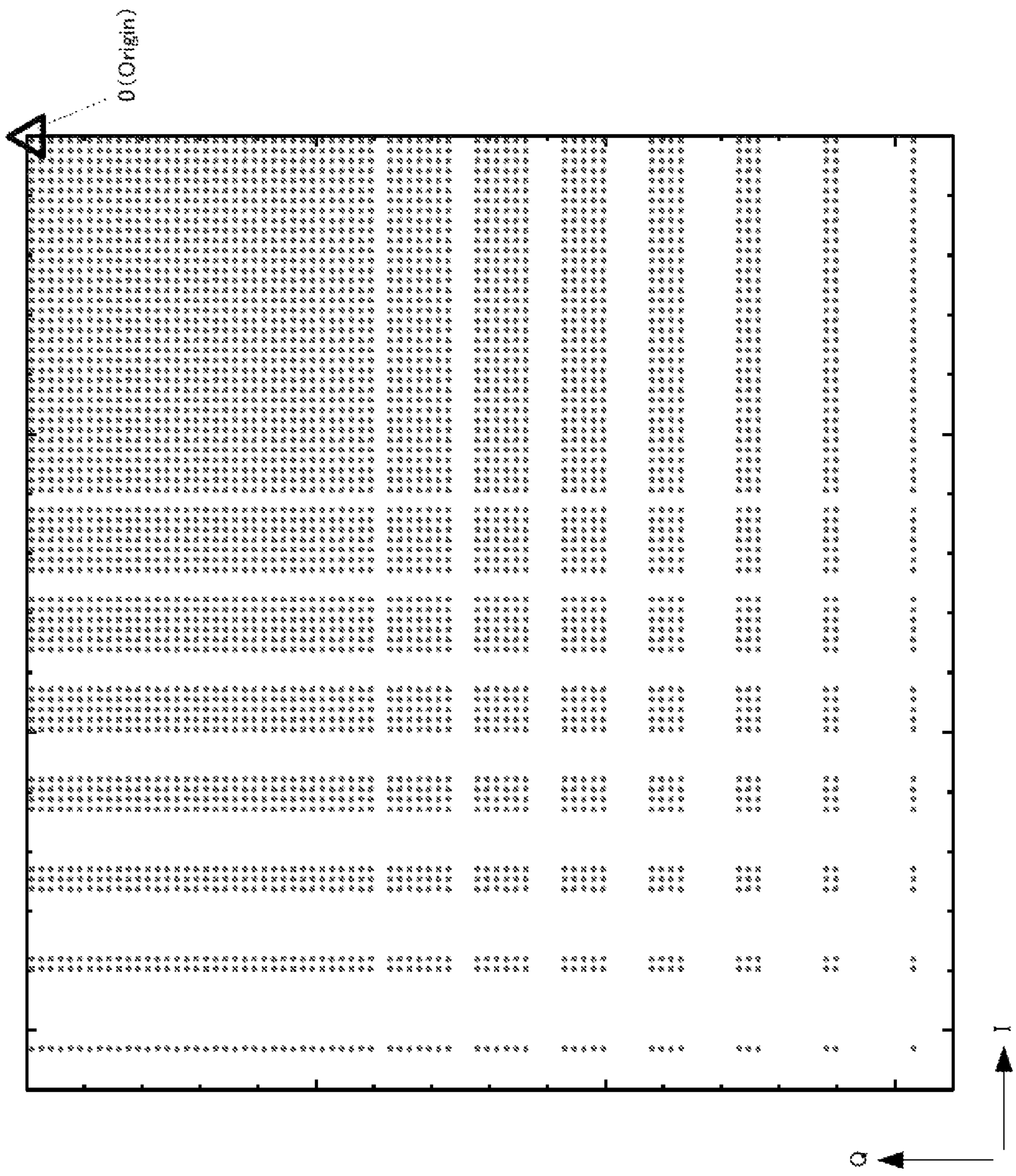
FIG. 31 shows an example of constellation of signal points existing in the third quadrant in the I-Q plane.
Figure 32:
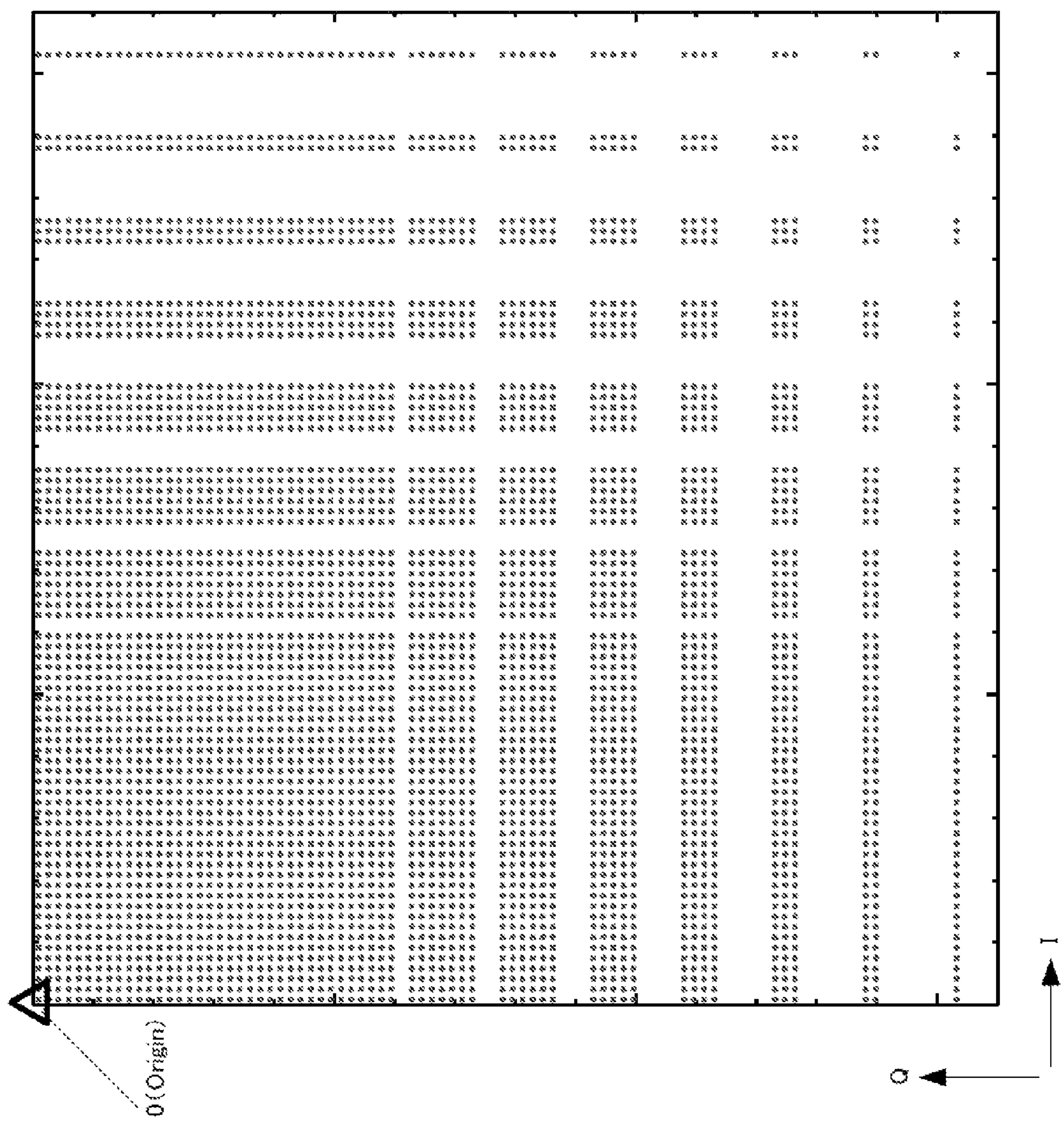
FIG. 32 shows an example of constellation of signal points existing in the fourth quadrant in the I-Q plane.
Figure 33:
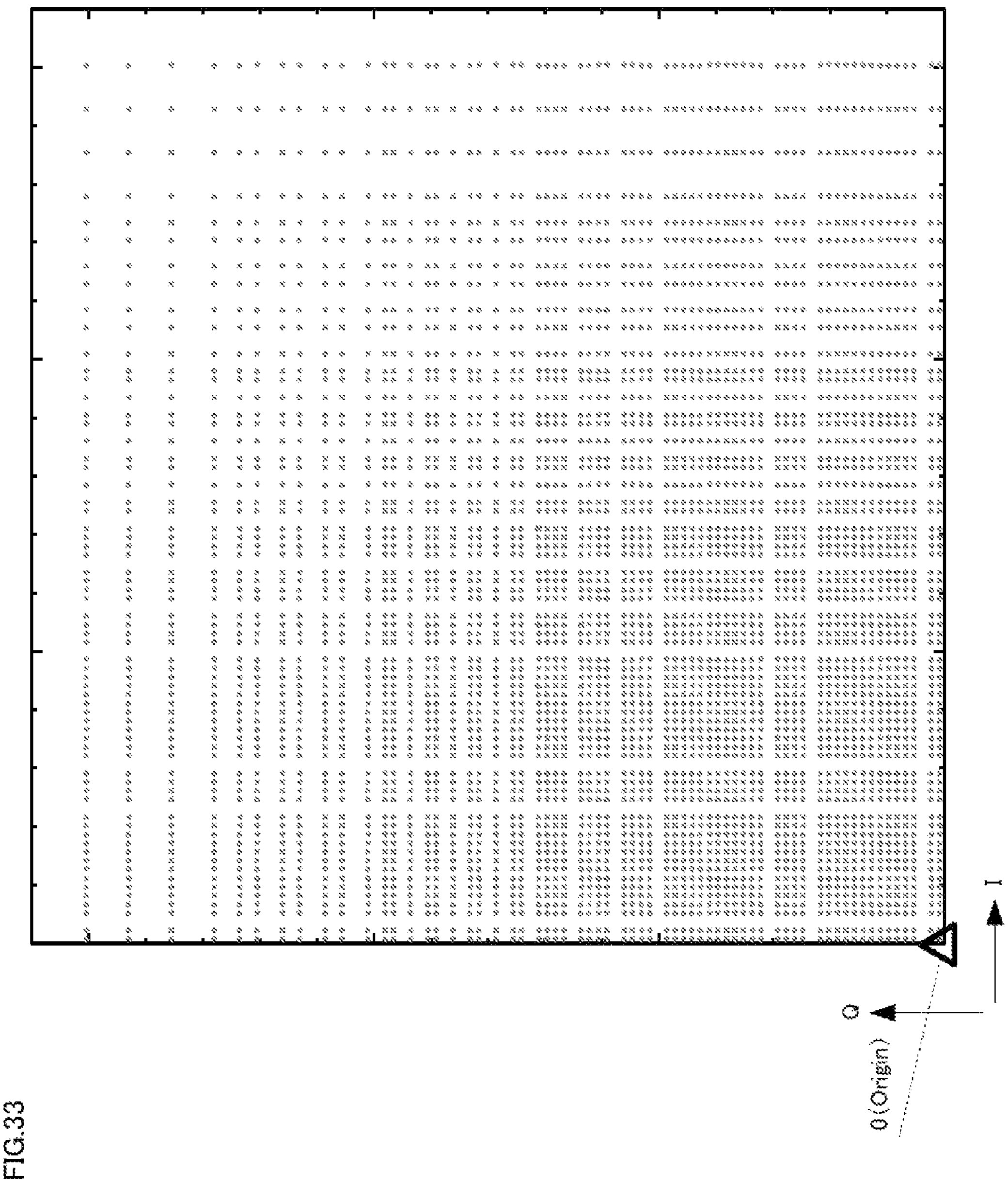
FIG. 33 shows an example of constellation of signal points existing in the first quadrant in the I-Q plane.
Figure 34:
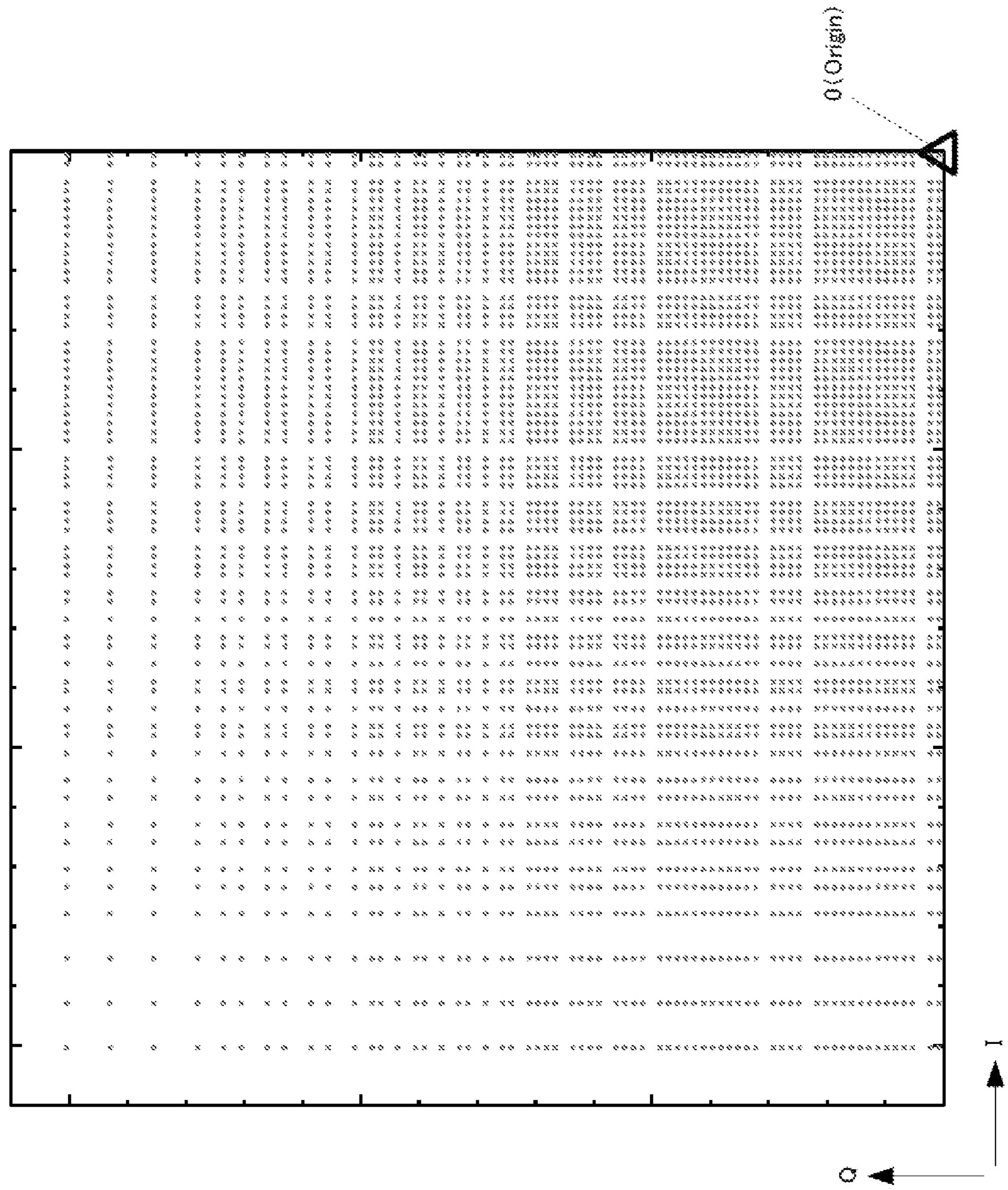
FIG. 34 shows an example of constellation of signal points existing in the second quadrant in the I-Q plane.
Figure 35:
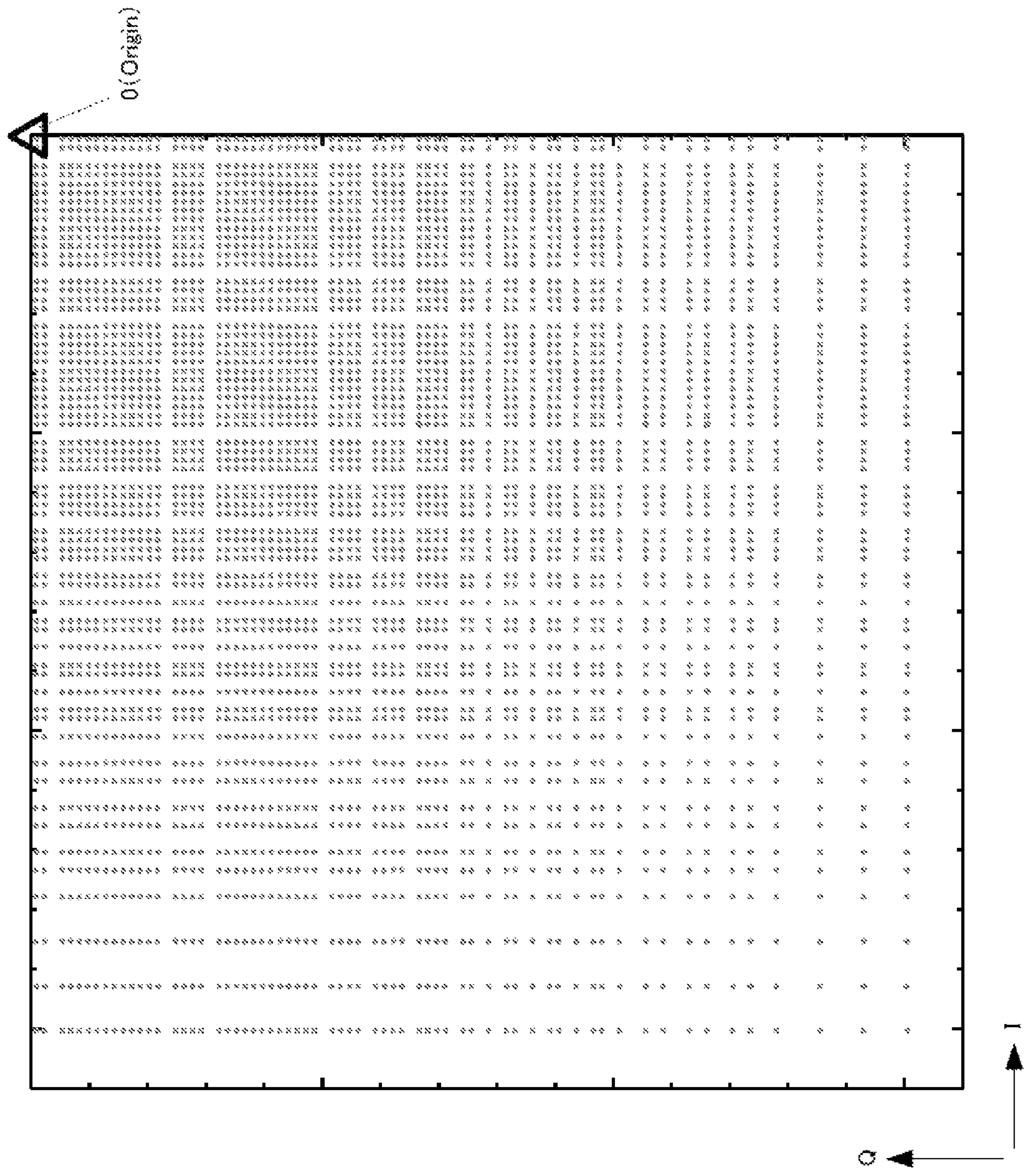
FIG. 35 shows an example of constellation of signal points existing in the third quadrant in the I-Q plane.
Figure 36:
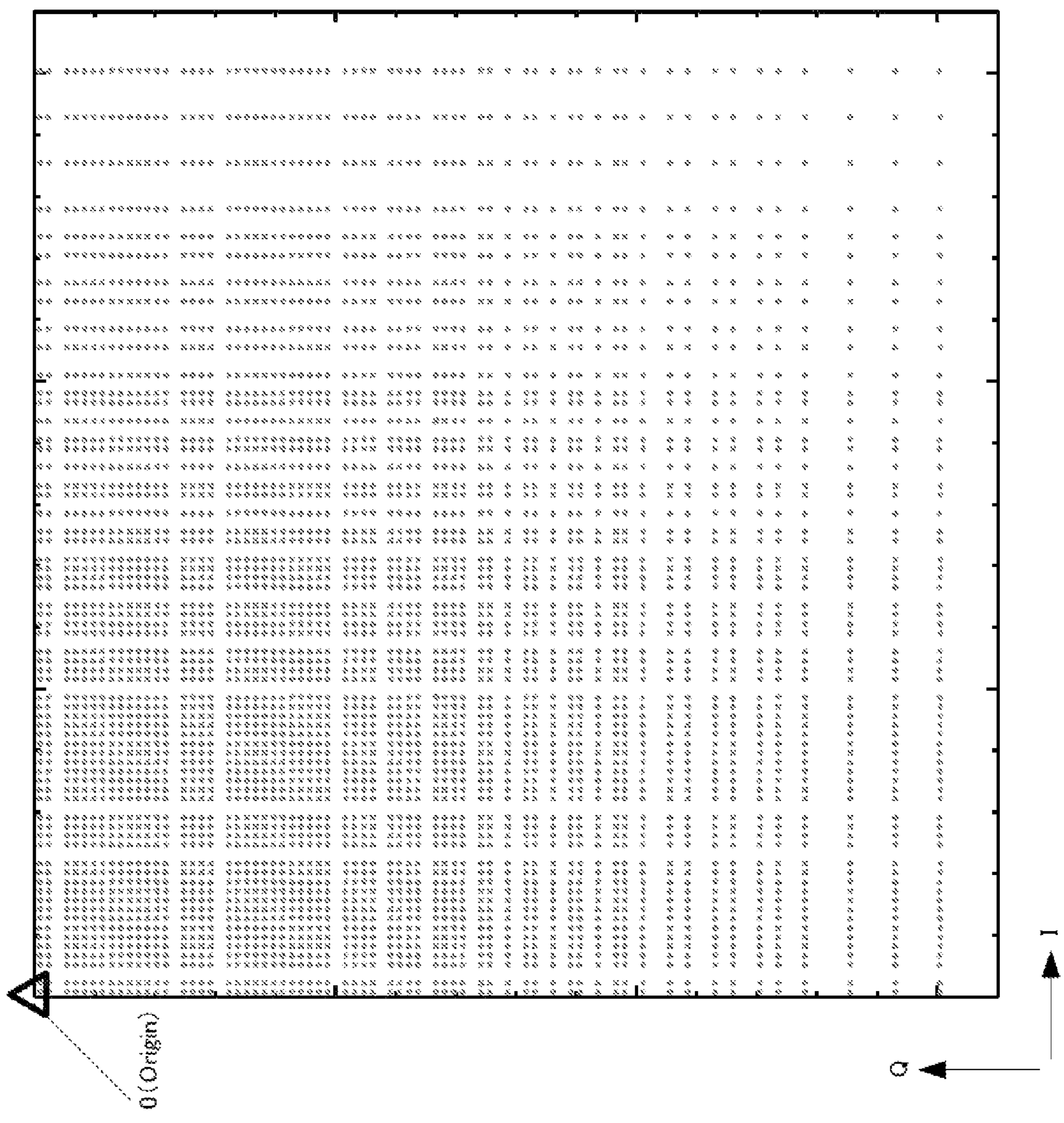
FIG. 36 shows an example of constellation of signal points existing in the fourth quadrant in the I-Q plane.
Figure 37:
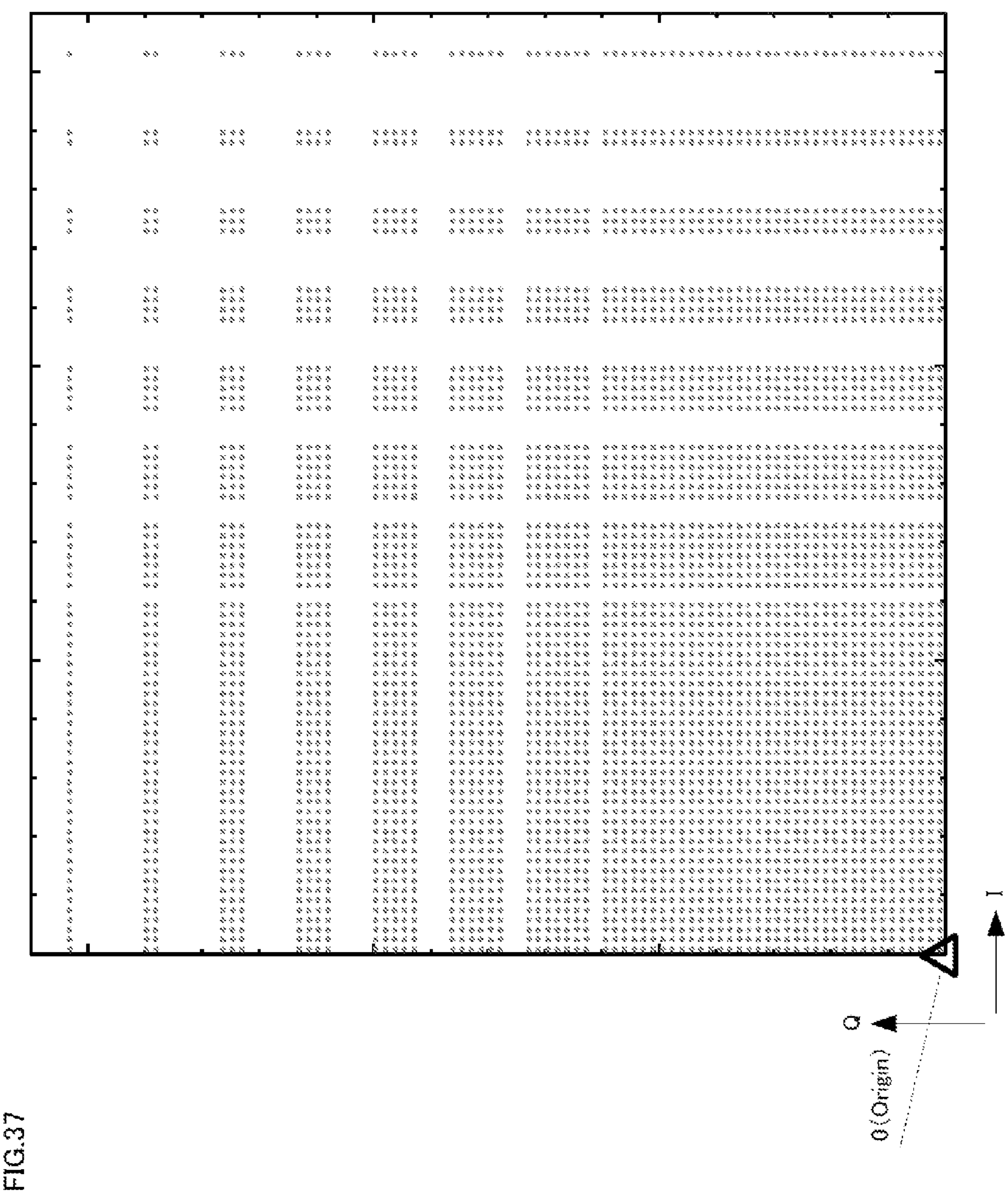
FIG. 37 shows an example of constellation of signal points existing in the first quadrant in the I-Q plane.
Figure 38:
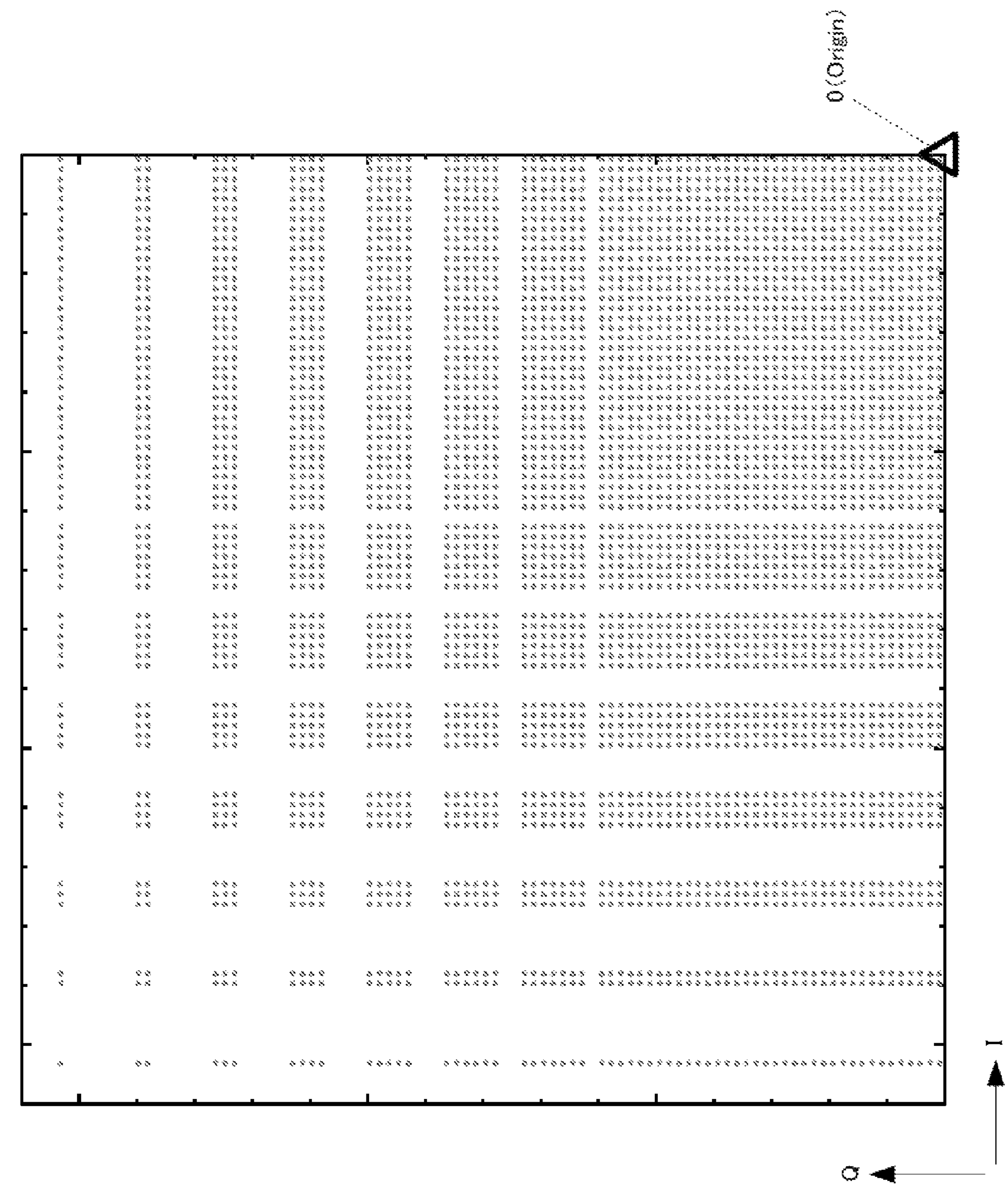
FIG. 38 shows an example of constellation of signal points existing in the second quadrant in the I-Q plane.
Figure 39:
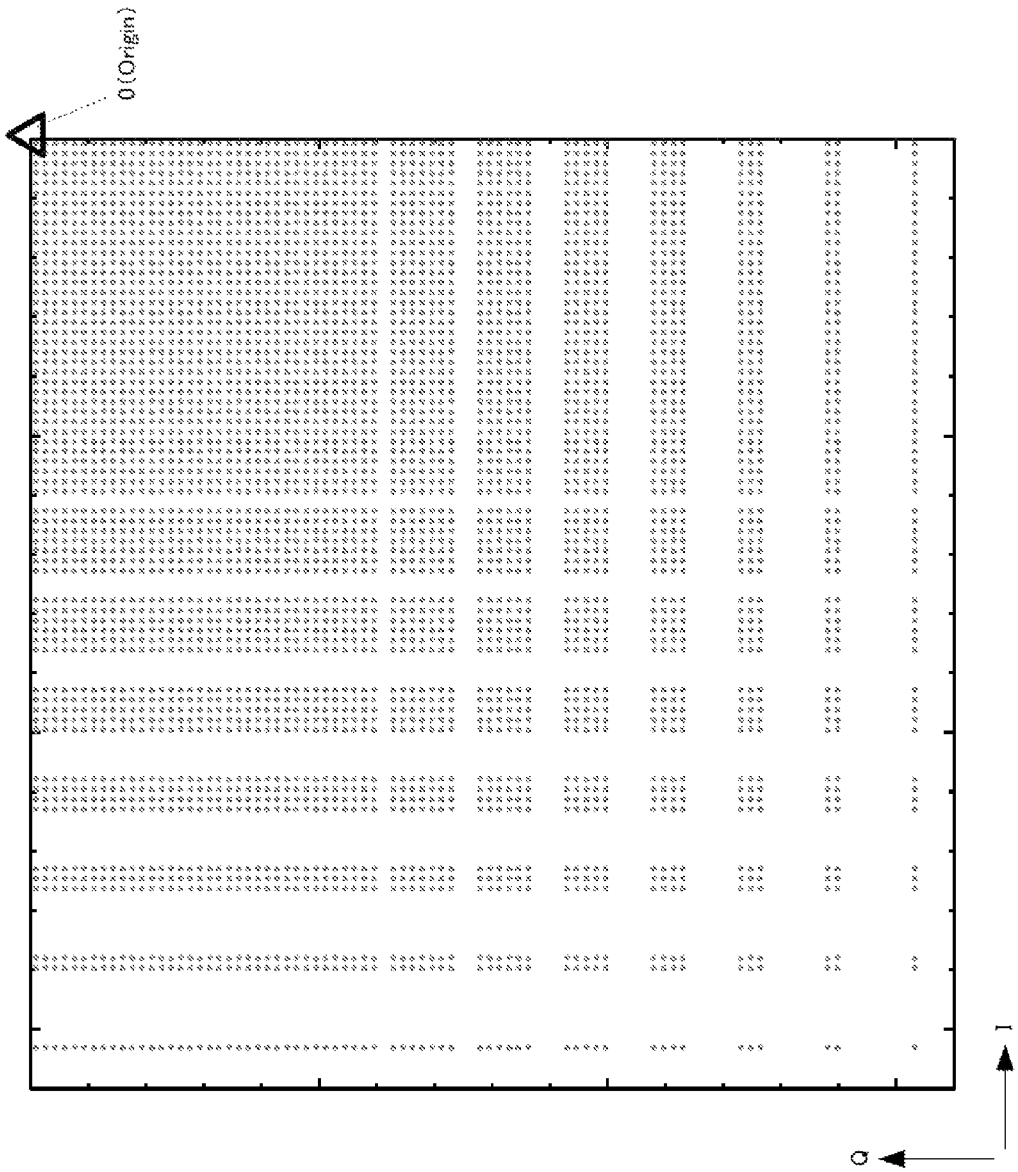
FIG. 39 shows an example of constellation of signal points existing in the third quadrant in the I-Q plane.
Figure 40:
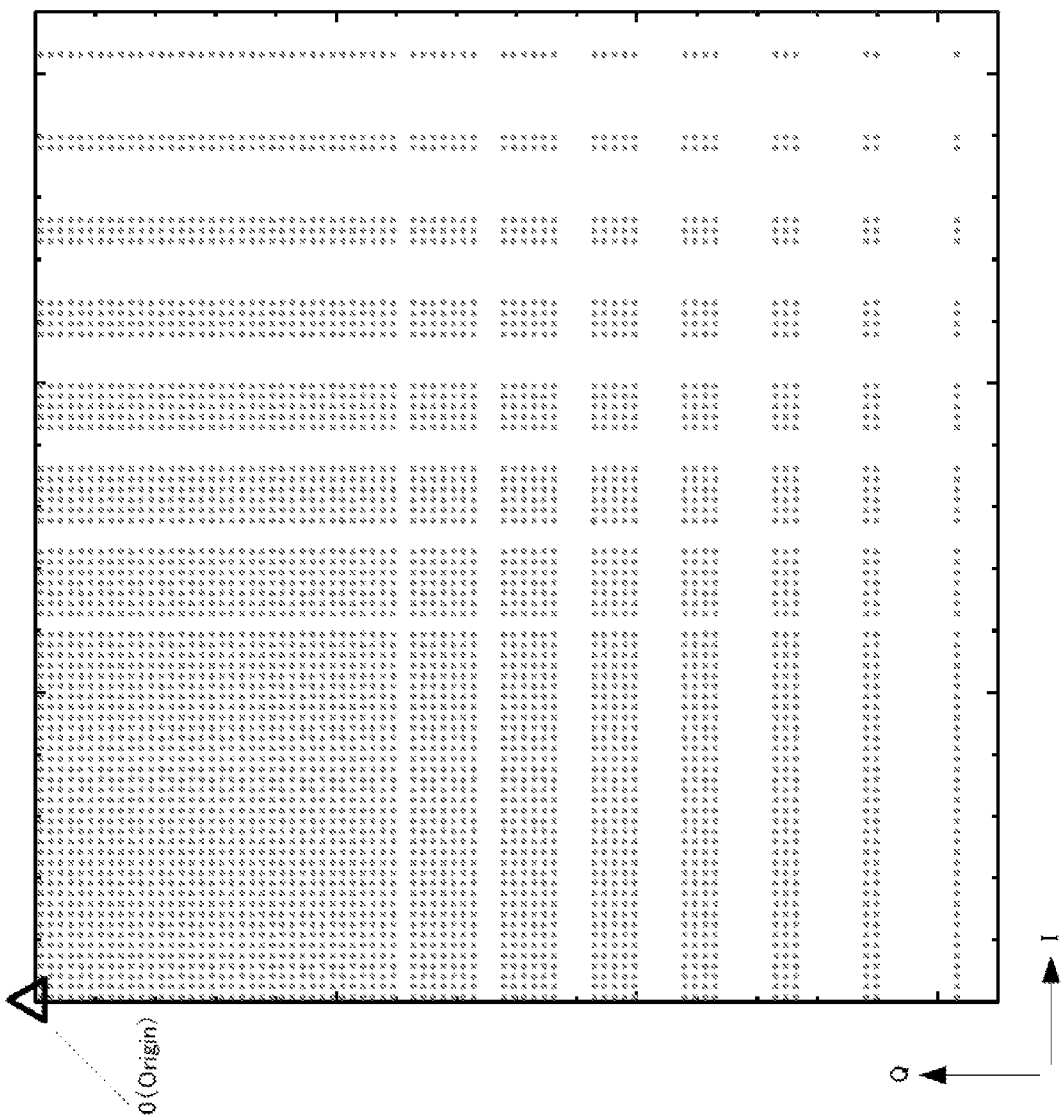
FIG. 40 shows an example of constellation of signal points existing in the fourth quadrant in the I-Q plane.
Figure 41:
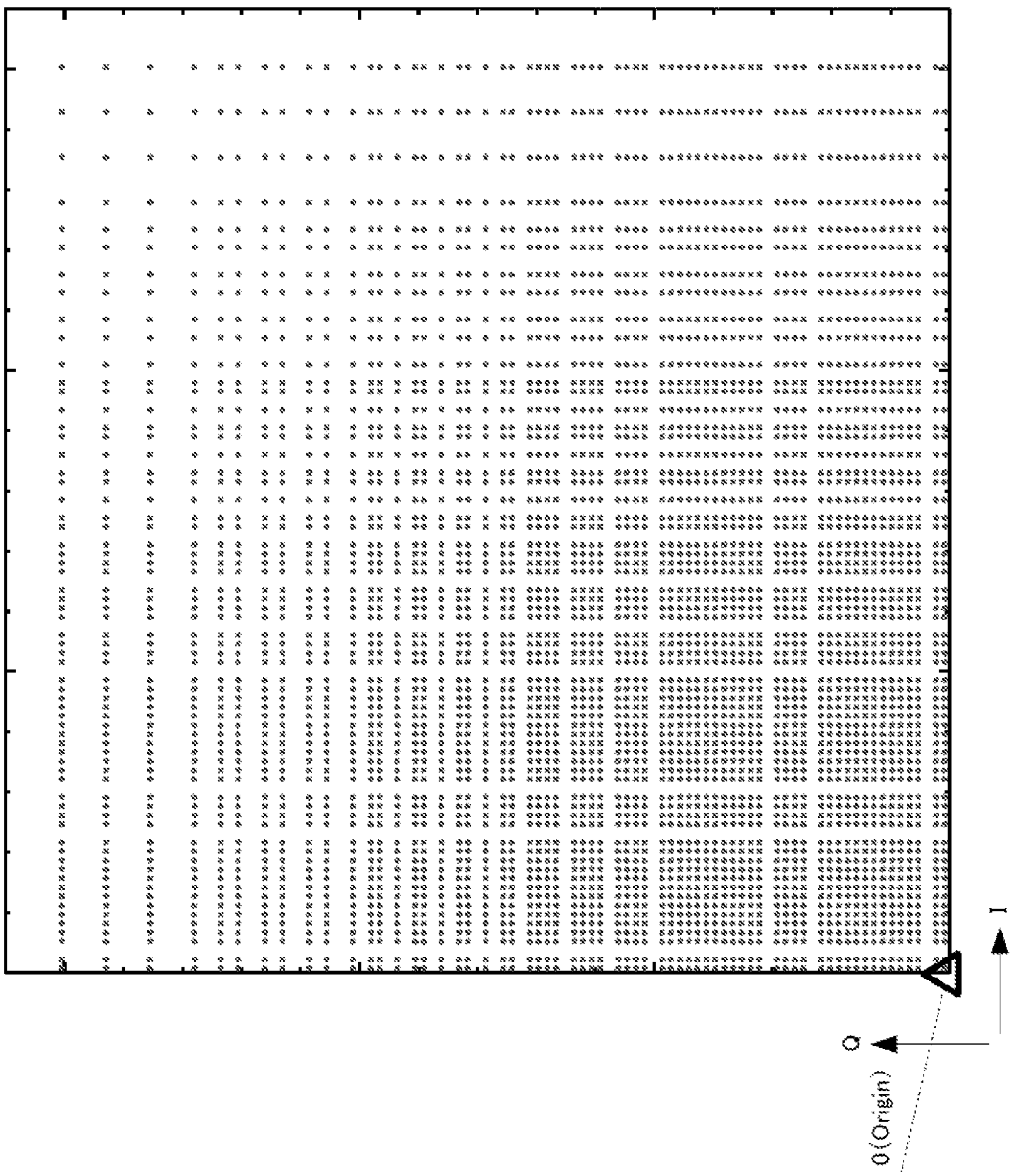
FIG. 41 shows an example of constellation of signal points existing in the first quadrant in the I-Q plane.
Figure 42:
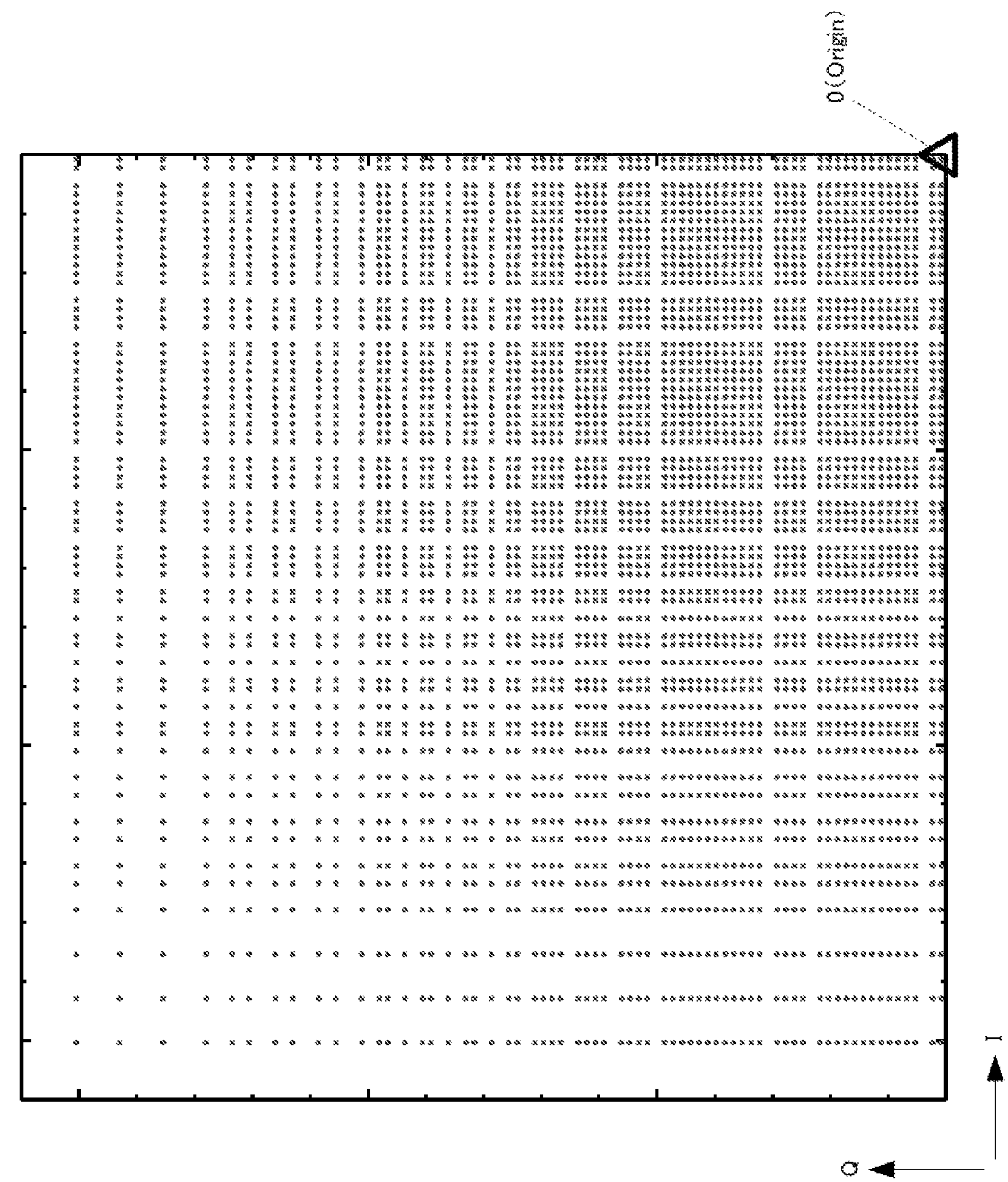
FIG. 42 shows an example of constellation of signal points existing in the second quadrant in the I-Q plane.
Figure 43:
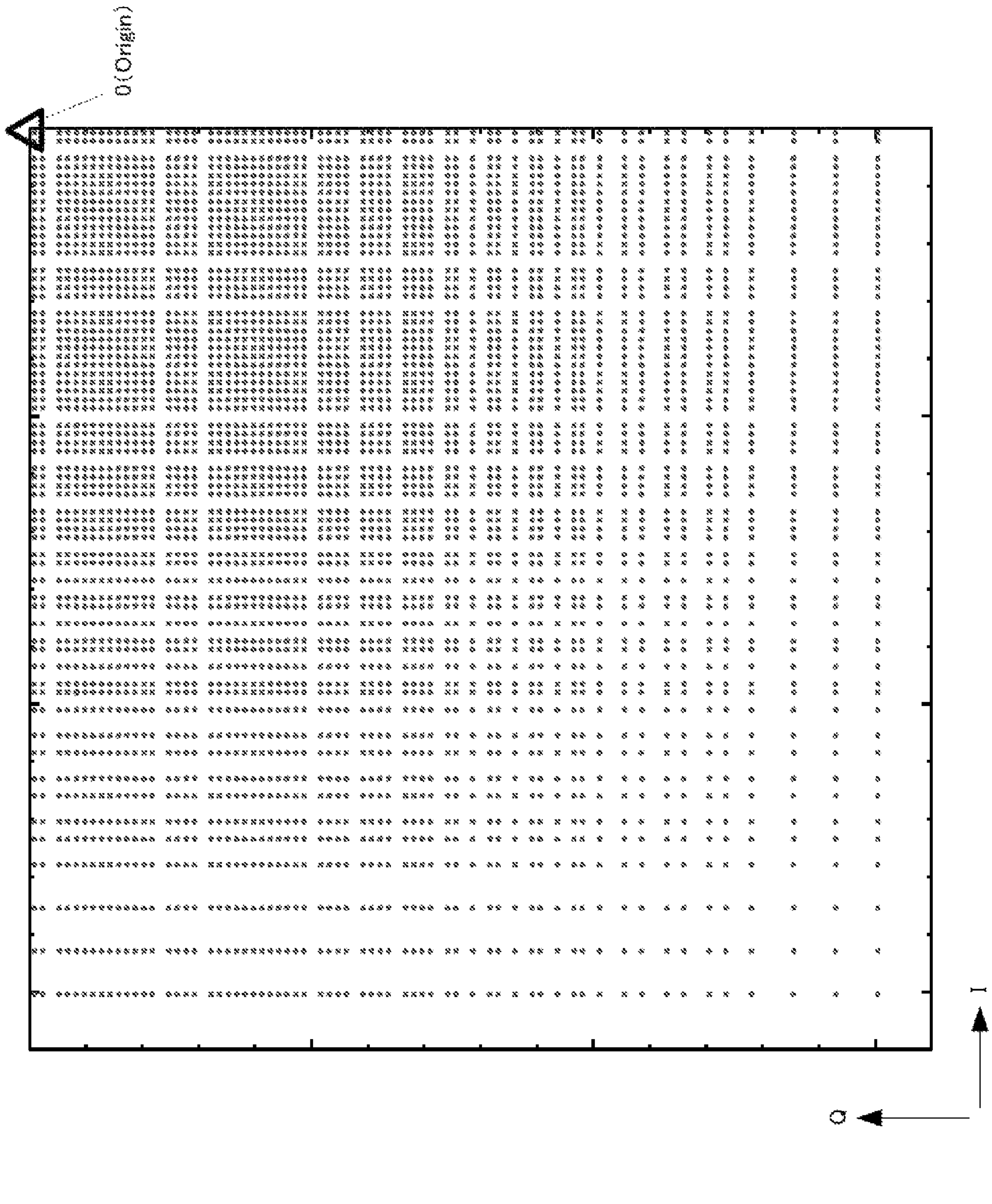
FIG. 43 shows an example of constellation of signal points existing in the third quadrant in the I-Q plane.
Figure 44:
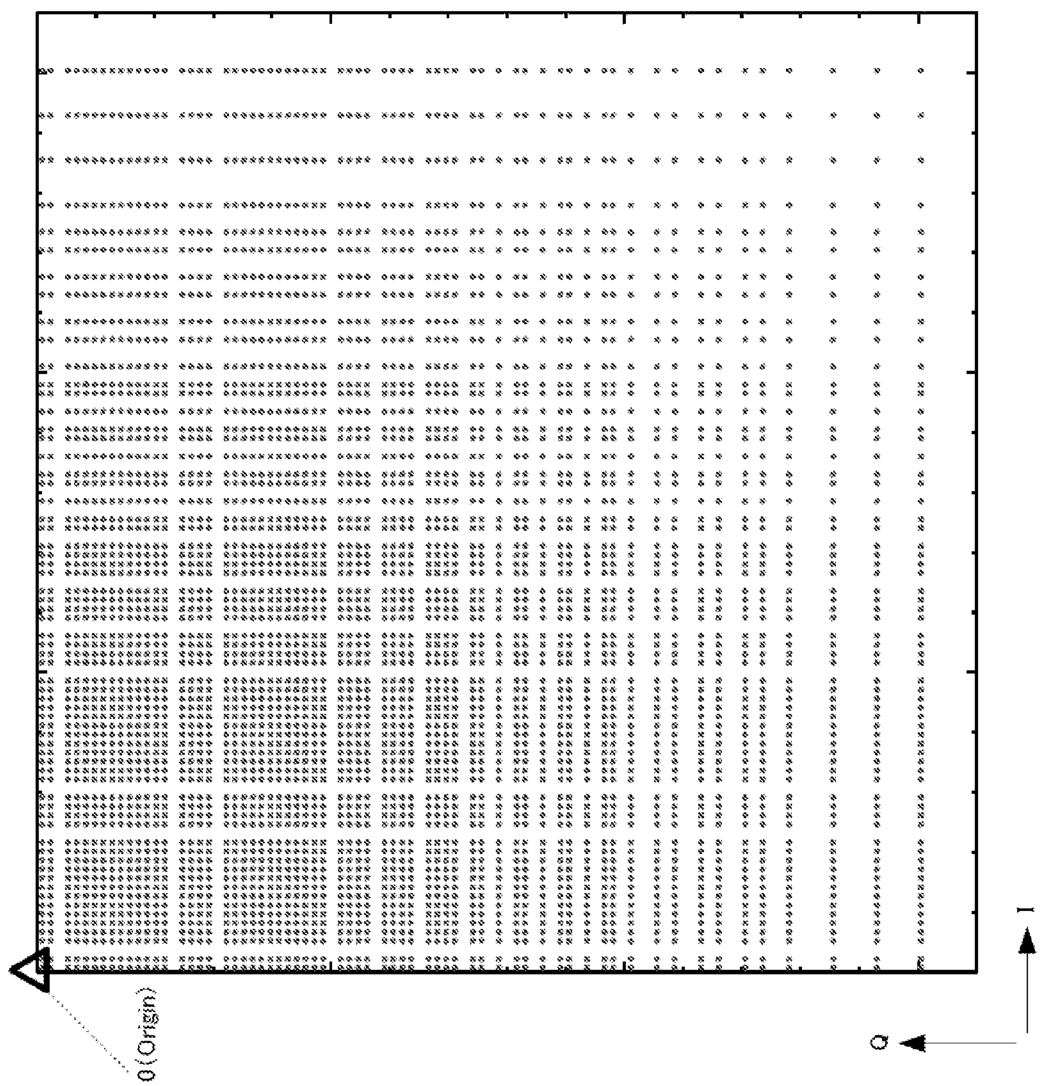
FIG. 44 shows an example of constellation of signal points existing in the fourth quadrant in the I-Q plane.
Figure 45:
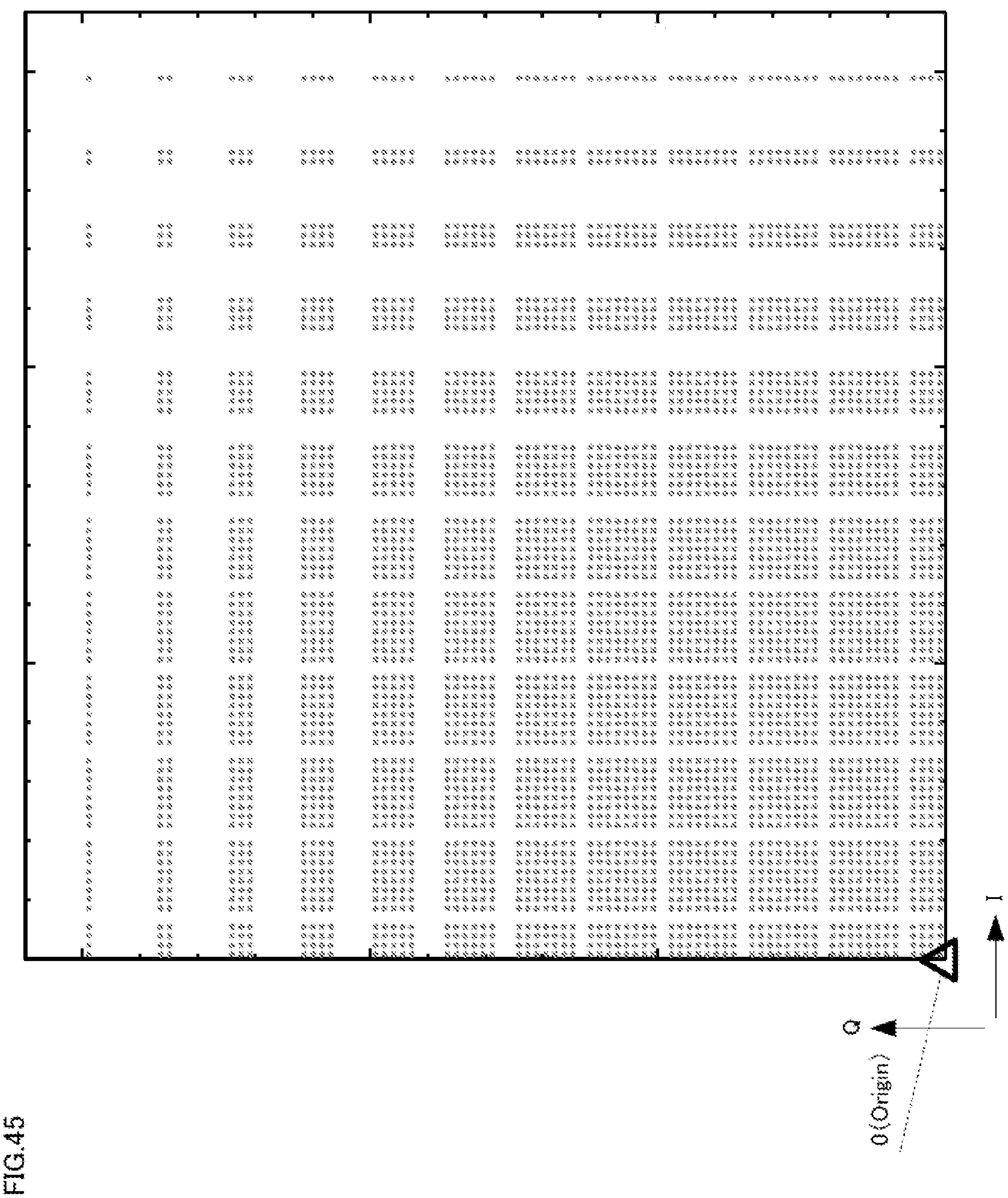
FIG. 45 shows an example of constellation of signal points existing in the first quadrant in the I-Q plane.
Figure 46:
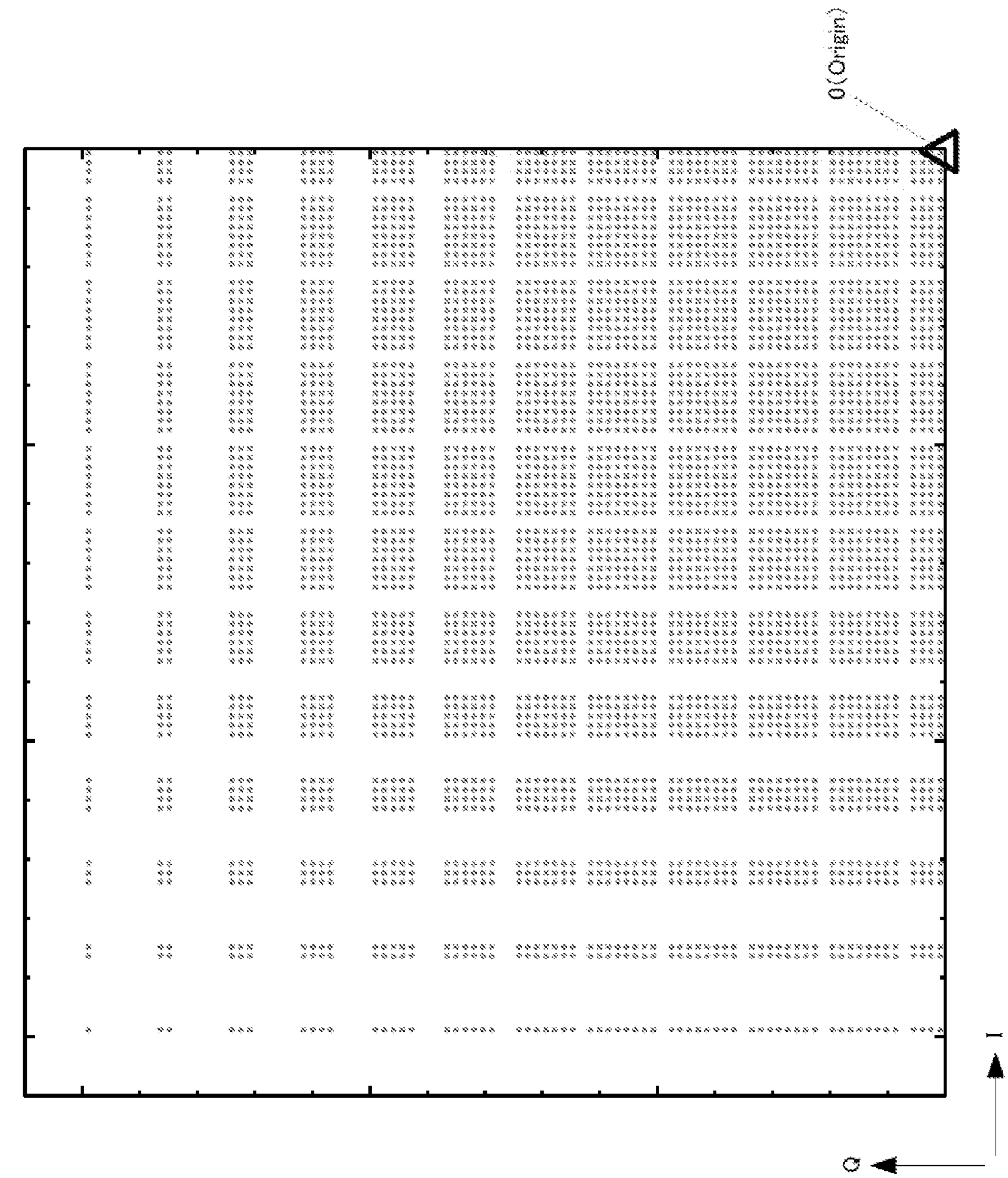
FIG. 46 shows an example of constellation of signal points existing in the second quadrant in the I-Q plane.
Figure 47:
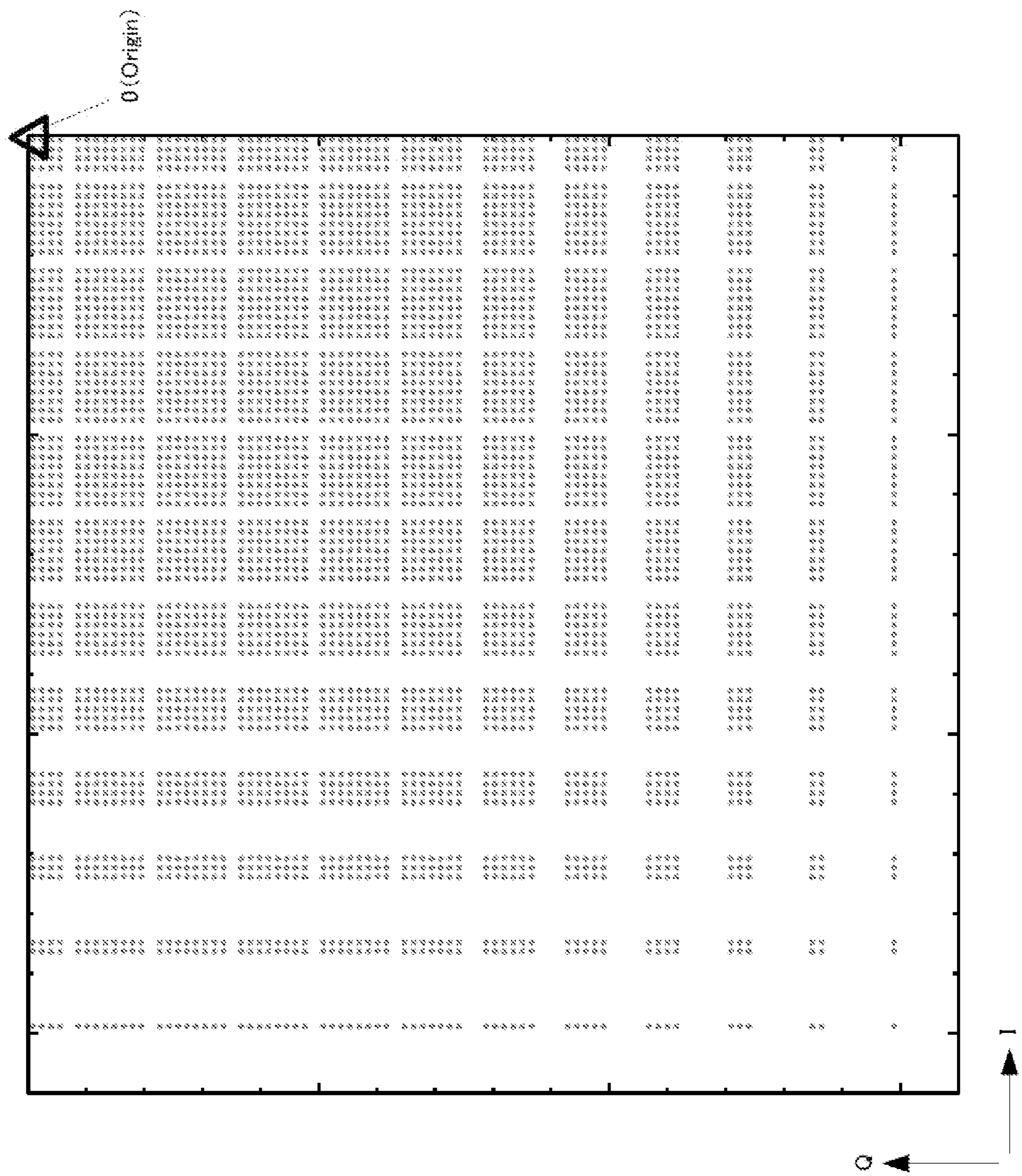
FIG. 47 shows an example of constellation of signal points existing in the third quadrant in the I-Q plane.
Figure 48:
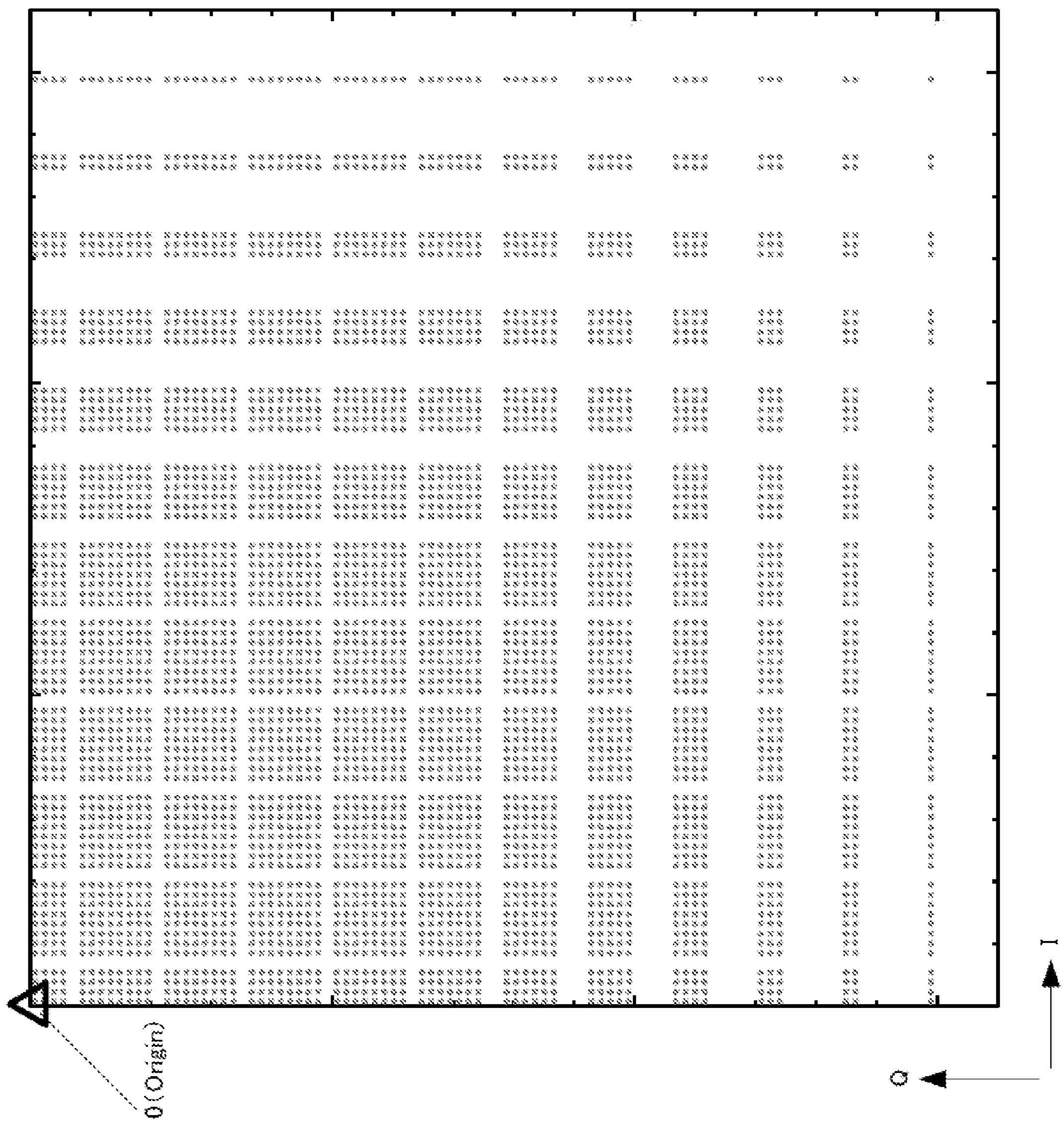
FIG. 48 shows an example of constellation of signal points existing in the fourth quadrant in the I-Q plane.
Figure 49:
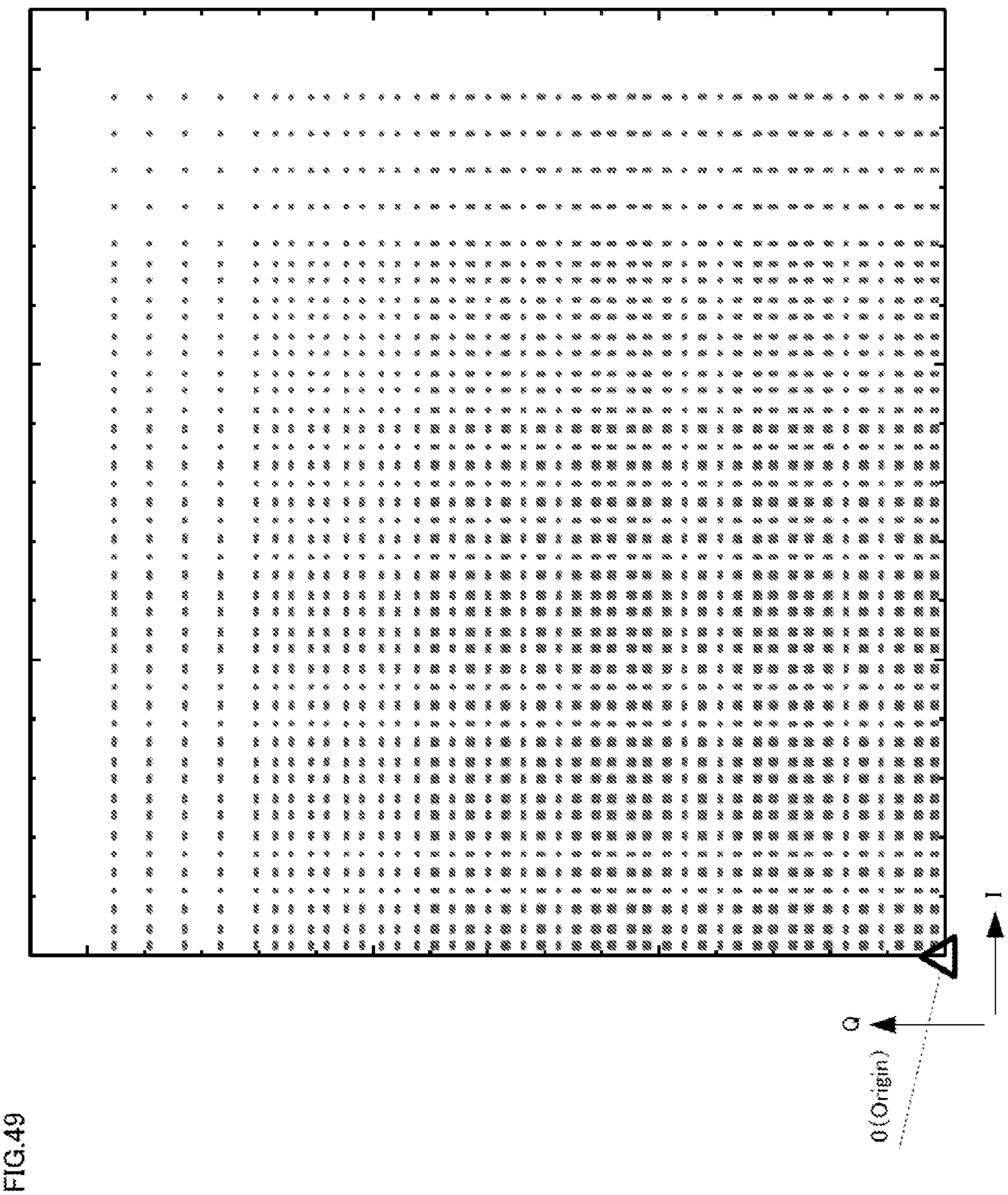
FIG. 49 shows an example of constellation of signal points existing in the first quadrant in the I-Q plane.
Figure 50:
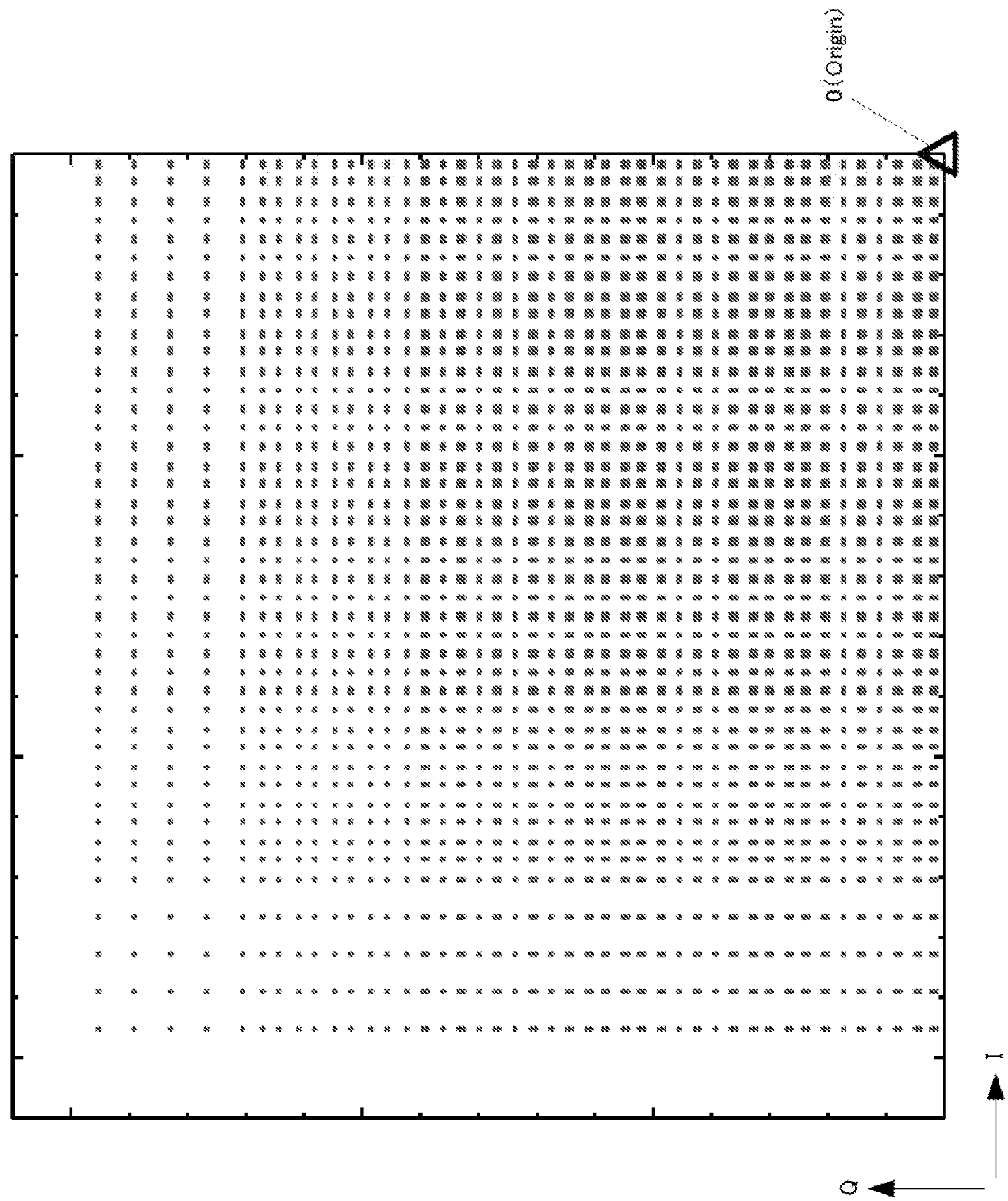
FIG. 50 shows an example of constellation of signal points existing in the second quadrant in the I-Q plane.
Figure 51:
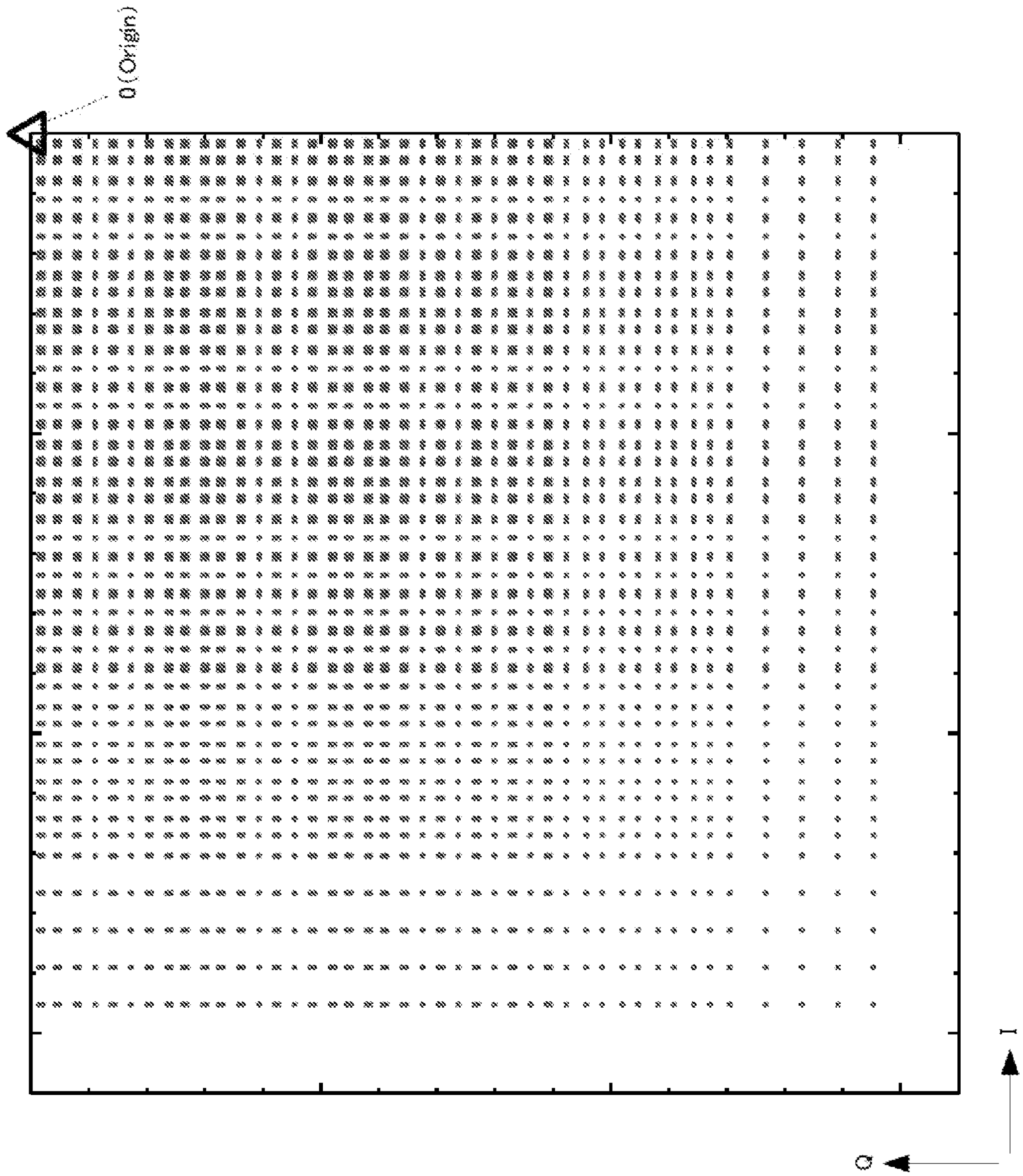
FIG. 51 shows an example of constellation of signal points existing in the third quadrant in the I-Q plane.
Figure 52:
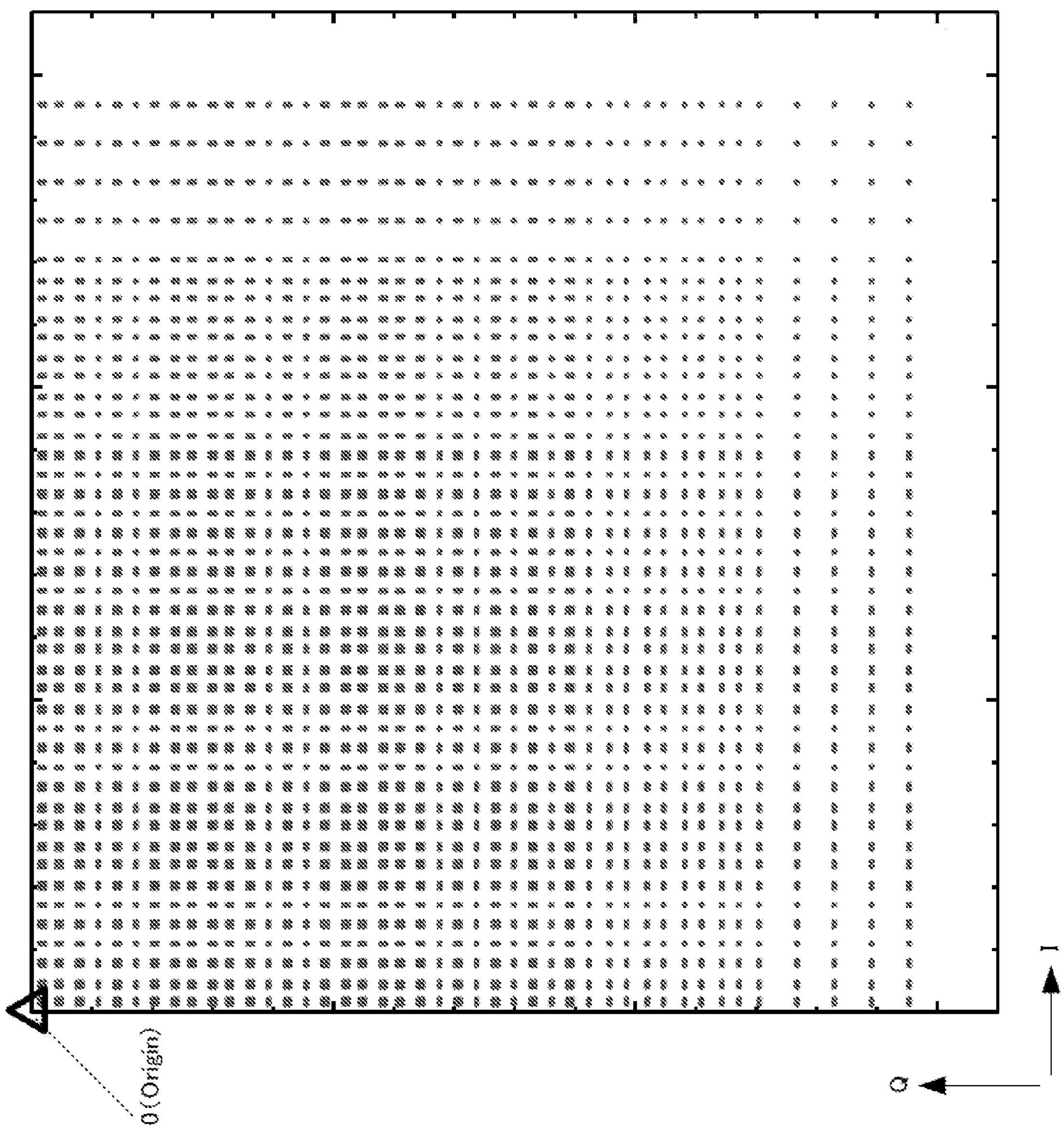
FIG. 52 shows an example of constellation of signal points existing in the fourth quadrant in the I-Q plane.

A mapping scheme for 256QAM is described below. FIG. 20 shows an example of signal point constellation for 256QAM in the I (in-phase)-Q (quadrature(-phase)) plane. In FIG. 20, 256 circles represent signal points for 256QAM.

Coordinates of the 256 signal points (i.e., the circles in FIG. 20) for 256QAM in the I (in-phase)-Q (quadrature (-phase)) plane are $(15w_{256},15w_{256})$, $(15w_{256},13w_{256})$, $(15w_{256},11w_{256})$, $(15w_{256},9w_{256})$, $(15w_{256},7w_{256})$, $(15w_{256},5w_{256})$, $(15w_{256},3w_{256})$, $(15w_{256},w_{256})$, $(15w_{256},-15w_{256})$, $(15w_{256},-13w_{256})$, $(15w_{256},-11w_{256})$, $(15w_{256},-9w_{256})$, $(15w_{256},-7w_{256})$, $(15w_{256},-5w_{256})$, $(15w_{256},-3w_{256})$, $(15w_{256},-w_{256})$,
$(13w_{256},15w_{256})$, $(13w_{256},13w_{256})$, $(13w_{256}11w_{256})$, $(13w_{256}-,9w_{256})$ $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$,
$(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$ $(11w_{256},-7w_{256})$, $(11w_{256}-5w_{256})$, $(11w_{256}-3w_{256})$, $(11w_{256},-w_{256})$,
$(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$, $(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$,
$(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$, $(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256}-w_{256})$,
$(5w_{256},15w_{255})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$, $(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256},-5w_{256})$, $(5w_{256},-3w_{256})$, $(5w_{256},-w_{256})$,
$(3w_{256}15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$, $(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256}-5w_{256})$, $(3w_{256},-3w_{256})$, $(3w_{256},-w_{256})$,
$(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$, $(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$,
$(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$, $(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$,
$(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$,
$(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$,
$(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},w_{256})$,
$(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$,
$(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-7w_{256},-w_{256})$,
$(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},$ $-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$, $(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-13w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, and $(-w_{256},-w_{256})$, where $w_{256}$ is a real number greater than 0.

Here, transmitted bits (input bits) are represented by b0, b1, b2, b3, b4, b5, b6, and b7. For example, when (b0, b1, b2, b3, b4, b5, b6, b7)=(0, 0, 0, 0, 0, 0, 0, 0) for the transmitted bits, mapping is performed to a signal point 2001 in FIG. 20. When an in-phase component and a quadrature component of the baseband signal obtained as a result of mapping are respectively represented by I and Q, (I, Q)=$(15w_{256}, 15w_{256})$ is satisfied.

That is to say, the in-phase component I and the quadrature component Q of the baseband signal obtained as a result of mapping (at the time of using 256QAM) are determined based on the transmitted bits (b0, b1, b2, b3, b4, b5, b6, b7). One example of a relationship between values (00000000-11111111) of a set of b0, b1, b2, b3, b4, b5, b6, and b7 and coordinates of signal points is as shown in FIG. 20. The values 00000000-11111111 of the set of b0, b1, b2, b3, b4, b5, b6, and b7 are shown directly below the 256 signal points (i.e., the circles in FIG. 20) for 256QAM, which are $(15w_{256},15w_{256})$, $(15w_{256},13w_{256})$, $(15w_{256},11w_{256})$, $(15w_{256},9w_{256})$, $(15w_{256},7w_{256})$, $(15w_{256},5w_{256})$, $(15w_{256},3w_{256})$, $(15w_{256},w_{256})$, $(15w_{256},-15w_{256})$, $(15w_{256},-13w_{256})$, $(15w_{256},-11w_{256})$, $(15w_{256},-9w_{256})$, $(15w_{256},-7w_{256})$, $(15w_{256},-5w_{256})$, $(15w_{256},-3w_{256})$, $(15w_{256},-w_{256})$, $(13w_{256},15w_{256})$, $(13w_{256},13w_{256})$, $(13w_{256}11w_{256})$, $(13w_{256}-,9w_{256})$ $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$, $(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$ $(11w_{256},-7w_{256})$, $(11w_{256}-5w_{256})$, $(11w_{256}-3w_{256})$, $(11w_{256},-w_{256})$, $(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256})$, $(9w_{256},-15w_{256})$, $(9w_{256},-13w_{256})$, $(9w_{256},-11w_{256})$, $(9w_{256},-9w_{256})$, $(9w_{256},-7w_{256})$, $(9w_{256},-5w_{256})$, $(9w_{256},-3w_{256})$, $(9w_{256},-w_{256})$, $(7w_{256},15w_{256})$, $(7w_{256},13w_{256})$, $(7w_{256},11w_{256})$, $(7w_{256},9w_{256})$, $(7w_{256},7w_{256})$, $(7w_{256},5w_{256})$, $(7w_{256},3w_{256})$, $(7w_{256},w_{256})$, $(7w_{256},-15w_{256})$, $(7w_{256},-13w_{256})$, $(7w_{256},-11w_{256})$, $(7w_{256},-9w_{256})$, $(7w_{256},-7w_{256})$, $(7w_{256},-5w_{256})$, $(7w_{256},-3w_{256})$, $(7w_{256}-w_{256})$, $(5w_{256},15w_{255})$, $(5w_{256},13w_{256})$, $(5w_{256},11w_{256})$, $(5w_{256},9w_{256})$, $(5w_{256},7w_{256})$, $(5w_{256},5w_{256})$, $(5w_{256},3w_{256})$, $(5w_{256},w_{256})$, $(5w_{256},-15w_{256})$, $(5w_{256},-13w_{256})$, $(5w_{256},-11w_{256})$, $(5w_{256},-9w_{256})$, $(5w_{256},-7w_{256})$, $(5w_{256},-5w_{256})$, $(5w_{256},-3w_{256})$, $(5w_{256},-w_{256})$, $(3w_{256}15w_{256})$, $(3w_{256},13w_{256})$, $(3w_{256},11w_{256})$, $(3w_{256},9w_{256})$, $(3w_{256},7w_{256})$, $(3w_{256},5w_{256})$, $(3w_{256},3w_{256})$, $(3w_{256},w_{256})$, $(3w_{256},-15w_{256})$, $(3w_{256},-13w_{256})$, $(3w_{256},-11w_{256})$, $(3w_{256},-9w_{256})$, $(3w_{256},-7w_{256})$, $(3w_{256}-5w_{256})$, $(3w_{256},-3w_{256})$, $(3w_{256},-w_{256})$, $(w_{256},15w_{256})$, $(w_{256},13w_{256})$, $(w_{256},11w_{256})$, $(w_{256},9w_{256})$, $(w_{256},7w_{256})$, $(w_{256},5w_{256})$, $(w_{256},3w_{256})$, $(w_{256},w_{256})$, $(w_{256},-15w_{256})$, $(w_{256},-13w_{256})$, $(w_{256},-11w_{256})$, $(w_{256},-9w_{256})$, $(w_{256},-7w_{256})$, $(w_{256},-5w_{256})$, $(w_{256},-3w_{256})$, $(w_{256},-w_{256})$, $(-15w_{256},15w_{256})$, $(-15w_{256},13w_{256})$, $(-15w_{256},11w_{256})$, $(-15w_{256},9w_{256})$, $(-15w_{256},7w_{256})$, $(-15w_{256},5w_{256})$, $(-15w_{256},3w_{256})$, $(-15w_{256},w_{256})$, $(-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$, $(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$, $(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$, $(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256},w_{256})$, $(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$, $(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-7w_{256},-w_{256})$, $(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$, $(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-13w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, and $(-w_{256},-w_{256})$, $(-w_{25},-w_{256})$. Coordinates, in the I (in-phase)-Q (quadrature(-phase)) plane, of the signal points (i.e., the circles) directly above the values 00000000-11111111 of the set of b0, b1, b2, b3, b4, b5, b6, and b7 indicate the in-phase component I and the quadrature component Q of the baseband signal obtained as a result of mapping. The relationship between the values (00000000-11111111) of the set of b0, b1, b2, b3, b4, b5, b6, and b7 for 256QAM and coordinates of signal points is not limited to that shown in FIG. 20. Values obtained by expressing the in-phase component I and the quadrature component Q of the baseband signal obtained as a result of mapping (at the time of using 256QAM) in complex numbers correspond to the baseband signal ($s_1(t)$ or $s_2(t)$) in FIGS. 5-7.

This example shows the structure of the precoding matrix when 64QAM and 256QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, in FIGS. 5-7.

In this case, the baseband signal 505A ($s_1(t)$ ($s_1(i)$)) and the baseband signal 505B ($s_2(t)$ ($s_2(i)$)), which are outputs of the mapper 504 shown in FIGS. 5-7, are typically set to have an equal average power. Thus, the following formulas are satisfied for the coefficients $w_{64}$ and $w_{256}$ described in the above-mentioned explanations on the mapping schemes for 64QAM and 256QAM, respectively.

[Math. 192]

$$w_{64} = \frac{z}{\sqrt{42}} \quad \text{(formula S153)}$$

[Math. 193]

$$w_{256} = \frac{z}{\sqrt{170}} \quad \text{(formula S154)}$$

In formulas S153 and S154, z is a real number greater than 0. The following describes the precoding matrix F used when calculation in the following cases is performed.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 194]

$$F = \begin{pmatrix} a(i) & b(i) \\ c(i) & d(i) \end{pmatrix} \quad \text{(formula S155)}$$

The structure of the above-mentioned precoding matrix F is described in detail below in Example 3-1 to Example 3-8.

Example 3-1

In any of the above-mentioned cases <1> to <5>, the precoding matrix F is set to the precoding matrix F in any of the following formulas.

[Math. 195]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S156)}$$

or

[Math. 196]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{(formula S157)}$$

or

[Math. 197]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S158)}$$

or

[Math. 198]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{(formula S159)}$$

In formulas S156, S157, S158, and S159, α may be either a real number or an imaginary number, and β may be either a real number or an imaginary number. However, α is not 0 (zero). Similarly, β is not 0 (zero).

In this case, values of α that allow the reception device to obtain high data reception quality are considered.

First, the values of α that allow the reception device to obtain high data reception quality when attention is focused on the signal $z_1(t)$ ($z_1(i)$) in formulas S2, S3, S4, S5, and S8 are as follows.

When α is a real number:

[Math. 199]

$$\alpha = \frac{\sqrt{170}}{\sqrt{42}} \times \frac{9}{8} \quad \text{(formula S160)}$$

or

[Math. 200]

$$\alpha = -\frac{\sqrt{170}}{\sqrt{42}} \times \frac{9}{8} \quad \text{(formula S161)}$$

When α is an imaginary number:

[Math. 201]

$$\alpha = \frac{\sqrt{170}}{\sqrt{42}} \times \frac{9}{8} \times e^{j\frac{\pi}{2}} \quad \text{(formula S162)}$$

or

[Math. 202]

$$\alpha = \frac{\sqrt{170}}{\sqrt{42}} \times \frac{9}{8} \times e^{j\frac{3\pi}{2}} \quad \text{(formula S163)}$$

In the meantime, 64QAM and 256QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively. Therefore, when precoding (as well as phase change and power change) is performed as described above to transmit a modulated signal from each antenna, the total number of bits in symbols transmitted from the antennas 808A and 808B in FIG. 8 at the (unit) time u at the frequency (carrier) v is 14 bits, which is the sum of 6 bits (transmitted by using 64QAM) and 8 bits (transmitted by using 256QAM).

When input bits used to perform mapping for 64QAM are represented by $b_{0,64}$, $b_{1,64}$, $b_{2,64}$, $b_{3,64}$, and $b_{5,64}$ and input bits used to perform mapping for 256QAM are represented by $b_{0,256}$, $b_{1,256}$, $b_{2,256}$, $b_{3,256}$, $b_{4,256}$, $b_{5,256}$, $b_{6,256}$, and $b_{7,256}$, even if α is set to α in any of formulas S160, S161, S162, and S163, concerning the signal $z_1(t)$ ($z_1(i)$), signal points from a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(0, 0, 0, 0, 0, 0, 0, 0, 0, 0, 0, 0, 0, 0) to a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(1, 1, 1, 1, 1, 1, 1, 1, 1, 1, 1, 1, 1, 1) exist in the I (in-phase)-Q (quadrature(-phase)) plane.

Similarly, concerning the signal $z_2(t)$ ($z_2(i)$), signal points from a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(0, 0, 0, 0, 0, 0, 0, 0, 0, 0, 0, 0, 0, 0) to a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(1, 1, 1, 1, 1, 1, 1, 1, 1, 1, 1, 1, 1, 1) exist in the I (in-phase)-Q (quadrature(-phase)) plane.

Formulas S160 to S163 are shown above as "the values of α that allow the reception device to obtain high data reception quality when attention is focused on the signal $z_1(t)$ ($z_1(i)$) in formulas S2, S3, S4, S5, and S8". Description is made on this point.

Concerning the signal $z_1(t)$ ($z_1(i)$), signal points from a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(0, 0, 0, 0, 0, 0, 0, 0, 0, 0, 0, 0, 0, 0) to a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(1, 1, 1, 1, 1, 1, 1, 1, 1, 1, 1, 1, 1, 1) exist in the I (in-phase)-Q (quadrature(-phase)) plane. It is desirable that these $2^{14}$=16384 signal points exist without overlapping one another in the I (in-phase)-Q (quadrature(-phase)) plane.

The reason is as follows. When the modulated signal transmitted from the antenna for transmitting the signal $z_2(t)$ ($z_2(i)$) does not reach the reception device, the reception device performs detection and error correction decoding by using the signal $z_1(t)$ ($z_1(i)$). In this case, it is desirable that "16384 signal points exist without overlapping one another" in order for the reception device to obtain high data reception quality. When the precoding matrix F is set to the precoding matrix F in any of formulas S156, S157, S158, and S159, and α is set to α in any of formulas S160, S161, S162, and S163, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 21, 22, 23, and 24. In FIGS. 21, 22, 23, and 24, the horizontal and vertical axes respectively represent I and Q, black circles represent the signal points, and a triangle represents the origin (0).

As can be seen from FIGS. 21, 22, 23, and 24, 16384 signal points exist without overlapping one another in the I (in-phase)-Q (quadrature(-phase)) plane. Furthermore, as for 16380 signal points, from among 16384 signal points, excluding four signal points located at the top right of the I (in-phase)-Q (quadrature(-phase)) plane in FIG. 21, bottom right of the I (in-phase)-Q (quadrature(-phase)) plane in FIG. 24, top left of the I (in-phase)-Q (quadrature(-phase)) plane in FIG. 22, and bottom left of the I (in-phase)-Q (quadrature (-phase)) plane in FIG. 23, Euclidian distances between any pairs of signal points that are the closest to each other are equal. As a result, the reception device is likely to obtain high reception quality.

When the precoding matrix F is set to the precoding matrix F in any of formulas S156, S157, S158, and S159, and α is set to α in any of formulas S160, S161, S162, and S163, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 25, 26, 27, and 28. In FIGS. 25, 26, 27, and 28, the horizontal and vertical axes respectively represent I and Q, black circles represent the signal points, and a triangle represents the origin (0).

As can be seen from FIGS. 25, 26, 27, and 28, 16384 signal points exist without overlapping one another. As a result, the reception device is likely to obtain high reception quality.

The minimum Euclidian distance between 16384 signal points in FIGS. 21, 22, 23, and 24 is represented by $D_1$, and the minimum Euclidian distance between 16384 signal points in FIGS. 25, 26, 27, and 28 is represented by $D_2$. In this case. $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 3-2

The following describes a case where formulas S153 and S154 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 203]

$$F=\begin{pmatrix}\beta\times\cos\theta & \beta\times\sin\theta\\ \beta\times\sin\theta & -\beta\times\cos\theta\end{pmatrix} \quad \text{(formula S164)}$$

or

[Math. 204]

$$F=\begin{pmatrix}\cos\theta & \sin\theta\\ \sin\theta & -\cos\theta\end{pmatrix} \quad \text{(formula S165)}$$

or

[Math. 205]

$$F=\begin{pmatrix}\beta\times\cos\theta & -\beta\times\sin\theta\\ \beta\times\sin\theta & \beta\times\cos\theta\end{pmatrix} \quad \text{(formula S166)}$$

or

[Math. 206]

$$F=\begin{pmatrix}\cos\theta & -\sin\theta\\ \sin\theta & \cos\theta\end{pmatrix} \quad \text{(formula S167)}$$

In formulas S164 and S166, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_1(t)$ ($z_1(i)$) in formulas S2, S3, S4, S5, and S8 are as follows.

[Math. 207]

$$\theta=\tan^{-1}\left(\frac{\sqrt{170}}{\sqrt{42}}\times\frac{9}{8}\right) \text{ or } \tan^{-1}\left(\frac{\sqrt{170}}{\sqrt{42}}\times\frac{9}{8}\right)+2n\pi \text{ (radian)} \quad \text{(formula S168)}$$

or

-continued

[Math. 208]

$$\theta = \pi + \tan^{-1}\left(\frac{\sqrt{170}}{\sqrt{42}} \times \frac{9}{8}\right) \text{ or } \pi + \tan^{-1}\left(\frac{\sqrt{170}}{\sqrt{42}} \times \frac{9}{8}\right) + 2n\pi \text{ (radian)} \quad \text{(formula S169)}$$

or

[Math. 209]

$$\theta = \tan^{-1}\left(-\frac{\sqrt{170}}{\sqrt{42}} \times \frac{9}{8}\right) \text{ or } \tan^{-1}\left(-\frac{\sqrt{170}}{\sqrt{42}} \times \frac{9}{8}\right) + 2n\pi \text{ (radian)} \quad \text{(formula S170)}$$

or

[Math. 210]

$$\theta = \pi + \tan^{-1}\left(-\frac{\sqrt{170}}{\sqrt{42}} \times \frac{9}{8}\right) \text{ or } \pi + \tan^{-1}\left(-\frac{\sqrt{170}}{\sqrt{42}} \times \frac{9}{8}\right) + 2n\pi \text{ (radian)} \quad \text{(formula S171)}$$

In formulas S168, S169, S170, and S171, $\tan^{-1}(x)$ is an inverse trigonometric function (an inverse function of the trigonometric function with appropriately restricted domains), and satisfies the following formula.

[Math. 211]

$$-\frac{\pi}{2} \text{ (radian)} < \tan^{-1}(x) < \frac{\pi}{2} \text{ (radian)} \quad \text{(formula S172)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S164, S165, S166, and S167, and θ is set to θ in any of formulas S168, S169, S170, and S171, concerning the signal $u_1(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 21, 22, 23, and 24 similarly to the above. In FIGS. 21, 22, 23, and 24, the horizontal and vertical axes respectively represent I and Q, black circles represent the signal points, and a triangle represents the origin (0).

As can be seen from FIGS. 21, 22, 23, and 24, 16384 signal points exist without overlapping one another in the I (in-phase)-Q (quadrature(-phase)) plane. Furthermore, as for 16380 signal points, from among 16384 signal points, excluding four signal points located at the top right of the I (in-phase)-Q (quadrature(-phase)) plane in FIG. 21, bottom right of the I (in-phase)-Q (quadrature(-phase)) plane in FIG. 24, top left of the I (in-phase)-Q (quadrature(-phase)) plane in FIG. 22, and bottom left of the I (in-phase)-Q (quadrature (-phase)) plane in FIG. 23, Euclidian distances between any pairs of signal points that are the closest to each other are equal. As a result, the reception device is likely to obtain high reception quality.

When the precoding matrix F is set to the precoding matrix F in any of formulas S164, S165, S166, and S167, and θ is set to θ in any of formulas S168, S169, S170, and S171, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 25, 26, 27, and 28 as described above. In FIGS. 25, 26, 27, and 28, the horizontal and vertical axes respectively represent I and Q, black circles represent the signal points, and a triangle represents the origin (0).

As can be seen from FIGS. 25, 26, 27, and 28, 16384 signal points exist without overlapping one another. As a result, the reception device is likely to obtain high reception quality.

The minimum Euclidian distance between 16384 signal points in FIGS. 21, 22, 23, and 24 is represented by $D_1$, and the minimum Euclidian distance between 16384 signal points in FIGS. 25, 26, 27, and 28 is represented by $D_2$. In this case, $D_1 > D_2$ is satisfied. Accordingly, as described in Configuration Example R1, it is desirable that $Q_1 > Q_2$ be satisfied when $Q_1 \neq Q_2$ is satisfied in formulas S2, S3, S4, S5, and S8.

Example 3-3

The following describes a case where formulas S153 and S154 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2 = P_2^2$ is satisfied in formula S2

<2> Case where $P_1^2 = P_2^2$ is satisfied in formula S3

<3> Case where $P_1^2 = P_2^2$ is satisfied in formula S4

<4> Case in formula S5

<5> Case in formula S8

[Math. 212]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S173)}$$

or

[Math. 213]

$$F = \frac{1}{\sqrt{\alpha^2 + 1}} \begin{pmatrix} e^{j0} & \alpha \times e^{j0} \\ \alpha \times e^{j0} & e^{j\pi} \end{pmatrix} \quad \text{(formula S174)}$$

or

[Math. 214]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S175)}$$

or

[Math. 215]

$$F = \frac{1}{\sqrt{\alpha^2 + 1}} \begin{pmatrix} e^{j0} & \alpha \times e^{j\pi} \\ \alpha \times e^{j0} & e^{j0} \end{pmatrix} \quad \text{(formula S176)}$$

In formulas S173, S174, S175, and S176, $\alpha$ may be either a real number or an imaginary number, and $\beta$ may be either a real number or an imaginary number. However, $\alpha$ is not 0 (zero). Similarly, $\beta$ is not 0 (zero).

In this case, values of $\alpha$ that allow the reception device to obtain high data reception quality are considered.

The values of $\alpha$ that allow the reception device to obtain high data reception quality when attention is focused on the signal $z_1(t)$ ($z_1(i)$) in formulas S2, S3, S4, S5, and S8 are as follows.

When $\alpha$ is a real number:

[Math. 216]

$$\alpha = \frac{\sqrt{170}}{\sqrt{42}} \times \frac{8}{9} \quad \text{(formula S177)}$$

or

[Math. 217]

$$\alpha = -\frac{\sqrt{170}}{\sqrt{42}} \times \frac{8}{9} \quad \text{(formula S178)}$$

When $\alpha$ is an imaginary number:

[Math. 218]

$$\alpha = \frac{\sqrt{170}}{\sqrt{42}} \times \frac{8}{9} \times e^{j\frac{\pi}{2}} \quad \text{(formula S179)}$$

or

[Math. 219]

$$\alpha = \frac{\sqrt{170}}{\sqrt{42}} \times \frac{8}{9} \times e^{j\frac{3\pi}{2}} \quad \text{(formula S180)}$$

When the precoding matrix F is set to the precoding matrix F in any of formulas S173, S174, S175, and S176, and $\alpha$ is set to $\alpha$ in any of formulas S177, S178, S179, and S180, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 29, 30, 31, and 32 similarly to the above. In FIGS. 29, 30, 31, and 32, the horizontal and vertical axes respectively represent I and Q, black circles represent the signal points, and a triangle represents the origin (0).

As can be seen from FIGS. 29, 30, 31, and 32, 16384 signal points exist without overlapping one another. Furthermore, as for 16380 signal points, from among 16384 signal points, excluding four signal points located at the top right of the I (in-phase)-Q (quadrature(-phase)) plane in FIG. 29, bottom right of the I (in-phase)-Q (quadrature(-phase)) plane in FIG. 32, top left of the I (in-phase)-Q (quadrature (-phase)) plane in FIG. 30, and bottom left of the I (in-phase)-Q (quadrature(-phase)) plane in FIG. 31, Euclidian distances between any pairs of signal points that are the closest to each other are equal. As a result, the reception device is likely to obtain high reception quality.

When the precoding matrix F is set to the precoding matrix F in any of formulas S173, S174, S175, and S176, and $\alpha$ is set to $\alpha$ in any of formulas S177, S178, S179, and S180, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 33, 34, 35, and 36 similarly to the above. In FIGS. 33, 34, 35, and 36, the horizontal and vertical axes respectively represent I and Q, black circles represent the signal points, and a triangle represents the origin (0).

As can be seen from FIGS. 33, 34, 35, and 36, 1024 signal points exist without overlapping one another. As a result, the reception device is likely to obtain high reception quality.

The minimum Euclidian distance between 16384 signal points in FIGS. 29, 30, 31, and 32 is represented by $D_1$, and the minimum Euclidian distance between 16384 signal points in FIGS. 33, 34, 35, and 36 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 3-4

The following describes a case where formulas S153 and S154 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 220]

$$F = \begin{pmatrix} \beta \times \cos\theta & \beta \times \sin\theta \\ \beta \times \sin\theta & -\beta \times \cos\theta \end{pmatrix} \quad \text{(formula S181)}$$

or

[Math. 221]

$$F = \begin{pmatrix} \cos\theta & \sin\theta \\ \sin\theta & -\cos\theta \end{pmatrix} \quad \text{(formula S182)}$$

or

[Math. 222]

$$F = \begin{pmatrix} \beta \times \cos\theta & -\beta \times \sin\theta \\ \beta \times \sin\theta & \beta \times \cos\theta \end{pmatrix} \quad \text{(formula S183)}$$

or

[Math. 223]

$$F = \begin{pmatrix} \cos\theta & -\sin\theta \\ \sin\theta & \cos\theta \end{pmatrix} \quad \text{(formula S184)}$$

In formulas S181 and S183, $\beta$ may be either a real number or an imaginary number. However, $\beta$ is not 0 (zero).

In this case, values of θ that allow the reception device to obtain high data reception quality are considered.

First, the values of θ that allow the reception device to obtain high data reception quality when attention is focused on the signal $z_1(t)$ ($z_1(i)$) in formulas S2, S3, S4, S5, and S8 are as follows.

[Math. 224]

$$\theta = \tan^{-1}\left(\frac{\sqrt{170}}{\sqrt{42}} \times \frac{8}{9}\right) \text{ or } \tan^{-1}\left(\frac{\sqrt{170}}{\sqrt{42}} \times \frac{8}{9}\right) + 2n\pi \text{ (radian)} \quad \text{(formula S185)}$$

or

[Math. 225]

$$\theta = \pi + \tan^{-1}\left(\frac{\sqrt{170}}{\sqrt{42}} \times \frac{8}{9}\right) \text{ or } \pi + \tan^{-1}\left(\frac{\sqrt{170}}{\sqrt{42}} \times \frac{8}{9}\right) + 2n\pi \text{ (radian)} \quad \text{(formula S186)}$$

or

[Math. 226]

$$\theta = \tan^{-1}\left(-\frac{\sqrt{170}}{\sqrt{42}} \times \frac{8}{9}\right) \text{ or } \tan^{-1}\left(-\frac{\sqrt{170}}{\sqrt{42}} \times \frac{8}{9}\right) + 2n\pi \text{ (radian)} \quad \text{(formula S187)}$$

or

[Math. 227]

$$\theta = \pi + \tan^{-1}\left(-\frac{\sqrt{170}}{\sqrt{42}} \times \frac{8}{9}\right) \text{ or } \pi + \tan^{-1}\left(-\frac{\sqrt{170}}{\sqrt{42}} \times \frac{8}{9}\right) + 2n\pi \text{ (radian)} \quad \text{(formula S188)}$$

In formulas S185, S186, S187, and S188, $\tan^{-1}(x)$ is an inverse trigonometric function (an inverse function of the trigonometric function with appropriately restricted domains), and satisfies the following formula.

[Math. 228]

$$-\frac{\pi}{2} \text{ (radian)} < \tan^{-1}(x) < \frac{\pi}{2} \text{ (radian)} \quad \text{(formula S189)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S181, S182, S183, and S184, and θ is set to θ in any of formulas S185, S186, S187, and S188, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 29, 30, 31, and 32 similarly to the above. In FIGS. 29, 30, 31, and 32, the horizontal and vertical axes respectively represent I and Q, black circles represent the signal points, and a triangle represents the origin (0).

As can be seen from FIGS. 29, 30, 31, and 32, 16384 signal points exist without overlapping one another in the I (in-phase)-Q (quadrature(-phase)) plane. Furthermore, as for 16380 signal points, from among 16384 signal points, excluding four signal points located at the top right of the I (in-phase)-Q (quadrature(-phase)) plane in FIG. 29, bottom right of the I (in-phase)-Q (quadrature(-phase)) plane in FIG. 32, top left of the I (in-phase)-Q (quadrature(-phase)) plane in FIG. 30, and bottom left of the I (in-phase)-Q (quadrature (-phase)) plane in FIG. 31, Euclidian distances between any pairs of signal points that are the closest to each other are equal. As a result, the reception device is likely to obtain high reception quality.

When the precoding matrix F is set to the precoding matrix F in any of formulas S181, S182, S183, and S184, and θ is set to θ in any of formulas S185, S186, S187, and S188, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 33, 34, 35, and 36 similarly to the above. In FIGS. 33, 34, 35, and 36, the horizontal and vertical axes respectively represent I and Q, black circles represent the signal points, and a triangle represents the origin (0).

As can be seen from FIGS. 33, 34, 35, and 36, 16384 signal points exist without overlapping one another. As a result, the reception device is likely to obtain high reception quality.

The minimum Euclidian distance between 16384 signal points in FIGS. 29, 30, 31, and 32 is represented by $D_1$, and the minimum Euclidian distance between 16384 signal points in FIGS. 33, 34, 35, and 36 is represented by $D_2$. In this case, $D_1 > D_2$ is satisfied. Accordingly, as described in Configuration Example R1, it is desirable that $Q_1 > Q_2$ be satisfied when $Q_1 \neq Q_2$ is satisfied in formulas S2, S3, S4, S5, and S8.

Example 3-5

The following describes a case where formulas S153 and S154 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2 = P_2^2$ is satisfied in formula S2
<2> Case where $P_1^2 = P_2^2$ is satisfied in formula S3
<3> Case where $P_1^2 = P_2^2$ is satisfied in formula S4
<4> Case in formula S5
<5> Case in formula S8

[Math. 229]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S190)}$$

or

-continued

[Math. 230]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{(formula S191)}$$

or

[Math. 231]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S192)}$$

or

[Math. 232]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{(formula S193)}$$

In formulas S190, S191, S192, and S193, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_2(t)$ ($z_2(i)$) in formulas S2, S3, S4, S5, and S8 are as follows.

When α is a real number:

[Math. 233]

$$\alpha = \frac{\sqrt{42}}{\sqrt{170}} \times \frac{9}{8} \quad \text{(formula S194)}$$

or

[Math. 234]

$$\alpha = -\frac{\sqrt{42}}{\sqrt{170}} \times \frac{9}{8} \quad \text{(formula S195)}$$

When α is an imaginary number:

[Math. 235]

$$\alpha = \frac{\sqrt{42}}{\sqrt{170}} \times \frac{9}{8} \times e^{j\frac{\pi}{2}} \quad \text{(formula S196)}$$

or

[Math. 236]

$$\alpha = \frac{\sqrt{42}}{\sqrt{170}} \times \frac{9}{8} \times e^{j\frac{3\pi}{2}} \quad \text{(formula S197)}$$

When the precoding matrix F is set to the precoding matrix F in any of formulas S190, S191, S192, and S193, and α is set to α in any of formulas S194, S195, S196, and S197, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 37, 38, 39, and 40 similarly to the above. In FIGS. 37, 38, 39, and 40, the horizontal and vertical axes respectively represent I and Q, black circles represent the signal points, and a triangle represents the origin (0).

As can be seen from FIGS. 37, 38, 39, and 40, 16384 signal points exist without overlapping one another. Furthermore, as for 16380 signal points, from among 16384 signal points, excluding four signal points located at the top right of the I (in-phase)-Q (quadrature(-phase)) plane in FIG. 37, bottom right of the I (in-phase)-Q (quadrature(-phase)) plane in FIG. 40, top left of the I (in-phase)-Q (quadrature (-phase)) plane in FIG. 38, and bottom left of the I (in-phase)-Q (quadrature(-phase)) plane in FIG. 39, Euclidian distances between any pairs of signal points that are the closest to each other are equal. As a result, the reception device is likely to obtain high reception quality.

When the precoding matrix F is set to the precoding matrix F in any of formulas S190, S191, S192, and S193, and α is set to α in any of formulas S194, S195, S196, and S197, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 41, 42, 43, and 44 similarly to the above. In FIGS. 41, 42, 43, and 44, the horizontal and vertical axes respectively represent I and Q, black circles represent the signal points, and a triangle represents the origin (0).

As can be seen from FIGS. 41, 42, 43, and 44, 1024 signal points exist without overlapping one another. As a result, the reception device is likely to obtain high reception quality.

The minimum Euclidian distance between 16384 signal points in FIGS. 37, 38, 39, and 40 is represented by $D_2$, and the minimum Euclidian distance between 16384 signal points in FIGS. 41, 42, 43, and 44 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 3-6

The following describes a case where formulas S153 and S154 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 237]

$$F = \begin{pmatrix} \beta \times \cos\theta & \beta \times \sin\theta \\ \beta \times \sin\theta & -\beta \times \cos\theta \end{pmatrix} \quad \text{(formula S198)}$$

or

-continued

[Math. 238]

$$F = \begin{pmatrix} \cos\theta & \sin\theta \\ \sin\theta & -\cos\theta \end{pmatrix} \quad \text{(formula S199)}$$

or

[Math. 239]

$$F = \begin{pmatrix} \beta\times\cos\theta & -\beta\times\sin\theta \\ \beta\times\sin\theta & \beta\times\cos\theta \end{pmatrix} \quad \text{(formula S200)}$$

or

[Math. 240]

$$F = \begin{pmatrix} \cos\theta & -\sin\theta \\ \sin\theta & \cos\theta \end{pmatrix} \quad \text{(formula S201)}$$

In formulas S198 and S200, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 241]

$$\theta = \tan^{-1}\left(\frac{\sqrt{42}}{\sqrt{170}}\times\frac{9}{8}\right) \text{ or } \tan^{-1}\left(\frac{\sqrt{42}}{\sqrt{170}}\times\frac{9}{8}\right) + 2n\pi \text{ (radian)} \quad \text{(formula S202)}$$

or

[Math. 242]

$$\theta = \pi + \tan^{-1}\left(\frac{\sqrt{42}}{\sqrt{170}}\times\frac{9}{8}\right) \text{ or } \pi + \tan^{-1}\left(\frac{\sqrt{42}}{\sqrt{170}}\times\frac{9}{8}\right) + 2n\pi \text{ (radian)} \quad \text{(formula S203)}$$

or

[Math. 243]

$$\theta = \tan^{-1}\left(-\frac{\sqrt{42}}{\sqrt{170}}\times\frac{9}{8}\right) \text{ or } \tan^{-1}\left(-\frac{\sqrt{42}}{\sqrt{170}}\times\frac{9}{8}\right) + 2n\pi \text{ (radian)} \quad \text{(formula S204)}$$

or

[Math. 244]

$$\theta = \pi + \tan^{-1}\left(-\frac{\sqrt{42}}{\sqrt{170}}\times\frac{9}{8}\right) \text{ or } \pi + \tan^{-1}\left(-\frac{\sqrt{42}}{\sqrt{170}}\times\frac{9}{8}\right) + 2n\pi \text{ (radian)} \quad \text{(formula S205)}$$

In formulas S202, S203, S204, and S205, $\tan^{-1}(x)$ is an inverse trigonometric function (an inverse function of the trigonometric function with appropriately restricted domains), and satisfies the following formula.

[Math. 245]

$$-\frac{\pi}{2} \text{ (radian)} < \tan^{-1}(x) < \frac{\pi}{2} \text{ (radian)} \quad \text{(formula S206)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S198, S199, S200, and S201, and θ is set to θ in any of formulas S202, S203, S204, and S205, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 37, 38, 39, and 40 similarly to the above. In FIGS. 37, 38, 39, and 40, the horizontal and vertical axes respectively represent I and Q, black circles represent the signal points, and a triangle represents the origin (0).

As can be seen from FIGS. 37, 38, 39, and 40, 16384 signal points exist without overlapping one another. Furthermore, as for 16380 signal points, from among 16384 signal points, excluding four signal points located at the top right of the I (in-phase)-Q (quadrature(-phase)) plane in FIG. 37, bottom right of the I (in-phase)-Q (quadrature(-phase)) plane in FIG. 40, top left of the I (in-phase)-Q (quadrature (-phase)) plane in FIG. 38, and bottom left of the I (in-phase)-Q (quadrature(-phase)) plane in FIG. 39, Euclidian distances between any pairs of signal points that are the closest to each other are equal. As a result, the reception device is likely to obtain high reception quality.

When the precoding matrix F is set to the precoding matrix F in any of formulas S198, S199, S200, and S201, and θ is set to θ in any of formulas S202, S203, S204, and S205, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 41, 42, 43, and 44 as described above similarly to the above. In FIGS. 41, 42, 43, and 44, the horizontal and vertical axes respectively represent I and Q, black circles represent the signal points, and a triangle represents the origin (0).

As can be seen from FIGS. 41, 42, 43, and 44, 1024 signal points exist without overlapping one another. As a result, the reception device is likely to obtain high reception quality.

The minimum Euclidian distance between 16384 signal points in FIGS. 37, 38, 39, and 40 is represented by $D_2$, and the minimum Euclidian distance between 16384 signal points in FIGS. 41, 42, 43, and 44 is represented by $D_1$. In this case, $D_1<D_2$ is satisfied. Accordingly, as described in Configuration Example R1, it is desirable that $Q_1<Q_2$ be satisfied when $Q_1\neq Q_2$ is satisfied in formulas S2, S3, S4, S5, and S8.

Example 3-7

The following describes a case where formulas S153 and S154 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4
<4> Case in formula S5
<5> Case in formula S8

[Math. 246]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(formula S207)}$$

or

[Math. 247]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{(formula S208)}$$

or

[Math. 248]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(formula S209)}$$

or

[Math. 249]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{(formula S210)}$$

In formulas S207, S208, S209, and S210, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_2(t)$ ($z_2(i)$) in formulas S2, S3, S4, S5, and S8 are as follows.

When α is a real number:

[Math. 250]

$$\alpha = \frac{\sqrt{42}}{\sqrt{170}} \times \frac{8}{9} \quad \text{(formula S211)}$$

or

[Math. 251]

$$\alpha = -\frac{\sqrt{42}}{\sqrt{170}} \times \frac{8}{9} \quad \text{(formula S212)}$$

When α is an imaginary number:

[Math. 252]

$$\alpha = \frac{\sqrt{42}}{\sqrt{170}} \times \frac{8}{9} \times e^{j\frac{\pi}{2}} \quad \text{(formula S213)}$$

or

[Math. 253]

$$\alpha = \frac{\sqrt{42}}{\sqrt{170}} \times \frac{8}{9} \times e^{j\frac{3\pi}{2}} \quad \text{(formula S214)}$$

When the precoding matrix F is set to the precoding matrix F in any of formulas S207, S208, S209, and S210, and α is set to α in any of formulas S211, S212, S213, and S214, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 45, 46, 47, and 48 similarly to the above. In FIGS. 45, 46, 47, and 48, the horizontal and vertical axes respectively represent I and Q, black circles represent the signal points, and a triangle represents the origin (0).

As can be seen from FIGS. 45, 46, 47, and 48, 16384 signal points exist without overlapping one another. Furthermore, as for 16380 signal points, from among 16384 signal points, excluding four signal points located at the top right of the I (in-phase)-Q (quadrature(-phase)) plane in FIG. 45, bottom right of the I (in-phase)-Q (quadrature(-phase)) plane in FIG. 48, top left of the I (in-phase)-Q (quadrature (-phase)) plane in FIG. 46, and bottom left of the I (in-phase)-Q (quadrature(-phase)) plane in FIG. 47, Euclidian distances between any pairs of signal points that are the closest to each other are equal. As a result, the reception device is likely to obtain high reception quality.

When the precoding matrix F is set to the precoding matrix F in any of formulas S207, S208, S209, and S210, and α is set to α in any of formulas S211, S212, S213, and S214, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 49, 50, 51, and 52 as described above similarly to the above. In FIGS. 49, 50, 51, and 52, the horizontal and vertical axes respectively represent I and Q, black circles represent the signal points, and a triangle represents the origin (0).

As can be seen from FIGS. 49, 50, 51, and 52, 1024 signal points exist without overlapping one another. As a result, the reception device is likely to obtain high reception quality.

The minimum Euclidian distance between 16384 signal points in FIGS. 45, 46, 47, and 48 is represented by $D_2$, and the minimum Euclidian distance between 16384 signal points in FIGS. 49, 50, 51, and 52 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 3-8

The following describes a case where formulas S153 and S154 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 254]

$$F = \begin{pmatrix} \beta \times \cos\theta & \beta \times \sin\theta \\ \beta \times \sin\theta & -\beta \times \cos\theta \end{pmatrix} \quad \text{(formula S215)}$$

or

[Math. 255]

$$F = \begin{pmatrix} \cos\theta & \sin\theta \\ \sin\theta & -\cos\theta \end{pmatrix} \quad \text{(formula S216)}$$

or

[Math. 256]

$$F = \begin{pmatrix} \beta \times \cos\theta & -\beta \times \sin\theta \\ \beta \times \sin\theta & \beta \times \cos\theta \end{pmatrix} \quad \text{(formula S217)}$$

or

[Math. 257]

$$F = \begin{pmatrix} \cos\theta & -\sin\theta \\ \sin\theta & \cos\theta \end{pmatrix} \quad \text{(formula S218)}$$

In formulas S215 and S217, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 258]

$$\theta = \tan^{-1}\left(\frac{\sqrt{42}}{\sqrt{170}} \times \frac{8}{9}\right) \text{ or } \tan^{-1}\left(\frac{\sqrt{42}}{\sqrt{170}} \times \frac{8}{9}\right) + 2n\pi \text{ (radian)} \quad \text{(formula S219)}$$

or

[Math. 259]

$$\theta = \pi + \tan^{-1}\left(\frac{\sqrt{42}}{\sqrt{170}} \times \frac{8}{9}\right) \text{ or } \pi + \tan^{-1}\left(\frac{\sqrt{42}}{\sqrt{170}} \times \frac{8}{9}\right) + 2n\pi \text{ (radian)} \quad \text{(formula S220)}$$

or

[Math. 260]

$$\theta = \tan^{-1}\left(-\frac{\sqrt{42}}{\sqrt{170}} \times \frac{8}{9}\right) \text{ or } \tan^{-1}\left(-\frac{\sqrt{42}}{\sqrt{170}} \times \frac{8}{9}\right) + 2n\pi \text{ (radian)} \quad \text{(formula S221)}$$

or

-continued

[Math. 261]

$$\theta = \pi + \tan^{-1}\left(-\frac{\sqrt{42}}{\sqrt{170}} \times \frac{8}{9}\right) \text{ or } \pi + \tan^{-1}\left(-\frac{\sqrt{42}}{\sqrt{170}} \times \frac{8}{9}\right) + 2n\pi \text{ (radian)} \quad \text{(formula S222)}$$

In formulas S219, S220, S221, and S222, $\tan^{-1}(x)$ is an inverse trigonometric function (an inverse function of the trigonometric function with appropriately restricted domains), and satisfies the following formula.

[Math. 262]

$$-\frac{\pi}{2} \text{ (radian)} < \tan^{-1}(x) < \frac{\pi}{2} \text{ (radian)} \quad \text{(formula S223)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S215, S216, S217, and S218, and θ is set to θ in any of formulas S219, S220, S221, and S222, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 45, 46, 47, and 48 similarly to the above. In FIGS. 45, 46, 47, and 48, the horizontal and vertical axes respectively represent I and Q, black circles represent the signal points, and a triangle represents the origin (0).

As can be seen from FIGS. 45, 46, 47, and 48, 16384 signal points exist without overlapping one another. Furthermore, as for 16380 signal points, from among 16384 signal points, excluding four signal points located at the top right of the I (in-phase)-Q (quadrature(-phase)) plane in FIG. 45, bottom right of the I (in-phase)-Q (quadrature(-phase)) plane in FIG. 48, top left of the I (in-phase)-Q (quadrature (-phase)) plane in FIG. 46, and bottom left of the I (in-phase)-Q (quadrature(-phase)) plane in FIG. 47, Euclidian distances between any pairs of signal points that are the closest to each other are equal. As a result, the reception device is likely to obtain high reception quality.

When the precoding matrix F is set to the precoding matrix F in any of formulas S215, S216, S217, and S218, and θ is set to θ in any of formulas S219, S220, S221, and S222, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 49, 50, 51, and 52 similarly to the above. In FIGS. 49, 50, 51, and 52, the horizontal and vertical axes respectively represent I and Q, black circles represent the signal points, and a triangle represents the origin (0).

As can be seen from FIGS. 49, 50, 51, and 52, 1024 signal points exist without overlapping one another. As a result, the reception device is likely to obtain high reception quality.

The minimum Euclidian distance between 16384 signal points in FIGS. 45, 46, 47, and 48 is represented by $D_2$, and the minimum Euclidian distance between 16384 signal points in FIGS. 49, 50, 51, and 52 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 3

Supplemental Remarks

Examples of the values of $\alpha$ and $\theta$ that allow for obtaining high data reception quality are shown in Example 3-1 to Example 3-8. Even when the values of $\alpha$ and $\theta$ are not equal to the values shown in these examples, however, high data reception quality can be obtained by satisfying the conditions shown in Configuration Example R1.

Example 4

In the following description, in the mapper 504 in FIGS. 5-7, 256QAM and 64QAM are applied as a modulation scheme for obtaining $s_1(t)$ $(s_1(i))$ and a modulation scheme for obtaining $s_2(t)$ $(s_2(i))$, respectively. The following describes examples of the structure of the precoding matrix (F) and conditions regarding power change when precoding shown in any of formulas S2, S3, S4, S5, and S8 and/or power change are/is performed.

A mapping scheme for 64QAM is described first below. FIG. 11 shows an example of signal point constellation for 64QAM in the I (in-phase)-Q (quadrature(-phase)) plane. In FIG. 11, 64 circles represent signal points for 64QAM, and the horizontal and vertical axes respectively represent I and Q.

Coordinates of the 64 signal points (i.e., the circles in FIG. 11) for 64QAM in the I (in-phase)-Q (quadrature(-phase)) plane are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$,
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$,
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$,
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$,
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$, where $w_{64}$ is a real number greater than 0.

Here, transmitted bits (input bits) are represented by b0, b1, b2, b3, b4, and b5. For example, when (b0, b1, b2, b3, b4, b5)=(0, 0, 0, 0, 0, 0) for the transmitted bits, mapping is performed to a signal point 1101 in FIG. 11. When an in-phase component and a quadrature component of the baseband signal obtained as a result of mapping are respectively represented by I and Q, $(I, Q)=(7w_{64}, 7w_{64})$ is satisfied.

That is to say, the in-phase component I and the quadrature component Q of the baseband signal obtained as a result of mapping (at the time of using 64QAM) are determined based on the transmitted bits (b0, b1, b2, b3, b4, b5). One example of a relationship between values (000000-111111) of a set of b0, b1, b2, b3, b4, and b5 and coordinates of signal points is as shown in FIG. 11. The values 000000-111111 of the set of b0, b1, b2, b3, b4, and b5 are shown directly below the 64 signal points (i.e., the circles in FIG. 11) for 64QAM, which are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$,
$(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$,
$(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$,
$(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$,
$(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$. Coordinates, in the I (in-phase)-Q (quadrature(-phase)) plane, of the signal points (i.e., the circles) directly above the values 000000-111111 of the set of b0, b1, b2, b3, b4, and b5 indicate the in-phase component I and the quadrature component Q of the baseband signal obtained as a result of mapping. The relationship between the values (000000-111111) of the set of b0, b1, b2, b3, b4, and b5 for 64QAM and coordinates of signal points is not limited to that shown in FIG. 11. Values obtained by expressing the in-phase component I and the quadrature component Q of the baseband signal obtained as a result of mapping (at the time of using 64QAM) in complex numbers correspond to the baseband signal ($s_1(t)$ or $s_2(t)$) in FIGS. 5-7.

A mapping scheme for 256QAM is described below. FIG. 20 shows an example of signal point constellation for 256QAM in the I (in-phase)-Q (quadrature(-phase)) plane. In FIG. 20, 256 circles represent signal points for 256QAM.

Coordinates of the 256 signal points (i.e., the circles in FIG. 20) for 256QAM in the I (in-phase)-Q (quadrature(-phase)) plane are $(15w_{256},15w_{256})$, $(15w_{256},13w_{256})$, $(15w_{256},11w_{256})$, $(15w_{256},9w_{256})$, $(15w_{256},7w_{256})$, $(15w_{256},5w_{256})$, $(15w_{256},3w_{256})$, $(15w_{256},w_{256})$, $(15w_{256},-15w_{256})$, $(15w_{256},-13w_{256})$, $(15w_{256},-11w_{256})$, $(15w_{256},-9w_{256})$, $(15w_{256},-7w_{256})$, $(15w_{256},-5w_{256})$, $(15w_{256},-3w_{256})$, $(15w_{256},-w_{256})$,
$(13w_{256},15w_{256})$, $(13w_{256},13w_{256})$, $(13w_{256}11w_{256})$, $(13w_{256}-,9w_{256})$ $(13w_{256},7w_{256})$, $(13w_{256},5w_{256})$, $(13w_{256},3w_{256})$, $(13w_{256},w_{256})$, $(13w_{256},-15w_{256})$, $(13w_{256},-13w_{256})$, $(13w_{256},-11w_{256})$, $(13w_{256},-9w_{256})$, $(13w_{256},-7w_{256})$, $(13w_{256},-5w_{256})$, $(13w_{256},-3w_{256})$, $(13w_{256},-w_{256})$,
$(11w_{256},15w_{256})$, $(11w_{256},13w_{256})$, $(11w_{256},11w_{256})$, $(11w_{256},9w_{256})$, $(11w_{256},7w_{256})$, $(11w_{256},5w_{256})$, $(11w_{256},3w_{256})$, $(11w_{256},w_{256})$, $(11w_{256},-15w_{256})$, $(11w_{256},-13w_{256})$, $(11w_{256},-11w_{256})$, $(11w_{256},-9w_{256})$ $(11w_{256},-7w_{256})$, $(11w_{256}-5w_{256})$, $(11w_{256}-3w_{256})$, $(11w_{256},-w_{256})$,
$(9w_{256},15w_{256})$, $(9w_{256},13w_{256})$, $(9w_{256},11w_{256})$, $(9w_{256},9w_{256})$, $(9w_{256},7w_{256})$, $(9w_{256},5w_{256})$, $(9w_{256},3w_{256})$, $(9w_{256},w_{256}), (9w_{256},-15w_{256}), (9w_{256},-13w_{256}), (9w_{256},-11w_{256}), (9w_{256},-9w_{256}), (9w_{256},-7w_{256}), (9w_{256},-5w_{256}), (9w_{256},-3w_{256}), (9w_{256},-w_{256})$,
$(7w_{256},15w_{256}), (7w_{256},13w_{256}), (7w_{256},11w_{256}), (7w_{256},9w_{256}), (7w_{256},7w_{256}), (7w_{256},5w_{256}), (7w_{256},3w_{256}), (7w_{256},w_{256}), (7w_{256},-15w_{256}), (7w_{256},-13w_{256}), (7w_{256},-11w_{256}), (7w_{256},-9w_{256}), (7w_{256},-7w_{256}), (7w_{256},-5w_{256}), (7w_{256},-3w_{256}), (7w_{256}-w_{256})$,
$(5w_{256},15w_{255}), (5w_{256},13w_{256}), (5w_{256},11w_{256}), (5w_{256},9w_{256}), (5w_{256},7w_{256}), (5w_{256},5w_{256}), (5w_{256},3w_{256}), (5w_{256},w_{256}), (5w_{256},-15w_{256}), (5w_{256},-13w_{256}), (5w_{256},-11w_{256}), (5w_{256},-9w_{256}), (5w_{256},-7w_{256}), (5w_{256},-5w_{256}), (5w_{256},-3w_{256}), (5w_{256},-w_{256})$,
$(3w_{256}15w_{256}), (3w_{256},13w_{256}), (3w_{256},11w_{256}), (3w_{256},9w_{256}), (3w_{256},7w_{256}), (3w_{256},5w_{256}), (3w_{256},3w_{256}), (3w_{256},w_{256}), (3w_{256},-15w_{256}), (3w_{256},-13w_{256}), (3w_{256},-11w_{256}), (3w_{256},-9w_{256}), (3w_{256},-7w_{256}), (3w_{256}-5w_{256}), (3w_{256},-3w_{256}), (3w_{256},-w_{256})$,
$(w_{256},15w_{256}), (w_{256},13w_{256}), (w_{256},11w_{256}), (w_{256},9w_{256}), (w_{256},7w_{256}), (w_{256},5w_{256}), (w_{256},3w_{256}), (w_{256},w_{256}), (w_{256},-15w_{256}), (w_{256},-13w_{256}), (w_{256},-11w_{256}), (w_{256},-9w_{256}), (w_{256},-7w_{256}), (w_{256},-5w_{256}), (w_{256},-3w_{256}), (w_{256},-w_{256})$,
$(-15w_{256},15w_{256}), (-15w_{256},13w_{256}), (-15w_{256},11w_{256}), (-15w_{256},9w_{256}), (-15w_{256},7w_{256}), (-15w_{256},5w_{256}), (-15w_{256},3w_{256}), (-15w_{256},w_{256}), (-15w_{256},-15w_{256}), (-15w_{256},-13w_{256}), (-15w_{256},-11w_{256}), (-15w_{256},-9w_{256}), (-15w_{256},-7w_{256}), (-15w_{256},-5w_{256}), (-15w_{256},-3w_{256}), (-15w_{256},-w_{256})$,
$(-13w_{256},15w_{256}), (-13w_{256},13w_{256}), (-13w_{256},11w_{256}), (-13w_{256},9w_{256}), (-13w_{256},7w_{256}), (-13w_{256},5w_{256}), (-13w_{256},3w_{256}), (-13w_{256},w_{256}), (-13w_{256},-15w_{256}), (-13w_{256},-13w_{256}), (-13w_{256},-11w_{256}), (-13w_{256},-9w_{256}), (-13w_{256},-7w_{256}), (-13w_{256},-5w_{256}), (-13w_{256},-3w_{256}), (-13w_{256},-w_{256})$,
$(-11w_{256},15w_{256}), (-11w_{256},13w_{256}), (-11w_{256},11w_{256}), (-11w_{256},9w_{256}), (-11w_{256},7w_{256}), (-11w_{256},5w_{256}), (-11w_{256},3w_{256}), (-11w_{256},w_{256}), (-11w_{256},-15w_{256}), (-11w_{256},-13w_{256}), (-11w_{256},-11w_{256}), (-11w_{256},-9w_{256}), (-11w_{256},-7w_{256}), (-11w_{256},-5w_{256}), (-11w_{256},-3w_{256}), (-11w_{256},-w_{256})$,
$(-9w_{256},15w_{256}), (-9w_{256},13w_{256}), (-9w_{256},11w_{256}), (-9w_{256},9w_{256}), (-9w_{256},7w_{256}), (-9w_{256},5w_{256}), (-9w_{256},3w_{256}), (-9w_{256},w_{256}), (-9w_{256},-15w_{256}), (-9w_{256},-13w_{256}), (-9w_{256},-11w_{256}), (-9w_{256},-9w_{256}), (-9w_{256},-7w_{256}), (-9w_{256},-5w_{256}), (-9w_{256},-3w_{256}), (-9w_{256},w_{256})$,
$(-7w_{256},15w_{256}), (-7w_{256},13w_{256}), (-7w_{256},11w_{256}), (-7w_{256},9w_{256}), (-7w_{256},7w_{256}), (-7w_{256},5w_{256}), (-7w_{256},3w_{256}), (-7w_{256},w_{256}), (-7w_{256},-15w_{256}), (-7w_{256},-13w_{256}), (-7w_{256},-11w_{256}), (-7w_{256},-9w_{256}), (-7w_{256},-7w_{256}), (-7w_{256},-5w_{256}), (-7w_{256},-3w_{256}), (-7w_{256},-w_{256})$,
$(-5w_{256},15w_{256}), (-5w_{256},13w_{256}), (-5w_{256},11w_{256}), (-5w_{256},9w_{256}), (-5w_{256},7w_{256}), (-5w_{256},5w_{256}), (-5w_{256},3w_{256}), (-5w_{256},w_{256}), (-5w_{256},-15w_{256}), (-5w_{256},-13w_{256}), (-5w_{256},-11w_{256}), (-5w_{256},-9w_{256}), (-5w_{256},-7w_{256}), (-5w_{256},-5w_{256}), (-5w_{256},-3w_{256}), (-7w_{256},-w_{256})$,
$(-3w_{256},15w_{256}), (-3w_{256},13w_{256}), (-3w_{256},11w_{256}), (-3w_{256},9w_{256}), (-3w_{256},7w_{256}), (-3w_{256},5w_{256}), (-3w_{256},3w_{256}), (-3w_{256},w_{256}), (-3w_{256},-15w_{256}), (-3w_{256},-13w_{256}), (-3w_{256},-11w_{256}), (-3w_{256},-9w_{256}), (-3w_{256},-7w_{256}), (-3w_{256},-5w_{256}), (-3w_{256},-3w_{256}), (-3w_{256},-w_{256})$,
$(-w_{256},15w_{256}), (-w_{256},13w_{256}), (-w_{256},11w_{256}), (-w_{256},9w_{256}), (-w_{256},7w_{256}), (-w_{256},5w_{256}), (-w_{256},3w_{256}), (-w_{256},w_{256}), (-w_{256},-15w_{256}), (-w_{256},-13w_{256}), (-w_{256},-11w_{256}), (-w_{256},-9w_{256}), (-w_{256},-7w_{256}), (-w_{256},-5w_{256}), (-w_{256},-3w_{256})$, and $(-w_{256},-w_{256})$,
where $w_{256}$ is a real number greater than 0.

Here, transmitted bits (input bits) are represented by b0, b1, b2, b3, b4, b5, b6, and b7. For example, when (b0, b1, b2, b3, b4, b5, b6, b7)=(0, 0, 0, 0, 0, 0, 0) for the transmitted bits, mapping is performed to a signal point 2001 in FIG. 20. When an in-phase component and a quadrature component of the baseband signal obtained as a result of mapping are respectively represented by I and Q, (I, Q)=$(15w_{256}, 15w_{256})$ is satisfied.

That is to say, the in-phase component I and the quadrature component Q of the baseband signal obtained as a result of mapping (at the time of using 256QAM) are determined based on the transmitted bits (b0, b1, b2, b3, b4, b5, b6, b7). One example of a relationship between values (00000000-11111111) of a set of b0, b1, b2, b3, b4, b5, b6, and b7 and coordinates of signal points is as shown in FIG. 20. The values 00000000-11111111 of the set of b0, b1, b2, b3, b4, b5, b6 and b7 are shown directly below the 256 signal points (i.e., the circles in FIG. 20) for 256QAM, which are
$(15w_{256},15w_{256}), (15w_{256},13w_{256}), (15w_{256},11w_{256}), (15w_{256},9w_{256}), (15w_{256},7w_{256}), (15w_{256},5w_{256}), (15w_{256},3w_{256}), (15w_{256},w_{256}), (15w_{256},-15w_{256}), (15w_{256},-13w_{256}), (15w_{256},-11w_{256}), (15w_{256},-9w_{256}), (15w_{256},-7w_{256}), (15w_{256},-5w_{256}), (15w_{256},-3w_{256}), (15w_{256},-w_{256})$,
$(13w_{256},15w_{256}), (13w_{256},13w_{256}), (13w_{256}11w_{256}), (13w_{256}-,9w_{256})\ (13w_{256},7w_{256}), (13w_{256},5w_{256}), (13w_{256},3w_{256}), (13w_{256},w_{256}), (13w_{256},-15w_{256}), (13w_{256},-13w_{256}), (13w_{256},-11w_{256}), (13w_{256},-9w_{256}), (13w_{256},-7w_{256}), (13w_{256},-5w_{256}), (13w_{256},-3w_{256}), (13w_{256},-w_{256})$,
$(11w_{256},15w_{256}), (11w_{256},13w_{256}), (11w_{256},11w_{256}), (11w_{256},9w_{256}), (11w_{256},7w_{256}), (11w_{256},5w_{256}), (11w_{256},3w_{256}), (11w_{256},w_{256}), (11w_{256},-15w_{256}), (11w_{256},-13w_{256}), (11w_{256},-11w_{256}), (11w_{256},-9w_{256})\ (11w_{256},-7w_{256}), (11w_{256}-5w_{256}), (11w_{256}-3w_{256}), (11w_{256},-w_{256})$,
$(9w_{256},15w_{256}), (9w_{256},13w_{256}), (9w_{256},11w_{256}), (9w_{256},9w_{256}), (9w_{256},7w_{256}), (9w_{256},5w_{256}), (9w_{256},3w_{256}), (9w_{256},w_{256}), (9w_{256},-15w_{256}), (9w_{256},-13w_{256}), (9w_{256},-11w_{256}), (9w_{256},-9w_{256}), (9w_{256},-7w_{256}), (9w_{256},-5w_{256}), (9w_{256},-3w_{256}), (9w_{256},-w_{256})$,
$(7w_{256},15w_{256}), (7w_{256},13w_{256}), (7w_{256},11w_{256}), (7w_{256},9w_{256}), (7w_{256},7w_{256}), (7w_{256},5w_{256}), (7w_{256},3w_{256}), (7w_{256},w_{256}), (7w_{256},-15w_{256}), (7w_{256},-13w_{256}), (7w_{256},-11w_{256}), (7w_{256},-9w_{256}), (7w_{256},-7w_{256}), (7w_{256},-5w_{256}), (7w_{256},-3w_{256}), (7w_{256}-w_{256})$,
$(5w_{256},15w_{255}), (5w_{256},13w_{256}), (5w_{256},11w_{256}), (5w_{256},9w_{256}), (5w_{256},7w_{256}), (5w_{256},5w_{256}), (5w_{256},3w_{256}), (5w_{256},w_{256}), (5w_{256},-15w_{256}), (5w_{256},-13w_{256}), (5w_{256},-11w_{256}), (5w_{256},-9w_{256}), (5w_{256},-7w_{256}), (5w_{256},-5w_{256}), (5w_{256},-3w_{256}), (5w_{256},-w_{256})$,
$(3w_{256}15w_{256}), (3w_{256},13w_{256}), (3w_{256},11w_{256}), (3w_{256},9w_{256}), (3w_{256},7w_{256}), (3w_{256},5w_{256}), (3w_{256},3w_{256}), (3w_{256},w_{256}), (3w_{256},-15w_{256}), (3w_{256},-13w_{256}), (3w_{256},-11w_{256}), (3w_{256},-9w_{256}), (3w_{256},-7w_{256}), (3w_{256}-5w_{256}), (3w_{256},-3w_{256}), (3w_{256},-w_{256})$,
$(w_{256},15w_{256}), (w_{256},13w_{256}), (w_{256},11w_{256}), (w_{256},9w_{256}), (w_{256},7w_{256}), (w_{256},5w_{256}), (w_{256},3w_{256}), (w_{256},w_{256}), (w_{256},-15w_{256}), (w_{256},-13w_{256}), (w_{256},-11w_{256}), (w_{256},-9w_{256}), (w_{256},-7w_{256}), (w_{256},-5w_{256}), (w_{256},-3w_{256}), (w_{256},-w_{256})$,
$(-15w_{256},15w_{256}), (-15w_{256},13w_{256}), (-15w_{256},11w_{256}), (-15w_{256},9w_{256}), (-15w_{256},7w_{256}), (-15w_{256},5w_{256}), (-15w_{256},3w_{256}), (-15w_{256},w_{256}), (-15w_{256},-15w_{256})$, $(-15w_{256},-13w_{256})$, $(-15w_{256},-11w_{256})$, $(-15w_{256},-9w_{256})$, $(-15w_{256},-7w_{256})$, $(-15w_{256},-5w_{256})$, $(-15w_{256},-3w_{256})$, $(-15w_{256},-w_{256})$,
$(-13w_{256},15w_{256})$, $(-13w_{256},13w_{256})$, $(-13w_{256},11w_{256})$, $(-13w_{256},9w_{256})$, $(-13w_{256},7w_{256})$, $(-13w_{256},5w_{256})$, $(-13w_{256},3w_{256})$, $(-13w_{256},w_{256})$, $(-13w_{256},-15w_{256})$, $(-13w_{256},-13w_{256})$, $(-13w_{256},-11w_{256})$, $(-13w_{256},-9w_{256})$, $(-13w_{256},-7w_{256})$, $(-13w_{256},-5w_{256})$, $(-13w_{256},-3w_{256})$, $(-13w_{256},-w_{256})$,
$(-11w_{256},15w_{256})$, $(-11w_{256},13w_{256})$, $(-11w_{256},11w_{256})$, $(-11w_{256},9w_{256})$, $(-11w_{256},7w_{256})$, $(-11w_{256},5w_{256})$, $(-11w_{256},3w_{256})$, $(-11w_{256},w_{256})$, $(-11w_{256},-15w_{256})$, $(-11w_{256},-13w_{256})$, $(-11w_{256},-11w_{256})$, $(-11w_{256},-9w_{256})$, $(-11w_{256},-7w_{256})$, $(-11w_{256},-5w_{256})$, $(-11w_{256},-3w_{256})$, $(-11w_{256},-w_{256})$,
$(-9w_{256},15w_{256})$, $(-9w_{256},13w_{256})$, $(-9w_{256},11w_{256})$, $(-9w_{256},9w_{256})$, $(-9w_{256},7w_{256})$, $(-9w_{256},5w_{256})$, $(-9w_{256},3w_{256})$, $(-9w_{256},w_{256})$, $(-9w_{256},-15w_{256})$, $(-9w_{256},-13w_{256})$, $(-9w_{256},-11w_{256})$, $(-9w_{256},-9w_{256})$, $(-9w_{256},-7w_{256})$, $(-9w_{256},-5w_{256})$, $(-9w_{256},-3w_{256})$, $(-9w_{256}, w_{256})$,
$(-7w_{256},15w_{256})$, $(-7w_{256},13w_{256})$, $(-7w_{256},11w_{256})$, $(-7w_{256},9w_{256})$, $(-7w_{256},7w_{256})$, $(-7w_{256},5w_{256})$, $(-7w_{256},3w_{256})$, $(-7w_{256},w_{256})$, $(-7w_{256},-15w_{256})$, $(-7w_{256},-13w_{256})$, $(-7w_{256},-11w_{256})$, $(-7w_{256},-9w_{256})$, $(-7w_{256},-7w_{256})$, $(-7w_{256},-5w_{256})$, $(-7w_{256},-3w_{256})$, $(-7w_{256},-w_{256})$,
$(-5w_{256},15w_{256})$, $(-5w_{256},13w_{256})$, $(-5w_{256},11w_{256})$, $(-5w_{256},9w_{256})$, $(-5w_{256},7w_{256})$, $(-5w_{256},5w_{256})$, $(-5w_{256},3w_{256})$, $(-5w_{256},w_{256})$, $(-5w_{256},-15w_{256})$, $(-5w_{256},-13w_{256})$, $(-5w_{256},-11w_{256})$, $(-5w_{256},-9w_{256})$, $(-5w_{256},-7w_{256})$, $(-5w_{256},-5w_{256})$, $(-5w_{256},-3w_{256})$, $(-7w_{256},-w_{256})$,
$(-3w_{256},15w_{256})$, $(-3w_{256},13w_{256})$, $(-3w_{256},11w_{256})$, $(-3w_{256},9w_{256})$, $(-3w_{256},7w_{256})$, $(-3w_{256},5w_{256})$, $(-3w_{256},3w_{256})$, $(-3w_{256},w_{256})$, $(-3w_{256},-15w_{256})$, $(-3w_{256},-13w_{256})$, $(-3w_{256},-11w_{256})$, $(-3w_{256},-9w_{256})$, $(-3w_{256},-7w_{256})$, $(-3w_{256},-5w_{256})$, $(-3w_{256},-3w_{256})$, $(-3w_{256},-w_{256})$,
$(-w_{256},15w_{256})$, $(-w_{256},13w_{256})$, $(-w_{256},11w_{256})$, $(-w_{256},9w_{256})$, $(-w_{256},7w_{256})$, $(-w_{256},5w_{256})$, $(-w_{256},3w_{256})$, $(-w_{256},w_{256})$, $(-w_{256},-15w_{256})$, $(-w_{256},-13w_{256})$, $(-w_{256},-11w_{256})$, $(-w_{256},-9w_{256})$, $(-w_{256},-7w_{256})$, $(-w_{256},-5w_{256})$, $(-w_{256},-3w_{256})$, and $(-w_{256},-w_{256})$. Coordinates, in the I (in-phase)-Q (quadrature(-phase)) plane, of the signal points (i.e., the circles) directly above the values 00000000-11111111 of the set of b0, b1, b2, b3, b4, b5, b6, and b7 indicate the in-phase component I and the quadrature component Q of the baseband signal obtained as a result of mapping. The relationship between the values (00000000-11111111) of the set of b0, b1, b2, b3, b4, b5, b6, and b7 for 256QAM and coordinates of signal points is not limited to that shown in FIG. 20. Values obtained by expressing the in-phase component I and the quadrature component Q of the baseband signal obtained as a result of mapping (at the time of using 256QAM) in complex numbers correspond to the baseband signal ($s_1(t)$ or $s_2(t)$) in FIGS. 5-7.

This example shows the structure of the precoding matrix when 256QAM and 64QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, in FIGS. 5-7.

In this case, the baseband signal 505A ($s_1(t)$ ($s_1(i)$)) and the baseband signal 505B ($s_2(t)$ ($s_2(i)$)), which are outputs of the mapper 504 shown in FIGS. 5-7, are typically set to have an equal average power. Thus, the following formulas are satisfied for the coefficients $w_{64}$ and $w_{256}$ described in the above-mentioned explanations on the mapping schemes for 64QAM and 256QAM, respectively.

[Math. 263]

$$w_{64} = \frac{z}{\sqrt{42}} \qquad \text{(formula S224)}$$

[Math. 264]

$$w_{256} = \frac{z}{\sqrt{170}} \qquad \text{(formula S225)}$$

In formulas S224 and S225, z is a real number greater than 0. The following describes the precoding matrix F used when calculation in the following cases is performed.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 265]

$$F = \begin{pmatrix} a(i) & b(i) \\ c(i) & d(i) \end{pmatrix} \qquad \text{(formula S226)}$$

The structure of the above-mentioned precoding matrix F is described in detail below in Example 4-1 to Example 4-8.

Example 4-1

In any of the above-mentioned cases <1> to <5>, the precoding matrix F is set to the precoding matrix F in any of the following formulas.

[Math. 266]

$$F = \begin{pmatrix} \beta \times e^{j0} & \beta \times \alpha \times e^{j0} \\ \beta \times \alpha \times e^{j0} & \beta \times e^{j\pi} \end{pmatrix} \qquad \text{(formula S227)}$$

or

[Math. 267]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \qquad \text{(formula S228)}$$

or

[Math. 268]

$$F = \begin{pmatrix} \beta \times e^{j0} & \beta \times \alpha \times e^{j\pi} \\ \beta \times \alpha \times e^{j0} & \beta \times e^{j0} \end{pmatrix} \qquad \text{(formula S229)}$$

or

[Math. 269]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \qquad \text{(formula S230)}$$

In formulas S227, S228, S229, and S230, α may be either a real number or an imaginary number, and β may be either a real number or an imaginary number. However, α is not 0 (zero). Similarly, β is not 0 (zero).

In this case, values of $\alpha$ that allow the reception device to obtain high data reception quality are considered.

First, the values of $\alpha$ that allow the reception device to obtain high data reception quality when attention is focused on the signal $z_2(t)$ ($z_2(i)$) in formulas S2, S3, S4, S5, and S8 are as follows.

When $\alpha$ is a real number:

[Math. 270]

$$\alpha = \frac{\sqrt{170}}{\sqrt{42}} \times \frac{9}{8} \qquad \text{(formula S231)}$$

or

[Math. 271]

$$\alpha = -\frac{\sqrt{170}}{\sqrt{42}} \times \frac{9}{8} \qquad \text{(formula S232)}$$

When $\alpha$ is an imaginary number:

[Math. 272]

$$\alpha = \frac{\sqrt{170}}{\sqrt{42}} \times \frac{9}{8} \times e^{j\frac{\pi}{2}} \qquad \text{(formula S233)}$$

or

[Math. 273]

$$\alpha = \frac{\sqrt{170}}{\sqrt{42}} \times \frac{9}{8} \times e^{j\frac{3\pi}{2}} \qquad \text{(formula S234)}$$

In the meantime, 256QAM and 64QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively. Therefore, when precoding (as well as phase change and power change) is performed as described above to transmit a modulated signal from each antenna, the total number of bits in symbols transmitted from the antennas 808A and 808B in FIG. 8 at the (unit) time u at the frequency (carrier) v is 14 bits, which is the sum of 6 bits (transmitted by using 64QAM) and 8 bits (transmitted by using 256QAM).

When input bits used to perform mapping for 64QAM are represented by $b_{0,64}$, $b_{1,64}$, $b_{2,64}$, $b_{3,64}$, $b_{4,64}$, and $b_{5,64}$, and input bits used to perform mapping for 256QAM are represented by $b_{0,256}$, $b_{1,256}$, $b_{2,256}$, $b_{3,256}$, $b_{4,256}$, $b_{5,256}$, $b_{6,256}$, and $b_{7,256}$, even if a is set to a in any of formulas S231, S232, S233, and S234, concerning the signal $z_1(t)$ ($z_1(i)$), signal points from a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(0, 0, 0, 0, 0, 0, 0, 0, 0, 0, 0, 0, 0, 0) to a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(1, 1, 1, 1, 1, 1, 1, 1, 1, 1, 1, 1, 1, 1) exist in the I (in-phase)-Q (quadrature(-phase)) plane.

Similarly, concerning the signal $z_2(t)$ ($z_2(i)$), signal points from a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(0, 0, 0, 0, 0, 0, 0, 0, 0, 0, 0, 0, 0, 0) to a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(1, 1, 1, 1, 1, 1, 1, 1, 1, 1, 1, 1, 1, 1) exist in the I (in-phase)-Q (quadrature(-phase)) plane.

Formulas S231 to S234 are shown above as "the values of $\alpha$ that allow the reception device to obtain high data reception quality when attention is focused on the signal $z_2(t)$ ($z_2(i)$) in formulas S2, S3, S4, S5, and S8". Description is made on this point.

Concerning the signal $z_2(t)$ ($z_2(i)$), signal points from a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(0, 0, 0, 0, 0, 0, 0, 0, 0, 0, 0, 0, 0, 0) to a signal point corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$)=(1, 1, 1, 1, 1, 1, 1, 1, 1, 1, 1, 1, 1, 1) exist in the I (in-phase)-Q (quadrature(-phase)) plane. It is desirable that these $2^{14}$=16384 signal points exist without overlapping one another in the I (in-phase)-Q (quadrature(-phase)) plane.

The reason is as follows. When the modulated signal transmitted from the antenna for transmitting the signal $z_1(t)$ ($z_1(i)$) does not reach the reception device, the reception device performs detection and error correction decoding by using the signal $z_2(t)$ ($z_2(i)$). In this case, it is desirable that "16384 signal points exist without overlapping one another" in order for the reception device to obtain high data reception quality. When the precoding matrix F is set to the precoding matrix F in any of formulas S227, S228, S229, and S230, and $\alpha$ is set to $\alpha$ in any of formulas S231, S232, S233, and S234, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 37, 38, 39, and 40. In FIGS. 37, 38, 39, and 40, the horizontal and vertical axes respectively represent I and Q, black circles represent the signal points, and a triangle represents the origin (0).

As can be seen from FIGS. 37, 38, 39, and 40, 16384 signal points exist without overlapping one another in the I (in-phase)-Q (quadrature(-phase)) plane. Furthermore, as for 16380 signal points, from among 16384 signal points, excluding four signal points located at the top right of the I (in-phase)-Q (quadrature(-phase)) plane in FIG. 37, bottom right of the I (in-phase)-Q (quadrature(-phase)) plane in FIG. 40, top left of the I (in-phase)-Q (quadrature(-phase)) plane in FIG. 38, and bottom left of the I (in-phase)-Q (quadrature (-phase)) plane in FIG. 39, Euclidian distances between any pairs of signal points that are the closest to each other are equal. As a result, the reception device is likely to obtain high reception quality.

When the precoding matrix F is set to the precoding matrix F in any of formulas S227, S228, S229, and S230, and $\alpha$ is set to $\alpha$ in any of formulas S231, S232, S233, and S234, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 41, 42, 43, and 44. In FIGS. 41, 42, 43, and 44, the horizontal and vertical axes respectively represent I and Q, black circles represent the signal points, and a triangle represents the origin (0).

As can be seen from FIGS. 41, 42, 43, and 44, 16384 signal points exist without overlapping one another. As a result, the reception device is likely to obtain high reception quality.

The minimum Euclidian distance between 16384 signal points in FIGS. 37, 38, 39, and 40 is represented by $D_2$, and the minimum Euclidian distance between 16384 signal points in FIGS. 41, 42, 43, and 44 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 4-2

The following describes a case where formulas S224 and S225 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 274]

$$F=\begin{pmatrix}\beta\times\cos\theta & \beta\times\sin\theta\\ \beta\times\sin\theta & -\beta\times\cos\theta\end{pmatrix} \quad \text{(formula S235)}$$

or

[Math. 275]

$$F=\begin{pmatrix}\cos\theta & \sin\theta\\ \sin\theta & -\cos\theta\end{pmatrix} \quad \text{(formula S236)}$$

or

[Math. 276]

$$F=\begin{pmatrix}\beta\times\cos\theta & -\beta\times\sin\theta\\ \beta\times\sin\theta & \beta\times\cos\theta\end{pmatrix} \quad \text{(formula S237)}$$

or

[Math. 277]

$$F=\begin{pmatrix}\cos\theta & -\sin\theta\\ \sin\theta & \cos\theta\end{pmatrix} \quad \text{(formula S238)}$$

In formulas S235 and S237, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4. S5, and S8 are as follows.

[Math. 278]

$$\theta=\tan^{-1}\left(\frac{\sqrt{170}}{\sqrt{42}}\times\frac{9}{8}\right) \text{ or } \tan^{-1}\left(\frac{\sqrt{170}}{\sqrt{42}}\times\frac{9}{8}\right)+2n\pi \text{ (radian)} \quad \text{(formula S239)}$$

or

[Math. 279]

$$\theta=\pi+\tan^{-1}\left(\frac{\sqrt{170}}{\sqrt{42}}\times\frac{9}{8}\right) \text{ or } \pi+\tan^{-1}\left(\frac{\sqrt{170}}{\sqrt{42}}\times\frac{9}{8}\right)+2n\pi \text{ (radian)} \quad \text{(formula S240)}$$

or

-continued

[Math. 280]

$$\theta=\tan^{-1}\left(-\frac{\sqrt{170}}{\sqrt{42}}\times\frac{9}{8}\right) \text{ or } \tan^{-1}\left(-\frac{\sqrt{170}}{\sqrt{42}}\times\frac{9}{8}\right)+2n\pi \text{ (radian)} \quad \text{(formula S241)}$$

or

[Math. 281]

$$\theta=\pi+\tan^{-1}\left(-\frac{\sqrt{170}}{\sqrt{42}}\times\frac{9}{8}\right) \text{ or } \pi+\tan^{-1}\left(-\frac{\sqrt{170}}{\sqrt{42}}\times\frac{9}{8}\right)+2n\pi \text{ (radian)} \quad \text{(formula S242)}$$

In formulas S239, S240, S241, and S242, $\tan^{-1}(x)$ is an inverse trigonometric function (an inverse function of the trigonometric function with appropriately restricted domains), and satisfies the following formula.

[Math. 282]

$$-\frac{\pi}{2} \text{ (radian)} < \tan^{-1}(x) < \frac{\pi}{2} \text{ (radian)} \quad \text{(formula S243)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S235, 5236, S237, and S238, and θ is set to θ in any of formulas S239, S240, S241, and S242, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 37, 38, 39, and 40 similarly to the above. In FIGS. 37, 38, 39, and 40, the horizontal and vertical axes respectively represent I and Q, black circles represent the signal points, and a triangle represents the origin (0).

As can be seen from FIGS. 37, 38, 39, and 40, 16384 signal points exist without overlapping one another in the I (in-phase)-Q (quadrature(-phase)) plane. Furthermore, as for 16380 signal points, from among 16384 signal points, excluding four signal points located at the top right of the I (in-phase)-Q (quadrature(-phase)) plane in FIG. 37, bottom right of the I (in-phase)-Q (quadrature(-phase)) plane in FIG. 40, top left of the I (in-phase)-Q (quadrature(-phase)) plane in FIG. 38, and bottom left of the I (in-phase)-Q (quadrature (-phase)) plane in FIG. 39, Euclidian distances between any pairs of signal points that are the closest to each other are equal. As a result, the reception device is likely to obtain high reception quality.

When the precoding matrix F is set to the precoding matrix F in any of formulas S235, S236, S237, and S238, and θ is set to θ in any of formulas S239, S240, S241, and S242, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 41, 42, 43, and 44 similarly to the above. In FIGS. 41, 42, 43, and 44, the horizontal and vertical axes respectively represent I and Q, black circles represent the signal points, and a triangle represents the origin (0).

As can be seen from FIGS. 41, 42, 43, and 44, 16384 signal points exist without overlapping one another. As a result, the reception device is likely to obtain high reception quality.

The minimum Euclidian distance between 16384 signal points in FIGS. 37, 38, 39, and 40 is represented by $D_2$, and the minimum Euclidian distance between 16384 signal points in FIGS. 41, 42, 43, and 44 is represented by $D_1$. In this case. $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 4-3

The following describes a case where formulas S224 and S225 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 283]

$$F=\begin{pmatrix} \beta\times e^{j0} & \beta\times\alpha\times e^{j0} \\ \beta\times\alpha\times e^{j0} & \beta\times e^{j\pi} \end{pmatrix} \quad \text{(formula S244)}$$

or

[Math. 284]

$$F=\frac{1}{\sqrt{\alpha^2+1}}\begin{pmatrix} e^{j0} & \alpha\times e^{j0} \\ \alpha\times e^{j0} & e^{j\pi} \end{pmatrix} \quad \text{(formula S245)}$$

or

[Math. 285]

$$F=\begin{pmatrix} \beta\times e^{j0} & \beta\times\alpha\times e^{j\pi} \\ \beta\times\alpha\times e^{j0} & \beta\times e^{j0} \end{pmatrix} \quad \text{(formula S246)}$$

or

[Math. 286]

$$F=\frac{1}{\sqrt{\alpha^2+1}}\begin{pmatrix} e^{j0} & \alpha\times e^{j\pi} \\ \alpha\times e^{j0} & e^{j0} \end{pmatrix} \quad \text{(formula S247)}$$

In formulas S244, S245, S246, and S247, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_2(t)$ ($z_2(i)$) in formulas S2, S3, S4, S5, and S8 are as follows.

When α is a real number:

[Math. 287]

$$\alpha=\frac{\sqrt{170}}{\sqrt{42}}\times\frac{8}{9} \quad \text{(formula S248)}$$

or

[Math. 288]

$$\alpha=-\frac{\sqrt{170}}{\sqrt{42}}\times\frac{8}{9} \quad \text{(formula S249)}$$

When α is an imaginary number:

[Math. 289]

$$\alpha=\frac{\sqrt{170}}{\sqrt{42}}\times\frac{8}{9}\times e^{j\frac{\pi}{2}} \quad \text{(formula S250)}$$

or

[Math. 290]

$$\alpha=\frac{\sqrt{170}}{\sqrt{42}}\times\frac{8}{9}\times e^{j\frac{3\pi}{2}} \quad \text{(formula S251)}$$

When the precoding matrix F is set to the precoding matrix F in any of formulas S244, S245, S246, and S247, and α is set to α in any of formulas S248, S249, S250, and S251, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 45, 46, 47, and 48 similarly to the above. In FIGS. 45, 46, 47, and 48, the horizontal and vertical axes respectively represent I and Q, black circles represent the signal points, and a triangle represents the origin (0).

As can be seen from FIGS. 45, 46, 47, and 48, 16384 signal points exist without overlapping one another in the I (in-phase)-Q (quadrature(-phase)) plane. Furthermore, as for 16380 signal points, from among 16384 signal points, excluding four signal points located at the top right of the I (in-phase)-Q (quadrature(-phase)) plane in FIG. 45, bottom right of the I (in-phase)-Q (quadrature(-phase)) plane in FIG. 48, top left of the I (in-phase)-Q (quadrature(-phase)) plane in FIG. 46, and bottom left of the I (in-phase)-Q (quadrature (-phase)) plane in FIG. 47, Euclidian distances between any pairs of signal points that are the closest to each other are equal. As a result, the reception device is likely to obtain high reception quality.

When the precoding matrix F is set to the precoding matrix F in any of formulas S244, S245, S246, and S247, and α is set to α in any of formulas S248, S249, S250, and S251, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 49, 50, 51, and 52 similarly to the above. In FIGS. 49, 50, 51, and 52, the horizontal and vertical axes respectively represent I and Q, black circles represent the signal points, and a triangle represents the origin (0).

As can be seen from FIGS. 49, 50, 51, and 52, 1024 signal points exist without overlapping one another. As a result, the reception device is likely to obtain high reception quality.

The minimum Euclidian distance between 16384 signal points in FIGS. 45, 46, 47, and 48 is represented by $D_2$, and the minimum Euclidian distance between 16384 signal points in FIGS. 49, 50, 51, and 52 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 4-4

The following describes a case where formulas S224 and S225 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 291]

$$F=\begin{pmatrix}\beta\times\cos\theta & \beta\times\sin\theta\\ \beta\times\sin\theta & -\beta\times\cos\theta\end{pmatrix} \quad \text{(formula S252)}$$

or

[Math. 292]

$$F=\begin{pmatrix}\cos\theta & \sin\theta\\ \sin\theta & -\cos\theta\end{pmatrix} \quad \text{(formula S253)}$$

or

[Math. 293]

$$F=\begin{pmatrix}\beta\times\cos\theta & -\beta\times\sin\theta\\ \beta\times\sin\theta & \beta\times\cos\theta\end{pmatrix} \quad \text{(formula S254)}$$

or

[Math. 294]

$$F=\begin{pmatrix}\cos\theta & -\sin\theta\\ \sin\theta & \cos\theta\end{pmatrix} \quad \text{(formula S255)}$$

In formulas S252 and S254, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 295]

$$\theta=\tan^{-1}\left(\frac{\sqrt{170}}{\sqrt{42}}\times\frac{8}{9}\right) \text{ or } \tan^{-1}\left(\frac{\sqrt{170}}{\sqrt{42}}\times\frac{8}{9}\right)+2n\pi \text{ (radian)} \quad \text{(formula S256)}$$

or

[Math. 296]

$$\theta=\pi+\tan^{-1}\left(\frac{\sqrt{170}}{\sqrt{42}}\times\frac{8}{9}\right) \text{ or } \pi+\tan^{-1}\left(\frac{\sqrt{170}}{\sqrt{42}}\times\frac{8}{9}\right)+2n\pi \text{ (radian)} \quad \text{(formula S257)}$$

or

[Math. 297]

$$\theta=\tan^{-1}\left(-\frac{\sqrt{170}}{\sqrt{42}}\times\frac{8}{9}\right) \text{ or } \tan^{-1}\left(-\frac{\sqrt{170}}{\sqrt{42}}\times\frac{8}{9}\right)+2n\pi \text{ (radian)} \quad \text{(formula S258)}$$

or

[Math. 298]

$$\theta=\pi+\tan^{-1}\left(-\frac{\sqrt{170}}{\sqrt{42}}\times\frac{8}{9}\right) \text{ or } \pi+\tan^{-1}\left(-\frac{\sqrt{170}}{\sqrt{42}}\times\frac{8}{9}\right)+2n\pi \text{ (radian)} \quad \text{(formula S259)}$$

In formulas S256, S257, S258, and S259, $\tan^{-1}(x)$ is an inverse trigonometric function (an inverse function of the trigonometric function with appropriately restricted domains), and satisfies the following formula.

[Math. 299]

$$-\frac{\pi}{2} \text{ (radian)} < \tan^{-1}(x) < \frac{\pi}{2} \text{ (radian)} \quad \text{(formula S260)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S252, S253, S254, and S255, and θ is set to θ in any of formulas S256, S257, S258, and S259, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 45, 46, 47, and 48 similarly to the above. In FIGS. 45, 46, 47, and 48, the horizontal and vertical axes respectively represent I and Q, black circles represent the signal points, and a triangle represents the origin (0).

As can be seen from FIGS. 45, 46, 47, and 48, 16384 signal points exist without overlapping one another in the I (in-phase)-Q (quadrature(-phase)) plane. Furthermore, as for 16380 signal points, from among 16384 signal points, excluding four signal points located at the top right of the I (in-phase)-Q (quadrature(-phase)) plane in FIG. 45, bottom right of the I (in-phase)-Q (quadrature(-phase)) plane in FIG. 48, top left of the I (in-phase)-Q (quadrature(-phase)) plane in FIG. 46, and bottom left of the I (in-phase)-Q (quadrature (-phase)) plane in FIG. 47, Euclidian distances between any pairs of signal points that are the closest to each other are equal. As a result, the reception device is likely to obtain high reception quality.

When the precoding matrix F is set to the precoding matrix F in any of formulas S252, S253, S254, and S255, and θ is set to θ in any of formulas S256, S257, S258, and S259, concerning the signal $u_1(t)$ $(u_1(i))$ described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 49, 50, 51, and 52 similarly to the above. In FIGS. 49, 50, 51, and 52, the horizontal and vertical axes respectively represent I and Q, black circles represent the signal points, and a triangle represents the origin (0).

As can be seen from FIGS. 49, 50, 51, and 52, 1024 signal points exist without overlapping one another. As a result, the reception device is likely to obtain high reception quality.

The minimum Euclidian distance between 16384 signal points in FIGS. 45, 46, 47, and 48 is represented by $D_2$, and the minimum Euclidian distance between 16384 signal points in FIGS. 49, 50, 51, and 52 is represented by $D_1$. In this case, $D_1<D_2$ is satisfied. Accordingly, as described in Configuration Example R1, it is desirable that $Q_1<Q_2$ be satisfied when $Q_1 \neq Q_2$ is satisfied in formulas S2, S3, S4, S5, and S8.

Example 4-5

The following describes a case where formulas S224 and S225 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 300]

$$F = \begin{pmatrix} \beta\times e^{j0} & \beta\times\alpha\times e^{j0} \\ \beta\times\alpha\times e^{j0} & \beta\times e^{j\pi} \end{pmatrix} \quad \text{(formula S261)}$$

or

[Math. 301]

$$F = \frac{1}{\sqrt{\alpha^2+1}}\begin{pmatrix} e^{j0} & \alpha\times e^{j0} \\ \alpha\times e^{j0} & e^{j\pi} \end{pmatrix} \quad \text{(formula S262)}$$

or

[Math. 302]

$$F = \begin{pmatrix} \beta\times e^{j0} & \beta\times\alpha\times e^{j\pi} \\ \beta\times\alpha\times e^{j0} & \beta\times e^{j0} \end{pmatrix} \quad \text{(formula S263)}$$

or

[Math. 303]

$$F = \frac{1}{\sqrt{\alpha^2+1}}\begin{pmatrix} e^{j0} & \alpha\times e^{j\pi} \\ \alpha\times e^{j0} & e^{j0} \end{pmatrix} \quad \text{(formula S264)}$$

In formulas S261, S262, S263, and S264, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_1(t)$ $(z_1(i))$ in formulas S2, S3, S4, S5, and S8 are as follows.

When α is a real number:

[Math. 304]

$$\alpha = \frac{\sqrt{42}}{\sqrt{170}}\times\frac{9}{8} \quad \text{(formula S265)}$$

or

[Math. 305]

$$\alpha = -\frac{\sqrt{42}}{\sqrt{170}}\times\frac{9}{8} \quad \text{(formula S266)}$$

When α is an imaginary number:

[Math. 306]

$$\alpha = \frac{\sqrt{42}}{\sqrt{170}}\times\frac{9}{8}\times e^{j\frac{\pi}{2}} \quad \text{(formula S267)}$$

or

[Math. 307]

$$\alpha = \frac{\sqrt{42}}{\sqrt{170}}\times\frac{9}{8}\times e^{j\frac{3\pi}{2}} \quad \text{(formula S268)}$$

When the precoding matrix F is set to the precoding matrix F in any of formulas S261, S262, S263, and S264, and α is set to α in any of formulas S265, S266, S267, and S268, concerning the signal $u_1(t)$ $(u_1(i))$ described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 21, 22, 23, and 24 similarly to the above. In FIGS. 21, 22, 23, and 24, the horizontal and vertical axes respectively represent I and Q, black circles represent the signal points, and a triangle represents the origin (0).

As can be seen from FIGS. 21, 22, 23, and 24, 16384 signal points exist without overlapping one another. Furthermore, as for 16380 signal points, from among 16384 signal points, excluding four signal points located at the top right of the I (in-phase)-Q (quadrature(-phase)) plane in FIG. 21, bottom right of the I (in-phase)-Q (quadrature(-phase)) plane in FIG. 24, top left of the I (in-phase)-Q (quadrature (-phase)) plane in FIG. 22, and bottom left of the I (in-phase)-Q (quadrature(-phase)) plane in FIG. 23, Euclidian distances between any pairs of signal points that are the closest to each other are equal. As a result, the reception device is likely to obtain high reception quality.

When the precoding matrix F is set to the precoding matrix F in any of formulas S261, S262, S263, and S264, and $\alpha$ is set to $\alpha$ in any of formulas S265, S266, S267, and S268, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 25, 26, 27, and 28 similarly to the above. In FIGS. 25, 26, 27, and 28, the horizontal and vertical axes respectively represent I and Q, black circles represent the signal points, and a triangle represents the origin (0).

As can be seen from FIGS. 25, 26, 27, and 28, 1024 signal points exist without overlapping one another. As a result, the reception device is likely to obtain high reception quality.

The minimum Euclidian distance between 16384 signal points in FIGS. 21, 22, 23, and 24 is represented by $D_1$, and the minimum Euclidian distance between 16384 signal points in FIGS. 25, 26, 27, and 28 is represented by $D_2$. In this case, $D_1>D_2$ is satisfied. Accordingly, as described in Configuration Example R1, it is desirable that $Q_1>Q_2$ be satisfied when $Q_1\neq Q_2$ is satisfied in formulas S2, S3, S4, S5, and S8.

Example 4-6

The following describes a case where formulas S224 and S225 are satisfied for the coefficients $w_{64}$ and $w_{256}$ described in the above-mentioned explanations on the mapping schemes for 64QAM and 256QAM, respectively, and the preceding matrix F used when calculation in the following cases is performed is set to the precoding matrix F in any of the following formulas.

<1> Case where $P_1^2=P_2^2$ is satisfied in formula S2
<2> Case where $P_1^2=P_2^2$ is satisfied in formula S3
<3> Case where $P_1^2=P_2^2$ is satisfied in formula S4
<4> Case in formula S5
<5> Case in formula S8

[Math. 308]

$$F=\begin{pmatrix}\beta\times\cos\theta & \beta\times\sin\theta\\ \beta\times\sin\theta & -\beta\times\cos\theta\end{pmatrix} \quad \text{(formula S269)}$$

or

[Math. 309]

$$F=\begin{pmatrix}\cos\theta & \sin\theta\\ \sin\theta & -\cos\theta\end{pmatrix} \quad \text{(formula S270)}$$

or

[Math. 310]

$$F=\begin{pmatrix}\beta\times\cos\theta & -\beta\times\sin\theta\\ \beta\times\sin\theta & \beta\times\cos\theta\end{pmatrix} \quad \text{(formula S271)}$$

or

[Math. 311]

$$F=\begin{pmatrix}\cos\theta & -\sin\theta\\ \sin\theta & \cos\theta\end{pmatrix} \quad \text{(formula S272)}$$

In formulas S269 and S271, $\beta$ may be either a real number or an imaginary number. However, $\beta$ is not 0 (zero).

In this case, values of $\theta$ that allow the reception device to obtain high data reception quality are considered.

First, the values of $\theta$ that allow the reception device to obtain high data reception quality when attention is focused on the signal $z_1(t)$ ($z_1(i)$) in formulas S2, S3, S4, S5, and S8 are as follows.

[Math. 312]

$$\theta=\tan^{-1}\left(\frac{\sqrt{42}}{\sqrt{170}}\times\frac{9}{8}\right) \text{ or } \tan^{-1}\left(\frac{\sqrt{42}}{\sqrt{170}}\times\frac{9}{8}\right)+2n\pi \text{ (radian)} \quad \text{(formula S273)}$$

or

[Math. 313]

$$\theta=\pi+\tan^{-1}\left(\frac{\sqrt{42}}{\sqrt{170}}\times\frac{9}{8}\right) \text{ or } \pi+\tan^{-1}\left(\frac{\sqrt{42}}{\sqrt{170}}\times\frac{9}{8}\right)+2n\pi \text{ (radian)} \quad \text{(formula S274)}$$

or

[Math. 314]

$$\theta=\tan^{-1}\left(-\frac{\sqrt{42}}{\sqrt{170}}\times\frac{9}{8}\right) \text{ or } \tan^{-1}\left(-\frac{\sqrt{42}}{\sqrt{170}}\times\frac{9}{8}\right)+2n\pi \text{ (radian)} \quad \text{(formula S275)}$$

or

[Math. 315]

$$\theta=\pi+\tan^{-1}\left(-\frac{\sqrt{42}}{\sqrt{170}}\times\frac{9}{8}\right) \text{ or } \pi+\tan^{-1}\left(-\frac{\sqrt{42}}{\sqrt{170}}\times\frac{9}{8}\right)+2n\pi \text{ (radian)} \quad \text{(formula S276)}$$

In formulas S273, S274, S275, and S276, $\tan^{-1}(x)$ is an inverse trigonometric function (an inverse function of the trigonometric function with appropriately restricted domains), and satisfies the following formula.

[Math. 316]

$$-\frac{\pi}{2} \text{ (radian)} < \tan^{-1}(x) < \frac{\pi}{2} \text{ (radian)} \quad \text{(formula S277)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S269, S270, S271, and S272, and $\theta$ is set to $\theta$ in any of formulas S273, S274, S275, and S276, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 21, 22, 23, and 24 similarly to the above. In FIGS. 21, 22, 23, and 24, the horizontal and vertical axes respectively represent I and Q, black circles represent the signal points, and a triangle represents the origin (0).

As can be seen from FIGS. 21, 22, 23, and 24, 16384 signal points exist without overlapping one another. Furthermore, as for 16380 signal points, from among 16384 signal points, excluding four signal points located at the top right of the I (in-phase)-Q (quadrature(-phase)) plane in FIG. 21, bottom right of the I (in-phase)-Q (quadrature(-phase)) plane in FIG. 24, top left of the I (in-phase)-Q (quadrature (-phase)) plane in FIG. 22, and bottom left of the I (in-phase)-Q (quadrature(-phase)) plane in FIG. 23, Euclidian distances between any pairs of signal points that are the closest to each other are equal. As a result, the reception device is likely to obtain high reception quality.

When the precoding matrix F is set to the precoding matrix F in any of formulas S269, S270, S271, and S272, and θ is set to θ in any of formulas S273, S274, S275, and S276, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 25, 26, 27, and 28 similarly to the above. In FIGS. 25, 26, 27, and 28, the horizontal and vertical axes respectively represent I and Q, black circles represent the signal points, and a triangle represents the origin (0).

As can be seen from FIGS. 25, 26, 27, and 28, 1024 signal points exist without overlapping one another. As a result, the reception device is likely to obtain high reception quality.

The minimum Euclidian distance between 16384 signal points in FIGS. 21, 22, 23, and 24 is represented by $D_1$, and the minimum Euclidian distance between 16384 signal points in FIGS. 25, 26, 27, and 28 is represented by $D_2$. In this case, $D_1>D_2$ is satisfied. Accordingly, as described in Configuration Example R1, it is desirable that $Q_1>Q_2$ be satisfied when $Q_1\neq Q_2$ is satisfied in formulas S2, S3, S4, S5, and S8.

Example 4-7

The following describes a case where formulas S224 and S225 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

[Math. 317]

$$F=\begin{pmatrix}\beta\times e^{j0} & \beta\times\alpha\times e^{j0}\\ \beta\times\alpha\times e^{j0} & \beta\times e^{j\pi}\end{pmatrix} \quad \text{(formula S278)}$$

or

-continued

[Math. 318]

$$F=\frac{1}{\sqrt{\alpha^2+1}}\begin{pmatrix}e^{j0} & \alpha\times e^{j0}\\ \alpha\times e^{j0} & e^{j\pi}\end{pmatrix} \quad \text{(formula S279)}$$

or

[Math. 319]

$$F=\begin{pmatrix}\beta\times e^{j0} & \beta\times\alpha\times e^{j\pi}\\ \beta\times\alpha\times e^{j0} & \beta\times e^{j0}\end{pmatrix} \quad \text{(formula S280)}$$

or

[Math. 320]

$$F=\frac{1}{\sqrt{\alpha^2+1}}\begin{pmatrix}e^{j0} & \alpha\times e^{j\pi}\\ \alpha\times e^{j0} & e^{j0}\end{pmatrix} \quad \text{(formula S281)}$$

In formulas S278, S279, S280, and S281, α may be either a real number or an imaginary number, and β may be either a real number or an imaginary number. However, α is not 0 (zero). Similarly, β is not 0 (zero).

In this case, values of α that allow the reception device to obtain high data reception quality are considered.

The values of α that allow the reception device to obtain high data reception quality when attention is focused on the signal $z_1(t)$ ($z_1(i)$) in formulas S2, S3, S4, S5, and S8 are as follows.

When α is a real number:

[Math. 321]

$$\alpha=\frac{\sqrt{42}}{\sqrt{170}}\times\frac{8}{9} \quad \text{(formula S282)}$$

or

[Math. 322]

$$\alpha=-\frac{\sqrt{42}}{\sqrt{170}}\times\frac{8}{9} \quad \text{(formula S283)}$$

When α is an imaginary number:

[Math. 323]

$$\alpha=\frac{\sqrt{42}}{\sqrt{170}}\times\frac{8}{9}\times e^{j\frac{\pi}{2}} \quad \text{(formula S284)}$$

or

[Math. 324]

$$\alpha=\frac{\sqrt{42}}{\sqrt{170}}\times\frac{8}{9}\times e^{j\frac{3\pi}{2}} \quad \text{(formula S285)}$$

When the precoding matrix F is set to the precoding matrix F in any of formulas S278, S279, S280, and S281, and α is set to α in any of formulas S282, S283, S284, and S285, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 29, 30, 31, and 32 similarly to the above. In FIGS. 29, 30, 31, and 32, the horizontal and vertical axes respectively represent I and Q, black circles represent the signal points, and a triangle represents the origin (0).

As can be seen from FIGS. 29, 30, 31, and 32, 16384 signal points exist without overlapping one another. Furthermore, as for 16380 signal points, from among 16384 signal points, excluding four signal points located at the top right of the I (in-phase)-Q (quadrature(-phase)) plane in FIG. 29, bottom right of the I (in-phase)-Q (quadrature(-phase)) plane in FIG. 32, top left of the I (in-phase)-Q (quadrature (-phase)) plane in FIG. 30, and bottom left of the I (in-phase)-Q (quadrature(-phase)) plane in FIG. 31, Euclidian distances between any pairs of signal points that are the closest to each other are equal. As a result, the reception device is likely to obtain high reception quality.

When the precoding matrix F is set to the precoding matrix F in any of formulas S278, S279, S280, and S281, and α is set to α in any of formulas S282, S283, S284, and S285, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 33, 34, 35, and 36 similarly to the above. In FIGS. 33, 34, 35, and 36, the horizontal and vertical axes respectively represent I and Q, black circles represent the signal points, and a triangle represents the origin (0).

As can be seen from FIGS. 33, 34, 35, and 36, 1024 signal points exist without overlapping one another. As a result, the reception device is likely to obtain high reception quality.

The minimum Euclidian distance between 16384 signal points in FIGS. 29, 30, 31, and 32 is represented by $D_1$, and the minimum Euclidian distance between 16384 signal points in FIGS. 33, 34, 35, and 36 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 4-8

The following describes a case where formulas S224 and S225 are satisfied for the coefficients $w_{64}$ and $w_{256}$ described in the above-mentioned explanations on the mapping schemes for 64QAM and 256QAM, respectively, and the precoding matrix F used when calculation in the following cases is performed is set to the precoding matrix F in any of the following formulas.

<1> Case where $P_1^2=P_1^2$ is satisfied in formula S2
<2> Case where $P_1^2=P_1^2$ is satisfied in formula S3
<3> Case where $P_1^2=P_1^2$ is satisfied in formula S4
<4> Case in formula S5
<5> Case in formula S8

[Math. 325]

$$F=\begin{pmatrix}\beta\times\cos\theta & \beta\times\sin\theta\\ \beta\times\sin\theta & -\beta\times\cos\theta\end{pmatrix} \qquad \text{(formula S286)}$$

or

-continued

[Math. 326]

$$F=\begin{pmatrix}\cos\theta & \sin\theta\\ \sin\theta & -\cos\theta\end{pmatrix} \qquad \text{(formula S287)}$$

or

[Math. 327]

$$F=\begin{pmatrix}\beta\times\cos\theta & -\beta\times\sin\theta\\ \beta\times\sin\theta & \beta\times\cos\theta\end{pmatrix} \qquad \text{(formula S288)}$$

or

[Math. 328]

$$F=\begin{pmatrix}\cos\theta & -\sin\theta\\ \sin\theta & \cos\theta\end{pmatrix} \qquad \text{(formula S289)}$$

In formulas S286 and S288, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_1(t)$ ($z_1(i)$) in formulas S2, S3, S4, S5, and S8 are as follows.

[Math. 329]

$$\theta=\tan^{-1}\left(\frac{\sqrt{42}}{\sqrt{170}}\times\frac{8}{9}\right) \text{ or } \tan^{-1}\left(\frac{\sqrt{42}}{\sqrt{170}}\times\frac{8}{9}\right)+2n\pi \text{ (radian)} \qquad \text{(formula S290)}$$

or

[Math. 330]

$$\theta=\pi+\tan^{-1}\left(\frac{\sqrt{42}}{\sqrt{170}}\times\frac{8}{9}\right) \text{ or } \pi+\tan^{-1}\left(\frac{\sqrt{42}}{\sqrt{170}}\times\frac{8}{9}\right)+2n\pi \text{ (radian)} \qquad \text{(formula S291)}$$

or

[Math. 331]

$$\theta=\tan^{-1}\left(-\frac{\sqrt{42}}{\sqrt{170}}\times\frac{8}{9}\right) \text{ or } \tan^{-1}\left(-\frac{\sqrt{42}}{\sqrt{170}}\times\frac{8}{9}\right)+2n\pi \text{ (radian)} \qquad \text{(formula S292)}$$

or

[Math. 332]

$$\theta=\pi+\tan^{-1}\left(-\frac{\sqrt{42}}{\sqrt{170}}\times\frac{8}{9}\right) \text{ or } \pi+\tan^{-1}\left(-\frac{\sqrt{42}}{\sqrt{170}}\times\frac{8}{9}\right)+2n\pi \text{ (radian)} \qquad \text{(formula S293)}$$

In formulas S290, S291, S292, and S293, $\tan^{-1}(x)$ is an inverse trigonometric function (an inverse function of the trigonometric function with appropriately restricted domains), and satisfies the following formula.

[Math. 333]

$$-\frac{\pi}{2}\text{ (radian)} < \tan^{-1}(x) < \frac{\pi}{2}\text{ (radian)} \quad \text{(formula S294)}$$

Further, "$\tan^{-1}(x)$" may be expressed as "$\mathrm{Tan}^{-1}(x)$", "arctan(x)", and "Arctan(x)". Note that n is an integer.

When the precoding matrix F is set to the precoding matrix F in any of formulas S286, S287, S288, and S289, and θ is set to θ in any of formulas S290, S291, S292, and S293, concerning the signal $u_1(t)$ ($u_1(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 29, 30, 31, and 32 similarly to the above. In FIGS. 29, 30, 31, and 32, the horizontal and vertical axes respectively represent I and Q, black circles represent the signal points, and a triangle represents the origin (0).

As can be seen from FIGS. 29, 30, 31, and 32, 16384 signal points exist without overlapping one another. Furthermore, as for 16380 signal points, from among 16384 signal points, excluding four signal points located at the top right of the I (in-phase)-Q (quadrature(-phase)) plane in FIG. 29, bottom right of the I (in-phase)-Q (quadrature(-phase)) plane in FIG. 32, top left of the I (in-phase)-Q (quadrature (-phase)) plane in FIG. 30, and bottom left of the I (in-phase)-Q (quadrature(-phase)) plane in FIG. 31, Euclidian distances between any pairs of signal points that are the closest to each other are equal. As a result, the reception device is likely to obtain high reception quality.

When the precoding matrix F is set to the precoding matrix F in any of formulas S286, S287, S288, and S289, and θ is set to θ in any of formulas S290, S291, S292, and S293, concerning the signal $u_2(t)$ ($u_2(i)$) described in Configuration Example R1, from among signal points corresponding to ($b_{0,64}$, $b_{1,64}$, $b_{2,64}$, $b_{3,64}$, $b_{4,64}$, $b_{5,64}$, $b_{0,256}$, $b_{1,256}$, $b_{2,256}$, $b_{3,256}$, $b_{4,256}$, $b_{5,256}$, $b_{6,256}$, $b_{7,256}$), signal points existing in the first, second, third, and fourth quadrants are respectively arranged in the I (in-phase)-Q (quadrature(-phase)) plane as shown in FIGS. 33, 34, 35, and 36 similarly to the above. In FIGS. 33, 34, 35, and 36, the horizontal and vertical axes respectively represent I and Q, black circles represent the signal points, and a triangle represents the origin (0).

As can be seen from FIGS. 33, 34, 35, and 36, 1024 signal points exist without overlapping one another. As a result, the reception device is likely to obtain high reception quality.

The minimum Euclidian distance between 16384 signal points in FIGS. 29, 30, 31, and 32 is represented by $D_1$, and the minimum Euclidian distance between 16384 signal points in FIGS. 33, 34, 35, and 36 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 4

Supplemental Remarks

Examples of the values of α and θ that allow for obtaining high data reception quality are shown in Example 4-1 to Example 4-8. Even when the values of α and θ are not equal to the values shown in these examples, however, high data reception quality can be obtained by satisfying the conditions shown in Configuration Example R1.

(Modifications)

The following describes precoding schemes as modifications to Example 1 to Example 4. A case where, in FIG. 5, the baseband signal 511A ($z_1(t)$ ($z_1(i)$)) and the baseband signal 511B ($z_2(t)$ ($z_2(i)$)) are expressed by either of the following formulas is considered.

[Math. 334]

$$\begin{pmatrix} z_1(i) \\ z_2(i) \end{pmatrix} = \begin{pmatrix} Q_1 & 0 \\ 0 & Q_2 \end{pmatrix} \begin{pmatrix} \beta\times e^{j\theta_{11}(i)} & \beta\times\alpha\times e^{j(\theta_{11}(i)+\lambda)} \\ \beta\times\alpha\times e^{j\theta_{21}(i)} & \beta\times e^{j(\theta_{21}(i)+\lambda+\pi)} \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S295)}$$

[Math. 335]

$$\begin{pmatrix} z_1(i) \\ z_2(i) \end{pmatrix} = \begin{pmatrix} Q_1 & 0 \\ 0 & Q_2 \end{pmatrix} \frac{1}{\sqrt{\alpha^2+1}} \begin{pmatrix} e^{j\theta_{11}(i)} & \alpha\times e^{j(\theta_{11}(i)+\lambda)} \\ \alpha\times e^{j\theta_{21}(i)} & e^{j(\theta_{21}(i)+\lambda+\pi)} \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S296)}$$

However, $\theta_{11}(i)$ and $\theta_{21}(i)$ are each the function of i (time or frequency), λ is a fixed value, α may be either a real number or an imaginary number, and β may be either a real number or an imaginary number. However, α is not 0 (zero). Similarly, β is not 0 (zero).

As a modification to Example 1, similar effects to those obtained in Example 1 can be obtained when 16QAM and 64QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, formulas S11 and S12 are satisfied for the coefficients $w_{16}$ and $w_{64}$ described in the above-mentioned explanations on the mapping schemes for 16QAM and 64QAM, and any of the following conditions is satisfied:

The value of α in any of formulas S18, S19, S20, and S21 is used as a value of α in formulas S295 and S296, and $Q_1>Q_2$ is satisfied;

The value of α in any of formulas S35, S36, S37, and S38 is used as a value of α in formulas S295 and S296, and $Q_1>Q_2$ is satisfied;

The value of α in any of formulas S52, S53, S54, and S55 is used as a value of α in formulas S295 and S296, and $Q_1<Q_2$ is satisfied; or The value of α in any of formulas S69, S70, S71, and S72 is used as a value of α in formulas S295 and S296, and $Q_1<Q_2$ is satisfied.

As a modification to Example 2, similar effects to those obtained in Example 2 can be obtained when 64QAM and 16QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, formulas S82 and S83 are satisfied for the coefficients $w_{16}$ and $w_{64}$ described in the above-mentioned explanations on the mapping schemes for 16QAM and 64QAM, and any of the following conditions is satisfied:

The value of α in any of formulas S89, S90, S91, and S92 is used as a value of α in formulas S295 and S296, and $Q_1<Q_2$ is satisfied;

The value of α in any of formulas S106, S107, S108, and S109 is used as a value of α in formulas S295 and S296, and $Q_1<Q_2$ is satisfied;

The value of α in any of formulas S123, S124, S125, and S126 is used as a value of α in formulas S295 and S296, and $Q_1>Q_2$ is satisfied; or The value of α in any of formulas S140, S141, S142, and S143 is used as a value of α in formulas S295 and S296, and $Q_1>Q_2$ is satisfied.

As a modification to Example 3, similar effects to those obtained in Example 3 can be obtained when 64QAM and 256QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, formulas S153 and S154 are satisfied for the coefficients $w_6$ and $w_{23}$ described in the above-mentioned explanations on the mapping schemes for 64QAM and 256QAM, and any of the following conditions is satisfied:

The value of α in any of formulas S160, S161, S162, and S163 is used as a value of α in formulas S295 and S296, and $Q_1>Q_2$ is satisfied;

The value of α in any of formulas S177, S178, S179, and S180 is used as a value of α in formulas S295 and S296, and $Q_1>Q_2$ is satisfied;

The value of α in any of formulas S194, S195, S196, and S197 is used as a value of α in formulas S295 and S296, and $Q_1<Q_2$ is satisfied; or The value of α in any of formulas S211, S212, S213, and S214 is used as a value of α in formulas S295 and S296, and $Q_1<Q_2$ is satisfied.

As a modification to Example 4, similar effects to those obtained in Example 4 can be obtained when 256QAM and 64QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, formulas S224 and S225 are satisfied for the coefficients $w_{64}$, and $w_{256}$ described in the above-mentioned explanations on the mapping schemes for 64QAM and 256QAM, and any of the following conditions is satisfied:

The value of α in any of formulas S231, S232, S233, and S234 is used as a value of α in formulas S295 and S296, and $Q_1<Q_2$ is satisfied;

The value of α in any of formulas S248, S249, S250, and S251 is used as a value of α in formulas S295 and S296, and $Q_1<Q_2$ is satisfied;

The value of α in any of formulas S265, S266, S267, and S268 is used as a value of α in formulas S295 and S296, and $Q_1>Q_2$ is satisfied; or A value of α in any of formulas S282, S283, S284, and S285 is used as a value of α in formulas S295 and S296, and $Q_1>Q_2$ is satisfied.

Examples of the values of α and θ that allow for obtaining high data reception quality are shown in Modifications above. Even when the values of α and θ are not equal to the values shown in these modifications, however, high data reception quality can be obtained by satisfying the conditions shown in Configuration Example R1.

The following describes examples different from Examples 1 to 4 and Modifications thereto.

Example 5

In the following description, in the mapper 504 in FIGS. 5-7, 16QAM and 64QAM are applied as a modulation scheme for obtaining $s_1(t)$ ($s_1(i)$) and a modulation scheme for obtaining $s_2(t)$ ($s_2(i)$), respectively. The following describes examples of the structure of the precoding matrix (F) and conditions regarding power change when precoding shown in any of formulas S2, S3, S4, S5, and S8 and/or power change are/is performed.

A mapping scheme for 16QAM is described first below. FIG. 10 shows an example of signal point constellation for 16QAM in the I (in-phase)-Q (quadrature(-phase)) plane. In FIG. 10, 16 circles represent signal points for 16QAM, and the horizontal and vertical axes respectively represent I and Q.

Coordinates of the 16 signal points (i.e., the circles in FIG. 10) for 16QAM in the I (in-phase)-Q (quadrature(-phase)) plane are $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16},3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$, where $w_{16}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to the signal point 1001 in FIG. 10. When an in-phase component and a quadrature component of the baseband signal obtained as a result of mapping are respectively represented by I and Q, (I, Q)=$(3w_{16}, 3w_{16})$ is satisfied.

That is to say, the in-phase component I and the quadrature component Q of the baseband signal obtained as a result of mapping (at the time of using 16QAM) are determined based on the transmitted bits (b0, b1, b2, b3). One example of a relationship between values (0000-1111) of a set of b0, b1, b2, and b3 and coordinates of signal points is as shown in FIG. 10. The values 0000-1111 of the set of b0, b1, b2, and b3 are shown directly below the 16 signal points (i.e., the circles in FIG. 10) for 16QAM, which are $(3w_{16},3w_{16})$, $(3w_{16},w_{16})$, $(3w_{16},-w_{16})$, $(3w_{16},-3w_{16})$, $(w_{16},3w_{16})$, $(w_{16},w_{16})$, $(w_{16},-w_{16})$, $(w_{16},-3w_{16})$, $(-w_{16}3w_{16})$, $(-w_{16},w_{16})$, $(-w_{16},-w_{16})$, $(-w_{16},-3w_{16})$, $(-3w_{16},3w_{16})$, $(-3w_{16},w_{16})$, $(-3w_{16},-w_{16})$, and $(-3w_{16},-3w_{16})$. Coordinates, in the I (in-phase)-Q (quadrature(-phase)) plane, of the signal points (i.e., the circles) directly above the values 0000-1111 of the set of b0, b1, b2, and b3 indicate the in-phase component I and the quadrature component Q of the baseband signal obtained as a result of mapping. The relationship between the values (0000-1111) of the set of b0, b1, b2, and b3 for 16QAM and coordinates of signal points is not limited to that shown in FIG. 10. Values obtained by expressing the in-phase component I and the quadrature component Q of the baseband signal obtained as a result of mapping (at the time of using 16QAM) in complex numbers correspond to the baseband signal ($s_1(t)$ or $s_2(t)$) in FIGS. 5-7.

A mapping scheme for 64QAM is described below. FIG. 11 shows an example of signal point constellation for 64QAM in the I (in-phase)-Q (quadrature(-phase)) plane. In FIG. 11, 64 circles represent signal points for 64QAM, and the horizontal and vertical axes respectively represent I and Q.

Coordinates of the 64 signal points (i.e., the circles in FIG. 11) for 64QAM in the I (in-phase)-Q (quadrature(-phase)) plane are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$,
$(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$,
$(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$,
$(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$, $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$, $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$, $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$, $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$, where $w_{64}$ is a real number greater than 0.

Here, transmitted bits (input bits) are represented by b0, b1, b2, b3, b4, and b5. For example, when (b0, b1, b2, b3, b4, b5)=(0, 0, 0, 0, 0, 0) for the transmitted bits, mapping is performed to a signal point 1101 in FIG. 11. When an in-phase component and a quadrature component of the baseband signal obtained as a result of mapping are respectively represented by I and Q, $(I, Q)=(7w_{64}, 7w_{64})$ is satisfied.

That is to say, the in-phase component I and the quadrature component Q of the baseband signal obtained as a result of mapping (at the time of using 64QAM) are determined based on the transmitted bits (b0, b1, b2, b3, b4, b5). One example of a relationship between values (000000-111111) of a set of b0, b1, b2, b3, b4, and b5 and coordinates of signal points is as shown in FIG. 11. The values 000000-111111 of the set of b0, b1, b2, b3, b4, and b5 are shown directly below the 64 signal points (i.e., the circles in FIG. 11) for 64QAM, which are $(7w_{64},7w_{64})$, $(7w_{64},5w_{64})$, $(7w_{64},3w_{64})$, $(7w_{64},w_{64})$, $(7w_{64},-w_{64})$, $(7w_{64},-3w_{64})$, $(7w_{64},-5w_{64})$, $(7w_{64},-7w_{64})$, $(5w_{64},7w_{64})$, $(5w_{64},5w_{64})$, $(5w_{64},3w_{64})$, $(5w_{64},w_{64})$, $(5w_{64},-w_{64})$, $(5w_{64},-3w_{64})$, $(5w_{64},-5w_{64})$, $(5w_{64},-7w_{64})$, $(3w_{64},7w_{64})$, $(3w_{64},5w_{64})$, $(3w_{64},3w_{64})$, $(3w_{64},w_{64})$, $(3w_{64},-w_{64})$, $(3w_{64},-3w_{64})$, $(3w_{64},-5w_{64})$, $(3w_{64},-7w_{64})$, $(w_{64},7w_{64})$, $(w_{64},5w_{64})$, $(w_{64},3w_{64})$, $(w_{64},w_{64})$, $(w_{64},-w_{64})$, $(w_{64},-3w_{64})$, $(w_{64},-5w_{64})$, $(w_{64},-7w_{64})$, $(-w_{64},7w_{64})$, $(-w_{64},5w_{64})$, $(-w_{64},3w_{64})$, $(-w_{64},w_{64})$, $(-w_{64},-w_{64})$, $(-w_{64},-3w_{64})$, $(-w_{64},-5w_{64})$, $(-w_{64},-7w_{64})$, $(-3w_{64},7w_{64})$, $(-3w_{64},5w_{64})$, $(-3w_{64},3w_{64})$, $(-3w_{64},w_{64})$, $(-3w_{64},-w_{64})$, $(-3w_{64},-w_{64})$, $(-3w_{64},-5w_{64})$, $(-3w_{64},-7w_{64})$, $(-5w_{64},7w_{64})$, $(-5w_{64},5w_{64})$, $(-5w_{64},3w_{64})$, $(-5w_{64},w_{64})$, $(-5w_{64},-w_{64})$, $(-5w_{64},-3w_{64})$, $(-5w_{64},-5w_{64})$, $(-5w_{64},-7w_{64})$, $(-7w_{64},7w_{64})$, $(-7w_{64},5w_{64})$, $(-7w_{64},3w_{64})$, $(-7w_{64},w_{64})$, $(-7w_{64},-w_{64})$, $(-7w_{64},-3w_{64})$, $(-7w_{64},-5w_{64})$, and $(-7w_{64},-7w_{64})$. Coordinates, in the I (in-phase)-Q (quadrature(-phase)) plane, of the signal points (i.e., the circles) directly above the values 000000-111111 of the set of b0, b1, b2, b3, b4, and b5 indicate the in-phase component I and the quadrature component Q of the baseband signal obtained as a result of mapping. The relationship between the values (000000-111111) of the set of b0, b1, b2, b3, b4, and b5 for 64QAM and coordinates of signal points is not limited to that shown in FIG. 11. Values obtained by expressing the in-phase component I and the quadrature component Q of the baseband signal obtained as a result of mapping (at the time of using 64QAM) in complex numbers correspond to the baseband signal ($s_1(t)$ or $s_2(t)$) in FIGS. 5-7.

This example shows the structure of the precoding matrix when 16QAM and 64QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, in FIGS. 5-7.

In this case, the baseband signal 505A ($s_1(t)$ ($s_1(i)$)) and the baseband signal 505B ($s_2(t)$ ($s_2(i)$)), which are outputs of the mapper 504 shown in FIGS. 5-7, are typically set to have an equal average power. Thus, formulas S11 and S12 are satisfied for the coefficients $w_{16}$ and $w_{64}$ described in the above-mentioned explanations on the mapping schemes for 16QAM and 64QAM, respectively. In formulas S11 and S12, z is a real number greater than 0. The following describes the structure of the precoding matrix F used when calculation in the following cases is performed, and the relationship between $Q_1$ and $Q_2$.

<1> Case where $P_1^2=P_1^2$ is satisfied in formula S2

<2> Case where $P_1^2=P_1^2$ is satisfied in formula S3

<3> Case where $P_1^2=P_1^2$ is satisfied in formula S4

<4> Case in formula S5

<5> Case in formula S8

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of formulas S22, S23, S24, and S25.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

In formulas S22 and S24, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_1(t)$ ($z_1(i)$) in formulas S2, S3, S4, S5, and S8 are as follows.

[Math. 336]

$$\theta = 15 \text{ or } 15 + 360 \times n \text{ (degree)} \quad \text{(formula S297)}$$

or

[Math. 337]

$$\begin{aligned}\theta &= 180 + 15 \\ &= 195 \\ &\text{or } 195 + 360 \times n \text{ (degree)}\end{aligned} \quad \text{(formula S298)}$$

or

[Math. 338]

$$\theta = -15 \text{ or } -15 + 360 \times n \text{ (degree)} \quad \text{(formula S299)}$$

or

[Math. 339]

$$\begin{aligned}\theta &= 180 - 15 \\ &= 165 \\ &\text{or } 165 + 360 \times n \text{ (degree)}\end{aligned} \quad \text{(formula S300)}$$

Note that n is an integer.

Figure 55:
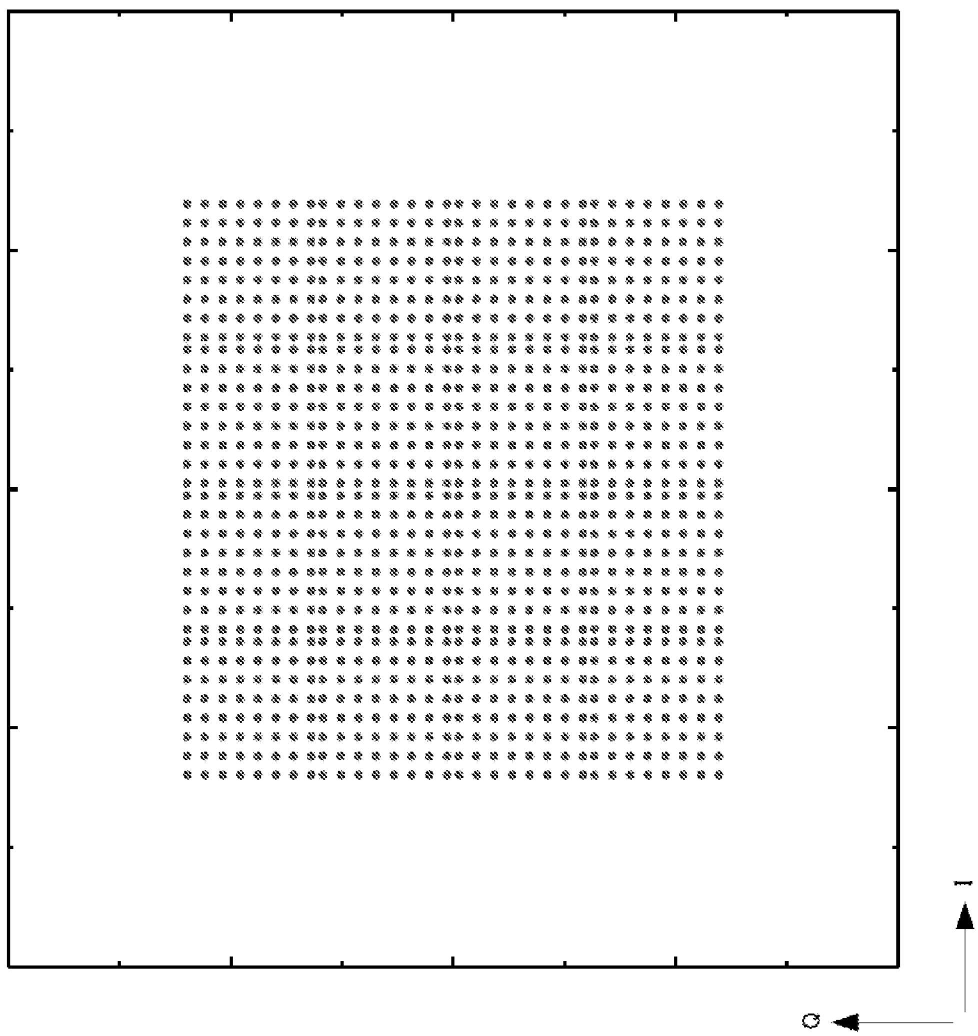
FIG. 55 shows an example of constellation of signal points in the I-Q plane.

When the precoding matrix F is set to the precoding matrix F in any of formulas S22, S23, S24, and S25, and θ is set to θ in any of formulas S297, S298, S299, and S300, concerning the signal $u_1(t)$ ($u_1(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 55 similarly to the above. In FIG. 55, the horizontal and vertical axes respectively represent I and Q, and black circles represent the signal points.

As can be seen from FIG. 55, 1024 signal points exist without overlapping one another. As a result, the reception device is likely to obtain high reception quality.

Figure 56:
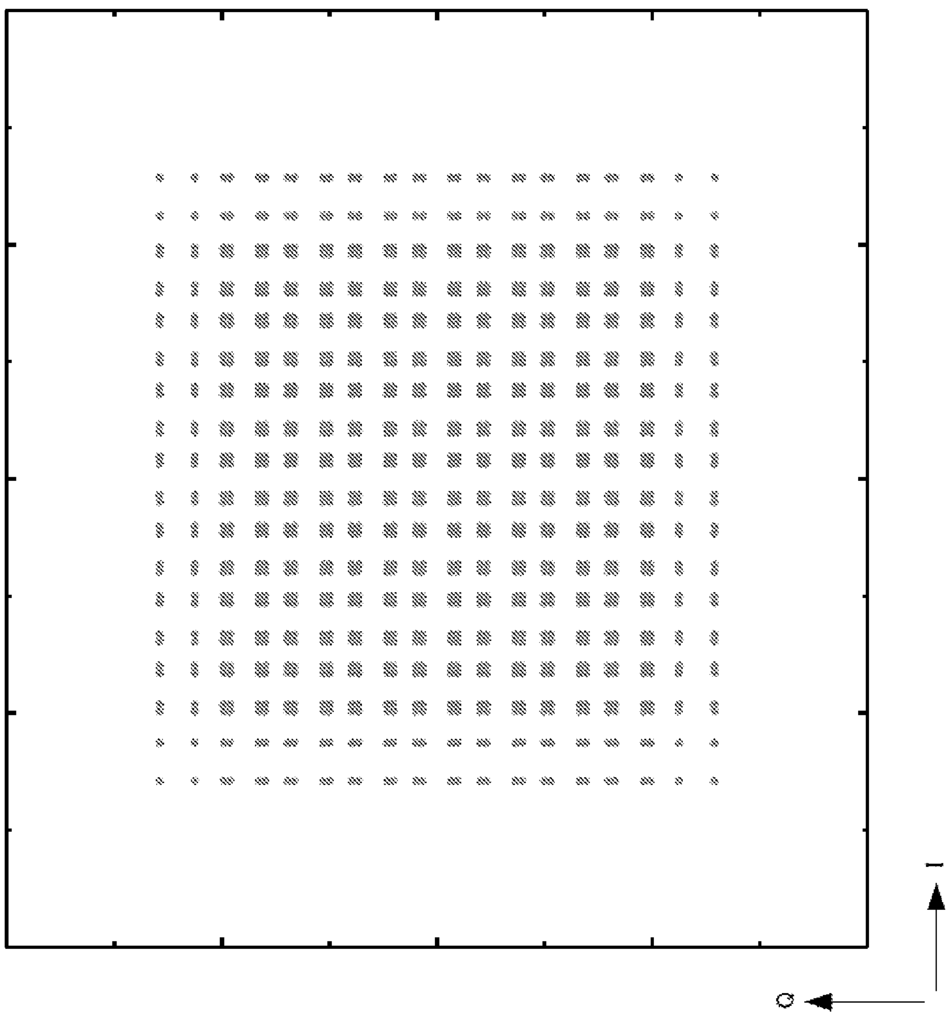
FIG. 56 shows an example of constellation of signal points in the I-Q plane.

When the precoding matrix F is set to the precoding matrix F in any of formulas S22, S23, S24, and S25, and θ is set to θ in any of formulas S297, S298, S299, and S300, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 56 similarly to the above. In FIG. 56, the horizontal and vertical axes respectively represent I and Q, and black circles represent the signal points.

As can be seen from FIG. 56, 1024 signal points exist without overlapping one another. As a result, the reception device is likely to obtain high reception quality.

The minimum Euclidian distance between 1024 signal points in FIG. 55 is represented by $D_1$, and the minimum Euclidian distance between 1024 signal points in FIG. 56 is represented by $D_2$. In this case, $D_1>D_2$ is satisfied. Accordingly, as described in Configuration Example R1, it is desirable that $Q_1>Q_2$ be satisfied when $Q_1 \neq Q_2$ is satisfied in formulas S2, S3, S4, S5, and S8.

Example 5

Supplemental Remarks

Examples of the value of θ that allows for obtaining high data reception quality are shown in the above-mentioned example. Even when the value of θ is not equal to the value shown in the above-mentioned example, however, high data reception quality can be obtained by satisfying the conditions shown in Configuration Example R1.

Example 6

In the following description, in the mapper 504 in FIGS. 5-7, 64QAM and 16QAM are applied as a modulation scheme for obtaining $s_1(t)$ ($s_1(i)$) and a modulation scheme for obtaining $s_2(t)$ ($s_2(i)$), respectively. The following describes examples of the structure of the precoding matrix (F) and conditions regarding power change when precoding shown in any of formulas S2, S3, S4, S5, and S8 and/or power change are/is performed.

A mapping scheme for 16QAM is described first below. FIG. 10 shows an example of signal point constellation for 16QAM in the I (in-phase)-Q (quadrature(-phase)) plane. In FIG. 10, 16 circles represent signal points for 16QAM, and the horizontal and vertical axes respectively represent I and Q.

Coordinates of the 16 signal points (i.e., the circles in FIG. 10) for 16QAM in the I (in-phase)-Q (quadrature(-phase)) plane are ($3w_{16}$,$3w_{16}$), ($3w_{16}$,$w_{16}$), ($3w_{16}$,$-w_{16}$), ($3w_{16}$,$-3w_{16}$), ($w_{16,3}w_{16}$), ($w_{16}$,$w_{16}$), ($w_{16}$,$-w_{16}$), ($w_{16}$,$-3w_{16}$), ($-w_{16}$,$3w_{16}$), ($-w_{16}$,$w_{16}$), ($-w_{16}$,$-w_{16}$), ($-w_{16}$,$-3w_{16}$), ($-3w_{6,3}w_{16}$), ($-3w_{16}$,$w_{16}$), ($-3w_{16}$,$-w_{16}$), and ($-3w_{16}$, $-3w_{16}$), where $w_{16}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to the signal point 1001 in FIG. 10. When an in-phase component and a quadrature component of the baseband signal obtained as a result of mapping are respectively represented by I and Q, (I, Q)=($3w_{16}$, $3w_{16}$) is satisfied.

That is to say, the in-phase component I and the quadrature component Q of the baseband signal obtained as a result of mapping (at the time of using 16QAM) are determined based on the transmitted bits (b0, b1, b2, b3). One example of a relationship between values (0000-1111) of a set of b0, b1, b2, and b3 and coordinates of signal points is as shown in FIG. 10. The values 0000-1111 of the set of b0, b1, b2, and b3 are shown directly below the 16 signal points (i.e., the circles in FIG. 10) for 16QAM, which are ($3w_{16}$,$3w_{16}$), ($3w_{16}$,$w_{16}$), ($3w_{16}$,$-w_{16}$), ($3w_{16}$,$-3w_{16}$), ($w_{16}$,$3w_{16}$), ($w_{16}$, $w_{16}$), ($w_{16}$$-w_{16}$), ($w_{16}$,$-3w_{16}$), ($-w_{16}$,$-3w_{16}$), ($-w_{16}$,$w_{16}$), ($-w_{16}$,$-w_{16}$), ($-w_{16}$,$-3w_{16}$), ($-3w_{16}$,$3w_{16}$), ($-3w_{16}$,$w_{16}$), ($-3w_{16}$,$-w_{16}$), and ($-3w_{16}$,$-3w_{16}$). Coordinates, in the I (in-phase)-Q (quadrature(-phase)) plane, of the signal points (i.e., the circles) directly above the values 0000-1111 of the set of b0, b1, b2, and b3 indicate the in-phase component I and the quadrature component Q of the baseband signal obtained as a result of mapping. The relationship between the values (0000-1111) of the set of b0, b1, b2, and b3 for 16QAM and coordinates of signal points is not limited to that shown in FIG. 10. Values obtained by expressing the in-phase component I and the quadrature component Q of the baseband signal obtained as a result of mapping (at the time of using 16QAM) in complex numbers correspond to the baseband signal ($s_1(t)$ or $s_2(t)$) in FIGS. 5-7.

A mapping scheme for 64QAM is described below. FIG. 11 shows an example of signal point constellation for 64QAM in the I (in-phase)-Q (quadrature(-phase)) plane. In FIG. 11, 64 circles represent signal points for 64QAM, and the horizontal and vertical axes respectively represent I and Q.

Coordinates of the 64 signal points (i.e., the circles in FIG. 11) for 64QAM in the I (in-phase)-Q (quadrature(-phase)) plane are ($7w_{64}$,$7w_{64}$), ($7w_{64}$,$5w_{64}$), ($7w_{64}$,$3w_{64}$), ($7w_{64}$,$w_{64}$), ($7w_{64}$, $-w_{64}$), ($7w_{64}$,$-3w_{64}$), ($7w_{64}$,$-5w_{64}$), ($7w_{64}$,$-7w_{64}$),
($5w_{64}$,$7w_{64}$), ($5w_{64}$,$5w_{64}$), ($5w_{64}$,$3w_{64}$), ($5w_{64}$,$w_{64}$), ($5w_{64}$,$-w_{64}$), ($5w_{64}$,$-3w_{64}$), ($5w_{64}$,$-5w_{64}$), ($5w_{64}$,$-7w_{64}$),
($3w_{64}$,$7w_{64}$), ($3w_{64}$,$5w_{64}$), ($3w_{64}$,$3w_{64}$), ($3w_{64}$,$w_{64}$), ($3w_{64}$,$-w_{64}$), ($3w_{64}$,$-3w_{64}$), ($3w_{64}$,$-5w_{64}$), ($3w_{64}$,$-7w_{64}$),
($w_{64}$,$7w_{64}$), ($w_{64}$,$5w_{64}$), ($w_{64}$,$3w_{64}$), ($w_{64}$,$w_{64}$), ($w_{64}$,$-w_{64}$), ($w_{64}$,$-3w_{64}$), ($w_{64}$,$-5w_{64}$), ($w_{64}$,$-7w_{64}$),
($-w_{64}$,$7w_{64}$), ($-w_{64}$,$5w_{64}$), ($-w_{64}$,$3w_{64}$), ($-w_{64}$,$w_{64}$), ($-w_{64}$,$-w_{64}$), ($-w_{64}$,$-3w_{64}$), ($-w_{64}$,$-5w_{64}$), ($-w_{64}$,$-7w_{64}$),
($-3w_{64}$,$7w_{64}$), ($-3w_{64}$,$5w_{64}$), ($-3w_{64}$,$3w_{64}$), ($-3w_{64}$,$w_{64}$), ($-3w_{64}$,$-w_{64}$), ($-3w_{64}$,$-w_{64}$), ($-3w_{64}$,$-5w_{64}$), ($-3w_{64}$, $-7w_{64}$),
($-5w_{64}$,$7w_{64}$), ($-5w_{64}$,$5w_{64}$), ($-5w_{64}$,$3w_{64}$), ($-5w_{64}$,$w_{64}$), ($-5w_{64}$,$-w_{64}$), ($-5w_{64}$,$-3w_{64}$), ($-5w_{64}$,$-5w_{64}$), ($-5w_{64}$, $-7w_{64}$),
($-7w_{64}$,$7w_{64}$), ($-7w_{64}$,$5w_{64}$), ($-7w_{64}$,$3w_{64}$), ($-7w_{64}$,$w_{64}$), ($-7w_{64}$,$-w_{64}$), ($-7w_{64}$,$-3w_{64}$), ($-7w_{64}$,$-5w_{64}$), and ($-7w_{64}$,$-7w_{64}$), where $w_{64}$ is a real number greater than 0.

Here, transmitted bits (input bits) are represented by b0, b1, b2, b3, b4, and b5. For example, when (b0, b1, b2, b3, b4, b5)=(0, 0, 0, 0, 0, 0) for the transmitted bits, mapping is performed to the signal point 1101 in FIG. 11. When an in-phase component and a quadrature component of the baseband signal obtained as a result of mapping are respectively represented by I and Q, (I, Q)=($7w_{64}$, $7w_{64}$) is satisfied.

That is to say, the in-phase component I and the quadrature component Q of the baseband signal obtained as a result of mapping (at the time of using 64QAM) are determined based on the transmitted bits (b0, b1, b2, b3, b4, b5). One example of a relationship between values (000000-111111) of a set of b0, b1, b2, b3, b4, and b5 and coordinates of signal points is as shown in FIG. 11. The values 000000-111111 of the set of b0, b1, b2, b3, b4, and b5 are shown directly below the 64 signal points (i.e., the circles in FIG. 11) for 64QAM, which are
($7w_{64}$,$7w_{64}$), ($7w_{64}$,$5w_{64}$), ($7w_{64}$,$3w_{64}$), ($7w_{64}$,$w_{64}$), ($7w_{64}$,$-w_{64}$), ($7w_{64}$,$-3w_{64}$), ($7w_{64}$,$-5w_{64}$), ($7w_{64}$,$-7w_{64}$),
($5w_{64}$,$7w_{64}$), ($5w_{64}$,$5w_{64}$), ($5w_{64}$,$3w_{64}$), ($5w_{64}$,$w_{64}$), ($5w_{64}$,$-w_{64}$), ($5w_{64}$,$-3w_{64}$), ($5w_{64}$,$-5w_{64}$), ($5w_{64}$,$-7w_{64}$),
($3w_{64}$,$7w_{64}$), ($3w_{64}$,$5w_{64}$), ($3w_{64}$,$3w_{64}$), ($3w_{64}$,$w_{64}$), ($3w_{64}$,$-w_{64}$), ($3w_{64}$,$-3w_{64}$), ($3w_{64}$,$-5w_{64}$), ($3w_{64}$,$-7w_{64}$),
($w_{64}$,$7w_{64}$), ($w_{64}$,$5w_{64}$), ($w_{64}$,$3w_{64}$), ($w_{64}$,$w_{64}$), ($w_{64}$,$-w_{64}$), ($w_{64}$,$-3w_{64}$), ($w_{64}$,$-5w_{64}$), ($w_{64}$,$-7w_{64}$),
($-w_{64}$,$7w_{64}$), ($-w_{64}$,$5w_{64}$), ($-w_{64}$,$3w_{64}$), ($-w_{64}$,$w_{64}$), ($-w_{64}$,$-w_{64}$), ($-w_{64}$,$-3w_{64}$), ($-w_{64}$,$-5w_{64}$), ($-w_{64}$,$-7w_{64}$),
($-3w_{64}$,$7w_{64}$), ($-3w_{64}$,$5w_{64}$), ($-3w_{64}$,$3w_{64}$), ($-3w_{64}$,$w_{64}$), ($-3w_{64}$,$-w_{64}$), ($-3w_{64}$,$-w_{64}$), ($-3w_{64}$,$-5w_{64}$), ($-3w_{64}$,$-7w_{64}$),
($-5w_{64}$,$7w_{64}$), ($-5w_{64}$,$5w_{64}$), ($-5w_{64}$,$3w_{64}$), ($-5w_{64}$,$w_{64}$), ($-5w_{64}$,$-w_{64}$), ($-5w_{64}$,$-3w_{64}$), ($-5w_{64}$,$-5w_{64}$), ($-5w_{64}$,$-7w_{64}$),
($-7w_{64}$,$7w_{64}$), ($-7w_{64}$,$5w_{64}$), ($-7w_{64}$,$3w_{64}$), ($-7w_{64}$,$w_{64}$), ($-7w_{64}$,$-w_{64}$), ($-7w_{64}$,$-3w_{64}$), ($-7w_{64}$,$-5w_{64}$), and ($-7w_{64}$,$-7w_{64}$). Coordinates, in the I (in-phase)-Q (quadrature(-phase)) plane, of the signal points (i.e., the circles) directly above the values 000000-111111 of the set of b0, b1, b2, b3, b4, and b5 indicate the in-phase component I and the quadrature component Q of the baseband signal obtained as a result of mapping. The relationship between the values (000000-111111) of the set of b0, b1, b2, b3, b4, and b5 for 64QAM and coordinates of signal points is not limited to that shown in FIG. 11. Values obtained by expressing the in-phase component I and the quadrature component Q of the baseband signal obtained as a result of mapping (at the time of using 64QAM) in complex numbers correspond to the baseband signal ($s_1(t)$ or $s_2(t)$) in FIGS. 5-7.

This example shows the structure of the precoding matrix when 64QAM and 16QAM are applied as the modulation scheme for generating the baseband signal 505A ($s_1(t)$ ($s_1(i)$)) and the modulation scheme for generating the baseband signal 505B ($s_2(t)$ ($s_2(i)$)), respectively, in FIGS. 5-7.

In this case, the baseband signal 505A ($s_1(t)$ ($s_1(i)$)) and the baseband signal 505B ($s_2(t)$ ($s_2(i)$)), which are outputs of the mapper 504 shown in FIGS. 5-7, are typically set to have an equal average power. Thus, formulas S82 and S83 are satisfied for the coefficients $w_{16}$ and $w_{64}$ described in the above-mentioned explanations on the mapping schemes for 16QAM and 64QAM, respectively. In formulas S82 and S83, z is a real number greater than 0. The following describes the structure of the precoding matrix F used when calculation in the following cases is performed and the relationship between $Q_1$ and $Q_2$.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

The following describes a case where formulas S11 and S12 are satisfied for the coefficients $w_{16}$ and $w_{64}$ described in the above-mentioned explanations on the mapping schemes for 16QAM and 64QAM, respectively, and the precoding matrix F used when calculation in the following cases is performed is set to the precoding matrix F in any of formulas S93, S94, S95, and S96.

<1> Case where $P_1^2=P_2^2$ is satisfied in formula S2

<2> Case where $P_1^2=P_2^2$ is satisfied in formula S3

<3> Case where $P_1^2=P_2^2$ is satisfied in formula S4

<4> Case in formula S5

<5> Case in formula S8

In formulas S93 and S95, β may be either a real number or an imaginary number. However, β is not 0 (zero).

In this case, values of θ that allow the reception device to obtain high data reception quality are considered.

First, the values of θ that allow the reception device to obtain high data reception quality when attention is focused on the signal $z_2(t)$ ($z_2(i)$) in formulas S2, S3, S4, S5, and S8 are as follows.

[Math. 340]

$$\theta = 15 \text{ or } 15+360\times n \text{ (degree)} \quad \text{(formula S301)}$$

or

[Math. 341]

$$\begin{aligned}\theta &= 180+15\\ &= 195\end{aligned}$$
$$\text{or } 195+360\times n \text{ (degree)} \quad \text{(formula S302)}$$

or

[Math. 342]

$$\theta = -15 \text{ or } -15+360\times n \text{ (degree)} \quad \text{(formula S303)}$$

or

[Math. 343]

$$\begin{aligned}\theta &= 180-15\\ &= 165\end{aligned}$$
$$\text{or } 165+360\times n \text{ (degree)} \quad \text{(formula S304)}$$

Note that n is an integer.

When the precoding matrix F is set to the precoding matrix F in any of formulas S93, S94, S95, and S96, and θ is set to θ in any of formulas S301, S302, S303, and S304, concerning the signal $u_2(t)$ ($u_2(i)$) described in Configuration Example R1, signal points from a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(0, 0, 0, 0, 0, 0, 0, 0, 0, 0) to a signal point corresponding to ($b_{0,16}$, $b_{1,16}$, $b_{2,16}$, $b_{3,16}$, $b_{0,64}$, $b_{1,64}$, $b_{2,64}$, $b_{3,64}$, $b_{4,64}$, $b_{5,64}$)=(1, 1, 1, 1, 1, 1, 1, 1, 1, 1) are arranged in the I (in-phase)-Q (quadrature(-phase)) plane as shown in FIG. 55 similarly to the above. In FIG. 55, the horizontal and vertical axes respectively represent I and Q, and black circles represent the signal points.

As can be seen from FIG. 55, 1024 signal points exist without overlapping one another. As a result, the reception device is likely to obtain high reception quality.

When the precoding matrix F is set to the precoding matrix F in any of formulas S93, S94, S95, and S96, and θ is set to θ in any of formulas S301, S302, S303, and S304, concerning the signal $u_1(t)$ ($u_1(i)$) described in Configuration Example R1, signal points from a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(0, 0, 0, 0, 0, 0, 0, 0, 0, 0)$ to a signal point corresponding to $(b_{0,16}, b_{1,16}, b_{2,16}, b_{3,16}, b_{0,64}, b_{1,64}, b_{2,64}, b_{3,64}, b_{4,64}, b_{5,64})=(1, 1, 1, 1, 1, 1, 1, 1, 1, 1)$ are arranged in the I (in-phase)-Q (quadrature(-phase)) plane as shown in FIG. 56 similarly to the above. In FIG. 56, the horizontal and vertical axes respectively represent I and Q, and black circles represent the signal points.

As can be seen from FIG. 56, 1024 signal points exist without overlapping one another. As a result, the reception device is likely to obtain high reception quality.

The minimum Euclidian distance between 1024 signal points in FIG. 55 is represented by $D_2$, and the minimum Euclidian distance between 1024 signal points in FIG. 56 is represented by $D_1$. In this case, $D_1<D_2$ is satisfied. Accordingly, as described in Configuration Example R1, it is desirable that $Q_1<Q_2$ be satisfied when $Q_1\neq Q_2$ is satisfied in formulas S2, S3, S4, S5, and S8.

Example 6

Supplemental Remarks

Examples of the value of θ that allows for obtaining high data reception quality are shown in the above-mentioned example. Even when the value of θ is not equal to the value shown in the above-mentioned example, however, high data reception quality can be obtained by satisfying the conditions shown in Configuration Example R1.

The following describes operations of the reception device performed when the transmission device transmits modulated signals by using Examples 1-4, modifications thereto, and Examples 5-6.

FIG. 53 shows the relationship between the transmit antenna and the receive antenna. A modulated signal #1 (5301A) is transmitted from a transmit antenna #1 (5302A) in the transmission device, and a modulated signal #2 (5301B) is transmitted from a transmit antenna #2 (5302B) in the transmission device.

The receive antenna #1 (5303X) and the receive antenna #2 (5303Y) in the reception device receive the modulated signals transmitted by the transmission device (obtain received signals 5304X and 5304Y). In this case, the propagation coefficient from the transmit antenna #1 (5302A) to the receive antenna #1 (5303X) is represented by $h_{11}(t)$, the propagation coefficient from the transmit antenna #1 (5302A) to the receive antenna #2 (5303Y) is represented by $h_{21}(t)$, the propagation coefficient from the receive antenna #2 (5302B) to the transmit antenna #1 (5303X) is represented by $h_{12}(t)$, and the propagation coefficient from the transmit antenna #2 (5302B) to the receive antenna #2 (5303Y) is represented by $h_{22}(t)$ (t is time).

Figure 54:
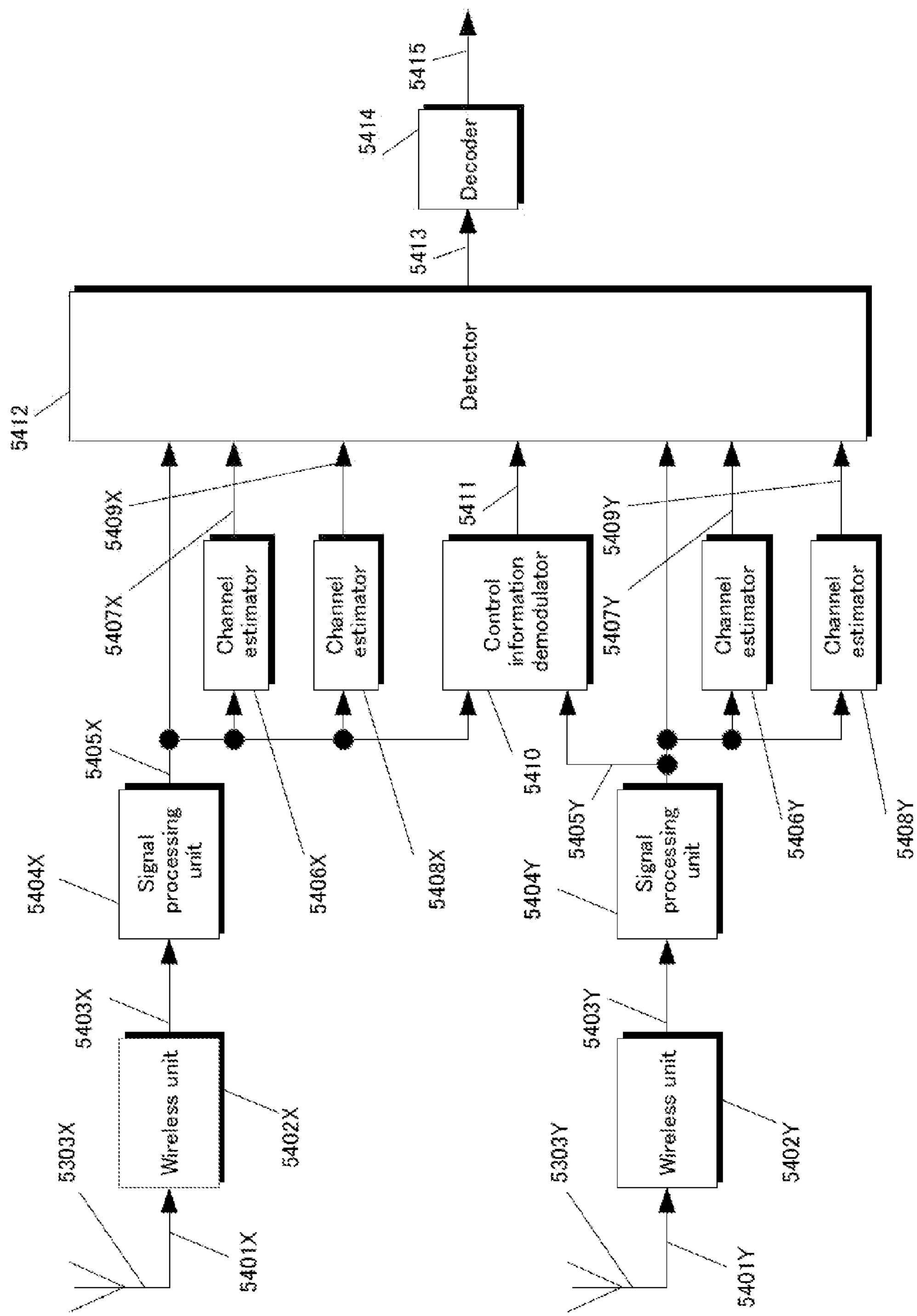
FIG. 54 shows an example of configuration of a reception device.

FIG. 54 shows one example of the configuration of the reception device. A wireless unit 5402X receives a received signal 5401X received by the receive antenna #1 (S4903X) as an input, performs processing such as amplification and frequency conversion on the received signal 5401X, and outputs a signal 5403X.

When the OFDM scheme is used, for example, the signal processing unit 5404X performs processing such as Fourier transformation and parallel-serial conversion to obtain a baseband signal 5405X. In this case, the baseband signal 5405X is expressed as $r'_1(t)$.

A wireless unit 5402Y receives a received signal 5401Y received by the receive antenna #2 (S4903Y) as an input, performs processing such as amplification and frequency conversion on the received signal 5401Y, and outputs a signal 5403Y.

When the OFDM scheme is used, for example, the signal processing unit 5404Y performs processing such as Fourier transformation and parallel-serial conversion to obtain a baseband signal 5405Y. In this case, the baseband signal 5405Y is expressed as $r'_2(t)$.

A channel estimator 5406X receives the baseband signal 5405X as an input, performs channel estimation (propagation coefficient estimation) from pilot symbols in the frame structure shown in FIG. 9, and outputs a channel estimation signal 5407X. The channel estimation signal 5407X is an estimation signal for $h_{11}(t)$, and is expressed as $h'_{11}(t)$.

A channel estimator 5408X receives the baseband signal 5405X as an input, performs channel estimation (propagation coefficient estimation) from pilot symbols in the frame structure shown in FIG. 9, and outputs a channel estimation signal 5409X. The channel estimation signal 5409X is an estimation signal for $h_{12}(t)$, and is expressed as $h'_2(t)$.

A channel estimator 5406Y receives the baseband signal 5405Y as an input, performs channel estimation (propagation coefficient estimation) from pilot symbols in the frame structure shown in FIG. 9, and outputs a channel estimation signal 5407Y. The channel estimation signal 5407Y is an estimation signal for $h_{21}(t)$, and is expressed as $h'_{21}(t)$.

A channel estimator 5408Y receives the baseband signal 5405Y as an input, performs channel estimation (propagation coefficient estimation) from pilot symbols in the frame structure shown in FIG. 9, and outputs a channel estimation signal 5409Y. The channel estimation signal 5409Y is an estimation signal for $h_{22}(t)$, and is expressed as $h'_{22}(t)$.

A control information demodulator 5410 receives a baseband signal 5405X and a baseband signal 5405Y as inputs, demodulates (detects and decodes) symbols for transmitting control information including information relating to a transmission scheme, a modulation scheme, and a transmission power that the transmission device has transmitted along with data (symbols), and outputs control information 5411.

The transmission device transmits modulated signals by using any of the above-mentioned transmission schemes. The transmission schemes are thus as follows:

<1> Transmission scheme in formula S2
<2> Transmission scheme in formula S3
<3> Transmission scheme in formula S4
<4> Transmission scheme in formula S5
<5> Transmission scheme in formula S6
<6> Transmission scheme in formula S7
<7> Transmission scheme in formula S8
<8> Transmission scheme in formula S9
<9> Transmission scheme in formula S10
<10> Transmission scheme in formula S295
<11> Transmission scheme in formula S296

The following relationship is satisfied when modulated signals are transmitted by using the transmission scheme in formula S2.

[Math. 344]

$$\begin{aligned}\begin{pmatrix} r'_1(i) \\ r'_2(i) \end{pmatrix} &= \begin{pmatrix} h'_{11}(i) & h'_{12}(i) \\ h'_{21}(i) & h'_{22}(i) \end{pmatrix}\begin{pmatrix} z_1(i) \\ z_2(i) \end{pmatrix} \\ &= \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix} F \begin{pmatrix} P_1 \times s_1(i) \\ P_2 \times s_2(i) \end{pmatrix} \\ &= \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix}\begin{pmatrix} a(i) & b(i) \\ c(i) & d(i) \end{pmatrix} \\ &\quad \begin{pmatrix} P_1 & 0 \\ 0 & P_2 \end{pmatrix}\begin{pmatrix} s_1(i) \\ s_2(i) \end{pmatrix}\end{aligned} \quad \text{(formula S305)}$$

The following relationship is satisfied when modulated signals are transmitted by using the transmission scheme in formula S3.

[Math. 345]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S306)}$$

The following relationship is satisfied when modulated signals are transmitted by using the transmission scheme in formula S4.

[Math. 346]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S307)}$$

The following relationship is satisfied when modulated signals are transmitted by using the transmission scheme in formula S5.

[Math. 347]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula S308)}$$

The following relationship is satisfied when modulated signals are transmitted by using the transmission scheme in formula S6.

[Math. 348]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S309)}$$

The following relationship is satisfied when the modulated signals are transmitted by using the transmission scheme in formula S7.

[Math. 349]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula S310)}$$

The following relationship is satisfied when modulated signals are transmitted by using the transmission scheme in formula S8.

[Math. 350]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} s_1(i) \\ s_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a(i) & b(i) \\ c(i) & d(i) \end{pmatrix} \begin{pmatrix} s_1(i) \\ s_2(i) \end{pmatrix} \quad \text{(formula S311)}$$

The following relationship is satisfied when the modulated signals are transmitted by using the transmission scheme in formula S9.

[Math. 351]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix} \begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix} \begin{pmatrix} 1 & 0 \\ 0 & e^{j\theta(i)} \end{pmatrix} \begin{pmatrix} a(i) & b(i) \\ c(i) & d(i) \end{pmatrix} \begin{pmatrix} P_1 & 0 \\ 0 & P_2 \end{pmatrix} \begin{pmatrix} s_1(i) \\ s_2(i) \end{pmatrix} \quad \text{(formula S312)}$$

The following relationship is satisfied when modulated signals are transmitted by using the transmission scheme in formula S10.

[Math. 352]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix}\begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix}\begin{pmatrix} 1 & 0 \\ 0 & e^{j\theta(i)} \end{pmatrix}\begin{pmatrix} a(i) & b(i) \\ c(i) & d(i) \end{pmatrix}\begin{pmatrix} s_1(i) \\ s_2(i) \end{pmatrix} \quad \text{(formula S313)}$$

The following relationship is satisfied when modulated signals are transmitted by using the transmission scheme in formula S295.

[Math. 353]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix}\begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix}\begin{pmatrix} \beta\times e^{j\theta_{11}(i)} & \beta\times\alpha\times e^{j(\theta_{11}(i)+\lambda)} \\ \beta\times\alpha\times e^{j\theta_{21}(i)} & \beta\times e^{j(\theta_{21}(i)+\lambda+\pi)} \end{pmatrix}\begin{pmatrix} P_1 & 0 \\ 0 & P_2 \end{pmatrix}\begin{pmatrix} s_1(i) \\ s_2(i) \end{pmatrix} \quad \text{(formula S314)}$$

The following relationship is satisfied when modulated signals are transmitted by using the transmission scheme in formula S296.

[Math. 354]

$$\begin{pmatrix} r'_1(i) \\ r'_2(i) \end{pmatrix} = \begin{pmatrix} h'_{11}(i) & h'_{12}(i) \\ h'_{21}(i) & h'_{22}(i) \end{pmatrix}\begin{pmatrix} z_1(i) \\ z_2(i) \end{pmatrix} = \begin{pmatrix} h'_{11}(i) & h'_{12}(i) \\ h'_{21}(i) & h'_{22}(i) \end{pmatrix}\begin{pmatrix} Q_1 & 0 \\ 0 & Q_2 \end{pmatrix}\frac{1}{\sqrt{\alpha^2+1}}\begin{pmatrix} e^{j\theta_{11}(i)} & \alpha\times e^{j(\theta_{11}(i)+\lambda)} \\ \alpha\times e^{j\theta_{21}(i)} & e^{j(\theta_{21}(i)+\lambda+\pi)} \end{pmatrix}\begin{pmatrix} P_1 & 0 \\ 0 & P_2 \end{pmatrix}\begin{pmatrix} s_1(i) \\ s_2(i) \end{pmatrix} \quad \text{(formula S315)}$$

A detector 5412 receives the baseband signals 5405X and 5405Y, the channel estimation signals 5407X, 5409X, 5407Y, and 5409Y, and the control information 5411 as inputs. The detector 5412 knows, from the control information 5411, the relationship that is satisfied, from among the relationships in the above-mentioned formulas S305, S306, S307, S308, S309, S310, S311, S312, S313, S314, and S315.

The detector 5412 detects each bit of data transmitted by $s_1(t)$ ($s_1(i)$) and $s_2(t)$ ($s_2(i)$) based on the relationship in any of formulas S305, S306, S307, S308, S309, S310, S311, S312, S313, S314, and S315 (i.e., obtains a log-likelihood or a log-likelihood ratio of each bit), and outputs a detection result 5413.

The decoder 5414 receives the detection result 5413 as an input, decodes an error correction code, and outputs received data 5415.

The precoding scheme in the MIMO system, and the configurations of the transmission device and the reception device using the precoding scheme have been described so far in this configuration example. Use of the precoding scheme described above produces such an effect that the reception device can obtain high data reception quality.

Each of the transmit antenna and the receive antenna described in the above-mentioned configuration example may be a single antenna unit composed of a plurality of antennas. A plurality of antennas for transmitting the respective two modulated signals on which precoding has been performed may be used so as to simultaneously transmit one modulated signal at another time.

Although the reception device has been described as having two receive antennas, the reception device is not limited to this configuration, and may have three or more receive antennas. With this configuration, received data can be obtained in a similar manner.

The precoding scheme in this configuration example is implemented in a similar manner when it is applied to a single carrier scheme, a multicarrier scheme, such as an OFDM scheme and an OFDM scheme using wavelet transformation, and a spread spectrum scheme.

The transmission scheme, the reception scheme, the transmission device, and the reception device described in each of the above-mentioned configuration examples are mere examples of the structure to which the invention described later in each embodiment is applicable. Needless to say, the invention described later in each embodiment is applicable to a transmission scheme, a reception scheme, a transmission device, and a reception device that are different from the respective transmission scheme, reception scheme, transmission device, and reception device described above.

Embodiments 1-4

The following embodiments describe modifications on the processing performed within the encoder and the mapper and/or the processing performed before and after the encoder and the mapper described in Configuration Example R1 and Configuration Example S1 described above. This configuration including the encoder and the mapper is also referred to as BICM (Bit Interleaved Coded Modulation).

A first complex signal s1 (s1($t$), s1($f$), or s1($t,f$), where t denotes time, and f denotes frequency) is a baseband signal that can be expressed by an in-phase component I and a quadrature component Q, based on a modulation scheme, such as mapping for BPSK (Binary Phase Shift Keying), QPSK (Quadrature Phase Shift Keying), 16QAM (16 Quadrature Amplitude Modulation), 64QAM (64 Quadrature Amplitude Modulation), 256QAM (256 Quadrature Amplitude Modulation), or the like. Similarly, a second complex signal s2 (s2($t$), s2($f$), or s2($t,f$)) is a baseband signal that can be expressed by the in-phase component I and the quadrature component Q, based on a modulation scheme, such as mapping for BPSK (Binary Phase Shift Keying), QPSK (Quadrature Phase Shift Keying), 16QAM (16 Quadrature Amplitude Modulation), 64QAM (64 Quadrature Amplitude Modulation), 256QAM (256 Quadrature Amplitude Modulation), or the like.

The mapper 504 receives a second bit sequence as an input. Also, the mapper 504 demultiplexes the second bit sequence into bit sequences of (X+Y). The mapper 504 generates the first complex signal s1 with use of X bits in the bit sequence of (X+Y), based on the mapping of a first modulation scheme. Similarly, the mapper 504 generates the second complex signal s2 with use of Y bits in the bit sequence of (X+Y), based on the mapping of a second modulation scheme.

Note that in the following embodiments of the present specification, from the mapper 504 onwards, the specific precoding described in Configuration Example R1 and Configuration Example S1 may be performed. Alternatively, precoding expressed by any of formulas (R2), (R3), (R4), (R5), (R6), (R7), (R8), (R9), (R10), (S2), (S3), (S4), (S5), (S6), (S7), (S8), (S9), and (S10) may be performed.

The encoder 502 performs encoding (with an error correction code) on a K-bit information sequence, and outputs a first bit sequence (503) which is an N-bit codeword. Accordingly, in the present example, an N-bit codeword, i.e., a block code having a block length (code length) of N bits is used as an error correction code. Examples of a block code include: an LDPC (block) code and a turbo code using tail-biting as described in Non-Patent Literature 1, Non-Patent Literature 6, etc.; a Duo-Binary Turbo code using tail-biting as described in Non-Patent Literatures 3, 4, etc.; and a code resulting from a concatenation of an LDPC (block) code and a BCH code (Bose-Chaudhuri-Hocquenghem code) as described in Non-Patent Literature 5, etc.

Note that K and N are natural numbers that satisfy the relationship of N>K. In the case of a systematic code which is often used in the LDPC code, the first bit sequence includes the K-bit information bit sequence.

Depending on the value of X+Y, which is the number of bits for generating the two complex signals s1 and s2, the length of the codeword (N bits) output from the encoder may not be a multiple of X+Y.

For example, consider the case where a codeword length N is 64800 bits, 64QAM is used as a modulation scheme so that X=6, and 256QAM is used as a modulation scheme so that Y=8, i.e., X+Y=14. Also, consider the case where the codeword length N is 16200 bits, 256QAM is used as a modulation scheme so that X=8, and 256QAM is used as a modulation scheme so that Y=8, i.e., X+Y=16.

In both of the cases, "the length of the codeword (N bits) output from the encoder is not a multiple of X+Y which is the number of bits for generating the two complex signals s1 and s2".

In the following embodiments, even if the length of the codeword (N bits) output from the encoder is arbitrary, an adjustment is made so that the mapper can perform processing without leaving any remainder from the number of bits.

As a supplementary explanation, the following describes an advantage obtained when the length of the codeword (N bits) output from the encoder is a multiple of X+Y which is the number of bits for generating the two complex signals s1 and s2.

Consider the case where the transmission device efficiently transmits a block of an error correction code, which has a codeword length of N bits and is used by the transmission device for encoding. In this case, it is desirable that X+Y, which is the number of bits transmittable by the first complex signal s1 and the second complex signal s2 that are transmitted at the same frequency at the same time, not include bits of a plurality of blocks, since this configuration is more likely to allow the reduction of the memory size of the transmission device and/or the reception device.

For example, suppose that (the modulation scheme of the first complex signal s1, the modulation scheme of the second complex signal s2)=(16QAM, 16QAM). In this case, X+Y, which is the number of bits transmittable by the first complex signal s1 and the second complex signal s2 that are transmitted at the same frequency at the same time, is 8 bits, and it is desirable that the 8 bits not include data of a plurality of blocks (of an error correction code). In other words, in the modulation schemes selected by the transmission device, it is desirable that X+Y, which is the number of bits transmittable by the first complex signal s1 and the second complex signal s2 that are transmitted at the same frequency at the same time, not include data of a plurality of blocks (of an error correction code).

Accordingly, it is desirable that the length of the codeword (N bits) output from the encoder be a multiple of X+Y which is the number of bits for generating the two complex signals s1 and s2.

It is likely that the transmission device can switch between a plurality of modulation schemes for both the modulation scheme of the first complex signal s1 and the modulation scheme of the second complex signal s2. Accordingly, X+Y is likely to take a plurality of values.

At this time, X+Y may take a value that does not satisfy the condition that "the length of the codeword (N bits) output from the encoder is a multiple of X+Y which is the number of bits for generating the two complex signals s1 and s2". Accordingly, the processing scheme described in the following embodiment is necessary.

Embodiment 1

Figure 57:
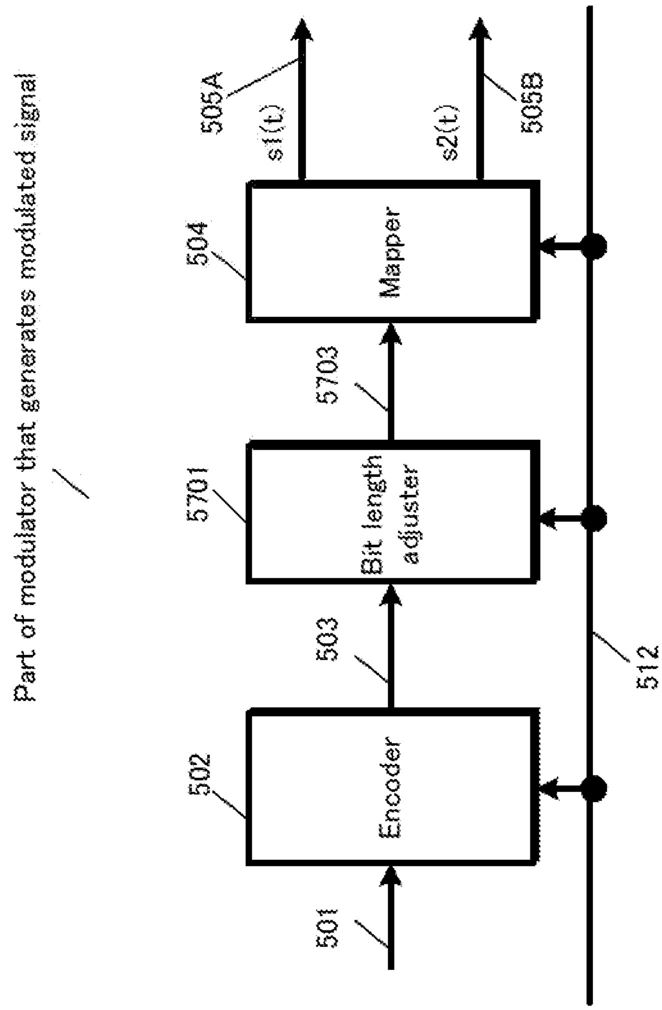
FIG. 57 shows configuration of part of the transmission device according to Embodiment 1 that generates a modulated signal.

FIG. 57 shows the configuration of "a part of the transmission device for generating modulated signals" (hereinafter, referred to as a modulator). In FIG. 57, the same functions and signals as "the part for generating modulated signals" described above in Configuration Example R1 are provided with the same reference signs.

The modulator of the present embodiment includes a bit length adjuster 5701 between the encoder 502 and the mapper 504.

According to a control signal 512, the encoder 502 outputs the first bit sequence (503), which is a codeword (block length (code length)) of N bits, from the K-bit information bit sequence.

According to the control signal 512, the mapper 504 selects the first modulation scheme which is a modulation scheme used for generation of the complex signal s1($t$), and the second modulation scheme which is a modulation scheme used for generation of the complex signal s2($t$). The mapper 504 receives a second bit sequence 5703, and generates the first complex signal s1($t$) and the second complex signal s2($t$) with use of a bit sequence having X+Y bits included in the second bit sequence 5703, where X indicates the number of bits used to generate the first complex signal s1, and Y indicates the number of bits used to generate the second complex signal s2. Details are described above.

The bit length adjuster 5701 is provided after the encoder 502 and before the mapper 504. The bit length adjuster 5701 receives a first bit sequence 503 as an input, adjusts the bit length of the first bit sequence 503 (in the present example, the codeword length (the block length (code length) of a codeword (block) of an error correction code), and generates the second bit sequence 5703.

Figure 58:
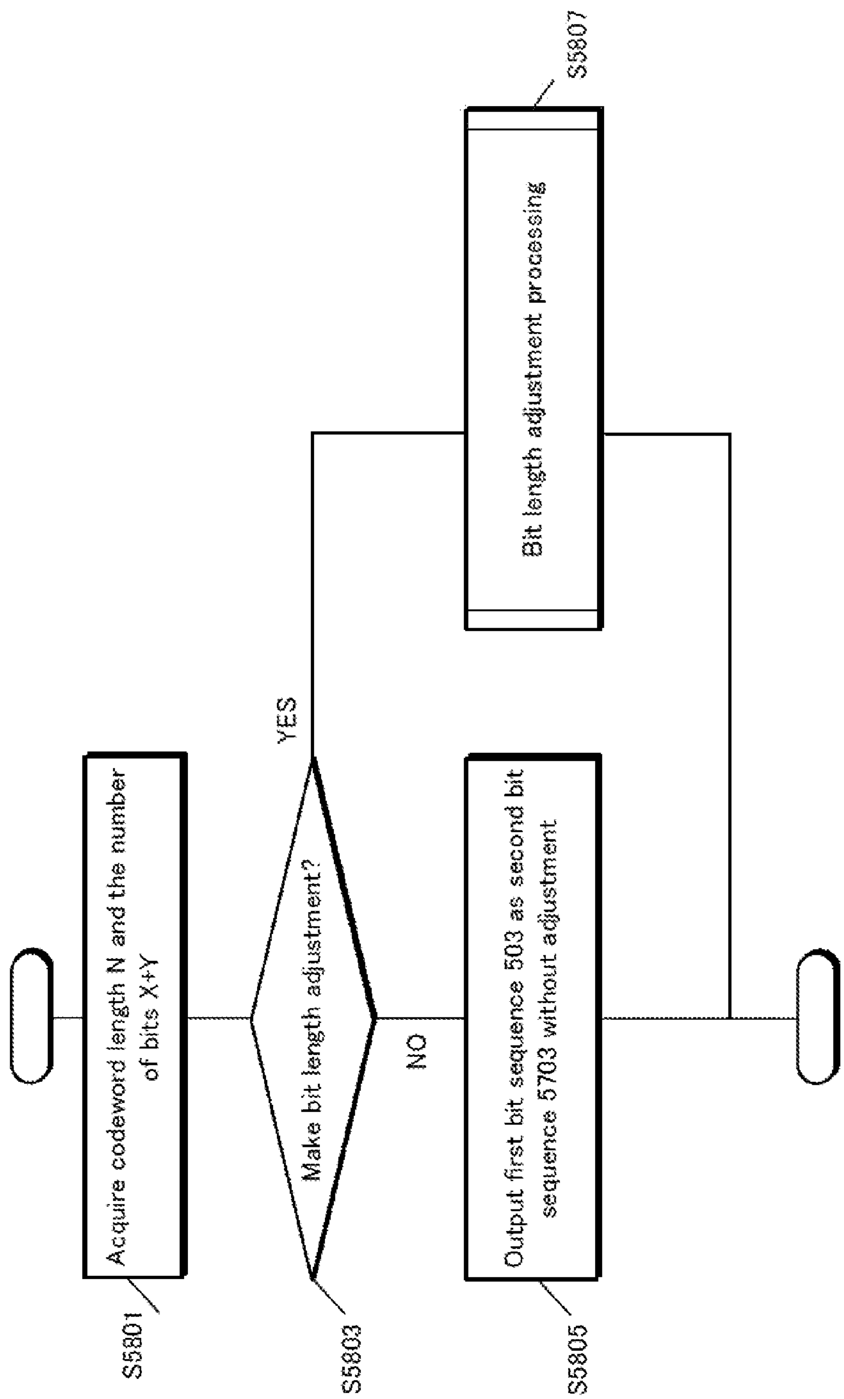
FIG. 58 is a flowchart of a generation scheme of a modulated signal.

FIG. 58 shows bit length adjustment processing in a modulation processing scheme according to the present embodiment.

A controller (not shown) acquires X+Y, where X is the number of bits for generating the first complex signal s1 and Y is the number of bits for generating the second complex signal s2 (step S5801).

Next, the controller determines whether to make a bit length adjustment on the codeword length (block length (code length)) of a codeword (block) of an error correction code (step S5803). A condition for the determination may be whether or not a codeword length (block length (code length)) of N bits of the error correction code is a multiple of the value of X+Y, which is indicated by a control signal. Also, the above determination may be performed with use of a table showing the correspondence between X+Y and N. Information on X+Y may be determined based on information on the first modulation scheme which is a modulation scheme used for generation of the complex signal s1($t$), and the second modulation scheme which is a modulation scheme used for generation of the complex signal s2($t$).

For example, if a codeword length (block length (code length)) of N bits of the error correction code is 64800 bits and the value of X+Y is 16, the codeword length of N bits of the error correction code is a multiple of the value of X+Y. The controller determines that "a bit length adjustment is not to be made" (NO as a result of S5803).

When determining that a bit length adjustment is unnecessary (NO as a result of S5803), the controller causes the bit length adjuster 5701 to output the first bit sequence 503 as the second bit sequence 5703 without any adjustment (S5805). That is, in the example described above, the bit length adjuster 5701 receives a codeword of 64800 bits of the error correction code as an input, and outputs the codeword of 64800 bits of the error correction code. (The bit length adjuster 5701 outputs the received bit sequence 503 to the mapper 504 as the second bit sequence 5703.)

If a codeword length (block length (code length)) of N bits of the error correction code is 64800 bits and the value of X+Y is 14, the codeword length of N bits of the error correction code is not a multiple of the value of X+Y. In this case, the controller determines that "a bit length adjustment is to be made" (YES as a result of S5803).

When determining that "a bit length adjustment is to be made", the controller causes the bit length adjuster 5701 to perform bit length adjustment processing on the first bit sequence 503 (S5805).

Figure 59:
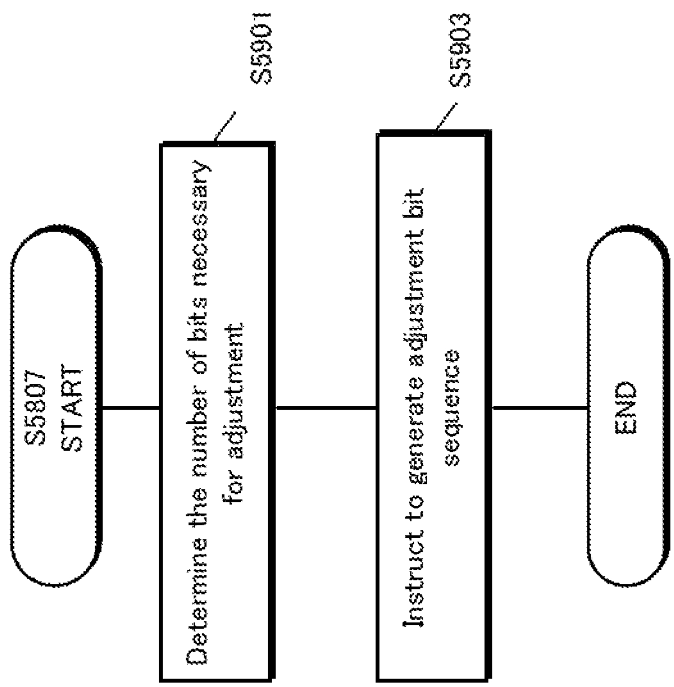
FIG. 59 is a flowchart of bit length adjustment processing according to Embodiment 1.

FIG. 59 shows a flowchart of bit length adjustment processing according to the present embodiment.

The controller determines a value PadNum that corresponds to the number of bits necessary for the adjustment of the first bit sequence 503 (S5901). That is, PadNum indicates the number of bits to be added to an N-bit codeword of the error correction code.

In Embodiment 1, the number equal to the value derived from the following formula (i.e., deficiencies) is determined as the value of PadNum (bits).

$$\text{PadNum}=\text{ceil}(N/(X+Y))\times(X+Y)-N$$

Note that the ceil function is a function that returns an integer resulting from a round-up calculation.

This determination processing may be performed with use of the values stored in the table without reliance on calculations, as long as the same result as the calculation result of the above formula is obtained.

For example, the number of bits necessary for adjustment (the value of PadNum) may be stored in advance for a control signal (a codeword length (block length (code length)) of the error correction code, and a pair of information on the modulation scheme for generating s1 and information on the modulation scheme for generating s2), and the value of PadNum corresponding to the current value of X+Y may be determined as the number of bits necessary for adjustment. The index values for the table may be coding rates, power imbalance values, or any other values, as long as the number of bits for adjustment is obtained in correspondence with the relationship between the codeword length (block length (code length)) of N bits of the error correction code and the value of X+Y.

The above control is particularly necessary for a communication system in which the modulation scheme for generating s1 and the modulation scheme for generating s2 are each switched between a plurality of modulation schemes.

Next, the controller instructs the bit length adjuster 5701 to generate an adjustment bit sequence, which is composed of PadNum bits and used for a bit length adjustment (S5903).

The adjustment bit sequence, which is composed of PadNum bits and used for a bit length adjustment, may be composed of PadNum bits whose values are all "0 (zero)" or PadNum bits whose values are all "1". The important point is that the transmission device including the modulator in FIG. 57 and the reception device that receives the modulated signals from the transmission device can share information on the adjustment bit sequence, which is composed of PadNum bits and used for a bit length adjustment. Accordingly, the adjustment bit sequence, which is composed of PadNum bits and used for a bit length adjustment, may be generated under a particular rule, and this particular rule may be shared between the transmission device and the reception device. Therefore, the adjustment bit sequence, which is composed of PadNum bits and used for a bit length adjustment, is not limited to the example given above.

Subsequently, using the first bit sequence 503 as an input, the bit length adjuster 5701 adds the adjustment bit sequence (i.e., the adjustment bit sequence which is composed of PadNum bits and used for a bit length adjustment) to a predetermined position, such as the ending, beginning, etc., of the codeword of the error correction code having a codeword length (block length (code length)) of N bits, and outputs, to the mapper, the second bit sequence composed of the number of bits which is a multiple of X+Y.

Advantageous Effect of the Present Embodiment

When the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. This configuration is more likely to allow the reduction of the memory size of the transmission device and/or the reception device.

Note that the bit length adjuster 5701 may be implemented as one of the functions of the encoder 502 or as one of the functions of the mapper 504.

Embodiment 2

Figure 60:
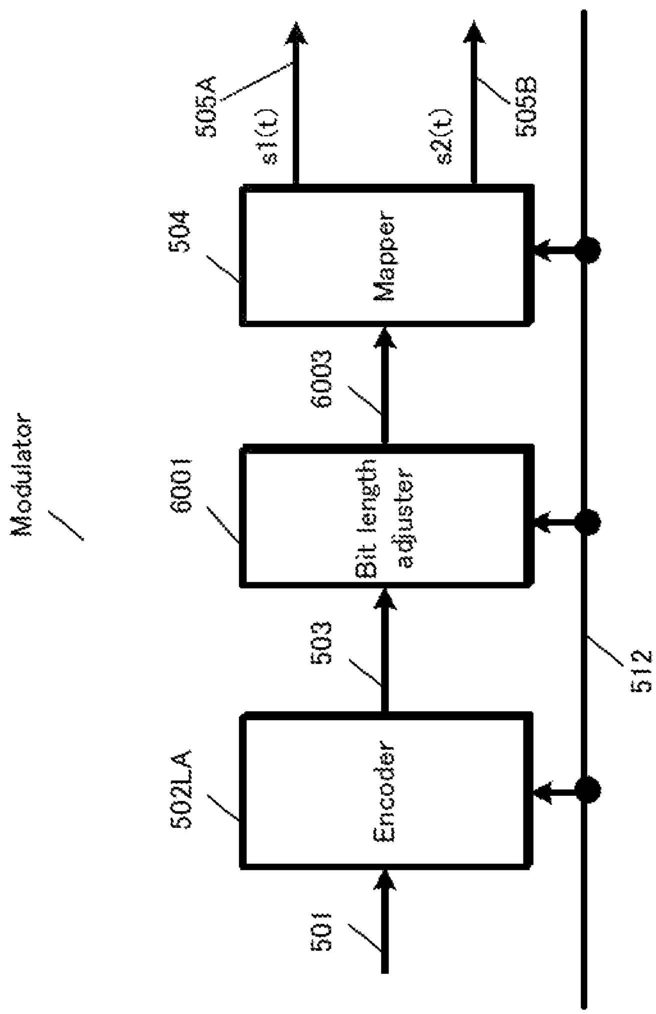
FIG. 60 shows configuration of a modulator according to Embodiment 2.

FIG. 60 shows the configuration of the modulator of the present embodiment.

The modulator of the present embodiment includes an encoder 502LA, a bit length adjuster 6001, and the mapper 504. The processing of the mapper 504 is described above, and thus description thereof is omitted.

<Encoder 502LA>

The encoder 502LA receives information bits composed of K bits (K being a natural number), obtains a codeword of N bits (N being a natural number), such as a codeword of a systematic LDPC code, and outputs the codeword of N bits. Note that N>K. In order to obtain a bit sequence of a parity portion of N−K bits, which is a portion other than an information portion, a parity-check matrix of the LDPC code has an accumulate structure.

Information on an $i^{th}$ block, which is an input for LDPC coding, is expressed as $X_{i,j}$ (i being an integer, and j being an integer from 1 to N). The parity obtained after coding is expressed as $P_{i,k}$ (k being an integer from N+1 to K). Also, let the vector of the codeword of the LDPC code of the $i^{th}$ block be $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$, and the parity-check matrix of the LDPC code be H. In this case, Hu=0 is true (here, the "Hu=0 (zero)" means that all elements of the vector are zero).

Figure 61:
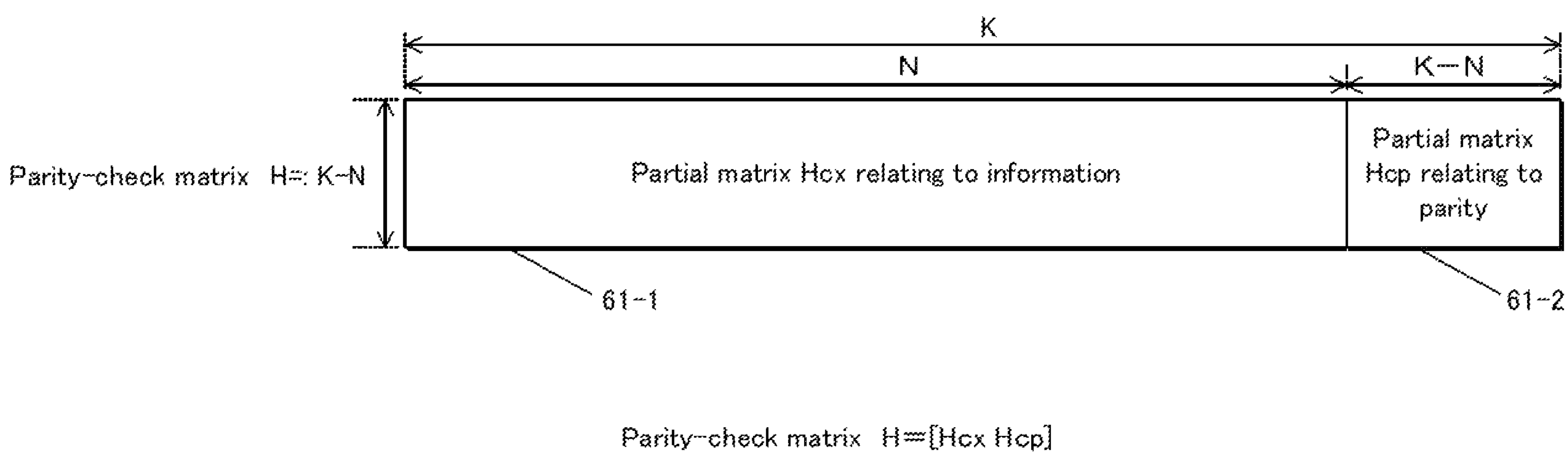
FIG. 61 shows a parity-check matrix.
Figure 62:
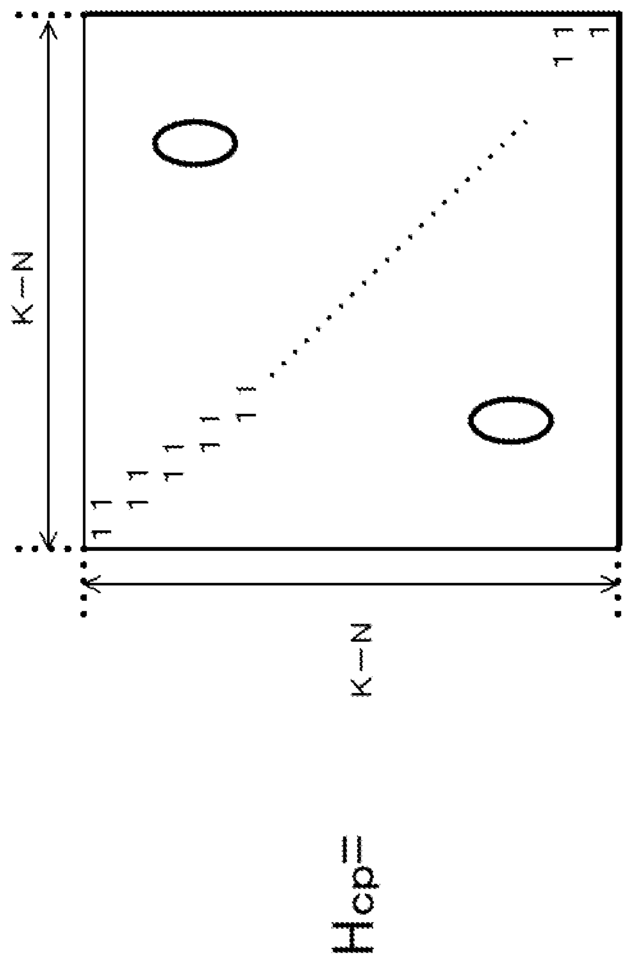
FIG. 62 shows an example of structure of a partial matrix.

At this time, the parity-check matrix H is expressed as shown in FIG. 61. As shown in FIG. 61, in the parity-check matrix H, the number of rows is N−K (the first row to the N−K row exist), and the number of columns is N (the first column to the $N^{th}$ column exist). In a partial matrix (61-1) (Hcx) relating to information, the number of rows is N−K (the first row to the N−K row exist), and the number of columns is K (the first column to the $K^{th}$ column exist). In a partial matrix (61-2) (Hcp) relating to parity, the number of rows is N−K (the first row to the N−K row exist), and the number of columns is N−K (the first row to the N−K row exist). Accordingly, the parity-check matrix $H=[H_{cx}\ H_{cp}]$ FIG. 62 shows the structure of the partial matrix $H_{cp}$, which relates to the parity in the parity-check matrix H of the LDPC code having the accumulate structure given as an example. As shown in FIG. 62, let the elements of i rows and j columns of the partial matrix $H_{cp}$ relating to parity be expressed as $H_{cp,comp}$ [i][j] (i and j each being an integer from 1 to N−K (i, j=1, 2, 3, . . . , N−K−1, N−K)). In this case, the following is true.

[Math. 355]

When $i=1$:

$$H_{cp,comp}[1][1]=1 \tag{1-1}$$

$$H_{cp,comp}[1][j]=0 \text{ for } \forall j;\ j=2,3,\ldots,N-K-1,N-K \tag{1-2}$$

(j is an integer from 2 to K−N(j=2, 3, . . . , N−K−1, N−K), and formula 1-2 is true for every j that satisfies this condition.)

[Math. 356]

When $i\neq 1$ ($i$ being an integer from 2 to $N-K$, i.e., $i=2,3,\ldots,N-K-1,N-K$):

$$H_{cp,comp}[i][i]=1 \text{ for } \forall i;\ i=2,3,\ldots,N-K-1,N-K \tag{2-1}$$

(i is an integer from 2 to N−K (i=2, 3, . . . , N−K−1, N−K), and formula 2-1 is true for every i that satisfies this condition.)

$$H_{cp,comp}[i][i-1]=1 \text{ for } \forall i;\ i=2,3,\ldots,N-K-1,N-K \tag{2-2}$$

(i is an integer from 2 to N−K (i=2, 3, . . . , N−K−1, N−K), and formula 2-2 is true for every i that satisfies this condition.)

$$H_{cp,comp}[i][j]=0 \text{ for } \forall i\forall j;\ i\neq j;\ i-1\neq j;\ i=2,3,\ldots,N-K-1,N-K;\ j=1,2,3,\ldots,N-K-1,N-K \tag{2-3}$$

(i is an integer from 2 to N−K (i=2, 3, . . . , N−K−1, N−K), j is an integer from 1 to N−K (j=1, 2, 3, . . . , N−K−1, N−K), {i≠j or i−1≠j}, and formula 2-3 is true for every i and every j that satisfies these conditions.)

Figure 63:
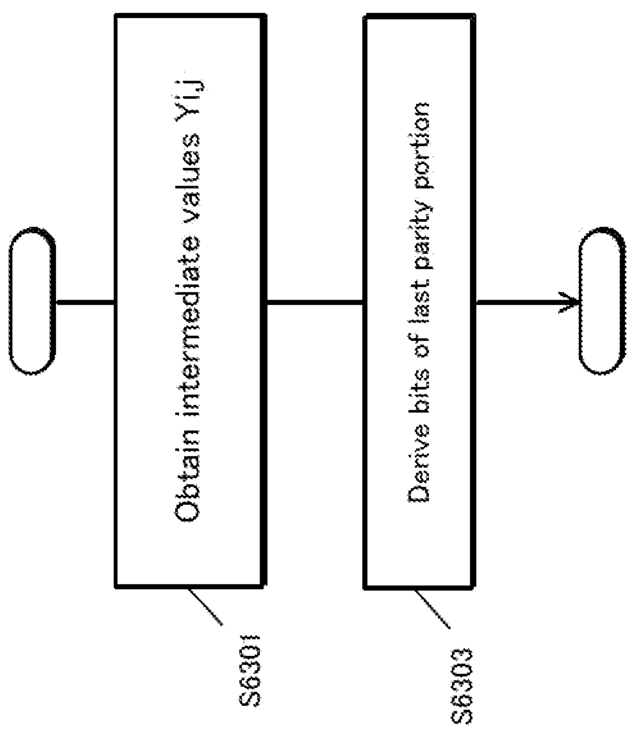
FIG. 63 is a flowchart of LDPC coding processing performed by an encoder 502LA.

FIG. 63 is a flowchart of LDPC coding processing performed by the encoder 502LA.

First, the encoder 502LA performs calculations relating to an information portion in the codeword of an LDPC code. The following description is provided with an example of the $j^{th}$ row (j being an integer from 1 to N−K) of the parity-check matrix H.

The encoder 502LA performs calculations by using the $j^{th}$ vector of the partial matrix (61-1)($H_{cx}$) relating to the information on the parity-check matrix H, and the information on the $i^{th}$ block $X_{i,j}$, and obtains an intermediate value $Y_{i,j}$ (S6301).

Next, since the partial matrix (61-2)($H_{cp}$) relating to parity has the accumulate structure, the encoder 502LA performs the following calculation to obtain a parity.

$$P_{i,N+j}=Y_{i,j}\text{EXOR}P_{i,N+j-1}$$

(EXOR is modulo-2 addition.) However, when j is 1, the following calculation is performed.

$$P_{i,N+1}=Y_{i,j}\text{EXOR}0$$

Figure 64:
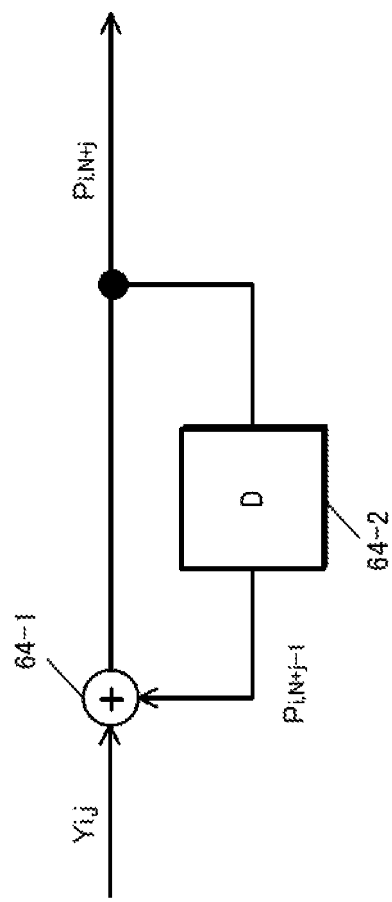
FIG. 64 shows an example of configuration that realizes accumulate processing.

FIG. 64 shows an example of a configuration that realizes the accumulate processing described above. FIG. 64 shows an exclusive OR 64-1 and a register 64-2.

The initial value of the register 64-2 is "0 (zero)".

<Bit Length Adjuster 6001>

Similarly to the bit length adjuster in Embodiment 1, the bit length adjuster 6001 receives an input of the first bit sequence 503, which is a codeword (block length (code length) of N bits, makes a bit length adjustment, and outputs a second bit sequence 6003.

A characteristic point is that the bit length adjuster 6001 uses at least one repetition of the bit value of a predetermined portion of the N-bit codeword (of the $i^{th}$ block) obtained by the encoding processing.

Figure 65:
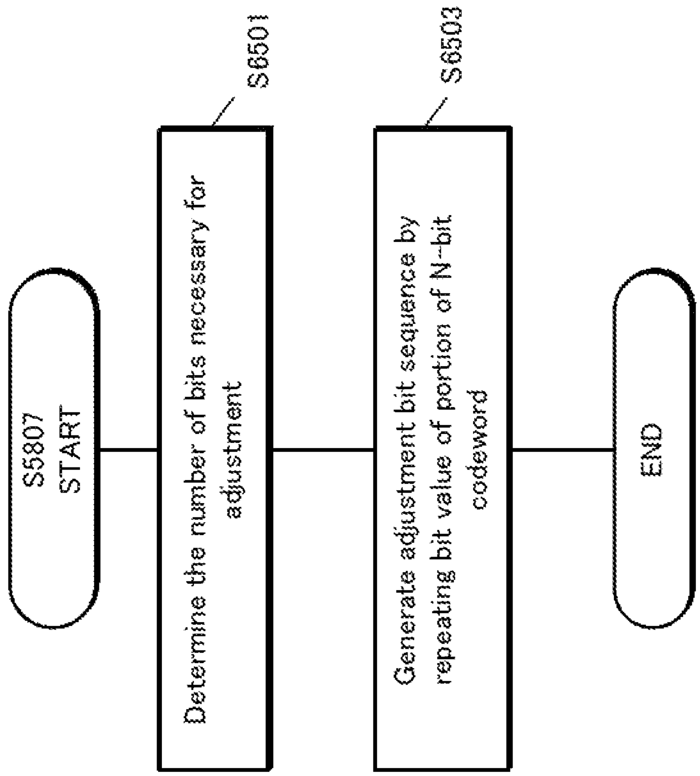
FIG. 65 is a flowchart of bit length adjustment processing according Embodiment 2.

FIG. 65 shows a flowchart of bit length adjustment processing according to the present embodiment.

The bit length adjustment processing is started under the condition corresponding to the condition under which step S5807 in FIG. 58 of Embodiment 1 is performed.

As with the case of FIG. 58, the number of bits necessary for adjustment is determined (step S6501). This step corresponds to step S5901 in FIG. 59 of Embodiment 1.

Next, a control unit instructs the bit length adjuster 6001 to generate a bit sequence for adjustment (hereinafter "adjustment bit sequence") by repeating the bit value of a predetermined portion of the N-bit codeword (S6503).

Figure 66:
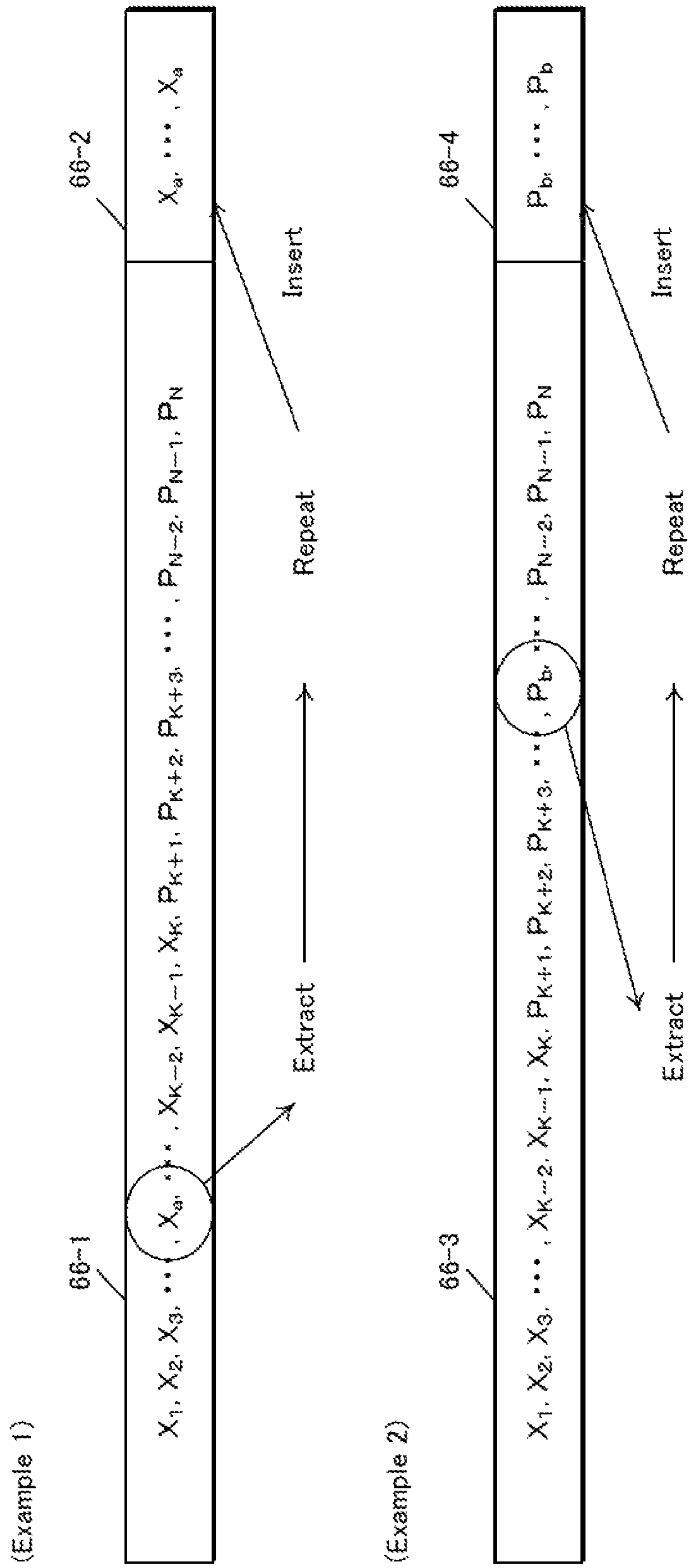
FIG. 66 shows an example of a generation scheme of an adjustment bit sequence.
Figure 67:
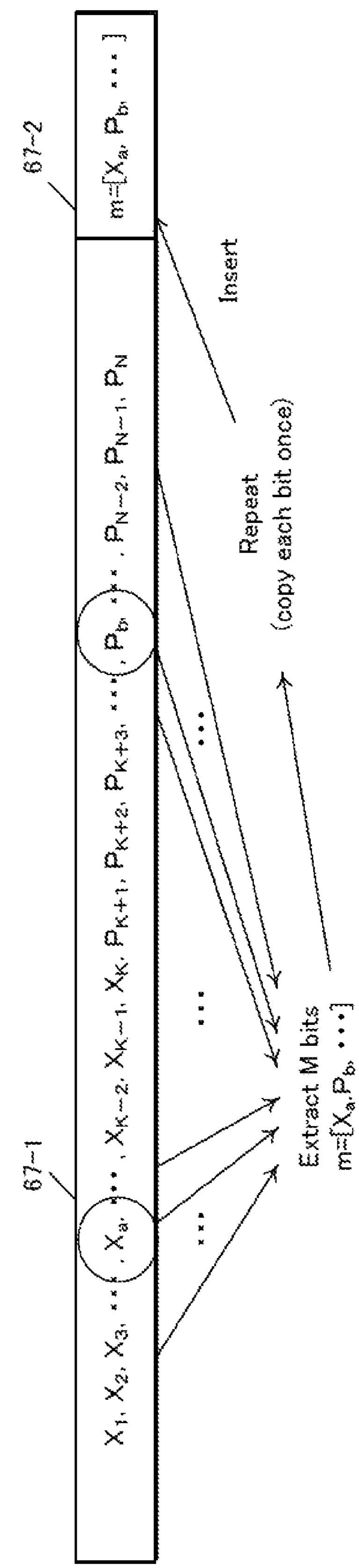
FIG. 67 shows an example of a generation scheme of an adjustment bit sequence.
Figure 68:
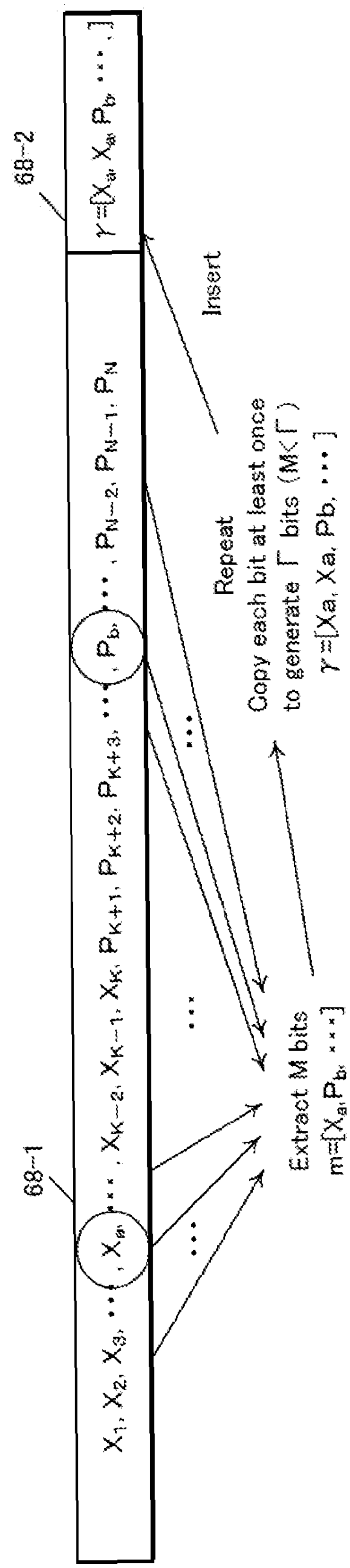
FIG. 68 shows an example of a generation scheme of an adjustment bit sequence.

The following describes examples of schemes for generating the adjustment bit sequence with use of FIGS. 66, 67, and 68.

As described above, the vector of the codeword of the LDPC code of the $i^{th}$ block is $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$.

<Generation Scheme of Adjustment Bit Sequence According to FIG. 66 (Example 1)>

In FIG. 66 (Example 1), the bit of $X_a$ is extracted from the information bits of the vector of the codeword of the LDPC code of the $i^{th}$ block, i.e., $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (66-1). Then, $X_a$ is repeated, whereby a plurality of $X_a$ (a plurality of bits) are generated. The plurality of $X_a$ are treated as an adjustment bit sequence (66-2), and the adjustment bit sequence (66-2) is added to the codeword of the LDPC code of the $i^{th}$ block (the resultant bit sequence is shown as 66-1 and 66-2 in FIG. 66). Accordingly, concerning the bit length adjuster 6001 of FIG. 60, the first bit sequence (503) input to the bit length adjuster 6001 is the codeword of the LDPC code of the $i^{th}$ block, and the second bit sequence (6003) output from the bit length adjuster 6001 is composed of the codeword 66-1 of the LDPC code of the $i^{th}$ block and the adjustment bit sequence 66-2.

Note that in FIG. 66 (Example 1), the adjustment bit sequence is inserted at (added to) the end of the codeword of the LDPC code of the $i^{th}$ block. However, no limitation is intended thereby, and the adjustment bit sequence may be inserted at any position within the codeword of the LDPC code of the $i^{th}$ block. Also, a plurality of blocks that are each composed of one or more bits may be generated from the adjustment bit sequence, and each of the blocks may be inserted at any position within the codeword of the LDPC code of the $i^{th}$ block.

<Generation Scheme of Adjustment Bit Sequence According to FIG. 66 (Example 2)>

In FIG. 66 (Example 2), the bit of $P_b$ is extracted from the parity bits of the vector of the codeword of the LDPC code of the $i^{th}$ block, i.e., $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (66-3). Then, $P_b$ is repeated, whereby a plurality of $P_b$ (a plurality of bits) are generated. The plurality of $P_b$ are treated as an adjustment bit sequence (66-2), and the adjustment bit sequence (66-4) is added to the codeword of the LDPC code of the $i^{th}$ block (the resultant bit sequence is shown as 66-3 and 66-4 in FIG. 66). Accordingly, concerning the bit length adjuster 6001 of FIG. 60, the first bit sequence (503) input to the bit length adjuster 6001 is the codeword of the LDPC code of the $i^{th}$ block, and the second bit sequence (6003) output from the bit length adjuster 6001 is composed of the codeword 66-3 of the LDPC code of the $i^{th}$ block and the adjustment bit sequence 66-4.

Note that in FIG. 66 (Example 2), the adjustment bit sequence is inserted at (added to) the end of the codeword of the LDPC code of the $i^{th}$ block. However, no limitation is intended thereby, and the adjustment bit sequence may be inserted at any position within the codeword of the LDPC code of the $i^{th}$ block. Also, a plurality of blocks that are each composed of one or more bits may be generated from the adjustment bit sequence, and each of the blocks may be inserted at any position within the codeword of the LDPC code of the $i^{th}$ block.

<Generation Scheme of Adjustment Bit Sequence According to FIG. 67>

In FIG. 67, M bits are selected from the information bits of the vector of the codeword of the LDPC code of the $i^{th}$ block, i.e., $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (67-1). For example, the selected bits include $X_a$ and $P_b$, and each bit out of the extracted M bits is copied once. At this time, a vector m composed of M bits is expressed by $m=[X_a, P_b, \ldots]$. Also, the vector $m=[X_a, P_b, \ldots]$ is treated as an adjustment bit sequence (67-2), and the adjustment bit sequence (67-2) is added to the codeword of the LDPC code of the $i^{th}$ block (the resultant bit sequence is shown as 67-1 and 67-2 in FIG. 67). Accordingly, concerning the bit length adjuster 6001 of FIG. 60, the first bit sequence (503) input to the bit length adjuster 6001 is the codeword of the LDPC code of the $i^{th}$ block, and the second bit sequence (6003) output from the bit length adjuster 6001 is composed of the codeword 67-1 of the LDPC code of the $i^{th}$ block and the adjustment bit sequence 67-2.

Note that in FIG. 67, the adjustment bit sequence is inserted at (added to) the end of the codeword of the LDPC code of the $i^{th}$ block. However, no limitation is intended thereby, and the adjustment bit sequence may be inserted at any position within the codeword of the LDPC code of the $i^{th}$ block. Also, a plurality of blocks that are each composed of one or more bits may be generated from the adjustment bit sequence, and each of the blocks may be inserted at any position within the codeword of the LDPC code of the $i^{th}$ block.

Furthermore, the adjustment bit sequence may be generated only from either the information bits or the parity bits, or alternatively, may be generated from both the information bits and the parity bits.

<Generation Scheme of Adjustment Bit Sequence According to FIG. 68>

In FIG. 68, M bits are selected from the information bits of the vector of the codeword of the LDPC code of the $i^{th}$ block. i.e., $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ (68-1). For example, the selected bits include $X_a$ and $P_b$, and each bit out of the extracted M bits is copied once. At this time, a vector m composed of M bits is expressed by $m=[X_a, P_b, \ldots]$.

Each bit of the vector composed of M bits, i.e., $m=[X_a, P_b, \ldots]$ is copied at least once, and a vector $\gamma$ composed of $\Gamma$ bits is expressed by $\gamma=[X_a, X_a, P_b, \ldots]$. (Note that $M<\Gamma$) Also, the vector $\gamma=[X_a, X_a, P_b, \ldots]$ is treated as an adjustment bit sequence (68-2), and the adjustment bit sequence (68-2) is added to the codeword of the LDPC code of the $i^{th}$ block (the resultant bit sequence is shown as 68-1 and 68-2 in FIG. 68).

Accordingly, concerning the bit length adjuster 6001 of FIG. 60, the first bit sequence (503) input to the bit length adjuster 6001 is the codeword of the LDPC code of the $i^{th}$ block, and the second bit sequence (6003) output from the bit length adjuster 6001 is composed of the codeword 68-1 of the LDPC code of the $i^{th}$ block and the adjustment bit sequence 68-2.

Note that in FIG. 68, the adjustment bit sequence is inserted at (added to) the end of the codeword of the LDPC code of the $i^{th}$ block. However, no limitation is intended thereby, and the adjustment bit sequence may be inserted at any position within the codeword of the LDPC code of the $i^{th}$ block. Also, a plurality of blocks that are each composed of one or more bits may be generated from the adjustment bit sequence, and each of the blocks may be inserted at any position within the codeword of the LDPC code of the $i^{th}$ block.

Furthermore, the adjustment bit sequence may be generated only from either the information bits or the parity bits, or alternatively, may be generated from both the information bits and the parity bits.

<Number of Bits of Adjustment Bit Sequence Generated by Bit Length Adjuster 6001>

The number of bits of an adjustment bit sequence generated by the bit length adjuster 6001 may be determined in the same manner as in Embodiment 1, etc., described above. Description on this point is provided below with reference to FIG. 60.

In FIG. 60, a first complex signal s1 (s1($t$), s1($f$), or s1($t,f$), where t denotes time, and f denotes frequency) is a baseband signal that can be expressed by an in-phase component I and a quadrature component Q, based on a modulation scheme, such as mapping for BPSK, QPSK, 16QAM, 64QAM, 256QAM, or the like. Similarly, a second complex signal s2 (s2($t$), s2($f$), or s2($t,f$)) is a baseband signal that can be expressed by the in-phase component I and the quadrature component Q, based on a modulation scheme, such as mapping for BPSK, QPSK, 16QAM, 64QAM, 256QAM, or the like.

The mapper 504 receives a second bit sequence as an input. Also, the mapper 504 demultiplexes the second bit sequence into bit sequences of (X+Y). The mapper 504 generates the first complex signal s1 with use of X bits in the bit sequence of (X+Y), based on the mapping of a first modulation scheme. Similarly, the mapper 504 generates the second complex signal s2 with use of Y bits in the bit sequence of (X+Y), based on the mapping of a second modulation scheme.

The encoder 502 performs encoding (with an error correction code) on a K-bit information sequence, and outputs the first bit sequence (503) which is an N-bit codeword.

Depending on the value of X+Y, the length of the codeword (N bits) output from the encoder may not be a multiple of X+Y which is the number of bits for generating the two complex signals s1 and s2.

For example, consider the case where a codeword length N is 64800 bits, 64QAM is used as a modulation scheme so that X=6, and 256QAM is used as a modulation scheme so that Y=8, i.e., X+Y=14. Also, consider the case where the codeword length N is 16200 bits, 256QAM is used as a modulation scheme so that X=8, and 256QAM is used as a modulation scheme so that Y=8, i.e., X+Y=16.

In both of the cases, "the length of the codeword (N bits) output from the encoder is not a multiple of X+Y which is the number of bits for generating the two complex signals s1 and s2".

Accordingly, in the present embodiment, even if the length of the codeword (N bits) output from the encoder is arbitrary, the mapper makes an adjustment in order to perform processing without leaving any remainder from the number of bits.

As a supplementary explanation, the following describes an advantage obtained when the length of the codeword (N bits) output from the encoder is a multiple of X+Y which is the number of bits for generating the two complex signals s1 and s2.

Consider the case where the transmission device efficiently transmits a block of an error correction code, which has a codeword length of N bits and is used by the transmission device for encoding. In this case, it is desirable that X+Y, which indicates the number of bits that are transmittable by the first complex signal s1 and the second complex signal s2 that are transmitted at the same frequency at the same time, not include bits of a plurality of blocks, since this configuration is more likely to allow the reduction of the memory size of the transmission device and/or the reception device.

For example, suppose that (the modulation scheme of the first complex signal s1, the modulation scheme of the second complex signal s2)=(16QAM, 16QAM). In this case, X+Y, which is the number of bits transmittable by the first complex signal s1 and the second complex signal s2 that are transmitted at the same frequency at the same time, is 8 bits, and it is desirable that the 8 bits not include data of a plurality of blocks (of an error correction code). In other words, in the modulation schemes selected by the transmission device, it is desirable that X+Y, which is the number of bits transmittable by the first complex signal s1 and the second complex signal s2 that are transmitted at the same frequency at the same time, not include data of a plurality of blocks (of an error correction code).

Accordingly, it is desirable that the length of the codeword (N bits) output from the encoder be a multiple of X+Y which is the number of bits for generating the two complex signals s1 and s2.

It is likely that the transmission device can switch between a plurality of modulation schemes for both the modulation scheme of the first complex signal s1 and the modulation scheme of the second complex signal s2. Accordingly, X+Y is likely to take a plurality of values.

At this time, X+Y may take a value that does not satisfy the condition that "the length of the codeword (N bits) output from the encoder is a multiple of X+Y which is the number of bits for generating the two complex signals s1 and s2". Accordingly, the processing scheme described in the following embodiment is necessary.

According to the control signal 512, the mapper 504 selects the first modulation scheme which is a modulation scheme used for generation of the complex signal s1(*t*), and the second modulation scheme which is a modulation scheme used for generation of the complex signal s2(*t*). The mapper 504 receives the second bit sequence 6003, and generates the first complex signal s1(*t*) and the second complex signal s2(*t*) with use of a bit sequence having X+Y bits included in the second bit sequence 6003, where X indicates the number of bits used to generate the first complex signal s1, and Y indicates the number of bits used to generate the second complex signal s2.

The bit length adjuster 6001 receives the first bit sequence 503 as an input, adjusts the bit length of the first bit sequence 503 (in the present example, the codeword length (the block length (code length) of a codeword (block) of an error correction code), and generates the second bit sequence 5703.

FIG. 58 shows bit length adjustment processing in a modulation processing scheme according to the present embodiment.

A controller (not shown) acquires X+Y, where X is the number of bits for generating the first complex signal s1 and Y is the number of bits for generating the second complex signal s2 (step S5801).

Next, the controller determines whether to make a bit length adjustment on a codeword length (block length (code length)) of a codeword (block) of the error correction code (step S5803). A condition for the determination may be whether or not a codeword length (block length (code length)) of N bits of the error correction code is a multiple of the value of X+Y, which is indicated by a control signal. Also, the above determination may be performed with use of a table showing the correspondence between X+Y and N. Information on X+Y may be determined based on information on the first modulation scheme which is a modulation scheme used for generation of the complex signal s1(*t*), and the second modulation scheme which is a modulation scheme used for generation of the complex signal s2(*t*).

For example, if a codeword length (block length (code length)) of N bits of the error correction code is 64800 bits and the value of X+Y is 16, the codeword length of N bits of the error correction code is a multiple of the value of X+Y. The controller determines that "a bit length adjustment is not to be made" (NO as a result of S5803).

When determining that a bit length adjustment is unnecessary (NO as a result of S5803), the controller causes the bit length adjuster 5701 to output the first bit sequence 503 as the second bit sequence 5703 without any adjustment (S5805). That is, in the example described above, the bit length adjuster 5701 receives a codeword of 64800 bits of the error correction code as an input, and outputs the codeword of 64800 bits of the error correction code. (The bit length adjuster 5701 outputs the received bit sequence 503 to the mapper 504 as the second bit sequence 5703.)

If a codeword length (block length (code length)) of N bits of the error correction code is 64800 bits and the value of X+Y is 14, the codeword length of N bits of the error correction code is not a multiple of the value of X+Y In this case, the controller determines that "a bit length adjustment is to be made" (YES as a result of S5803).

When determining that "a bit length adjustment is to be made", the controller causes the bit length adjuster 5701 to perform bit length adjustment processing on the first bit sequence 503 (S5805). In short, in the bit length adjustment processing of the present embodiment, an adjustment bit sequence is generated and added to the vector of the codeword of the LDPC code of the $i^{th}$ block, as described above. (For example, the bit length adjustment processing is performed as shown in FIGS. 66, 67, and 68.)

Accordingly, in the case where, for example, the codeword length (block length (code length)) N of the vector of the codeword of the LDPC code of the $i^{th}$ block is fixed, such as 64800 bits, and the value of X+Y. i.e., the set of the first modulation scheme and the second modulation scheme is switched to another set (or the setting of the first modulation scheme and the second modulation scheme is changeable), the number of bits of the adjustment bit sequence is appropriately changed. (Depending on the value of X+Y (the set of the first modulation scheme and the second modulation scheme), the adjustment bit sequence may be unnecessary.)

One important point is that the number of bits of the second bit sequence (6003) composed of the codeword of the LDPC code of the $i^{th}$ block and the adjustment bit sequence is a multiple of X+Y determined by the set of the first modulation scheme and the second modulation scheme that have been set.

The following describes examples of schemes for generating an adjustment bit sequence which are characteristic.

Figure 69:
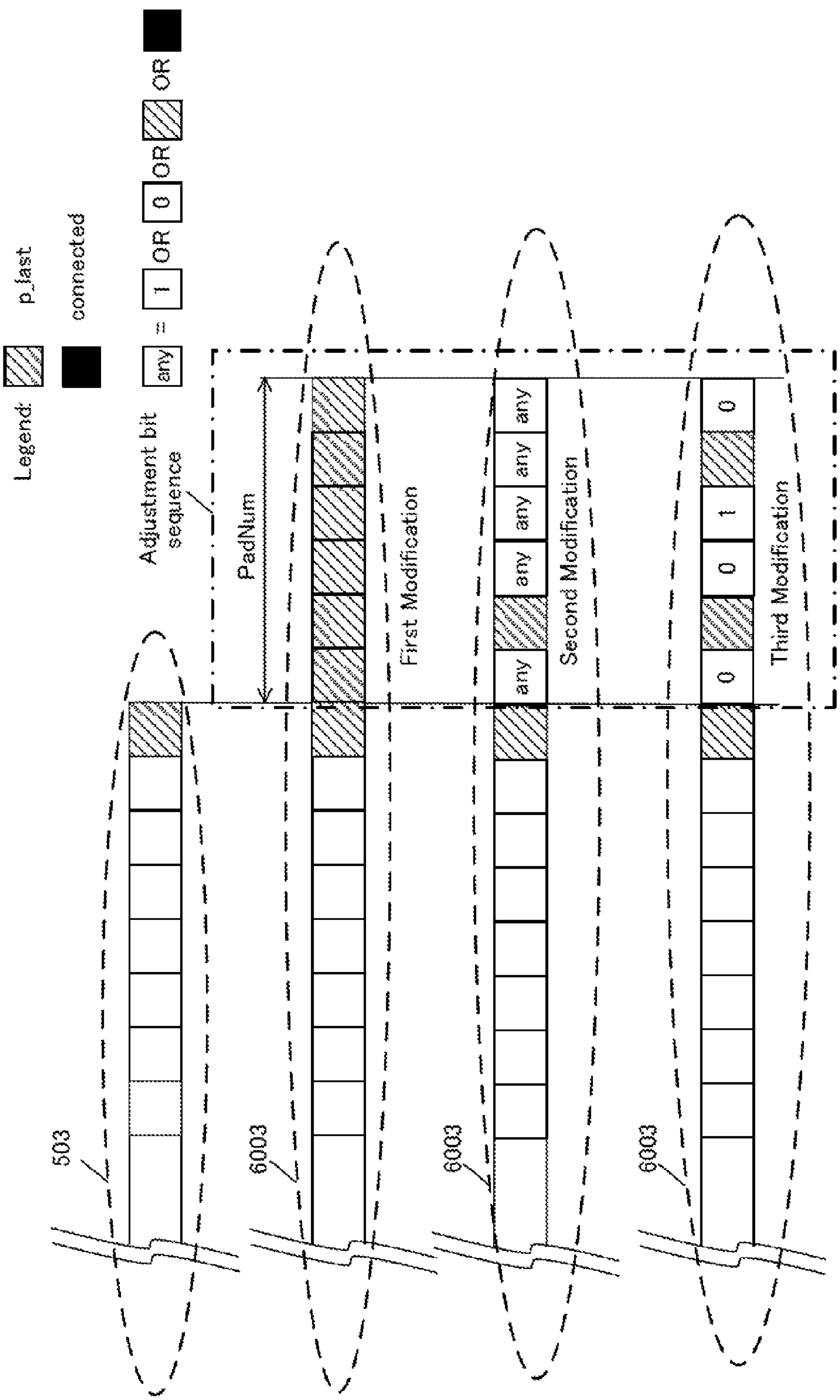
FIG. 69 shows a modification of an adjustment bit sequence generated by a bit length adjustment unit.
Figure 70:
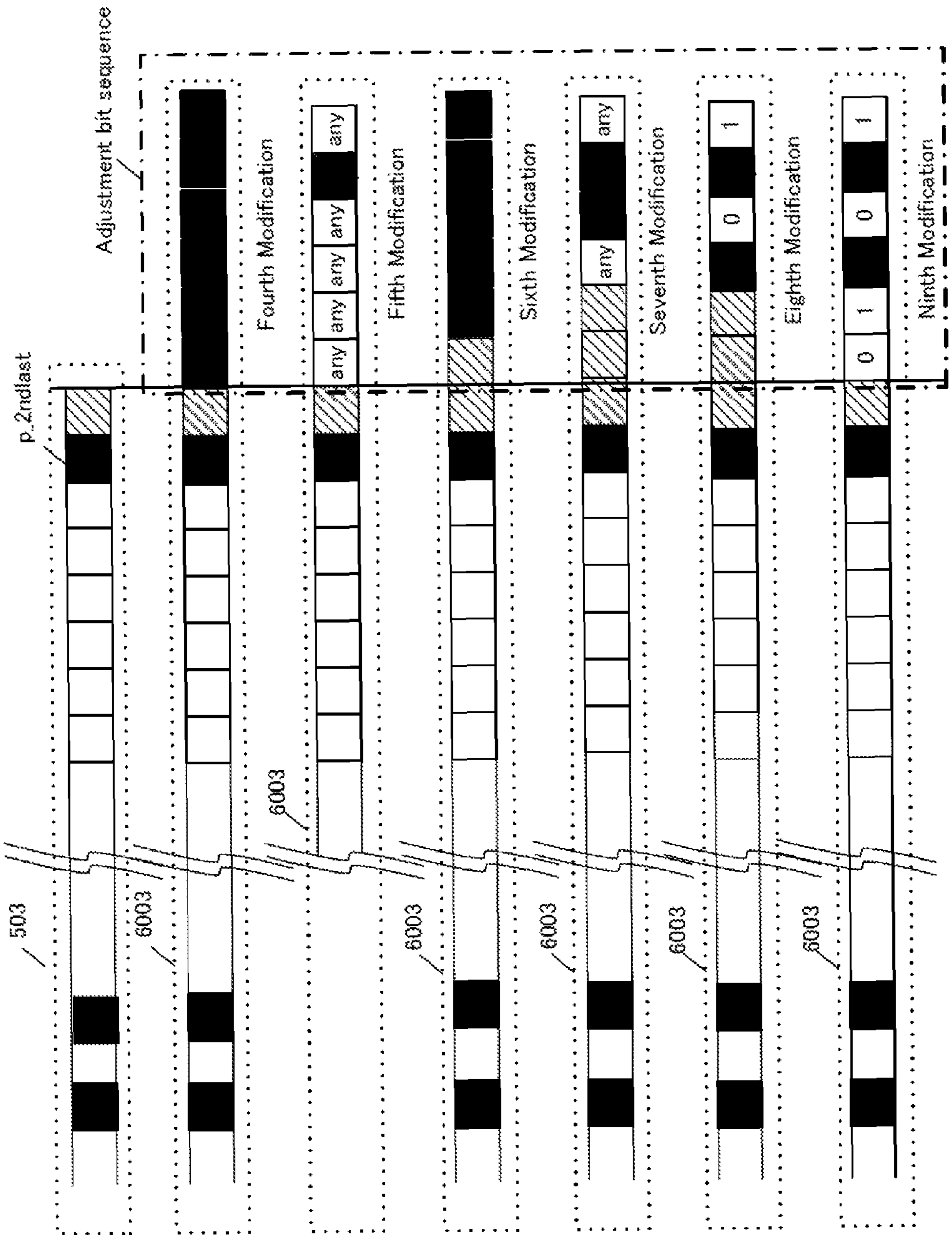
FIG. 70 shows a modification of an adjustment bit sequence generated by the bit length adjustment unit.

FIGS. 69 and 70 show modifications of an adjustment bit sequence generated by the bit length adjuster. The reference sign 503 in FIGS. 69 and 70 indicates the first bit sequence (503) input to the bit length adjuster 6001 shown in FIG. 60. The reference sign 6003 in FIGS. 69 and 70 indicates the second bit sequence output from the bit length adjuster. To facilitate understanding of the following description, in FIGS. 69 and 70, the second bit sequence 6003 is composed of the first bit sequence 503 and the adjustment bit sequence added to the end of the first bit sequence 503. (Note that the position to which the adjustment bit sequence is added is not limited to the position mentioned above.)

<Legend>

Each square frame indicates a bit of the first bit sequence 503 or the second bit sequence 6003.

Each square frame surrounding "0" in the figures indicates a bit having a value of "0".

Each square frame surrounding "1" in the figures indicates a bit having a value of "1".

A hatched square "p_last" indicates "the value of a bit corresponding to the last bit which is output last in the accumulate processing". In other words, in the LDPC code that is based on the parity-check matrix, and in which the partial matrix relating to parity has the accumulate structure, the p_last is $P_N$ where the vector of the codeword of the LDPC code of the $i^{th}$ block is $u=(X_1, X_2, X_3, \ldots, X_{K-2}, X_{K-1}, X_K, P_{K+1}, P_{K+2}, P_{K+3} \ldots, P_{N-2}, P_{N-1}, P_N)^T$. (In the LDPC code that is based on the parity-check matrix, and in which the partial matrix relating to parity has the accumulate structure, the p_last is a bit relating to the last column of the partial matrix relating to the parity having the accumulate structure.)

Each black square "connected" indicates any of connected bits, which are bits used by the encoder 502 during the processing of FIG. 63 in order to derive the value of p_last.

One of the connected bits has the value of a bit corresponding to the bit p_2ndlast which is the second last bit used for the derivation of p_last in the accumulate processing of step S6303. In other words, in the LDPC code that is based on the parity-check matrix, and in which the partial matrix relating to parity has the accumulate structure, the p_2ndlast is one of the connected bits, and is $P_{N-1}$ where the vector of the codeword of the LDPC code of the $i^{th}$ block is $u=(X_1, X_2, X_3, \ldots, X_{K-2}, X_{K-1}, X_K, P_{K+1}, P_{K+2}, P_{K+3} \ldots, P_{N-2}, P_{N-1}, P_N)^T$.

Also, in the parity-check matrix H (matrix with N−K rows and N columns) of the LDPC code, in which the vector of the codeword of the LDPC code of the $i^{th}$ block is $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$ and the partial matrix relating to the parity has the accumulate structure, the vector having the N−K rows is h K. At this time, $h_{N-K}$ is a vector with one row and N columns.

In the vector $h_{N-K}$, the column having a value of "1" is assumed to be g. Note that g is an integer from 1 to K. At this time, Xg is a candidate for a connected bit.

In the figures, each square frame surrounding "any" is a bit of either "0" or "1".

Also, the length of the arrow indicated by "PadNum" indicates the number of adjustment bits when the bit length is adjusted (in a scheme for compensating deficiencies).

The following describes examples. The hatched p_last is $P_N$.

The bit length adjuster 6001 of FIG. 60 generates any of the adjustment bit sequences described in the following modifications. (Note that the adjustment bit sequence may be arranged at the position other than the position shown in FIG. 60, as described above.

<First Modification in FIG. 69>

The bit length adjuster 6001 generates the adjustment bit sequence by repeating the value of p_last at least once.

<Second Modification in FIG. 69>

The bit length adjuster 6001 generates part of the adjustment bit sequence by repeating the value of p_last at least once. Each of the bits "any" is also generated from any of the bits in the vector of the codeword of the LDPC code of the $i^{th}$ block, i.e., $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$.

<Third Modification in FIG. 69>

The bit length adjuster 6001 generates part of the adjustment bit sequence by repeating the value of p_last at least once. The other part of the adjustment bit sequence is made up of predetermined bits.

<Fourth Modification in FIG. 70>

The bit length adjuster 6001 generates the adjustment bit sequence by repeating the value of a connected bit at least once.

<Fifth Modification in FIG. 70>

The bit length adjuster 6001 generates part of the adjustment bit sequence by repeating the value of a connected bit at least once. Each of the bits "any" is also generated from any of the bits in the vector of the codeword of the LDPC code of the $i^{th}$ block, i.e., $u=(X_1, X_2, X_3, \ldots, X_{K-2}, X_{K-1}, X_K, P_{K+1}, P_{K+2}, P_{K+3}, \ldots, P_{N-2}, P_{N-1}, P_N)^T$.

<Sixth Modification in FIG. 70>

The bit length adjuster 6001 generates the adjustment bit sequence from the value of p_last and the value of a connected bit.

<Seventh Modification in FIG. 70>

The bit length adjuster 6001 generates part of the adjustment bit sequence from the value of p_last and the value of a connected bit. Each of the bits "any" is also generated from any of the bits in the vector of the codeword of the LDPC code of the $i^{th}$ block, i.e., $u=(X_1, X_2, X_3, \ldots, X_{K-2}, X_{K-1}, X_K, P_{K-1}, P_{K+2}, P_{K+3}, \ldots, P_{N-2}, P_{N-1}, P_N)^T$.

<Eighth Modification in FIG. 70>

The bit length adjuster 6001 generates part of the adjustment bit sequence from the value of p_last and the value of a connected bit. The other part of the adjustment bit sequence is made up of predetermined bits.

<Ninth Modification in FIG. 70>

The bit length adjuster 6001 generates part of the adjustment bit sequence from the value of a connected bit. The other part of the adjustment bit sequence is made up of predetermined bits.

Advantageous Effect of the Present Embodiment

Figure 71:
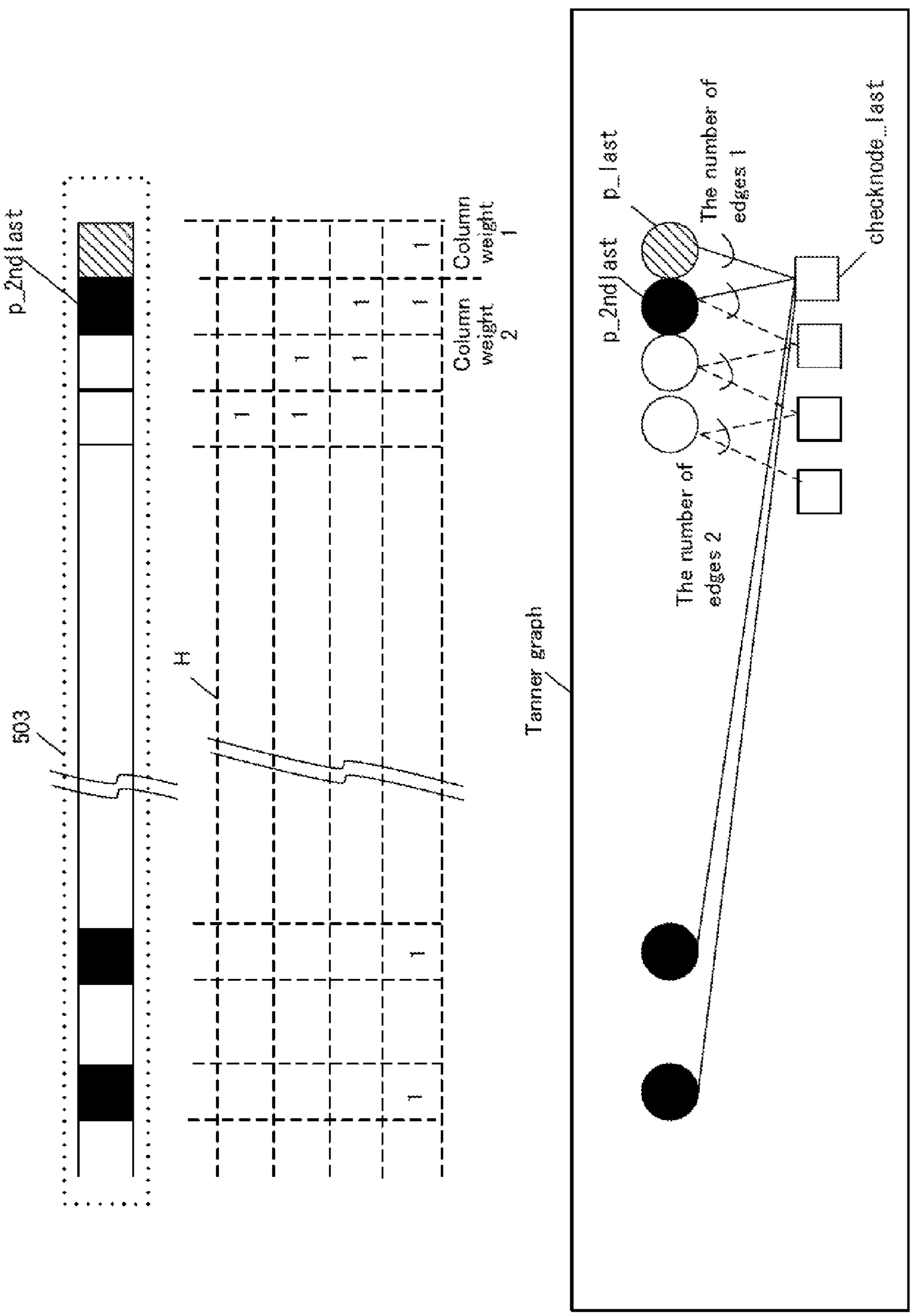
FIG. 71 illustrates one of points of the invention according to Embodiment 2.
Figure 72:
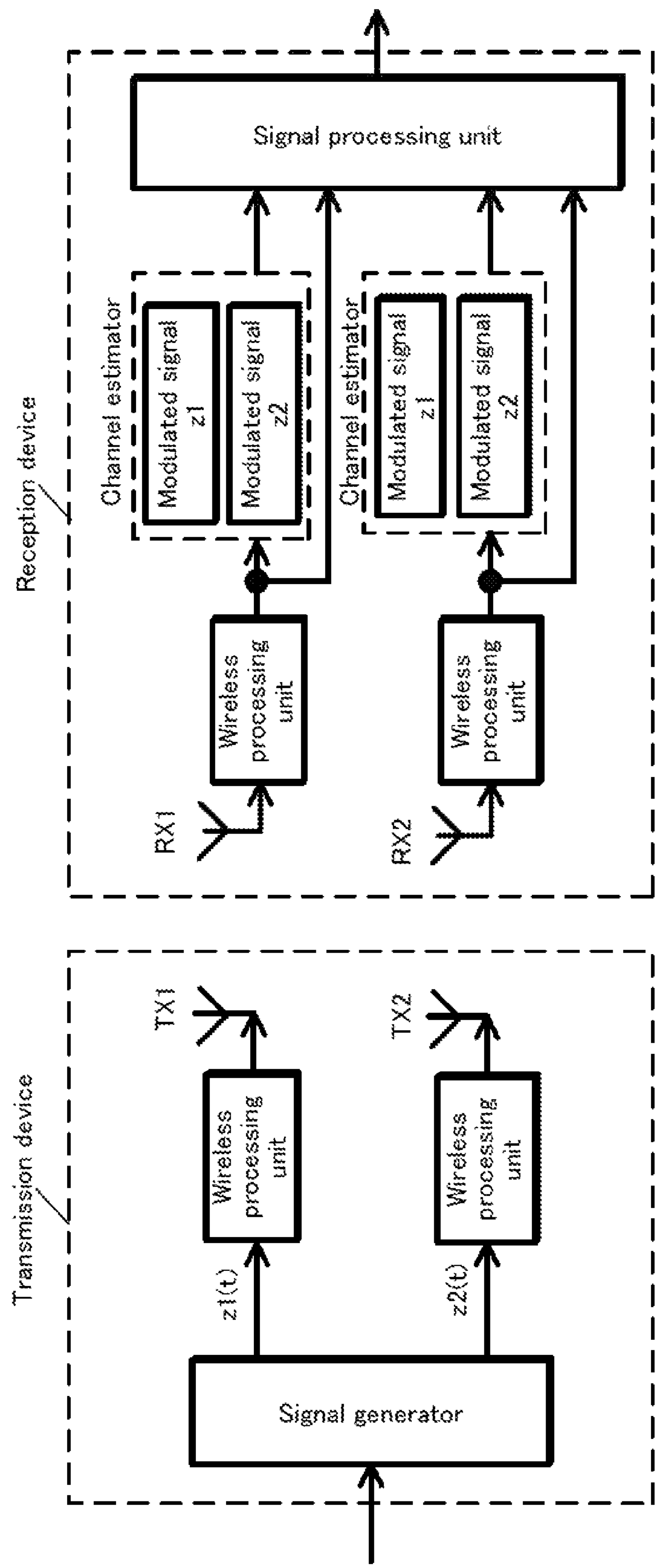
FIG. 72 shows an outline of a MIMO system.

FIG. 71 illustrates one of the points of the invention according to the present embodiment.

The upper part of FIG. 71 shows the first bit sequence (the codeword of the LDPC code of the $i^{th}$ block) 503 which is also shown in FIGS. 69 and 70.

The middle part of FIG. 71 shows the parity check matrix H of a modeling LDPC code, which is modeled for the LDPC coding processing involving the accumulate processing (i.e., processing of step S6303).

The value "1" in the figure corresponds to an edge in a tanner graph for the parity-check matrix of the modeling LDPC code. As described in step S6303, the value of p_last is calculated with use of the value of p_2ndlast. However, the value of p_last is the last bit in the accumulate processing order, and has no relation with the value of the next bit. Accordingly, in the parity-check matrix H of the modeling LDPC code, the column weight of p_last (or bits corresponding to p_last), which is column weight 1, is smaller than the column weight of bits corresponding to another parity portion, which is column weight 2. (Note that the column weight is the number of elements with the value "1", in the column vector of each column in the parity-check matrix.)

The lower part of FIG. 71 shows a tanner graph of the parity-check matrix H of the modeling LDPC code.

Each of the circles "○" indicates a variable (bit) node. The hatched circle indicates a variable (bit) node abstracting p_last. Each of the black circles indicates a bit node abstracting a connected bit. The squares "□" at the bottom of the figure indicate check nodes connected to these variable (bit) nodes. In particular, the check node indicated by checknode_last is a check node connected to a bit node abstracting p_last (having the number of edges 1). In the lower part of the figure, each of the variable (bit) nodes connected to the solid lines is connected to checknode_last.

The connected bits are bits, including p_2ndlast, that are directly connected to checknode_last. In the lower part of the figure, each of the solid lines indicates an edge directly connected to checknode_last. Each of the dashed lines indicates an edge connected to a check node other than checknode_last for the parity-check matrix H of the modeling LDPC code.

The following considers the case where BP (Belief Propagation) decoding, such as sum-product decoding, is performed on the LDPC code in which the partial matrix relating to parity has the accumulate structure.

A focus is placed on the tanner graph in the lower part of FIG. 71. In particular, a focus is placed on the graph formed with the variable (bit) nodes and the check nodes for parity.

At this time, each of the variable (bit) nodes that abstract bits of a parity portion other than p_last, such as p_2ndlast, is connected to two check nodes (the number of edges 2 in the figure).

Concerning the graph formed with the variable (bit) nodes and the check nodes for parity when the number of parity edges is two, external values are obtained from two directions (check nodes). Due to iterative decoding, beliefs are propagated from a distant check node and a distant variable (bit) node.

On the other hand, in the graph formed with the variable (bit) nodes and the check nodes for parity, the variable (bit) node abstracting p_last has an edge (the line indicated by the number of edges 1 in the figure) with only one check node (checknode_last).

This means that the variable (bit) node of p_last obtains an external value from only one direction. As described above, due to the iterative decoding, beliefs are propagated from a distant check node and a distant variable (bit) node. Since the variable (bit) node of p_last obtains an external value from only one direction, and cannot obtain many beliefs, the belief of p_last is lower than the belief of the other parity bits.

The low belief of p_last causes error propagation over the other bits.

Accordingly, improving the belief of p_last can suppress the occurrence of error propagation, resulting in the improvement of the belief of the other bits. Based on the above point, the present invention according to the present embodiment suggests that p_last be repeatedly transmitted.

Note that the belief of the connected bits decreases as the belief of p_last decreases. (This point can be known from the relationship of "Hu=0" described above. The low belief of the connected bits causes error propagation over the other bits.

Accordingly, improving the belief of the connected bits can suppress the occurrence of error propagation, resulting in the improvement of the belief of the other bits. Based on the above point, the present invention according to the present embodiment suggests that the connected bits be repeatedly transmitted.

Needless to say, the embodiments described in the present specification may be arbitrarily combined for implementation.

Embodiment 3

Figure 73:
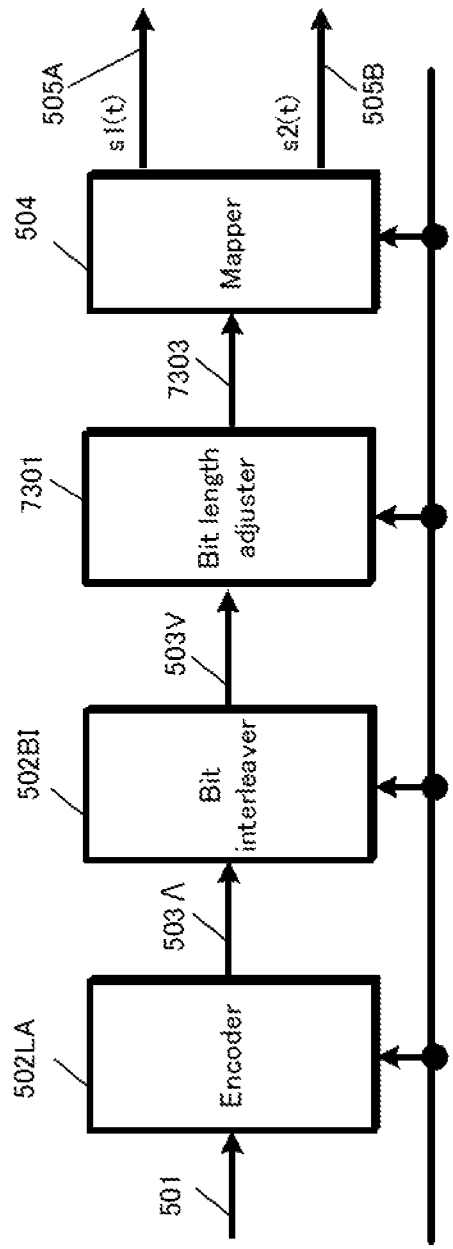
FIG. 73 shows configuration of a modulator according to Embodiment 3.

FIG. 73 shows the configuration of a modulator of the present embodiment.

The modulator of FIG. 73 includes the encoder 502LA, a bit interleaver 502BI, a bit length adjuster 7301, and the mapper 504.

Since the mapper 504 performs the same operation as in the above embodiments, description thereof is omitted.

The encoder 502LA receives k-bit information of the $i^{th}$ block as an input, and outputs an N-bit codeword (sequence) 503A of the $i^{th}$ block. The N-bit sequence 503A has a particular number of bits, such as 4320 bits, 16800 bits, or 64800 bits.

For example, the bit interleaver 502BI receives the N-bit sequence 503A of the $i^{th}$ block, performs bit interleave processing, and outputs an N-bit (interleaved) sequence 503V. In the interleave processing, the bit interleaver 502BI permutes the bits input thereto, and outputs a bit sequence resulting from the permutation. For example, suppose that the input bits of the bit interleaver 502BI are arranged in the order of b1, b2, b3, b4, and b5. In this case, interleave processing is performed so that the output bits of the bit interleaver 502BI are arranged in the order of b2, b4, b5, b1, and b3. (Note that no limitation is intended by this order.)

For example, the bit length adjuster 7301 receives an N-bit (bit-interleaved) sequence 503V as an input, adjusts the bit length thereof, and outputs a bit sequence 7303 resulting from the bit length adjustment.

Figure 74:
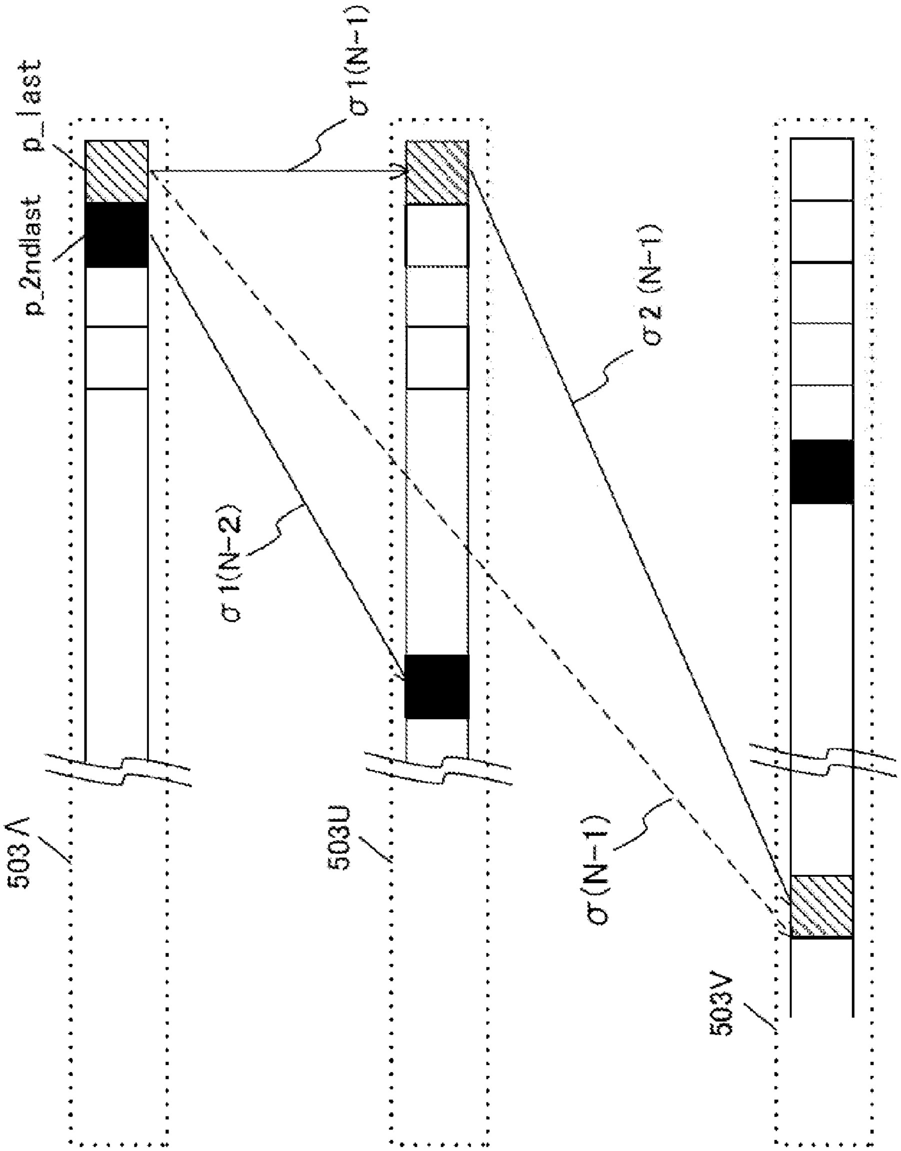
FIG. 74 illustrates a bit sequence output as a result of an operation by a bit interleaver 502BI.

FIG. 74 shows a bit sequence output as a result of an operation by the bit interleaver 502BI shown in FIG. 73. Note that FIG. 74 shows merely an example of a bit interleave scheme, and it is acceptable to employ a different bit interleave scheme.

The hatched squares and black squares in FIG. 74 are used in the same manner as in FIG. 69, etc., in Embodiment 2.

In FIG. 74, the reference sign 503A indicates the order of bits of the bit sequence before the bit interleave processing.

The reference sign 503U indicates the order of bits of the bit sequence after the first bit interleave processing (σ1).

The reference sign 503V indicates the order of bits of the bit sequence after the second bit interleave processing (σ2).

The solid arrow indicates that the bit located at a position (order) of the base of the arrow is moved to the position (order) of the head of the arrow by the first bit interleave processing. For example, the reference sign σ1(N−1) indicates that p_last at the position of N−1, which is the value of the last bit of the parity portion, is moved as a result of the first interleave processing. In the example of FIG. 74, σ1(N−1) equals to N−1, and the position of p_last does not change. The reference sign σ1(N−2) indicates the movement of the position of p_2ndlast.

The bit interleave processing is performed to lengthen the distance between two adjacent bits within the codeword generated by the coding using an LDPC code, in particular within the parity of the codeword, and thereby to enhance the robustness with respect to a burst error occurring in a communication channel. As a result of the interleave processing σ1, p_last and p_2ndlast which were adjacent immediately after encoding processing as shown in 503A are arranged with a distance therebetween as shown in 503U.

The dashed arrow indicates that the bit located at the position (order) of the base of the arrow is moved to the position (order) of the head of the arrow by bit interleave processing which is performed a plurality of times (σ1, σ2, . . . ). The reference sign σ(N−1) indicates the composition of a plurality of permutations including σ1 and σ2. In the example of FIG. 74 in which two permutations are performed, σ(N−1) equals σ2(σ1(N−1)).

As described above, the bit interleaver 502BI performs interleave processing to permute the bits input thereto and outputs a bit sequence resulting from the permutation.

Figure 75:
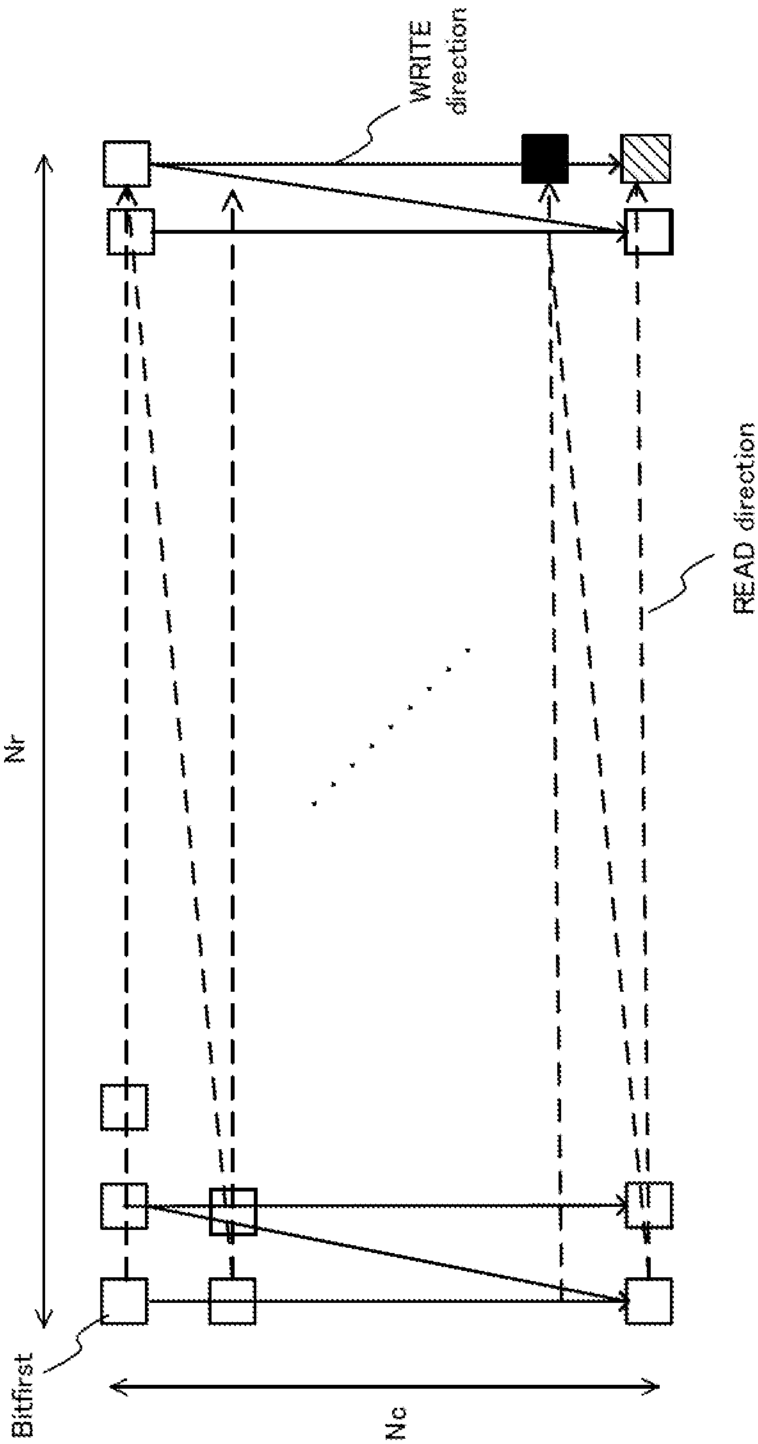
FIG. 75 shows an example of implementation of a bit interleaver 502.

FIG. 75 shows an implementation example of the bit interleaver 502.

The interleave processing is performed by writing a bit sequence targeted for interleaving to a memory having a size of Nr×Nc in a predetermined write order, and reading the written bit sequence from the memory in a read order that differs from the write order, where Nr and Nc are divisors of the number of bits of the bit sequence.

First, the bit interleaver reserves the memory for N bits targeted for the bit interleave processing. Here, N=Nr×Nc.

Nr and Nc can be changed according to the coding rate of an error correction code and/or a preset modulation scheme (or preset modulation schemes).

In FIG. 75, Nr×Nc squares each indicate a storage cell in which a corresponding bit value is written (the value "0" or "1" is stored).

Each of the solid arrows in the vertical direction (WRITE direction) indicates that the bit sequence is written into the memory in the direction from the base of the arrow to the head of the arrow. Bitfirst in FIG. 75 indicates the position at which the initial bit is written. The write position of the top bit of each column may be changed.

Each of the dashed arrows in the horizontal direction (READ direction) indicates the direction in which the bit sequence is read from the memory.

The example of FIG. 75 shows the processing of permuting the bits of the parity portion in the bit sequence 503A (i.e., parity interleave processing). The space between p_2ndlast and p_last, which have been written into the storage cells whose addresses are consecutive in the WRITE direction, will increase.

Figure 76:
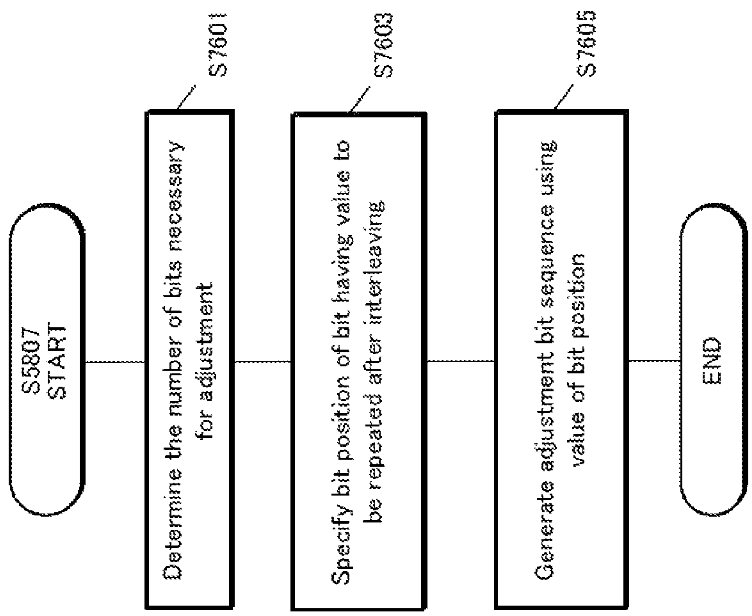
FIG. 76 shows an example of bit length adjustment processing.

FIG. 76 shows a flowchart of bit length adjustment processing according to the present embodiment.

First, a controller, which is not shown in FIG. 73, determines the number of bits necessary for adjustment (step S7601). This step corresponds to step S5901 in FIG. 59 of Embodiment 1.

Next, the controller specifies, for the bit length adjuster 7301 in FIG. 73, positions at which to add a bit sequence (e.g., bits to be added as described in Embodiment 1, or the adjustment bit sequence as described in Embodiment 2), within the N-bit codeword of the $i^{th}$ block after interleaving (S7603).

Figure 77:
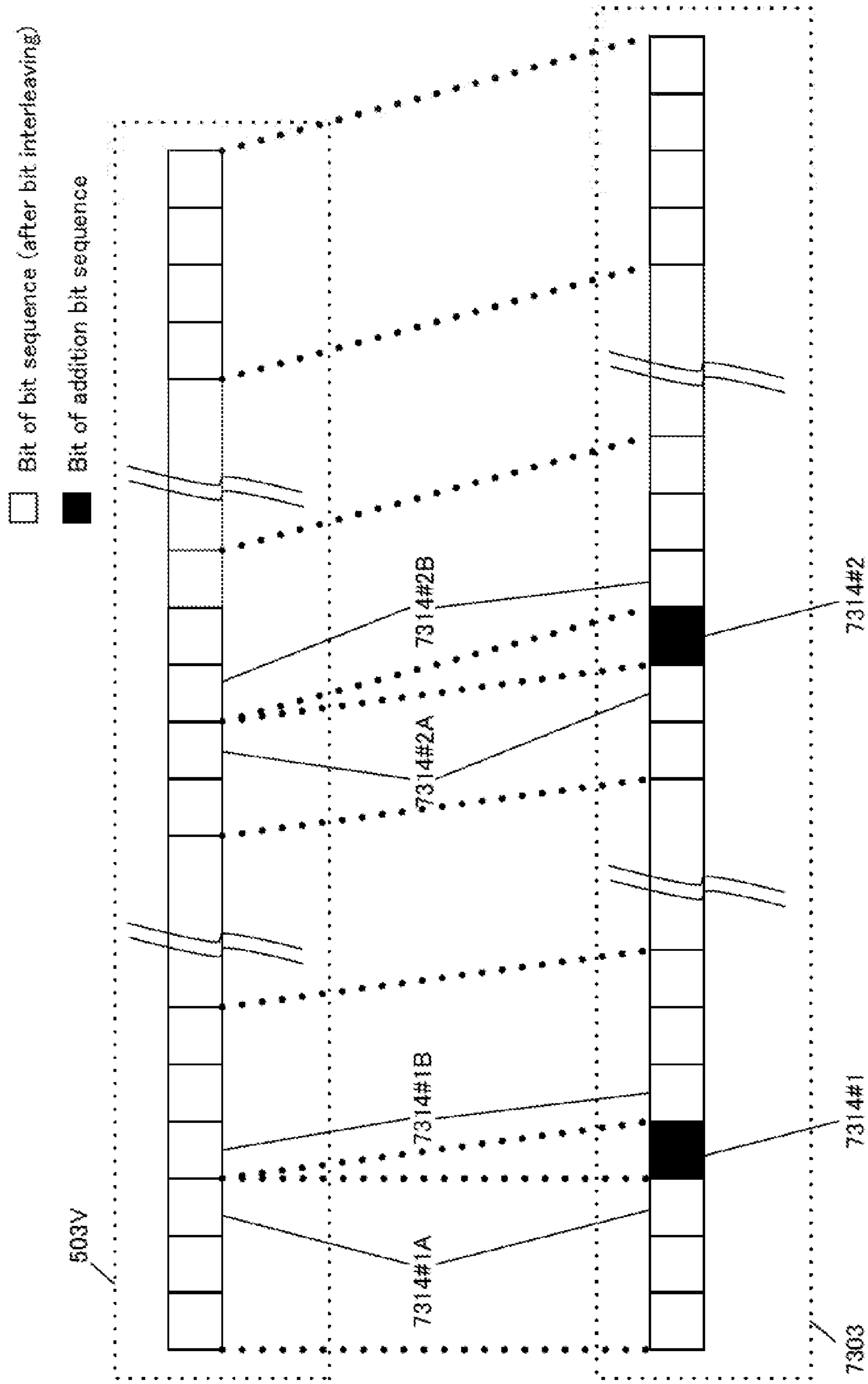
FIG. 77 shows an example of a bit sequence to be added.

The following describes an example using FIG. 77. In FIG. 77, the reference sign 503V indicates a bit sequence after interleaving shown in FIG. 73. For example, the bit sequence is the N-bit codeword of the $i^{th}$ block after interleaving.

The reference sign 7303 indicates a post-adjustment bit sequence which is a bit sequence after bit length adjustment shown in FIG. 73. The post-adjustment bit sequence 7303 is composed of the N-bit codeword of the $i^{th}$ block after interleaving and an addition bit sequence which is a bit sequence to be added to the N-bit codeword.

In FIG. 77, each square "□" indicates a bit of the N-bit codeword of the $i^{th}$ block after interleaving, and each black square "■" indicates a bit of the addition bit sequence.

In the example of FIG. 77, the post-adjustment bit sequence 7303 is generated by inserting a bit (■) 7314#1 of the addition bit sequence between a bit (□) 7314#1A and a bit (□) 7314#1B of the N-bit codeword, and inserting a bit (■) 7314#2 of the addition bit sequence between a bit (□) 7314#2A and a bit (□) 7314#2B of the N-bit codeword. That is, the post-adjustment bit sequence 7303 is generated by insertion/addition of the addition bit sequence into the N-bit codeword of the $i^{th}$ block after interleaving.

As described in Embodiments 1 and 2, "in the case where the codeword length (block length (code length)) N of the vector of the codeword (of the LDPC code) of the $i^{th}$ block is fixed, such as 64800 bits, and the value of X+Y, i.e., the set of the first modulation scheme for s1($t$) and the second modulation scheme for s2($t$) is switched to another set (or the setting of the first modulation scheme for s1($t$) and the second modulation scheme for s2($t$) is changeable), the number of bits of the adjustment bit sequence is appropriately changed". (Depending on the value of X+Y (the set of the first modulation scheme for s1($t$) and the second modulation scheme for s2($t$)), the addition bit sequence may be unnecessary.)

One important point is that the number of bits of the post-adjustment bit sequence 7303 composed of the codeword of the LDPC code of the $i^{th}$ block and the addition bit sequence is a multiple of X+Y determined by the set of the first modulation scheme for s1($t$) and the second modulation scheme for s2($t$) that have been set.

According to the description above, the bit length adjuster 7301 receives the N-bit (bit-interleaved) sequence 503V as an input, adjusts the bit length thereof, and outputs the bit sequence 7303 resulting from the bit length adjustment, for example. However, the bit length adjuster 7301 may receive an (N×z)-bit (bit-interleaved) sequence as an input instead of the N-bit (bit-interleaved) sequence 503V, adjust the bit length thereof, and output the bit sequence 7303 resulting from the bit length adjustment (z being an integer greater than or equal to 1).

FIG. 75 shows an implementation example of the bit interleaver 502.

The interleave processing is performed by writing a bit sequence targeted for interleaving to a memory having a size of Nr×Nc in a predetermined write order, and reading the written bit sequence from the memory in a read order that differs from the write order, where Nr and Nc are divisors of the number of bits of the bit sequence.

First, the bit interleaver reserves the memory for N×z bits targeted for the bit interleave processing. Here, N×z=Nr×Nc Nr and Nc can be changed according to the coding rate of an error correction code and/or a preset modulation scheme (or preset modulation schemes).

In FIG. 75, Nr×Nc squares each indicate a storage cell in which a corresponding bit value is written (the value "0" or "1" is stored).

Each of the solid arrows in the vertical direction (WRITE direction) indicates that the bit sequence is written into the memory in the direction from the base of the arrow to the head of the arrow. Bitfirst in FIG. 75 indicates the position at which the initial bit is written. The write position of the top bit of each column may be changed.

Each of the dashed arrows in the horizontal direction (READ direction) indicates the direction in which the bit sequence is read from the memory.

The example of FIG. 75 shows the processing of permuting the bits of the parity portion in the bit sequence 503A (i.e., parity interleave processing). The space between p_2ndlast and p_last, which have been written into the storage cells whose addresses are consecutive in the WRITE direction, will increase.

FIG. 76 shows a flowchart of bit length adjustment processing according to the present embodiment.

First, a controller, which is not shown in FIG. 73, determines the number of bits necessary for adjustment (step S7601). This step corresponds to step S5901 in FIG. 59 of Embodiment 1.

Next, the controller specifies, for the bit length adjuster 7301 in FIG. 73, positions at which to add a bit sequence (e.g., bits to be added as described in Embodiment 1, or the adjustment bit sequence as described in Embodiment 2), within z blocks that are each an N-bit codeword after interleaving (S7603).

The following describes an example using FIG. 77. In FIG. 77, the reference sign 503V indicates a bit sequence after interleaving shown in FIG. 73. For example, the bit sequence is composed of z blocks that are each an N-bit codeword after interleaving.

The reference sign 7303 indicates a post-adjustment bit sequence which is a bit sequence after bit length adjustment shown in FIG. 73. The post-adjustment bit sequence 7303 is composed of z blocks that are each an N-bit codeword after interleaving and an addition bit sequence which is a bit sequence to be added to the z blocks.

In FIG. 77, each square "□" indicates a bit of the z blocks that are each an N-bit codeword, and each black square "■" indicates a bit of the addition bit sequence.

In the example of FIG. 77, the post-adjustment bit sequence 7303 is generated by inserting the bit (■) 7314#1 of the addition bit sequence between the bit (□) 7314#1A and the bit (□) 7314#1B, and inserting the bit (■) 7314#2 of the addition bit sequence between the bit (□) 7314#2A and the bit (□) 7314#2B. That is, the post-adjustment bit sequence 7303 is generated by insertion/addition of the addition bit sequence into the z blocks that are each an N-bit codeword after interleaving (S7605).

As with the case of Embodiments 1 and 2, "in the case where the codeword length (block length (code length)) N of the vector of the codeword (of the LDPC code) of the $i^{th}$ block is fixed, such as 64800 bits, and the value of X+Y, i.e., the set of the first modulation scheme s1($t$) and the second modulation scheme s2($t$), is switched to another set (or the setting of the first modulation scheme for s1($t$) and the second modulation scheme for s2($t$) is changeable), the number of bits of the addition bit sequence is appropriately changed". (Depending on the value of X+Y (the set of the first modulation scheme for s1($t$) and the second modulation scheme for s2($t$)), the addition bit sequence may be unnecessary.)

One important point is that the number of bits of the post-adjustment bit sequence 7303 composed of (i) a bit sequence composed of z codewords that are each a codeword of the LDPC code, i.e., (N×z)-bit sequence and (ii) the addition bit sequence is a multiple of X+Y determined by the set of the first modulation scheme for s1($t$) and the second modulation scheme for s2($t$) that have been set.

<Point of the Present Embodiment>

(1) Measures Against Changes of Modulation Schemes

As described in Embodiments 1 and 2, an aim of the present invention is to take measures against the deficiencies of bits resulting from switching of the set of the modulation scheme of the complex signal s1($t$) and the modulation scheme of the complex signal s2($t$).

(When Interleaving Size is N Bits)

(Advantage 1)

As described above, "the number of bits of the post-adjustment bit sequence 7303 composed of the codeword of the LDPC code of the $i^{th}$ block and the addition bit sequence is a multiple of X+Y determined by the set of the first modulation scheme for s1($t$) and the second modulation scheme for s2($t$) that have been set".

In this way, when the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. This configuration is more likely to allow the reduction of the memory size of the transmission device and/or the reception device.

(Advantage 2)

Suppose that the value of X+Y, i.e., the set of the first modulation scheme for s1($t$) and the second modulation scheme s2($t$), is switched to another set (or the setting of the first modulation scheme for s1($t$) and the second modulation scheme for s2($t$) is changeable). In this case, since the bit length adjuster 7301 is arranged after the bit interleaver 502B1, as shown in FIG. 73, the memory size of the bit interleaver is the same regardless of the set of the first modulation scheme for s1(t) and the second modulation scheme s2(t). This produces an advantageous effect of preventing an increase in the memory of the bit interleaver. (If the order of the bit interleaver 502BI and the bit length adjuster 7301 is reversed, the memory size may need to be changed depending on the set of the first modulation scheme for s1(t) and the second modulation scheme for s2(t). Accordingly, it is important to arrange the bit length adjuster 7301 after the bit interleaver 502BI. In FIG. 73, the bit length adjuster 7301 is arranged immediately after the bit interleaver 502BI. However, an interleaver that performs different interleaving or another processing unit may be inserted between the bit interleaver 502B1 and the bit length adjuster 7301.)

Note that a plurality of codeword lengths (block lengths (code lengths)) may be prepared for the error correction code. For example, Na bits and Nb bits may be prepared each as the codeword length (block length (code length)) of the error correction code. In the case where the error correction code having a codeword length (block length (code length)) of Na bits is used, the memory size of the bit interleaver is set to Na bits, and bit interleaving is performed with the memory size of Na bits. Subsequently, the bit length adjuster 7301 of FIG. 73 adds the addition bit sequence if necessary. Similarly, in the case where the error correction code having a codeword length (block length (code length)) of Nb bits is used, the memory size of the bit interleaver is set to Nb bits, and bit interleaving is performed with the memory size of Nb bits. Subsequently, the bit length adjuster 7301 of FIG. 73 adds the addition bit sequence if necessary.

(When Interleaving Size is N×z Bits)

(Advantage 3)

As described above, the number of bits of the post-adjustment bit sequence 7303 composed of (i) a bit sequence composed of z codewords that are each a codeword of the LDPC code, i.e., (N×z)-bit sequence and (ii) the addition bit sequence is a multiple of X+Y determined by the set of the first modulation scheme for s1(t) and the second modulation scheme for s2(t) that have been set.

In this way, when the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a block other than the z codewords, regardless of the value of N. This configuration is more likely to allow the reduction of the memory size of the transmission device and/or the reception device.

(Advantage 4)

Suppose that the value of X+Y, i.e., the set of the first modulation scheme for s1(t) and the second modulation scheme s2(t), is switched to another set (or the setting of the first modulation scheme for s1(t) and the second modulation scheme for s2(t) is changeable). In this case, since the bit length adjuster 7301 is arranged after the bit interleaver 502B1, as shown in FIG. 73, the memory size of the bit interleaver is the same regardless of the set of the first modulation scheme for s1(t) and the second modulation scheme s2(t). This produces an advantageous effect of preventing an increase in the memory of the bit interleaver. (If the order of the bit interleaver 502BI and the bit length adjuster 7301 is reversed, the memory size may need to be changed depending on the set of the first modulation scheme for s1(t) and the second modulation scheme for s2(t). Accordingly, it is important to arrange the bit length adjuster 7301 after the bit interleaver 502BI. In FIG. 73, the bit length adjuster 7301 is arranged immediately after the bit interleaver 502BI. However, an interleaver that performs different interleaving or another processing unit may be inserted between the bit interleaver 502B1 and the bit length adjuster 7301.)

Note that a plurality of codeword lengths (block lengths (code lengths)) may be prepared for the error correction code. For example, Na bits and Nb bits may be prepared each as the codeword length (block length (code length)) of the error correction code. In the case where the error correction code having a codeword length (block length (code length)) of Na bits is used, the memory size of the bit interleaver is set to Na×z bits, and bit interleaving is performed with the memory size of Na×z bits. Subsequently, the bit length adjuster 7301 of FIG. 73 adds the addition bit sequence if necessary. Similarly, in the case where the error correction code having a codeword length (block length (code length)) of Nb bits is used, the memory size of the bit interleaver is set to Nb×z bits, and bit interleaving is performed with the memory size of Nb×z bits. Subsequently, the bit length adjuster 7301 of FIG. 73 adds the addition bit sequence if necessary.

Note that a plurality of bit interleaving sizes may be prepared for the code length (block length (code length)) of each error correction code. For example, when the codeword length of an error correction code is N bits, N×a bits and N×b bits may be prepared as bit interleaving sizes (a and b each being an integer greater than or equal to 1). In the case where N, a bits are used as a bit interleaving size, bit interleaving is performed with the interleaving size of N×a bits, and subsequently the bit length adjuster 7301 of FIG. 73 adds the addition bit sequence if necessary. Similarly, in the case where N×b bits are used as a bit interleaving size, bit interleaving is performed with the interleaving size of N×b bits, and subsequently the bit length adjuster 7301 of FIG. 73 adds the addition bit sequence if necessary.

(Supplementary Explanation of Embodiment 3)

(Scheme 1) Measures Against Changes of Codeword Length N of Error Correction Code A fundamental solution is to determine the codeword length N of the error correction code to be a value at least having a factor X+Y.

However, there is a limit to setting the codeword length N of the error correction code to a value having the factors of all patterns of X+Y in new modulation schemes. For example, when X+Y is 6+8, the value of X+Y is 14. To correspond to the value 14, the codeword length N of the error correction code needs to be a value at least having 7 as a factor. Then, to correspond to a total value of 22, which is the sum of X=10 and Y=12 as the modulation schemes, as well as to the aforementioned value of 14, the codeword length N of the error correction code needs to be a value at least having 11 as a factor.

(Scheme 2) Backward Compatibility of Previous Bit Interleaver to Nr×Nc Memory

Furthermore, as described in FIG. 75, the bit interleaver realizes interleaving of a predetermined number of bits by differentiating the write direction of the memory having a predetermined number of storage cells, i.e., Nc×Nr storage cells, from the read direction of the memory. Here, suppose that in the specifications (standards) in the first phase, when the value X+Y is less than or equal to 12 in selectable modulation schemes, appropriate bit interleaving is performed on the codeword N of the error correction code. Also, suppose that in the specifications (standards) of the second phase, 14 is newly added as the value X+Y. In this case, if X+Y=14, it is difficult to perform a control including appropriate bit interleaving in the specifications (standards) of the first phase. The following describes on this point while p_last is assumed to be a "bit having a value to be repeated".

Figure 78:
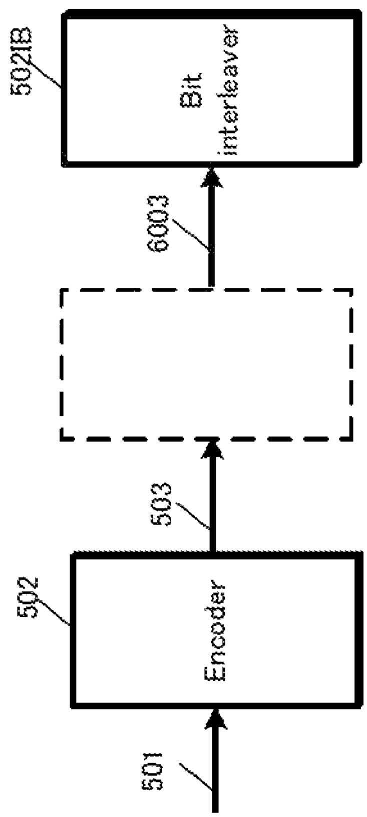
FIG. 78 shows an example of insertion of a bit length adjuster.

In FIG. 78, a bit length adjuster is inserted before (not after) the bit interleaver 502BI. The dashed square in FIG. 75 indicates a bit length adjuster assumed to be inserted.

If the bit length adjuster is located before (not after) the bit interleaver 502BI, p_last is positioned as the last bit of the bit sequence 503A.

In this case, the bit sequence 6003 composed of the N-bit sequence 503 and a 6-bit adjustment bit sequence is output to the bit interleaver 502B1 located after the bit length adjuster. Upon receiving the 6-bit adjustment bit sequence, the bit interleaver 502B1 needs to perform interleaving processing on a bit sequence having the number of bits that has a new factor (e.g., 7 or 11) other than a multiple of Nr×Nc bits defined in the specifications (standards) of the first phase. Accordingly if the bit length adjuster is inserted before (not after) the bit interleaver 502BI, the compatibility with the bit interleaver in the specifications (standards) of the first phase is poor.

On the other hand, according to the configuration of the present embodiment as shown in FIG. 73, the bit length adjuster 7301 is positioned after (not before) the bit interleaver 502BI.

In this way, the bit interleaver 502BI can receive, as an input, the N-bit codeword of the error correction code in the specification (standard) of the first phase, and can perform bit interleaving processing suitable for the codeword length of the N-bit sequence 503 or a predetermined number within the N-bit codeword.

Also, as with the other embodiments, measures can be taken against the deficiencies of bits with respect to X+Y, which is the number of bits for generating the complex signals s1(*t*) and s2(*t*).

Other Examples

Figure 79:
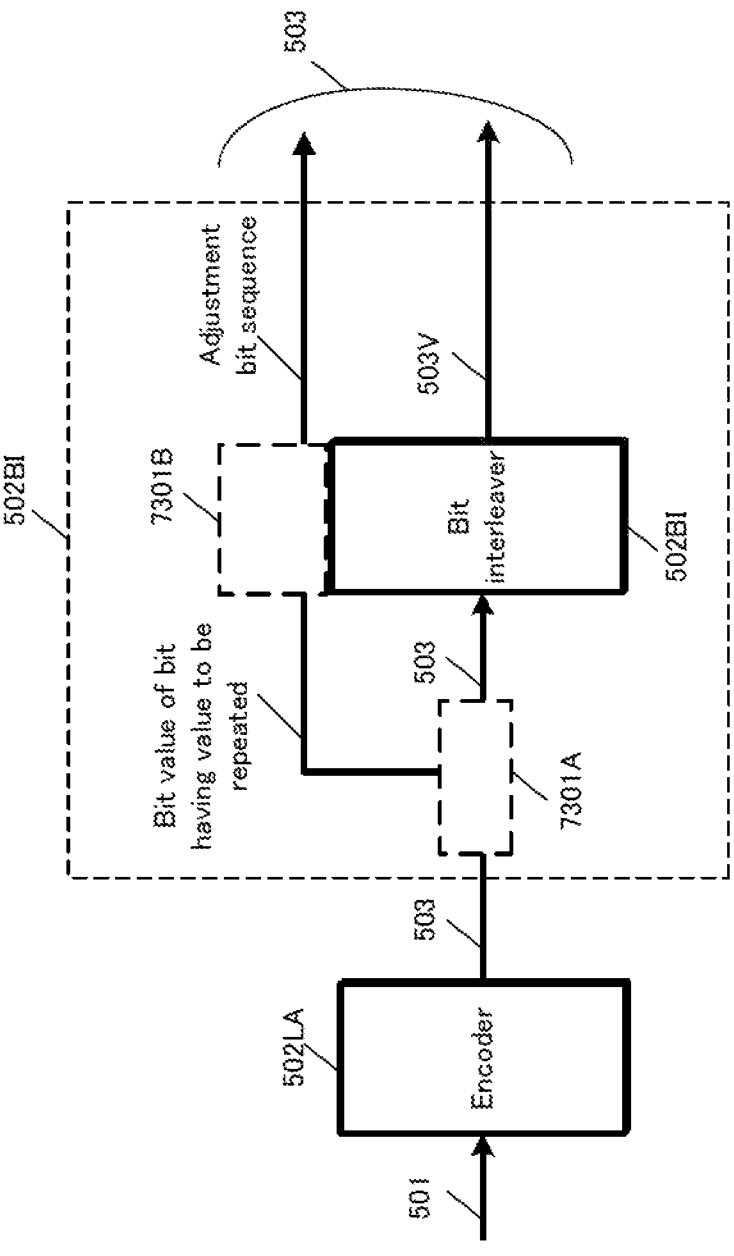
FIG. 79 shows configuration of a modulator according to modification.

FIG. 79 shows a modification of the modulator of the present embodiment.

The modulator includes, after the encoder 502LA, a bit value holding unit 7301A and an adjustment bit sequence generator 7301B that constitute the bit length adjuster 7301.

The bit value holding unit 7301A receives the N-bit sequence 503 as an input, and outputs the N-bit sequence 503 to the bit interleaver 502BI as is. Thereafter, the bit interleaver 502BI performs interleave processing on the N-bit sequence 503 having a bit length (a code length of an error correction code) of N bits.

Also, the bit value holding unit 7301A holds the bit value at the position of a bit having a value to be repeated among the bits of the first bit sequence 503 output from the encoder, and outputs the bit value to the adjustment bit sequence generator 7301B.

The adjustment bit sequence generator 7301B acquires the bit value of the bit having a value to be repeated, generates any of the adjustment bit sequences described in Embodiment 2 with use of the acquired bit value, adds the generated adjustment bit sequence to the N-bit sequence 503V, and outputs the resultant bit sequence obtained by the addition.

According to the above modification, (1) the position of a bit having a value to be repeated can be easily obtained without being affected by a bit interleaving pattern, which is changed according to the coding rate of an error correction code, or the like. For example, if the bit having a value to be repeated is p_last, the position of p_last can be easily obtained. Accordingly, the bit length adjuster can generate a bit sequence from the repetition of the last input bit, which is a bit located at a fixed position in the first bit sequence 503.

(2) The above scheme is favorable in terms of compatibility with the processing of the bit interleaver designed for the codeword length of a predetermined error correction code.

As shown by the dashed frames, the functions of the bit value holding unit 7301A and the adjustment bit sequence generator 7301B may be included in the function of the bit interleaver 502BI.

Embodiment 4

Embodiments 1-3 explain that, regarding the bit length of the bit sequence 503, the deficiencies of bits (PadNum bits) with respect to a multiple of the value X+Y are compensated by the adjustment bit sequence.

In Embodiment 4, description is provided on a scheme for adjusting the bit length by shortening a surplus of bits so that the bit length becomes a multiple of the value X+Y. In particular, the following describes a scheme for adjusting the length of a bit sequence by inserting known information into information before encoding of an error correction code, encoding the information including the known information, and thereafter removing the known information. Note that TmpPadNum indicates the number of bits of the known information to be inserted, and also indicates the number of bits to be removed.

Figure 80:
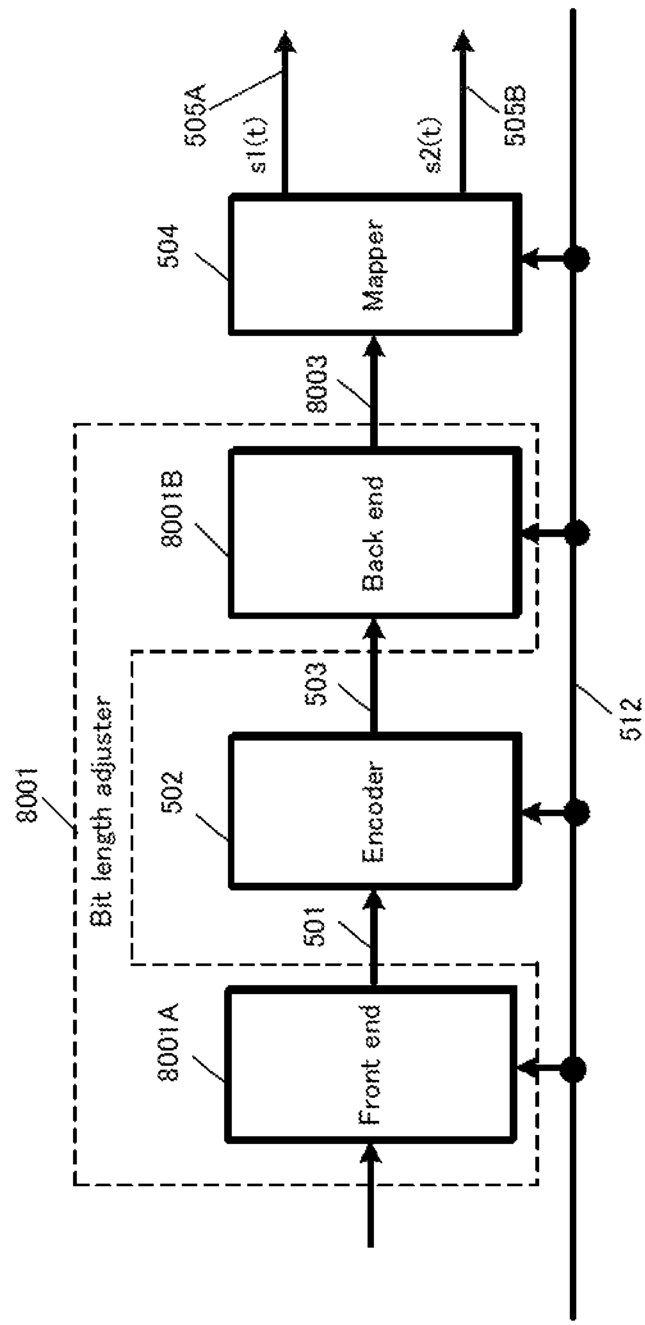
FIG. 80 shows configuration of a modulator according to Embodiment 4.

FIG. 80 shows the configuration of a modulator of the present embodiment.

According to the present embodiment, a bit length adjuster 8001 includes a front end 8001A and a back end 8001B.

The front end 8001A performs pre-processing. Specifically, the front end temporarily adds an adjustment bit sequence, which is known information, to an information bit sequence input thereto, and outputs a K-bit information sequence.

The encoder 502 receives the k-bit information sequence including the known information as an input, encodes the k-bit information sequence, and outputs the first bit sequence (503) which is an N-bit codeword. Note that the error correction code used by the encoder 502 is a systematic code (i.e., a code composed of information and parity).

The back end 8001B performs post-processing. Specifically, the back end 8001B receives the first bit sequence 503, and removes the adjustment bit sequence which is the known information temporarily inserted by the front end 8001A. In this way, the length of a post-adjustment bit sequence 8003 output from the front end 8001A becomes a multiple of the value X+Y.

Note that the value of X+Y is the same as in Embodiments 1 to 3 above.

Figure 81:
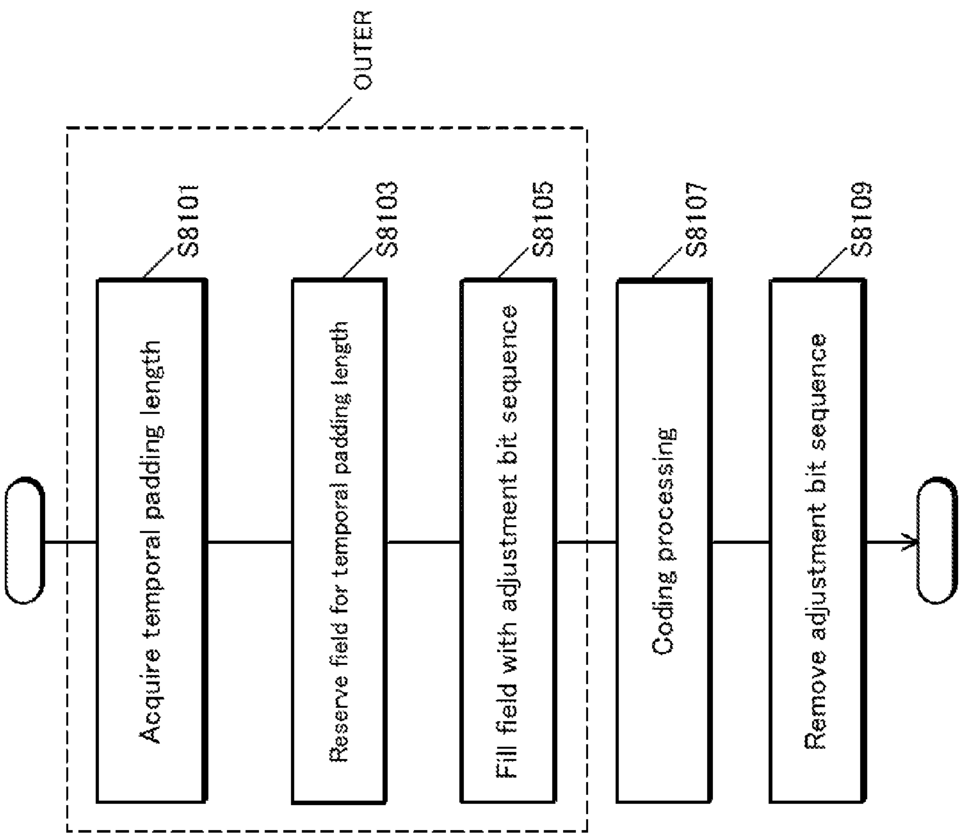
FIG. 81 is a flowchart of processing.

FIG. 81 shows a flowchart of processing according to the present embodiment.

The dashed frame "OUTER" indicates the pre-processing.

The pre-processing is processing for a controller to set details of processing to the front end. Although not shown in FIG. 80, the controller outputs a signal line 512.

Based on the value X+Y, the controller acquires TmpPadNum indicating the bit length of the known information in the K-bit information, which is to be included in the N-bit codeword of the error correction code (S8101).

For example, the value is acquired from the following formula.

$$TmpPadNum=N-(floor(N/(X+Y))\times(X+Y))$$

Here, "floor" is a function that returns an integer resulting from a round-up calculation.

The aforementioned value is not necessarily acquired by calculations. For example, the value can be acquired from a table showing a parameter such as the codeword length (block length) N of the error correction code used by the encoder 502.

Next, the controller reserves a field for the length of TmpPadNum in a manner that the bit sequence 501 output from the front end becomes K bits. That is, the controller performs control such that, among K bits, K-TmpPadNum (bits) indicates information and TmpPadNum (bits) indicates the known information to be inserted (S8103).

Example 1

When the Front End 8001A in FIG. 80 is Part of a Frame Configurator

The front end 8001A in FIG. 80 may be positioned at a frame configurator which is a functional block preceding the modulator.

Figure 82:
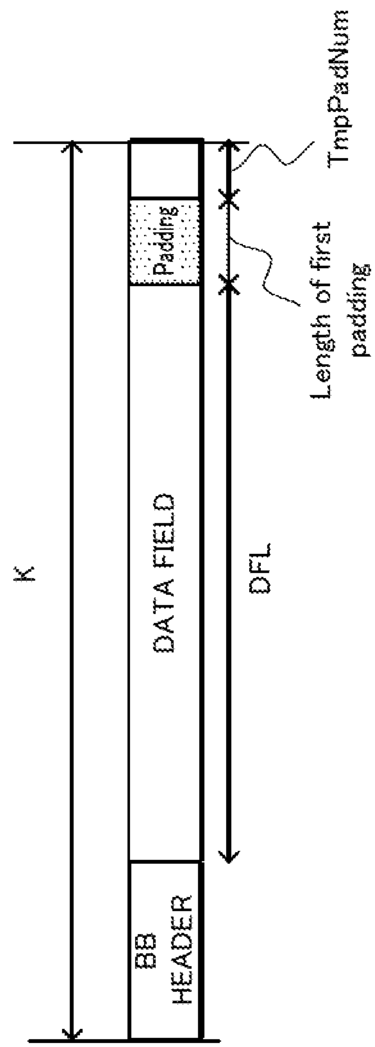
FIG. 82 shows relationship between K that is the length of BBFRAME and TmpPadNum that is the length to be reserved.

For example, in a system such as a system in DVB, a field having a length of TmpPadNum may be reserved in advance based on the value of X+Y, within the baseband frame (so-called BBFRAME) generally configured as a K-bit (information) bit sequence. FIG. 82 shows the relationship between K which indicates the length of BBFRAME, and TmpPadNum which is to be reserved. BBHEADER is a header for BBFRAME. DATAFIELD is a data bit sequence having a length of DFL (bits). The length of a first padding indicated by a hatched portion is not determined by the value of X+Y. The first padding is added to the length DFL which is an integral multiple of TS packets, etc., and is used for the adjustment of the number of bits. As shown in FIG. 82, TmpPadNum indicates the bit length to be reserved. Specifically, TmpPadNum indicates the number of bits temporarily padded, separately from the first padding.

Also, the front end, which is arranged at the input side of the encoder, may reserve the field length based on the codeword length N (or an index (coding rate, etc.) of a table storing information equivalent to the codeword length N).

Example 2

When the Front End 8001A in FIG. 80 is Another Encoder that Performs Encoding Processing for an Outer Code The front end 8001A in FIG. 80 may be an outer code encoder, in the modulator, that generates a codeword of an outer code, when the error correction code is a concatenated code and the code of the encoder 502 is an inner code of the concatenated code.

In this case, the field for the value X+Y can be reserved by changing the coding rate (codeword length) of the outer code. For example, when BCH coding is used as outer code processing, the degree of a generation polynomial g(x) can be reduced by X+Y, and the codeword length $N_{outer}$ (of the outer code) can be thereby shortened by X+Y. The scheme as described above can reserve the field for X+Y bits.

To change the degree, various modifications can be considered. For example, in order for the degree of the generation polynomial g(x) to be smaller than the degree thereof in the case where no adjustment is made, a value (or an index for changing the degree) may be set to a table, and the generation polynomial g(x) may be generated via a control signal with use of the table.

The field mentioned above is composed of one or more subfields used to insert the number of bits of TmpPadNum, within the K-bit sequence subjected to processing by the encoder at a succeeding stage. Note that the insertion of TmpPadNum may be performed serially or discretely.

The controller instructs the front end to fill the reserved field having a length of TmpPadNum with the adjustment bit sequence (known information) (S8105). The front end 8001A of FIG. 80 fills the field with the adjustment bit sequence, and outputs the bit sequence 501 having a length of K bits to the encoder 502 (S8105).

The known information (adjustment bit sequence) may be composed of bits each having a value of 0 (zero), for example. The encoder 502 encodes the K-bit sequence composed of the known information and information to be transmitted, and obtains an N-bit codeword composed of information and parity as a result of the encoding (S8107). The above gives an example where the known information (adjustment bit sequence) is composed of bits each having a value of 0 (zero), so as to facilitate the encoding. However, the known information is not limited to such, and may be any information as long as the information is shared between the encoding side and the decoding side. Note that bit interleaving may be performed on the bit sequence resulting from the processing by the encoder 502 in FIG. 80.

The back end 8001B of FIG. 80 removes the temporarily inserted adjustment bit sequence (known information, or a group of interleaved bits corresponding to the bits of the adjustment bit sequence before interleaving), and outputs the second bit sequence (bit sequence after bit length adjustment) 8003 having the number of bits smaller than N bits (S8109). This processing may also be performed with use of a table storing the values of X+Y in correspondence with removal positions.

(Advantage)

Concerning the second bit sequence (post-adjustment bit sequence) 8003 obtained by removing the adjustment bit sequence temporarily inserted in the N-bit codeword of the LDPC code of the $i^{th}$ block, N-TmpPadNum, which is the number of bits of the second bit sequence (post-adjustment bit sequence) 8003, is a multiple of X+Y determined by the set of the first modulation scheme for s1($t$) and the second modulation scheme for s2($t$) that have been set.

In the case where the codeword length (block length (code length)) N of the vector of the codeword (of the LDPC code) of the $i^{th}$ block is fixed, such as 64800 bits, and the value of X+Y, i.e., the set of the first modulation scheme s1($t$) and the second modulation scheme s2($t$), is switched to another set (or the setting of the first modulation scheme for s1($t$) and the second modulation scheme for s2($t$) is changeable), TmpPadNum, which is the number of bits temporarily inserted and thereafter removed, is appropriately changed. (Depending on the value of X+Y (the set of the first modulation scheme for s1($t$) and the second modulation scheme for s2($t$)), the value of TmpPadNum may be zero.)

In this way, when the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. This configuration is more likely to allow the reduction of the memory size of the transmission device and/or the reception device.

Figure 83:
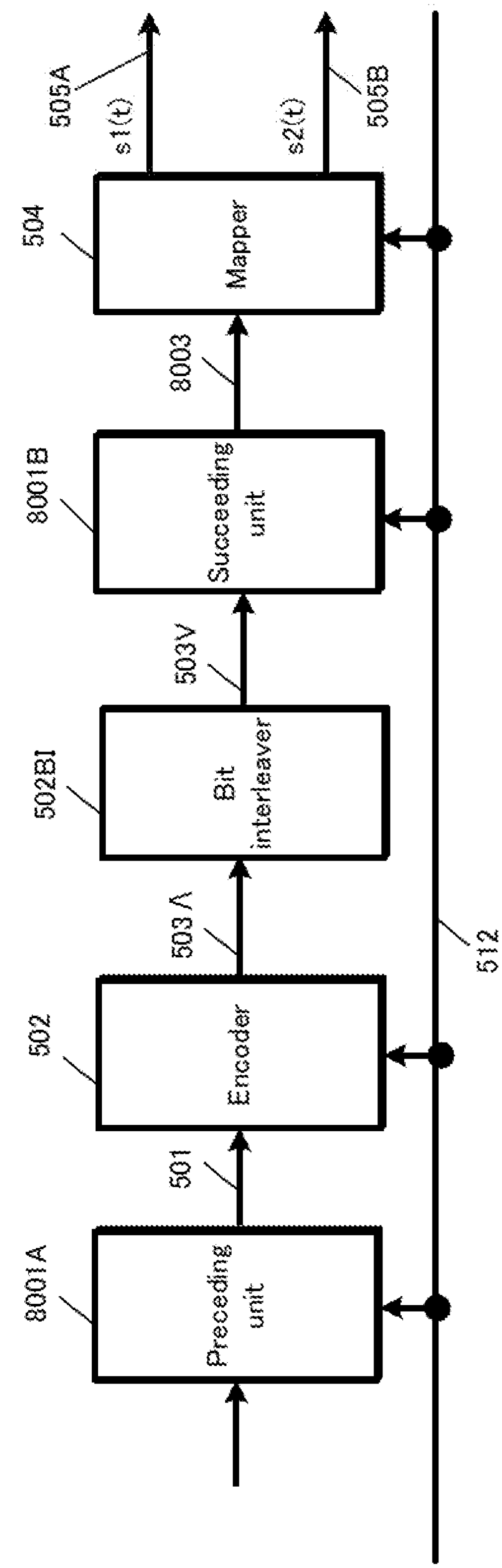
FIG. 83 shows configuration of a modulator that is different from the modulator shown in FIG. 80.

FIG. 83 shows a modulator having a different configuration from the modulator in FIG. 80. Note that in FIG. 83, elements that operate in the same way as elements shown in FIG. 80 are labeled using the same reference signs. FIG. 83 differs from FIG. 80 in that the bit interleaver 502BI is inserted between the encoder 502 and the back end 8001B. The operation with the configuration in FIG. 83 is described with use of FIG. 84.

Figure 84:
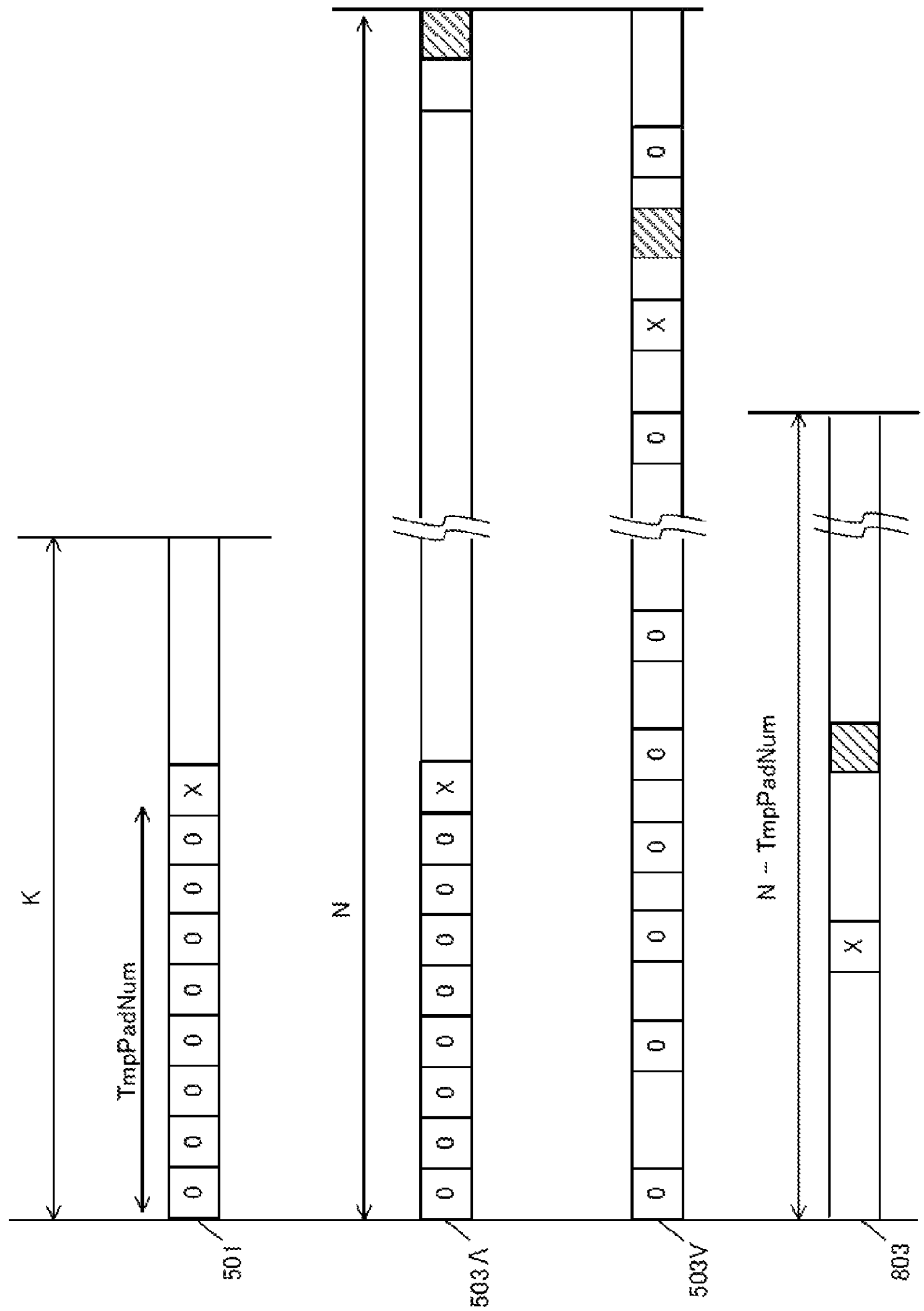
FIG. 84 illustrates the bit length of each of bit sequences 501 to 8003.

FIG. 84 shows the bit length of each of the bit sequences 501 to 8003.

The bit sequence 501 is a K-bit (information) sequence output from the front end 8001A, and includes a field for the known information having a length of TmpPadNum (bits).

The bit sequence 503A is an N-bit sequence (first bit sequence) output from the encoder 502, and is a codeword of an error correction code.

The bit sequence 503V is an N-bit sequence in which the order of bit values is permuted by bit interleaving.

The bit sequence 8003 is a second bit sequence (post-adjustment bit sequence) whose bit length is adjusted to N-TmpPadNum, and is output from the back end 8001B. Note that the bit sequence 8003 is a bit sequence obtained by removing, from the bit sequence 503V, the known information composed of TmpPadNum bits.

Advantageous Effect of the Present Embodiment

With the above configuration, the codeword of the error correction code can be estimated (decoding processing) without need for special processing during decoding by the reception device.

Also, the transmission device treats the adjustment bit sequence, which is to be temporarily inserted, as known information, and removes only the adjustment bit sequence (known information) that has been temporarily inserted. As a result, the reception device decodes the error correction code with use of the known information. This increases the probability to achieve a high error correction capability.

It is more desirable that the front end generate an outer code such as BCH or RS so as to easily reserve a field.

Embodiment 5

In Embodiments 5 and 6, description is provided on the invention pertaining to a scheme and configuration for the reception device to decode the bit sequence 501 transmitted from the transmission device.

More specifically, the following describes processing for demodulating (detecting) the complex signals s1($t$) and s2($t$) that are generated from the (information) bit sequence 501 by "the part for generating modulated signals" (modulator) described in Embodiments 1 to 4, and that are transmitted via processing such as MIMO precoding processing, and recovering a bit sequence from complex signals x1($t$) and x2($t$).

Note that the complex signals x1($t$) and x2($t$) are complex baseband signals obtained from received signals which are received via receive antennas.

Figure 85:
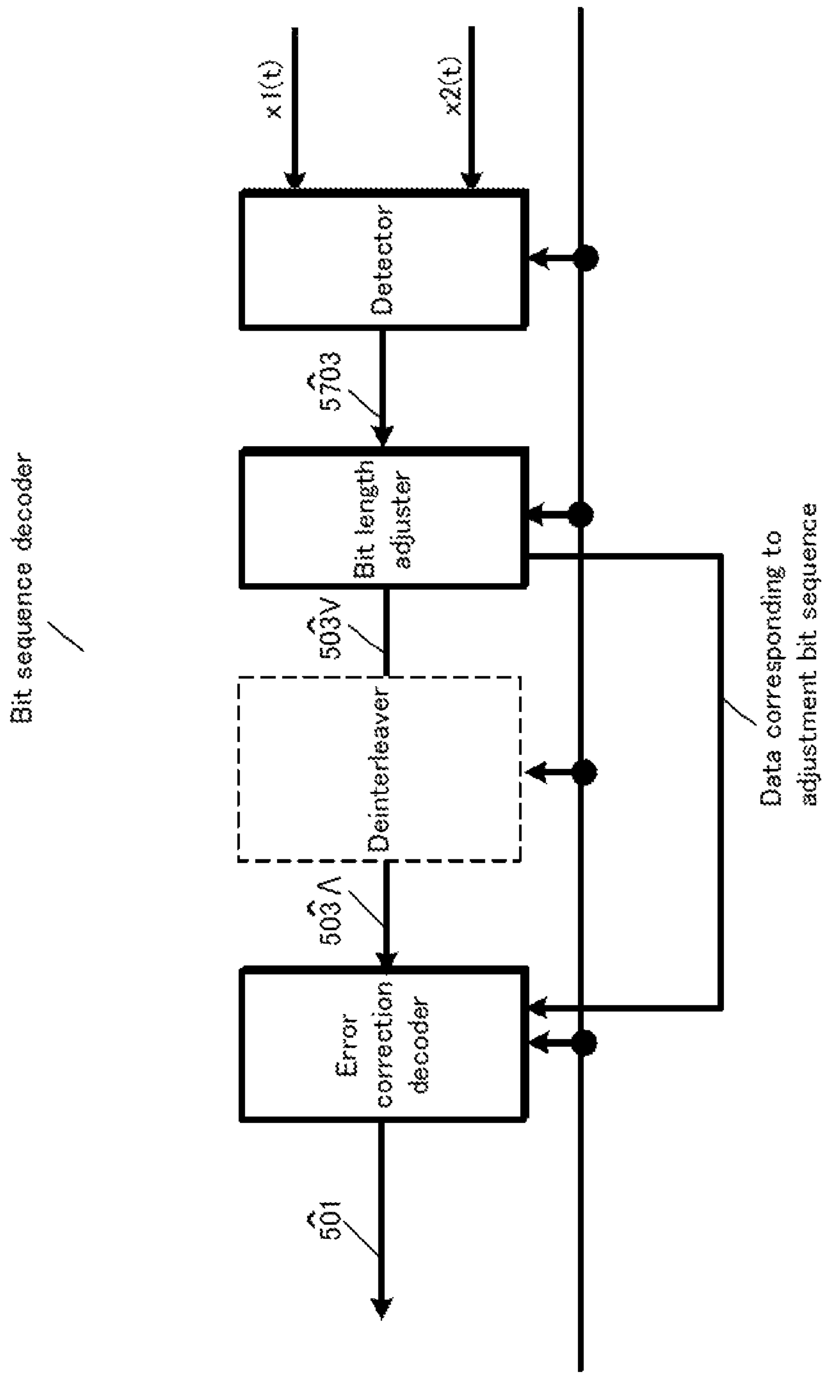
FIG. 85 shows an example of a bit sequence decoder of a reception device.

FIG. 85 shows a bit sequence decoder of a reception device that receives modulated signals transmitted based on any of the transmission schemes described in Embodiments 1 to 3.

In FIG. 85, each of the carets ˆ indicates an estimation result of the signal indicated by the reference sign under the caret. In the following description, each of the carets is simply indicated by ˆ before a reference sign (e.g., ˆ5703).

The bit sequence decoder of FIG. 85 includes a detector (demodulator), a bit length adjuster, and an error correction decoder.

The detector (demodulator) generates, from the complex baseband signals x1($t$) and x2($t$) obtained from the received signals received via the receive antennas, data such as a hard decision value, a soft decision value, a log-likelihood, or a log-likelihood ratio that corresponds to each of the bits in X+Y, and outputs a data sequence corresponding to a second bit sequence having a length of an integral multiple of X+Y. Here, X is the number of bits per symbol in the first complex signal s1, and Y is the number of bits per symbol in the second complex signal s2. Note that ˆ5703 is a data sequence that corresponds to the second bit sequence 5703 having a length of N+PadNum, for example.

The bit length adjuster of FIG. 85 receives a data sequence (ˆ5703) corresponding to a bit sequence having a second bit length. Then, the bit length adjuster extracts data corresponding to the adjustment bit sequence that has a length of PadNum and that has been inserted by the transmission device, outputs the adjustment bit sequence to the error correction decoder, and outputs a data sequence (ˆ503V) corresponding to an N-bit sequence.

A deinterleaver deinterleaves the data sequence (ˆ503V) corresponding to the N-bit sequence, and outputs a data sequence of N data pieces (ˆ503A) obtained by the deterinterleaving to the error correction decoder. The data sequences ˆ503V and ˆ503A correspond to the bit sequences 503V and 503A, respectively.

The error correction decoder of FIG. 85 receives, as inputs, data corresponding to the adjustment bit sequence having a length of PadNum, and the data sequence of N data pieces (ˆ503A), performs error correction decoding (e.g., in the case of LDPC code, Belief Propagation (BP) decoding (e.g., sum-product decoding, min-sum decoding, Normalized BP decoding, or offset BP decoding) and Bit Flipping decoding), and obtains a K-bit information bit estimation sequence.

If the transmission device uses a bit interleaver, the reception device further includes a deinterleaver as shown in FIG. 85. On the other hand, if the transmission device does not use any bit interleaver, the deinterleaver in FIG. 85 is unnecessary.

Figure 86:
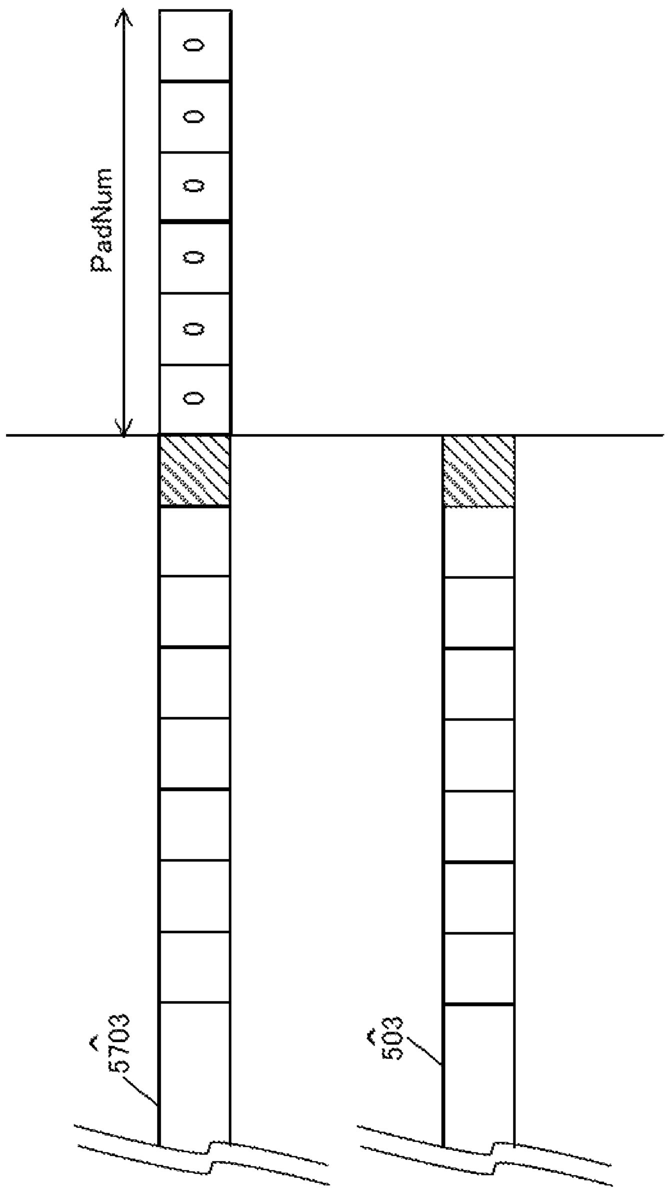
FIG. 86 illustrates input and output of a bit length adjuster.

FIG. 86 illustrates input and output of the bit length adjuster of the present embodiment.

The reference sign ˆ5703 indicates a data sequence corresponding to a bit sequence having a length of N+PadNum. The values "0" in six square frames constitute the adjustment bit sequence. The reference sign ˆ503 indicates a data sequence corresponding to the N-bit codeword output by the bit length adjuster.

Figure 87:
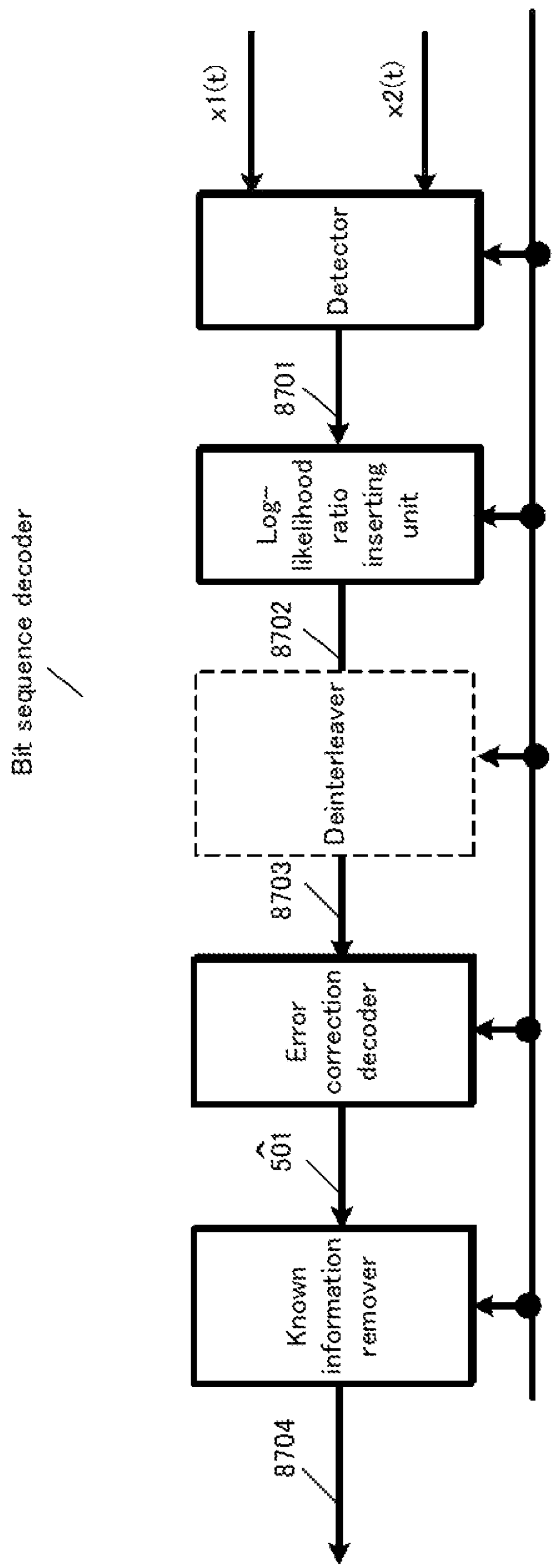
FIG. 87 shows an example of a bit sequence decoder of a reception device.

FIG. 87 shows the bit sequence decoder of the reception device that receives the modulated signals transmitted based on the transmission scheme described in Embodiment 4.

The detector (demodulator) generates, from the complex baseband signals x1($t$) and x2($t$) obtained from the received signals received via the receive antennas, data such as a hard decision value, a soft decision value, a log-likelihood, or a log-likelihood ratio that corresponds to each of the bits in X+Y, and outputs a data sequence 8701 corresponding to a second bit sequence having a length of an integral multiple of X+Y. Here, X is the number of bits per symbol in the first complex signal s1, and Y is the umber of bits per symbol in the second complex signal s2. Note that the data sequence 8701 is a data sequence that corresponds to the second bit sequence 8003 (see FIG. 83) having a length of N−TmpPadNum, for example.

A log-likelihood ratio inserting unit of FIG. 87 receives, as an input, the data sequence 8701 corresponding to the second bit sequence, inserts, into the data sequence 8701, (for example,) log-likelihood ratios (as many as TmpPadNum) corresponding to the adjustment bit sequence which is the known information removed by the transmission device as described in Embodiment 4, and outputs an adjusted data sequence 8702. Accordingly, the adjusted data sequence 8702 is composed of a data sequence of N data pieces.

The deinterleaver in FIG. 87 receives the adjusted data sequence 8702 as an input, permutes the bits of the adjusted data sequence 8702, and outputs a permuted data sequence 8703.

The error correction decoder of FIG. 87 receives the permuted data sequence 8703 as an input, performs error correction decoding (e.g., in the case of LDPC code, Belief Propagation (BP) decoding (e.g., sum-product decoding, min-sum decoding, Normalized BP decoding, or offset BP decoding) and Bit Flipping decoding), and obtains a K-bit information bit estimation sequence. A known information remover removes known information from the K-bit information bit estimation sequence, acquires data 8704 as a result of the removal, and outputs the data 8704.

If the transmission device uses a bit interleaver, the reception device further includes a deinterleaver as shown in FIG. 87. On the other hand, if the transmission device does not use any bit interleaver, the deinterleaver in FIG. 87 is unnecessary.

Advantageous Effect of the Present Embodiment

The description has been provided on the operation of each of the reception devices when the modulated signals are transmitted by any of the transmission schemes in Embodiments 1 to 4, with use of FIGS. 85 and 87.

Each of the reception devices changes the operation thereof based the modulation schemes for s1(*t*) and s2(*t*) used by the transmission device, and performs the operation of error correction decoding. This increases the probability to achieve a high data reception quality.

Also, when the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. In accordance with this, the error correction decoder appropriately performs operation for demodulation and decoding. This increases the probability to reduce the memory size of the reception device.

Embodiment 6

Figure 88:
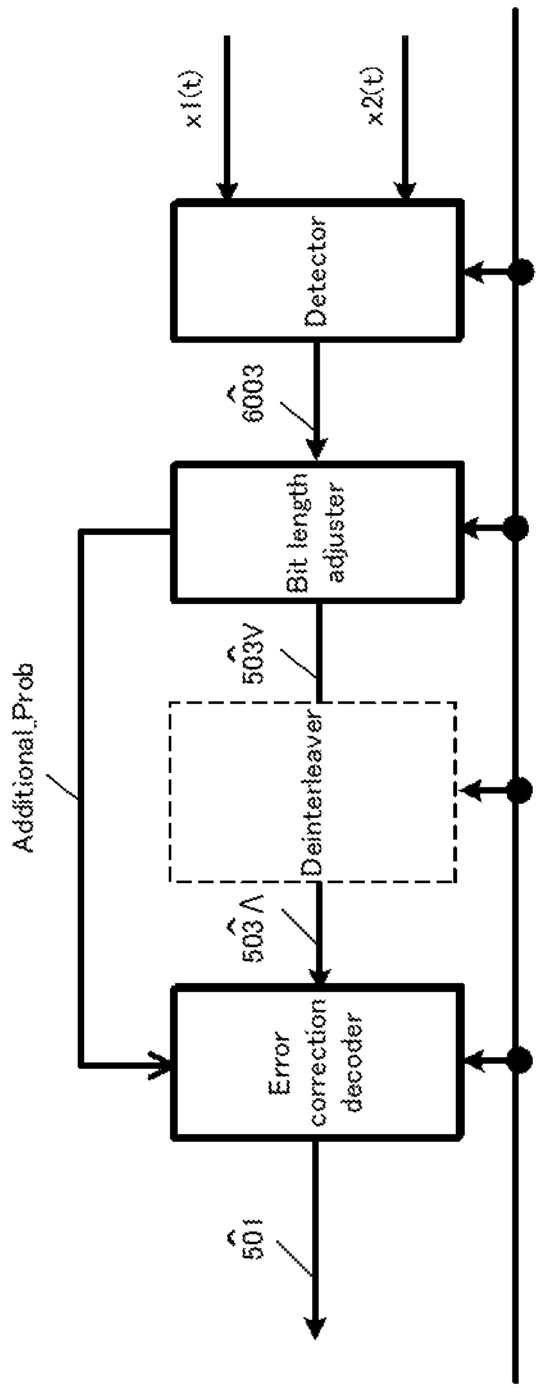
FIG. 88 shows an example of a bit sequence decoder of a reception device.

FIG. 88 shows a bit sequence decoder of a reception device according to the present embodiment.

The operations of a deinterleaver and a detector are the same as in Embodiment 5.

The detector outputs a bit sequence ˆ6003 that includes any one of the adjustment bits described in the first modification to the ninth modification pertaining to the adjustment bit sequence of Embodiment 2.

The bit length adjuster of the present embodiment extracts a data sequence corresponding to the second bit sequence (e.g., the log-likelihood ratios corresponding to the second bit sequence) or partial data (e.g., log-likelihood ratios) corresponding to the bit values of a predetermined portion within the N bits.

For example, the bit length adjuster performs the following processing in order to achieve a high error correction capability.

- Selectively extract data corresponding to the adjustment bit sequence from the bit sequence ˆ6003 of N+TmpPadNum bits.
- Generate, for example, log-likelihood ratios Additional_Prob, which pertains to the adjustment bit sequence, from data corresponding to each bit of the adjustment bit sequence.
- Output the Additional_Prob thus generated to the error correction decoder.

The error correction decoder estimates the N-bit codeword of an error correction code, with use of Additional_Prob and partial data (e.g., log-likelihood ratios) corresponding to the bit values of the predetermined portion within N bits.

At this time, the error correction decoder performs sum-product decoding, for example, based on the tanner graph structure (parity-check matrix) in Embodiment 2.

Figure 89:
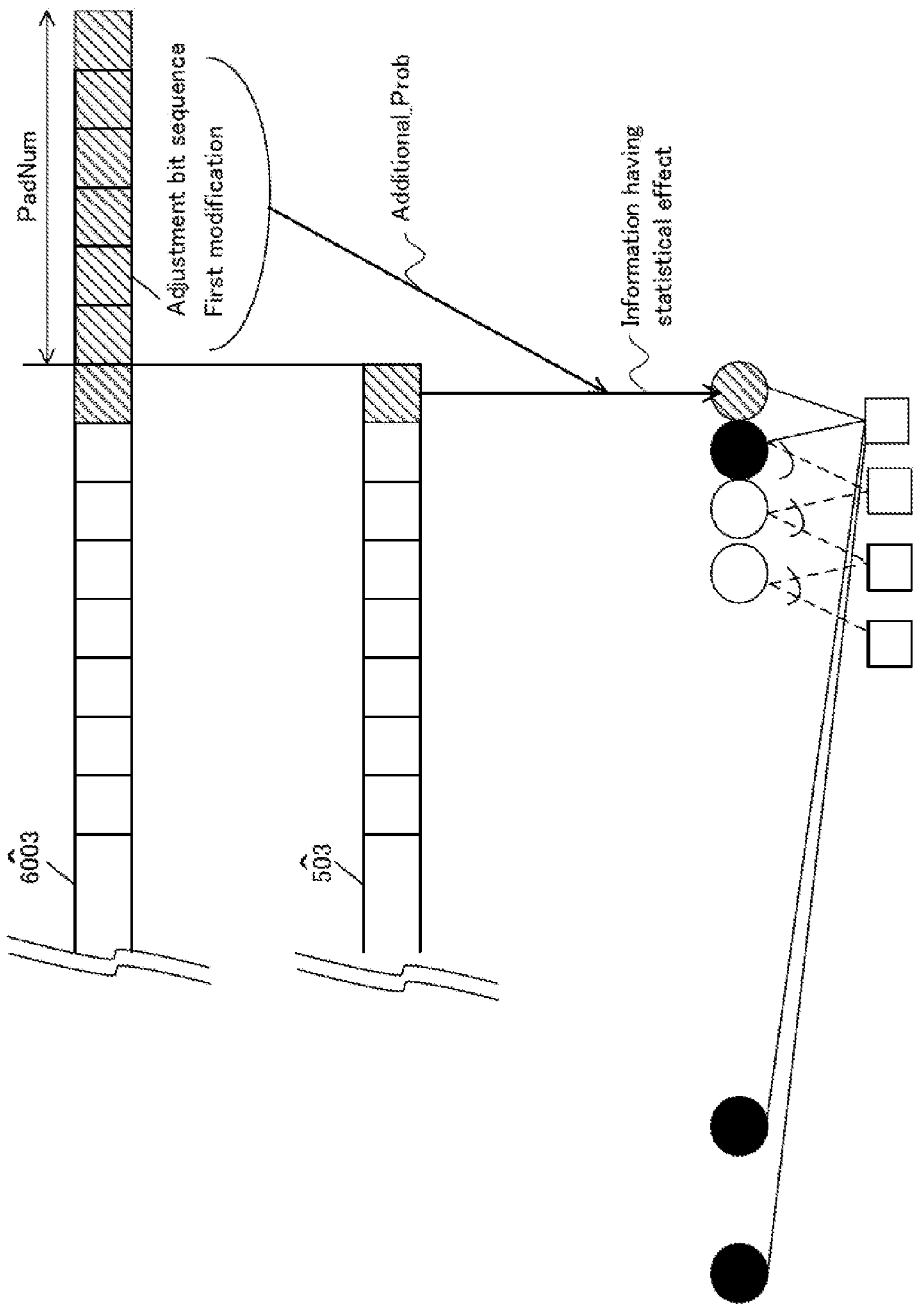
FIG. 89 conceptually illustrates processing according to Embodiment 6.

FIG. 89 conceptually illustrates processing according to the present embodiment.

The circles and squares in FIG. 89 indicate the same information as described in Embodiment 2 using the same circles and squares.

The reference sign ˆ6003 indicates a second bit sequence that has a bit length of N+padNum and that is output by the detector.

The reference sign ˆ503 indicates a bit sequence ˆ503 having a bit length N output from the bit length adjuster. Additional_Prob indicates further log-likelihood ratios obtained from the log-likelihood ratios of the adjustment bit sequence. The further log-likelihood ratios are used to provide log-likelihood ratios for the predetermined portion described in each of the modifications of Embodiment 2.

For example, if the predetermined portion is p_last, a log-likelihood ratio can be provided for p_last. Also, by adding p_2ndlast to the predetermined portion, a log-likelihood ratio can be provided for p_2ndlast or, alternatively, a log-likelihood ratio can be indirectly provided for p_last.

This increases the probability to achieve a high error correction capability.

Embodiment 7

Embodiments 1 to 4 each have described a transmission scheme and a transmission device, and Embodiments 5 to 6 each have described a reception scheme and a reception device. The present embodiment provides a supplementary explanation on the relationship between (i) the transmission schemes and the transmission devices and (ii) the reception schemes and the reception devices.

Figure 90:
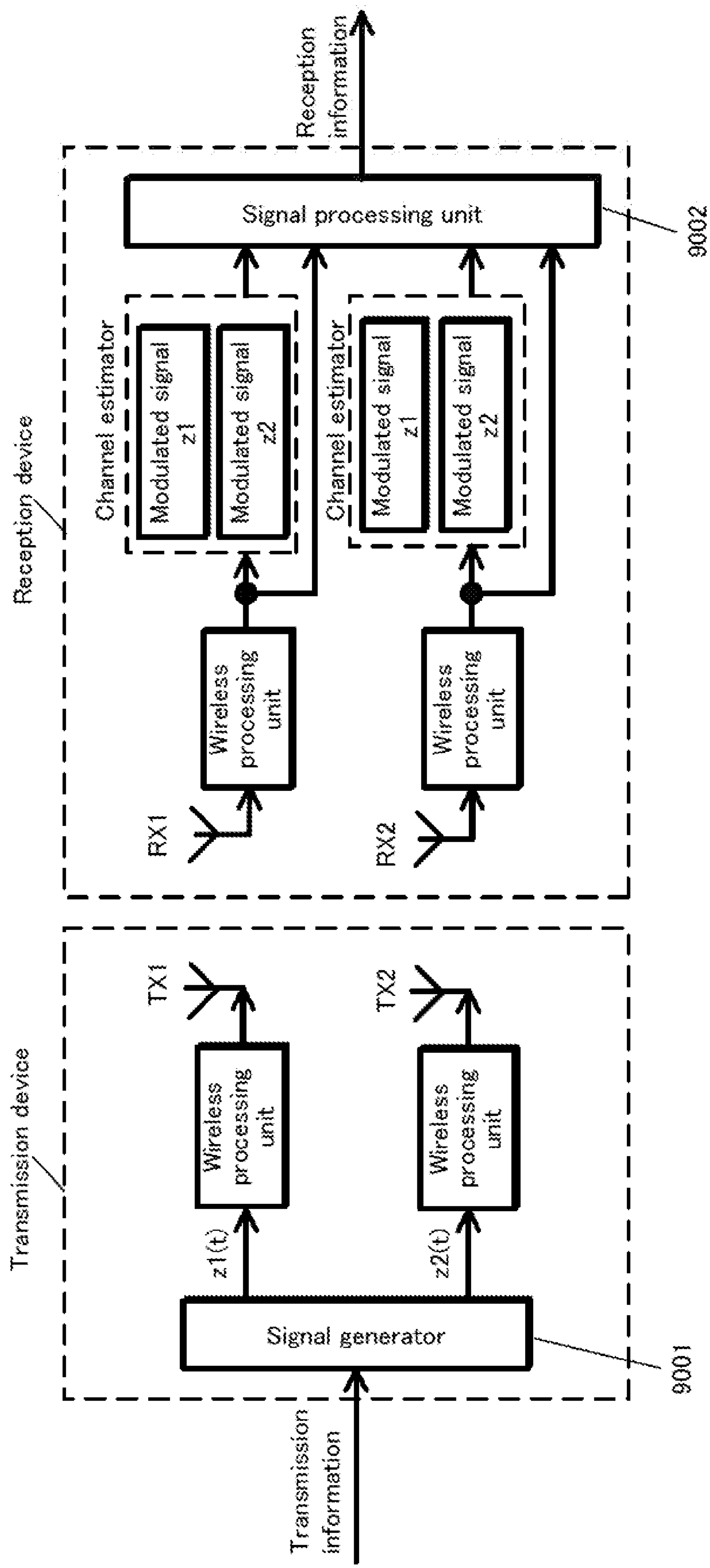
FIG. 90 shows relationship between a transmission device and a reception device.

FIG. 90 shows a transmission device and a reception device according to the present embodiment.

As shown in FIG. 90, the transmission device transmits two modulated signals from different antennas. Each wireless processing unit of the transmission device performs, for example, OFDM signal processing, frequency conversion, power amplification, and so on.

A signal generator 9001 of the transmission device in FIG. 90 receives transmission information as an input, performs processing such as encoding, mapping, and precoding, and outputs modulated signals z1($t$) and z2($t$) after precoding. Accordingly, the signal generator 9001 performs processing pertaining to the transmission schemes described in Embodiments 1 to 4, and processing pertaining to the aforementioned precoding.

A receive antenna RX1 of the reception device in FIG. 90 receives a signal resulting from spatial multiplexing of a signal transmitted by a transmit antenna TX1 of the transmission device and a signal transmitted by a transmit antenna TX2 of the transmission device.

Similarly, a receive antenna RX2 of the reception device receives the signal resulting from spatial multiplexing of the signal transmitted by the transmit antenna TX1 of the transmission device and the signal transmitted by the transmit antenna TX2 of the transmission device.

Channel estimators of the reception device shown in FIG. 90 estimate the channel variations of the modulated signal z1($t$) and the channel variations of the modulated signal z2($t$) using the respective antennas.

A signal processing unit 9002 of the reception device of FIG. 90 performs reception processing described in Embodiments 5 and 6, and thereby obtains estimation results of transmission information transmitted from the transmission device.

The above description is given with use of the examples of Embodiments 1 to 6. Note that in the following embodiments, any description on a transmission scheme and a transmission device pertains to the transmission device in FIG. 90, and any description on a reception scheme and a reception device pertains to the reception device in FIG. 90.

Embodiment 8

In the present embodiment, description is provided on a modification of the scheme described in Embodiment 4, i.e., the scheme for adjusting the bit length by shortening a surplus of bits so that the bit length becomes a multiple of the value X+Y.

Example 1

Figure 91:
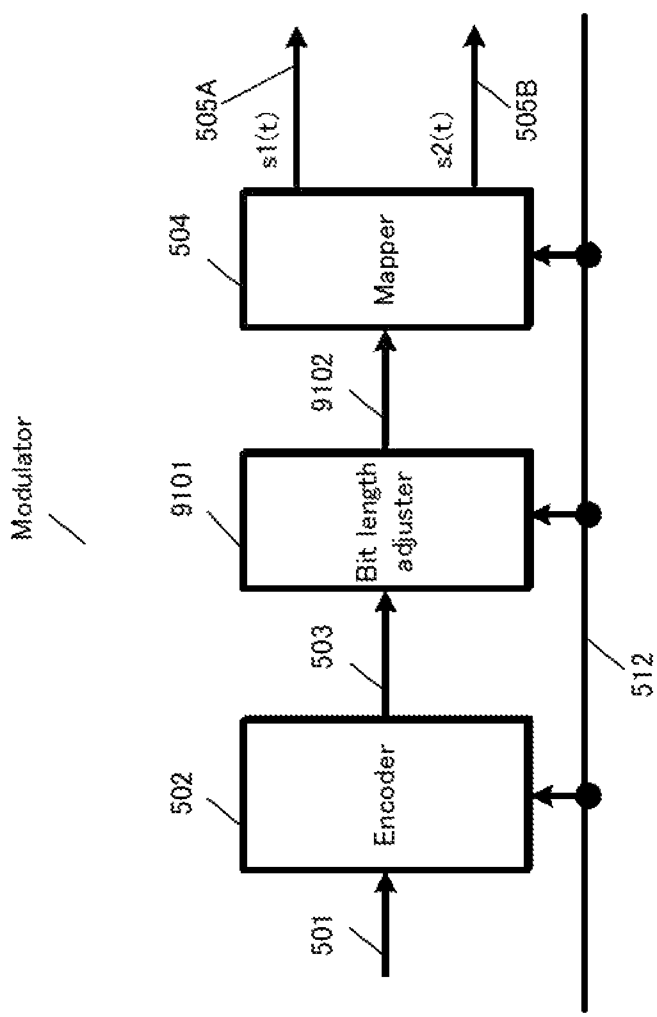
FIG. 91 shows an example of configuration of a modulator of a transmission device.

FIG. 91 shows the configuration of a modulator of a transmission device according to the present embodiment. In FIG. 91, elements that operate in the same way as elements described in the above embodiments with figures are labeled using the same reference signs The encoder 502 receives the control information 512 and the K-bit information 501 of the $i^{th}$ block as inputs, performs error correction coding of an LDPC code or the like based on information on a scheme of error correction coding, a coding rate, and a block length (code length) included in the control information 512, and outputs the N-bit encoded data 503 of the $i^{th}$ block.

A bit length adjuster 9101 receives the control information 512 and the N-bit codeword 503 of the $i^{th}$ block as inputs, determines the value of PunNum, which is the number of bits to be removed from the N-bit codeword 503, based on either one of the information on the modulation schemes for s1($t$) and s2($t$) and the value of X+Y included in the control information 512, removes data of PunNum bits from the N-bit codeword 503, and outputs a data sequence 9102 having a length of N−PunNum bits. Similarly to the above embodiments, the value of PunNum is determined in a manner that N−PunNum becomes a multiple of the value of X+Y. (Depending on the value of X+Y (the set of the first modulation scheme for s1($t$) and the second modulation scheme for s2($t$)), the value of PunNum may be zero.)

The value of X+Y is the same as that described in the above embodiments.

The mapper 504 receives the control information 512 and the data sequence 9102 of N−PunNum bits as inputs, performs mapping based on the modulation schemes for s1($t$) and s2($t$) with reference to the information on the modulation schemes for s1($t$) and s2($t$) included in the control information 512, and outputs the first complex signal s1($t$) (505A) and the second complex signal s2($t$)(505B).

Figure 92:
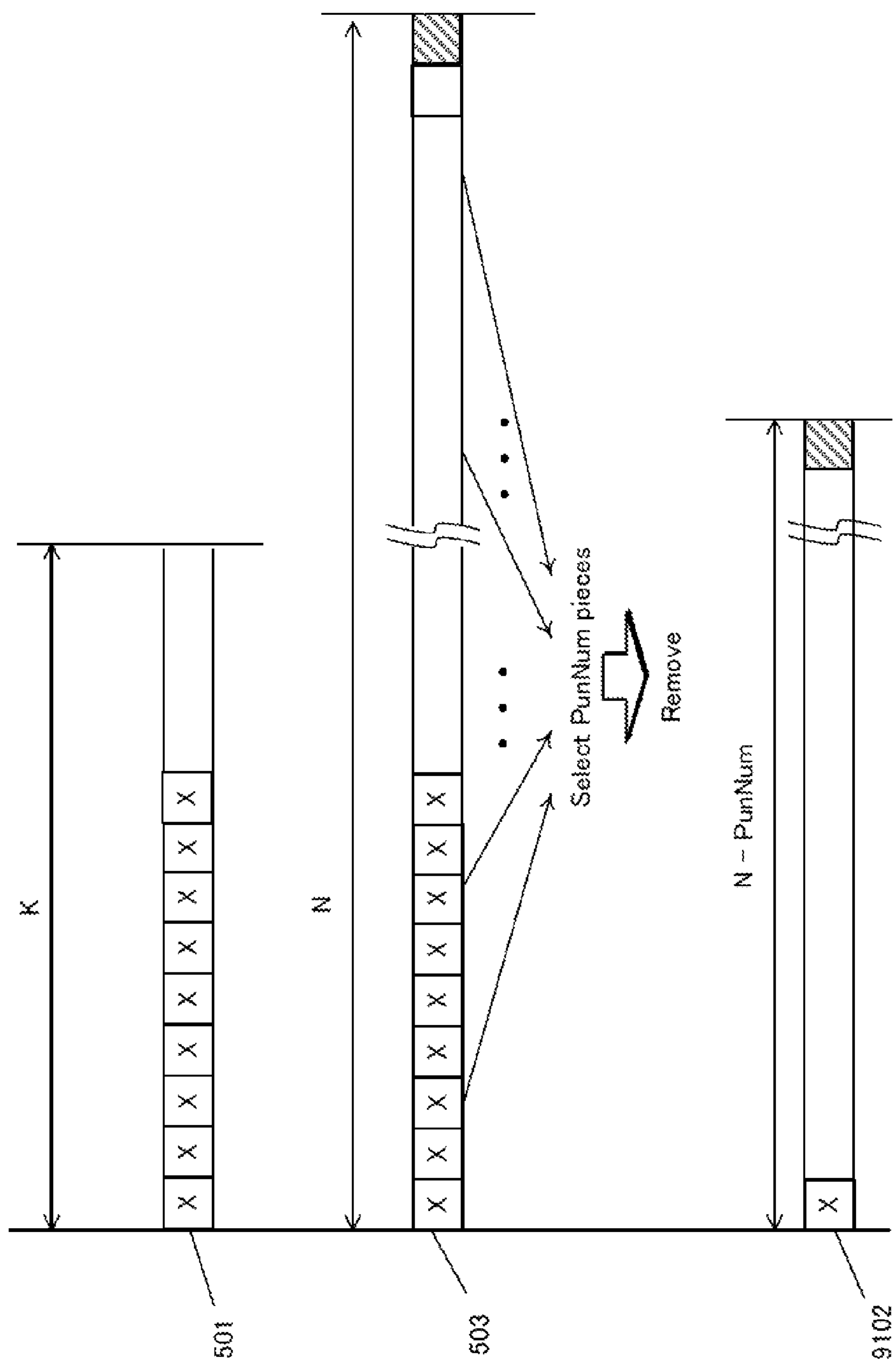
FIG. 92 shows the bit length of each bit sequence.

FIG. 92 shows the bit length of each bit sequence, and each of the squares represents 1 bit. The K-bit information 501 of the $i^{th}$ block in FIG. 91 is as shown in FIG. 92.

The N-bit codeword 503 of the $i^{th}$ block in FIG. 91 is as shown in FIG. 92. PunNum bits are selected and removed from the N-bit codeword 503 of the $i^{th}$ block so as to generate the data sequence 9102 of N−PunNum bits (see FIG. 92).

Example 2

Figure 93:
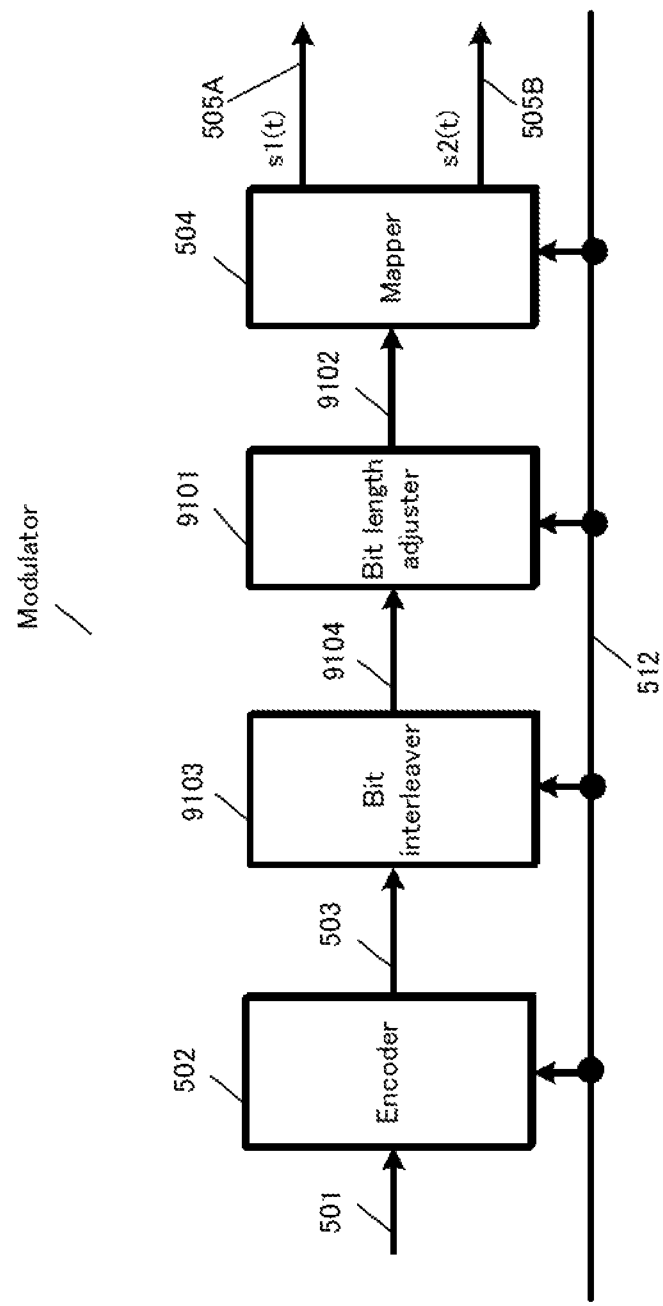
FIG. 93 shows configuration of a modulator that is different from the modulator shown in FIG. 91.

FIG. 93 shows the configuration of a modulator of a transmission device according to the present embodiment. The modulator in FIG. 93 differs from the modulator in FIG. 91. In FIG. 93, elements that operate in the same way as elements described in the above embodiments with figures are labeled using the same reference signs.

The encoder 502 receives the control information 512 and the K-bit information 501 of the $i^{th}$ block as inputs, performs error correction coding of an LDPC code or the like based on information on a scheme of error correction coding, a coding rate, and a block length (code length) included in the control information 512, and outputs the N-bit encoded data 503 of the $i^{th}$ block.

A bit interleaver 9103 receives the control information 512 and the N-bit codeword 503 of the $i^{th}$ block as inputs, permutes the order of bits in the N-bit codeword 503 of the $i^{th}$ block, based on information on a bit interleave scheme included in the control information 512, and outputs an N-bit codeword 9104 of the $i^{th}$ block resulting from the interleaving.

The bit length adjuster 9101 receives the control information 512 and the interleaved N-bit codeword 9104 of the $i^{th}$ block as inputs, determines the value of PunNum, which is the number of bits to be removed from the interleaved N-bit codeword 9104 of the $i^{th}$ block, based on either one of the information on the modulation schemes for s1($t$) and s2($t$) and the value of X+Y included in the control information 512, removes data of PunNum bits from the interleaved N-bit codeword 9104 of the $i^{th}$ block, and outputs the data sequence 9102 having a length of N−PunNum bits. Similarly to the above embodiment, the value of PunNum is determined in a manner that N−PunNum becomes a multiple of the value of X+Y. (Depending on the value of X+Y (the set of the first modulation scheme for s1($t$) and the second modulation scheme for s2($t$)), the value of PunNum may be zero.)

The value of X+Y is the same as that described in the above embodiments.

The mapper 504 receives the control information 512 and the data sequence 9102 of N−PunNum bits as inputs, performs mapping based on the modulation schemes for s1($t$) and s2($t$) with reference to the information on the modulation schemes for s1($t$) and s2($t$) included in the control information 512, and outputs the first complex signal s1($t$) (505A) and the second complex signal s2($t$)(505B).

Figure 94:
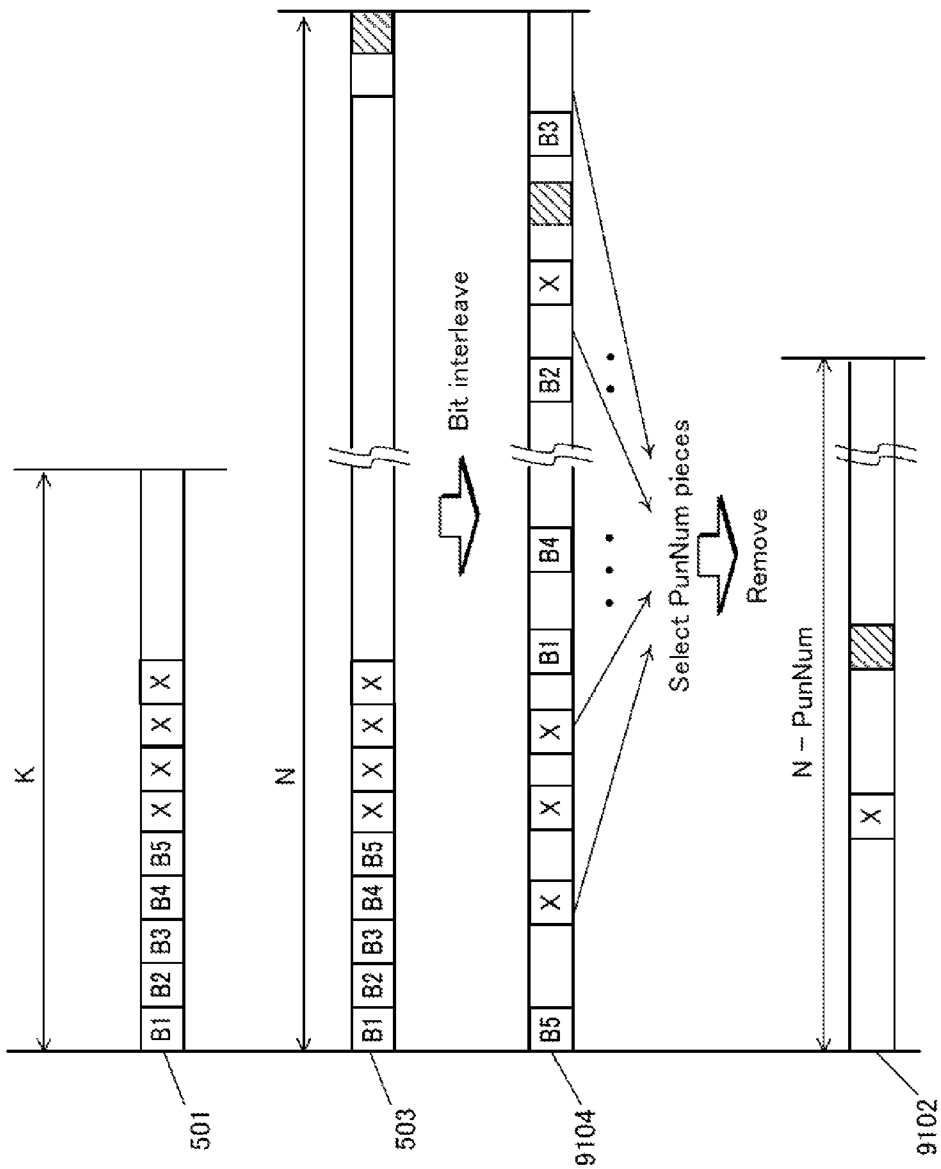
FIG. 94 shows the bit length of each bit sequence.

FIG. 94 shows the bit length of each bit sequence, and each of the squares represents 1 bit. The K-bit information 501 of the $i^{th}$ block in FIG. 93 is as shown in FIG. 94.

The N-bit codeword 503 of the $i^{th}$ block in FIG. 93 is as shown in FIG. 94. As shown in FIG. 94, bit interleaving, i.e., bit permutation, is performed on the N-bit codeword 503 of the $i^{th}$ block, whereby the interleaved N-bit codeword 9104 of the $i^{th}$ block is generated.

Thereafter, PunNum bits are selected and removed from the interleaved N-bit codeword 9104 of the $i^{th}$ block, whereby the data sequence 9102 of N−PunNum bits is generated (see FIG. 94).

(Advantage)

As described above, the value of PunNum is determined in a manner that in the data sequence 9102 of N−PunNum bits, N−PunNum becomes a multiple of the value of X+Y.

In this way, when the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N, since N−PunNum is a multiple of the value of X+Y. This configuration is more likely to allow the reduction of the memory size of the transmission device and/or the reception device.

Suppose that the value of X+Y, i.e., the set of the first modulation scheme for s1($t$) and the second modulation scheme s2($t$), is switched to another set (or the setting of the first modulation scheme for s1($t$) and the second modulation scheme for s2($t$) is changeable). In this case, since the bit length adjuster 9101 is arranged after the bit interleaver 9103, as shown in FIG. 93, the memory size of the bit interleaver is the same regardless of the set of the first modulation scheme for s1($t$) and the second modulation scheme s2($t$). This produces an advantageous effect of preventing an increase in the memory of the bit interleaver. (If the order of the bit length adjuster 9101 and the bit interleaver 9103 is reversed, the memory size may need to be changed depending on the set of the first modulation scheme for s1($t$) and the second modulation scheme for s2($t$). Accordingly, it is important to arrange the bit length adjuster 9101 after the bit interleaver 9103. In FIG. 93, the bit length adjuster 9101 is arranged immediately after the bit interleaver 9103. However, an interleaver that performs different interleaving or another processing unit may be inserted between the bit interleaver 9103 and the bit length adjuster 9101.)

Note that a plurality of codeword lengths (block lengths (code lengths)) may be prepared for the error correction code. For example, Na bits and Nb bits may be prepared each as the codeword length (block length (code length)) of the error correction code. In the case where the error correction code having a codeword length (block length (code length)) of Na bits is used, the memory size of the bit interleaver is set to Na bits, and bit interleaving is performed with the memory size of Na bits. Subsequently, the bit length adjuster 9101 of FIG. 93 removes a desired number of bits if necessary. Similarly, in the case where the error correction code having a codeword length (block length (code length)) of Nb bits is used, the memory size of the bit interleaver is set to Nb bits, and bit interleaving is performed with the memory size of Nb bits. Subsequently, the bit length adjuster 9101 of FIG. 93 removes a desired number of bits if necessary.

Example 3

FIG. 93 shows the configuration of a modulator of a transmission device according to the present embodiment. The modulator in FIG. 93 differs from the modulator in FIG. 91. In FIG. 93, elements that operate in the same way as elements described in the above embodiments with figures are labeled using the same reference signs.

The encoder 502 receives the control information 512 and the K-bit information 501 of the $i^{th}$ block as inputs, performs error correction coding of an LDPC code or the like based on information on a scheme of error correction coding, a coding rate, and a block length (code length) included in the control information 512, and outputs the N-bit encoded data 503 of the $i^{th}$ block.

A bit interleaver 9103 receives the control information 512 and z N-bit codewords, i.e., N-z bits (z being an integer greater than or equal to 1), as inputs, permutes the order of N×z bits, based on information on a bit interleave scheme included in the control information 512, and outputs a bit sequence 9104 resulting from the interleaving.

The bit length adjuster 9101 receives the control information 512 and the interleaved bit sequence 9104 as inputs, determines the value of PunNum, which is the number of bits to be removed from the interleaved bit sequence 9104, based on either one of the information on the modulation schemes for s1($t$) and s2($t$) and the value of X+Y included in the control information 512, removes data of PunNum bits from the interleaved bit sequence 9104, and outputs a data sequence 9102 having a length of N×z−PunNum bits.

Similarly to the above embodiment, the value of PunNum is determined in a manner that N×z−PunNum becomes a multiple of the value of X+Y. (Depending on the value of X+Y (the set of the first modulation scheme for s1($t$) and the second modulation scheme for s2($t$)), the value of PunNum may be zero.)

The value of X+Y is the same as that described in the above embodiments.

The mapper 504 receives the control information 512 and the data sequence 9102 of N×z−PunNum bits, performs mapping based on the modulation schemes for s1($t$) and s2($t$) with reference to the information on the modulation schemes for s1($t$) and s2($t$) included in the control information 512, and outputs the first complex signal s1 ($t$)(505A) and the second complex signal s2($t$)(505B).

Figure 95:
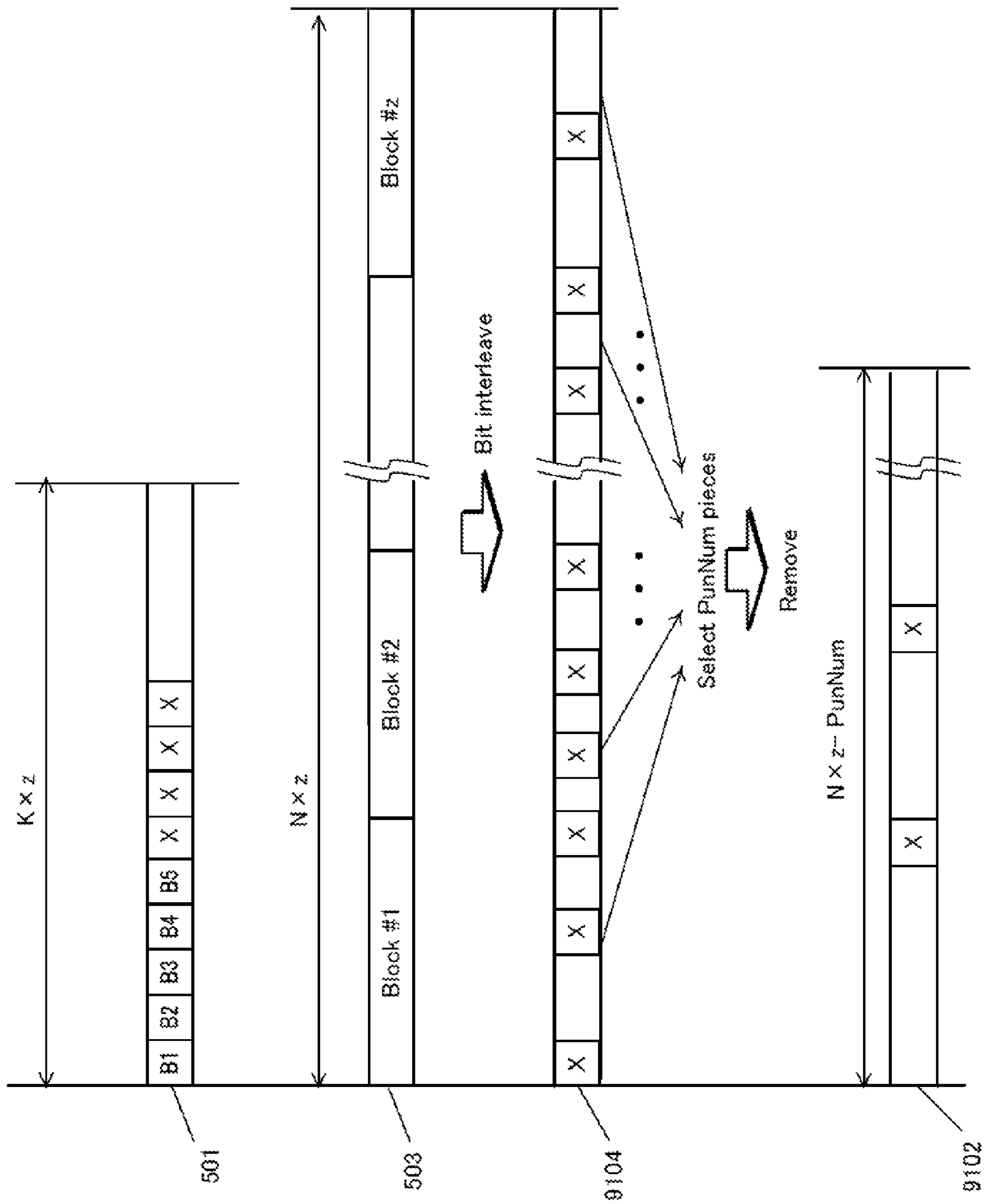
FIG. 95 shows the bit length of each bit sequence.

FIG. 95 shows the bit length of each bit sequence, and each of the squares represents 1 bit. The reference sign 501 in FIG. 95 indicates z K-bit information blocks.

The z N-bit codewords 503 in FIG. 93 are as shown in FIG. 95. As shown in FIG. 95, bit interleaving, i.e., bit permutation, is performed on the z N-bit codewords 503, whereby the interleaved (N×z)-bit sequence 9104 is generated.

Thereafter, PunNum bits are selected and removed from the interleaved (N×z)-bit sequence 9104, whereby the data sequence 9102 of N×z−PunNum bits is generated (see FIG. 95).

(Advantage)

As described above, the value of PunNum is determined in a manner that in the data sequence 9102 of N×z−PunNum bits. N×z−PunNum becomes a multiple of the value of X+Y.

In this way, when the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a block other than the z codewords, regardless of the value of N, since N×z−PunNum is a multiple of the value of X+Y. This configuration is more likely to allow the reduction of the memory size of the transmission device and/or the reception device.

Suppose that the value of X+Y, i.e., the set of the first modulation scheme for s1(*t*) and the second modulation scheme s2(*t*), is switched to another set (or the setting of the first modulation scheme for s1(*t*) and the second modulation scheme for s2(*t*) is changeable). In this case, since the bit length adjuster 9101 is arranged after the bit interleaver 9103, as shown in FIG. 93, the memory size of the bit interleaver is the same regardless of the set of the first modulation scheme for s1(*t*) and the second modulation scheme s2(*t*). This produces an advantageous effect of preventing an increase in the memory of the bit interleaver. (If the order of the bit length adjuster 9101 and the bit interleaver 9103 is reversed, the memory size may need to be changed depending on the set of the first modulation scheme for s1(*t*) and the second modulation scheme for s2(*t*). Accordingly, it is important to arrange the bit length adjuster 9101 after the bit interleaver 9103. In FIG. 93, the bit length adjuster 9101 is arranged immediately after the bit interleaver 9103. However, an interleaver that performs different interleaving or another processing unit may be inserted between the bit interleaver 9103 and the bit length adjuster 9101.)

Note that a plurality of codeword lengths (block lengths (code lengths)) may be prepared for the error correction code. For example, Na bits and Nb bits may be prepared each as the codeword length (block length (code length)) of the error correction code. In the case where the error correction code having a codeword length (block length (code length)) of Na bits is used, the memory size of the bit interleaver is set to Na bits, and bit interleaving is performed with the memory size of Na bits. Subsequently, the bit length adjuster 9101 of FIG. 93 removes a desired number of bits if necessary. Similarly, in the case where the error correction code having a codeword length (block length (code length)) of Nb bits is used, the memory size of the bit interleaver is set to Nb bits, and bit interleaving is performed with the memory size of Nb bits. Subsequently, the bit length adjuster 9101 of FIG. 93 removes a desired number of bits if necessary.

Note that a plurality of bit interleaving sizes may be prepared for the code length (block length (code length)) of each error correction code. For example, when the codeword length of an error correction code is N bits, N×a bits and N×b bits may be prepared as bit interleaving sizes (a and b each being an integer greater than or equal to 1). In the case where N×a bits are used as a bit interleaving size, bit interleaving is performed with the interleaving size of N×a bits, and subsequently the bit length adjuster 9101 of FIG. 93 removes a desired number of bits if necessary. Similarly, in the case where N×b bits are used as a bit interleaving size, bit interleaving is performed with the interleaving size of N×b bits, and subsequently the bit length adjuster 9101 of FIG. 93 removes a desired number of bits if necessary.

Embodiment 9

In the present embodiment, description is provided on the operation of a reception device that receives the modulated signals transmitted in the transmission scheme described in Embodiment 8. In particular, the description pertains to the operation of a bit sequence decoder.

More specifically, the following describes processing for demodulating (detecting) the complex signals s1(*t*) and s2(*t*) that are generated from the (information) bit sequence 501 by "the part for generating modulated signals" (modulator) described in Embodiment 8, and that are transmitted via processing such as MIMO precoding processing, and recovering a bit sequence from complex signals x1(*t*) and x2(*t*).

Note that the complex signals x1(*t*) and x2(*t*) are complex baseband signals obtained from received signals which are received via receive antennas.

Figure 96:
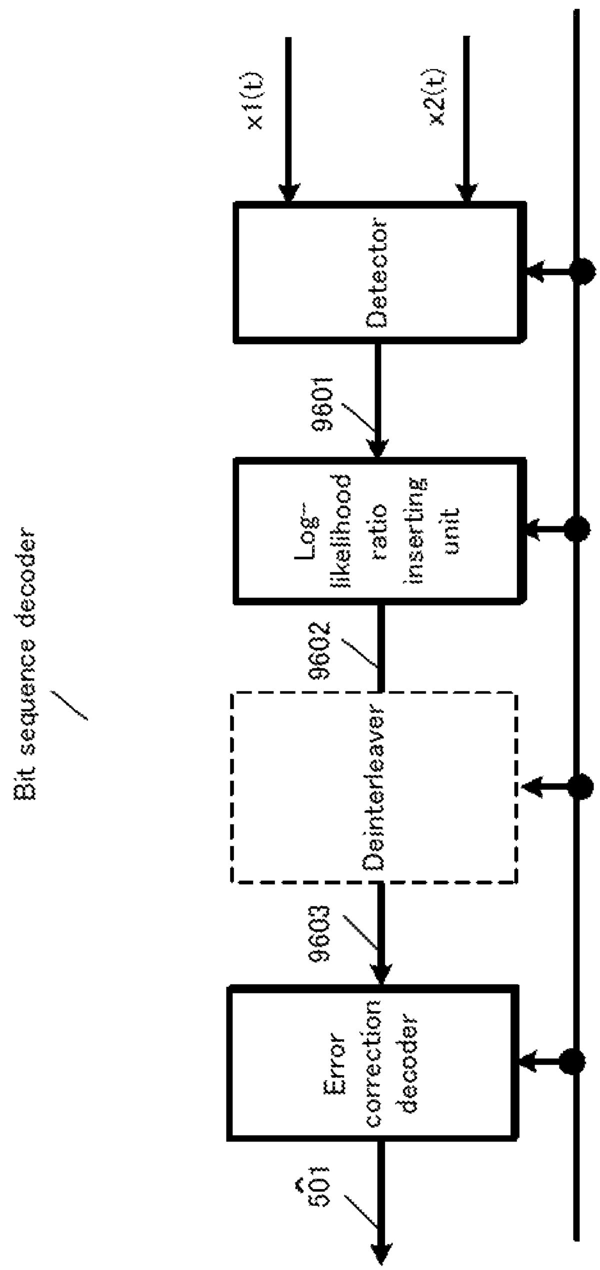
FIG. 96 shows an example of a bit sequence decoder of a reception device.

FIG. 96 shows a bit sequence decoder of a reception device that receives modulated signals transmitted based on the transmission scheme described in Embodiment 8.

In FIG. 96, the caret ˆ indicates an estimation result of the signal indicated by the reference sign under the caret. In the following description, the caret is simply indicated by ˆ before the reference sign.

The bit sequence decoder of FIG. 96 includes a detector (demodulator), a bit length adjuster, and an error correction decoder.

The detector (demodulator) shown in FIG. 96 generates, from the complex baseband signals x1(*t*) and x2(*t*) obtained from the received signals received via the receive antennas, data such as a hard decision value, a soft decision value, a log-likelihood, or a log-likelihood ratio that corresponds to each of the bits in X+Y, and outputs a data sequence 9601 corresponding to the data sequence 9102 having a bit length of either N−PunNum bits or N×z−PunNum bits which is a bit length of an integral multiple of X+Y. Here, X is the number of bits per symbol in the first complex signal s1, and Y is the number of bits per symbol in the second complex signal s2.

A log-likelihood ratio inserting unit of FIG. 96 receives, as an input, the data sequence 9601 corresponding to the data sequence 9102 having a bit length of either N−PunNum bits or N×z−PunNum bits, inserts, into the data sequence 9601, a log-likelihood ratio of each bit among the PunNum bits that have been removed by the transmission device, i.e., PunNum number of log-likelihood ratios, and outputs a log-likelihood ratio sequence 9602 including N or N×z log-likelihood ratios.

A deinterleaver in FIG. 96 receives the log-likelihood ratio sequence 9602 including N or N×z log-likelihood ratios as an input, deinterleaves the bits of the log-likelihood ratio sequence 9602, and outputs a log-likelihood ratio sequence 9603 including N or N×z log-likelihood ratios resulting from the deinterleaving.

The error correction decoder of FIG. 96 receives, as an input, the log-likelihood ratio sequence 9603 including N or N×z log-likelihood ratios resulting from the deinterleaving, performs error correction decoding (e.g., in the case of LDPC code, Belief Propagation (BP) decoding (e.g., sum-product decoding, min-sum decoding, Normalized BP decoding, or offset BP decoding) and Bit Flipping decoding), and obtains an information bit estimation sequence of K bits or K×z bits.

If the transmission device uses a bit interleaver, the reception device further includes a deinterleaver as shown in FIG. 96. On the other hand, if the transmission device does not use any bit interleaver, the deinterleaver in FIG. 96 is unnecessary.

Advantageous Effect of the Present Embodiment

The description has been provided on the operation of the reception device when the modulated signals are transmitted in the transmission scheme in Embodiment 8, with use of FIG. 96.

Each of the reception devices mentioned above changes the operation thereof based the modulation schemes for s1(*t*) and s2(*t*) used by the transmission device, and performs the operation of error correction decoding. This increases the probability to achieve a high data reception quality.

Also, when the encoder outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. In accordance with this, the error correction decoder appropriately performs operation for demodulation and decoding. This increases the probability to reduce the memory size of the reception device.

Embodiment 10

So far, description has been provided on the bit length adjustment schemes which are widely applicable to a precoding scheme. In the present embodiment, description is provided on a bit length adjustment scheme applicable to a transmission scheme in which phase change is regularly performed after precoding.

Figure 97:
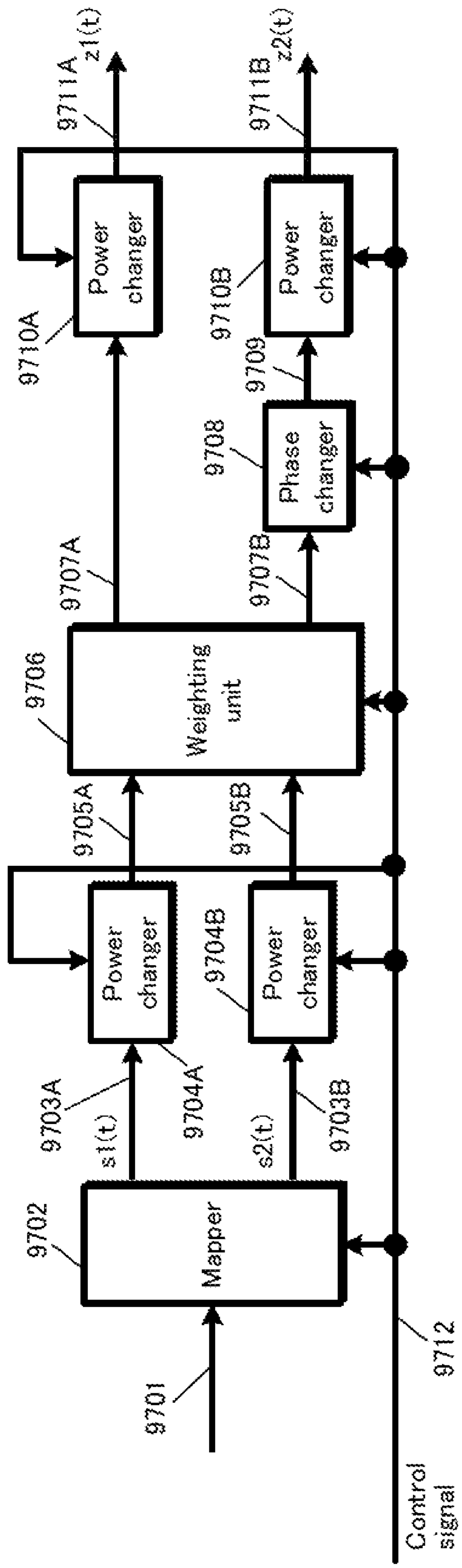
FIG. 97 shows a part that performs processing that relates to precoding.

FIG. 97 shows a part, of a transmission device according to the present embodiment, that performs processing that relates to precoding, A mapper 9702 of FIG. 97 receives a bit sequence 9701 and a control signal 9712 as inputs. The control signal 9712 is assumed to designate a transmission scheme for transmitting two streams. In addition, the control signal 9712 is assumed to designate modulation schemes α and β as modulation schemes for modulating two streams. The modulation schemes α and β are assumed to be modulation schemes for modulating x-bit data and y-bit data, respectively (for example, 16QAM (16 Quadrature Amplitude Modulation) is a modulation scheme for modulating 4-bit data, and 64QAM (64 Quadrature Amplitude Modulation) is a modulation scheme for modulating 6-bit data).

The mapper 9702 modulates x-bit data of (x+y)-bit data by using the modulation scheme α to generate a baseband signal s1(*t*) (9703A), and outputs the baseband signal $s_1(t)$. The mapper 9702 modulates remaining y-bit data of the (x+y)-bit data by using the modulation scheme β to generate a baseband signal $s_2(t)$ (9703B), and outputs the baseband signal $s_2(t)$ (9703B). (In FIG. 97, the number of mappers is one. As another configuration, however, a mapper for generating $s_1(t)$ and a mapper for generating $s_2(t)$ may be separately provided. In this case, the bit sequence 9701 is distributed to the mapper for generating $s_1(t)$ and the mapper for generating $s_2(t)$.)

Note that $s_1(t)$ and $s_2(t)$ are expressed in complex numbers ($s_1(t)$ and $s_2(t)$, however, may be either complex numbers or real numbers), and t is a time. When a transmission scheme, such as OFDM (Orthogonal Frequency Division Multiplexing), of using multi-carriers is used, s1 and s2 may be considered as functions of a frequency f, which are expressed as s1(*f*) and s2(*f*), and as functions of the time t and the frequency f which are expressed as s1(*t,f*) and s2(*t,f*).

Hereinafter, the baseband signals, precoding matrices, and phase changes are described as functions of the time t, but may be considered as the functions of the frequency f or the functions of the time t and the frequency f.

The baseband signals, precoding matrices, and phase changes are thus also described as functions of a symbol number i, but, in this case, may be considered as the functions of the time t, the functions of the frequency f, or the functions of the time t and the frequency f. That is to say, symbols and baseband signals may be generated in the time domain and arranged, and may be generated in the frequency domain and arranged. Alternatively, symbols and baseband signals may be generated in the time domain and in the frequency domain and arranged.

A power changer 9704A (power adjuster 9704A) receives the baseband signal $s_1(t)$(9703A) and the control signal 9712 as inputs, sets a real number $P_1$ based on the control signal 9712, and outputs $P_1 \times s_1(t)$ as a power-changed signal 9705A. (Although $P_1$ is described as a real number, $P_1$ may be a complex number.)

Similarly, a power changer 9704B (power adjuster 9704B) receives the baseband signal $s_2(t)$(9703B) and the control signal 9712 as inputs, sets a real number $P_2$, and outputs $P_2 \times s_2(t)$ as a power-changed signal 9705B. (Although $P_2$ is described as a real number, P2 may be a complex number.)

A weighting unit 9706 receives, as inputs, the power-changed signal 9705A, the power-changed signal 9705B, and the control signal 9712, and sets a precoding matrix F (or F(i)) based on the control signal 9712. Letting a slot number (symbol number) be i, the weighting unit 9706 performs the following calculation.

[Math. 357]

$$\begin{aligned}\begin{pmatrix} u_1(i) \\ u_2(i) \end{pmatrix} &= F\begin{pmatrix} P_1 \times s_1(i) \\ P_2 \times s_2(i) \end{pmatrix} \\ &= \begin{pmatrix} a & b \\ c & d \end{pmatrix}\begin{pmatrix} P_1 \times s_1(i) \\ P_2 \times s_2(i) \end{pmatrix} \\ &= \begin{pmatrix} a & b \\ c & d \end{pmatrix}\begin{pmatrix} P_1 & 0 \\ 0 & P_2 \end{pmatrix}\begin{pmatrix} s_1(i) \\ s_2(i) \end{pmatrix}\end{aligned} \tag{R10-1}$$

Here, a, b, c, and d can be expressed in complex numbers (may be real numbers), and the number of zeros among a, b, c, and d should not be three or more. Note that a, b, c, and d are coefficients determined by the set of the modulation scheme for $s_1(t)$ and the modulation scheme for $s_2(t)$ that have been determined.

The weighting unit 9706 outputs $u_1(i)$ in formula R10-1 as a weighted signal 9707A, and outputs $u_2(i)$ in formula R10-1 as a weighted signal 9707B.

A phase changer 9708 receives $u_2(i)$ in formula R10-1 (weighted signal 9707B) and the control signal 9712 as inputs, and performs phase change on $u_2(i)$ in formula R10-1 (weighted signal 9707B), based on the control signal 9712.

Thus, a signal obtained by performing phase change on $u_2(i)$ in formula R10-1 (weighted signal 9707B) is expressed as $e^{j\theta(i)} \times u_2(i)$, and the phase changer 9708 outputs $e^{j\theta(i)} \times u_2(i)$ as a phase-changed signal 9709 (j being an imaginary unit). The characterizing portion is that a value of changed phase is a function of i, which is expressed as θ(i).

A power changer 9710A receives the weighted signal 9707A($u_1(i)$) and the control signal 9712 as inputs, sets the real number $Q_1$ based on the control signal 9712, and outputs the $Q_1 \times u_1(t)$ as a power-changed signal 9711A($z_1(i)$). (Although $Q_1$ is described as a real number, $Q_1$ may be a complex number.)

Similarly, a power changer 9710B receives the phase-changed signal 9709($e^{j\theta(i)} \times u_2(i)$) and the control signal 9712 as inputs, sets the real number $Q_2$ based on the control signal 9712, and outputs the $Q_2 \times e^{j\theta(i)} \times u_2(i)$ as a power-changed signal 9711B($z_2$(i)). (Although $Q_2$ is described as a real number, $Q_2$ may be a complex number.)

Thus, $z_1$(i) and $z_2$(i), which are respectively outputs of the power changers 9710A and 9710B in FIG. 97, are expressed by the following formula.

[Math. 358]

$$\begin{pmatrix} z_1(i) \\ z_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} F \begin{pmatrix} P_1 \times s_1(i) \\ P_2 \times s_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a & b \\ c & d \end{pmatrix} \begin{pmatrix} P_1 \times s_1(i) \\ P_2 \times s_2(i) \end{pmatrix} = \begin{pmatrix} Q_1 & 0 \\ 0 & Q_2 \end{pmatrix} \begin{pmatrix} 1 & 0 \\ 0 & e^{j\theta(i)} \end{pmatrix} \begin{pmatrix} a & b \\ c & d \end{pmatrix} \begin{pmatrix} P_1 & 0 \\ 0 & P_2 \end{pmatrix} \begin{pmatrix} s_1(i) \\ s_2(i) \end{pmatrix} \quad \text{(R10-2)}$$

Figure 98:
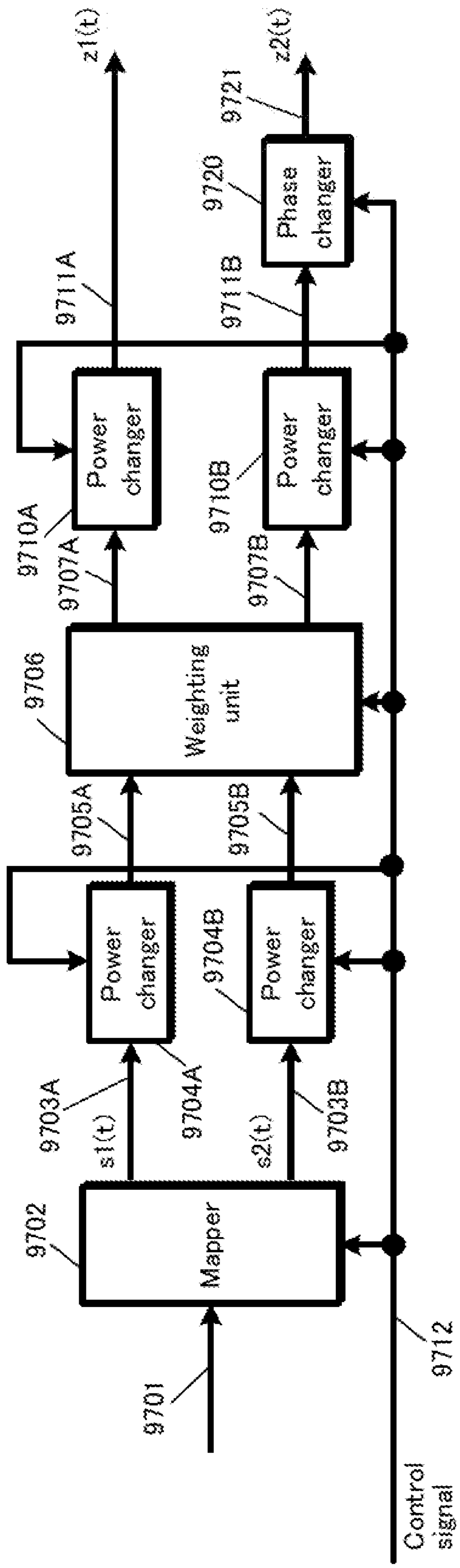
FIG. 98 shows a part that performs processing that relates to precoding.

FIG. 98 shows a different scheme for achieving formula R10-2 than that shown in FIG. 97. FIG. 97 differs from FIG. 98 in that the order of the power changer and the phase changer is switched. (The functions to perform power change and phase change themselves remain unchanged.) In this case, $z_1$(i) and $z_2$(i) are expressed by the following formula.

[Math. 359]

$$\begin{pmatrix} z_1(i) \\ z_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} F \begin{pmatrix} P_1 \times s_1(i) \\ P_2 \times s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a & b \\ c & d \end{pmatrix} \begin{pmatrix} P_1 \times s_1(i) \\ P_2 \times s_2(i) \end{pmatrix} = \begin{pmatrix} 1 & 0 \\ 0 & e^{j\theta(i)} \end{pmatrix} \begin{pmatrix} Q_1 & 0 \\ 0 & Q_2 \end{pmatrix} \begin{pmatrix} a & b \\ c & d \end{pmatrix} \begin{pmatrix} P_1 & 0 \\ 0 & P_2 \end{pmatrix} \begin{pmatrix} s_1(i) \\ s_2(i) \end{pmatrix} \quad \text{(R10-3)}$$

Note that $z_1$(i) in formula R10-2 is equal to $z_1$(i) in formula R10-3, and $z_2$(i) in formula R10-2 is equal to $z_2$(i) in formula R10-3.

When a value θ(i) of changed phase in formulas R10-2 and R10-3 is set such that θ(i+1)−θ(i) is a fixed value, for example, reception devices are likely to obtain high data reception quality in a radio-wave propagation environment where direct waves are dominant. How to give the value of changed phase θ(i), however, is not limited to the above-mentioned example. The relationship between how to give θ(i) and the operation of the bit length adjuster is described in detail below.

Figure 99:
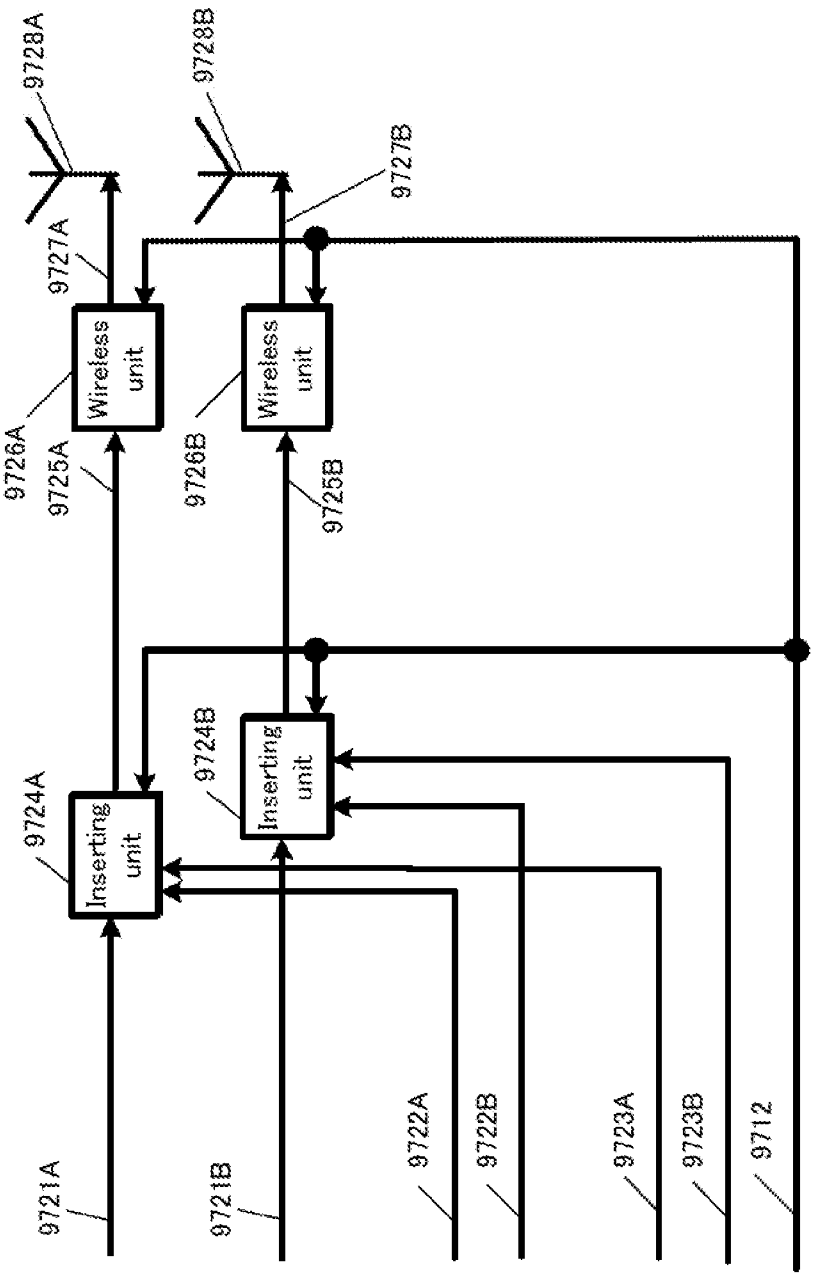
FIG. 99 shows an example of configuration of a signal processor.

FIG. 99 shows one example of a configuration of a signal processing unit for performing processing on the signals $z_1$(i) and $z_2$(i), which are obtained in FIGS. 97-98.

An inserting unit 9724A receives the signal $z_1$(i) (9721A), a pilot symbol 9722A, a control information symbol 9723A, and the control signal 9712 as inputs, inserts the pilot symbol 9722A and the control information symbol 9723A into the signal (symbol) $z_1$(i) (9721A) in accordance with the frame structure included in the control signal 9712, and outputs a modulated signal 9725A in accordance with the frame structure.

The pilot symbol 9722A and the control information symbol 9723A are symbols having been modulated by using a modulation scheme such as BPSK (Binary Phase Shift Keying) and QPSK (Quadrature Phase Shift Keying). Note that the other modulation schemes may be used.

A wireless unit 9726A receives the modulated signal 9725A and the control signal 9712 as inputs, performs processing such as frequency conversion and amplification on the modulated signal 9725A based on the control signal 9712 (processing such as inverse Fourier transformation is performed when the OFDM scheme is used), and outputs a transmission signal 9727A. The transmission signal 9727A is output from an antenna 9728A as a radio wave.

An inserting unit 9724B receives the signal $z_2$(i) (9721B), a pilot symbol 9722B, a control information symbol 9723B, and the control signal 9712 as inputs, inserts the pilot symbol 9722B and the control information symbol 9723B into the signal (symbol) $z_2$(i) (9721B) in accordance with the frame structure included in the control signal 9712, and outputs a modulated signal 9725B in accordance with the frame structure.

The pilot symbol 9722B and the control information symbol 9723B are symbols having been modulated by using a modulation scheme such as BPSK (Binary Phase Shift Keying) and QPSK (Quadrature Phase Shift Keying). Note that the other modulation schemes may be used.

A wireless unit 9726B receives the modulated signal 9725B and the control signal 9712 as inputs, performs processing such as frequency conversion and amplification on the modulated signal 9725B based on the control signal 9712 (processing such as inverse Fourier transformation is performed when the OFDM scheme is used), and outputs a transmission signal 9727B. The transmission signal 9727B is output from an antenna 9728B as a radio wave.

In this case, when i is set to the same number in the signal $z_1$(i) (9721A) and the signal $z_2$(i) (9721B), the signal $z_1$(i) (9721A) and the signal $z_2$(i) (9721B) are transmitted from different antennas at the same (shared/common) frequency at the same time (i.e., transmission is performed by using the MIMO scheme).

The pilot symbol 9722A and the pilot symbol 9722B are each a symbol for performing signal detection, frequency offset estimation, gain control, channel estimation, etc., in the reception device. Although referred to as a pilot symbol, the pilot symbol may be referred to as a reference symbol, or the like.

The control information symbol 9723A and the control information symbol 9723B are each a symbol for transmitting, to the reception device, information on a modulation scheme, a transmission scheme, a precoding scheme, an error correction coding scheme, a coding rate and a block length (code length) of an error correction code each used by the transmission device. The control information symbol may be transmitted by using only one of the control information symbol 9723A and the control information symbol 9723B.

Figure 100:
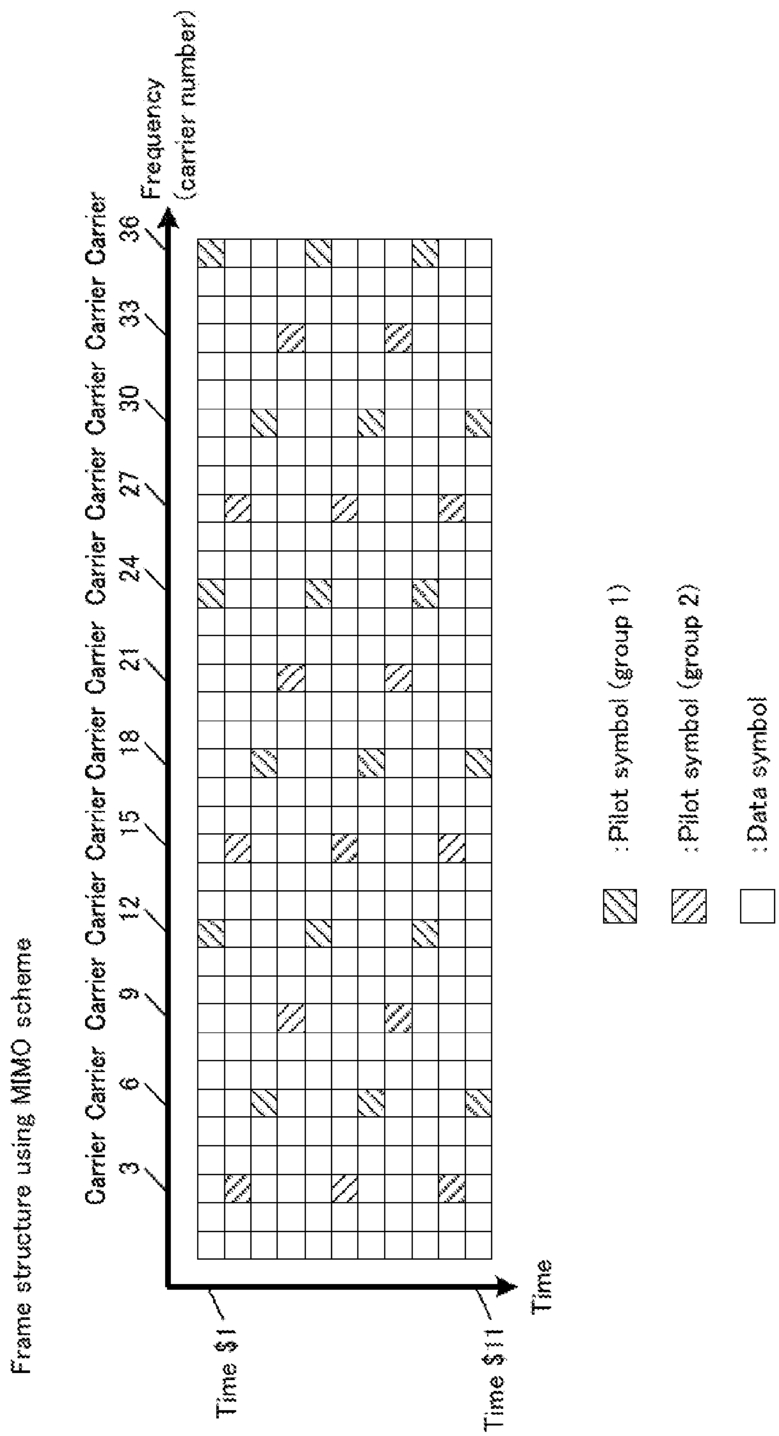
FIG. 100 shows an example of frame structure in a time-frequency domain when two streams are transmitted.

FIG. 100 shows one example of the frame structure in the time-frequency domain when two streams are transmitted. In FIG. 100, the horizontal and vertical axes respectively represent a frequency and a time. FIG. 100 shows the structure of symbols in a range of carrier 1 to carrier 38 and time $1 to time $11.

FIG. 100 shows the frame structure of the transmission signal transmitted from the antenna 9728A and the frame structure of the transmission signal transmitted from the antenna 9728B in FIG. 99 together.

In FIG. 100, in the case of a frame of the transmission signal transmitted from the antenna 9728A in FIG. 99, a data symbol corresponds to the signal (symbol) $z_1(i)$. A pilot symbol corresponds to the pilot symbol 9722A.

In FIG. 100, in the case of a frame of the transmission signal transmitted from the antenna 9728B in FIG. 99, a data symbol corresponds to the signal (symbol) $z_2(i)$. A pilot symbol corresponds to the pilot symbol 9722B.

Therefore, as set forth above, when i is set to the same number in the signal $z_1(i)$ (9721A) and the signal $z_2(i)$ (9721B), the signal $z_1(i)$ (9721A) and the signal $z_2(i)$ (9721B) are transmitted from different antennas at the same (shared/common) frequency at the same time. The structure of the pilot symbols is not limited to that shown in FIG. 100. For example, time intervals and frequency intervals of the pilot symbols are not limited to those shown in FIG. 100. The frame structure in FIG. 100 is such that pilot symbols are transmitted from the antennas 9728A and 9728B in FIG. 99 at the same time at the same frequency (the same (sub)carrier). The frame structure, however, is not limited to that shown in FIG. 99. For example, the frame structure may be such that pilot symbols are arranged at the antenna 9728A in FIG. 99 at the time A at the frequency a ((sub)carrier a) and no pilot symbols are arranged at the antenna 9728B in FIG. 99 at the time A at the frequency a ((sub)carrier a), and no pilot symbols are arranged at the antenna 9728A in FIG. 99 at the time B at the frequency b ((sub)carrier b) and pilot symbols are arranged at the antenna 9728B in FIG. 99 at the time B at the frequency b ((sub)carrier b).

Although only data symbols and pilot symbols are shown in FIG. 99, other symbols, such as control information symbols, may be included in a frame.

Description has been made so far on a case where one or more (or all) of the power changers exist, with use of FIGS. 97 and 98. However, there are cases where one or more of the power changers do not exist.

For example, in FIGS. 97 and 98, when the power changer (power adjuster) 9704A and the power changer (power adjuster) 9704B do not exist, $z_1(i)$ and $z_2(i)$ are expressed as follows.

[Math. 360]

$$\begin{pmatrix} z_1(i) \\ z_2(i) \end{pmatrix} = \begin{pmatrix} Q_1 & 0 \\ 0 & Q_2 \end{pmatrix}\begin{pmatrix} 1 & 0 \\ 0 & e^{j\theta(i)} \end{pmatrix}\begin{pmatrix} a & b \\ c & d \end{pmatrix}\begin{pmatrix} s_1(i) \\ s_2(i) \end{pmatrix} = \begin{pmatrix} 1 & 0 \\ 0 & e^{j\theta(i)} \end{pmatrix}\begin{pmatrix} Q_1 & 0 \\ 0 & Q_2 \end{pmatrix}\begin{pmatrix} a & b \\ c & d \end{pmatrix}\begin{pmatrix} s_1(i) \\ s_2(i) \end{pmatrix} \quad \text{(R10-4)}$$

In FIGS. 97 and 98, when the power changer (power adjuster) 9710A and the power changer (power adjuster) 9710B do not exist, $z_1(i)$ and $z_2(i)$ are expressed as follows.

[Math. 361]

$$\begin{pmatrix} z_1(i) \\ z_2(i) \end{pmatrix} = \begin{pmatrix} 1 & 0 \\ 0 & e^{j\theta(i)} \end{pmatrix}\begin{pmatrix} a & b \\ c & d \end{pmatrix}\begin{pmatrix} P_1 & 0 \\ 0 & P_2 \end{pmatrix}\begin{pmatrix} s_1(i) \\ s_2(i) \end{pmatrix} \quad \text{(R10-5)}$$

In FIGS. 97 and 98, when the power changer (power adjuster) 9704A, the power changer (power adjuster) 9704B, the power changer (power adjuster) 9710A, and the power changer (power adjuster) 9710B do not exist, $z_1(i)$ and $z_2(i)$ are expressed as follows.

[Math. 362]

$$\begin{pmatrix} z_1(i) \\ z_2(i) \end{pmatrix} = \begin{pmatrix} 1 & 0 \\ 0 & e^{j\theta(i)} \end{pmatrix}\begin{pmatrix} a & b \\ c & d \end{pmatrix}\begin{pmatrix} s_1(i) \\ s_2(i) \end{pmatrix} \quad \text{(R10-6)}$$

The following describes the relationship between how to give θ(i) in the processing that relates to precoding and the operation of the bit length adjuster.

In the present embodiment, a unit of phase, such as argument, in the complex plane is expressed in "radian".

Use of the complex plane allows for display of complex numbers in polar form in the polar coordinate system. When a point (a, b) in the complex plane is associated with a complex number z=a+jb (where a and b are each a real number, and j is an imaginary unit), and this point is expressed as [r, θ] in the polar coordinate system, $$a = r\times\cos\theta,$$

$$b = r\times\sin\theta, \text{ and}$$

[Math. 363]

$$r=\sqrt{a^2+b^2} \quad \text{(R10-7)}$$

are satisfied. Herein, r is the absolute value of z (r=|z|), and θ is the argument. Thus, z=a+jb is expressed as $r\times e^{j\theta}$.

The baseband signals s1, s2, z1, and z2 are complex signals. A complex signal made up of in-phase signal I and quadrature signal Q is also expressible as complex signal I+jQ (j is the imaginary unit). Here, either of I and Q may be equal to zero.

The following describes an example of how to give θ(i) in the processing that relates to precoding.

In the present embodiment, θ(i) is regularly changed, for example. Specifically, a period is provided for the change of θ(i), for example. The period for the change of θ(i) (hereinafter "θ(i) change period") is expressed as z. (Note that z is an integer greater than or equal to 2.) In the above condition, when the θ(i) change period z=9, θ(i) is changed as follows, for example.

Letting the slot number (symbol number) be i, the θ(i) change period z=9 is formed so as to satisfy the following conditions:

when $i=9\times k+0$, $\theta(i=9\times k+0)=0$ radians;

when $i=9\times k+1$, $\theta(i=9\times k+1)=(2\times 1\times\pi)/9$ radians;

when $i=9\times k+2$, $\theta(i=9\times k+2)=(2\times 2\times\pi)/9$ radians;

when $i=9\times k+3$, $\theta(i=9\times k+3)=(2\times 3\times\pi)/9$ radians;

when $i=9\times k+4$, $\theta(i=9\times k+4)=(2\times 4\times\pi)/9$ radians;

when $i=9\times k+5$, $\theta(i=9\times k+5)=(2\times 5\times\pi)/9$ radians;

when $i=9\times k+6$, $\theta(i=9\times k+6)=(2\times 6\times\pi)/9$ radians;

when $i=9\times k+7$, $\theta(i=9\times k+7)=(2\times 7\times\pi)/9$ radians; and when $i=9\times k+8$, $\theta(i=9\times k+8)=(2\times 8\times\pi)/9$ radians.

(Note that k is an integer.)

The scheme for forming the θ(i) change period z=9 is not limited to the above. For example, nine phases $\lambda_0$, $\lambda_1$, $\lambda_2$, $\lambda_3$, $\lambda_4$, $\lambda_5$, $\lambda_6$, $\lambda_7$, and $\lambda_8$ are prepared, and, letting the slot number (symbol number) be i, the θ(i) change period z=9 is formed so as to satisfy the following conditions:

when $i=9\times k+0$, $\theta(i=9\times k+0)=\lambda_0$ radians;

when $i=9\times k+1$, $\theta(i=9\times k+1)=\lambda_1$ radians;

when $i=9\times k+2$, $\theta(i=9\times k+2)=\lambda_2$ radians;

when $i=9\times k+3$, $\theta(i=9\times k+3)=\lambda_3$ radians;

$$\text{when } i=9\times k+4,\ \theta(i=9\times k+4)=\lambda_4 \text{ radians;}$$

$$\text{when } i=9\times k+5,\ \theta(i=9\times k+5)=\lambda_5 \text{ radians;}$$

$$\text{when } i=9\times k+6,\ \theta(i=9\times k+6)=\lambda_6 \text{ radians;}$$

$$\text{when } i=9\times k+7,\ \theta(i=9\times k+7)=\lambda_7 \text{ radians; and}$$

$$\text{when } i=9\times k+8,\ \theta(i=9\times k+8)=\lambda_8 \text{ radians.}$$

(Note that k is an integer, and $0\le\lambda_v<2\pi$ (where v is an integer from 0 to 8).)

Note that the following two schemes are available as the schemes for establishing the period z=9.

(1) $\lambda_x\ne\lambda_y$ holds true for all x and y, where x is an integer from 0 to 8, y is an integer from 0 to 8, and y≠x.

(2) $\lambda_x=\lambda_y$ holds true for some x and y, where x is an integer from 0 to 8, y is an integer from 0 to 8, and y≠x, resulting in the period z=9.

The above description can be generalized as follows. That is, the θ(i) change period z (z being an integer greater than or equal to 2) can be formed such that: z phases and X (v being an integer from 0 to z−1) are prepared; and letting the slot number (symbol number) be i, $$\text{when } i=z\times k+v,\ \theta(i=z\times k+v)=\lambda_v \text{ radians.}$$

(Note that k is an integer, and $0\le\lambda_v<2\pi$).

Note that the following two schemes are available as the schemes for establishing the period z.

(1) $\lambda_x\ne\lambda_y$ holds true for all x and y, where x is an integer from 0 to z−1, y is an integer from 0 to z−1, and y≠x.

(2) $\lambda_x=\lambda_y$ holds true for some x and y, where x is an integer from 0 to z−1, y is an integer from 0 to z−1, and y≠x, resulting in the period z.

The processing before the mapper 9702 in FIGS. 97 and 98 is as described in Embodiments 1 to 9. The following provides detailed description on particularly important points in the present embodiment.

Modification of Embodiment 1

In Embodiment 1, the configuration of the modulator that performs processing before the mapper 9702 in FIGS. 97 and 98 is as shown in FIG. 57. The feature of Embodiment 1 is as follows.

"When the encoder 502 in FIG. 57 outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. In order for X+Y bits not to include data of a plurality of blocks, the bit length adjuster 5701 receives the first bit sequence 503 as an input, adds an adjustment bit sequence to the ending, the beginning, or a predetermined position of the codeword of the error correction code having a codeword length (block length (code length)) of N bits, and outputs, to the mapper, the second bit sequence composed of the number of bits which is a multiple of X+Y".

Note that the value of X+Y is the same as that described in Embodiments 1 to 3 above.

In the present modification of Embodiment 1, the aforementioned θ(i) change period z is also taken into consideration to determine the number of bits of the adjustment bit sequence. Detailed description is provided below.

For simplicity, the following description is provided with a specific example.

The code length (block length) of an error correction code for use is assumed to be 64800 bits, and the θ(i) change period z is assumed to be 9. Concerning the modulation schemes, QPSK, 16QAM, 64QAM, and 256QAM are usable. Accordingly, the set of the modulation scheme of s1(*t*) (first complex signal s1) and the modulation scheme of s2(*t*) (second complex signal s2) can be any one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM). In the following description, some of these sets are taken as examples.

As with the case of the other embodiments, the modulation scheme of the first complex signal s1 (s1(*t*)) and the modulation scheme of the second complex signal s2 (s2(*t*)) are each switchable between a plurality of modulation schemes.

The following definitions are provided for the description below.

α is an integer greater than or equal to 0, and β is an integer greater than or equal to 0. The least common multiple of α and β is expressed by LCM(α, β). For example, letting α be 8 and β be 6, LCM(α, β) is 24.

A feature of the present modification of Embodiment 1 is that, regarding the value of X+Y, the θ(i) change period z, and the sum of the number of bits of a code length (N) and the number of bits of an adjustment bit sequence, when γ=LCM(X+Y, z), the sum of N and the number of bits of the adjustment bit sequence is a multiple of γ. In other words, the sum of N and the number of bits of an adjustment bit sequence is a multiple of the least common multiple of X+Y and z. Note that X is an integer greater than or equal to 1, and Y is an integer greater than or equal to 1. Accordingly, the value of X+Y is an integer greater than or equal to 2, and z is an integer greater than or equal to 2. Although the number of bits of the adjustment bit sequence is ideally 0, there may be a case where the number is not 0. In this case, it is important to add the adjustment bit sequence as described above.

Description on this point is provided below with an example.

Example 1

Assume that the set of the modulation scheme of $s_1(t)$ (first complex signal s1) and the modulation scheme of $s_2(t)$ (second complex signal s2) is (16QAM, 16QAM), the codeword length (block length (code length)) of an error correction code (e.g., a block code such as an LDPC code) is 64800 bits, and the θ(i) change period z is 9. In this case, γ=LCM(X+Y, z)=(8, 9)=72. Accordingly, the number of bits of the adjustment bit sequence necessary to obtain the above feature is 72×n bits (n being an integer greater than or equal to 0).

Figure 101:
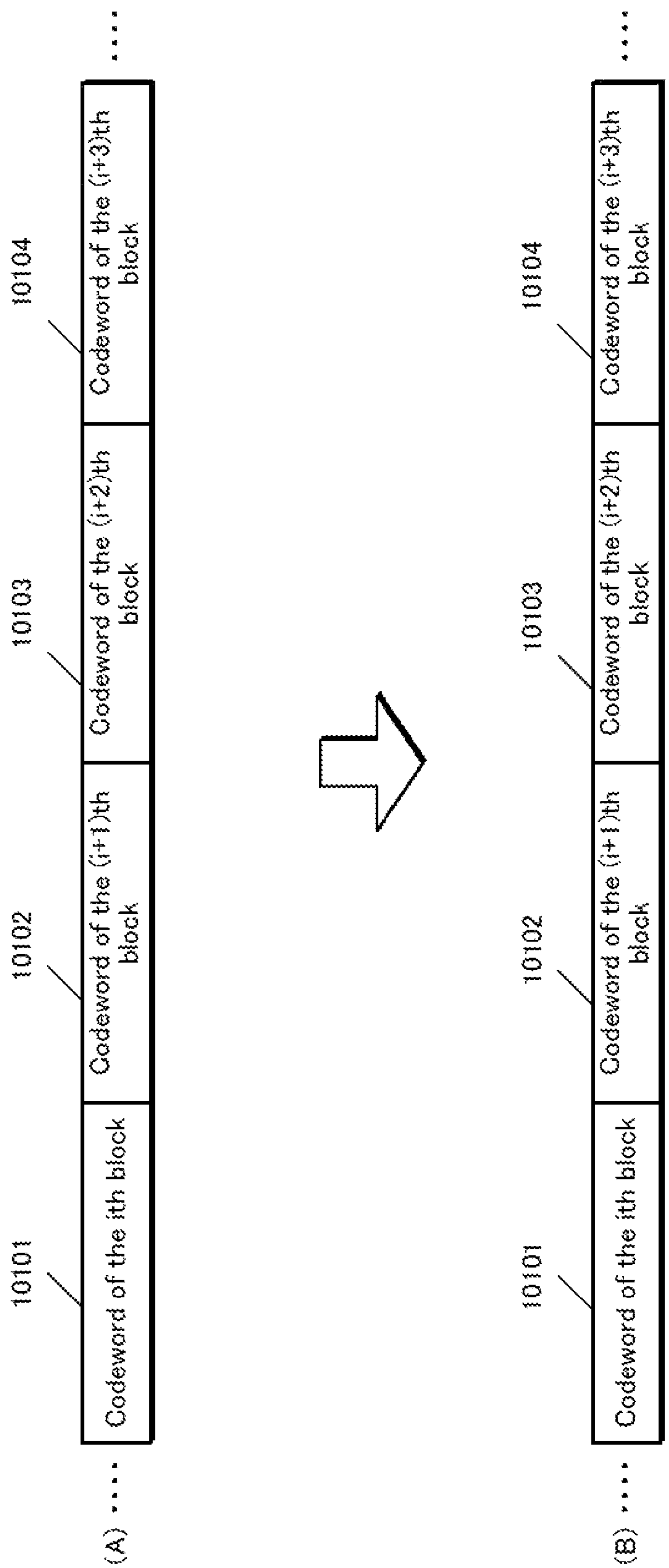
FIG. 101 shows an output first bit sequence 503 in portion (A), and shows an output second bit sequence 5703 in portion (B).

The portion (A) of FIG. 101 shows the first bit sequence 503 output from the encoder 502 of the modulator in FIG. 57. In the portion (A) of FIG. 101, the reference sign 10101 indicates the codeword of the $i^{th}$ block of 64800 bits, the reference sign 10102 indicates the codeword of the $(i+1)^{th}$ block of 64800 bits, the reference sign 10103 indicates the codeword of the $(i+2)^{th}$ block of 64800 bits, and the reference sign 10104 indicates the codeword of the $(i+3)^{th}$ block of 64800 bits, and these blocks are followed by the codeword of the $(i+4)^{th}$ block, the codeword of the $(i+5)^{th}$ block, . . . .

As described above, the number of bits of the adjustment bit sequence necessary to obtain the above feature is 72×n bits (n being an integer greater than or equal to 0). In the present example, the number of bits of the adjustment bit sequence is 0 (zero). Accordingly, the second bit sequence 5703 output from the bit length adjuster 5701 of the modulator of FIG. 57 is as shown in the portion (B) of FIG. 101. That is, as with the case of the first bit sequence 503 output from the encoder 502 of the modulator in FIG. 57, in the portion (B) of FIG. 101 showing the second bit sequence 5703 output from the bit length adjuster 5701 of the modulator in FIG. 57, the codeword 10101 of the $i^{th}$ block of 64800 bits, the codeword 10102 of the $(i+1)^{th}$ block of 64800 bits, the codeword 10103 of the $(i+2)^{th}$ block of 64800 bits, and the codeword 10104 of the $(i+3)^{th}$ block of 64800 bits are arranged in this order, followed by the codeword of the $(i+4)^{th}$ block, the codeword of the $(i+5)^{th}$ block, . . . .

Example 2

Assume the set of the modulation scheme of $s_1(t)$ (first complex signal s1) and the modulation scheme of $s_2(t)$ (second complex signal s2) is (64QAM, 256QAM), the codeword length (block length (code length)) of an error correction code (e.g., a block code such as an LDPC code) is 64800 bits, and the θ(i) change period z is 9. In this case, γ=LCM(X+Y, z)=(14, 9)=126. Accordingly, the number of bits of the adjustment bit sequence necessary to obtain the above feature is 126×n+90 bits (n being an integer greater than or equal to 0).

Figure 102:
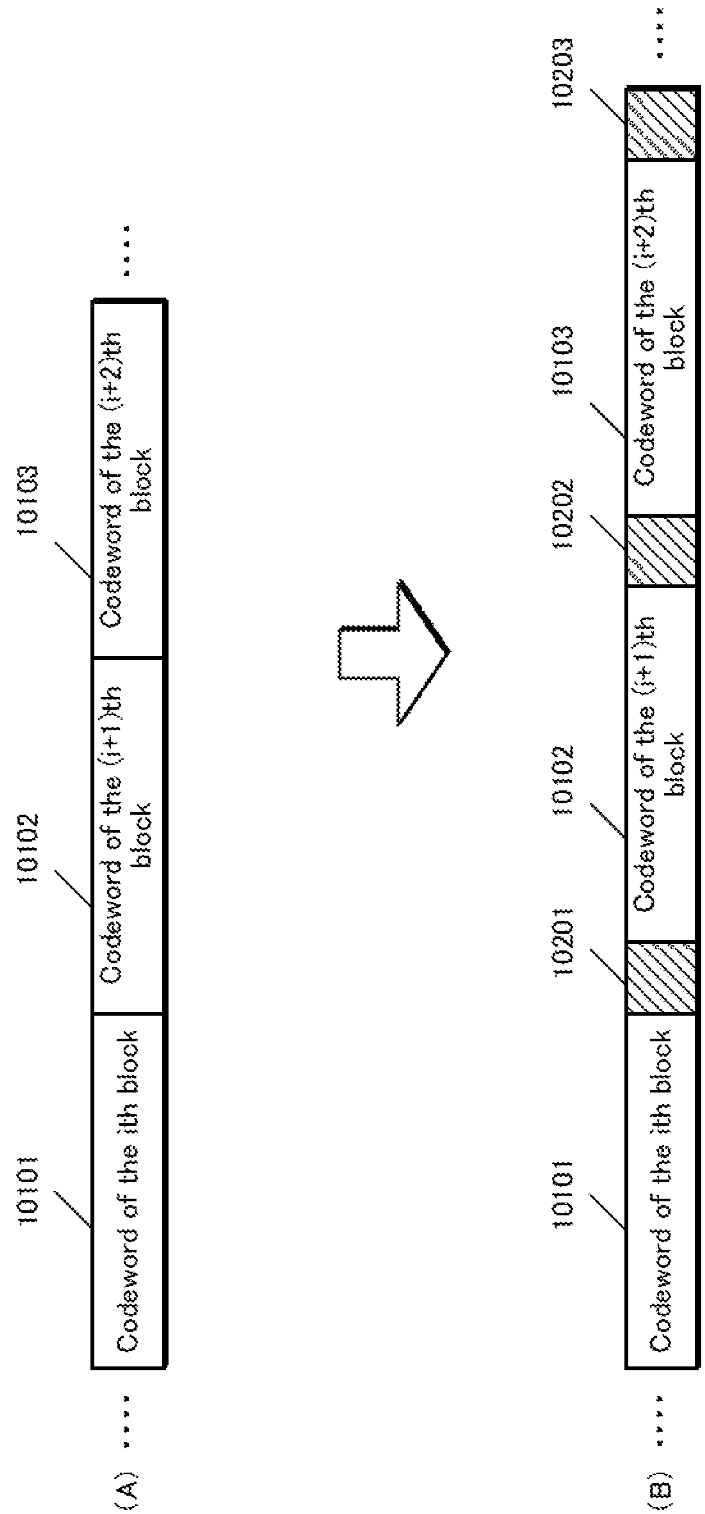
FIG. 102 shows an output first bit sequence 503 in portion (A), and shows an output second bit sequence 5703 in portion (B).

The portion (A) of FIG. 102 shows the first bit sequence 503 output from the encoder 502 of the modulator in FIG. 57. In the portion (A) of FIG. 102, the reference sign 10101 indicates the codeword of the $i^{th}$ block of 64800 bits, the reference sign 10102 indicates the codeword of the $(i+1)^{th}$ block of 64800 bits, the reference sign 10103 indicates the codeword of the $(i+2)^{th}$ block of 64800 bits, and the reference sign 10104 indicates the codeword of the $(i+3)^{th}$ block of 64800 bits, and these blocks are followed by the codeword of the $(i+4)^{th}$ block, the codeword of the $(i+5)^{th}$ block, . . . .

As described above, the number of bits of the adjustment bit sequence necessary to obtain the above feature is 126×n+90 bits (n being an integer greater than or equal to 0). In the present example, the number of bits of the adjustment bit sequence is 90. Accordingly, the second bit sequence 5703 output from the bit length adjuster 5701 of the modulator of FIG. 57 is as shown in the portion (B) of FIG. 102.

In the portion (B) of FIG. 102, the reference signs 10201, 10202, and 10203 each indicate an adjustment bit sequence. The adjustment bit sequence 10201 is an adjustment bit sequence for the codeword 10101 of the $i^{th}$ block of 64800 bits, and is composed of 90 bits. Accordingly, the sum of the number of bits of the codeword 10101 of the $i^{th}$ block of 64800 bits and the number of bits of the adjustment bit sequence 10201 is 64890. As such, the advantage of Embodiment 1 is obtained. The number of slots (each slot being made up of one symbol of s1 and one symbol of s2) necessary to transmit 64890 bits, which is the sum of the number of bits of the codeword 10101 of the $i^{th}$ block of 64800 bits and the number of bits of the adjustment bit sequence 10201, is an integral multiple of the θ(i) change period z=9.

In this way, the number of appearances of each of the nine values that θ(i) may take, within the slots for 64890 bits which is the sum of the number of bits of the codeword 10101 of the $i^{th}$ block of 64800 bits and the number of bits of the adjustment bit sequence 10201, becomes equal. This increases the probability to obtain information included in the codeword 10101 of the $i^{th}$ block with high reception quality.

Similarly, the adjustment bit sequence 10202 is an adjustment bit sequence for the codeword 10102 of the $(i+1)^{th}$ block of 64800 bits, and is composed of 90 bits. Accordingly, the sum of the number of bits of the codeword 10102 of the $(i+1)^{th}$ block of 64800 bits and the number of bits of the adjustment bit sequence 10202 is 64890. As such, the advantage of Embodiment 1 is obtained. The number of slots necessary to transmit 64890 bits, which is the sum of the number of bits of the codeword 10102 of the $(i+1)^{th}$ block of 64800 bits and the number of bits of the adjustment bit sequence 10202, is an integral multiple of the θ(i) change period z=9. In this way, the number of appearances of each of the nine values that θ(i) may take, within the slots for 64890 bits which is the sum of the number of bits of the codeword 10102 of the $(i+1)^{th}$ block of 64800 bits and the number of bits of the adjustment bit sequence 10202, becomes equal. This increases the probability to obtain information included in the codeword 10102 of the $(i+1)^{th}$ block with high reception quality.

Similarly, the adjustment bit sequence 10203 is an adjustment bit sequence for the codeword 10103 of the $(i+2)^{th}$ block of 64800 bits, and is composed of 90 bits. Accordingly, the sum of the number of bits of the codeword 10103 of the $(i+2)^{th}$ block of 64800 bits and the number of bits of the adjustment bit sequence 10203 is 64890. As such, the advantage of Embodiment 1 is obtained. The number of slots necessary to transmit 64890 bits, which is the sum of the number of bits of the codeword 10103 of the $(i+2)^{th}$ block of 64800 bits and the number of bits of the adjustment bit sequence 10203, is an integral multiple of the θ(i) change period z=9. In this way, the number of appearances of each of the nine values that θ(i) may take, within the slots for 64890 bits which is the sum of the number of bits of the codeword 10103 of the $(i+2)^{th}$ block of 64800 bits and the number of bits of the adjustment bit sequence 10203, becomes equal. This increases the probability to obtain information included in the codeword 10103 of the $(i+2)^{th}$ block with high reception quality.

Note that the scheme for inserting an adjustment bit sequence is not limited to the scheme shown in FIG. 102. The stun of a codeword of 64800 bits and an adjustment bit sequence of 90 bits, i.e., 64890 bits, may be arranged in any order.

Modification of Embodiment 2

In Embodiment 2, the configuration of the modulator that performs processing before the mapper 9702 in FIGS. 97 and 98 is as shown in FIG. 60. The feature of Embodiment 2 is as follows.

"When the encoder 502LA in FIG. 60 outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. In order for X+Y bits not to include data of a plurality of blocks, the bit length adjuster 6001 receives the first bit sequence 503 as an input, adds an adjustment bit sequence to the ending, the beginning, or a predetermined position of the codeword of the error correction code having a codeword length (block length (code length)) of N bits, and outputs, to the mapper, the second bit sequence composed of the number of bits which is a multiple of X+Y. The adjustment bit sequence includes at least one repetition of the bit value of a predetermined portion of the N-bit codeword obtained by the encoding processing". Note that the value of X+Y is the same as that described in Embodiments 1 to 3 above.

In the present modification of Embodiment 2, the aforementioned θ(i) change period z is also taken into consideration to determine the number of bits of the adjustment bit sequence. Detailed description is provided below.

For simplicity, the following description is provided with a specific example.

The code length (block length) of an error correction code for use is assumed to be 64800 bits, and the θ(i) change period z is assumed to be 9. Concerning the modulation schemes, QPSK, 16QAM, 64QAM, and 256QAM are usable. Accordingly, the set of the modulation scheme of s1(*t*) (first complex signal s1) and the modulation scheme of s2(*t*) (second complex signal s2) can be any one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM). In the following description, some of these sets are taken as examples.

As with the case of the other embodiments, the modulation scheme of the first complex signal s1 (s1(*t*)) and the modulation scheme of the second complex signal s2 (s2(*t*)) are each switchable between a plurality of modulation schemes.

A feature of the present modification of Embodiment 2 is that, regarding the value of X+Y, the θ(i) change period z, and the sum of the number of bits of a code length (N) and the number of bits of an adjustment bit sequence, when γ=LCM(X+Y, z), the sum of N and the number of bits of the adjustment bit sequence is a multiple of γ. In other words, the sum of N and the number of bits of the adjustment bit sequence is a multiple of the least common multiple of X+Y and z. Note that X is an integer greater than or equal to 1, and Y is an integer greater than or equal to 1. Accordingly, the value of X+Y is an integer greater than or equal to 2, and z is an integer greater than or equal to 2. Although the number of bits of the adjustment bit sequence is ideally 0, there may be a case where the number is not 0. In this case, it is important to add the adjustment bit sequence as described above.

Description on this point is provided below with an example.

Example 3

Assume the set of the modulation scheme of $s_1(t)$ (first complex signal s1) and the modulation scheme of $s_2(t)$ (second complex signal s2) is (16QAM, 16QAM), the codeword length (block length (code length)) of an error correction code (e.g., a block code such as an LDPC code) is 64800 bits, and the θ(i) change period z is 9. In this case, γ=LCM(X+Y, z)=(8, 9)=72. Accordingly, the number of bits of the adjustment bit sequence necessary to obtain the above feature is 72-n bits (n being an integer greater than or equal to 0).

The portion (A) of FIG. 101 shows the first bit sequence 503 output from the encoder 502LA of the modulator in FIG. 60. In the portion (A) of FIG. 101, the reference sign 10101 indicates the codeword of the $i^{th}$ block of 64800 bits, the reference sign 10102 indicates the codeword of the $(i+1)^{th}$ block of 64800 bits, the reference sign 10103 indicates the codeword of the $(i+2)^{th}$ block of 64800 bits, and the reference sign 10104 indicates the codeword of the $(i+3)^{th}$ block of 64800 bits, and these blocks are followed by the codeword of the $(i+4)^{th}$ block, the codeword of the $(i+5)^{th}$ block, . . . .

As described above, the number of bits of the adjustment bit sequence necessary to obtain the above feature is 72×n bits (n being an integer greater than or equal to 0). In the present example, the number of bits of the adjustment bit sequence is 0 (zero). Accordingly, the second bit sequence 6003 output from the bit length adjuster 6001 of the modulator of FIG. 60 is as shown in the portion (B) OF FIG. 101. That is, as with the case of the first bit sequence 503 output from the 502LA of the modulator in FIG. 60, in the portion (B) of FIG. 101 showing the second bit sequence 6003 output from the bit length adjuster 6001 of the modulator in FIG. 60, the codeword 10101 of the $i^{th}$ block of 64800 bits, the codeword 10102 of the $(i+1)^{th}$ block of 64800 bits, the codeword 10103 of the $(i+2)^{th}$ block of 64800 bits, and the codeword 10104 of the $(i+3)^{th}$ block of 64800 bits are arranged in this order, followed by the codeword of the $(i+4)^{th}$ block, the codeword of the $(i+5)^{th}$ block, . . . .

Example 4

Assume the set of the modulation scheme of $s_1(t)$ (first complex signal s1) and the modulation scheme of $s_2(t)$ (second complex signal s2) is (64QAM, 256QAM), the codeword length (block length (code length)) of an error correction code (e.g., a block code such as an LDPC code) is 64800 bits, and the θ(i) change period z is 9. In this case, γ=LCM(X+Y, z)=(14, 9)=126. Accordingly, the number of bits of the adjustment bit sequence necessary to obtain the above feature is 126×n+90 bits (n being an integer greater than or equal to 0).

The portion (A) of FIG. 102 shows the first bit sequence 503 output from the encoder 502LA of the modulator in FIG. 60. In the portion (A) of FIG. 102, the reference sign 10101 indicates the codeword of the $i^{th}$ block of 64800 bits, the reference sign 10102 indicates the codeword of the $(i+1)^{th}$ block of 64800 bits, the reference sign 10103 indicates the codeword of the $(i+2)^{th}$ block of 64800 bits, and the reference sign 10104 indicates the codeword of the $(i+3)^{th}$ block of 64800 bits, and these blocks are followed by the codeword of the $(i+4)^{th}$ block, the codeword of the $(i+5)^{th}$ block, . . . .

As described above, the number of bits of the adjustment bit sequence necessary to obtain the above feature is 126×n+90 bits (n being an integer greater than or equal to 0). In the present example, the number of bits of the adjustment bit sequence is 90. Accordingly, the second bit sequence 6003 output from the bit length adjuster 6001 of the modulator of FIG. 60 is as shown in the portion (B) of FIG. 102.

In the portion (B) of FIG. 102, the reference signs 10201, 10202, and 10203 each indicate an adjustment bit sequence. The adjustment bit sequence 10201 is an adjustment bit sequence for the codeword 10101 of the $i^{th}$ block of 64800 bits, and is composed of 90 bits. Accordingly, the sum of the number of bits of the codeword 10101 of the $i^{th}$ block of 64800 bits and the number of bits of the adjustment bit sequence 10201 is 64890. As such, the advantage of Embodiment 2 is obtained. The number of slots (each slot being made up of one symbol of s1 and one symbol of s2) necessary to transmit 64890 bits, which is the sum of the number of bits of the codeword 10101 of the $i^{th}$ block of 64800 bits and the number of bits of the adjustment bit sequence 10201, is an integral multiple of the θ(i) change period z=9.

In this way, the number of appearances of each of the nine values that θ(i) may take, within the slots for 64890 bits which is the sum of the number of bits of the codeword 10101 of the $i^{th}$ block of 64800 bits and the number of bits of the adjustment bit sequence 10201, becomes equal. This increases the probability to obtain information included in the codeword 10101 of the $i^{th}$ block with high reception quality.

Similarly, the adjustment bit sequence 10202 is an adjustment bit sequence for the codeword 10102 of the $(i+1)^{th}$ block of 64800 bits, and is composed of 90 bits. Accordingly, the sum of the number of bits of the codeword 10102 of the $(i+1)^{th}$ block of 64800 bits and the number of bits of the adjustment bit sequence 10202 is 64890. As such, the advantage of Embodiment 2 is obtained. The number of slots necessary to transmit 64890 bits, which is the sum of the number of bits of the codeword 10102 of the $(i+1)^{th}$ block of 64800 bits and the number of bits of the adjustment bit sequence 10202, is an integral multiple of the θ(i) change period z=9. In this way, the number of appearances of each of the nine values that θ(i) may take, within the slots for 64890 bits which is the sum of the number of bits of the codeword 10102 of the $i^{th}$ block of 64800 bits and the number of bits of the adjustment bit sequence 10202, becomes equal. This increases the probability to obtain information included in the codeword 10102 of the $i^{th}$ block with high reception quality.

Similarly, the adjustment bit sequence 10203 is an adjustment bit sequence for the codeword 10103 of the $(i+2)^6$ block of 64800 bits, and is composed of 90 bits. Accordingly, the sum of the number of bits of the codeword 10103 of the $(i+2)^{th}$ block of 64800 bits and the number of bits of the adjustment bit sequence 10203 is 64890. As such, the advantage of Embodiment 2 is obtained. The number of slots necessary to transmit 64890 bits, which is the sum of the number of bits of the codeword 10103 of the $(i+2)^{th}$ block of 64800 bits and the number of bits of the adjustment bit sequence 10203, is an integral multiple of the θ(i) change period z=9. In this way, the number of appearances of each of the nine values that θ(i) may take, within the slots for 64890 bits which is the sum of the number of bits of the codeword 10103 of the $(i+2)^{th}$ block of 64800 bits and the number of bits of the adjustment bit sequence 10203, becomes equal. This increases the probability to obtain information included in the codeword 10103 of the $(i+2)^{th}$ block with high reception quality.

Note that as described in Embodiment 2, each adjustment bit sequence includes at least one repetition of the bit value of a predetermined portion of an N-bit codeword obtained by encoding processing. The specific schemes for configuring the adjustment bit sequences are as described in Embodiment 2.

Note that the scheme for inserting an adjustment bit sequence is not limited to the scheme shown in FIG. 102. The sum of a codeword of 64800 bits and an adjustment bit sequence of 90 bits. i.e., 64890 bits, may be arranged in any order.

Modification of Embodiment 3

In Embodiment 3, the configuration of the modulator that performs processing before the mapper 9702 in FIGS. 97 and 98 is as shown in FIG. 73. The feature of Embodiment 3 is as follows.

"When the encoder 502LA in FIG. 73 outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. In order for X+Y bits not to include data of a plurality of blocks, the bit length adjuster 7301 receives the bit sequence 503V as an input, adds an adjustment bit sequence to the ending, the beginning, or a predetermined position of the codeword of the error correction code having a codeword length (block length (code length)) of N bits, and outputs, to the mapper, the post-adjustment bit sequence composed of the number of bits which is a multiple of X+Y. The post-adjustment bit sequence includes at least one repetition of the bit value of a predetermined portion of the N-bit codeword obtained by the encoding processing or, alternatively, is composed of a predetermined bit sequence".

Note that the value of X+Y is the same as that described in Embodiments 1 to 3 above.

In the present modification of Embodiment 2, the aforementioned θ(i) change period z is also taken into consideration to determine the number of bits of the adjustment bit sequence. Detailed description is provided below.

For simplicity, the following description is provided with a specific example.

The code length (block length) of an error correction code for use is assumed to be 64800 bits, and the θ(i) change period z is assumed to be 9. Concerning the modulation schemes, QPSK, 16QAM, 64QAM, and 256QAM are usable. Accordingly, the set of the modulation scheme of s1(*t*) (first complex signal s1) and the modulation scheme of s2(*t*) (second complex signal s2) can be any one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM). In the following description, some of these sets are taken as examples.

As with the case of the other embodiments, the modulation scheme of the first complex signal s1 (s1(*t*)) and the modulation scheme of the second complex signal s2 (s2(*t*)) are each switchable between a plurality of modulation schemes.

A feature of the present modification of Embodiment 3 is that, regarding the value of X+Y, the θ(i) change period z, and the stun of the number of bits of a code length (N) and the number of bits of an adjustment bit sequence, when γ=LCM(X+Y, z), the sum of N and the number of bits of the adjustment bit sequence is a multiple of γ. In other words, the sum of N and the number of bits of the adjustment bit sequence is a multiple of the least common multiple of X+Y and z. Note that X is an integer greater than or equal to 1, and Y is an integer greater than or equal to 1. Accordingly, the value of X+Y is an integer greater than or equal to 2, and z is an integer greater than or equal to 2. Although the number of bits of the adjustment bit sequence is ideally 0, there may be a case where the number is not 0. In this case, it is important to add the adjustment bit sequence as described above.

Description on this point is provided below with an example.

Example 5

Assume the set of the modulation scheme of $s_1(t)$ (first complex signal s1) and the modulation scheme of $s_2(t)$ (second complex signal s2) is (16QAM, 16QAM), the codeword length (block length (code length)) of an error correction code (e.g., a block code such as an LDPC code) is 64800 bits, and the θ(i) change period z is 9. In this case, γ=LCM(X+Y, z)=(8, 9)=72. Accordingly, the number of bits of the adjustment bit sequence necessary to obtain the above feature is 72×n bits (n being an integer greater than or equal to 0).

The portion (A) of FIG. 101 shows the first bit sequence 503A output from the encoder 502LA of the modulator in FIG. 73. In the portion (A) of FIG. 101, the reference sign 10101 indicates the codeword of the $i^{th}$ block of 64800 bits, the reference sign 10102 indicates the codeword of the $(i+1)^{th}$ block of 64800 bits, the reference sign 10103 indicates the codeword of the $(i+2)^{th}$ block of 64800 bits, and the reference sign 10104 indicates the codeword of the $(i+3)^{th}$ block of 64800 bits, and these blocks are followed by the codeword of the $(i+4)^{th}$ block, the codeword of the $(i+5)^{th}$ block, . . . .

As described above, the number of bits of the adjustment bit sequence necessary to obtain the above feature is 72×n bits (n being an integer greater than or equal to 0). In the present example, the number of bits of the adjustment bit sequence is 0 (zero). Accordingly, the post-adjustment bit sequence 7303 output from the bit length adjuster 7301 of the modulator of FIG. 73 is as shown in the portion (B) of FIG. 101. That is, as with the case of the first bit sequence 503A output from the 502LA of the modulator in FIG. 73, in the portion (B) of FIG. 101 showing the post-adjustment bit sequence 7303 output from the bit length adjuster 7301 of the modulator in FIG. 73, the codeword 10101 of the $i^{th}$ block of 64800 bits, the codeword 10102 of the $(i+1)^{th}$ block of 64800 bits, the codeword 10103 of the $(i+2)^{th}$ block of 64800 bits, and the codeword 10104 of the $(i+3)^{th}$ block of 64800 bits are arranged in this order, followed by the codeword of the $(i+4)^{th}$ block, the codeword of the $(i+5)^{th}$ block, . . . .

Example 6

Assume the set of the modulation scheme of $s_1(t)$ (first complex signal s1) and the modulation scheme of $s_2(t)$ (second complex signal s2) is (64QAM, 256QAM), the codeword length (block length (code length)) of an error correction code (e.g., a block code such as an LDPC code) is 64800 bits, and the θ(i) change period z is 9. In this case, γ=LCM(X+Y, z)=(14, 9)=126. Accordingly, the number of bits of the adjustment bit sequence necessary to obtain the above feature is 126×n+90 bits (n being an integer greater than or equal to 0).

Figure 103:
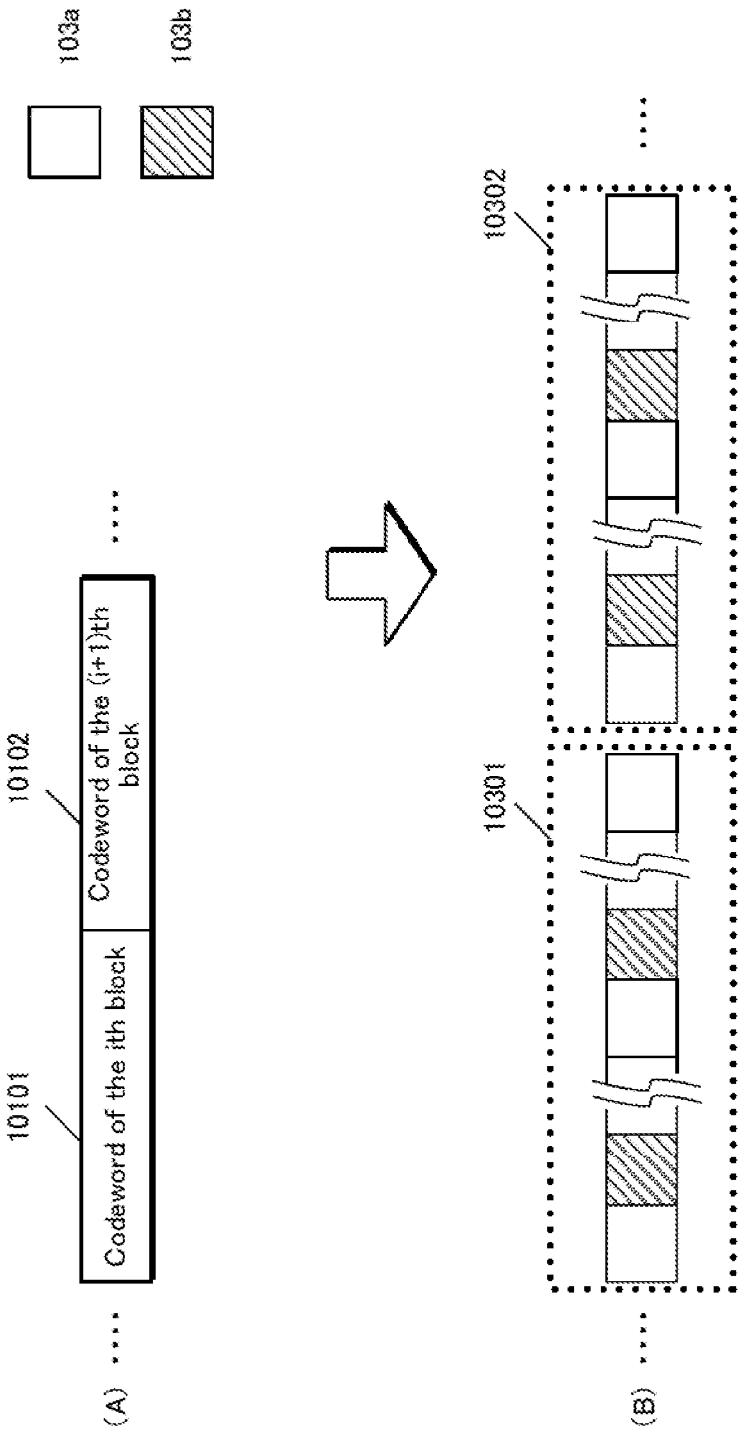
FIG. 103 shows an output first bit sequence 503A in portion (A), and shows an output second bit sequence 5703 in portion (B).

The portion (A) of FIG. 103 shows the first bit sequence 503A output from the encoder 502LA of the modulator in FIG. 73. In the portion (A) of FIG. 103, the reference sign 10101 indicates the codeword of the $i^{th}$ block of 64800 bits, and the reference sign 10102 indicates the codeword of the $(i+1)^{th}$ block of 64800 bits, and these blocks are followed by the codeword of the $(i+2)^{th}$ block, the codeword of the $(i+3)^{th}$ block, . . . .

As described above, the number of bits of the adjustment bit sequence necessary to obtain the above feature is 126×n+90 bits (n being an integer greater than or equal to 0). In the present example, the number of bits of the adjustment bit sequence is 90. Accordingly, the post-adjustment bit sequence 7303 output from the bit length adjuster 7301 of the modulator of FIG. 73 is as shown in the portion (B) of FIG. 103.

In the portion (B) of FIG. 103, the reference sign 103*a* indicates one of the bits of the codeword, the reference sign 103*b* indicates one of the bits of the adjustment bit sequence. Regarding the reference sign 10301, the sum of the number of bits of the codeword 10101 of the $i^{th}$ block and the number of bits of the adjustment bit sequence for the codeword 10101 is 64890 bits. Regarding the reference sign 10302, the sum of the number of bits of the codeword 10102 of the $(i+1)^{th}$ block and the number of bits of the adjustment bit sequence for the codeword 10102 is 64890 bits.

As such, the advantage of Embodiment 3 is obtained. The number of slots (each slot being made up of one symbol of s1 and one symbol of s2) necessary to transmit 64890 bits, which is the sum of the number of bits of the codeword 10101 of the $i^{th}$ block of 64800 bits and the number of bits of the adjustment bit sequence, is an integral multiple of the θ(i) change period z=9.

In this way, the number of appearances of each of the nine values that θ(i) may take, within the slots for 64890 bits which is the sum of the number of bits of the codeword 10101 of the $i^{th}$ block of 64800 bits and the number of bits of the adjustment bit sequence, becomes equal. This increases the probability to obtain information included in the codeword 10101 of the $i^{th}$ block with high reception quality.

Similarly, the number of slots necessary to transmit 64890 bits, which is the sum of the number of bits of the codeword 10102 of the $(i+1)^{th}$ block of 64800 bits and the number of bits of the adjustment bit sequence, is an integral multiple of the θ(i) change period z=9. In this way, the number of appearances of each of the nine values that θ(i) may take, within the slots for 64890 bits which is the sum of the number of bits of the codeword 10102 of the $(i+1)^{th}$ block of 64800 bits and the number of bits of the adjustment bit sequence, becomes equal. This increases the probability to obtain information included in the codeword 10102 of the $(i+1)^{th}$ block with high reception quality.

Note that as described in Embodiment 3, each adjustment bit sequence includes at least one repetition of the bit value of a predetermined portion of an N-bit codeword obtained by encoding processing or, alternatively, is composed of a predetermined bit sequence. Specific schemes for configuring adjustment bit sequences are as described in Embodiment 3.

Note that the scheme for inserting an adjustment bit sequence is not limited to the scheme shown in FIG. 103. The stun of a codeword of 64800 bits and an adjustment bit sequence of 90 bits, i.e., 64890 bits, may be arranged in any order.

Also, as described in Embodiment 3, the interleaving size may be N-z bits. In this case, the following feature is obtained.

"When the encoder 502LA in FIG. 73 outputs the codeword having a codeword length (block length (code length)) of N bits of the error correction code, X+Y, which is the number of bits transmittable by a pair of complex signals in any combination of modulation schemes, i.e., the first complex signal s1 and the second complex signal s2 that are transmitted at the same frequency at the same time, does not include data of a plurality of blocks (of an error correction code), regardless of the value of N. In order for X+Y bits not to include data of a plurality of blocks, the bit length adjuster 7301 adds an adjustment bit sequence to N×z bits stored in the interleaver, and the sum of the N×z bits and the number of bits of the adjustment bit sequence becomes a multiple of γ=LCM(X+Y, z)".

Modification of Embodiment 4

In Embodiment 4, the configuration of the modulator that performs processing before the mapper 9702 in FIGS. 97 and 98 is as shown in FIGS. 80 and 83. The feature of Embodiment 4 is as follows.

"Concerning the second bit sequence (post-adjustment bit sequence) 8003 obtained by removing the adjustment bit sequence temporarily inserted in the N-bit codeword of the LDPC code of the $i^{th}$ block, the number of bits of the second bit sequence (post-adjustment bit sequence) 8003 is a multiple of X+Y determined by the set of the first modulation scheme for s1(*t*) and the second modulation scheme for s2(*t*) that have been set".

Note that the value of X+Y is the same as that described in Embodiments 1 to 3 above.

In the present modification of Embodiment 4, the aforementioned θ(i) change period z is also taken into consideration to determine the number of bits of the adjustment bit sequence. Detailed description is provided below.

For simplicity, the following description is provided with a specific example.

The code length (block length) of an error correction code for use is assumed to be 64800 bits, and the θ(i) change period z is assumed to be 9. Concerning the modulation schemes, QPSK, 16QAM, 64QAM, and 256QAM are usable. Accordingly, the set of the modulation scheme of s1(*t*) (first complex signal s1) and the modulation scheme of s2(*t*) (second complex signal s2) can be any one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM). In the following description, some of these sets are taken as examples.

As with the case of the other embodiments, the modulation scheme of the first complex signal s1 (s1(*t*)) and the modulation scheme of the second complex signal s2 (s2(*t*)) are each switchable between a plurality of modulation schemes.

A feature of the present modification of Embodiment 4 is that, regarding the value of X+Y, the θ(i) change period z, and the sum of the number of bits of a code length (N) and the number of bits of an adjustment bit sequence, when γ=LCM(X+Y z), the number of bits of a bit sequence after bit length adjustment is a multiple of γ. In other words, the number of bits of a bit sequence after bit length adjustment, i.e., a post-adjustment bit sequence, is a multiple of the least common multiple of X+Y and z. Note that X is an integer greater than or equal to 1, and Y is an integer greater than or equal to 1. Accordingly, the value of X+Y is an integer greater than or equal to 2, and z is an integer greater than or equal to 2. Although the difference between the number of bits of the post-adjustment bit sequence and the number of bits of the codeword is ideally 0, there may be a case where the difference in bits is not 0. In this case, it is important to adjust the bit length as described above.

Description on this point is provided below with an example.

Example 7

Assume the set of the modulation scheme of $s_1(t)$ (first complex signal s1) and the modulation scheme of $s_2(t)$ (second complex signal s2) is (16QAM, 16QAM), the codeword length (block length (code length)) of an error correction code (e.g., a block code such as an LDPC code) is 64800 bits, and the θ(i) change period z is 9. In this case, γ=LCM(X+Y, z)=(8, 9)=72. Accordingly, the number of bits of the temporarily inserted adjustment bit sequence (known information) necessary to obtain the above feature is 72×n bits (n being an integer greater than or equal to 0).

The portion (A) of FIG. 101 shows the first bit sequence 503 (or 503A) output from the encoder 502 of the modulator in FIGS. 80 and 83. In the portion (A) of FIG. 101, the reference sign 10101 indicates the codeword of the $i^{th}$ block of 64800 bits, the reference sign 10102 indicates the codeword of the $(i+1)^{th}$ block of 64800 bits, the reference sign 10103 indicates the codeword of the $(i+_2)^{th}$ block of 64800 bits, and the reference sign 10104 indicates the codeword of the $(i+3)^{th}$ block of 64800 bits, and these blocks are followed by the codeword of the $(i+4)^{th}$ block, the codeword of the $(i+5)^{th}$ block, . . . . Note that the codewords 10101, 10102, 10103, and 10104 of the respective blocks do not include any temporarily inserted adjustment bit sequence (known information).

As described above, the number of bits of the temporarily inserted adjustment bit sequence (known information) necessary to obtain the above feature is 72×n bits (n being an integer greater than or equal to 0). In the present example, the number of bits of the temporarily inserted adjustment bit sequence (known information) is 0 (zero). Accordingly, the post-adjustment bit sequence 8003 output from the back end 8001B shown in FIGS. 80 and 83 is as shown in the portion (B) of FIG. 101. That is, as with the case of the first bit sequence 503 (or 503A) output from the 502 of the modulator in FIGS. 80 and 83, in the portion (B) of FIG. 101 showing the post-adjustment bit sequence 8003 output from the back end 8001B in FIGS. 80 and 83, the codeword 10101 of the $i^{th}$ block of 64800 bits, the codeword 10102 of the $(i+1)^{th}$ block of 64800 bits, the codeword 10103 of the $(i+2)^{th}$ block of 64800 bits, and the codeword 10104 of the $(i+3)^{th}$ block of 64800 bits are arranged in this order, followed by the codeword of the $(i+4)^{th}$ block, the codeword of the $(i+5)^{th}$ block, . . . .

Example 8

Assume the set of the modulation scheme of $s_1(t)$ (first complex signal s1) and the modulation scheme of $s_2(t)$ (second complex signal s2) is (64QAM, 256QAM), the codeword length (block length (code length)) of an error correction code (e.g., a block code such as an LDPC code) is 64800 bits, and the θ(i) change period z is 9. In this case, γ=LCM(X+Y, z)=(14, 9)=126. Accordingly, the number of bits of the temporarily inserted adjustment bit sequence (known information) necessary to obtain the above feature is 126×n+36 bits (n being an integer greater than or equal to 0).

Figure 104:
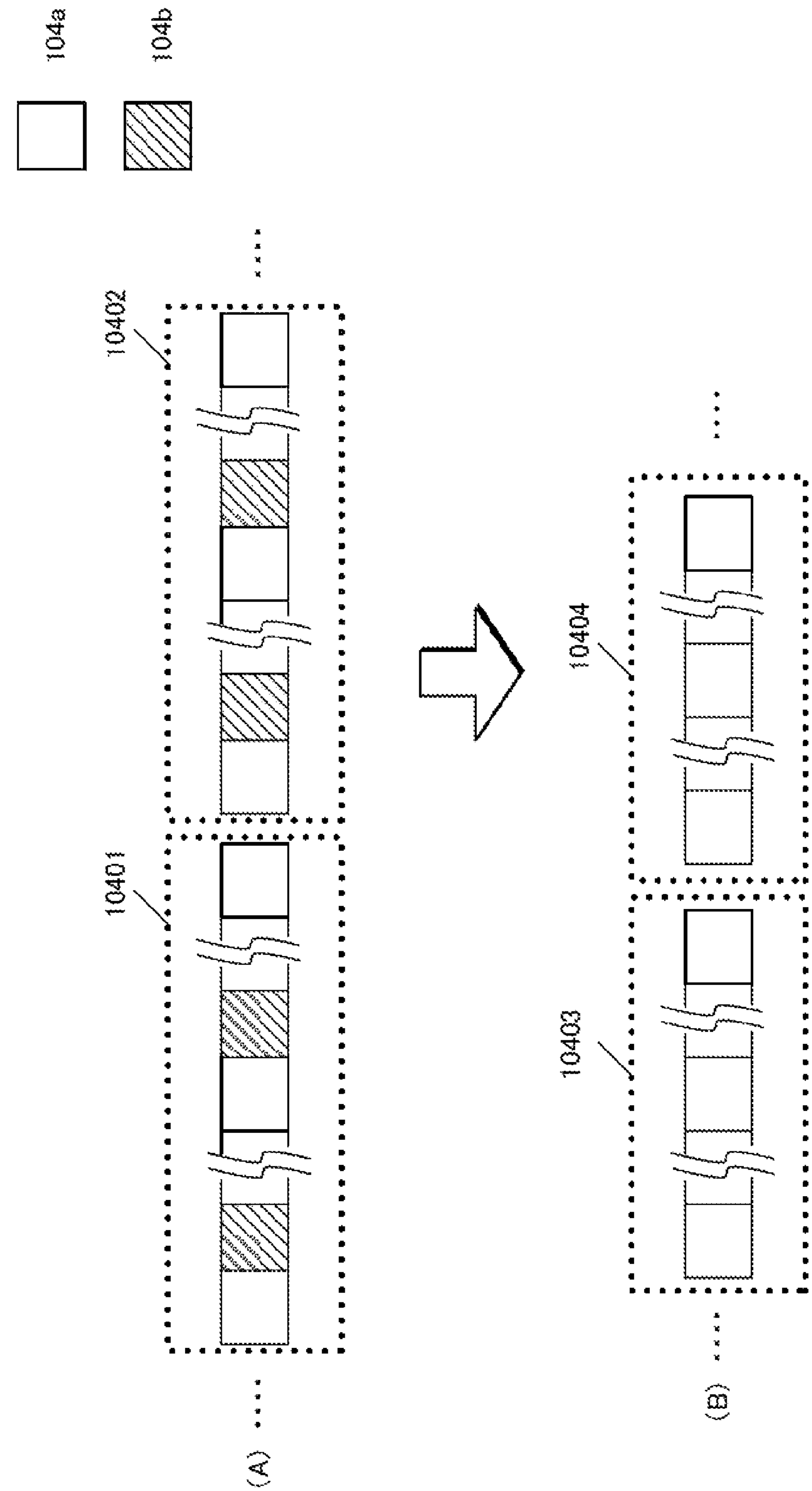
FIG. 104 shows an output first bit sequence 503 (or 503A) in portion (A), and shows an output bit sequence 8003 after bit length adjustment in portion (B).

The portion (A) of FIG. 104 shows the first bit sequence 503 (or 503A) output from the encoder 502 of the modulator in FIGS. 80 and 83. In the portion (A) of FIG. 104, the reference sign 10401 indicates the codeword of the $i^{th}$ block of 64800 bits, and the reference sign 10402 indicates the codeword of the $(i+1)^{th}$ block of 64800 bits, and these blocks are followed by the codeword of the $(i+2)^{th}$ block, the codeword of the $(i+3)^{th}$ block, . . . .

Note that in FIG. 104, the reference sign 104*b* indicates a bit of the temporarily inserted adjustment bit sequence, and the reference sign 104*a* indicates a bit not included in the temporarily inserted adjustment bit sequence.

As shown in the portion (A) of FIG. 104, the codeword 10401 of the $i^{th}$ block of 64800 bits includes the bits 104*b* of the 36-bit temporarily inserted adjustment bit sequence.

Also, the codeword 10402 of the (i+1)$^{th}$ block of 64800 bits includes the bits 104*b* of the 36-bit temporarily inserted adjustment bit sequence.

As described above, the number of bits of the temporarily inserted adjustment bit sequence (known information) necessary to obtain the above feature is 126×n+36 bits (n being an integer greater than or equal to 0). In the present example, the number of bits of the temporarily inserted adjustment bit sequence (known information) is 36. The back end 8001B in FIGS. 80 and 83 removes the temporarily inserted adjustment bit sequence (known information). Accordingly, the post-adjustment bit sequence 8003 output from the back end 8001B of the modulator shown in FIGS. 80 and 83 is as shown in the portion (B) of FIG. 104.

In the portion (B) of FIG. 104, the reference sign 10403 indicates the i$^{th}$ post-adjustment bit sequence composed of only the bits 104*a*. The number of bits of the i$^{th}$ post-adjustment bit sequence 10403 is 64800−36=64764.

Similarly, the reference sign 10404 indicates the (i+1)$^{th}$ post-adjustment bit sequence composed of only the bits 104*a*. The number of bits of the i$^{th}$ post-adjustment bit sequence 10404 is 64800−36=64764.

As such, the advantage of Embodiment 4 is obtained.

Also, the number of slots (each slot being made up of one symbol of s1 and one symbol of s2) necessary to transmit the i$^{th}$ post-adjustment bit sequence becomes an integral multiple of the θ(i) change period z=9.

In this way, the number of appearances of each of the nine values that θ(i) may take, within the slots for the i$^{th}$ post-adjustment bit sequence, becomes equal. This increases the probability to obtain information included in the i$^{th}$ post-adjustment bit sequence with high reception quality.

Also, the number of slots (each slot being made up of one symbol of s1 and one symbol of s2) necessary to transmit the (i+1)$^{th}$ post-adjustment bit sequence becomes an integral multiple of the θ(i) change period z=9.

In this way, the number of appearances of each of the nine values that θ(i) may take, within the slots for the (i+1)$^{th}$ post-adjustment bit sequence, becomes equal. This increases the probability to obtain information included in the (i+1)$^{th}$ post-adjustment bit sequence with high reception quality.

The specific scheme for configuring the temporarily inserted adjustment bit sequence (known information) is as described in Embodiment 4.

Modification of Embodiment 8

In Embodiment 8, the configuration of the modulator that performs processing before the mapper 9702 in FIGS. 97 and 98 is as shown in FIGS. 91 and 93. The feature of Embodiment 8 is as follows.

"The bit length adjuster removes data of PunNum bits from the N-bit codeword, and outputs a data sequence having a length of N−PunNum bits. Herein, the value of PunNum is determined in a manner that N−PunNum becomes a multiple of the value of X+Y".

Note that the value of X+Y is the same as that described in Embodiments 1 to 3 above.

In the present modification of Embodiment 8, the aforementioned θ(i) change period z is also taken into consideration to determine PunNum which indicates the number of bits of the data be removed. Detailed description is provided below.

For simplicity, the following description is provided with a specific example.

The code length (block length) of an error correction code for use is assumed to be 64800 bits, and the θ(i) change period z is assumed to be 9. Concerning the modulation schemes, QPSK, 16QAM, 64QAM, and 256QAM are usable. Accordingly, the set of the modulation scheme of s1(*t*) (first complex signal s1) and the modulation scheme of s2(*t*) (second complex signal s2) can be any one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM). In the following description, some of these sets are taken as examples.

As with the case of the other embodiments, the modulation scheme of the first complex signal s1 (s1(*t*)) and the modulation scheme of the second complex signal s2 (s2(*t*)) are each switchable between a plurality of modulation schemes.

A feature of the present modification of Embodiment 8 is that, regarding the value of X+Y, the θ(i) change period z, and the sum of the number of bits of a code length (N) and the number of bits of an adjustment bit sequence, when γ=LCM(X+Y, z), N−PunNum is a multiple of T. In other words, N−PunNum is a multiple of the least common multiple of X+Y and z. Note that X is an integer greater than or equal to 1, and Y is an integer greater than or equal to 1. Accordingly, the value of X+Y is an integer greater than or equal to 2, and z is an integer greater than or equal to 2. Although PunNum is ideally 0, there may be a case where PunNum is not 0. In this case, it is important to adjust N−PunNum as described above.

Description on this point is provided below with an example.

Example 9

Assume the set of the modulation scheme of $s_1$(t) (first complex signal s1) and the modulation scheme of $s_2$(t) (second complex signal s2) is (16QAM, 16QAM), the codeword length (block length (code length)) of an error correction code (e.g., a block code such as an LDPC code) is 64800 bits, and the θ(i) change period z is 9. In this case, γ=LCM(X+Y, z)=(8, 9)=72. Accordingly, PunNum necessary to obtain the above feature is 72×n bits (n being an integer greater than or equal to 0).

The portion (A) of FIG. 101 shows the N-bit codeword 503 output from the encoder 502 of the modulator in FIGS. 91 and 93. In the portion (A) of FIG. 101, the reference sign 10101 indicates the codeword of the i$^{th}$ block of 64800 bits, the reference sign 10102 indicates the codeword of the (i+1)$^{th}$ block of 64800 bits, the reference sign 10103 indicates the codeword of the (i+2)$^{th}$ block of 64800 bits, and the reference sign 10104 indicates the codeword of the (i+3)$^{th}$ block of 64800 bits, and these blocks are followed by the codeword of the (i+4)$^{th}$ block, the codeword of the (i+5)$^{th}$ block, . . . .

As described above, PunNum necessary to obtain the above feature is 72×n bits (n being an integer greater than or equal to 0). In the present example, PunNum is 0 (zero) bits. Accordingly, the data sequence 9102 of N−PunNum bits output from the bit length adjuster 9101 shown in FIGS. 91 and 93 is as shown in the portion (B) of FIG. 101. That is, as with the case of the first bit sequence 503 output from the 502 of the modulator in FIGS. 91 and 93, in the portion (B) of FIG. 101 showing the data sequence 9102 of N−PunNum bits output from the bit length adjuster 9101, the codeword 10101 of the i$^{th}$ block of 64800 bits, the codeword 10102 of the (i+1)$^{th}$ block of 64800 bits, the codeword 10103 of the (i+2)$^{th}$ block of 64800 bits, and the codeword 10104 of the $(i+3)^{th}$ block of 64800 bits are arranged in this order, followed by the codeword of the $(i+4)^{th}$ block, the codeword of the $(i+5)^{th}$ block, . . . .

Example 10

Assume the set of the modulation scheme of $s_1(t)$ (first complex signal s1) and the modulation scheme of $s_2(t)$ (second complex signal s2) is (64QAM, 256QAM), the codeword length (block length (code length)) of an error correction code (e.g., a block code such as an LDPC code) is 64800 bits, and the θ(i) change period z is 9. In this case, γ=LCM(X+Y, z)=(14, 9)=126. Accordingly, PunNum necessary to obtain the above feature is 126×n+36 bits (n being an integer greater than or equal to 0).

Figure 105:
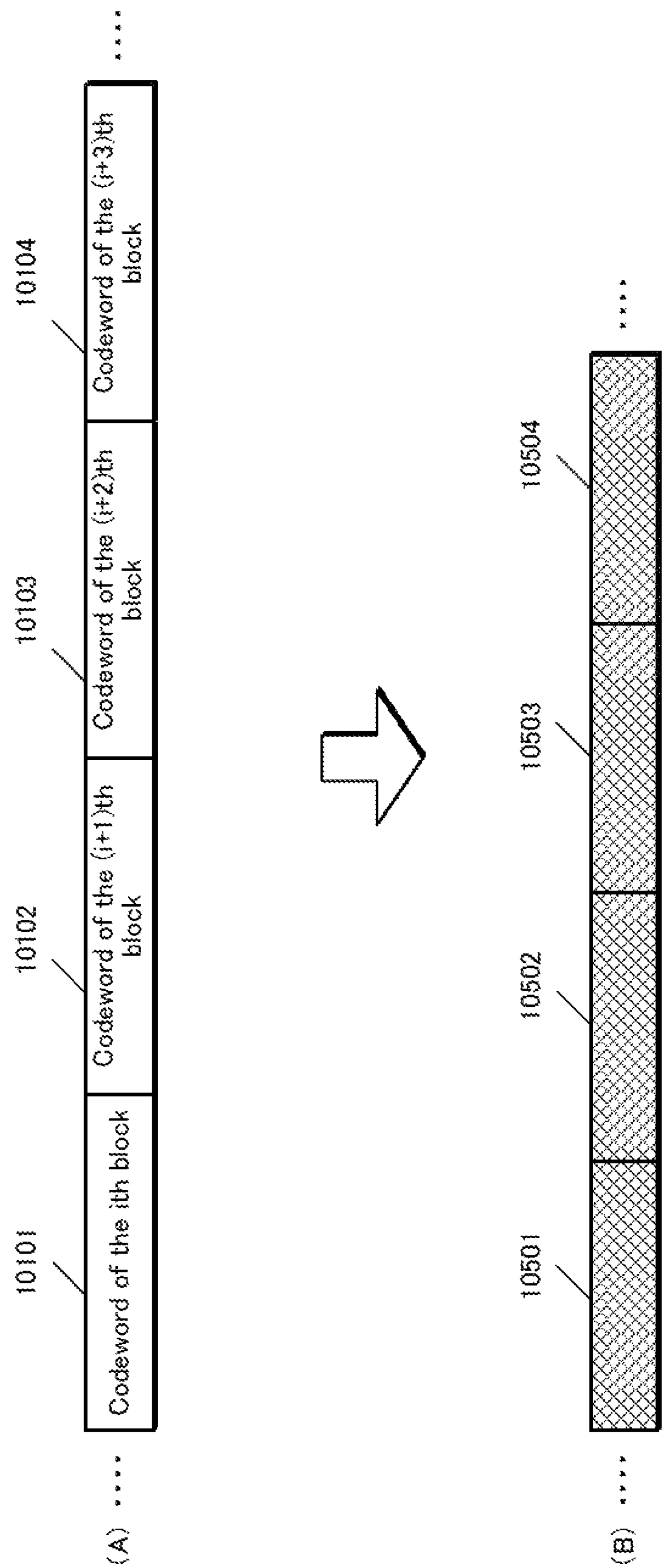
FIG. 105 shows an output N-bit codeword 503 in portion (A), and shows a data sequence 9102 of N−PunNum bits in portion (B).

The portion (A) of FIG. 105 shows the N-bit codeword 503 output from the encoder 502 of the modulator in FIGS. 91 and 93. In the portion (A) of FIG. 105, the reference sign 10101 indicates the codeword of the $i^{th}$ block of 64800 bits, the reference sign 10102 indicates the codeword of the $(i+1)^{th}$ block of 64800 bits, the reference sign 10103 indicates the codeword of the $(i+2)^{th}$ block of 64800 bits, and the reference sign 10104 indicates the codeword of the $(i+3)^{th}$ block of 64800 bits, and these blocks are followed by the codeword of the $(i+4)^{th}$ block, the codeword of the $(i+5)^{th}$ block, . . . .

As described above, PunNum necessary to obtain the above feature is 126×n+36 bits (n being an integer greater than or equal to 0). In the present example, PunNum is 36 bits. Accordingly, the data sequence 9102 of N−PunNum bits output from the bit length adjuster 9101 shown in FIGS. 91 and 93 is as shown in the portion (B) of FIG. 105.

In the portion (B) of FIG. 105, the reference sign 10501 indicates the $i^{th}$ post-adjustment bit sequence, i.e., the $i^{th}$ data sequence of N−PunNum bits. Accordingly, the $i^{th}$ post-adjustment bit sequence is the $i^{th}$ block composed of 64800−36=64764 bits.

Similarly, the reference sign 10502 indicates the $(i+1)^{th}$ post-adjustment bit sequence, i.e., the $(i+1)^{th}$ data sequence of N−PunNum bits. Accordingly, the $(i+1)^{th}$ post-adjustment bit sequence is the $(i+1)^{th}$ block composed of 64800−36=64764 bits. Similarly, the reference sign 10503 indicates the $(i+2)^{th}$ post-adjustment bit sequence, i.e., the $(i+2)^{th}$ data sequence of N−PunNum bits. Accordingly, the $(i+2)^{th}$ post-adjustment bit sequence is the $(i+2)^{th}$ block composed of 64800−36=64764 bits.

The reference sign 10504 indicates the $(i+3)^{th}$ post-adjustment bit sequence, i.e., the $(i+3)^{th}$ data sequence of N−PunNum bits. Accordingly, the $(i+3)^{th}$ post-adjustment bit sequence is the $(i+3)^{th}$ block composed of 64800−36=64764 bits.

As such, the advantage of Embodiment 8 is obtained.

Also, the number of slots (each slot being made up of one symbol of s1 and one symbol of s2) necessary to transmit the $i^{th}$ block after bit length adjustment becomes an integral multiple of the θ(i) change period z=9.

In this way, the number of appearances of each of the nine values that θ(i) may take, within the slots for the $i^{th}$ block after bit length adjustment, becomes equal. This increases the probability to obtain information included in the $i^{th}$ block after bit length adjustment with high reception quality.

Also, the number of slots (each slot being made up of one symbol of s1 and one symbol of s2) necessary to transmit the $(i+1)^{th}$ block after bit length adjustment becomes an integral multiple of the θ(i) change period z=9.

In this way, the number of appearances of each of the nine values that 6(i) may take, within the slots for the $(i+1)^{th}$ block after bit length adjustment, becomes equal. This increases the probability to obtain information included in the $(i+1)^{th}$ block after bit length adjustment with high reception quality.

The number of slots (each slot being made up of one symbol of s1 and one symbol of s2) necessary to transmit the $(i+2)^{th}$ block after bit length adjustment becomes an integral multiple of the θ(i) change period z=9.

In this way, the number of appearances of each of the nine values that θ(i) may take, within the slots for the $(i+2)^{th}$ block after bit length adjustment, becomes equal. This increases the probability to obtain information included in the $(i+2)^{th}$ block after bit length adjustment with high reception quality.

The number of slots (each slot being made up of one symbol of s1 and one symbol of s2) necessary to transmit the $(i+3)^{th}$ block after bit length adjustment becomes an integral multiple of the θ(i) change period z=9.

In this way, the number of appearances of each of the nine values that θ(i) may take, within the slots for the $(i+3)^{th}$ block after bit length adjustment, becomes equal. This increases the probability to obtain information included in the $(i+3)^{th}$ block after bit length adjustment with high reception quality.

The above description also applies to the blocks after bit length adjustment, which are blocks subsequent to the $(i+3)^{th}$ block after bit length adjustment.

The implementation as described in the above examples allows the reception device to achieve high data reception quality. The configuration of the reception device is described in each of Embodiments 5 to 8. (Note that the bit length adjustment scheme is as described in the present embodiment.)

Also, when the encoder outputs the codeword having a codeword length (block length (code length)) of N bits of the error correction code, and the blocks after bit length adjustment in a pair of complex signals in any combination of modulation schemes (for s1 and s2) satisfy any of the conditions described in the above examples regardless of the value of N, then the memory size of the transmission device and/or the reception device is more likely to be reduced.

Embodiment 11

Embodiments 1 to 10 each have described a scheme for performing a control such that "when the encoder outputs the codeword having a codeword length (block length (code length)) of N bits of the error correction code, each of the blocks after bit length adjustment becomes a multiple of the value of X+Y". The present embodiment further describes the feature that "when the encoder outputs the codeword having a codeword length (block length (code length)) of N bits of the error correction code, each of the blocks after bit length adjustment becomes a multiple of the value of X+Y".

Note that the value of X+Y is the same as that described in Embodiments 1 to 3 above.

In the present embodiment, the code length (block length) of an error correction code for use is assumed to be either 16200 bits or 64800 bits, and the set of the modulation scheme of $s_1(t)$ (first complex signal s1) and the modulation scheme of $s_2(t)$ (second complex signal s2) is assumed to be one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM). (In the following description, n is assumed to be an integer greater than or equal to 0.) In this case, the following can be said.

(1)

The set of the modulation scheme of $s_1(t)$ (first complex signal s1) and the modulation scheme of $s_2(t)$ (second complex signal s2) is assumed to be (QPSK, QPSK), and the code length (block length) of an error correction code for use is assumed to be 16200 bits. (The value of X+Y is 4.)

(1-1) When any of the schemes described in Embodiments 1 to 3 is used, the number of bits of an adjustment bit sequence (to be added) is 4×n.

(1-2) When the scheme described in Embodiment 4 is used, the number of bits of a temporarily inserted adjustment bit sequence (known information) is 4×n. (Note that 4×n<16200.)

(1-3) When the scheme described in Embodiment 8 is used, PunNum (the number of bits to be removed) is 4×n. (Note that 4×n<16200.)

(2)

The set of the modulation scheme of $s_1(t)$ (first complex signal s1) and the modulation scheme of $s_2(t)$ (second complex signal s2) is assumed to be (QPSK, 16QAM), and the code length (block length) of an error correction code for use is assumed to be 16200 bits. (The value of X+Y is 6.)

(2-1) When any of the schemes described in Embodiments 1 to 3 is used, the number of bits of an adjustment bit sequence (to be added) is 6×n.

(2-2) When the scheme described in Embodiment 4 is used, the number of bits of a temporarily inserted adjustment bit sequence (known information) is 6×n. (Note that 6×n<16200.)

(2-3) When the scheme described in Embodiment 8 is used, PunNum (the number of bits to be removed) is 6×n. (Note that 6×n<16200.)

(3)

The set of the modulation scheme of $s_1(t)$ (first complex signal s1) and the modulation scheme of $s_2(t)$ (second complex signal s2) is assumed to be (QPSK, 64QAM), and the code length (block length) of an error correction code for use is assumed to be 16200 bits. (The value of X+Y is 8.)

(3-1) When any of the schemes described in Embodiments 1 to 3 is used, the number of bits of an adjustment bit sequence (to be added) is 8×n.

(3-2) When the scheme described in Embodiment 4 is used, the number of bits of a temporarily inserted adjustment bit sequence (known information) is 8×n. (Note that 8×n<16200.)

(3-3) When the scheme described in Embodiment 8 is used, PunNum (the number of bits to be removed) is 8×n. (Note that 8×n<16200.)

(4)

The set of the modulation scheme of $s_1(t)$ (first complex signal s1) and the modulation scheme of $s_2(t)$ (second complex signal s2) is assumed to be (QPSK, 256QAM), and the code length (block length) of an error correction code for use is assumed to be 16200 bits. (The value of X+Y is 10.)

(4-1) When any of the schemes described in Embodiments 1 to 3 is used, the number of bits of an adjustment bit sequence (to be added) is 10×n.

(4-2) When the scheme described in Embodiment 4 is used, the number of bits of a temporarily inserted adjustment bit sequence (known information) is 10×n. (Note that 10×n<16200.)

(4-3) When the scheme described in Embodiment 8 is used, PunNum (the number of bits to be removed) is 10×n. (Note that 10×n<16200.)

(5)

The set of the modulation scheme of $s_1(t)$ (first complex signal s1) and the modulation scheme of $s_2(t)$ (second complex signal s2) is assumed to be (16QAM, 16QAM), and the code length (block length) of an error correction code for use is assumed to be 16200 bits. (The value of X+Y is 8.)

(5-1) When any of the schemes described in Embodiments 1 to 3 is used, the number of bits of an adjustment bit sequence (to be added) is 8×n.

(5-2) When the scheme described in Embodiment 4 is used, the number of bits of a temporarily inserted adjustment bit sequence (known information) is 8×n. (Note that 8×n<16200.)

(5-3) When the scheme described in Embodiment 8 is used, PunNum (the number of bits to be removed) is 8×n. (Note that 8×n<16200.)

(6)

The set of the modulation scheme of $s_1(t)$ (first complex signal s1) and the modulation scheme of $s_2(t)$ (second complex signal s2) is assumed to be (16QAM, 64QAM), and the code length (block length) of an error correction code for use is assumed to be 16200 bits. (The value of X+Y is 10.)

(6-1) When any of the schemes described in Embodiments 1 to 3 is used, the number of bits of an adjustment bit sequence (to be added) is 10×n.

(6-2) When the scheme described in Embodiment 4 is used, the number of bits of a temporarily inserted adjustment bit sequence (known information) is 10×n. (Note that 10×n<16200.)

(6-3) When the scheme described in Embodiment 8 is used, PunNum (the number of bits to be removed) is 10×n. (Note that 10×n<16200.)

(7)

The set of the modulation scheme of $s_1(t)$ (first complex signal s1) and the modulation scheme of $s_2(t)$ (second complex signal s2) is assumed to be (16QAM, 256QAM), and the code length (block length) of an error correction code for use is assumed to be 16200 bits. (The value of X+Y is 12.)

(7-1) When any of the schemes described in Embodiments 1 to 3 is used, the number of bits of an adjustment bit sequence (to be added) is 12×n.

(7-2) When the scheme described in Embodiment 4 is used, the number of bits of a temporarily inserted adjustment bit sequence (known information) is 12×n. (Note that 12×n<16200.)

(7-3) When the scheme described in Embodiment 8 is used, PunNum (the number of bits to be removed) is 12×n. (Note that 12×n<16200.)

(8)

The set of the modulation scheme of $s_1(t)$ (first complex signal s1) and the modulation scheme of $s_2(t)$ (second complex signal s2) is assumed to be (64QAM, 256QAM), and the code length (block length) of an error correction code for use is assumed to be 16200 bits. (The value of X+Y is 14.)

(8-1) When any of the schemes described in Embodiments 1 to 3 is used, the number of bits of an adjustment bit sequence (to be added) is 14×n+12.

(8-2) When the scheme described in Embodiment 4 is used, the number of bits of a temporarily inserted adjustment bit sequence (known information) is 14×n+2. (Note that 14×n+2<16200.)

(8-3) When the scheme described in Embodiment 8 is used, PunNum (the number of bits to be removed) is 14×n+2. (Note that 14×n+2<16200.)

(9)

The set of the modulation scheme of $s_1(t)$ (first complex signal s1) and the modulation scheme of $s_2(t)$ (second complex signal s2) is assumed to be (256QAM, 256QAM), and the code length (block length) of an error correction code for use is assumed to be 16200 bits. (The value of X+Y is 16.)

(9-1) When any of the schemes described in Embodiments 1 to 3 is used, the number of bits of an adjustment bit sequence (to be added) is 16×n+8.

(9-2) When the scheme described in Embodiment 4 is used, the number of bits of a temporarily inserted adjustment bit sequence (known information) is 16 n+8. (Note that 16×n+8<16200.)

(9-3) When the scheme described in Embodiment 8 is used, PunNum (the number of bits to be removed) is 16×n+8. (Note that 16×n+8<16200.)

(10)

The set of the modulation scheme of $s_1(t)$ (first complex signal s1) and the modulation scheme of $s_2(t)$ (second complex signal s2) is assumed to be (QPSK, QPSK), and the code length (block length) of an error correction code for use is assumed to be 64800 bits. (The value of X+Y is 4.)

(10-1) When any of the schemes described in Embodiments 1 to 3 is used, the number of bits of an adjustment bit sequence (to be added) is 4×n.

(10-2) When the scheme described in Embodiment 4 is used, the number of bits of a temporarily inserted adjustment bit sequence (known information) is 4×n. (Note that 4×n<64800.)

(10-3) When the scheme described in Embodiment 8 is used, PunNum (the number of bits to be removed) is 4×n. (Note that 4×n<64800.)

(11)

The set of the modulation scheme of $s_1(t)$ (first complex signal s1) and the modulation scheme of $s_2(t)$ (second complex signal s2) is assumed to be (QPSK, 16QAM), and the code length (block length) of an error correction code for use is assumed to be 64800 bits. (The value of X+Y is 6.)

(11-1) When any of the schemes described in Embodiments 1 to 3 is used, the number of bits of an adjustment bit sequence (to be added) is 6×n.

(11-2) When the scheme described in Embodiment 4 is used, the number of bits of a temporarily inserted adjustment bit sequence (known information) is 6×n. (Note that 6×n<64800.)

(11-3) When the scheme described in Embodiment 8 is used. PunNum (the number of bits to be removed) is 6×n. (Note that 6×n<64800.)

(12)

The set of the modulation scheme of $s_1(t)$ (first complex signal s1) and the modulation scheme of $s_2(t)$ (second complex signal s2) is assumed to be (QPSK, 64QAM), and the code length (block length) of an error correction code for use is assumed to be 64800 bits. (The value of X+Y is 8.)

(12-1) When any of the schemes described in Embodiments 1 to 3 is used, the number of bits of an adjustment bit sequence (to be added) is 8×n.

(12-2) When the scheme described in Embodiment 4 is used, the number of bits of a temporarily inserted adjustment bit sequence (known information) is 8×n. (Note that 8×n<64800.)

(12-3) When the scheme described in Embodiment 8 is used, PunNum (the number of bits to be removed) is 8 n. (Note that 8×n<64800.)

(13)

The set of the modulation scheme of $s_1(t)$ (first complex signal s1) and the modulation scheme of $s_2(t)$ (second complex signal s2) is assumed to be (QPSK, 256QAM), and the code length (block length) of an error correction code for use is assumed to be 64800 bits. (The value of X+Y is 10.)

(13-1) When any of the schemes described in Embodiments 1 to 3 is used, the number of bits of an adjustment bit sequence (to be added) is 10×n.

(13-2) When the scheme described in Embodiment 4 is used, the number of bits of a temporarily inserted adjustment bit sequence (known information) is 10×n. (Note that 10×n<64800.)

(13-3) When the scheme described in Embodiment 8 is used, PunNum (the number of bits to be removed) is 10×n. (Note that 10×n<64800.)

(14)

The set of the modulation scheme of $s_1(t)$ (first complex signal s1) and the modulation scheme of $s_2(t)$ (second complex signal s2) is assumed to be (16QAM, 16QAM), and the code length (block length) of an error correction code for use is assumed to be 64800 bits. (The value of X+Y is 8.)

(14-1) When any of the schemes described in Embodiments 1 to 3 is used, the number of bits of an adjustment bit sequence (to be added) is 8×n.

(14-2) When the scheme described in Embodiment 4 is used, the number of bits of a temporarily inserted adjustment bit sequence (known information) is 8×n. (Note that 8×n<64800.)

(14-3) When the scheme described in Embodiment 8 is used, PunNum (the number of bits to be removed) is 8×n. (Note that 8×n<64800.)

(15)

The set of the modulation scheme of $s_1(t)$ (first complex signal s1) and the modulation scheme of $s_2(t)$ (second complex signal s2) is assumed to be (16QAM, 64QAM), and the code length (block length) of an error correction code for use is assumed to be 64800 bits. (The value of X+Y is 10.)

(15-1) When any of the schemes described in Embodiments 1 to 3 is used, the number of bits of an adjustment bit sequence (to be added) is 10×n.

(15-2) When the scheme described in Embodiment 4 is used, the number of bits of a temporarily inserted adjustment bit sequence (known information) is 10×n. (Note that 10×n<64800.)

(15-3) When the scheme described in Embodiment 8 is used, PunNum (the number of bits to be removed) is 10×n. (Note that 10×n<64800.)

(16)

The set of the modulation scheme of $s_1(t)$ (first complex signal s1) and the modulation scheme of $s_2(t)$ (second complex signal s2) is assumed to be (16QAM, 256QAM), and the code length (block length) of an error correction code for use is assumed to be 64800 bits. (The value of X+Y is 12.)

(16-1) When any of the schemes described in Embodiments 1 to 3 is used, the number of bits of an adjustment bit sequence (to be added) is 12×n.

(16-2) When the scheme described in Embodiment 4 is used, the number of bits of a temporarily inserted adjustment bit sequence (known information) is 12×n. (Note that 12×n<64800.)

(16-3) When the scheme described in Embodiment 8 is used, PunNum (the number of bits to be removed) is 12×n. (Note that 12×n<64800.)

(17)

The set of the modulation scheme of $s_1(t)$ (first complex signal s1) and the modulation scheme of $s_2(t)$ (second complex signal s2) is assumed to be (64QAM, 256QAM), and the code length (block length) of an error correction code for use is assumed to be 64800 bits. (The value of X+Y is 14.)

(17-1) When any of the schemes described in Embodiments 1 to 3 is used, the number of bits of an adjustment bit sequence (to be added) is 14×n+6.

(17-2) When the scheme described in Embodiment 4 is used, the number of bits of a temporarily inserted adjustment bit sequence (known information) is 14×n+8. (Note that 14×n+8<64800.)

(17-3) When the scheme described in Embodiment 8 is used, PunNum (the number of bits to be removed) is 14×n+8. (Note that 14×n+8<64800.)

(18)

The set of the modulation scheme of $s_1(t)$ (first complex signal s1) and the modulation scheme of $s_2(t)$ (second complex signal s2) is assumed to be (256QAM, 256QAM), and the code length (block length) of an error correction code for use is assumed to be 64800 bits. (The value of X+Y is 16.)

(18-1) When any of the schemes described in Embodiments 1 to 3 is used, the number of bits of an adjustment bit sequence (to be added) is 16×n.

(18-2) When the scheme described in Embodiment 4 is used, the number of bits of a temporarily inserted adjustment bit sequence (known information) is 16×n. (Note that 16×n<64800.)

(18-3) When the scheme described in Embodiment 8 is used, PunNum (the number of bits to be removed) is 16×n. (Note that 16×n<64800.)

For example, assume that a communication system can use the set of the modulation scheme of $s_1(t)$ (first complex signal s1) and the modulation scheme of $s_2(t)$ (second complex signal s2) to any one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM), and can also use the code length (block length) of an error correction code to either 16200 bits or 64800 bits.

In this case, it is important to satisfy any of the conditions described in the items (1) to (18) above. A characteristic point is that even when the set of the modulation scheme of s1(*t*) (first complex signal s1) and the modulation scheme of s2(*t*) (second complex signal s2) is fixed to a certain set of modulation schemes, the number of bits to be added or the number of bits to be removed differs depending on the code length (block length) of an error correction code.

The following describes case 1 and case 2 as specific examples of such a case.

Case 1:

The set of the modulation scheme of $s_1(t)$ (first complex signal s1) and the modulation scheme of $s_2(t)$ (second complex signal s2) is assumed to be (64QAM, 256QAM). The transmission device is assumed to be able to set the code length (block length) of an error correction code to either 16200 bits or 64800 bits.

Suppose that the transmission device selects 16200 bits as the code length (block length) of an error correction code. In this case, for example, when the condition of (8-1) is applied, the number of bits of an adjustment bit sequence (to be added) is set to 12; when the condition of (8-2) is applied, the number of bits of a temporarily inserted adjustment bit sequence (known information) is set to 2; and when the condition of (8-3) is applied, PunNum (the number of bits to be removed) is set to 2.

Alternatively, suppose that the transmission device selects 64800 bits as the code length (block length) of an error correction code. In this case, for example, when the condition of (17-1) is applied, the number of bits of an adjustment bit sequence (to be added) is set to 6; when the condition of (17-2) is applied, the number of bits of a temporarily inserted adjustment bit sequence (known information) is set to 8; and when the condition of (17-3) is applied, PunNum (the number of bits to be removed) is set to 8.

Case 2:

The set of the modulation scheme of $s_1(t)$ (first complex signal s1) and the modulation scheme of $s_2(t)$ (second complex signal s2) is assumed to be (256QAM, 256QAM). The transmission device is assumed to be able to set the code length (block length) of an error correction code to either 16200 bits or 64800 bits.

Suppose that the transmission device selects 16200 bits as the code length (block length) of an error correction code. In this case, for example, when the condition of (9-1) is applied, the number of bits of an adjustment bit sequence (to be added) is set to 8; when the condition of (9-2) is applied, the number of bits of a temporarily inserted adjustment bit sequence (known information) is set to 8; and when the condition of (9-3) is applied, PunNum (the number of bits to be removed) is set to 8.

Alternatively, suppose that the transmission device selects 64800 bits as the code length (block length) of an error correction code. In this case, for example, when the condition of (18-1) is applied, the number of bits of an adjustment bit sequence (to be added) is set to 0; when the condition of (18-2) is applied, the number of bits of a temporarily inserted adjustment bit sequence (known information) is set to 0; and when the condition of (18-3) is applied, PunNum (the number of bits to be removed) is set to 0.

The following considers a case where the code length (block length) of an error correction code for use is assumed to be either 16200 bits or 64800 bits, and the set of the modulation scheme of $s_1(t)$ (first complex signal s1) and the modulation scheme of $s_2(t)$ (second complex signal s2) is assumed to be one of (QPSK, QPSK), (QPSK, 16QAM), (QPSK, 64QAM), (QPSK, 256QAM), (16QAM, 16QAM), (16QAM, 64QAM), (16QAM, 256QAM), (64QAM, 256QAM), and (256QAM, 256QAM), and the scheme of Embodiment 10 is applied. Note that the θ(i) change period z described in Embodiment 10 is assumed to be 9. (In the following description, n is assumed to be an integer greater than or equal to 0.) In this case, the following can be said.

(19)

The set of the modulation scheme of $s_1(t)$ (first complex signal s1) and the modulation scheme of $s_2(t)$ (second complex signal s2) is assumed to be (QPSK, QPSK), and the code length (block length) of an error correction code for use is assumed to be 16200 bits. (The value of X+Y is 4.)

(19-1) When any of the schemes in the modification of Embodiment 1 to the modification of Embodiment 3, which are described in Embodiment 10, is used, the number of bits of an adjustment bit sequence (to be added) is 36×n.

(19-2) When the scheme in the modification of Embodiment 4 described in Embodiment 10 is used, the number of bits of a temporarily inserted adjustment bit sequence (known information) is 36×n. (Note that 36×n<16200.)

(19-3) When the scheme in the modification of Embodiment 8 described in Embodiment 10 is used, PunNum (the number of bits to be removed) is 36×n. (Note that 36×n<16200.)

(20)

The set of the modulation scheme of $s_1(t)$ (first complex signal s1) and the modulation scheme of $s_2(t)$ (second complex signal s2) is assumed to be (QPSK, 16QAM), and the code length (block length) of an error correction code for use is assumed to be 16200 bits. (The value of X+Y is 6.)

(20-1) When any of the schemes in the modification of Embodiment 1 to the modification of Embodiment 3, which are described in Embodiment 10, is used, the number of bits of an adjustment bit sequence (to be added) is 18×n.

(20-2) When the scheme in the modification of Embodiment 4 described in Embodiment 10 is used, the number of bits of a temporarily inserted adjustment bit sequence (known information) is 18×n. (Note that 18×n<16200.)

(20-3) When the scheme in the modification of Embodiment 8 described in Embodiment 10 is used, PunNum (the number of bits to be removed) is 18×n. (Note that 18×n<16200.)

(21)

The set of the modulation scheme of $s_1(t)$ (first complex signal s1) and the modulation scheme of $s_2(t)$ (second complex signal s2) is assumed to be (QPSK, 64QAM), and the code length (block length) of an error correction code for use is assumed to be 16200 bits. (The value of X+Y is 8.)

(21-1) When any of the schemes in the modification of Embodiment 1 to the modification of Embodiment 3, which are described in Embodiment 10, is used, the number of bits of an adjustment bit sequence (to be added) is 72×n.

(21-2) When the scheme in the modification of Embodiment 4 described in Embodiment 10 is used, the number of bits of a temporarily inserted adjustment bit sequence (known information) is 72×n. (Note that 72×n<16200.)

(21-3) When the scheme in the modification of Embodiment 8 described in Embodiment 10 is used, PunNum (the number of bits to be removed) is 72×n. (Note that 72×n<16200.)

(22)

The set of the modulation scheme of $s_1(t)$ (first complex signal s1) and the modulation scheme of $s_2(t)$ (second complex signal s2) is assumed to be (QPSK, 256QAM), and the code length (block length) of an error correction code for use is assumed to be 16200 bits. (The value of X+Y is 10.)

(22-1) When any of the schemes in the modification of Embodiment 1 to the modification of Embodiment 3, which are described in Embodiment 10, is used, the number of bits of an adjustment bit sequence (to be added) is 90×n.

(22-2) When the scheme in the modification of Embodiment 4 described in Embodiment 10 is used, the number of bits of a temporarily inserted adjustment bit sequence (known information) is 90×n. (Note that 90×n<16200.)

(22-3) When the scheme in the modification of Embodiment 8 described in Embodiment 10 is used. PunNum (the number of bits to be removed) is 90×n. (Note that 90×n<16200.)

(23)

The set of the modulation scheme of $s_1(t)$ (first complex signal s1) and the modulation scheme of $s_2(t)$ (second complex signal s2) is assumed to be (16QAM, 16QAM), and the code length (block length) of an error correction code for use is assumed to be 16200 bits. (The value of X+Y is 8.)

(23-1) When any of the schemes in the modification of Embodiment 1 to the modification of Embodiment 3, which are described in Embodiment 10, is used, the number of bits of an adjustment bit sequence (to be added) is 72×n.

(23-2) When the scheme in the modification of Embodiment 4 described in Embodiment 10 is used, the number of bits of a temporarily inserted adjustment bit sequence (known information) is 72×n. (Note that 72×n<16200.)

(23-3) When the scheme in the modification of Embodiment 8 described in Embodiment 10 is used, PunNum (the number of bits to be removed) is 72×n. (Note that 72×n<16200.)

(24)

The set of the modulation scheme of $s_1(t)$ (first complex signal s1) and the modulation scheme of $s_2(t)$ (second complex signal s2) is assumed to be (16QAM, 64QAM), and the code length (block length) of an error correction code for use is assumed to be 16200 bits. (The value of X+Y is 10.)

(24-1) When any of the schemes in the modification of Embodiment 1 to the modification of Embodiment 3, which are described in Embodiment 10, is used, the number of bits of an adjustment bit sequence (to be added) is 90×n.

(24-2) When the scheme in the modification of Embodiment 4 described in Embodiment 10 is used, the number of bits of a temporarily inserted adjustment bit sequence (known information) is 90×n. (Note that 90×n<16200.)

(24-3) When the scheme in the modification of Embodiment 8 described in Embodiment 10 is used. PunNum (the number of bits to be removed) is 90×n. (Note that 90×n<16200.)

(25)

The set of the modulation scheme of $s_1(t)$ (first complex signal s1) and the modulation scheme of $s_2(t)$ (second complex signal s2) is assumed to be (16QAM, 256QAM), and the code length (block length) of an error correction code for use is assumed to be 16200 bits. (The value of X+Y is 12.)

(25-1) When any of the schemes in the modification of Embodiment 1 to the modification of Embodiment 3, which are described in Embodiment 10, is used, the number of bits of an adjustment bit sequence (to be added) is 36×n.

(25-2) When the scheme in the modification of Embodiment 4 described in Embodiment 10 is used, the number of bits of a temporarily inserted adjustment bit sequence (known information) is 36×n. (Note that 36×n<16200.)

(25-3) When the scheme in the modification of Embodiment 8 described in Embodiment 10 is used, PunNum (the number of bits to be removed) is 36×n. (Note that 36×n<16200.)

(26)

The set of the modulation scheme of $s_1(t)$ (first complex signal s1) and the modulation scheme of $s_2(t)$ (second complex signal s2) is assumed to be (64QAM, 256QAM), and the code length (block length) of an error correction code for use is assumed to be 16200 bits. (The value of X+Y is 14.)

(26-1) When any of the schemes in the modification of Embodiment 1 to the modification of Embodiment 3, which are described in Embodiment 10, is used, the number of bits of an adjustment bit sequence (to be added) is 126 n+54.

(26-2) When the scheme in the modification of Embodiment 4 described in Embodiment 10 is used, the number of bits of a temporarily inserted adjustment bit sequence (known information) is 126×n+72. (Note that 126×n+72<16200.)

(26-3) When the scheme in the modification of Embodiment 8 described in Embodiment 10 is used, PunNum (the number of bits to be removed) is 126×n+72. (Note that 126×n+72<16200.)

(27)

The set of the modulation scheme of $s_1(t)$ (first complex signal s1) and the modulation scheme of $s_2(t)$ (second complex signal s2) is assumed to be (256QAM, 256QAM), and the code length (block length) of an error correction code for use is assumed to be 16200 bits. (The value of X+Y is 16.)

(27-1) When any of the schemes in the modification of Embodiment 1 to the modification of Embodiment 3, which are described in Embodiment 10, is used, the number of bits of an adjustment bit sequence (to be added) is 144×n+72.

(27-2) When the scheme in the modification of Embodiment 4 described in Embodiment 10 is used, the number of bits of a temporarily inserted adjustment bit sequence (known information) is 144×n+72. (Note that 144×n+72<16200.)

(27-3) When the scheme in the modification of Embodiment 8 described in Embodiment 10 is used, PunNum (the number of bits to be removed) is 144×n+72. (Note that 144×n+72<16200.)

(28)

The set of the modulation scheme of $s_1(t)$ (first complex signal s1) and the modulation scheme of $s_2(t)$ (second complex signal s2) is assumed to be (QPSK, QPSK), and the code length (block length) of an error correction code for use is assumed to be 64800 bits. (The value of X+Y is 4.)

(28-1) When any of the schemes in the modification of Embodiment 1 to the modification of Embodiment 3, which are described in Embodiment 10, is used, the number of bits of an adjustment bit sequence (to be added) is 36×n.

(28-2) When the scheme in the modification of Embodiment 4 described in Embodiment 10 is used, the number of bits of a temporarily inserted adjustment bit sequence (known information) is 36×n. (Note that 36×n<64800.)

(28-3) When the scheme in the modification of Embodiment 8 described in Embodiment 10 is used, PunNum (the number of bits to be removed) is 36×n. (Note that 36×n<64800.)

(29)

The set of the modulation scheme of $s_1(t)$ (first complex signal s1) and the modulation scheme of $s_2(t)$ (second complex signal s2) is assumed to be (QPSK, 16QAM), and the code length (block length) of an error correction code for use is assumed to be 64800 bits. (The value of X+Y is 6.)

(29-1) When any of the schemes in the modification of Embodiment 1 to the modification of Embodiment 3, which are described in Embodiment 10, is used, the number of bits of an adjustment bit sequence (to be added) is 18×n.

(29-2) When the scheme in the modification of Embodiment 4 described in Embodiment 10 is used, the number of bits of a temporarily inserted adjustment bit sequence (known information) is 18×n. (Note that 18 n<64800.)

(29-3) When the scheme in the modification of Embodiment 8 described in Embodiment 10 is used, PunNum (the number of bits to be removed) is 18×n. (Note that 18×n<64800.)

(30)

The set of the modulation scheme of $s_1(t)$ (first complex signal s1) and the modulation scheme of $s_2(t)$ (second complex signal s2) is assumed to be (QPSK, 64QAM), and the code length (block length) of an error correction code for use is assumed to be 64800 bits. (The value of X+Y is 8.)

(30-1) When any of the schemes in the modification of Embodiment 1 to the modification of Embodiment 3, which are described in Embodiment 10, is used, the number of bits of an adjustment bit sequence (to be added) is 72×n.

(30-2) When the scheme in the modification of Embodiment 4 described in Embodiment 10 is used, the number of bits of a temporarily inserted adjustment bit sequence (known information) is 72×n. (Note that 72×n<64800.)

(30-3) When the scheme in the modification of Embodiment 8 described in Embodiment 10 is used, PunNum (the number of bits to be removed) is 72×n. (Note that 72×n<64800.)

(31)

The set of the modulation scheme of $s_1(t)$ (first complex signal s1) and the modulation scheme of $s_2(t)$ (second complex signal s2) is assumed to be (QPSK, 256QAM), and the code length (block length) of an error correction code for use is assumed to be 64800 bits. (The value of X+Y is 10.)

(31-1) When any of the schemes in the modification of Embodiment 1 to the modification of Embodiment 3, which are described in Embodiment 10, is used, the number of bits of an adjustment bit sequence (to be added) is 90×n.

(31-2) When the scheme in the modification of Embodiment 4 described in Embodiment 10 is used, the number of bits of a temporarily inserted adjustment bit sequence (known information) is 90×n. (Note that 90×n<64800.)

(31-3) When the scheme in the modification of Embodiment 8 described in Embodiment 10 is used, PunNum (the number of bits to be removed) is 90×n. (Note that 90×n<64800.)

(32)

The set of the modulation scheme of $s_1(t)$ (first complex signal s1) and the modulation scheme of $s_2(t)$ (second complex signal s2) is assumed to be (16QAM, 16QAM), and the code length (block length) of an error correction code for use is assumed to be 64800 bits. (The value of X+Y is 8.)

(32-1) When any of the schemes in the modification of Embodiment 1 to the modification of Embodiment 3, which are described in Embodiment 10, is used, the number of bits of an adjustment bit sequence (to be added) is 72×n.

(32-2) When the scheme in the modification of Embodiment 4 described in Embodiment 10 is used, the number of bits of a temporarily inserted adjustment bit sequence (known information) is 72×n. (Note that 72×n<64800.)

(32-3) When the scheme in the modification of Embodiment 8 described in Embodiment 10 is used, PunNum (the number of bits to be removed) is 72×n. (Note that 72×n<64800.)

(33)

The set of the modulation scheme of $s_1(t)$ (first complex signal s1) and the modulation scheme of $s_2(t)$ (second complex signal s2) is assumed to be (16QAM, 64QAM), and the code length (block length) of an error correction code for use is assumed to be 64800 bits. (The value of X+Y is 10.)

(33-1) When any of the schemes in the modification of Embodiment 1 to the modification of Embodiment 3, which are described in Embodiment 10, is used, the number of bits of an adjustment bit sequence (to be added) is 90×n.

(33-2) When the scheme in the modification of Embodiment 4 described in Embodiment 10 is used, the number of bits of a temporarily inserted adjustment bit sequence (known information) is 90×n. (Note that 90, n<64800.)

(33-3) When the scheme in the modification of Embodiment 8 described in Embodiment 10 is used, PunNum (the number of bits to be removed) is 90-n. (Note that 90×n<64800.)

(34)

The set of the modulation scheme of $s_1(t)$ (first complex signal s1) and the modulation scheme of $s_2(t)$ (second complex signal s2) is assumed to be (16QAM, 256QAM), and the code length (block length) of an error correction code for use is assumed to be 64800 bits. (The value of X+Y is 12.)

(34-1) When any of the schemes in the modification of Embodiment 1 to the modification of Embodiment 3, which are described in Embodiment 10, is used, the number of bits of an adjustment bit sequence (to be added) is 36×n.

(34-2) When the scheme in the modification of Embodiment 4 described in Embodiment 10 is used, the number of bits of a temporarily inserted adjustment bit sequence (known information) is 36×n. (Note that 36×n<64800.)

(34-3) When the scheme in the modification of Embodiment 8 described in Embodiment 10 is used, PunNum (the number of bits to be removed) is 36×n. (Note that 36×n<64800.)

(35)

The set of the modulation scheme of $s_1(t)$ (first complex signal s1) and the modulation scheme of $s_2(t)$ (second complex signal s2) is assumed to be (64QAM, 256QAM), and the code length (block length) of an error correction code for use is assumed to be 64800 bits. (The value of X+Y is 14.)

(35-1) When any of the schemes in the modification of Embodiment 1 to the modification of Embodiment 3, which are described in Embodiment 10, is used, the number of bits of an adjustment bit sequence (to be added) is 126×n+90.

(35-2) When the scheme in the modification of Embodiment 4 described in Embodiment 10 is used, the number of bits of a temporarily inserted adjustment bit sequence (known information) is 126×n+36. (Note that 126×n+36<64800.)

(35-3) When the scheme in the modification of Embodiment 8 described in Embodiment 10 is used, PunNum (the number of bits to be removed) is 126×n+36. (Note that 126×n+36<64800.)

(36)

The set of the modulation scheme of $s_1(t)$ (first complex signal s1) and the modulation scheme of $s_2(t)$ (second complex signal s2) is assumed to be (256QAM, 256QAM), and the code length (block length) of an error correction code for use is assumed to be 64800 bits. (The value of X+Y is 16.)

(36-1) When any of the schemes in the modification of Embodiment 1 to the modification of Embodiment 3, which are described in Embodiment 10, is used, the number of bits of an adjustment bit sequence (to be added) is 144×n.

(36-2) When the scheme in the modification of Embodiment 4 described in Embodiment 10 is used, the number of bits of a temporarily inserted adjustment bit sequence (known information) is 144×n. (Note that 144×n<64800.)

(36-3) When the scheme in the modification of Embodiment 8 described in Embodiment 10 is used, PunNum (the number of bits to be removed) is 144<n. (Note that 144×n<64800.)

For example, assume that a communication system can use the set of the modulation scheme of $s_1(t)$ (first complex signal s1) and the modulation scheme of $s_2(t)$ (second complex signal s2) to any one of (QPSK, QPSK), (QPSK, 16QAM), (QPSK, 64QAM), (QPSK, 256QAM), (16QAM, 16QAM), (16QAM, 64QAM). (16QAM, 256QAM), (64QAM, 256QAM), and (256QAM, 256QAM), and can also use the code length (block length) of an error correction code to either 16200 bits or 64800 bits. Note that the θ(i) change period z described in Embodiment 10 is assumed to be 9.

In this case, it is important to satisfy any of the conditions described in the items (19) to (36) above. A characteristic point is that even when the set of the modulation scheme of $s_1(t)$ (first complex signal s1) and the modulation scheme of $s_2(t)$ (second complex signal s2) is fixed to a certain set of modulation schemes, the number of bits to be added or the number of bits to be removed differs depending on the code length (block length) of an error correction code.

The following describes case 3 and case 4 as specific examples of such a case.

Case 3:

The set of the modulation scheme of $s_1(t)$ (first complex signal s1) and the modulation scheme of $s_2(t)$ (second complex signal s2) is assumed to be (64QAM, 256QAM). The transmission device is assumed to be able to set the code length (block length) of an error correction code to either 16200 bits or 64800 bits.

Suppose that the transmission device selects 16200 bits as the code length (block length) of an error correction code. In this case, for example, when the condition of (26-1) is applied, the number of bits of an adjustment bit sequence (to be added) is set to 54; when the condition of (26-2) is applied, the number of bits of a temporarily inserted adjustment bit sequence (known information) is set to 72; and when the condition of (26-3) is applied, PunNum (the number of bits to be removed) is set to 72.

Alternatively, suppose that the transmission device selects 64800 bits as the code length (block length) of an error correction code. In this case, for example, when the condition of (35-1) is applied, the number of bits of an adjustment bit sequence (to be added) is set to 90; when the condition of (35-2) is applied, the number of bits of a temporarily inserted adjustment bit sequence (known information) is set to 36; and when the condition of (35-3) is applied, PunNum (the number of bits to be removed) is set to 36.

Case 4:

The set of the modulation scheme of $s_1(t)$ (first complex signal s1) and the modulation scheme of $s_2(t)$ (second complex signal s2) is assumed to be (256QAM, 256QAM). The transmission device is assumed to be able to set the code length (block length) of an error correction code to either 16200 bits or 64800 bits.

Suppose that the transmission device selects 16200 bits as the code length (block length) of an error correction code. In this case, for example, when the condition of (27-1) is applied, the number of bits of an adjustment bit sequence (to be added) is set to 72; when the condition of (27-2) is applied, the number of bits of a temporarily inserted adjustment bit sequence (known information) is set to 72; and when the condition of (27-3) is applied, PunNum (the number of bits to be removed) is set to 72.

Alternatively, suppose that the transmission device selects 64800 bits as the code length (block length) of an error correction code. In this case, for example, when the condition of (36-1) is applied, the number of bits of an adjustment bit sequence (to be added) is set to 0; when the condition of (36-2) is applied, the number of bits of a temporarily inserted adjustment bit sequence (known information) is set to 0; and when the condition of (36-3) is applied, PunNum (the number of bits to be removed) is set to 0.

Embodiment 12

The present embodiment describes a scheme for applying the bit length adjustment schemes in Embodiments 1 to 11 to DVB standards.

The following describes the case where the bit length adjustment schemes are applied to DVB (Digital Video Broadcasting)-T2 (T: Terrestrial) standards. First, description is provided on the frame structure of a broadcasting system using DVB-T2 standards.

Figure 106:
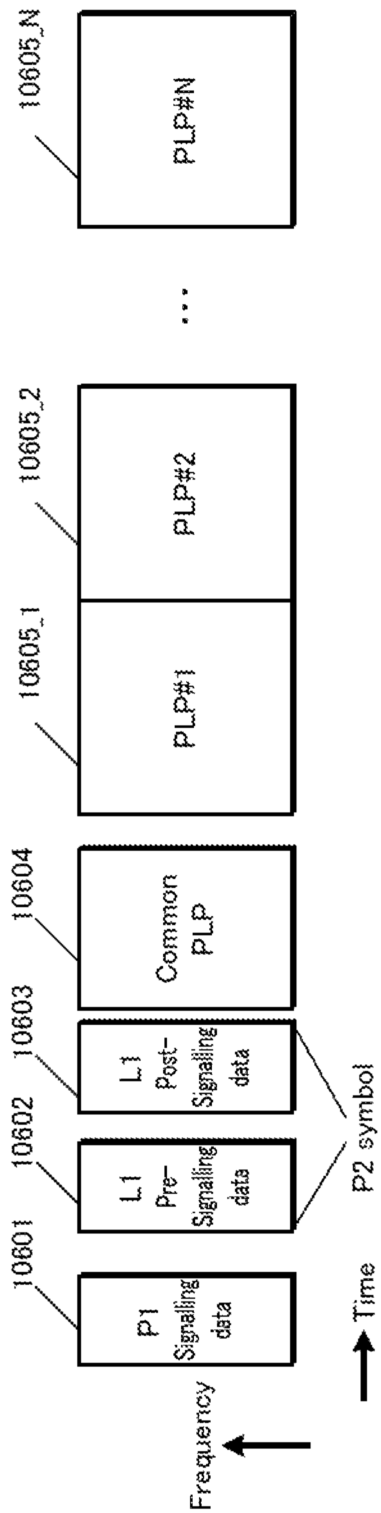
FIG. 106 shows an outline of frame structure.

FIG. 106 schematically shows the frame structure of a signal transmitted by a broadcasting station according to DVB-T2 standards. Since DVB-T2 standards use the OFDM scheme, the frame is built in the time-frequency domain. FIG. 106 shows the frame structure in the time-frequency domain, and the frame is composed of P1 Signalling data (hereinafter, also referred to as P1 symbol) (10601), L1 Pre-Signalling data (10602), L1 Post-Signalling data (10603), Common PLP (10604), and PLP#1 to PLP#N (10605_1 to 10605_N) (PLP: Physical Layer Pipe). (Here, the L1 Pre-Signalling data (10602) and the L1 Post-Signalling data (10603) are referred to as P2 symbols.)

The frame composed of the P1 Signalling data (10601), the L1 Pre-Signalling data (10602), the L1 Post-Signalling data (10603), the Common PLP (10604), and the PLP#1 to the PLP#N (10605_1 to 10605_N) as described above is referred to as a T2 frame, which is a unit of the frame structure.

The P1 Signalling data (10601) is a symbol for the reception device to perform signal detection and frequency synchronization (including frequency offset estimation). The P1 Signalling data (10601) transmits information on the FFT (Fast Fourier Transform) size in the frame, information on whether to transmit a modulated signal in a SISO (Single-Input Single-Output) scheme or a MISO (Multiple-Input Single-Output) scheme, and so on. (In DVB-T2 standards, the SISO scheme is a scheme for transmitting one modulated signal, and the MISO scheme is a scheme for transmitting a plurality of modulated signals with use of space-time block codes described in Non-Patent Literatures 5, 7, and 8.)

In the present embodiment, when the SISO scheme is used, a plurality of modulated signals may be generated from a single stream, and may be transmitted via a plurality of antennas.

The L1 Pre-Signalling data (10602) transmits information on: a guard interval used for a transmission frame; a signal processing scheme performed to reduce a PAPR (Peak to Average Power Ratio); the modulation scheme, error correction scheme (FEC: Forward Error Correction), and coding rate of the error correction scheme all used in transmitting the L1 Post-Signalling data; the size of the L1 Post-Signalling data and the information size; a pilot pattern; a cell (frequency region) unique number; which of a normal mode and an extended mode is used (the normal mode differs from the extended mode in the number of subcarriers used in data transmission); and so on.

The L1 Post-Signalling data (10603) transmits information on: the number of PLPs; a frequency region used; the unique number of each PLP; a modulation scheme, an error correction scheme, and a coding rate of the error correction scheme all used in transmitting each PLP; the number of blocks transmitted in each PLP; and so on.

The Common PLP (10604) and the PLP#1 to PLP#N (10605_1 to 10605_N) are fields used for transmitting data.

Figure 107:
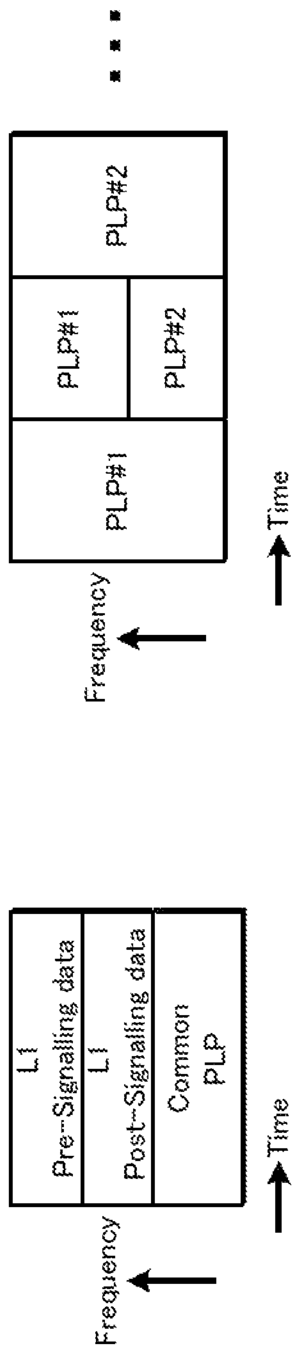
FIG. 107 shows an example in which two or more signals are concurrently present.

In the frame structure shown in FIG. 106, the P1 Signalling data (10601), the L1 Pre-Signalling data (10602), the L1 Post-Signalling data (10603), the Common PLP (10604), and the PLP#1 to PLP#N (10605_1 to 10605_N) are illustrated as being transmitted by time-sharing. In practice, however, two or more signals are concurrently present. FIG. 107 shows such an example. As shown in FIG. 107, the L1 Pre-Signalling data, the L1 Post-Signalling data, and the Common PLP may be present at the same time, and the PLP#1 and the PLP#2 may be present at the same time. That is, the signals constitute a frame using both time-sharing and frequency-sharing.

Figure 108:
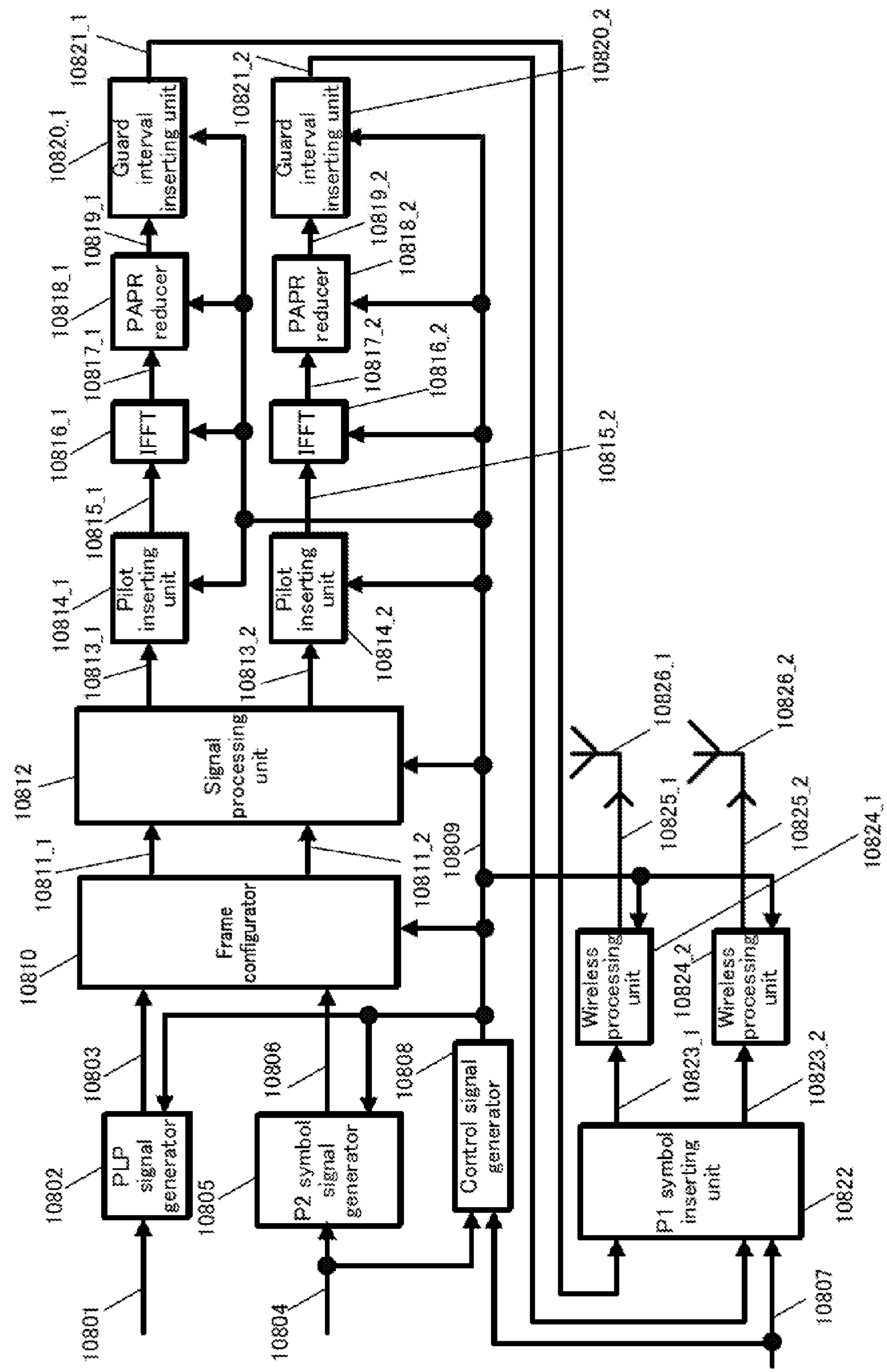
FIG. 108 shows an example of configuration of a transmission device.

FIG. 108 shows an example of the configuration of a transmission device (e.g., a broadcasting station) that is compliant with DVB-T2 standards and that employs the transmission scheme in which the aforementioned precoding and phase change are performed.

A PLP signal generator 10802 receives PLP transmission data (data for PLPs) 10801 and a control signal 10809 as inputs, performs error correction coding and mapping, based on the error correction code and modulation scheme of the PLP which are indicated by the information included in the control signal 10809, and outputs a (quadrature) baseband signal 10803 carrying the PLPs.

A P2 symbol signal generator 10805 receives P2 symbol transmission data 10804 and the control signal 10809 as inputs, performs mapping and error correction coding, based on the error correction code and modulation scheme of P2 symbols which are indicated by the information included in the control signal 10809, and outputs a (quadrature) baseband signal 10806 carrying the P2 symbols.

A control signal generator 10808 receives P1 symbol transmission data 10807 and P2 symbol transmission data 10804 as inputs, and then outputs, as the control signal 10809, information on the transmission scheme (the error correction code, coding rate of the error correction code, modulation scheme, block length, frame structure, selected transmission schemes including a transmission scheme that regularly hops between precoding matrices, pilot symbol insertion scheme, IFFT (Inverse Fast Fourier Transform)/FFT, PAPR reduction scheme, and guard interval insertion scheme) of each symbol group shown in FIG. 106 (P1 Signalling data (10601). L1 Pre-Signalling data (10602), L1 Post-Signalling data (10603), Common PLP (10604), PLP#1 to PLP#N (10605_1 to 10605_N)).

A frame configurator 10810 receives, as inputs, the baseband signal 10803 carrying PLPs, the baseband signal 10806 carrying P2 symbols, and the control signal 10809, and performs arrangement in the frequency and time domains based on the information on the frame structure included in the control signal 10809, and outputs a (quadrature) baseband signal 10811_1 corresponding to stream 1 (a signal obtained as a result of mapping, that is, a baseband signal based on a modulation scheme to be used) and a (quadrature) baseband signal 10811_2 corresponding to stream 2 (a signal obtained as a result of mapping, that is, a baseband signal based on a modulation scheme to be used) each in accordance with the frame structure.

A signal processing unit 10812 receives, as inputs, the baseband signal 10811_1 corresponding to stream 1, the baseband signal 10811_2 corresponding to stream 2, and the control signal 10809, and outputs a modulated signal 1 (10813_1) and a modulated signal 2 (10813_2) each obtained as a result of signal processing based on the transmission scheme indicated by information included in the control signal 10809.

Detailed descriptions on the operation of the signal processing unit 10812 are provided later.

A pilot inserting unit 10814_1 receives, as inputs, the modulated signal 1 (10813_1) obtained as a result of the signal processing and the control signal 10809, inserts pilot symbols into the received modulated signal 1 (10813_1) based on the information on the pilot symbol insertion scheme included in the control signal 10809, and outputs a modulated signal 10815_1 obtained as a result of the pilot signal insertion.

A pilot inserting unit 10814_2 receives, as inputs, the modulated signal 2 (10813_2) obtained as a result of the signal processing and the control signal 10809, inserts pilot symbols into the received modulated signal 2 (10813_2), based on the information on the pilot symbol insertion scheme included the control signal 10809, and outputs a modulated signal 10815_2 obtained as a result of the pilot symbol insertion.

An IFFT (Inverse Fast Fourier Transform) unit 10816_1 receives, as inputs, the modulated signal 10815_1 obtained as a result of the pilot symbol insertion and the control signal 10809, applies IFFT based on the information on the IFFT scheme included in the control signal 10809, and outputs a signal 10817_1 obtained as a result of the IFFT.

An IFFT unit 10816_2 receives, as inputs, the modulated signal 10815_2 obtained as a result of the pilot symbol insertion and the control signal 10809, applies IFFT based on the information on the IFFT scheme included in the control signal 10809, and outputs a signal 10817_2 obtained as a result of the IFFT.

A PAPR reducer 10818_1 receives, as inputs, the signal 10817_1 obtained as a result of the IFFT and the control signal 10809, performs processing to reduce PAPR on the received signal 10817_1 based on the information on PAPR reduction included in the control signal 10809, and outputs a signal 10819_1 obtained as a result of the PAPR reduction processing.

A PAPR reducer 10818_2 receives, as inputs, the signal 10817_2 obtained as a result of the IFFT and the control signal 10809, performs processing to reduce PAPR on the received signal 10817_2 based on the information on PAPR reduction included in the control signal 10809, and outputs a signal 10819_2 obtained as a result of the PAPR reduction processing.

A guard interval inserting unit 1082θ_1 receives, as inputs, the signal 10819_1 obtained as a result of the PAPR reduction processing and the control signal 10809, inserts guard intervals into the received signal 10819_1 based on the information on the guard interval insertion scheme included in the control signal 10809, and outputs a signal 10821_1 obtained as a result of the guard interval insertion.

A guard interval inserting unit 1082θ_2 receives, as inputs, the signal 10819_2 obtained as a result of the PAPR reduction processing and the control signal 10809, inserts guard intervals into the received signal 10819_2 based on the information on the guard interval insertion scheme included in the control signal 10809, and outputs a signal 10821_2 obtained as a result of the guard interval insertion.

A P1 symbol inserter 10822 receives, as inputs, the signal 10821_1 obtained as a result of the guard interval insertion, the signal 10821_2 obtained as a result of the guard interval insertion, and the P1 symbol transmission data 10807, generates a P1 symbol signal from the P1 symbol transmission data 10807, adds the P1 symbol to the signal 10821_1 obtained as a result of the guard interval insertion, and adds the P1 symbol to the signal 10821_2 obtained as a result of the guard interval insertion. Then, the P1 symbol inserting unit 10822 outputs a signal 10823_1 as a result of the addition of the P1 symbol, and a signal 10823_2 as a result of the addition of the P1 symbol. Note that a P1 symbol signal may be added to either or both of the signals 10823_1 and 10823_2 obtained as a result of the addition of the P1 symbol. In the case where the P1 symbol signal is added to one of the signals 10823_1 and 10823_2, the signal to which a P1 signal is not added includes, as a baseband signal, a zero signal in an interval corresponding to a P1 symbol interval of the signal to which a P1 symbol is added.

A wireless processing unit 10824_1 receives, as an input, the signal 10823_1 obtained as a result of the addition of the P1 symbol, performs processing such as frequency conversion and amplification, and outputs a transmission signal 10825_1. The transmission signal 10825_1 is then output as a radio wave from an antenna 10826_1.

A wireless processing unit 10824_2 receives, as an input, the signal 10823_2 obtained as a result of the addition of the P1 symbol, performs processing such as frequency conversion and amplification, and outputs a transmission signal 10825_2. The transmission signal 10825_2 is then output as a radio wave from an antenna 10826_2.

For example, assume that the broadcast station transmits each symbol in the frame structure as shown in FIG. 106. In this case, as an example, FIG. 109 shows a frame structure in the frequency-time domain when the broadcast station transmits PLP$1 (to avoid confusion, #1 is replaced by $1) and PLP$K using the transmission scheme of transmitting two modulated signals via two antennas as described in Embodiments 1 to 11.

Figure 109:
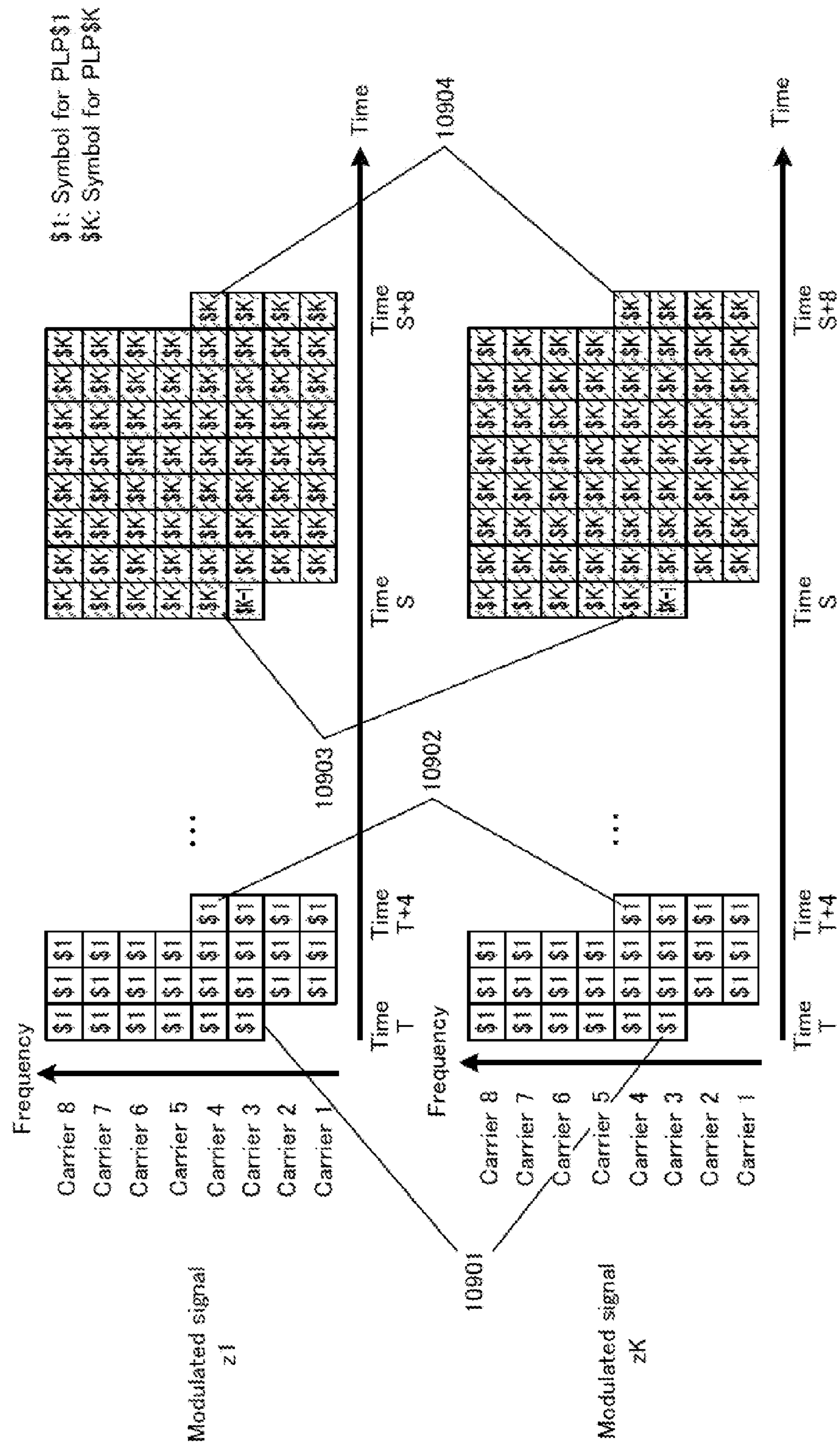
FIG. 109 shows an example of frame structure.

As shown in FIG. 109, the slots (symbols) for PLP$1 are present, where the first slot is time T and carrier 3 (10901 in FIG. 109) and the last slot is time T+4 and carrier 4 (10902 in FIG. 109).

That is, in PLP $1, the first slot is time T and carrier 3, the second slot is time T and carrier 4, the third slot is time T and carrier 5, . . . , the seventh slot is time T+1 and carrier 1, the eighth slot is time T+1 and carrier 2, the ninth slot is time T+1 and carrier 3, . . . , the fourteenth slot is time T+1 and carrier 8, the fifteenth slot is time T+2 and carrier 0, . . . .

As shown in FIG. 109, the slots (symbols) for PLP$K are present, where the first slot is time S and carrier 4 (10903 in FIG. 109) and the last slot is time S+8 and carrier 4 (10904 in FIG. 109).

That is, in PLP $K, the first slot is time S and carrier 4, the second slot is time S and carrier 5, the third slot is time S and carrier 6, . . . , the fifth slot is time S and carrier 8, the ninth slot is time S+1 and carrier 1, the tenth slot is time S+1 and carrier 2, . . . , the sixteenth slot is time S+1 and carrier 8, the seventeenth slot is time S+2 and carrier 0, . . . .

Here, slot information that is information on slots used by each PLP and that includes information on the first slot (symbol) and last slot (symbol) of each PLP is transmitted by control symbols such as the P1 symbol, the P2 symbols, and a control symbol group.

The following describes the operation of the signal processing unit 10812 shown in FIG. 108. The signal processing unit 10812 includes an encoder for an LDPC code, a mapper, a precoding unit, a bit length adjuster, and an interleaver.

The signal processing unit 10812 receives the control signal 10809 as an input, and determines a signal processing scheme based on the information included in the control signal 10809, such as information on the code length (block length) of the LDPC code, the transmission scheme (SISO, MIMO, or MISO), and the modulation scheme. When MIMO is selected as a transmission scheme, the signal processing unit 10812 performs bit length adjustment based on the code length (block length) of the LDPC code, a set of modulation schemes, and any of the bit length adjustment schemes described in Embodiments 1 to 11. Then, the signal processing unit 10812 performs interleaving and mapping, and may perform precoding in some circumstances, and outputs the modulated signal 1 (10813_1) and the modulated signal 2 (10813_2) each obtained as a result of signal processing.

As described above, the P1 symbol, the P2 symbols, and the control symbol group transmit, to the terminal device, the information on the transmission scheme of each PLP (e.g., a transmission scheme for transmitting a single stream, a transmission scheme that uses space-time block codes, or a transmission scheme for transmitting two streams) and the modulation scheme used.

The following describes the operation of the terminal device in this case.

Figure 110:
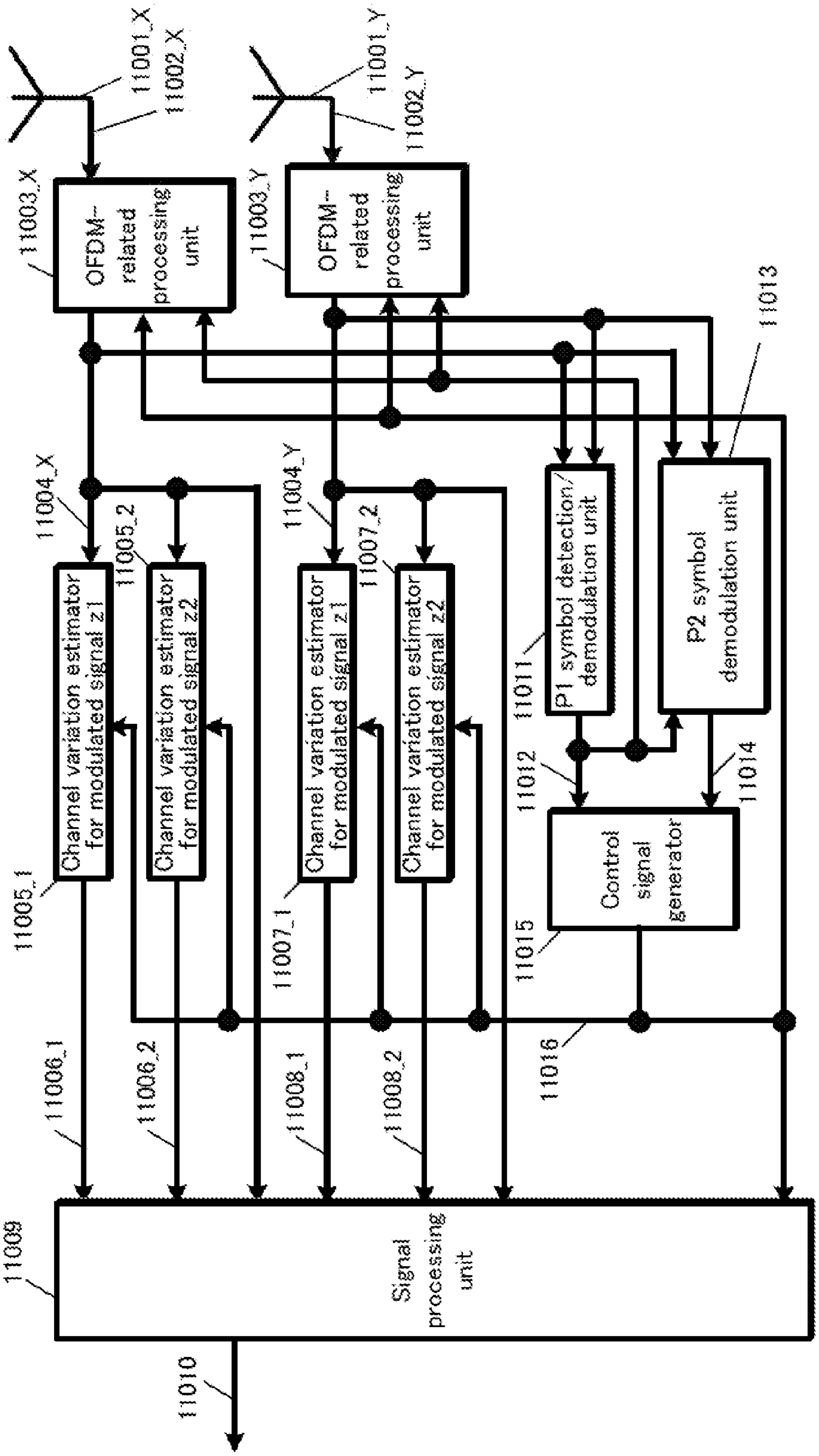
FIG. 110 shows an example of configuration of a reception device.

In FIG. 110, a P1 symbol detection/demodulation unit 11011 receives signals transmitted from the broadcasting station (FIG. 108). Specifically, the P1 symbol detection/demodulation unit 11011 receives a signal 11004_X and a signal 11004_Y obtained as a result of signal processing as inputs, detects a P1 symbol thereby to perform signal detection and time-frequency synchronization, and also acquires control information included in the P1 symbol (by performing demodulation and error correction decoding), and outputs P1 symbol control information 11012.

An OFDM-related processing unit 11003_X receives a reception signal 11002_X via an antenna 11001_X as an input, performs reception-side signal processing for the OFDM scheme, and outputs the signal 11004_X obtained as a result of the signal processing. Similarly, an OFDM-related processing unit 11003_Y receives a reception signal 11002_Y via an antenna 11001_Y as an input, performs reception-side signal processing for the OFDM scheme, and outputs the signal 11004_Y obtained as a result of the signal processing.

The OFDM-related processing units 11003_X and 11003_Y each receive the P1 symbol control information 11012 as an input, and changes the signal processing scheme for the OFDM scheme based on the P1 symbol control information 11012. (This is because, as described above, the information on the signal transmission scheme transmitted by the broadcasting station is included in the P1 symbol.)

A P2 symbol demodulation unit 11013 receives, as inputs, the signals 11004_X and 11004_Y obtained as a result of signal processing, and the P1 symbol control information 11012, performs signal processing based on the P1 symbol control information, performs demodulation (including error correction decoding), and outputs P2 symbol control information 11014.

A control signal generator 11015 receives the P1 symbol control information 11012 and the P2 symbol control information 11014 as inputs, bundles pieces of control information (which are related to reception operations), and outputs the bundled information as a control signal 11016. Subsequently, the control signal 11016 is input to each unit as shown in FIG. 110.

A channel variation estimator 11005_1 for the modulated signal $z_1$ (the modulated signal $z_1$ being as described in Embodiment 7) receives, as inputs, the signal 11004_X obtained as a result of signal processing and the control signal 11016, estimates channel variations between the antenna with which the transmission device has transmitted the modulated signal $z_1$ and the receive antenna 11001_X, with use of pilot symbols, etc., included in the signal 11004_X obtained as a result of signal processing, and outputs a channel estimation signal 11006_1.

A channel variation estimator 11005_2 for the modulated signal $z_2$ (the modulated signal $z_2$ being as described in Embodiment 7) receives, as inputs, the signal 11004_X obtained as a result of signal processing and the control signal 11016, estimates channel variations between the antenna with which the transmission device has transmitted the modulated signal $z_2$ and the receive antenna 11001_X, with use of pilot symbols, etc., included in the signal 11004_X obtained as a result of signal processing, and outputs a channel estimation signal 11006_2.

A channel variation estimator 11007_1 for the modulated signal $z_1$ (the modulated signal $z_1$ being as described in Embodiment 7) receives, as inputs, the signal 11004_Y obtained as a result of signal processing and the control signal 11016, estimates channel variations between the antenna with which the transmission device has transmitted the modulated signal $z_1$ and the receive antenna 11001_Y, with use of pilot symbols, etc., included in the signal 11004_Y obtained as a result of signal processing, and outputs a channel estimation signal 11008_1.

A channel variation estimator 11007_2 for the modulated signal $z_2$ (the modulated signal $z_2$ being as described in Embodiment 7) receives, as inputs, the signal 11004_Y obtained as a result of signal processing and the control signal 11016, estimates channel variations between the antenna with which the transmission device has transmitted the modulated signal $z_2$ and the receive antenna 11001_Y, with use of pilot symbols, etc., included in the signal 11004_Y obtained as a result of signal processing, and outputs a channel estimation signal 11008_2.

A signal processing unit 11009 receives, as inputs, the signals 11006_1, 11006_2, 11008_1, 11008_2, 11004_X, and 11004_Y, and the control signal 11016, performs demodulation and decoding, based on information included in the control signal 11016 such as a transmission scheme, a modulation scheme, an error correction coding scheme, the coding rate and block size of an error correction code, and the like, which are each used for the transmission of the PLPs, and outputs reception data 11010. The reception device extracts necessary PLP from the slot information that is information on slots used by each PLP and that is included in control symbols such as the P1 symbol, the P2 symbols, and the control symbol group, and performs demodulation (including separation of signals and signal detection) and error correction decoding.

The above mainly describes the configuration of a transmission device (e.g., a broadcasting station) that is compliant with DVB-T2 standards and that employs a transmission scheme in which precoding and phase change are performed, and also the configuration of a reception device that receives signals transmitted from the transmission device.

Suppose here that a broadcasting system using DVB-T2 standards has been established, and reception devices that can receive modulated signals in DVB-T2 standards are prevalent. In this case, when new standards are introduced, it is desirable that the reception devices that can receive modulated signals in DVB-T2 standards are not affected by the new standards.

Accordingly, the following description pertains to: a transmission scheme for transmitting a single stream without affecting the reception devices that can receive modulated signals in DVB-T2 standards; a scheme for configuring a P1 symbol (P1 signalling data) and P2 symbols (L1 Pre-Signalling data and L1 Post-Signalling data), in order to introduce a transmission scheme for transmitting two streams; and a scheme for configuring a P1 symbol (P1 signalling data) and P2 symbols (L1 Pre-Signalling data and L1 Post-Signalling data), in order to introduce the bit length adjustment scheme described in Embodiments 1 to 11.

First, in DVB-T2 standards, the following definitions are used in the S1 field of the P1 symbol (P1 Signalling data).

TABLE 1

| Value of S1 | Type | Explanation |
|---|---|---|
| 000 | T2_SISO | The transmission device sets S1 to this value ("000") so that the reception device can learn that a modulated signal has been transmitted using the SISO scheme in DVB-T2 standards. |
| 001 | T2_MISO | The transmission device sets S1 to this value ("001") so that the reception device can learn that modulated signals have been transmitted using the MISO scheme in DVB-T2 standards. |
| 010<br>011<br>100<br>101<br>110<br>111 | Reserved | Available future systems. |

Note that in table 1, the SISO scheme is a scheme for transmitting a single stream using a single antenna or a plurality of antennas, and the MISO scheme is a scheme for generating a plurality of modulated signals using space-time (or space-frequency) block coding described in Non-Patent Literatures 5, 7, and 8, and transmitting the plurality of modulated signals using a plurality of antennas.

Two bits of PLP_FEC_TYPE of L1 Post-Signalling data as a P2 symbol define the type of FEC (Forward Error Correction) used in PLPs.

TABLE 2

| Value of PLP_FEC_TYPE | Type of FEC in PLP |
|---|---|
| 00 | The transmission device sets PLP_FEC to this value ("00") so that the reception device can learn that an LDPC code having a block length of 16K (16200 bits) is used. |
| 01 | The transmission device sets PLP_FEC_TYPE to this value ("01") so that the reception device can learn that an LDPC code having a block length of 64K (64800 bits) is used. |
| 10 | Reserved |
| 11 | |

Next, description is provided on the structure of a P1 symbol and P2 symbols for realizing bit length adjustment described in Embodiments 1 to 11 without affecting the reception devices that can receive modulated signals in DVB-T2 standards.

In the above, description has been provided on the S1 field of a P1 symbol (P1 Signalling data) in DVB-T2 standards. In DVB standards, the S1 field of a P1 symbol (P1 Signalling data) is further defined as follows.

TABLE 3-1

| Value of S1 | Type | Explanation |
|---|---|---|
| 000 | T2_SISO | The transmission device sets S1 to this value ("000") so that the reception device can learn that a modulated signal has been transmitted using the SISO scheme in DVBT2 standards. |
| 001 | T2_MISO | The transmission device sets S1 to this value ("001") so that the reception device C311 learn that modulated signals have been transmitted using the MISO scheme in DVB-T2 standards. |
| 010 | Non-T2 | Special mode |
| 011 | T2_LITE_SISO | The transmission device sets S1 to this value ("011") so that the reception device can learn that a modulated signal has been transmitted using the SISO scheme in DVB-T2 Lite standards. |

| Value of S1 | Type | Explanation |
|---|---|---|
| 100 | T2_LITE_MISO | The transmission device sets S1 to this value ("100") so that the reception device can learn that modulated signals have been transmitted using the MISO scheme in DVB-T2 Lite standards. |
| 101 | NGH_SO | The transmission device sets S1 to this value ("101") so that the reception device can learn that a modulated signal has been transmitted using the SISO scheme in DVB-NGH standards. |
| 110 | NGH_MISO | The transmission device sets S1 to this value ("110") so that the reception devicevcan learn that modulated signals have been transmitted using the MiSO scheme in DVB-NG1-1 standards. |
| 111 | ESC | The transmission device sets S1 to this value ("111") when a transmission scheme selected is other than the transmission schemes defined by S1 with the values from 000 to 110. |

Note that in tables 3-1 and 3-2, the SISO scheme is a scheme for transmitting a single stream using a single antenna or a plurality of antennas, and the MISO scheme is a scheme for generating a plurality of modulated signals using space-time (or space-frequency) block coding described in Non-Patent Literatures 5, 7, and 8, and transmitting the plurality of modulated signals using a plurality of antennas.

When the value of S1 is "111" in tables 3-1 and 3-2, and S2 field 1 and S2 field 2 are set for new standards, the following definitions are used.

TABLE 4-1

| S2 field 1 | S2 field 2 | Meaning | Explanation |
|---|---|---|---|
| 000 | x | Preamble format of the NGH MIMO signal | When the value of S1 is "111" and S2 field 1and S2 field 2 are set to these respective values, the learns that reception device modulated signals have been transmitted using the MEMO scheme in DVB-NGH standards. When transmitting modulated signals using the MIMO scheme in DVB-NGH standards, the transmission device sets S1 to "111", and S2 field 1 and S2 field 2 to these respective values (S2 field 1 to "000", and S2 field 2 to "x"). |
| 001 | x | Preamble format of the NGH hybrid SISO | When the value of S1 is "111" and S2 field 1 and S2 field 2 are set to these respective signal values, the reception device learns that a modulated signal has been transmitted using the hybrid SISO scheme in DVB-NGH standards. When transmitting a modulated signal using the hybrid SISO scheme in DVB-NGH standards, the transmission device sets S1 to "111", and S2 field 1 and S2 field 2 to these respective values (S2 field 1 to "001", and S2 field 2 to "x"). |

TABLE 4-2

| S2 field 1 | S2 field 2 | Meaning | Explanation |
|---|---|---|---|
| 010 | x | Preamble format of the NGH hybrid MISO signal | When the value of S1 is "111" and S2 field 1 and S2 field 2 are set to these respective values, the reception device learns that modulated signals have been transmitted using the hybrid MISO scheme in DVB-NGH standards. When transmitting modulated signals using the hybrid MISO scheme in DVB-NGH standards, the transmission device sets S1 to "111", and S2 field 1 and S2 field 2 to these respective values (S2 field 1 to "010", and S2 field 2 to '"x"). |

TABLE 4-2-continued

| S2 field 1 | S2 field 2 | Meaning | Explanation |
|---|---|---|---|
| 011 | x | Preamble format of the NGH hybrid MIMO signal | When the value of S1 is "111" and S2 field 1 and S2 field 2 are set to these respective values, the reception device learns that modulated been signals have transmitted using the hybrid DVB-NGH standards. When transmitting modulated signals using the hybrid MIMO scheme in DVB-NGH s tandards, the transmission device sets S1 to "111", and S2 field 1 and S2 field 2 to these respective values (S2 field 1 to "011", and S2 field 2 to "x"). |

TABLE 4-3

| S2 field 1 | S2 field 2 | Meaning | Explanation |
|---|---|---|---|
| 100 | x | Ω standards SISO | When the value of S1 is "111" and S2 field 1 and S2 field 2 are set to these respective values, the reception device learns that a modulated signal has been transmitted using the S180 scheme in Ω standards. When transmitting a modulated signal using the SISO scheme in Ω standards, the transmission device sets S1 to "111", and S2 field 1 and S2 field 2 to these respective values (S2 field 1 to "100", and S2 field 2 to "x"). |
| 101 | x | Ω standards MISO | When the value of S1 is "111" and S2 field 1 and S2 field 2 are set to these respective values, the reception device learns that modulated signals have been transmitted using the MISO scheme in Ω standards. When transmitting modulated signals using the MISO scheme in S1 standards, the transmission device sets S1 to "111", and S2 field 1 and S2 field 2 to these respective values (S2 field 1 to "101", and S2 field 2 to "x"). |

TABLE 4-4

| S2 field 1 | S2 field 2 | Meaning | Explanation |
|---|---|---|---|
| 110 | x | Ω standards MIMO | When the value of S1 is "111" and S2 field 1 and S2 field 2 are set to these respective values, the reception device learns that modulated signals have been transmitted using the MIMO scheme in Ω standards. When transmit-ting modulated signals using the MIMO scheme in Ω standards, the transmission device sets S1 to "111", and S2 field 1 and S2 field 2 to these respective values (S2 field 1 to "110", and S2 field 2 to "x"). |
| 111 | x | Reserved | For future expansion. |

Note that in tables 4-1 to 4-4. "x" means that the value is indeterminate (any value is acceptable), the SISO scheme is a scheme for transmitting a single stream using a single antenna or a plurality of antennas, and the MISO scheme is a scheme for generating a plurality of modulated signals using space-time (or space-frequency) block coding described in Non-Patent Literatures 5, 7, and 8, and transmitting the plurality of modulated signals using a plurality of antennas, and the MIMO scheme is a scheme for transmitting two streams on which the aforementioned precoding, etc. has been performed.

As described above, with the P1 symbol transmitted by the transmission device, the reception device can learn "whether a modulated signal has been transmitted in the transmission scheme for transmitting a single stream or the transmission scheme for transmitting two streams".

When, as described above, a transmission scheme is selected from among: the scheme for transmitting a single stream; the SISO scheme (a scheme for transmitting a single stream using a single antenna or a plurality of antennas); the MISO scheme (a scheme for generating a plurality of modulated signals using space-time (or space-frequency) block coding described in Non-Patent Literatures 5, 7, and 8); and the MIMO scheme, the two bits of PLP_FEC_TYPE of L1 Post-Signalling data as a P2 symbol define the type of FEC as follows. (Note that the setting of S1 and S2 of the P1 symbol is performed in the same manner as in tables 3-1, 3-2, and 4-1 to 4-4).

TABLE 5

| Value of PLP_FEC_TYPE | Type of FEC in PLP |
|---|---|
| 00 | The transmission device sets PLP_FEC_TYPE to this value ("00") so that the reception device can learn that an LDPC code having a block length of 16K (16200 bits) is used. |
| 01 | The transmission device sets PLP_FEC_TYPE to this value ("01") so that the reception device can learn that an LDPC code having a block length of 64K (64800 bits) is used. |
| 10 | Reserved |
| 11 | Reserved |

Three bits of PLP_NUM_PER_CHANNEL_USE of L1 Post-Signalling data as a P2 symbol may define the following, for example.

TABLE 6-1

| Value of PLP_NUM_PER_CHANNEL_USE | BPCU (Bit Per Channel Use) (Value of X + Y) | Modulation |
|---|---|---|
| 000 | 6 | When the value of PLP_NUM_PER_CHANNEL_USE is "000", the modulation scheme of Tx1 is set to QPSK, and the |

TABLE 6-1-continued

| Value of PLP_NUM_PER_ CHANNEL_USE | BPCU (Bit Per Channel Use) (Value of X + Y) | Modulation |
| --- | --- | --- |
| 001 | 8 | modulation scheme of Tx2 is set to 16QAM. (When the value of PLP_NUM_PER_CHANNEL_USE is “000”, the modulation scheme of s1 is set to QPSK, and the modulation scheme of s2 is set to 16QAM.) When the value of PLP_NUM_PER_CHANNEL_ USE is “000”, the modulation scheme of Tx1 is set to 16QAM, and the modulation scheme of Tx2 is set to 16QAM. (When the value of PLP_NUM_PER CHANNEL_USE is “000”, the modulation scheme of s1 is set to 16QAM, and the modulation scheme of s2 is set to 16QAM.) |

TABLE 6-2

| Value of PLP_NUM_PER_ CHANNEL_USE | BPCU (Bit Per Channel Use) (Value of X + Y) | Modulation |
| --- | --- | --- |
| 010 | 10 | When the value of PLP_NUM_ PER_CHANNEL_USE is '“000”, the modulation scheme of Tx1 is set to 16QAM, and the modulation scheme of Tx2 is set to 64QAM. (When the value of PLP_NUM_PER_ CHANNEL_USE is “000”, the modulation scheme of s1 is set to 16QAM, and the modulation scheme of s2 is set to 64QAM.) |
| 011 | 12 | When the value of PLP_NUM_ PER_CHANNEL_USE is “000”, the modulation scheme of Tx1 is set to 64QAM, and the modulation scheme of Tx2 is set to 64QAM. (When the value of PLP_NUM_ PER_CHANNEL_USE is “000”, the modulation scheme of s1 is set to 64QAM, and the modulation scheme of s2 is set to 64QAM.) |

TABLE 6-3

| Value of PLP_NUM_PER_ CHANNEL_USE | BPCU (Bit Per Channel Use) (Value of X + Y) | Modulation |
| --- | --- | --- |
| 100 | 14 | When the value of PLP_NUM_PER_ CHANNEL_USE is “00”, the modulation scheme of Tx1 is set to 64QAM, and the modulation scheme of Tx2 is set to 256QAM. (When the value of PLP_NUM_PER_ CHANNEL_USE is “000”, the modulation scheme of s1 is set to 64QAM, and the modulation scheme of s2 is set to 256QAM |
| 101 | 16 | Whenthe value of PLP_NUM_PER_ CHANNEL_USE is “000”, the modulation scheme of Tx1 is set to 256QAM, and the modulation scheme of Tx2 is set to 256QAM. (When the value of PLP_NUM_PER_ CHANNEL_USE is “000”, the modulation scheme of s1 is set to 256QAM. and the modulation scheme of s2 is set to 256QAM.) |
| 110~111 | Reserved | Reserved |

Note that the value of X+Y, s1, and s2 are the same as those described in Embodiments 1 to 3 above.

Accordingly, when the MIMO scheme in Ω standards is selected by the P1 symbol, the signal processing unit 10812 in FIG. 108 performs bit length adjustment (adjustment of the number of bits of an adjustment bit sequence) based on any of the bit length adjustment schemes described in Embodiments 1 to 11, according to the block length of an LDPC code specified by the 2-bit value of PLP_FEC_TYPE of L1 Post-Signalling data as a P2 symbol and the modulation schemes for s1 and s2 specified by the 3-bit value of PLP_NUM_PER_CHANNEL_USE of L1 Post-Signalling data as the P2 symbol. Subsequently, the signal processing unit 10812 performs interleaving and mapping, and may perform precoding in some circumstances, and outputs the modulated signal 1 (10813_1) and the modulated signal 2 (10813_2) each obtained as a result of signal processing.

Specific examples of numerical values for bit length adjustment (adjustment of the number of bits of an adjustment bit sequence) are described in Embodiments 1 to 11. Note that these numerical values are merely provided as examples.

In the reception device (the terminal device) shown in FIG. 110, the P symbol detection/demodulation unit 11011 and the P2 symbol demodulation unit 11013 obtain data on the P1 symbol, the PLP_FEC_TYPE of L1 Post-Signalling data as the P2 symbol, and the PLP_NUM_PER_CHANNEL_USE of L1 Post-Signalling data as the P2 symbol. Based on the data thus obtained, the control signal generator 11015 estimates the bit length adjustment scheme used by the transmission device, and, the signal processing unit 11009 performs signal processing based on the bit length adjustment scheme estimated by the control signal generator 11015. Details of the signal processing are described in the operation examples of the reception device in Embodiments 1 to 11.

The implementation as described above allows the transmission device to efficiently transmit a modulation signal in new standards, as well as a modulation signal in DVB-T2 standards. In other words, the above implementation achieves an advantageous effect of reducing the amount of control information in the P1 symbol and P2 symbols. Furthermore, when a modulated signal in new standards is transmitted, the advantageous effects described in Embodiments 1 to 11 can also be achieved.

In addition, the reception device can use the P1 symbol and the P2 symbols to determine whether a reception signal is a signal in DVB-T2 standards or a signal in new standards, and can achieve the advantageous effects described in Embodiments 1 to 11.

Also, since the broadcasting station performs bit length adjustment described in Embodiments 1 to 11 and transmits modulated signals, the symbols constituting each block of a block code, such as an LDPC code (there is no symbol including data of a plurality of blocks), is clear. This allows the reception device to produce an advantageous effect of reducing the amount of control information on the P1 symbol and the P2 symbols. (Suppose that a symbol including data of a plurality of blocks is present among a plurality of symbols. In this case, information on the frame structure for such a symbol needs to be added.)

The structures of the P1 symbol and the P2 symbols described in the present embodiment are merely examples. The P1 symbol and/or the P2 symbols may have different structures. In addition to the P1 symbol and the P2 symbols that transmit control information, a new symbol that transmit new control information may be added to a transmission frame.

(Supplementary Explanation 1)

Of course, two or more of the embodiments described in the present Description may be implemented in combination with one another.

The present Description uses the symbol ∀, which is the universal quantifier, and the symbol ∃, which is the existential quantifier.

Furthermore, in the present Description a unit of phase, such as argument, in the complex plane is expressed in "radian".

Use of the complex plane allows for display of complex numbers in polar form in the polar coordinate system. When a point (a,b) in the complex plane is associated with a complex number z=a+jb (where a and b are each a real number, and j is an imaginary unit), and this point is expressed as [r,θ] in the polar coordinate system, $$a = r \times \cos\theta,$$

$$b = r \times \sin\theta, \text{ and}$$

$$r = \sqrt{a^2 + b^2} \qquad \text{[Math. 364]}$$

are satisfied. Herein, r is the absolute value of z (r=|z|), and θ is argument. Thus, z=a+jb can be expressed as $re^{j\theta}$.

In explanation of the present invention, the baseband signals s1, s2, z1, and z2 are complex signals. A complex signal made up of in-phase signal I and quadrature signal Q is also expressible as complex signal I+jQ (j is the imaginary unit). Here, either of I and Q may be equal to zero.

Note that a program for executing the above transmission scheme may, for example, be stored in advance in read only memory (ROM) and be executed by a central processing unit (CPU).

Furthermore, the program for executing the above transmission scheme may be stored on a computer-readable recording medium, the program stored on the recording medium may be loaded in random access memory (RAM) of a computer, and the computer may be operated in accordance with the program.

The components of the above-described embodiments may be typically assembled as a large scale integration (LSI), which is a type of integrated circuit. Individual components may respectively be made into discrete chips, or a subset or entirety of the components may be integrated into a single chip. Although an LSI is mentioned above, the terms integrated circuit, system LSI, super LSI, or ultra LSI may also apply, depending on the degree of integration. Furthermore, the method of integrated circuit assembly is not limited to LSI. A dedicated circuit or a general-purpose processor may be used. After LSI assembly, a field programmable gate array (FPGA) or reconfigurable processor capable of reconfiguring settings and connection of circuit cells in the LSI may be used.

Furthermore, should progress in the field of semiconductors or emerging technologies lead to replacement of LSI with other integrated circuit technology, then such technology may of course be used to integrate the functional blocks. Application of biotechnology is also plausible.

Embodiments 1 to 11 explain a bit length adjustment scheme. Furthermore, Embodiment 12 explains a situation in which the bit length adjustment scheme, explained in Embodiments 1 to 11, is applied to DVB standards. Explanation is provided in the aforementioned embodiments for situations in which 16QAM, 64QAM, and 256QAM are used as modulation schemes.

In Embodiments 1 to 12, a modulation scheme having 16 signal points in the I (in-phase)-Q (quadrature(-phase)) plane may be used as an alternative to 16QAM. In the same way, a modulation scheme having 64 signal points in the I (in-phase)-Q (quadrature(-phase)) plane may be used as an alternative to 64QAM, and a modulation scheme having 256 signal points in the I (in-phase)-Q (quadrature(-phase)) plane may be used as an alternative to 256QAM.

In the present Description, each antenna may be implemented as plurality of antennas.

In the present Description, the reception device and the antennas may alternatively be separate from one another. For example, the reception device may include an interface into which a signal received by an antenna, or a signal generated through frequency change being performed on the signal received by the antenna, is input via a cable, and the reception device may perform subsequent processing of the signal.

Data or information acquired by the reception device may be subsequently converted into video and displayed on a display (monitor), or converted into audio and output as sound through a speaker. Furthermore, signal processing related to video or audio may be performed on the data or information acquired by the reception device (note that it is not essential that signal processing is performed), and subsequently processed data or information may be output from an RCA terminal (video terminal or audio terminal), a universal serial bus (USB), a high-definition multimedia interface (HDMI), or a digital terminal of the reception device.

(Supplementary Explanation 2)

Embodiments 1 to 11 explain a bit length adjustment scheme. Furthermore, Embodiment 12 explains a situation in which the bit length adjustment scheme, explained in Embodiments 1 to 11, is applied to DVB standards. In the aforementioned embodiments, explanation is given for situations in which 16QAM, 64QAM, and 256QAM are used as modulation schemes. Specific explanation of a mapping scheme for 16QAM, 64QAM, and 256QAM is also provided in Configuration Example R1.

The following explains an alternative method for configuring a mapping scheme for 16QAM, 64QAM, and 256QAM, differing from Configuration Example R1. Note that 16QAM, 64QAM, and 256QAM explained below may be applied to any of Embodiments 1 to 12, thereby obtaining the same effects as explained in Embodiments 1 to 12.

Explanation is provided for a configuration in which 16QAM is extended.

Figure 111:
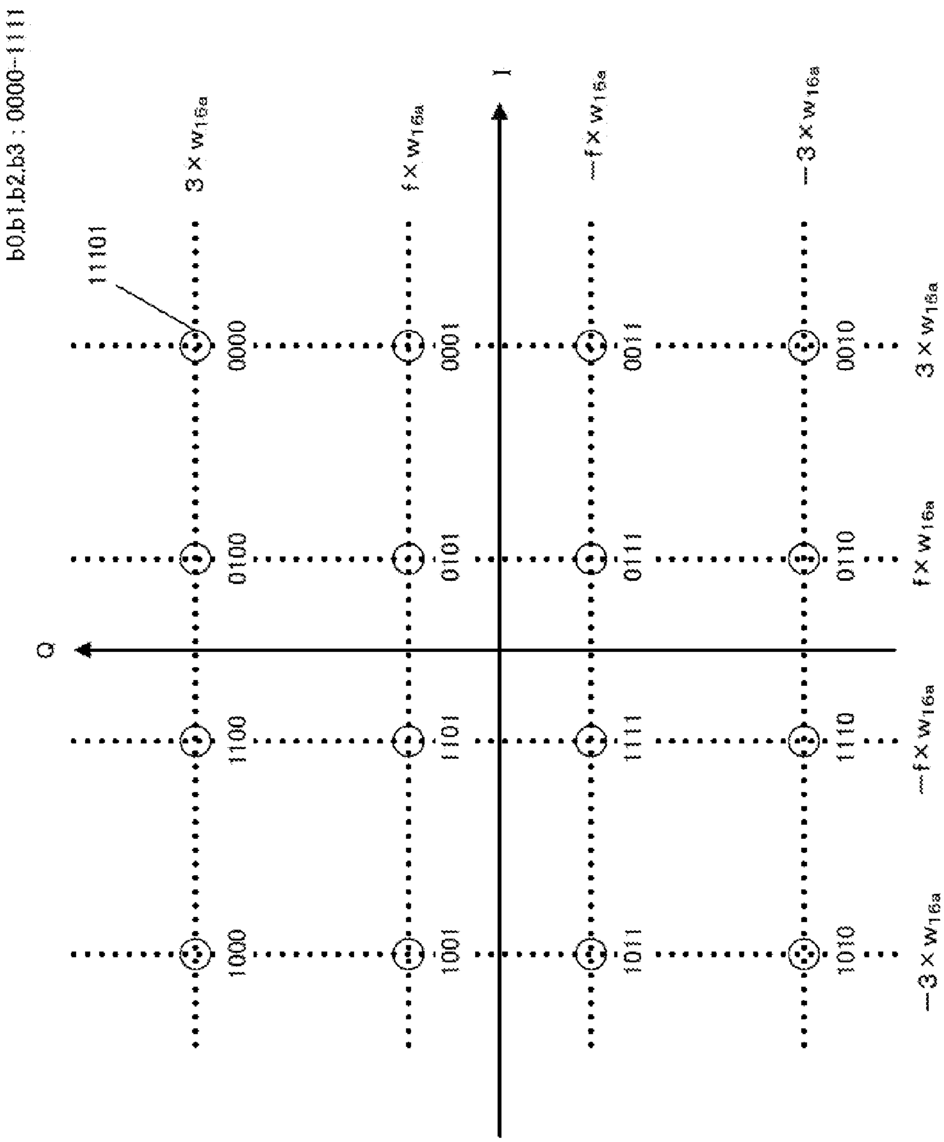
FIG. 111 shows an example of constellation of signal points for 16QAM in the I-Q plane.

A mapping scheme for 16QAM is explained below. FIG. 111 shows an example of a signal point constellation for 16QAM in an I (in-phase)-Q (quadrature(-phase)) plane. In FIG. 111, 16 circles represent signal points for 16QAM, and the horizontal and vertical axes respectively represent I and Q. Also, in FIG. 111, $f>0$ (i.e., f is a real number greater than 0), $f\neq3$, and $f\neq1$ are satisfied.

Coordinates of the 16 signal points (i.e., the circles in FIG. 111) for 16QAM in the I (in-phase)-Q (quadrature(-phase)) plane are $(3\times w_{16a},3\times w_{16a})$, $(3\times w_{16a},f\times w_{16a})$, $(3\times w_{16a},-f\times w_{16a})$, $(3\times w_{16a},-3\times w_{16a})$, $(f\times w_{16a},3\times w_{16a})$, $(f\times w_{16a},f\times w_{16a})$, $(f\times w_{16a},-f\times w_{16a})$, $(f\times w_{16a},-3\times w_{16a})$, $(-f\times w_{16a},3\times w_{16a})$, $(-f\times w_{16a},f\times w_{16a})$, $(-f\times w_{16a},-f\times w_{16a})$, $(-f\times w_{16a},-3\times w_{16a})$, $(-3\times w_{16a},3\times w_{16a})$, $(-3\times w_{16a},f\times w_{16a})$, $(-3\times w_{16a},-f\times w_{16a})$, and $(-3\times w_{16a},-3\times w_{16a})$,
where $w_{16a}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to a signal point 11101 in FIG. 111. When an in-phase component and a quadrature component of a baseband signal obtained as a result of mapping are respectively represented by I and Q, $(I, Q)=(3\times w_{16a}, 3\times w_{16a})$ is satisfied.

That is to say, the in-phase component I and the quadrature component Q of the baseband signal obtained as a result of mapping (at the time of using 16QAM) are determined based on the transmitted bits (i.e., b0, b1, b2, and b3). FIG. 111 shows one example of relationship between values (0000-1111) of the set of b0, b1, b2, and b3, and coordinates of the signal points. In FIG. 111, values 0000-1111 of the set of b0, b1, b2, and b3 are shown directly below the 16 signal points (i.e., the circles in FIG. 111) for 16QAM which are $(3\times w_{16a},3\times w_{16a})$, $(3\times w_{16a},f\times w_{16a})$, $(3\times w_{16a},-f\times w_{16a})$, $(3\times w_{16a},-3\times w_{16a})$, $(f\times w_{16a},3\times w_{16a})$, $(f\times w_{16a},f\times w_{16a})$, $(f\times w_{16a},-f\times w_{16a})$, $(f\times w_{16a},-3\times w_{16a})$, $(-f\times w_{16a},3\times w_{16a})$, $(-f\times w_{16a},f\times w_{16a})$, $(-f\times w_{16a},-f\times w_{16a})$, $(-f\times w_{16a},-3\times w_{16a})$, $(-3\times w_{16a},3\times w_{16a})$, $(-3\times w_{16a},f\times w_{16a})$, $(-3\times w_{16a},-f\times w_{16a})$, and $(-3\times w_{16a},-3\times w_{16a})$. Coordinates in the I (in-phase)-Q (quadrature(-phase)) plane of the signal points (i.e., the circles in FIG. 111) directly above the values 0000-1111 of the set of b0, b1, b2, and b3 indicate the in-phase component I and the quadrature component Q of the baseband signal obtained as a result of mapping. Note that relationship between the values (0000-1111) of the set of b0, b1, b2, and b3, and coordinates of the signal points in 16QAM is not limited to the relationship shown in FIG. 111.

The 16 signal points shown in FIG. 111 are assigned names "signal point 1", "signal point 2", and so on up to "signal point 16". In other words, as there are 16 signal points, signal points 1-16 exist. In the I (in-phase)-Q (quadrature(-phase)) plane, a signal point i is separated from the origin by a distance Di. Thus, $w_{16a}$ can be calculated as shown below.

[Math. 365]

$$w_{16a} = \frac{z}{\sqrt{\frac{\sum_{i=1}^{16} D_i^2}{16}}} = \frac{z}{\sqrt{\frac{((3^2+3^2)\times4+(f^2+f^2)\times4+(f^2+3^2)\times8)}{16}}} \tag{H1}$$

Consequently, the baseband signal obtained as a result of mapping has average power $z^2$.

Note that the in the above explanation, 16QAM is referred to as uniform 16QAM when the same as in Configuration Example R1, and is otherwise referred as non-uniform 16QAM.

Figure 112:
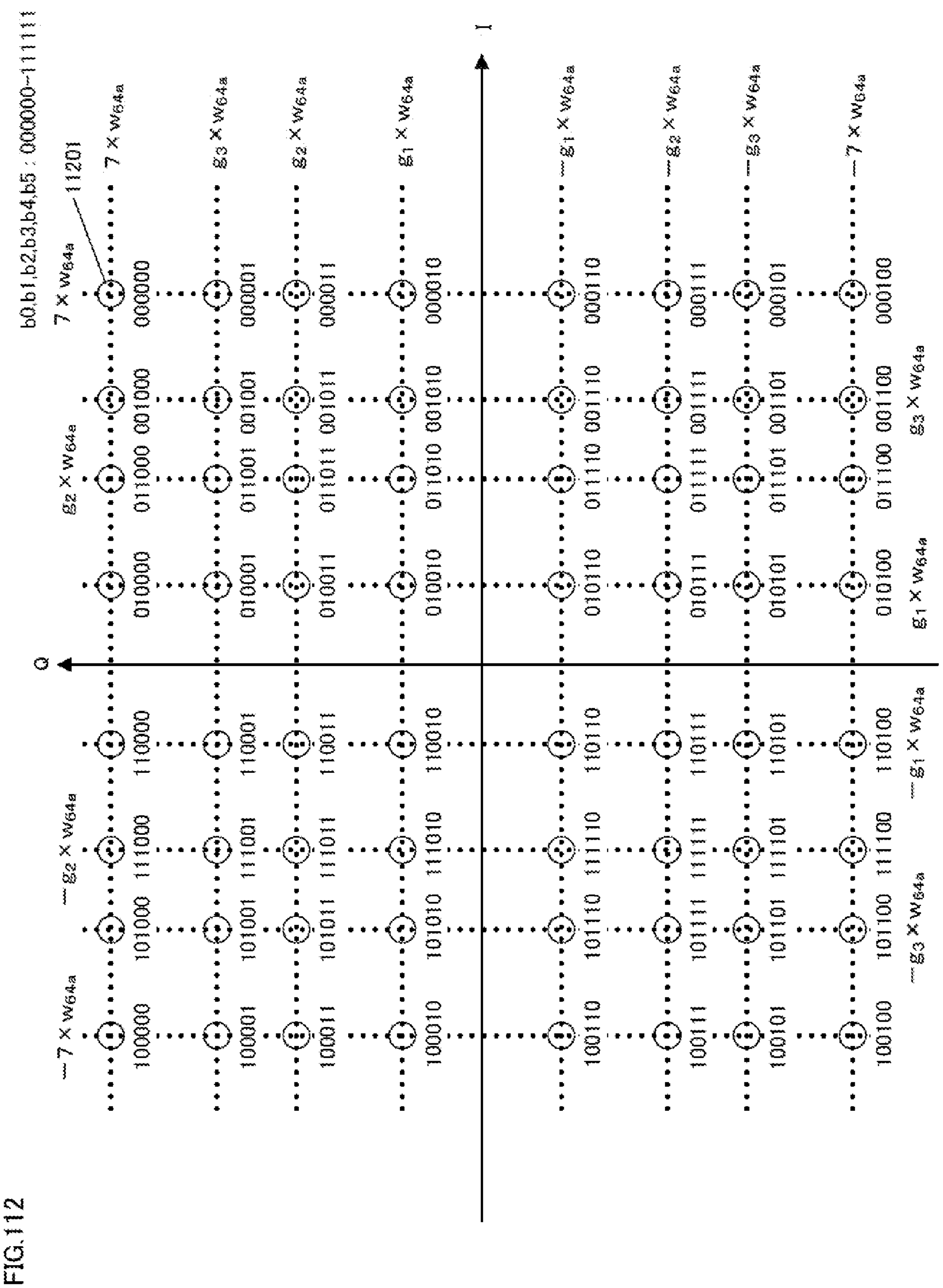
FIG. 112 shows an example of constellation of signal points for 64QAM in the I-Q plane.

A mapping scheme for 64QAM is explained below. FIG. 112 shows an example of a signal point constellation for 64QAM1 in an I (in-phase)-Q (quadrature(-phase)) plane. In FIG. 112, 64 circles represent signal point for 64QAM, and the horizontal and vertical axes represent I and Q respectively. Also, in FIG. 112, $g_1>0$ (i.e., $g_1$ is a real number greater than 0), $g_2>0$ (i.e., $g_2$ is a real number greater than zero), and $g_3>0$ (i.e., $g_3$ is a real number greater than zero), $\{\{g_1\neq7,\ g_2\neq7,\text{ and } g_3\neq7\}$ holds true$\}$, $\{\{(g_1, g_2, g_3)\neq(1, 3, 5), (g_1, g_2, g_3)\neq(1, 5, 3), (g_1, g_2, g_3), (3, 1, 5), (g_1, g_2, g_3)\neq(3, 5, 1), (g_1, g_2, g_3)\neq(5, 1, 3)$, and $(g_1, g_2, g_3)\neq(5, 3, 1)\}$ holds true$\}$, and $\{g_1\neq g_2,\ g_1\neq g_3,\text{ and } g_2\neq g_3\}$ holds true$\}$ are satisfied.

Coordinates of the 64 signal points (i.e., the circles in FIG. 112) for 64QAM in the I (in-phase)-Q (quadrature(-phase)) plane are $(7\times w_{64a},7\times w_{64a})$, $(7\times w_{64a},g_3\times w_{64a})$, $(7\times w_{64a},g_2\times w_{64a})$, $(7\times w_{64a},g_1\times w_{64a})$, $(7\times w_{64a},-g_1\times w_{64a})$, $(7\times w_{64a},-g_2\times w_{64a})$, $(7\times w_{64a},-g_3\times w_{64a})$, $(7\times w_{64a},-7\times w_{64a})$, $(g_3\times w_{64a},7\times w_{64a})$, $(g_3\times w_{64a},g_3\times w_{64a})$, $(g_3\times w_{64a},g_2\times w_{64a})$, $(g_3\times w_{64a},g_1\times w_{64a})$, $(g_3\times w_{64a},-g_1\times w_{64a})$, $(g_3\times w_{64a},-g_2\times w_{64a})$, $(g_3\times w_{64a},-g_3\times w_{64a})$, $(g_3\times w_{64a},-7\times w_{64a})$, $(g_2\times w_{64a},7\times w_{64a})$, $(g_2\times w_{64a},g_3\times w_{64a})$, $(g_2\times w_{64a},g_2\times w_{64a})$, $(g_2\times w_{64a},g_1\times w_{64a})$, $(g_2\times w_{64a},-g_1\times w_{64a})$, $(g_2\times w_{64a},-g_2\times w_{64a})$, $(g_2\times w_{64a},-g_3\times w_{64a})$, $(g_2\times w_{64a},-7\times w_{64a})$, $(g_1\times w_{64a},7\times w_{64a})$, $(g_1\times w_{64a},g_3\times w_{64a})$, $(g_1\times w_{64a},g_2\times w_{64a})$, $(g_1\times w_{64a},g_1\times w_{64a})$, $(g_1\times w_{64a},-g_1\times w_{64a})$, $(g_1\times w_{64a},-g_2\times w_{64a})$, $(g_1\times w_{64a},-g_3\times w_{64a})$, $(g_1\times w_{64a},-7\times w_{64a})$, $(-g_1\times w_{64a},7\times w_{64a})$, $(-g_1\times w_{64a},g_3\times w_{64a})$, $(-g_1\times w_{64a},g_2\times w_{64a})$, $(-g_1\times w_{64a},g_1\times w_{64a})$, $(-g_1\times w_{64a},-g_1\times w_{64a})$, $(-g_1\times w_{64a},-g_2\times w_{64a})$, $(-g_1\times w_{64a},-g_3\times w_{64a})$, $(-g_1\times w_{64a},-7\times w_{64a})$, $(-g_2\times w_{64a},7\times w_{64a})$, $(-g_2\times w_{64a},g_3\times w_{64a})$, $(-g_2\times w_{64a},g_2\times w_{64a})$, $(-g_2\times w_{64a},g_1\times w_{64a})$, $(-g_2\times w_{64a},-g_1\times w_{64a})$, $(-g_2\times w_{64a},-g_2\times w_{64a})$, $(-g_2\times w_{64a},-g_3\times w_{64a})$, $(-g_2\times w_{64a},-7\times w_{64a})$, $(-g_3\times w_{64a},7\times w_{64a})$, $(-g_3\times w_{64a},g_3\times w_{64a})$, $(-g_3\times w_{64a},g_2\times w_{64a})$, $(-g_3\times w_{64a},g_1\times w_{64a})$, $(-g_3\times w_{64a},-g_1\times w_{64a})$, $(-g_3\times w_{64a},-g_2\times w_{64a})$, $(-g_3\times w_{64a},-g_3\times w_{64a})$, $(-g_3\times w_{64a},-7\times w_{64a})$, $(-7\times w_{64a},7\times w_{64a})$, $(-7\times w_{64a},g_3\times w_{64a})$, $(7\times w_{64a},g_2\times w_{64a})$, $(-7\times w_{64a},g_1\times w_{64a})$, $(-7\times w_{64a},-g_1\times w_{64a})$, $(-7\times w_{64a},-g_2\times w_{64a})$, $(-7\times w_{64a},-g_3\times w_{64a})$, and $(-7\times w_{64a},-7\times w_{64a})$, where $w_{64}$ is a real number greater than 0.

Here, transmitted bits (input bits) are represented by b0, b1, b2, b3, b4 and b5. For example, when (b0, b1, b2, b3, b4, b5)=(0, 0, 0, 0, 0, 0) for the transmitted bits, mapping is performed to a signal point 11201 in FIG. 112. When an in-phase component and a quadrature component of a baseband signal obtained as a result of mapping are respectively represented by I and Q, $(I, Q)=(7\times w_{64a}, 7w_{64a})$ is satisfied.

That is to say, the in-phase component I and the quadrature component Q of the baseband signal obtained as a result of mapping (at the time of using 64QAM) are determined based on the transmitted bits (b0, b1, b2, b3, b4, and b5). FIG. 112 shows one example of relationship between values (000000-111111) of the set of b0, b1, b2, b3, b4, and b5, and coordinates of the signal points. In FIG. 112, values 000000-111111 of the set of b0, b2, b3, b4, and b5 are shown directly below the 64 signal points (i.e., the circles in FIG. 112) for 64QAM which are $(7\times w_{64a},7\times w_{64a})$, $(7\times w_{64a},g_3\times w_{64a})$, $(7\times w_{64a},g_2\times w_{64a})$, $(7\times w_{64a},g_1\times w_{64a})$, $(7\times w_{64a},-g_1\times w_{64a})$, $(7\times w_{64a},-g_2\times w_{64a})$, $(7\times w_{64a},-g_3\times w_{64a})$, $(7\times w_{64a},-7\times w_{64a})$, $(g_3\times w_{64a},7\times w_{64a})$, $(g_3\times w_{64a},g_3\times w_{64a})$, $(g_3\times w_{64a},g_2\times w_{64a})$, $(g_3\times w_{64a},g_1\times w_{64a})$, $(g_3\times w_{64a},-g_1\times w_{64a})$, $(g_3\times w_{64a},-g_2\times w_{64a})$, $(g_3\times w_{64a},-g_3\times w_{64a})$, $(g_3\times w_{64a},-7\times w_{64a})$, $(g_2\times w_{64a},7\times w_{64a})$, $(g_2\times w_{64a},g_3\times w_{64a})$, $(g_2\times w_{64a},g_2\times w_{64a})$, $(g_2\times w_{64a},g_1\times w_{64a})$, $(g_2\times w_{64a},-g_1\times w_{64a})$, $(g_2\times w_{64a},-g_2\times w_{64a})$, $(g_2\times w_{64a},-g_3\times w_{64a})$, $(g_2\times w_{64a},-7\times w_{64a})$, $(g_1\times w_{64a},7\times w_{64a})$, $(g_1\times w_{64a},g_3\times w_{64a})$, $(g_1\times w_{64a},g_2\times w_{64a})$, $(g_1\times w_{64a},g_1\times w_{64a})$, $(g_1\times w_{64a},-g_1\times w_{64a})$, $(g_1\times w_{64a},-g_2\times w_{64a})$, $(g_1\times w_{64a},-g_3\times w_{64a})$, $(g_1\times w_{64a},-7\times w_{64a})$, $(-g_1\times w_{64a},7\times w_{64a})$, $(-g_1\times w_{64a},g_3\times w_{64a})$, $(-g_1\times w_{64a},g_2\times w_{64a})$, $(-g_1\times w_{64a},g_1\times w_{64a})$, $(-g_1\times w_{64a},-g_1\times w_{64a})$, $(-g_1\times w_{64a},-g_2\times w_{64a})$, $(-g_1\times w_{64a},-g_3\times w_{64a})$, $(-g_1\times w_{64a},-7\times w_{64a})$, $(-g_2\times w_{64a},7\times w_{64a})$, $(-g_2\times w_{64a},g_3\times w_{64a})$, $(-g_2\times w_{64a},g_2\times w_{64a})$, $(-g_2\times w_{64a},g_1\times w_{64a})$, $(-g_2\times w_{64a},-g_1\times w_{64a})$, $(-g_2\times w_{64a},-g_2\times w_{64a})$, $(-g_2\times w_{64a},-g_3\times w_{64a})$, $(-g_2\times w_{64a},-7\times w_{64a})$, $(-g_3\times w_{64a},7\times w_{64a})$, $(-g_3\times w_{64a},g_3\times w_{64a})$, $(-g_3\times w_{64a},g_2\times w_{64a})$, $(-g_3\times w_{64a},g_1\times w_{64a})$, $(-g_3\times w_{64a},-g_1\times w_{64a})$, $(-g_3\times w_{64a},-g_2\times w_{64a})$, $(-g_3\times w_{64a},-g_3\times w_{64a})$, $(-g_3\times w_{64a},-7\times w_{64a})$, $(-7\times w_{64a},7\times w_{64a})$, $(-7\times w_{64a},g_3\times w_{64a})$, $(7\times w_{64a},g_2\times w_{64a})$, $(-7\times w_{64a},g_1\times w_{64a})$, $(-7\times w_{64a},-g_1\times w_{64a})$, $(-7\times w_{64a},-g_2\times w_{64a})$, $(-7\times w_{64a},-g_3\times w_{64a})$, and $(-7\times w_{64a},-7\times w_{64a})$, Coordinates in the I (in-phase)-Q (quadrature(-phase)) plane of the signal points (i.e., the circles in FIG. 112) directly above the values 000000-111111 of the set of b0, b1, b2, b3, b4, and b5 indicate the in-phase component I and the quadrature component Q of the baseband signal obtained as a result of mapping. Note that relationship between the values (000000-111111) of the set of b0, b1, b2, b3, b4, and b5, and coordinates of the signal points in 64QAM is not limited to the relationship shown in FIG. 112.

The 64 signal points shown in FIG. 112 are assigned names "signal point 1", "signal point 2", and so on up to "signal point 64". In other words, as there are 64 signal points, signal points 1-64 exist. In the I (in-phase)-Q (quadrature(-phase)) plane, a signal point i is separated from the origin by a distance Di. Thus, $w_{64a}$ can be calculated as shown below.

[Math. 366]

$$w_{64a} = \frac{z}{\sqrt{\frac{\sum_{i=1}^{64} D_i^2}{64}}} \tag{H2}$$

Consequently, the baseband signal obtained as a result of mapping has average power $z^2$.

Note that in the above explanation, 64QAM is referred to as uniform 64QAM when the same as in Configuration Example R1, and is otherwise referred as non-uniform 64QAM.

Figure 113:
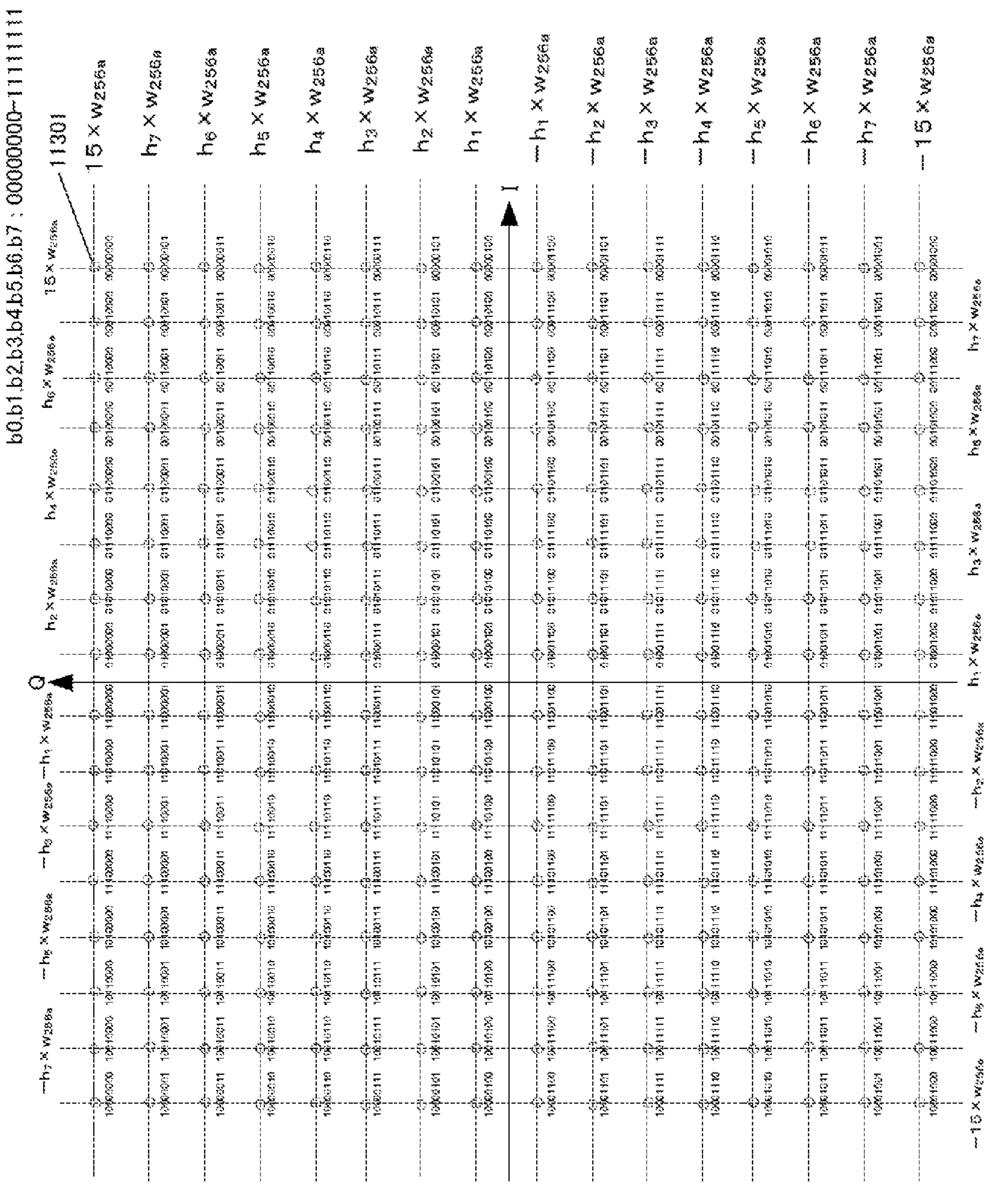
FIG. 113 shows an example of constellation of signal points for 256QAM in the I-Q plane.

A mapping scheme for 256QAM is explained below. FIG. 113 shows an example of a signal point constellation for 256QAM in an I (in-phase)-Q (quadrature(-phase)) plane. In FIG. 113, 256 circles represent signal points for 256QAM, and the horizontal and vertical axes respectively represent I and Q. Also, in FIG. 113, $h_1>0$ (i.e., $h_1$ is a real number greater than 0), $h_2>0$ (i.e., $h_2$ is a real number greater than 0), $h_3>0$ (i.e., $h_3$ is a real number greater than 0), $h_4>0$ (i.e., $h_4$ is a real number greater than 0), $h_5>0$ (i.e., $h_5$ is a real number greater than 0), $h_6>0$ (i.e., $h_6$ is a real number greater than 0), and $h_7>0$ (i.e., $h_7$ is a real number greater than 0), $\{\{h_1\neq 15, h_2\neq 15, h_3\neq 15, h_4\neq 15, h_5\neq 15, h_6\neq 15$, and $h_7\neq 15\}$ holds true$\}$, {when {a1 is an integer greater than 0 and no greater than 7, a2 is an integer greater than 0 and no greater than 7, a3 is an integer greater than 0 and no greater than 7, a4 is an integer greater than 0 and no greater than 7, a5 is an integer greater than 0 and no greater than 7, a6 is an integer greater than 0 and no greater than 7, and a7 is an integer greater than 0 and no greater than 7} and {x is an integer greater than 0 and no greater than 7, and y is an integer greater than 0 and no greater than 7, and satisfying $x\neq y$} hold true, $(h_{a1}, h_{a2}, h_{a3}, h_{a4}, h_{a5}, h_{a6}, h_{a7})\neq(1, 3, 5, 7, 9, 11, 13)$ holds true when $\{ax\neq ay$ holds true for all x and all y$\}\}$, and $\{\{h_1\neq h_2, h_1\neq h_3, h_1\neq h_4, h_1\neq h_5, h_1\neq h_6, h_1\neq h_7,$ $h_2\neq h_3, h_2\neq h_4, h_2\neq h_5, h_2\neq h_6, h_2\neq h_7,$ $h_3\neq h_4, h_3\neq h_5, h_3\neq h_6, h_3\neq h_7,$ $h_4\neq h_5, h_4\neq h_6, h_4\neq h_7,$ $h_5\neq h_6, h_5\neq h_7$, and $h_6\neq h_7\}$ holds true$\}$ are satisfied.

Coordinates of the 256 signal points (i.e., the circles in FIG. 113) for 256QAM in the I (in-phase)-Q (quadrature (-phase)) plane are $(15\times w_{256a},15\times w_{256a})$, $(15\times w_{256a},h_7\times w_{256a})$, $(15\times w_{256a},h_6\times w_{256a})$, $(15\times w_{256a},h_5\times w_{256a})$, $(15\times w_{256a},h_4\times w_{256a})$, $(15\times w_{256a},h_3\times w_{256a})$, $(15\times w_{256a},h_2\times w_{256a})$, $(15\times w_{256a},h_1\times w_{256a})$, $(15\times w_{256a},-15\times w_{256a})$, $(15\times w_{256a},-h_7\times w_{256a})$, $(15\times w_{256a},-h_6\times w_{256a})$, $(15\times w_{256a},-h_5\times w_{256a})$, $(15\times w_{256a},-h_4\times w_{256a})$, $(15\times w_{256a},-h_3\times w_{256a})$, $(15\times w_{256a},-h_2\times w_{256a})$, $(15\times w_{256a},-h_1\times w_{256a})$, $(h_7\times w_{256a},15\times w_{256a})$, $(h_7\times w_{256a},h_7\times w_{256a})$, $(h_7\times w_{256a},h_6\times w_{256a})$, $(h_7\times w_{256a},h_5\times w_{256a})$, $(h_7\times w_{256a},h_4\times w_{256a})$, $(h_7\times w_{256a},h_3\times w_{256a})$, $(h_7\times w_{256a},h_2\times w_{256a})$, $(h_7\times w_{256a},h_1\times w_{256a})$, $(h_7\times w_{256a},-15\times w_{256a})$, $(h_7\times w_{256a},-h_7\times w_{256a})$, $(h_7\times w_{256a},-h_6\times w_{256a})$, $(h_7\times w_{256a},-h_5\times w_{256a})$, $(h_7\times w_{256a},-h_4\times w_{256a})$, $(h_7\times w_{256a},-h_3\times w_{256a})$, $(h_7\times w_{256a},-h_2\times w_{256a})$, $(h_7\times w_{256a},-h_1\times w_{256a})$, $(h_6\times w_{256a}, 15\times w_{256a})$, $(h_6\times w_{256a},h_7\times w_{256a})$, $(h_6\times w_{256a},h_6\times w_{256a})$, $(h_6\times w_{256a},h_5\times w_{256a})$, $(h_6\times w_{256a},h_4\times w_{256a})$, $(h_6\times w_{256a},h_3\times w_{256a})$, $(h_6\times w_{256a},h_2\times w_{256a})$, $(h_6\times w_{256a},h_1\times w_{256a})$, $(h_6\times w_{256a},-15\times w_{256a})$, $(h_6\times w_{256a},-h_7\times w_{256a})$, $(h_6\times w_{256a},-h_6\times w_{256a})$, $(h_6\times w_{256a},-h_5\times w_{256a})$, $(h_6\times w_{256a},-h_4\times w_{256a})$, $(h_6\times w_{256a},-h_3\times w_{256a})$, $(h_6\times w_{256a},-h_2\times w_{256a})$, $(h_6\times w_{256a},-h_1\times w_{256a})$, $(h_5\times w_{256a},15\times w_{256a})$, $(h_5\times w_{256a},h_7\times w_{256a})$, $(h_5\times w_{256a},h_6\times w_{256a})$, $(h_5\times w_{256a},h_5\times w_{256a})$, $(h_5\times w_{256a},h_4\times w_{256a})$, $(h_5\times w_{256a},h_3\times w_{256a})$, $(h_5\times w_{256a},h_2\times w_{256a})$, $(h_5\times w_{256a},h_1\times w_{256a})$, $(h_5\times w_{256a},-15\times w_{256a})$, $(h_5\times w_{256a},-h_7\times w_{256a})$, $(h_5\times w_{256a},-h_6\times w_{256a})$, $(h_5\times w_{256a},-h_5\times w_{256a})$, $(h_5\times w_{256a},-h_4\times w_{256a})$, $(h_5\times w_{256a},-h_3\times w_{256a})$, $(h_5\times w_{256a},-h_2\times w_{256a})$, $(h_5\times w_{256a},-h_1\times w_{256a})$, $(h_4\times w_{256a},15\times w_{256a})$, $(h_4\times w_{256a},h_7\times w_{256a})$, $(h_4\times w_{256a},h_6\times w_{256a})$, $(h_4\times w_{256a},h_5\times w_{256a})$, $(h_4\times w_{256a},h_4\times w_{256a})$, $(h_4\times w_{256a},h_3\times w_{256a})$, $(h_4\times w_{256a},h_2\times w_{256a})$, $(h_4\times w_{256a},h_1\times w_{256a})$, $(h_4\times w_{256a},-15\times w_{256a})$, $(h_4\times w_{256a},-h_7\times w_{256a})$, $(h_4\times w_{256a},-h_6\times w_{256a})$, $(h_4\times w_{256a},-h_5\times w_{256a})$, $(h_4\times w_{256a},-h_4\times w_{256a})$, $(h_4\times w_{256a},-h_3\times w_{256a})$, $(h_4\times w_{256a},-h_2\times w_{256a})$, $(h_4\times w_{256a},-h_1\times w_{256a})$, $(h_3\times w_{256a},15\times w_{256a})$, $(h_3\times w_{256a},h_7\times w_{256a})$, $(h_3\times w_{256a},h_6\times w_{256a})$, $(h_3\times w_{256a},h_5\times w_{256a})$, $(h_3\times w_{256a},h_4\times w_{256a})$, $(h_3\times w_{256a},h_3\times w_{256a})$, $(h_3\times w_{256a},h_2\times w_{256a})$, $(h_3\times w_{256a},h_1\times w_{256a})$, $(h_3\times w_{256a},15\times w_{256a})$, $(h_3\times w_{256a},-h_7\times w_{256a})$, $(h_3\times w_{256a},-h_6\times w_{256a})$, $(h_3\times w_{256a},-h_5\times w_{256a})$, $(h_3\times w_{256a},-h_4\times w_{256a})$, $(h_3\times w_{256a},-h_3\times w_{256a})$, $(h_3\times w_{256a},-h_2\times w_{256a})$, $(h_3\times w_{256a},-h_1\times w_{256a})$, $(h_2\times w_{256a}, 15\times w_{256a})$, $(h_2\times w_{256a}, h_7\times w_{256a})$, $(h_2\times w_{256a}, h_6\times w_{256a})$, $(h_2\times w_{256a}, h_5\times w_{256a})$, $(h_2\times w_{256a}, h_4\times w_{256a})$, $(h_2\times w_{256a}, h_3\times w_{256a})$, $(h_2\times w_{256a}, h_2\times w_{256a})$, $(h_2\times w_{256a}, h_1\times w_{256a})$, $(h_2\times w_{256a}, -15\times w_{256a})$, $(h_2\times w_{256a}, -h_7\times w_{256a})$, $(h_2\times w_{256a}, -h_6\times w_{256a})$, $(h_2\times w_{256a}, -h_5\times w_{256a})$, $(h_2\times w_{256a}, -h_4\times w_{256a})$, $(h_2\times w_{256a}, -h_3\times w_{256a})$, $(h_2\times w_{256a}, -h_2\times w_{256a})$, $(h_2\times w_{256a}, -h_1\times w_{256a})$, $(h_1\times w_{256a}, 15\times w_{256a})$, $(h_1\times w_{256a}, h_7\times w_{256a})$, $(h_1\times w_{256a}, h_6\times w_{256a})$, $(h_1\times w_{256a}, h_5\times w_{256a})$, $(h_1\times w_{256a}, h_4\times w_{256a})$, $(h_1\times w_{256a}, h_3\times w_{256a})$, $(h_1\times w_{256a}, h_2\times w_{256a})$, $(h_1\times w_{256a}, h_1\times w_{256a})$, $(h_1\times w_{256a}, -15\times w_{256a})$, $(h_1\times w_{256a}, -h_7\times w_{256a})$, $(h_1\times w_{256a}, -h_6\times w_{256a})$, $(h_1\times w_{256a}, -h_5\times w_{256a})$, $(h_1\times w_{256a}, -h_4\times w_{256a})$, $(h_1\times w_{256a}, -h_3\times w_{256a})$, $(h_1\times w_{256a}, -h_2\times w_{256a})$, $(h_1\times w_{256a}, -h_1\times w_{256a})$, $(-15\times w_{256a}, -15\times w_{256a})$, $(-15\times w_{256a}, h_7\times w_{256a})$, $(-15\times w_{256a}, h_6\times w_{256a})$, $(-15\times w_{256a}, h_5\times w_{256a})$, $(-15\times w_{256a}, h_4\times w_{256a})$, $(-15\times w_{256a}, h_3\times w_{256a})$, $(-15\times w_{256a}, h_2\times w_{256a})$, $(-15\times w_{256a}, h_1\times w_{256a})$, $(-15\times w_{256a}, -15\times w_{256a})$, $(-15\times w_{256a}, -h_7\times w_{256a})$, $(-15\times w_{256a}, -h_6\times w_{256a})$, $(-15\times w_{256a}, -h_5\times w_{256a})$, $(-15\times w_{256a}, -h_4\times w_{256a})$, $(-15\times w_{256a}, -h_3\times w_{256a})$, $(-15\times w_{256a}, -h_2\times w_{256a})$, $(-15\times w_{256a}, -h_1\times w_{256a})$, $(-h_7\times w_{256a}, 15\times w_{256a})$, $(-h_7\times w_{256a}, h_7\times w_{256a})$, $(-h_7\times w_{256a}, h_6\times w_{256a})$, $(-h_7\times w_{256a}, h_5\times w_{256a})$, $(-h_7\times w_{256a}, h_4\times w_{256a})$, $(-h_7\times w_{256a}, h_3\times w_{256a})$, $(-h_7\times w_{256a}, h_2\times w_{256a})$, $(-h_7\times w_{256a}, h_1\times w_{256a})$, $(-h_7\times w_{256a}, -15\times w_{256a})$, $(-h_7\times w_{256a}, -h_7\times w_{256a})$, $(-h_7\times w_{256a}, -h_6\times w_{256a})$, $(-h_7\times w_{256a}, -h_5\times w_{256a})$, $(-h_7\times w_{256a}, -h_4\times w_{256a})$, $(-h_7\times w_{256a}, -h_3\times w_{256a})$, $(-h_7\times w_{256a}, -h_2\times w_{256a})$, $(-h_7\times w_{256a}, -h_1\times w_{256a})$, $(-h_6\times w_{256a}, 15\times w_{256a})$, $(-h_6\times w_{256a}, h_7\times w_{256a})$, $(-h_6\times w_{256a}, h_6\times w_{256a})$, $(-h_6\times w_{256a}, h_5\times w_{256a})$, $(-h_6\times w_{256a}, h_4\times w_{256a})$, $(-h_6\times w_{256a}, h_3\times w_{256a})$, $(-h_6\times w_{256a}, h_2\times w_{256a})$, $(-h_6\times w_{256a}, h_1\times w_{256a})$, $(-h_6\times w_{256a}, -15\times w_{256a})$, $(-h_6\times w_{256a}, -h_7\times w_{256a})$, $(-h_6\times w_{256a}, -h_6\times w_{256a})$, $(-h_6\times w_{256a}, -h_5\times w_{256a})$, $(-h_6\times w_{256a}, -h_4\times w_{256a})$, $(-h_6\times w_{256a}, -h_3\times w_{256a})$, $(-h_6\times w_{256a}, -h_2\times w_{256a})$, $(-h_6\times w_{256a}, -h_1\times w_{256a})$, $(-h_5\times w_{256a}, 15\times w_{256a})$, $(-h_5\times w_{256a}, h_7\times w_{256a})$, $(-h_5\times w_{256a}, h_6\times w_{256a})$, $(-h_5\times w_{256a}, h_5\times w_{256a})$, $(-h_5\times w_{256a}, h_4\times w_{256a})$, $(-h_5\times w_{256a}, h_3\times w_{256a})$, $(-h_5\times w_{256a}, h_2\times w_{256a})$, $(-h_5\times w_{256a}, h_1\times w_{256a})$, $(-h_5\times w_{256a}, -15\times w_{256a})$, $(-h_5\times w_{256a}, -h_7\times w_{256a})$, $(-h_5\times w_{256a}, -h_6\times w_{256a})$, $(-h_5\times w_{256a}, -h_5\times w_{256a})$, $(-h_5\times w_{256a}, -h_4\times w_{256a})$, $(-h_5\times w_{256a}, -h_3\times w_{256a})$, $(-h_5\times w_{256a}, -h_2\times w_{256a})$, $(-h_5\times w_{256a}, -h_1\times w_{256a})$, $(-h_4\times w_{256a}, 15\times w_{256a})$, $(-h_4\times w_{256a}, h_7\times w_{256a})$, $(-h_4\times w_{256a}, h_6\times w_{256a})$, $(-h_4\times w_{256a}, h_5\times w_{256a})$, $(-h_4\times w_{256a}, h_4\times w_{256a})$, $(-h_4\times w_{256a}, h_3\times w_{256a})$, $(-h_4\times w_{256a}, h_2\times w_{256a})$, $(-h_4\times w_{256a}, h_1\times w_{256a})$, $(-h_4\times w_{256a}, -15\times w_{256a})$, $(-h_4\times w_{256a}, -h_7\times w_{256a})$, $(-h_4\times w_{256a}, -h_6\times w_{256a})$, $(-h_4\times w_{256a}, -h_5\times w_{256a})$, $(-h_4\times w_{256a}, -h_4\times w_{256a})$, $(-h_4\times w_{256a}, -h_3\times w_{256a})$, $(-h_4\times w_{256a}, -h_2\times w_{256a})$, $(-h_4\times w_{256a}, -h_1\times w_{256a})$, $(-h_3\times w_{256a}, 15\times w_{256a})$, $(-h_3\times w_{256a}, h_7\times w_{256a})$, $(-h_3\times w_{256a}, h_6\times w_{256a})$, $(-h_3\times w_{256a}, h_5\times w_{256a})$, $(-h_3\times w_{256a}, h_4\times w_{256a})$, $(-h_3\times w_{256a}, h_3\times w_{256a})$, $(-h_3\times w_{256a}, h_2\times w_{256a})$, $(-h_3\times w_{256a}, h_1\times w_{256a})$, $(-h_3\times w_{256a}, 15\times w_{256a})$, $(-h_3\times w_{256a}, -h_7\times w_{256a})$, $(-h_3\times w_{256a}, -h_6\times w_{256a})$, $(-h_3\times w_{256a}, -h_5\times w_{256a})$, $(-h_3\times w_{256a}, -h_4\times w_{256a})$, $(-h_3\times w_{256a}, -h_3\times w_{256a})$, $(-h_3\times w_{256a}, -h_2\times w_{256a})$, $(-h_3\times w_{256a}, -h_1\times w_{256a})$, $(-h_2\times w_{256a}, 15\times w_{256a})$, $(-h_2\times w_{256a}, h_7\times w_{256a})$, $(-h_2\times w_{256a}, h_6\times w_{256a})$, $(-h_2\times w_{256a}, h_5\times w_{256a})$, $(-h_2\times w_{256a}, h_4\times w_{256a})$, $(-h_2\times w_{256a}, h_3\times w_{256a})$, $(-h_2\times w_{256a}, h_2\times w_{256a})$, $(-h_2\times w_{256a}, h_1\times w_{256a})$, $(-h_2\times w_{256a}, -15\times w_{256a})$, $(-h_2\times w_{256a}, -h_7\times w_{256a})$, $(-h_2\times w_{256a}, -h_6\times w_{256a})$, $(-h_2\times w_{256a}, -h_5\times w_{256a})$, $(-h_2\times w_{256a}, -h_4\times w_{256a})$, $(-h_2\times w_{256a}, -h_3\times w_{256a})$, $(-h_2\times w_{256a}, -h_2\times w_{256a})$, $(-h_2\times w_{256a}, -h_1\times w_{256a})$, $(-h_1\times w_{256a}, 15\times w_{256a})$, $(-h_1\times w_{256a}, h_7\times w_{256a})$, $(-h_1\times w_{256a}, h_6\times w_{256a})$, $(-h_1\times w_{256a}, h_5\times w_{256a})$, $(-h_1\times w_{256a}, h_4\times w_{256a})$, $(-h_1\times w_{256a}, h_3\times w_{256a})$, $(-h_1\times w_{256a}, h_2\times w_{256a})$, $(-h_1\times w_{256a}, h_1\times w_{256a})$, $(-h_1\times w_{256a}, -15\times w_{256a})$, $(-h_1\times w_{256a}, -h_7\times w_{256a})$, $(-h_1\times w_{256a}, -h_6\times w_{256a})$, $(-h_1\times w_{256a}, -h_5\times w_{256a})$, $(-h_1\times w_{256a}, -h_4\times w_{256a})$, $(-h_1\times w_{256a}, -h_3\times w_{256a})$, $(-h_1\times w_{256a}, -h_2\times w_{256a})$, $(-h_1\times w_{256a}, -h_1\times w_{256a})$, where $w_{256a}$, is a real number greater than 0.

Here, transmitted bits (input bits) are represented by b0, b1, b2, b3, b4, b5, b6, and b7. For example, when (b0, b1, b2, b3, b4, b5, b6, b7)=(0, 0, 0, 0, 0, 0, 0, 0) for the transmitted bits, mapping is performed to a signal point 11301 in FIG. 113. When an in-phase component and a quadrature component of a baseband signal obtained as a result of mapping are respectively represented by I and Q, $(I, Q)=(15\times w_{256a}, 15\times w_{256a})$ is satisfied.

That is to say, the in-phase component I and the quadrature component Q of the baseband signal obtained as a result of mapping (at the time of using 256QAM) are determined based on the transmitted bits (b0, b1, b2, b3, b4, b5, b6, and b7). FIG. 113 shows one example of relationship between values (00000000-11111111) of the set of b0, b1, b2, b3, b4, b5, b6, and b7, and coordinates of the signal points. In FIG. 113, values 00000000-11111111 of the set of b0, b1, b2, b3, b4, b5, b6, and b7 are shown directly below the 256 signal points (i.e., the circles in FIG. 113) for 256QAM which are $(15\times w_{256a}, 15\times w_{256a})$, $(15\times w_{256a}, h_7\times w_{256a})$, $(15\times w_{256a}, h_6\times w_{256a})$, $(15\times w_{256a}, h_5\times w_{256a})$, $(15\times w_{256a}, h_4\times w_{256a})$, $(15\times w_{256a}, h_3\times w_{256a})$, $(15\times w_{256a}, h_2\times w_{256a})$, $(15\times w_{256a}, h_1\times w_{256a})$, $(15\times w_{256a}, -15\times w_{256a})$, $(15\times w_{256a}, -h_7\times w_{256a})$, $(15\times w_{256a}, -h_6\times w_{256a})$, $(15\times w_{256a}, -h_5\times w_{256a})$, $(15\times w_{256a}, -h_4\times w_{256a})$, $(15\times w_{256a}, -h_3\times w_{256a})$, $(15\times w_{256a}, -h_2\times w_{256a})$, $(15\times w_{256a}, -h_1\times w_{256a})$, $(h_7\times w_{256a}, 15\times w_{256a})$, $(h_7\times w_{256a}, h_7\times w_{256a})$, $(h_7\times w_{256a}, h_6\times w_{256a})$, $(h_7\times w_{256a}, h_5\times w_{256a})$, $(h_7\times w_{256a}, h_4\times w_{256a})$, $(h_7\times w_{256a}, h_3\times w_{256a})$, $(h_7\times w_{256a}, h_2\times w_{256a})$, $(h_7\times w_{256a}, h_1\times w_{256a})$, $(h_7\times w_{256a}, -15\times w_{256a})$, $(h_7\times w_{256a}, -h_7\times w_{256a})$, $(h_7\times w_{256a}, -h_6\times w_{256a})$, $(h_7\times w_{256a}, -h_5\times w_{256a})$, $(h_7\times w_{256a}, -h_4\times w_{256a})$, $(h_7\times w_{256a}, -h_3\times w_{256a})$, $(h_7\times w_{256a}, -h_2\times w_{256a})$, $(h_7\times w_{256a}, -h_1\times w_{256a})$, $(h_6\times w_{256a}, 15\times w_{256a})$, $(h_6\times w_{256a}, h_7\times w_{256a})$, $(h_6\times w_{256a}, h_6\times w_{256a})$, $(h_6\times w_{256a}, h_5\times w_{256a})$, $(h_6\times w_{256a}, h_4\times w_{256a})$, $(h_6\times w_{256a}, h_3\times w_{256a})$, $(h_6\times w_{256a}, h_2\times w_{256a})$, $(h_6\times w_{256a}, h_1\times w_{256a})$, $(h_6\times w_{256a}, -15\times w_{256a})$, $(h_6\times w_{256a}, -h_7\times w_{256a})$, $(h_6\times w_{256a}, -h_6\times w_{256a})$, $(h_6\times w_{256a}, -h_5\times w_{256a})$, $(h_6\times w_{256a}, -h_4\times w_{256a})$, $(h_6\times w_{256a}, -h_3\times w_{256a})$, $(h_6\times w_{256a}, -h_2\times w_{256a})$, $(h_6\times w_{256a}, -h_1\times w_{256a})$, $(h_5\times w_{256a}, 15\times w_{256a})$, $(h_5\times w_{256a}, h_7\times w_{256a})$, $(h_5\times w_{256a}, h_6\times w_{256a})$, $(h_5\times w_{256a}, h_5\times w_{256a})$, $(h_5\times w_{256a}, h_4\times w_{256a})$, $(h_5\times w_{256a}, h_3\times w_{256a})$, $(h_5\times w_{256a}, h_2\times w_{256a})$, $(h_5\times w_{256a}, h_1\times w_{256a})$, $(h_5\times w_{256a}, -15\times w_{256a})$, $(h_5\times w_{256a}, -h_7\times w_{256a})$, $(h_5\times w_{256a}, -h_6\times w_{256a})$, $(h_5\times w_{256a}, -h_5\times w_{256a})$, $(h_5\times w_{256a}, -h_4\times w_{256a})$, $(h_5\times w_{256a}, -h_3\times w_{256a})$, $(h_5\times w_{256a}, -h_2\times w_{256a})$, $(h_5\times w_{256a}, -h_1\times w_{256a})$, $(h_4\times w_{256a}, 15\times w_{256a})$, $(h_4\times w_{256a}, h_7\times w_{256a})$, $(h_4\times w_{256a}, h_6\times w_{256a})$, $(h_4\times w_{256a}, h_5\times w_{256a})$, $(h_4\times w_{256a}, h_4\times w_{256a})$, $(h_4\times w_{256a}, h_3\times w_{256a})$, $(h_4\times w_{256a}, h_2\times w_{256a})$, $(h_4\times w_{256a}, h_1\times w_{256a})$, $(h_4\times w_{256a}, -15\times w_{256a})$, $(h_4\times w_{256a}, -h_7\times w_{256a})$, $(h_4\times w_{256a}, -h_6\times w_{256a})$, $(h_4\times w_{256a}, -h_5\times w_{256a})$, $(h_4\times w_{256a}, -h_4\times w_{256a})$, $(h_4\times w_{256a}, -h_3\times w_{256a})$, $(h_4\times w_{256a}, -h_2\times w_{256a})$, $(h_4\times w_{256a}, -h_1\times w_{256a})$, $(h_3\times w_{256a},15\times w_{256a})$, $(h_3\times w_{256a},h_7\times w_{256a})$, $(h_3\times w_{256a},h_6\times w_{256a})$, $(h_3\times w_{256a},h_5\times w_{256a})$, $(h_3\times w_{256a},h_4\times w_{256a})$, $(h_3\times w_{256a},h_3\times w_{256a})$, $(h_3\times w_{256a},h_2\times w_{256a})$, $(h_3\times w_{256a},h_1\times w_{256a})$, $(h_3\times w_{256a},15\times w_{256a})$, $(h_3\times w_{256a},-h_7\times w_{256a})$, $(h_3\times w_{256a},-h_6\times w_{256a})$, $(h_3\times w_{256a},-h_5\times w_{256a})$, $(h_3\times w_{256a},-h_4\times w_{256a})$, $(h_3\times w_{256a},-h_3\times w_{256a})$, $(h_3\times w_{256a},-h_2\times w_{256a})$, $(h_3\times w_{256a},-h_1\times w_{256a})$, $(h_2\times w_{256a},15\times w_{256a})$, $(h_2\times w_{256a},h_7\times w_{256a})$, $(h_2\times w_{256a},h_6\times w_{256a})$, $(h_2\times w_{256a},h_5\times w_{256a})$, $(h_2\times w_{256a},h_4\times w_{256a})$, $(h_2\times w_{256a},h_3\times w_{256a})$, $(h_2\times w_{256a},h_2\times w_{256a})$, $(h_2\times w_{256a},h_1\times w_{256a})$, $(h_2\times w_{256a},-15\times w_{256a})$, $(h_2\times w_{256a},-h_7\times w_{256a})$, $(h_2\times w_{256a},-h_6\times w_{256a})$, $(h_2\times w_{256a},-h_5\times w_{256a})$, $(h_2\times w_{256a},-h_4\times w_{256a})$, $(h_2\times w_{256a},-h_3\times w_{256a})$, $(h_2\times w_{256a},-h_2\times w_{256a})$, $(h_2\times w_{256a},-h_1\times w_{256a})$, $(h_1\times w_{256a},15\times w_{256a})$, $(h_1\times w_{256a},h_7\times w_{256a})$, $(h_1\times w_{256a},h_6\times w_{256a})$, $(h_1\times w_{256a},h_5\times w_{256a})$, $(h_1\times w_{256a},h_4\times w_{256a})$, $(h_1\times w_{256a},h_3\times w_{256a})$, $(h_1\times w_{256a},h_2\times w_{256a})$, $(h_1\times w_{256a},h_1\times w_{256a})$, $(h_1\times w_{256a},-15\times w_{256a})$, $(h_1\times w_{256a},-h_7\times w_{256a})$, $(h_1\times w_{256a},-h_6\times w_{256a})$, $(h_1\times w_{256a},-h_5\times w_{256a})$, $(h_1\times w_{256a},-h_4\times w_{256a})$, $(h_1\times w_{256a},-h_3\times w_{256a})$, $(h_1\times w_{256a},-h_2\times w_{256a})$, $(h_1\times w_{256a},-h_1\times w_{256a})$, $(-15\times w_{256a},-15\times w_{256a})$, $(-15\times w_{256a},h_7\times w_{256a})$, $(-15\times w_{256a},h_6\times w_{256a})$, $(-15\times w_{256a},h_5\times w_{256a})$, $(-15\times w_{256a},h_4\times w_{256a})$, $(-15\times w_{256a},h_3\times w_{256a})$, $(-15\times w_{256a},h_2\times w_{256a})$, $(-15\times w_{256a},h_1\times w_{256a})$, $(-15\times w_{256a},-15\times w_{256a})$, $(-15\times w_{256a},-h_7\times w_{256a})$, $(-15\times w_{256a},-h_6\times w_{256a})$, $(-15\times w_{256a},-h_5\times w_{256a})$, $(-15\times w_{256a},-h_4\times w_{256a})$, $(-15\times w_{256a},-h_3\times w_{256a})$, $(-15\times w_{256a},-h_2\times w_{256a})$, $(-15\times w_{256a},-h_1\times w_{256a})$, $(-h_7\times w_{256a},15\times w_{256a})$, $(-h_7\times w_{256a},h_7\times w_{256a})$, $(-h_7\times w_{256a},h_6\times w_{256a})$, $(-h_7\times w_{256a},h_5\times w_{256a})$, $(-h_7\times w_{256a},h_4\times w_{256a})$, $(-h_7\times w_{256a},h_3\times w_{256a})$, $(-h_7\times w_{256a},h_2\times w_{256a})$, $(-h_7\times w_{256a},h_1\times w_{256a})$, $(-h_7\times w_{256a},-15\times w_{256a})$, $(-h_7\times w_{256a},-h_7\times w_{256a})$, $(-h_7\times w_{256a},-h_6\times w_{256a})$, $(-h_7\times w_{256a},-h_5\times w_{256a})$, $(-h_7\times w_{256a},-h_4\times w_{256a})$, $(-h_7\times w_{256a},-h_3\times w_{256a})$, $(-h_7\times w_{256a},-h_2\times w_{256a})$, $(-h_7\times w_{256a},-h_1\times w_{256a})$, $(-h_6\times w_{256a},15\times w_{256a})$, $(-h_6\times w_{256a},h_7\times w_{256a})$, $(-h_6\times w_{256a},h_6\times w_{256a})$, $(-h_6\times w_{256a},h_5\times w_{256a})$, $(-h_6\times w_{256a},h_4\times w_{256a})$, $(-h_6\times w_{256a},h_3\times w_{256a})$, $(-h_6\times w_{256a},h_2\times w_{256a})$, $(-h_6\times w_{256a},h_1\times w_{256a})$, $(-h_6\times w_{256a},-15\times w_{256a})$, $(-h_6\times w_{256a},-h_7\times w_{256a})$, $(-h_6\times w_{256a},-h_6\times w_{256a})$, $(-h_6\times w_{256a},-h_5\times w_{256a})$, $(-h_6\times w_{256a},-h_4\times w_{256a})$, $(-h_6\times w_{256a},-h_3\times w_{256a})$, $(-h_6\times w_{256a},-h_2\times w_{256a})$, $(-h_6\times w_{256a},-h_1\times w_{256a})$, $(-h_5\times w_{256a},15\times w_{256a})$, $(-h_5\times w_{256a},h_7\times w_{256a})$, $(-h_5\times w_{256a},h_6\times w_{256a})$, $(-h_5\times w_{256a},h_5\times w_{256a})$, $(-h_5\times w_{256a},h_4\times w_{256a})$, $(-h_5\times w_{256a},h_3\times w_{256a})$, $(-h_5\times w_{256a},h_2\times w_{256a})$, $(-h_5\times w_{256a},h_1\times w_{256a})$, $(-h_5\times w_{256a},-15\times w_{256a})$, $(-h_5\times w_{256a},-h_7\times w_{256a})$, $(-h_5\times w_{256a},-h_6\times w_{256a})$, $(-h_5\times w_{256a},-h_5\times w_{256a})$, $(-h_5\times w_{256a},-h_4\times w_{256a})$, $(-h_5\times w_{256a},-h_3\times w_{256a})$, $(-h_5\times w_{256a},-h_2\times w_{256a})$, $(-h_5\times w_{256a},-h_1\times w_{256a})$, $(-h_4\times w_{256a},15\times w_{256a})$, $(-h_4\times w_{256a},h_7\times w_{256a})$, $(-h_4\times w_{256a},h_6\times w_{256a})$, $(-h_4\times w_{256a},h_5\times w_{256a})$, $(-h_4\times w_{256a},h_4\times w_{256a})$, $(-h_4\times w_{256a},h_3\times w_{256a})$, $(-h_4\times w_{256a},h_2\times w_{256a})$, $(-h_4\times w_{256a},h_1\times w_{256a})$, $(-h_4\times w_{256a},-15\times w_{256a})$, $(-h_4\times w_{256a},-h_7\times w_{256a})$, $(-h_4\times w_{256a},-h_6\times w_{256a})$, $(-h_4\times w_{256a},-h_5\times w_{256a})$, $(-h_4\times w_{256a},-h_4\times w_{256a})$, $(-h_4\times w_{256a},-h_3\times w_{256a})$, $(-h_4\times w_{256a},-h_2\times w_{256a})$, $(-h_4\times w_{256a},-h_1\times w_{256a})$, $(-h_3\times w_{256a},15\times w_{256a})$, $(-h_3\times w_{256a},h_7\times w_{256a})$, $(-h_3\times w_{256a},h_6\times w_{256a})$, $(-h_3\times w_{256a},h_5\times w_{256a})$, $(-h_3\times w_{256a},h_4\times w_{256a})$, $(-h_3\times w_{256a},h_3\times w_{256a})$, $(-h_3\times w_{256a},h_2\times w_{256a})$, $(-h_3\times w_{256a},h_1\times w_{256a})$, $(-h_3\times w_{256a},15\times w_{256a})$, $(-h_3\times w_{256a},-h_7\times w_{256a})$, $(-h_3\times w_{256a},-h_6\times w_{256a})$, $(-h_3\times w_{256a},-h_5\times w_{256a})$, $(-h_3\times w_{256a},-h_4\times w_{256a})$, $(-h_3\times w_{256a},-h_3\times w_{256a})$, $(-h_3\times w_{256a},-h_2\times w_{256a})$, $(-h_3\times w_{256a},-h_1\times w_{256a})$, $(-h_2\times w_{256a},15\times w_{256a})$, $(-h_2\times w_{256a},h_7\times w_{256a})$, $(-h_2\times w_{256a},h_6\times w_{256a})$, $(-h_2\times w_{256a},h_5\times w_{256a})$, $(-h_2\times w_{256a},h_4\times w_{256a})$, $(-h_2\times w_{256a},h_3\times w_{256a})$, $(-h_2\times w_{256a},h_2\times w_{256a})$, $(-h_2\times w_{256a},h_1\times w_{256a})$, $(-h_2\times w_{256a},-15\times w_{256a})$, $(-h_2\times w_{256a},-h_7\times w_{256a})$, $(-h_2\times w_{256a},-h_6\times w_{256a})$, $(-h_2\times w_{256a},-h_5\times w_{256a})$, $(-h_2\times w_{256a},-h_4\times w_{256a})$, $(-h_2\times w_{256a},-h_3\times w_{256a})$, $(-h_2\times w_{256a},-h_2\times w_{256a})$, $(-h_2\times w_{256a},-h_1\times w_{256a})$, $(-h_1\times w_{256a},15\times w_{256a})$, $(-h_1\times w_{256a},h_7\times w_{256a})$, $(-h_1\times w_{256a},h_6\times w_{256a})$, $(-h_1\times w_{256a},h_5\times w_{256a})$, $(-h_1\times w_{256a},h_4\times w_{256a})$, $(-h_1\times w_{256a},h_3\times w_{256a})$, $(-h_1\times w_{256a},h_2\times w_{256a})$, $(-h_1\times w_{256a},h_1\times w_{256a})$, $(-h_1\times w_{256a},-15\times w_{256a})$, $(-h_1\times w_{256a},-h_7\times w_{256a})$, $(-h_1\times w_{256a},-h_6\times w_{256a})$, $(-h_1\times w_{256a},-h_5\times w_{256a})$, $(-h_1\times w_{256a},-h_4\times w_{256a})$, $(-h_1\times w_{256a},-h_3\times w_{256a})$, $(-h_1\times w_{256a},-h_2\times w_{256a})$, and $(-h_1\times w_{256a},-h_1\times w_{256a})$, Coordinates in the I (in-phase)-Q (quadrature(-phase)) plane of the signal points (i.e., the circles in FIG. 113) directly above the values 00000000-11111111 of the set of b0, b1, b2, b3, b4, b5, b6, and b7 indicate the in-phase component I and the quadrature component Q of the baseband signal obtained as a result of mapping. Note that relationship between the values (000000-111111) of the set of b0, b1, b2, b3, b4, b5, b6, and b7, and coordinates of the signal points in 256QAM is not limited to the relationship shown in FIG. 113.

The 256 signal points shown in FIG. 113 are assigned names "signal point 1", "signal point 2", and so on up to "signal point 256". In other words, as there are 256 signal points, signal points 1-256 exist. In the I (in-phase)-Q (quadrature(-phase)) plane, a signal point i is separated from the origin by a distance Di. Thus, $w_{256a}$ can be calculated as shown below.

[Math. 367]

$$w_{256a} = \frac{z}{\sqrt{\frac{\sum_{i=1}^{256} D_i^2}{256}}} \qquad \text{(H3)}$$

Consequently, the baseband signal obtained as a result of mapping has average power $z^2$.

Note that in the above explanation, 256QAM is referred to as uniform 256QAM when the same as in Configuration Example R1, and is otherwise referred as non-uniform 256QAM.

(Supplementary Explanation 3)

Embodiments 1 to 11 explain a bit length adjustment scheme. Furthermore, Embodiment 12 explains a situation in which the bit length adjustment scheme, explained in Embodiments 1 to 11, is applied to DVB standards. In the aforementioned embodiments, explanation is given for situations in which 16QAM, 64QAM, and 256QAM are used as modulation schemes. Specific explanation of a mapping scheme for 16QAM, 64QAM, and 256QAM is also provided in Configuration Example R1.

The following explains an alternative method for configuring a mapping scheme for 16QAM, 64QAM, and 256QAM, differing from Configuration Example R1 and Supplementary Explanation 2. Note that 16QAM, 64QAM, and 256QAM explained below may be applied to any of Embodiments 1 to 12, thereby obtaining the same effects as explained in Embodiments 1 to 12.

Figure 114:
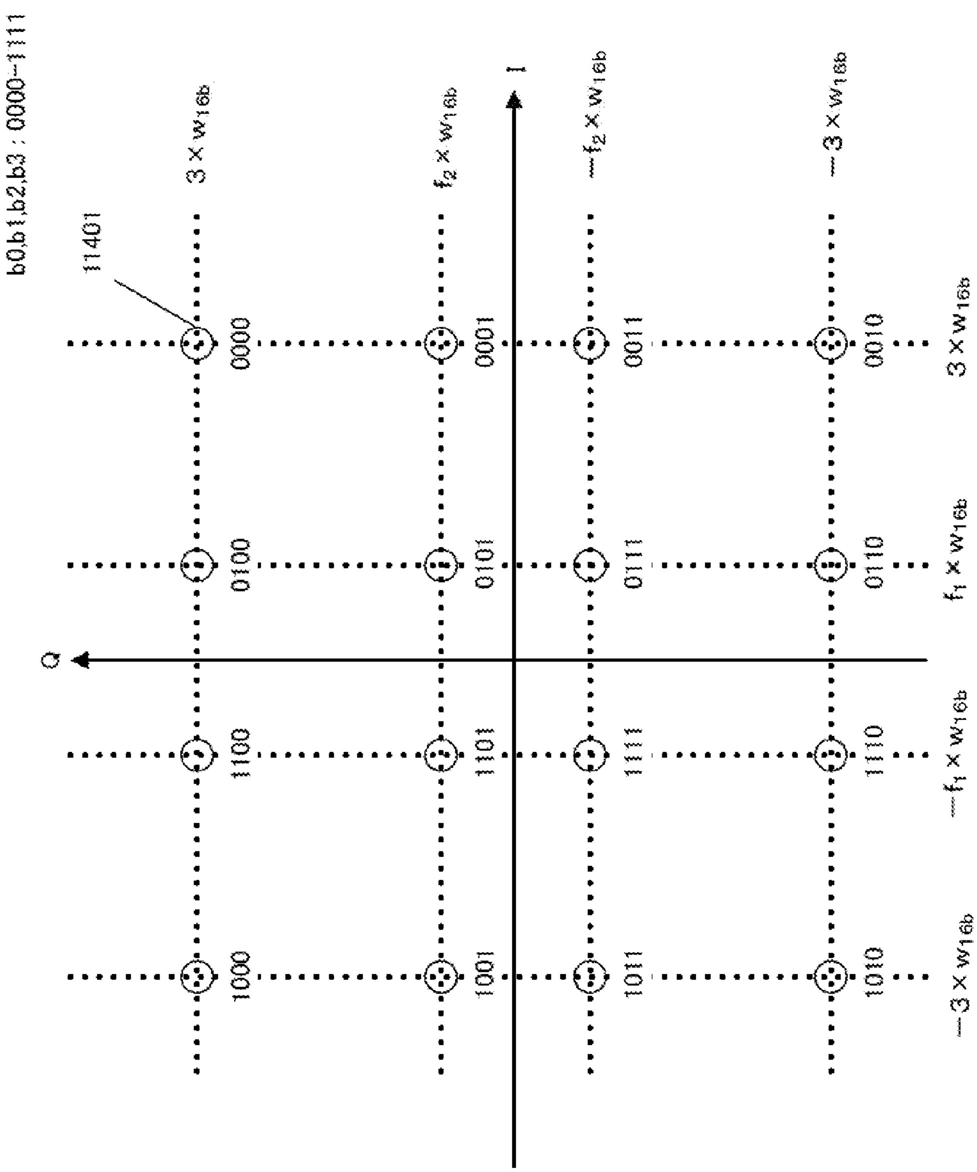
FIG. 114 shows an example of constellation of signal points for 16QAM in the I-Q plane.

A mapping scheme for 16QAM is explained below. FIG. 114 shows an example of a signal point constellation for 16QAM in an I (in-phase)-Q (quadrature(-phase)) plane. In FIG. 114, 16 circles represent signal points for 16QAM, and the horizontal and vertical axes respectively represent I and Q. Also, in FIG. 114 $f_1>0$ (i.e., $f_1$ is a real number greater than 0), $f_2>0$ (i.e., $f_2$ is a real number greater than 0), $f_1\neq 3$, $f_2\neq 3$, and $f_1\neq f_2$ are satisfied.

Coordinates of the 16 signal points (i.e., the circles in FIG. 114) for 16QAM in the I (in-phase)-Q (quadrature(-phase)) plane are $(3\times w_{16b},3\times w_{16b})$, $(3\times w_{16b},f_2\times w_{16b})$, $(3\times w_{16b},-f_2\times w_{16b})$, $(3\times w_{16b},-3\times w_{16b})$, $(f_1\times w_{16b},3\times w_{16b})$, $(f_1\times w_{16b},f_2\times w_{16b})$, $(f_1\times w_{16b},-f_2\times w_{16b})$, $(f_1\times w_{16b},-3\times w_{16b})$, $(-f_1\times w_{16b},3\times w_{16b})$, $(-f_1\times w_{16b},f_2\times w_{16b})$, $(-f_1\times w_{16b},-f_2\times w_{16b})$, $(-f_1\times w_{16b},-3\times w_{16b})$, $(-3\times w_{16b},3\times w_{16b})$, $(-3\times w_{16b},f_2\times w_{16b})$, $(-3\times w_{16b},-f_2\times w_{16b})$, and $(-3\times w_{16b},-3\times w_{16b})$, where $w_{16b}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to a signal point 11401 in FIG. 114. When an in-phase component and a quadrature component of a baseband signal obtained as a result of mapping are respectively represented by I and Q, $(I, Q)=(3\times w_{16b}, 3\times w_{16b})$ is satisfied.

That is to say, the in-phase component I and the quadrature component Q of the baseband signal obtained as a result of mapping (at the time of using 16QAM) are determined based on the transmitted bits (b0, b1, b2, and b3). FIG. 114 shows one example of relationship between values (0000-1111) of the set of b0, b1, b2, and b3, and coordinates of the signal points. In FIG. 114, values 0000-1111 of the set of b0, b1, b2, and b3 are shown directly below the 16 signal points (i.e., the circles in FIG. 114) which are $(3\times w_{16b},3\times w_{16b})$, $(3\times w_{16b},f_2\times w_{16b})$, $(3\times w_{16b},-f_2\times w_{16b})$, $(3\times w_{16b},-3\times w_{16b})$, $(f_1\times w_{16b},3\times w_{16b})$, $(f_1\times w_{16b},f_2\times w_{16b})$, $(f_1\times w_{16b},-f_2\times w_{16b})$, $(f_1\times w_{16b},-3\times w_{16b})$, $(-f_1\times w_{16b},3\times w_{16b})$, $(-f_1\times w_{16b},f_2\times w_{16b})$, $(-f_1\times w_{16b},-f_2\times w_{16b})$, $(-f_1\times w_{16b},-3\times w_{16b})$, $(-3\times w_{16b},3\times w_{16b})$, $(-3\times w_{16b},f_2\times w_{16b})$, $(-3\times w_{16b},-f_2\times w_{16b})$, and $(-3\times w_{16b},-3\times w_{16b})$, Coordinates in the I (in-phase)-Q (quadrature(-phase)) plane of the signal points directly above the values 0000-1111 of the set of b0, b1, b2, and b3 indicate the in-phase component I and the quadrature component Q of the baseband signal obtained as a result of mapping. Note that relationship between the values (0000-1111) of the set of b0, b1, b2, and b3, and coordinates of the signal points for 16QAM is not limited to the relationship shown in FIG. 114.

The 16 signal points shown in FIG. 114 are assigned names "signal point 1", "signal point 2", and so on up to "signal point 16". In other words, as there are 16 signal points, signal points 1-16 exist. In the I (in-phase)-Q (quadrature(-phase)) plane, a signal point i is separated from the origin by a distance Di. Thus, $w_{16b}$ can be calculated as shown below.

[Math. 368]

$$w_{16b} = \frac{z}{\sqrt{\frac{\sum_{i=1}^{16} D_i^2}{16}}} = \frac{z}{\sqrt{\frac{\left((3^2+3^2)\times 4+(f_1^2+f_2^2)\times 4+(f_1^2+3^2)\times 4+(f_2^2+3^2)\times 4\right)}{16}}} \quad \text{(H4)}$$

Consequently, the baseband signal obtained as a result of mapping has average power $z^2$. Effects for 16QAM described above are explained in detail further below.

Figure 115:
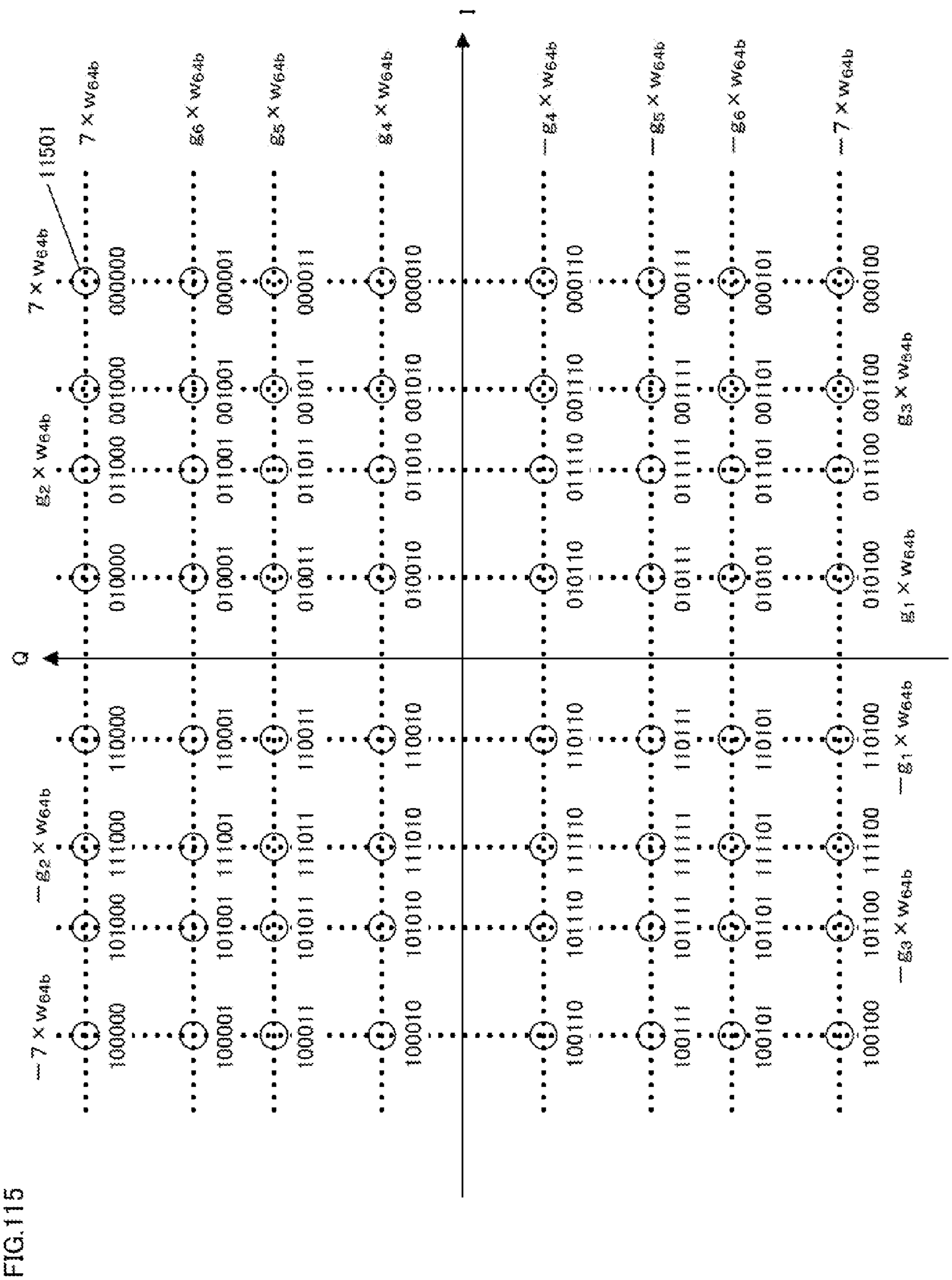
FIG. 115 shows an example of constellation of signal points for 64QAM in the I-Q plane.

A mapping scheme for 64QAM is explained below. FIG. 115 shows an example of a signal point constellation for 64QAM in an I (in-phase)-Q (quadrature(-phase)) plane. In FIG. 115, 64 circles represent signal points for 64QAM, and the horizontal and vertical axes respectively represent I and Q.

Also, in FIG. 115, $g_1>0$ (i.e., $g_1$ is a real number greater than 0), $g_2>0$ (i.e., $g_2$ is a real number greater than zero), $g_3>0$ (i.e., $g_3$ is a real number greater than zero), $g_4>0$ (i.e., $g_4$ is a real number greater than zero), $g_5>0$ (i.e., $g_5$ is a real number greater than zero), and $g_6>0$ (i.e., $g_6$ is a real number greater than zero), $\{g_1\neq 7, g_2\neq 7, g_3\neq 7, g_1\neq g_2, g_1\neq g_3, \text{and } g_2\neq g_3\}$, $\{g_4\neq 7, g_5\neq 7, g_6\neq 7, g_4\neq g_5, g_4\neq g_6, \text{and } g_5\neq g_6\}$, and $\{\{g_1\neq g_4 \text{ or } g_2\neq g_5 \text{ or } g_3\neq g_6\}$ holds true$\}$ are satisfied.

Coordinates of the 64 signal points (i.e., the circles in FIG. 115) for 64QAM in the I (in-phase)-Q (quadrature(-phase)) plane are $(7\times w_{64b},7\times w_{64b})$, $(7\times w_{64b},g_6\times w_{64b})$, $(7\times w_{64b},g_5\times w_{64b})$, $(7\times w_{64b},g_4\times w_{64b})$, $(7\times w_{64b},-g_4\times w_{64b})$, $(7\times w_{64b},-g_5\times w_{64b})$, $(7\times w_{64b},-g_6\times w_{64b})$, $(7\times w_{64b},-7\times w_{64b})$, $(g_3\times w_{64b},7\times w_{64b})$, $(g_3\times w_{64b},g_6\times w_{64b})$, $(g_3\times w_{64b},g_5\times w_{64b})$, $(g_3\times w_{64b},g_4\times w_{64b})$, $(g_3\times w_{64b},-g_4\times w_{64b})$, $(g_3\times w_{64b},-g_5\times w_{64b})$, $(g_3\times w_{64b},-g_6\times w_{64b})$, $(g_3\times w_{64b},-7\times w_{64b})$, $(g_2\times w_{64b},7\times w_{64b})$, $(g_2\times w_{64b},g_6\times w_{64b})$, $(g_2\times w_{64b},g_5\times w_{64b})$, $(g_2\times w_{64b},g_4\times w_{64b})$, $(g_2\times w_{64b},-g_4\times w_{64b})$, $(g_2\times w_{64b},-g_5\times w_{64b})$, $(g_2\times w_{64b},-g_6\times w_{64b})$, $(g_2\times w_{64b},-7\times w_{64b})$, $(g_1\times w_{64b},7\times w_{64b})$, $(g_1\times w_{64b},g_6\times w_{64b})$, $(g_1\times w_{64b},g_5\times w_{64b})$, $(g_1\times w_{64b},g_4\times w_{64b})$, $(g_1\times w_{64b},-g_4\times w_{64b})$, $(g_1\times w_{64b},-g_5\times w_{64b})$, $(g_1\times w_{64b},-g_6\times w_{64b})$, $(g_1\times w_{64b},-7\times w_{64b})$, $(-g_1\times w_{64b},7\times w_{64b})$, $(-g_1\times w_{64b},g_6\times w_{64b})$, $(-g_1\times w_{64b},g_5\times w_{64b})$, $(-g_1\times w_{64b},g_4\times w_{64b})$, $(-g_1\times w_{64b},-g_4\times w_{64b})$, $(-g_1\times w_{64b},-g_5\times w_{64b})$, $(-g_1\times w_{64b},-g_6\times w_{64b})$, $(-g_1\times w_{64b},-7\times w_{64b})$, $(-g_2\times w_{64b},7\times w_{64b})$, $(-g_2\times w_{64b},g_6\times w_{64b})$, $(-g_2\times w_{64b},g_5\times w_{64b})$, $(-g_2\times w_{64b},g_4\times w_{64b})$, $(-g_2\times w_{64b},-g_4\times w_{64b})$, $(-g_2\times w_{64b},-g_5\times w_{64b})$, $(-g_2\times w_{64b},-g_6\times w_{64b})$, $(-g_2\times w_{64b},-7\times w_{64b})$, $(-g_3\times w_{64b},7\times w_{64b})$, $(-g_3\times w_{64b},g_6\times w_{64b})$, $(-g_3\times w_{64b},g_5\times w_{64b})$, $(-g_3\times w_{64b},g_4\times w_{64b})$, $(-g_3\times w_{64b},-g_4\times w_{64b})$, $(-g_3\times w_{64b},-g_5\times w_{64b})$, $(-g_3\times w_{64b},-g_6\times w_{64b})$, $(-g_3\times w_{64b},-7\times w_{64b})$, $(-7\times w_{64b},7\times w_{64b})$, $(-7\times w_{64b},g_6\times w_{64b})$, $(7\times w_{64b},g_5\times w_{64b})$, $(-7\times w_{64b},g_4\times w_{64b})$, $(-7\times w_{64b},-g_4\times w_{64b})$, $(-7\times w_{64b},-g_5\times w_{64b})$, $(-7\times w_{64b},-g_6\times w_{64b})$, and $(-7\times w_{64b},-7\times w_{64b})$, where $w_{64b}$ is a real number greater than 0.

Here, transmitted bits (input bits) are represented by b0, b1, b2, b3, b4 and b5. For example, when (b0, b1, b2, b3, b4, b5)=(0, 0, 0, 0, 0, 0) for the transmitted bits, mapping is performed to a signal point 11501 in FIG. 115. When an in-phase component and a quadrature component of a baseband signal obtained as a result of mapping are respectively represented by I and Q, $(I, Q)=(7\times w_{64b}, 7\times w_{64b})$ is satisfied.

That is to say, the in-phase component I and the quadrature component Q of the baseband signal obtained as a result of mapping (at the time of using 64QAM) are determined based on the transmitted bits (b0, b1, b2, b3, b4, and b5). FIG. 115 shows one example of relationship between values (000000-111111) of the set of b0, b1, b2, b3, b4, and b5, and coordinates of the signal points. In FIG. 115, values 000000-111111 of the set of b0, b1, b2, b3, b4, and b5 are shown directly below the 64 signal points (i.e., the circles in FIG. 115) for 64QAM which are $(7\times w_{64b},7\times w_{64b})$, $(7\times w_{64b},g_6\times w_{64b})$, $(7\times w_{64b},g_5\times w_{64b})$, $(7\times w_{64b},g_4\times w_{64b})$, $(7\times w_{64b},-g_4\times w_{64b})$, $(7\times w_{64b},-g_5\times w_{64b})$, $(7\times w_{64b},-g_6\times w_{64b})$, $(7\times w_{64b},-7\times w_{64b})$, $(g_3\times w_{64b},7\times w_{64b})$, $(g_3\times w_{64b},g_6\times w_{64b})$, $(g_3\times w_{64b},g_5\times w_{64b})$, $(g_3\times w_{64b},g_4\times w_{64b})$, $(g_3\times w_{64b},-g_4\times w_{64b})$, $(g_3\times w_{64b},-g_5\times w_{64b})$, $(g_3\times w_{64b},-g_6\times w_{64b})$, $(g_3\times w_{64b},-7\times w_{64b})$, $(g_2\times w_{64b},7\times w_{64b})$, $(g_2\times w_{64b},g_6\times w_{64b})$, $(g_2\times w_{64b},g_5\times w_{64b})$, $(g_2\times w_{64b},g_4\times w_{64b})$, $(g_2\times w_{64b},-g_4\times w_{64b})$, $(g_2\times w_{64b},-g_5\times w_{64b})$, $(g_2\times w_{64b},-g_6\times w_{64b})$, $(g_2\times w_{64b},-7\times w_{64b})$, $(g_1\times w_{64b},7\times w_{64b})$, $(g_1\times w_{64b},g_6\times w_{64b})$, $(g_1\times w_{64b},g_5\times w_{64b})$, $(g_1\times w_{64b},g_4\times w_{64b})$, $(g_1\times w_{64b},-g_4\times w_{64b})$, $(g_1\times w_{64b},-g_5\times w_{64b})$, $(g_1\times w_{64b},-g_6\times w_{64b})$, $(g_1\times w_{64b},-7\times w_{64b})$, $(-g_1\times w_{64b},7\times w_{64b})$, $(-g_1\times w_{64b},g_6\times w_{64b})$, $(-g_1\times w_{64b},g_5\times w_{64b})$, $(-g_1\times w_{64b},g_4\times w_{64b})$, $(-g_1\times w_{64b},-g_4\times w_{64b})$, $(-g_1\times w_{64b},-g_5\times w_{64b})$, $(-g_1\times w_{64b},-g_6\times w_{64b})$, $(-g_1\times w_{64b},-7\times w_{64b})$, $(-g_2\times w_{64b},7\times w_{64b})$, $(-g_2\times w_{64b},g_6\times w_{64b})$, $(-g_2\times w_{64b},g_5\times w_{64b})$, $(-g_2\times w_{64b},g_4\times w_{64b})$, $(-g_2\times w_{64b},-g_4\times w_{64b})$, $(-g_2\times w_{64b},-g_5\times w_{64b})$, $(-g_2\times w_{64b},-g_6\times w_{64b})$, $(-g_2\times w_{64b},-7\times w_{64b})$, $(-g_3\times w_{64b},7\times w_{64b})$, $(-g_3\times w_{64b},g_6\times w_{64b})$, $(-g_3\times w_{64b},g_5\times w_{64b})$, $(-g_3\times w_{64b},g_4\times w_{64b})$, $(-g_3\times w_{64b},-g_4\times w_{64b})$, $(-g_3\times w_{64b},-g_5\times w_{64b})$, $(-g_3\times w_{64b},-g_6\times w_{64b})$, $(-g_3\times w_{64b},-7\times w_{64b})$, $(-7\times w_{64b},7\times w_{64b})$, $(-7\times w_{64b},g_6\times w_{64b})$, $(7\times w_{64b},g_5\times w_{64b})$, $(-7\times w_{64b},g_4\times w_{64b})$, $(-7\times w_{64b},-g_4\times w_{64b})$, $(-7\times w_{64b},-g_5\times w_{64b})$, $(-7\times w_{64b},-g_6\times w_{64b})$, and $(-7\times w_{64b},-7\times w_{64b})$, Coordinates in the I (in-phase)-Q (quadrature(-phase)) plane of the signal points directly above the values 000000-111111 of the set of b0, b1, b2, b3, b4, and b5 indicate the in-phase component I and the quadrature component Q of the baseband signal obtained as a result of mapping. Note that relationship between the values (000000-111111) of the set of b0, b1, b2, b3, b4, and b5, and coordinates of the signal points for 64QAM is not limited to the relationship shown in FIG. 115.

The 64 signal points shown in FIG. 115 are assigned names "signal point 1", "signal point 2", and so on up to "signal point 64". In other words, as there are 64 signal points, signal points 1-64 exist. In the I (in-phase)-Q (quadrature(-phase)) plane, a signal point i is separated from the origin by a distance Di. Thus, $w_{64b}$ can be calculated as shown below.

[Math. 369]

$$w_{64b} = \frac{z}{\sqrt{\frac{\sum_{i=1}^{64} D_i^2}{64}}} \qquad \text{(H5)}$$

Consequently, the baseband signal obtained as a result of mapping has average power $z^2$. Effects for 64QAM described above are explained in detail further below.

Figure 116:
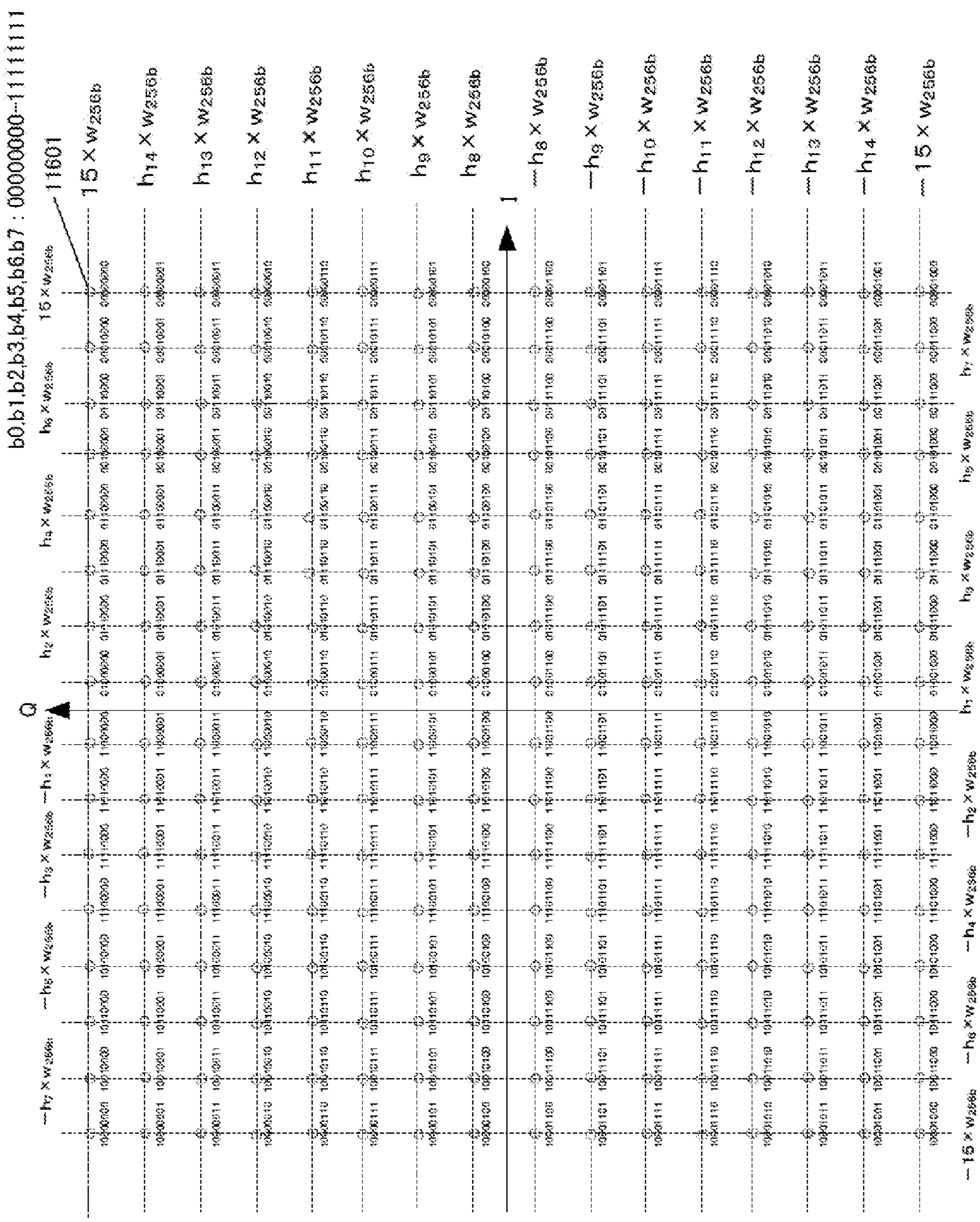
FIG. 116 shows an example of constellation of signal points for 256QAM in the I-Q plane.

A mapping scheme for 256QAM is explained below. FIG. 116 shows an example of a signal point constellation for 256QAM in an I (in-phase)-Q (quadrature(-phase)) plane. In FIG. 116, 256 circles represent signal points for 256QAM, and the horizontal and vertical axes respectively represent I and Q.

Also, in FIG. 116, $h_1>0$ (i.e., $h_1$ is a real number greater than 0), $h_2>0$ (i.e., $h_2$ is a real number greater than 0), $h_3>0$ (i.e., $h_3$ is a real number greater than 0), $h_4>0$ (i.e., $h_4$ is a real number greater than 0), $h_5>0$ (i.e., $h_5$ is a real number greater than 0), $h_6>0$ (i.e., $h_6$ is a real number greater than 0), $h_7>0$ (i.e., $h_7$ is a real number greater than 0), $h_8>0$ (i.e., $h_8$ is a real number greater than 0), $h_9>0$ (i.e., $h_9$ is a real number greater than 0), $h_{10}0$ (i.e., $h_{10}$ is a real number greater than 0), $h_{11}>0$ (i.e., $h_{11}$ is a real number greater than 0), $h_{12}>0$ (i.e., $h_{12}$ is a real number greater than 0), $h_{13}>0$ (i.e., $h_{13}$ is a real number greater than 0), and $h_{14}>0$ (i.e., $h_{14}$ is a real number greater than 0), $\{h_1\neq 15$, $h_2\neq 15$, $h_3\neq 15$, $h_4\neq 15$, $h_5\neq 15$, $h_6\neq 15$, $h_7\neq 15$,
$h_1\neq h_2$, $h_1\neq h_3$, $h_1\neq_4$, $h_1\neq h_5$, $h_1\neq h_6$, $h_1\neq h_7$,
$h_2\neq h_3$, $h_2\neq h_4$, $h_2\neq h_5$, $h_2\neq h_6$, $h_2\neq h_7$,
$h_3\neq h_4$, $h_3\neq h_5$, $h_3\neq h_6$, $h_3\neq h_7$,
$h_4\neq h_5$, $h_4\neq h_6$, $h_4\neq h_7$,
$h_5\neq h_6$, $h_5\neq h_7$, and
$h_6\neq h_7\}$,
$\{h_8\neq 15$, $h_9\neq 15$, $h_{10}\neq 15$, $h_{11}\neq 15$, $h_{12}\neq 15$, $h_{13}\neq 15$, $h_{14}\neq 15$,
$h_8\neq h_9$, $h_8\neq h_{10}$, $h_8\neq h_{11}$, $h_8\neq h_{12}$, $h_8\neq h_{13}$, $h_8\neq h_{14}$,
$h_9\neq h_{10}$, $h_9\neq h_{11}$, $h_9\neq h_{12}$, $h_9\neq h_{13}$, $h_9\neq h_{14}$,
$h_{10}\neq h_{11}$, $h_{10}\neq h_{12}$, $h_{10}\neq h_{13}$, $h_{10}\neq h_{14}$,
$h_{11}\neq h_{12}$, $h_{11}\neq h_{13}$, $h_{11}\neq h_{14}$,
$h_{12}\neq h_{13}$, $h_{12}\neq h_{14}$, and
$h_{13}\neq h_{14}\}$, and
$\{h_1\neq h_8$ or $h_2\neq h_9$ or $h_3\neq h_{10}$ or $h_4\neq h_{11}$ or $h_5\neq h_{12}$ or $h_6\neq h_{13}$ or $h_7\neq h_{14}$ holds true$\}$ are satisfied.

Coordinates of the 256 signal points (i.e., the circles in FIG. 116) for 256QAM in the I (in-phase)-Q (quadrature (-phase)) plane are $(15\times w_{256b},15\times w_{256b})$, $(15\times w_{256b},h_{14}\times w_{256b})$, $(15\times w_{256b},h_{13}\times w_{256b})$, $(15\times w_{256b},h_{12}\times w_{256b})$, $(15\times w_{256b},h_{11}\times w_{256b})$, $(15\times w_{256b},h_{10}\times w_{256b})$, $(15\times w_{256b},h_9\times w_{256b})$, $(15\times w_{256b},h_8\times w_{256b})$, $(15\times w_{256b},-15\times w_{256b})$, $(15\times w_{256b},-h_{14}\times w_{256b})$, $(15\times w_{256b},-h_{13}\times w_{256b})$, $(15\times w_{256b},-h_{12}\times w_{256b})$, $(15\times w_{256b},-h_{11}\times w_{256b})$, $(15\times w_{256b},-h_{10}\times w_{256b})$, $(15\times w_{256b},-h_9\times w_{256b})$, $(15\times w_{256b},-h_8\times w_{256b})$, $(h_7\times w_{256b},15\times w_{256b})$, $(h_7\times w_{256b},h_{14}\times w_{256b})$, $(h_7\times w_{256b},h_{13}\times w_{256b})$, $(h_7\times w_{256b},h_{12}\times w_{256b})$, $(h_7\times w_{256b},h_{11}\times w_{256b})$, $(h_7\times w_{256b},h_{10}\times w_{256b})$, $(h_7\times w_{256b},h_9\times w_{256b})$, $(h_7\times w_{256b},h_8\times w_{256b})$, $(h_7\times w_{256b},-15\times w_{256b})$, $(h_7\times w_{256b},-h_{14}\times w_{256b})$, $(h_7\times w_{256b},-h_{13}\times w_{256b})$, $(h_7\times w_{256b},-h_{12}\times w_{256b})$, $(h_7\times w_{256b},-h_{11}\times w_{256b})$, $(h_7\times w_{256b},-h_{10}\times w_{256b})$, $(h_7\times w_{256b},-h_9\times w_{256b})$, $(h_7\times w_{256b},-h_8\times w_{256b})$, $(h_6\times w_{256b},15\times w_{256b})$, $(h_6\times w_{256b},h_{14}\times w_{256b})$, $(h_6\times w_{256b},h_{13}\times w_{256b})$, $(h_6\times w_{256b},h_{12}\times w_{256b})$, $(h_6\times w_{256b},h_{11}\times w_{256b})$, $(h_6\times w_{256b},h_{10}\times w_{256b})$, $(h_6\times w_{256b},h_9\times w_{256b})$, $(h_6\times w_{256b},h_8\times w_{256b})$, $(h_6\times w_{256b},-15\times w_{256b})$, $(h_6\times w_{256b},-h_{14}\times w_{256b})$, $(h_6\times w_{256b},-h_{13}\times w_{256b})$, $(h_6\times w_{256b},-h_{12}\times w_{256b})$, $(h_6\times w_{256b},-h_{11}\times w_{256b})$, $(h_6\times w_{256b},-h_{10}\times w_{256b})$, $(h_6\times w_{256b},-h_9\times w_{256b})$, $(h_6\times w_{256b},-h_8\times w_{256b})$, $(h_5\times w_{256b},15\times w_{256b})$, $(h_5\times w_{256b},h_{14}\times w_{256b})$, $(h_5\times w_{256b},h_{13}\times w_{256b})$, $(h_5\times w_{256b},h_{12}\times w_{256b})$, $(h_5\times w_{256b},h_{11}\times w_{256b})$, $(h_5\times w_{256b},h_{10}\times w_{256b})$, $(h_5\times w_{256b},h_9\times w_{256b})$, $(h_5\times w_{256b},h_8\times w_{256b})$, $(h_5\times w_{256b},-15\times w_{256b})$, $(h_5\times w_{256b},-h_{14}\times w_{256b})$, $(h_5\times w_{256b},-h_{13}\times w_{256b})$, $(h_5\times w_{256b},-h_{12}\times w_{256b})$, $(h_5\times w_{256b},-h_{11}\times w_{256b})$, $(h_5\times w_{256b},-h_{10}\times w_{256b})$, $(h_5\times w_{256b},-h_9\times w_{256b})$, $(h_5\times w_{256b},-h_8\times w_{256b})$, $(h_4\times w_{256b},15\times w_{256b})$, $(h_4\times w_{256b},h_{14}\times w_{256b})$, $(h_4\times w_{256b},h_{13}\times w_{256b})$, $(h_4\times w_{256b},h_{12}\times w_{256b})$, $(h_4\times w_{256b},h_{11}\times w_{256b})$, $(h_4\times w_{256b},h_{10}\times w_{256b})$, $(h_4\times w_{256b},h_9\times w_{256b})$, $(h_4\times w_{256b},h_8\times w_{256b})$, $(h_4\times w_{256b},-15\times w_{256b})$, $(h_4\times w_{256b},-h_{14}\times w_{256b})$, $(h_4\times w_{256b},-h_{13}\times w_{256b})$, $(h_4\times w_{256b},-h_{12}\times w_{256b})$, $(h_4\times w_{256b},-h_{11}\times w_{256b})$, $(h_4\times w_{256b},-h_{10}\times w_{256b})$, $(h_4\times w_{256b},-h_9\times w_{256b})$, $(h_4\times w_{256b},-h_8\times w_{256b})$, $(h_3\times w_{256b},15\times w_{256b})$, $(h_3\times w_{256b},h_{14}\times w_{256b})$, $(h_3\times w_{256b},h_{13}\times w_{256b})$, $(h_3\times w_{256b},h_{12}\times w_{256b})$, $(h_3\times w_{256b},h_{11}\times w_{256b})$, $(h_3\times w_{256b},h_{10}\times w_{256b})$, $(h_3\times w_{256b},h_9\times w_{256b})$, $(h_3\times w_{256b},h_8\times w_{256b})$, $(h_3\times w_{256b},15\times w_{256b})$, $(h_3\times w_{256b},-h_{14}\times w_{256b})$, $(h_3\times$ $w_{256b},-h_{13}\times w_{256b})$, $(h_3\times w_{256b},-h_{12}\times w_{256b})$, $(h_3\times w_{256b},-h_{11}\times w_{256b})$, $(h_3\times w_{256b},-h_{10}\times w_{256b})$, $(h_3\times w_{256b},-h_9\times w_{256b})$, $(h_3\times w_{256b},-h_8\times w_{256b})$, $(h_2\times w_{256b},15\times w_{256b})$, $(h_2\times w_{256b},h_{14}\times w_{256b})$, $(h_2\times w_{256b},h_{13}\times w_{256b})$, $(h_2\times w_{256b},h_{12}\times w_{256b})$, $(h_2\times w_{256b},h_{11}\times w_{256b})$, $(h_2\times w_{256b},h_{10}\times w_{256b})$, $(h_2\times w_{256b},h_9\times w_{256b})$, $(h_2\times w_{256b},h_8\times w_{256b})$, $(h_2\times w_{256b},-15\times w_{256b})$, $(h_2\times w_{256b},-h_{14}\times w_{256b})$, $(h_2\times w_{256b},-h_{13}\times w_{256b})$, $(h_2\times w_{256b},-h_{12}\times w_{256b})$, $(h_2\times w_{256b},-h_{11}\times w_{256b})$, $(h_2\times w_{256b},-h_{10}\times w_{256b})$, $(h_2\times w_{256b},-h_9\times w_{256b})$, $(h_2\times w_{256b},-h_8\times w_{256b})$, $(h_1\times w_{256b},15\times w_{256b})$, $(h_1\times w_{256b},h_{14}\times w_{256b})$, $(h_1\times w_{256b},h_{13}\times w_{256b})$, $(h_1\times w_{256b},h_{12}\times w_{256b})$, $(h_1\times w_{256b},h_{11}\times w_{256b})$, $(h_1\times w_{256b},h_{10}\times w_{256b})$, $(h_1\times w_{256b},h_9\times w_{256b})$, $(h_1\times w_{256b},h_8\times w_{256b})$, $(h_1\times w_{256b},-15\times w_{256b})$, $(h_1\times w_{256b},-h_{14}\times w_{256b})$, $(h_1\times w_{256b},-h_{13}\times w_{256b})$, $(h_1\times w_{256b},-h_{12}\times w_{256b})$, $(h_1\times w_{256b},-h_{11}\times w_{256b})$, $(h_1\times w_{256b},-h_{10}\times w_{256b})$, $(h_1\times w_{256b},-h_9\times w_{256b})$, $(h_1\times w_{256b},-h_8\times w_{256b})$, $(-15\times w_{256b},-15\times w_{256b})$, $(-15\times w_{256b},h_{14}\times w_{256b})$, $(-15\times w_{256b}, h_{13}\times w_{256b})$, $(-15\times w_{256b},h_{12}\times w_{256b})$, $(-15\times w_{256b},h_{11}\times w_{256b})$, $(-15\times w_{256b},h_{10}\times w_{256b})$, $(-15\times w_{256b},h_9\times w_{256b})$, $(-15\times w_{256b},h_8\times w_{256b})$, $(-15\times w_{256b},-15\times w_{256b})$, $(-15\times w_{256b},-h_{14}\times w_{256b})$, $(-15\times w_{256b},-h_{13}\times w_{256b})$, $(-15\times w_{256b},-h_{12}\times w_{256b})$, $(-15\times w_{256b},-h_{11}\times w_{256b})$, $(-15\times w_{256b},-h_{10}\times w_{256b})$, $(-15\times w_{256b},-h_9\times w_{256b})$, $(-15\times w_{256b},-h_8\times w_{256b})$, $(-h_7\times w_{256b},15\times w_{256b})$, $(-h_7\times w_{256b},h_{14}\times w_{256b})$, $(-h_7\times w_{256b},h_{13}\times w_{256b})$, $(-h_7\times w_{256b},h_{12}\times w_{256b})$, $(-h_7\times w_{256b},h_{11}\times w_{256b})$, $(-h_7\times w_{256b},h_{10}\times w_{256b})$, $(-h_7\times w_{256b},h_9\times w_{256b})$, $(-h_7\times w_{256b},h_8\times w_{256b})$, $(-h_7\times w_{256b},-15\times w_{256b})$, $(-h_7\times w_{256b},-h_{14}\times w_{256b})$, $(-h_7\times w_{256b},-h_{13}\times w_{256b})$, $(-h_7\times w_{256b},-h_{12}\times w_{256b})$, $(-h_7\times w_{256b},-h_{11}\times w_{256b})$, $(-h_7\times w_{256b},-h_{10}\times w_{256b})$, $(-h_7\times w_{256b},-h_9\times w_{256b})$, $(-h_7\times w_{256b},-h_8\times w_{256b})$, $(-h_6\times w_{256b}, 15\times w_{256b})$, $(-h_6\times w_{256b},h_{14}\times w_{256b})$, $(-h_6\times w_{256b},h_{13}\times w_{256b})$, $(-h_6\times w_{256b},h_{12}\times w_{256b})$, $(-h_6\times w_{256b},h_{11}\times w_{256b})$, $(-h_6\times w_{256b},h_{10}\times w_{256b})$, $(-h_6\times w_{256b},h_9\times w_{256b})$, $(-h_6\times w_{256b},h_8\times w_{256b})$, $(-h_6\times w_{256b},-15\times w_{256b})$, $(-h_6\times w_{256b},-h_{14}\times w_{256b})$, $(-h_6\times w_{256b},-h_{13}\times w_{256b})$, $(-h_6\times w_{256b},-h_{12}\times w_{256b})$, $(-h_6\times w_{256b},-h_{11}\times w_{256b})$, $(-h_6\times w_{256b},-h_{10}\times w_{256b})$, $(-h_6\times w_{256b},-h_9\times w_{256b})$, $(-h_6\times w_{256b},-h_8\times w_{256b})$, $(-h_5\times w_{256b},15\times w_{256b})$, $(-h_5\times w_{256b},h_{14}\times w_{256b})$, $(-h_5\times w_{256b},h_{13}\times w_{256b})$, $(-h_5\times w_{256b},h_{12}\times w_{256b})$, $(-h_5\times w_{256b},h_{11}\times w_{256b})$, $(-h_5\times w_{256b},h_{10}\times w_{256b})$, $(-h_5\times w_{256b},h_9\times w_{256b})$, $(-h_5\times w_{256b},h_8\times w_{256b})$, $(-h_5\times w_{256b},-15\times w_{256b})$, $(-h_5\times w_{256b},-h_{14}\times w_{256b})$, $(-h_5\times w_{256b},-h_{13}\times w_{256b})$, $(-h_5\times w_{256b},-h_{12}\times w_{256b})$, $(-h_5\times w_{256b},-h_{11}\times w_{256b})$, $(-h_5\times w_{256b},-h_{10}\times w_{256b})$, $(-h_5\times w_{256b},-h_9\times w_{256b})$, $(-h_5\times w_{256b},-h_8\times w_{256b})$, $(-h_4\times w_{256b},15\times w_{256b})$, $(-h_4\times w_{256b},h_{14}\times w_{256b})$, $(-h_4\times w_{256b},h_{13}\times w_{256b})$, $(-h_4\times w_{256b},h_{12}\times w_{256b})$, $(-h_4\times w_{256b},h_{11}\times w_{256b})$, $(-h_4\times w_{256b},h_{10}\times w_{256b})$, $(-h_4\times w_{256b},h_9\times w_{256b})$, $(-h_4\times w_{256b},h_8\times w_{256b})$, $(-h_4\times w_{256b},-15\times w_{256b})$, $(-h_4\times w_{256b},-h_{14}\times w_{256b})$, $(-h_4\times w_{256b},-h_{13}\times w_{256b})$, $(-h_4\times w_{256b},-h_{12}\times w_{256b})$, $(-h_4\times w_{256b},-h_{11}\times w_{256b})$, $(-h_4\times w_{256b},-h_{10}\times w_{256b})$, $(-h_4\times w_{256b},-h_9\times w_{256b})$, $(-h_4\times w_{256b},-h_8\times w_{256b})$, $(-h_3\times w_{256b},15\times w_{256b})$, $(-h_3\times w_{256b},h_{14}\times w_{256b})$, $(-h_3\times w_{256b},h_{13}\times w_{256b})$, $(-h_3\times w_{256b},h_{12}\times w_{256b})$, $(-h_3\times w_{256b},h_{11}\times w_{256b})$, $(-h_3\times w_{256b},h_{10}\times w_{256b})$, $(-h_3\times w_{256b},h_9\times w_{256b})$, $(-h_3\times w_{256b},h_8\times w_{256b})$, $(-h_3\times w_{256b},15\times w_{256b})$, $(-h_3\times w_{256b},-h_{14}\times w_{256b})$, $(-h_3\times w_{256b},-h_{13}\times w_{256b})$, $(-h_3\times w_{256b},-h_{12}\times w_{256b})$, $(-h_3\times w_{256b},-h_{11}\times w_{256b})$, $(-h_3\times w_{256b},-h_{10}\times w_{256b})$, $(-h_3\times w_{256b},-h_9\times w_{256b})$, $(-h_3\times w_{256b},-h_8\times w_{256b})$, $(-h_2\times w_{256b},15\times w_{256b})$, $(-h_2\times w_{256b},h_{14}\times w_{256b})$, $(-h_2\times w_{256b},h_{13}\times w_{256b})$, $(-h_2\times w_{256b},h_{12}\times w_{256b})$, $(-h_2\times w_{256b},h_{11}\times w_{256b})$, $(-h_2\times w_{256b},h_{10}\times w_{256b})$, $(-h_2\times w_{256b},h_9\times w_{256b})$, $(-h_2\times w_{256b},h_8\times w_{256b})$, $(-h_2\times w_{256b},-15\times w_{256b})$, $(-h_2\times w_{256b},-h_{14}\times w_{256b})$, $(-h_2\times w_{256b},-h_{13}\times w_{256b})$, $(-h_2\times w_{256b},-h_{12}\times w_{256b})$, $(-h_2\times w_{256b},-h_{11}\times w_{256b})$, $(-h_2\times w_{256b},-h_{10}\times w_{256b})$, $(-h_2\times w_{256b},-h_9\times w_{256b})$, $(-h_2\times w_{256b},-h_8\times w_{256b})$, $(-h_1\times w_{256b},15\times w_{256b})$, $(-h_1\times w_{256b},h_{14}\times w_{256b})$, $(-h_1\times w_{256b},h_{13}\times w_{256b})$, $(-h_1\times w_{256b},h_{12}\times w_{256b})$, $(-h_1\times w_{256b},h_{11}\times w_{256b})$, $(-h_1\times w_{256b},h_{10}\times w_{256b})$, $(-h_1\times w_{256b},h_9\times w_{256b})$, $(-h_1\times w_{256b},h_8\times w_{256b})$, $(-h_1\times w_{256b},-15\times w_{256b})$, $(-h_1\times w_{256b},-h_{14}\times w_{256b})$, $(-h_1\times w_{256b},-h_{13}\times w_{256b})$, $(-h_1\times w_{256b},-h_{12}\times w_{256b})$, $(-h_1\times w_{256b},-h_{11}\times w_{256b})$, $(-h_1\times w_{256b},-h_{10}\times w_{256b})$, $(-h_1\times w_{256b},-h_9\times w_{256b})$, $(-h_1\times w_{256b},-h_8\times w_{256b})$, where $w_{256b}$ is a real number greater than 0.

Here, transmitted bits (input bits) are represented by b0, b1, b2, b3, b4, b5, b6, and b7. For example, when (b0, b1, b2, b3, b4, b5, b6, b7)=(0, 0, 0, 0, 0, 0, 0, 0) for the transmitted bits, mapping is performed to a signal point 11601 in FIG. 116. When an in-phase component and a quadrature component of a baseband signal obtained as a result of mapping are respectively represented by I and Q, $(I, Q)=(15\times w_{256b}, 15\times w_{256b})$ is satisfied.

That is to say, the in-phase component I and the quadrature component Q of the baseband signal obtained as a result of mapping (at the time of using 256QAM) are determined based on the transmitted bits (b0, b1, b2, b3, b4, b5, b6, and b7). FIG. 116 shows one example of relationship between the values (00000000-111111111) of the set of b0, b1, b2, b3, b4, b5, b6, and b7, and coordinates of the signal points. In FIG. 116, the values 00000000-11111111 of the set of b0, b1, b2, b3, b4, b5, b6, and b7 are shown directly below the 256 signal points (i.e., the circles in FIG. 116) for 256QAM which are $(15\times w_{256b},15\times w_{256b})$, $(15\times w_{256b},h_{14}\times w_{256b})$, $(15\times w_{256b},h_{13}\times w_{256b})$, $(15\times w_{256b},h_{12}\times w_{256b})$, $(15\times w_{256b},h_{11}\times w_{256b})$, $(15\times w_{256b},h_{10}\times w_{256b})$, $(15\times w_{256b},h_9\times w_{256b})$, $(15\times w_{256b},h_8\times w_{256b})$, $(15\times w_{256b},-15\times w_{256b})$, $(15\times w_{256b},-h_{14}\times w_{256b})$, $(15\times w_{256b},-h_{13}\times w_{256b})$, $(15\times w_{256b},-h_{12}\times w_{256b})$, $(15\times w_{256b},-h_{11}\times w_{256b})$, $(15\times w_{256b},-h_{10}\times w_{256b})$, $(15\times w_{256b},-h_9\times w_{256b})$, $(15\times w_{256b},-h_8\times w_{256b})$, $(h_7\times w_{256b},15\times w_{256b})$, $(h_7\times w_{256b},h_{14}\times w_{256b})$, $(h_7\times w_{256b},h_{13}\times w_{256b})$, $(h_7\times w_{256b},h_{12}\times w_{256b})$, $(h_7\times w_{256b},h_{11}\times w_{256b})$, $(h_7\times w_{256b},h_{10}\times w_{256b})$, $(h_7\times w_{256b},h_9\times w_{256b})$, $(h_7\times w_{256b},h_8\times w_{256b})$, $(h_7\times w_{256b},-15\times w_{256b})$, $(h_7\times w_{256b},-h_{14}\times w_{256b})$, $(h_7\times w_{256b},-h_{13}\times w_{256b})$, $(h_7\times w_{256b},-h_{12}\times w_{256b})$, $(h_7\times w_{256b},-h_{11}\times w_{256b})$, $(h_7\times w_{256b},-h_{10}\times w_{256b})$, $(h_7\times w_{256b},-h_9\times w_{256b})$, $(h_7\times w_{256b},-h_8\times w_{256b})$, $(h_6\times w_{256b}, 15\times w_{256b})$, $(h_6\times w_{256b},h_{14}\times w_{256b})$, $(h_6\times w_{256b},h_{13}\times w_{256b})$, $(h_6\times w_{256b},h_{12}\times w_{256b})$, $(h_6\times w_{256b},h_{11}\times w_{256b})$, $(h_6\times w_{256b},h_{10}\times w_{256b})$, $(h_6\times w_{256b},h_9\times w_{256b})$, $(h_6\times w_{256b},h_8\times w_{256b})$, $(h_6\times w_{256b},-15\times w_{256b})$, $(h_6\times w_{256b},-h_{14}\times w_{256b})$, $(h_6\times w_{256b},-h_{13}\times w_{256b})$, $(h_6\times w_{256b},-h_{12}\times w_{256b})$, $(h_6\times w_{256b},-h_{11}\times w_{256b})$, $(h_6\times w_{256b},-h_{10}\times w_{256b})$, $(h_6\times w_{256b},-h_9\times w_{256b})$, $(h_6\times w_{256b},-h_8\times w_{256b})$, $(h_5\times w_{256b},15\times w_{256b})$, $(h_5\times w_{256b},h_{14}\times w_{256b})$, $(h_5\times w_{256b},h_{13}\times w_{256b})$, $(h_5\times w_{256b},h_{12}\times w_{256b})$, $(h_5\times w_{256b},h_{11}\times w_{256b})$, $(h_5\times w_{256b},h_{10}\times w_{256b})$, $(h_5\times w_{256b},h_9\times w_{256b})$, $(h_5\times w_{256b},h_8\times w_{256b})$, $(h_5\times w_{256b},-15\times w_{256b})$, $(h_5\times w_{256b},-h_{14}\times w_{256b})$, $(h_5\times w_{256b},-h_{13}\times w_{256b})$, $(h_5\times w_{256b},-h_{12}\times w_{256b})$, $(h_5\times w_{256b},-h_{11}\times w_{256b})$, $(h_5\times w_{256b},-h_{10}\times w_{256b})$, $(h_5\times w_{256b},-h_9\times w_{256b})$, $(h_5\times w_{256b},-h_8\times w_{256b})$, $(h_4\times w_{256b},15\times w_{256b})$, $(h_4\times w_{256b},h_{14}\times w_{256b})$, $(h_4\times w_{256b},h_{13}\times w_{256b})$, $(h_4\times w_{256b},h_{12}\times w_{256b})$, $(h_4\times w_{256b},h_{11}\times w_{256b})$, $(h_4\times w_{256b},h_{10}\times w_{256b})$, $(h_4\times w_{256b},h_9\times w_{256b})$, $(h_4\times w_{256b},h_8\times w_{256b})$, $(h_4\times w_{256b},-15\times w_{256b})$, $(h_4\times w_{256b},-h_{14}\times w_{256b})$, $(h_4\times w_{256b},-h_{13}\times w_{256b})$, $(h_4\times w_{256b},-h_{12}\times w_{256b})$, $(h_4\times w_{256b},-h_{11}\times w_{256b})$, $(h_4\times w_{256b},-h_{10}\times w_{256b})$, $(h_4\times w_{256b},-h_9\times w_{256b})$, $(h_4\times w_{256b},-h_8\times w_{256b})$, $(h_3\times w_{256b},15\times w_{256b})$, $(h_3\times w_{256b},h_{14}\times w_{256b})$, $(h_3\times w_{256b},h_{13}\times w_{256b})$, $(h_3\times w_{256b},h_{12}\times w_{256b})$, $(h_3\times w_{256b},h_{11}\times w_{256b})$, $(h_3\times w_{256b},h_{10}\times w_{256b})$, $(h_3\times w_{256b},h_9\times w_{256b})$, $(h_3\times w_{256b},h_8\times w_{256b})$, $(h_3\times w_{256b},15\times w_{256b})$, $(h_3\times w_{256b},-h_{14}\times w_{256b})$, $(h_3\times w_{256b},-h_{13}\times w_{256b})$, $(h_3\times w_{256b},-h_{12}\times w_{256b})$, $(h_3\times w_{256b},-h_{11}\times w_{256b})$, $(h_3\times w_{256b},-h_{10}\times w_{256b})$, $(h_3\times w_{256b},-h_9\times w_{256b})$, $(h_3\times w_{256b},-h_8\times w_{256b})$, $(h_2\times w_{256b},15\times w_{256b})$, $(h_2\times w_{256b},h_{14}\times w_{256b})$, $(h_2\times w_{256b},h_{13}\times w_{256b})$, $(h_2\times w_{256b},h_{12}\times w_{256b})$, $(h_2\times w_{256b},h_{11}\times w_{256b})$, $(h_2\times w_{256b},h_{10}\times w_{256b})$, $(h_2\times w_{256b},h_9\times w_{256b})$, $(h_2\times w_{256b},h_8\times w_{256b})$, $(h_2\times w_{256b},-15\times w_{256b})$, $(h_2\times w_{256b},-h_{14}\times w_{256b})$, $(h_2\times w_{256b},-h_{13}\times w_{256b})$, $(h_2\times w_{256b},-h_{12}\times w_{256b})$, $(h_2\times w_{256b},-h_{11}\times w_{256b})$, $(h_2\times w_{256b},-h_{10}\times w_{256b})$, $(h_2\times w_{256b},-h_9\times w_{256b})$, $(h_2\times w_{256b},-h_8\times w_{256b})$, $(h_1\times w_{256b},15\times w_{256b})$, $(h_1\times w_{256b},h_{14}\times w_{256b})$, $(h_1\times w_{256b},h_{13}\times w_{256b})$, $(h_1\times w_{256b},h_{12}\times w_{256b})$, $(h_1\times w_{256b},h_{11}\times w_{256b})$, $(h_1\times w_{256b},h_{10}\times w_{256b})$, $(h_1\times w_{256b},h_9\times w_{256b})$, $(h_1\times w_{256b},h_8\times w_{256b})$, $(h_1\times w_{256b},-15\times w_{256b})$, $(h_1\times w_{256b},-h_{14}\times w_{256b})$, $(h_1\times w_{256b},-h_{13}\times w_{256b})$, $(h_1\times w_{256b},-h_{12}\times w_{256b})$, $(h_1\times w_{256b},-h_{11}\times w_{256b})$, $(h_1\times w_{256b},-h_{10}\times w_{256b})$, $(h_1\times w_{256b},-h_9\times w_{256b})$, $(h_1\times w_{256b},-h_8\times w_{256b})$, $(-15\times w_{256b},-15\times w_{256b})$, $(-15\times w_{256b},h_{14}\times w_{256b})$, $(-15\times w_{256b},h_{13}\times w_{256b})$, $(-15\times w_{256b},h_{12}\times w_{256b})$, $(-15\times w_{256b},h_{11}\times w_{256b})$, $(-15\times w_{256b},h_{10}\times w_{256b})$, $(-15\times w_{256b},h_9\times w_{256b})$, $(-15\times w_{256b},h_8\times w_{256b})$, $(-15\times w_{256b},-15\times w_{256b})$, $(-15\times w_{256b},-h_{14}\times w_{256b})$, $(-15\times w_{256b},-h_{13}\times w_{256b})$, $(-15\times w_{256b},-h_{12}\times w_{256b})$, $(-15\times w_{256b},-h_{11}\times w_{256b})$, $(-15\times w_{256b},-h_{10}\times w_{256b})$, $(-15\times w_{256b},-h_9\times w_{256b})$, $(-15\times w_{256b},-h_8\times w_{256b})$, $(-h_7\times w_{256b},15\times w_{256b})$, $(-h_7\times w_{256b},h_{14}\times w_{256b})$, $(-h_7\times w_{256b},h_{13}\times w_{256b})$, $(-h_7\times w_{256b},h_{12}\times w_{256b})$, $(-h_7\times w_{256b},h_{11}\times w_{256b})$, $(-h_7\times w_{256b},h_{10}\times w_{256b})$, $(-h_7\times w_{256b},h_9\times w_{256b})$, $(-h_7\times w_{256b},h_8\times w_{256b})$, $(-h_7\times w_{256b},-15\times w_{256b})$, $(-h_7\times w_{256b},-h_{14}\times w_{256b})$, $(-h_7\times w_{256b},-h_{13}\times w_{256b})$, $(-h_7\times w_{256b},-h_{12}\times w_{256b})$, $(-h_7\times w_{256b},-h_{11}\times w_{256b})$, $(-h_7\times w_{256b},-h_{10}\times w_{256b})$, $(-h_7\times w_{256b},-h_9\times w_{256b})$, $(-h_7\times w_{256b},-h_8\times w_{256b})$, $(-h_6\times w_{256b},15\times w_{256b})$, $(-h_6\times w_{256b},h_{14}\times w_{256b})$, $(-h_6\times w_{256b},h_{13}\times w_{256b})$, $(-h_6\times w_{256b},h_{12}\times w_{256b})$, $(-h_6\times w_{256b},h_{11}\times w_{256b})$, $(-h_6\times w_{256b},h_{10}\times w_{256b})$, $(-h_6\times w_{256b},h_9\times w_{256b})$, $(-h_6\times w_{256b},h_8\times w_{256b})$, $(-h_6\times w_{256b},-15\times w_{256b})$, $(-h_6\times w_{256b},-h_{14}\times w_{256b})$, $(-h_6\times w_{256b},-h_{13}\times w_{256b})$, $(-h_6\times w_{256b},-h_{12}\times w_{256b})$, $(-h_6\times w_{256b},-h_{11}\times w_{256b})$, $(-h_6\times w_{256b},-h_{10}\times w_{256b})$, $(-h_6\times w_{256b},-h_9\times w_{256b})$, $(-h_6\times w_{256b},-h_8\times w_{256b})$, $(-h_5\times w_{256b},15\times w_{256b})$, $(-h_5\times w_{256b},h_{14}\times w_{256b})$, $(-h_5\times w_{256b},h_{13}\times w_{256b})$, $(-h_5\times w_{256b},h_{12}\times w_{256b})$, $(-h_5\times w_{256b},h_{11}\times w_{256b})$, $(-h_5\times w_{256b},h_{10}\times w_{256b})$, $(-h_5\times w_{256b},h_9\times w_{256b})$, $(-h_5\times w_{256b},h_8\times w_{256b})$, $(-h_5\times w_{256b},-15\times w_{256b})$, $(-h_5\times w_{256b},-h_{14}\times w_{256b})$, $(-h_5\times w_{256b},-h_{13}\times w_{256b})$, $(-h_5\times w_{256b},-h_{12}\times w_{256b})$, $(-h_5\times w_{256b},-h_{11}\times w_{256b})$, $(-h_5\times w_{256b},-h_{10}\times w_{256b})$, $(-h_5\times w_{256b},-h_9\times w_{256b})$, $(-h_5\times w_{256b},-h_8\times w_{256b})$, $(-h_4\times w_{256b},15\times w_{256b})$, $(-h_4\times w_{256b},h_{14}\times w_{256b})$, $(-h_4\times w_{256b},h_{13}\times w_{256b})$, $(-h_4\times w_{256b},h_{12}\times w_{256b})$, $(-h_4\times w_{256b},h_{11}\times w_{256b})$, $(-h_4\times w_{256b},h_{10}\times w_{256b})$, $(-h_4\times w_{256b},h_9\times w_{256b})$, $(-h_4\times w_{256b},h_8\times w_{256b})$, $(-h_4\times w_{256b},-15\times w_{256b})$, $(-h_4\times w_{256b},-h_{14}\times w_{256b})$, $(-h_4\times w_{256b},-h_{13}\times w_{256b})$, $(-h_4\times w_{256b},-h_{12}\times w_{256b})$, $(-h_4\times w_{256b},-h_{11}\times w_{256b})$, $(-h_4\times w_{256b},-h_{10}\times w_{256b})$, $(-h_4\times w_{256b},-h_9\times w_{256b})$, $(-h_4\times w_{256b},-h_8\times w_{256b})$, $(-h_3\times w_{256b},15\times w_{256b})$, $(-h_3\times w_{256b},h_{14}\times w_{256b})$, $(-h_3\times w_{256b},h_{13}\times w_{256b})$, $(-h_3\times w_{256b},h_{12}\times w_{256b})$, $(-h_3\times w_{256b},h_{11}\times w_{256b})$, $(-h_3\times w_{256b},h_{10}\times w_{256b})$, $(-h_3\times w_{256b},h_9\times w_{256b})$, $(-h_3\times w_{256b},h_8\times w_{256b})$, $(-h_3\times w_{256b},15\times w_{256b})$, $(-h_3\times w_{256b},-h_{14}\times w_{256b})$, $(-h_3\times w_{256b},-h_{13}\times w_{256b})$, $(-h_3\times w_{256b},-h_{12}\times w_{256b})$, $(-h_3\times w_{256b},-h_{11}\times w_{256b})$, $(-h_3\times w_{256b},-h_{10}\times w_{256b})$, $(-h_3\times w_{256b},-h_9\times w_{256b})$, $(-h_3\times w_{256b},-h_8\times w_{256b})$, $(-h_2\times w_{256b},15\times w_{256b})$, $(-h_2\times w_{256b},h_{14}\times w_{256b})$, $(-h_2\times w_{256b},h_{13}\times w_{256b})$, $(-h_2\times w_{256b},h_{12}\times w_{256b})$, $(-h_2\times w_{256b},h_{11}\times w_{256b})$, $(-h_2\times w_{256b},h_{10}\times w_{256b})$, $(-h_2\times w_{256b},h_9\times w_{256b})$, $(-h_2\times w_{256b},h_8\times w_{256b})$, $(-h_2\times w_{256b},-15\times w_{256b})$, $(-h_2\times w_{256b},-h_{14}\times w_{256b})$, $(-h_2\times w_{256b},-h_{13}\times w_{256b})$, $(-h_2\times w_{256b},-h_{12}\times w_{256b})$, $(-h_2\times w_{256b},-h_{11}\times w_{256b})$, $(-h_2\times w_{256b},-h_{10}\times w_{256b})$, $(-h_2\times w_{256b},-h_9\times w_{256b})$, $(-h_2\times w_{256b},-h_8\times w_{256b})$, $(-h_1\times w_{256b},15\times w_{256b})$, $(-h_1\times w_{256b},h_{14}\times w_{256b})$, $(-h_1\times w_{256b},h_{13}\times w_{256b})$, $(-h_1\times w_{256b},h_{12}\times w_{256b})$, $(-h_1\times w_{256b},h_{11}\times w_{256b})$, $(-h_1\times w_{256b},h_{10}\times w_{256b})$, $(-h_1\times w_{256b},h_9\times w_{256b})$, $(-h_1\times w_{256b},h_8\times w_{256b})$, $(-h_1\times w_{256b},-15\times w_{256b})$, $(-h_1\times w_{256b},-h_{14}\times w_{256b})$, $(-h_1\times w_{256b},-h_{13}\times w_{256b})$, $(-h_1\times w_{256b},-h_{12}\times w_{256b})$, $(-h_1\times w_{256b},-h_{11}\times w_{256b})$, $(-h_1\times w_{256b},-h_{10}\times w_{256b})$, $(-h_1\times w_{256b},-h_9\times w_{256b})$, and $(-h_1\times w_{256b},-h_8\times w_{256b})$, Coordinates in the I (in-phase)-Q (quadrature(-phase)) plane of the signal points directly above the values 00000000-11111111 of the set of b0, b1, b2, b3, b4, b5, b6, and b7 indicate the in-phase component I and the quadrature component Q of the baseband signal obtained as a result of mapping. Note that relationship between the values (00000000-11111111) of the set of b0, b1, b2, b3, b4, b5, b6, b7, and coordinates of the signal points for 256QAM is not limited to the relationship shown in FIG. 116.

The 256 signal points shown in FIG. 116 are assigned names "signal point 1", "signal point 2", and so on up to "signal point 256". In other words, as there are 256 signal points, signal points 1-256 exist. In the I (in-phase)-Q (quadrature(-phase)) plane, a signal point i is separated from the origin by a distance Di. Thus, $w_{256}$, can be calculated using Di as shown below.

[Math. 370]

$$v_{256b}=\frac{z}{\sqrt{\frac{\sum_{i=1}^{256}D_i^2}{256}}} \tag{H6}$$

Consequently, the baseband signal obtained as a result of mapping has average power $z^2$. Effects for 256QAM described above are explained in detail further below.

The following explains effects when QAM described above is used.

First, explanation is provided of configuration of a transmission device and a reception device.

Figure 117:
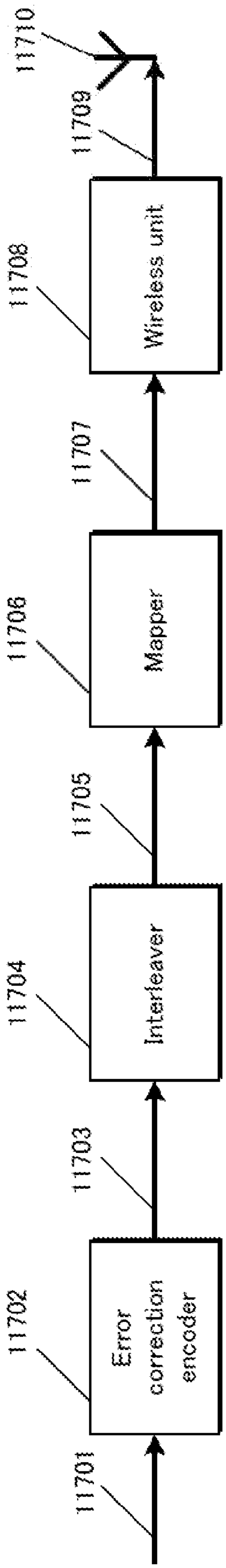
FIG. 117 shows an example of configuration of a transmission device.

FIG. 117 shows one example of configuration of the transmission device. An error correction encoder 11702 receives information 11701 as input, performs error correction encoding using LDPC codes, turbo codes or the like, and thereby outputs error correction encoded data 11703.

An interleaver 11704 receives the error correction encoded data 11703 as input, performs data interleaving, and thereby outputs interleaved data 11705.

A mapper 11706 receives the interleaved data 11705 as input, performs mapping in accordance with a modulation scheme set by the transmission device, and thereby outputs a quadrature baseband signal (i.e., an in-phase component I and a quadrature component Q) 11707.

A wireless unit 11708 receives the quadrature baseband signal 11707 as input, performs processing such as quadrature modulation, frequency conversion, and amplification, and thereby outputs a transmission signal 11709. Finally, an antenna 11710 outputs the transmission signal 11709 as a radio wave.

Figure 118:
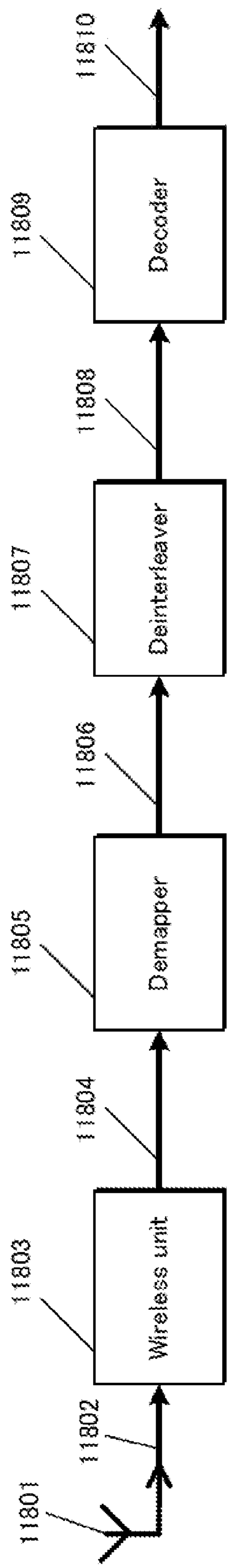
FIG. 118 shows an example of configuration of a reception device.

FIG. 118 shows one example of configuration of the reception device which receives modulated signals transmitted from the transmission device shown in FIG. 117.

A wireless unit 11803 receives a received signal 11802, received through an antenna 11801, as input, performs processing such as frequency conversion and quadrature demodulation, and thereby outputs a quadrature baseband signal 11804.

A demapper 11805 receives the quadrature baseband signal 11804 as input, and performs frequency offset estimation and elimination, and channel variation (transmission path variation) estimation. The demapper 11805 also, for example, performs log-likelihood ratio estimation for each bit of a data symbol, and thereby outputs a log-likelihood ratio signal 11806.

A deinterleaver 11807 receives the log-likelihood ratio signal 11806 as input, performs deinterleaving, and thereby outputs a deinterleaved log-likelihood ratio signal 11808.

A decoder 11809 receives the deinterleaved log-likelihood ratio signal 11808 as input, performs decoding of the error correction code, and thereby outputs received data 11810.

Effects are explained below using 16QAM as an example. The following compares two different configurations which are referred to below as 16QAM #1 and 16QAM #2.

16QAM #1 refers to 16QAM explained in Supplementary Explanation 2, for which the signal point constellation in the I (in-phase)-Q (quadrature(-phase)) plane is as shown in FIG. 11.

16QAM #2 refers to a configuration in which the signal point constellation in the I (in-phase)-Q (quadrature (-phase)) plane is as shown in FIG. 114, and in which, as explained above, $f_1>0$ (i.e., $f_1$ is a real number greater than 0), $f_2>0$ (i.e., $f_2$ is a real number greater than 0), $f_1\neq3$, $f_1\neq3$, and $f_1\neq f_2$ are satisfied.

As explained above, in 16QAM four bits b0, b1, b2, and b3 are transmitted. In the case of 16QAM #1, when the reception device calculates a log-likelihood ratio of each bit, the four bits are separated into two high-quality bits and two low-quality bits. On the other hand, in the case of 16QAM #2, due to the condition "$f_1>0$ (i.e., $f_1$ is a real number greater than 0), $f_2>0$ (i.e., $f_2$ is a real number greater than 0), $f_1\neq3$, $f_1\neq3$, and $f_1\neq f_2$ are satisfied", the four bits are separated into two high-quality bits, one medium-quality bit, and one low-quality bit. Therefore, as explained above, 16QAM #1 and 16QAM #2 differ in terms of quality distribution of the four bits. In consideration of the above situation, when the decoder 11809 in FIG. 118 performs decoding of error correction code, depending on the error correction code which is used, there is a possibility that 16QAM #2 enables the reception device to obtain better data reception quality.

Note that in the case of 64QAM, when the signal point constellation in the I (in-phase)-Q (quadrature(-phase)) plane is as shown in FIG. 115, the reception device may be able to achieve good data reception quality in the same way as described above. In such a situation, the condition explained above that "$g_1>0$ (i.e., $g_1$ is a real number greater than 0), $g_2>0$ (i.e., $g_2$ is a real number greater than zero), $g_3>0$ (i.e., $g_3$ is a real number greater than zero), $g_4>0$ (i.e., $g_4$ is a real number greater than zero), $g_5>0$ (i.e., $g_5$ is a real number greater than zero), and $g_6>0$ (i.e., $g_6$ is a real number greater than zero), $\{g_1\neq7,\ g_2\neq7,\ g_3\neq7,\ g_1\neq g_2,\ g_1\neq g_3, \text{ and } g_2\neq g_3\}$, $\{g_4\neq7,\ g_5\neq7,\ g_6\neq7,\ g_4\neq g_5,\ g_4\neq g_6, \text{ and } g_5\neq g_6\}$, and $\{g_1\neq g_4 \text{ or } g_2\neq g_5 \text{ or } g_3\neq g_6 \text{ holds true}\}$ are satisfied"

is an important condition, and the signal point constellation differs from that explained in Supplementary Explanation 2.

Likewise, in the case of 256QAM, when the signal point constellation in the I (in-phase)-Q (quadrature(-phase)) plane is as shown in FIG. 116, the reception device may be able to achieve good data reception quality in the same way as described above. In such a situation, the condition explained above that "$h_1>0$ (i.e., $h_1$ is a real number greater than 0), $h_2>0$ (i.e., $h_2$ is a real number greater than 0), $h_3>0$ (i.e., $h_3$ is a real number greater than 0), $h_4>0$ (i.e., $h_4$ is a real number greater than 0), $h_5>0$ (i.e., $h_5$ is a real number greater than 0), $h_6>0$ (i.e., $h_6$ is a real number greater than 0), $h_7>0$ (i.e., $h_7$ is a real number greater than 0), $h_8>0$ (i.e., $h_8$ is a real number greater than 0), $h_9>0$ (i.e., $h_9$ is a real number greater than 0), $h_{10}>0$ (i.e., $h_{10}$ is a real number greater than 0), $h_{11}>0$ (i.e., $h_{11}$ is a real number greater than 0), $h_{12}>0$ (i.e., $h_{12}$ is a real number greater than 0), $h_{13}>0$ (i.e., $h_{13}$ is a real number greater than 0), and $h_{14}>0$ (i.e., $h_{14}$ is a real number greater than 0), $\{h_1\neq15,\ h_2\neq15,\ h_3\neq15,\ h_4\neq15,\ h_5\neq15,\ h_6\neq15,\ h_7\neq15,$
$h_1\neq h_2,\ h_1\neq h_3,\ h_1\neq_4,\ h_1\neq h_5,\ h_1\neq h_6,\ h_1\neq h_7,$
$h_2\neq h_3,\ h_2\neq h_4,\ h_2\neq h_5,\ h_2\neq h_6,\ h_2\neq h_7,$
$h_3\neq h_4,\ h_3\neq h_5,\ h_3\neq h_6,\ h_3\neq h_7,$
$h_4\neq h_5,\ h_4\neq h_6,\ h_4\neq h_7,$
$h_5\neq h_6,\ h_5\neq h_7$, and
$h_6\neq h_7\}$, $\{h_8\neq15,\ h_9\neq15,\ h_{10}\neq15,\ h_{11}\neq15,\ h_{12}\neq15,\ h_{13}\neq15,\ h_{14}\neq15,$
$h_8\neq h_9,\ h_8\neq h_{10},\ h_8\neq_{11},\ h_8\neq h_{12},\ h_8\neq h_{13},\ h_8\neq h_{14},$
$h_9\neq h_{10},\ h_9\neq h_{11},\ h_9\neq h_{12},\ h_9\neq h_{13},\ h_9\neq h_{14},$
$h_{10}\neq h_{11},\ h_{10}\neq h_{12},\ h_{10}\neq h_{13},\ h_{10}\neq h_{14},$
$h_{11}\neq h_{12},\ h_{11}\neq h_{13},\ h_{11}\neq h_{14},$
$h_{12}\neq h_{13},\ h_{12}\neq h_{14}$, and
$h_{13}\neq h_{14}\}$, and $\{h_1\neq h_8 \text{ or } h_2\neq h_9 \text{ or } h_3\neq h_{10} \text{ or } h_4\neq h_{11} \text{ or } h_5\neq h_{12} \text{ or } h_6\neq h_{13} \text{ or } h_7\neq h_{14} \text{ holds true}\}$ are satisfied", is an important condition, and the signal point constellation differs from that explained in Supplementary Explanation 2.

Note that although detailed explanation of configuration is omitted for FIGS. 117 and 118, transmission and reception of modulated signal can be implemented in the same way even when the OFDM scheme or the spread spectrum communication scheme explained in other embodiments of the present Description is used in the transmission and reception of the modulated signals.

Also, there is a possibility of improved data reception being achieved using the 16QAM, 64QAM, and 256QAM explained above, even for a transmission scheme using space-time codes such as space-time block codes (note that symbols may alternatively be arranged in the frequency domain), or for an MIMO transmission scheme in which precoding is or is not performed, such as described in Embodiments 1 to 12.

(Supplementary Explanation 4)

Embodiments 1 to 11 explain a bit length adjustment scheme. Furthermore, Embodiment 12 explains a situation in which the bit length adjustment scheme, explained in Embodiments 1 to 11, is applied to DVB standards. In the aforementioned embodiments, explanation is given for situations in which 16QAM, 64QAM, and 256QAM are used as modulation schemes. Specific explanation of a mapping scheme for 16QAM, 64QAM, and 256QAM is also provided in Configuration Example R1.

The following explains an alternative method for configuring a mapping scheme for 16QAM, 64QAM, and 256QAM, differing from Configuration Example R1, and also Supplementary Explanations 2 and 3. Note that 16QAM, 64QAM, and 256QAM explained below may be applied to any of Embodiments 1 to 12, thereby obtaining the same effects as explained in Embodiments 1 to 12.

Figure 119:
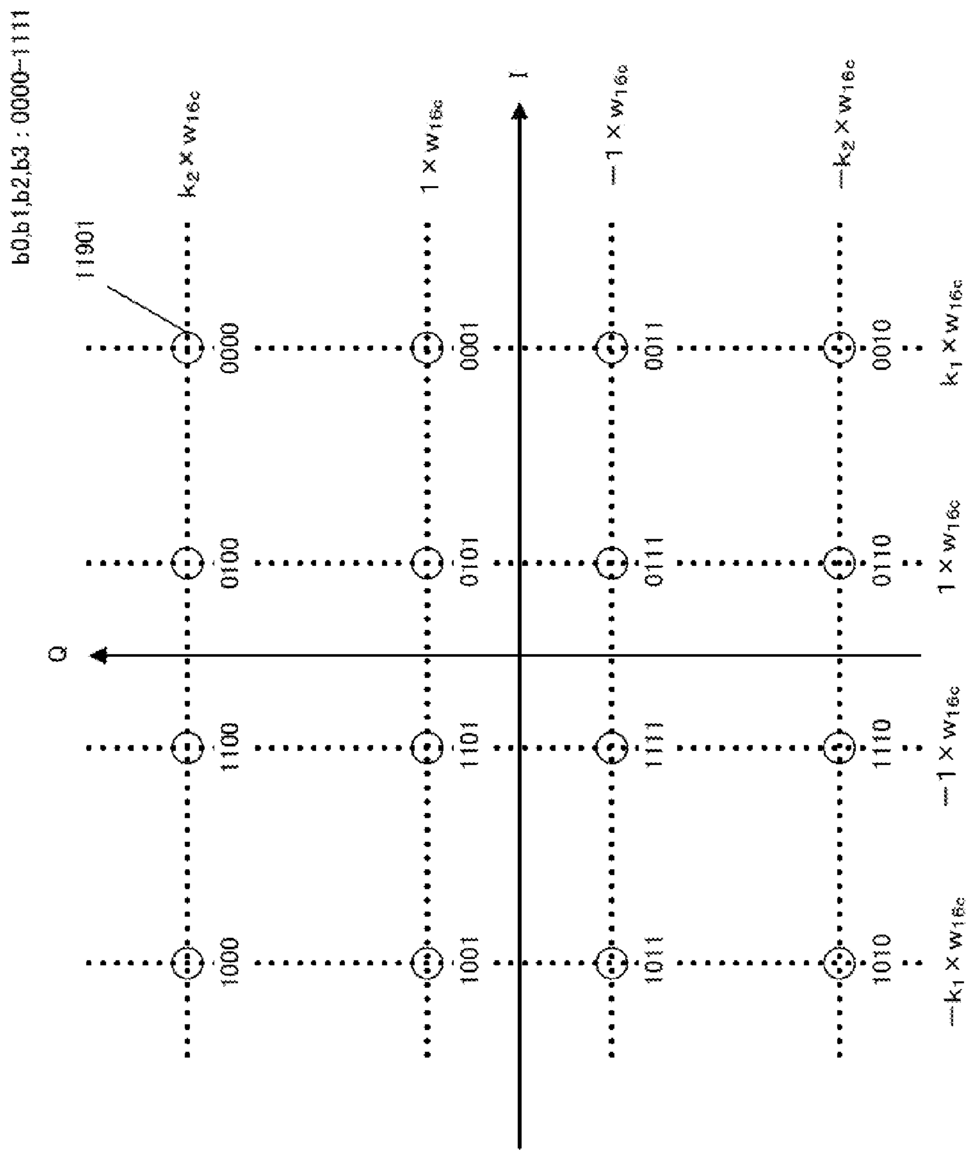
FIG. 119 shows an example of constellation of signal points for 16QAM in the I-Q plane.

A mapping scheme for 16QAM is explained below. FIG. 119 shows an example of a signal point constellation for 16QAM in an I (in-phase)-Q (quadrature(-phase)) plane. In FIG. 119, 16 circles represent signal points for 16QAM, and the horizontal and vertical axes respectively represent I and Q.

Also, in FIG. 119, $k_1>0$ (i.e., $k_1$ is a real number greater than 0), $k_2>0$ (i.e., $k_2$ is a real number greater than 0), $k_1\neq 1$, $k_2\neq 1$, and $k_1\neq k_2$ are satisfied.

Coordinates of the 16 signal points (i.e., the circles in FIG. 119) for 16QAM in the I (in-phase)-Q (quadrature(-phase)) plane are $(k_1\times w_{16c},k_2\times w_{16c})$, $(k_1\times w_{16c},1\times w_{16c})$, $(k_1\times w_{16c},-1\times w_{16c})$, $(k_1\times w_{16c},-k_2\times w_{16c})$, $(1\times w_{16c},k_2\times w_{16c})$, $(1\times w_{16c},1\times w_{16c})$, $(1\times w_{16c},-1\times w_{16c})$, $(1\times w_{16c},-k_2\times w_{16c})$, $(-1\times w_{16c},k_2\times w_{16c})$, $(-1\times w_{16c},1\times w_{16c})$, $(-1\times w_{16c},-1\times w_{16c})$, $(-1\times w_{16c},-k_2\times w_{16c})$, $(-k_1\times w_{16c},k_2\times w_{16c})$, $(-k_1\times w_{16c},1\times w_{16c})$, $(-k_1\times w_{16c},-1\times w_{16c})$, and $(-k_1\times w_{16c},-k_2\times w_{16c})$, where $w_{16c}$ is a real number greater than 0.

Here, transmitted bits (input bits) are represented by b0, b1, b2, and b3. For example, when (b0, b1, b2, b3)=(0, 0, 0, 0) for the transmitted bits, mapping is performed to a signal point 11901 in FIG. 119. When an in-phase component and a quadrature component of a baseband signal obtained as a result of mapping are respectively represented by I and Q, $(I, Q)=(k_1\times w_{16c}, k_2\times w_{16c})$ is satisfied.

That is to say, the in-phase component I and the quadrature component Q of the baseband signal obtained as a result of mapping (at the time of using 16QAM) are determined based on the transmitted bits (b0, b1, b2, and b3). FIG. 119 shows one example of relationship between the values (0000-1111) of the set of b0, b1, b2, and b3, and coordinates of the signal points. In FIG. 119, the values 0000-1111 of the set of b0, b1, b2, and b3 are shown directly below the 16 signal points (i.e., the circles in FIG. 119) for 16QAM which are $(k_1\times w_{16c},k_2\times w_{16c})$, $(k_1\times w_{16c},1\times w_{16c})$, $(k_1\times w_{16c},-1\times w_{16c})$, $(k_1\times w_{16c},-k_2\times w_{16c})$, $(1\times w_{16c},k_2\times w_{16c})$, $(1\times w_{16c},1\times w_{16c})$, $(1\times w_{16c},-1\times w_{16c})$, $(1\times w_{16c},-k_2\times w_{16c})$, $(-1\times w_{16c},k_2\times w_{16c})$, $(-1\times w_{16c},1\times w_{16c})$, $(-1\times w_{16c},-1\times w_{16c})$, $(-1\times w_{16c},-k_2\times w_{16c})$, $(-k_1\times w_{16c},k_2\times w_{16c})$, $(-k_1\times w_{16c},1\times w_{16c})$, $(-k_1\times w_{16c},-1\times w_{16c})$, and $(-k_1\times w_{16c},-k_2\times w_{16c})$, Coordinates in the I (in-phase)-Q (quadrature(-phase)) plane of the signal points directly above the values 0000-1111 of the set of b0, b1, b2, and b3 indicate the in-phase component I and the quadrature component Q of the baseband signal obtained as a result of mapping. Note that relationship between the values (0000-1111) of the set of b0, b1, b2, and b3, and coordinates of the signal points for 16QAM is not limited to the relationship shown in FIG. 119.

The 16 signal points shown in FIG. 119 are assigned names "signal point 1", "signal point 2", and so on up to "signal point 16". In other words, as there are 16 signal points, signal points 1-16 exist. In the I (in-phase)-Q (quadrature(-phase)) plane, a signal point i is separated from the origin by a distance Di. Thus, $w_{16c}$ can be calculated using Di as shown below.

[Math. 371]

$$w_{16c}=\frac{z}{\sqrt{\frac{\sum_{i=1}^{16}D_i^2}{16}}}=\frac{z}{\sqrt{\frac{\left(\begin{array}{l}(1^2+1^2)\times 4+(k_1^2+k_2^2)\times 4+\\(k_1^2+1^2)\times 4+(k_2^2+1^2)\times 4\end{array}\right)}{16}}}\tag{H7}$$

Consequently, the baseband signal obtained as a result of mapping has average power $z^2$. Effects for 16QAM described above are explained in detail further below.

Figure 120:
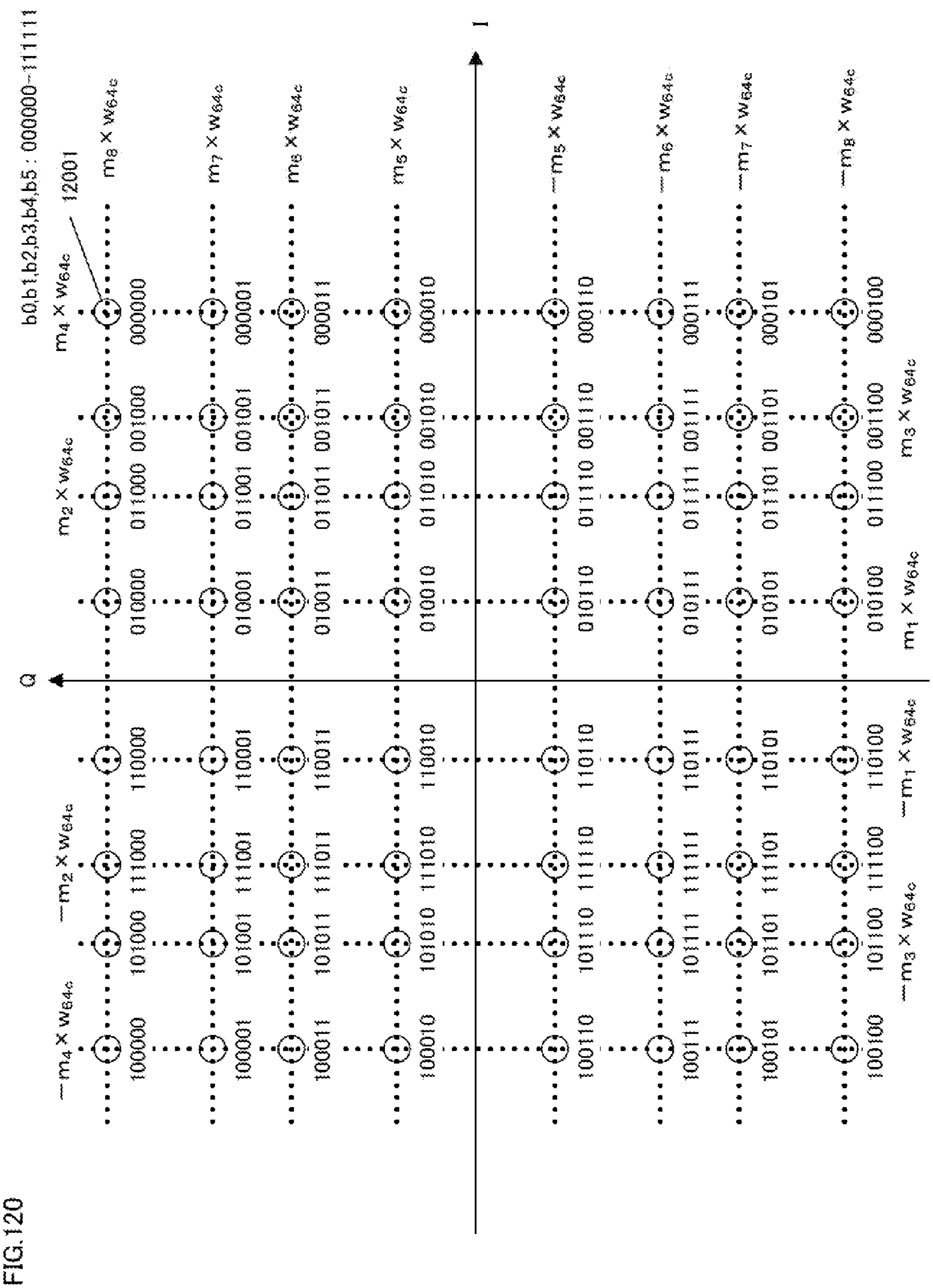

A mapping scheme for 64QAM is explained below. FIG. 120 shows an example of signal point constellation for 64QAM in an I (in-phase)-Q (quadrature(-phase)) plane. In FIG. 120, 64 circles represent signal points for 64QAM, and the horizontal and vertical axes respectively represent I and Q.

Also, in FIG. 120, either

"$m_1>0$ (i.e., $m_1$ is a real number greater than 0), $m_2>0$ (i.e., $m_2$ is a real number greater than 0), $m_3>0$ (i.e., $m_3$ is a real number greater than 0), $m_4>0$ (i.e., $m_4$ is a real number greater than 0), $m_5>0$ (i.e., $m_5$ is a real number greater than 0), $m_6>0$ (i.e., $m_6$ is a real number greater than 0), $m_7>0$ (i.e., $m_7$ is a real number greater than 0), and $m_8>0$ (i.e., $m_8$ is a real number greater than 0), $\{m_1\neq m_2, m_1\neq m_3, m_1\neq m_4, m_2\neq m_3, m_2\neq m_4, \text{ and } m_3\neq m_4\}$, $\{m_5\neq m_6, m_5\neq m_7, m_5\neq m_8, m_6\neq m_7, m_6\neq m_5, \text{ and } m_7\neq m_8\}$, and $\{m_1\neq m_5 \text{ or } m_2\neq m_6 \text{ or } m_3\neq m_7 \text{ or } m_4\neq m_8 \text{ hold true}\}$" is satisfied, or "$m_1>0$ (i.e., $m_1$ is a real number greater than 0), $m_2>0$ (i.e., $m_2$ is a real number greater than 0), $m_3>0$ (i.e., $m_3$ is a real number greater than 0), $m_4>0$ (i.e., $m_4$ is a real number greater than 0), $m_5>0$ (i.e., $m_5$ is a real number greater than 0), $m_6>0$ (i.e., $m_6$ is a real number greater than 0), $m_7>0$ (i.e., $m_7$ is a real number greater than 0), and $m_8>0$ (i.e., $m_8$ is a real number greater than 0), $\{m_1\neq m_2, m_1\neq m_3, m_1\neq m_4, m_2\neq m_3, m_2\neq m_4, \text{ and } m_3\neq m_4\}$, $\{m_5\neq m_6, m_5\neq m_7, m_5\neq m_8, m_6\neq m_7, m_6\neq m_8, \text{ and } m_7\neq m_8\}$, $\{m_1\neq m_5 \text{ or } m_2\neq m_6 \text{ or } m_3\neq m_7 \text{ or } m_4\neq m_8\}$, and $\{m_1=m_5 \text{ or } m_2=m_6 \text{ or } m_3=m_7 \text{ or } m_4=m_8 \text{ holds true}\}$" is satisfied.

Coordinates of the 64 signal points (i.e., the circles in FIG. 120) for 64QAM in the I (in-phase)-Q (quadrature(-phase)) plane are $(m_4\times w_{64c},m_8\times w_{64c})$, $(m_4\times w_{64c},m_7\times w_{64c})$, $(m_4\times w_{64c},m_6\times w_{64c})$, $(m_4\times w_{64c},m_5\times w_{64c})$, $(m_4\times w_{64c},-m_5\times w_{64c})$, $(m_4\times w_{64c},-m_6\times w_{64c})$, $(m_4\times w_{64c},-m_7\times w_{64c})$, $(m_4\times w_{64c},-m_8\times w_{64c})$, $(m_3\times w_{64c},m_8\times w_{64c})$, $(m_3\times w_{64c},m_7\times w_{64c})$, $(m_3\times w_{64c},m_6\times w_{64c})$, $(m_3\times w_{64c},m_5\times w_{64c})$, $(m_3\times w_{64c},-m_5\times w_{64c})$, $(m_3\times w_{64c},-m_6\times w_{64c})$, $(m_3\times w_{64c},-m_7\times w_{64c})$, $(m_3\times w_{64c},-m_8\times w_{64c})$, $(m_2\times w_{64c},m_8\times w_{64c})$, $(m_2\times w_{64c},m_7\times w_{64c})$, $(m_2\times w_{64c},m_6\times w_{64c})$, $(m_2\times w_{64c},m_5\times w_{64c})$, $(m_2\times w_{64c},-m_5\times w_{64c})$, $(m_2\times w_{64c},-m_6\times w_{64c})$, $(m_2\times w_{64c},-m_7\times w_{64c})$, $(m_2\times w_{64c},-m_8\times w_{64c})$, $(m_1 \times w_{64c}, m_8 \times w_{64c})$, $(m_1 \times w_{64c}, m_7 \times w_{64c})$, $(m_1 \times w_{64c}, m_6 \times w_{64c})$, $(m_1 \times w_{64c}, m_5 \times w_{64c})$, $(m_1 \times w_{64c}, -m_5 \times w_{64c})$, $(m_1 \times w_{64c}, -m_6 \times w_{64c})$, $(m_1 \times w_{64c}, -m_7 \times w_{64c})$, $(m_1 \times w_{64c}, -m_8 \times w_{64c})$, $(-m_1 \times w_{64c}, m_8 \times w_{64c})$, $(-m_1 \times w_{64c}, m_7 \times w_{64c})$, $(-m_1 \times w_{64c}, m_6 \times w_{64c})$, $(-m_1 \times w_{64c}, m_5 \times w_{64c})$, $(-m_1 \times w_{64c}, -m_5 \times w_{64c})$, $(-m_1 \times w_{64c}, -m_6 \times w_{64c})$, $(-m_1 \times w_{64c}, -m_7 \times w_{64c})$, $(-m_1 \times w_{64c}, -m_8 \times w_{64c})$, $(-m_2 \times w_{64c}, m_8 \times w_{64c})$, $(-m_2 \times w_{64c}, m_7 \times w_{64c})$, $(-m_2 \times w_{64c}, m_6 \times w_{64c})$, $(-m_2 \times w_{64c}, m_5 \times w_{64c})$, $(-m_2 \times w_{64c}, -m_5 \times w_{64c})$, $(-m_2 \times w_{64c}, -m_6 \times w_{64c})$, $(-m_2 \times w_{64c}, -m_7 \times w_{64c})$, $(-m_2 \times w_{64c}, -m_8 \times w_{64c})$, $(-m_3 \times w_{64c}, m_8 \times w_{64c})$, $(-m_3 \times w_{64c}, m_7 \times w_{64c})$, $(-m_3 \times w_{64c}, m_6 \times w_{64c})$, $(-m_3 \times w_{64c}, m_5 \times w_{64c})$, $(-m_3 \times w_{64c}, -m_5 \times w_{64c})$, $(-m_3 \times w_{64c}, -m_6 \times w_{64c})$, $(-m_3 \times w_{64c}, -m_7 \times w_{64c})$, $(-m_3 \times w_{64c}, -m_8 \times w_{64c})$, $(-m_4 \times w_{64c}, m_8 \times w_{64c})$, $(-m_4 \times w_{64c}, m_7 \times w_{64c})$, $(m_4 \times w_{64c}, m_6 \times w_{64c})$, $(-m_4 \times w_{64c}, m_5 \times w_{64c})$, $(-m_4 \times w_{64c}, -m_5 \times w_{64c})$, $(-m_4 \times w_{64c}, -m_6 \times w_{64c})$, $(-m_4 \times w_{64c}, -m_7 \times w_{64c})$, and $(-m_4 \times w_{64c}, -m_8 \times w_{64c})$, where $w_{64c}$ is a real number greater than 0.

Here transmitted bits (input bits) are represented by b0, b2, b3, b3, b4 and b5. For example, when (b0, b1, b2, b3, b4, b5)=(0, 0, 0, 0, 0, 0) for the transmitted bits, mapping is performed to a signal point 12001 in FIG. 120. When an in-phase component and a quadrature component of a baseband signal obtained as a result of mapping are respectively represented by I and Q, $(I, Q)=(m_4 \times w_{64c}, m_8 \times w_{64c})$ is satisfied.

That is to say, the in-phase component I and the quadrature component Q of the baseband signal obtained as a result of mapping (at the time of using 64QAM) are determined based on the transmitted bits (b0, b1, b2, b3, b4, and b5). FIG. 120 shows one example of relationship between values (000000-111111) of the set of b0, b1, b2, b3, b4, and b5, and coordinates of the signal points. In FIG. 120, the values 000000-111111 of the set of b0, b1, b2, b3, b4, and b5 are shown directly below the 64 signal points (i.e., the circles in FIG. 120) for 64QAM which are $(m_4 \times w_{64c}, m_8 \times w_{64c})$, $(m_4 \times w_{64c}, m_7 \times w_{64c})$, $(m_4 \times w_{64c}, m_6 \times w_{64c})$, $(m_4 \times w_{64c}, m_5 \times w_{64c})$, $(m_4 \times w_{64c}, -m_5 \times w_{64c})$, $(m_4 \times w_{64c}, -m_6 \times w_{64c})$, $(m_4 \times w_{64c}, -m_7 \times w_{64c})$, $(m_4 \times w_{64c}, -m_8 \times w_{64c})$, $(m_3 \times w_{64c}, m_8 \times w_{64c})$, $(m_3 \times w_{64c}, m_7 \times w_{64c})$, $(m_3 \times w_{64c}, m_6 \times w_{64c})$, $(m_3 \times w_{64c}, m_5 \times w_{64c})$, $(m_3 \times w_{64c}, -m_5 \times w_{64c})$, $(m_3 \times w_{64c}, -m_6 \times w_{64c})$, $(m_3 \times w_{64c}, -m_7 \times w_{64c})$, $(m_3 \times w_{64c}, -m_8 \times w_{64c})$, $(m_2 \times w_{64c}, m_8 \times w_{64c})$, $(m_2 \times w_{64c}, m_7 \times w_{64c})$, $(m_2 \times w_{64c}, m_6 \times w_{64c})$, $(m_2 \times w_{64c}, m_5 \times w_{64c})$, $(m_2 \times w_{64c}, -m_5 \times w_{64c})$, $(m_2 \times w_{64c}, -m_6 \times w_{64c})$, $(m_2 \times w_{64c}, -m_7 \times w_{64c})$, $(m_2 \times w_{64c}, -m_8 \times w_{64c})$, $(m_1 \times w_{64c}, m_8 \times w_{64c})$, $(m_1 \times w_{64c}, m_7 \times w_{64c})$, $(m_1 \times w_{64c}, m_6 \times w_{64c})$, $(m_1 \times w_{64c}, m_5 \times w_{64c})$, $(m_1 \times w_{64c}, -m_5 \times w_{64c})$, $(m_1 \times w_{64c}, -m_6 \times w_{64c})$, $(m_1 \times w_{64c}, -m_7 \times w_{64c})$, $(m_1 \times w_{64c}, -m_8 \times w_{64c})$, $(-m_1 \times w_{64c}, m_8 \times w_{64c})$, $(-m_1 \times w_{64c}, m_7 \times w_{64c})$, $(-m_1 \times w_{64c}, m_6 \times w_{64c})$, $(-m_1 \times w_{64c}, m_5 \times w_{64c})$, $(-m_1 \times w_{64c}, -m_5 \times w_{64c})$, $(-m_1 \times w_{64c}, -m_6 \times w_{64c})$, $(-m_1 \times w_{64c}, -m_7 \times w_{64c})$, $(-m_1 \times w_{64c}, -m_8 \times w_{64c})$, $(-m_2 \times w_{64c}, m_8 \times w_{64c})$, $(-m_2 \times w_{64c}, m_7 \times w_{64c})$, $(-m_2 \times w_{64c}, m_6 \times w_{64c})$, $(-m_2 \times w_{64c}, m_5 \times w_{64c})$, $(-m_2 \times w_{64c}, -m_5 \times w_{64c})$, $(-m_2 \times w_{64c}, -m_6 \times w_{64c})$, $(-m_2 \times w_{64c}, -m_7 \times w_{64c})$, $(-m_2 \times w_{64c}, -m_8 \times w_{64c})$, $(-m_3 \times w_{64c}, m_8 \times w_{64c})$, $(-m_3 \times w_{64c}, m_7 \times w_{64c})$, $(-m_3 \times w_{64c}, m_6 \times w_{64c})$, $(-m_3 \times w_{64c}, m_5 \times w_{64c})$, $(-m_3 \times w_{64c}, -m_5 \times w_{64c})$, $(-m_3 \times w_{64c}, -m_6 \times w_{64c})$, $(-m_3 \times w_{64c}, -m_7 \times w_{64c})$, $(-m_3 \times w_{64c}, -m_8 \times w_{64c})$, $(-m_4 \times w_{64c}, m_8 \times w_{64c})$, $(-m_4 \times w_{64c}, m_7 \times w_{64c})$, $(m_4 \times w_{64c}, m_6 \times w_{64c})$, $(-m_4 \times w_{64c}, m_5 \times w_{64c})$, $(-m_4 \times w_{64c}, -m_5 \times w_{64c})$, $(-m_4 \times w_{64c}, -m_6 \times w_{64c})$, $(-m_4 \times w_{64c}, -m_7 \times w_{64c})$, and $(-m_4 \times w_{64c}, -m_8 \times w_{64c})$.

Coordinates in the I (in-phase)-Q (quadrature(-phase)) plane of the signal points directly above the values 000000-111111 of the set of b0, b1, b2, b3, b4, and b5 indicate the in-phase component I and the quadrature component Q of the baseband signal obtained as a result of mapping. Note that relationship between the values (000000-111111) of the set of b0, b1, b2, b3, b4, and b5, and coordinates of the signal points for 64QAM is not limited to the relationship shown in FIG. 120.

The 64 signal points shown in FIG. 120 are assigned names "signal point 1", "signal point 2", and so on up to "signal point 64". In other words, as there are 64 signal points, signal points 1-64 exist. In the I (in-phase)-Q (quadrature(-phase)) plane, a signal point i is separated from the origin by a distance Di. $w_{64}$ can be calculated using Di as shown below.

[Math. 372]

$$w_{64c} = \frac{z}{\sqrt{\frac{\sum_{i=1}^{64} D_i^2}{64}}} \tag{H8}$$

Consequently, the baseband signal obtained as a result of mapping has average power $z^2$. Effects for 64QAM described above are explained in detail further below.

Figure 121:
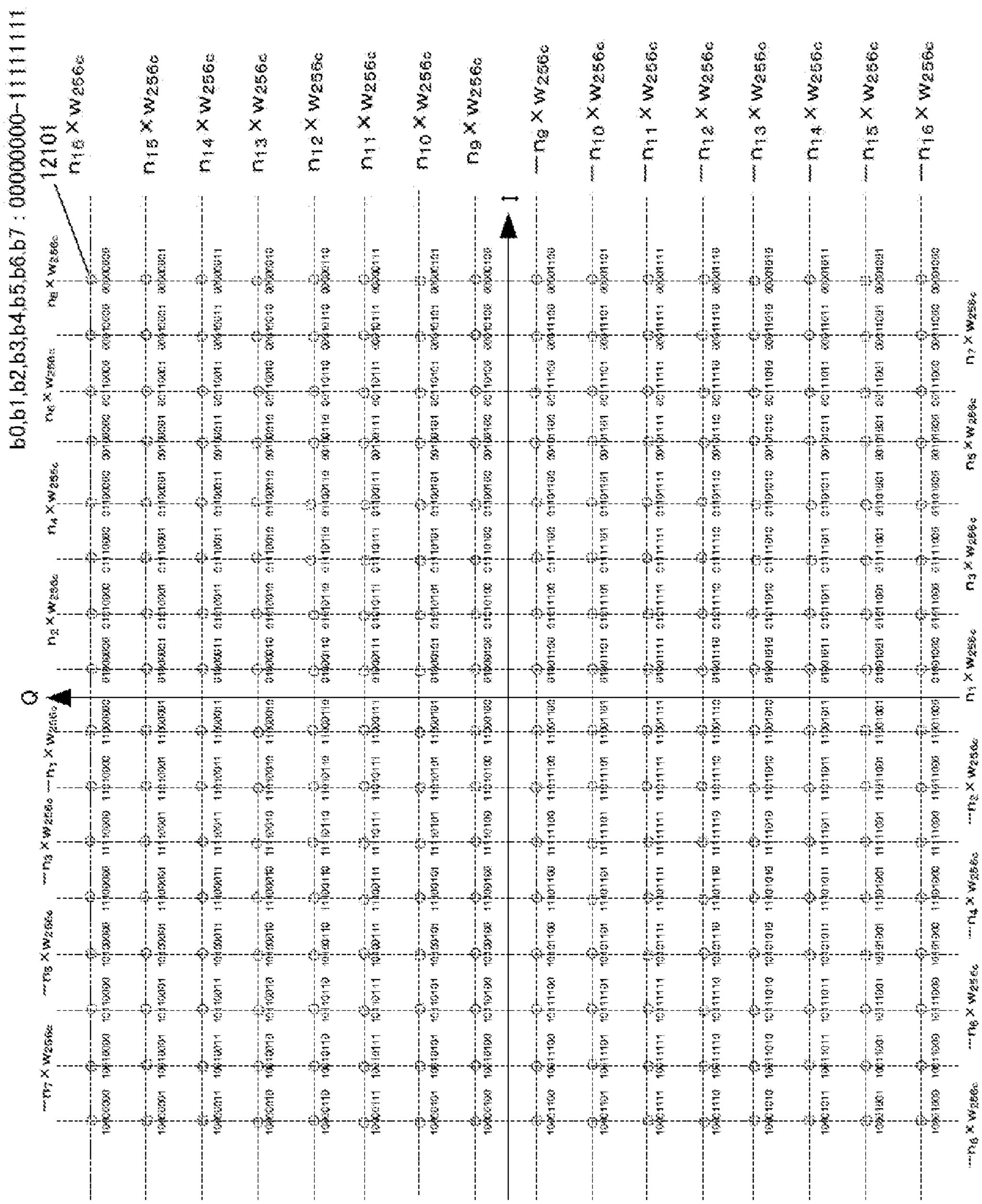

A mapping scheme for 256QAM is explained below. FIG. 121 shows an example of a signal point constellation for 256QAM in an I (in-phase)-Q (quadrature(-phase)) plane. In FIG. 121, 256 circles represent signal points for 256QAM, and the horizontal and vertical axes respectively represent I and Q.

Also, in FIG. 121, either

"$n_1>0$ (i.e., $n_1$ is a real number greater than 0), $n_2>0$ (i.e., $n_2$ is a real number greater than 0), $n_3>0$ (i.e., $n_3$ is a real number greater than 0), $n_4>0$ (i.e., $n_4$ is a real number greater than 0), $n_5>0$ (i.e., $n_5$ is a real number greater than 0), $n_6>0$ (i.e., $n_6$ is a real number greater than 0), $n_7>0$ (i.e., $n_7$ is a real number greater than 0), $n_8>0$ (i.e., no is a real number greater than 0), $n_9>0$ (i.e., $n_9$ is a real number greater than 0), $n_{10}>0$ (i.e., $n_{10}$ is a real number greater than 0), $n_{11}>0$ (i.e., $n_{11}$ is a real number greater than 0), $n_{12}>0$ (i.e., $n_{12}$ is a real number greater than 0), $n_{13}>0$ (i.e., $n_{13}$ is a real number greater than 0), $n_{14}>0$ (i.e., $n_{14}$ is a real number greater than 0), $n_{15}>0$ (i.e., $n_{15}$ is a real number greater than 0), and $n_{16}>0$ (i.e., nit is a real number greater than 0), $\{n_1 \neq n_2$, $n_1 \neq n_3$, $n_1 \neq n_4$, $n_1 \neq n_5$, $n_1 \neq n_6$, $n_1 \neq n_7$, $n_1 \neq n_8$,
$n_2 \neq n_3$, $n_2 \neq n_4$, $n_2 \neq n_5$, $n_2 \neq n_6$, $n_2 \neq n_7$, $n_2 \neq n_8$,
$n_3 \neq n_4$, $n_3 \neq n_5$, $n_3 \neq n_6$, $n_3 \neq n_7$, $n_3 \neq n_8$,
$n_4 \neq n_5$, $n_4 \neq n_6$, $n_4 \neq n_7$, $n_4 \neq n_8$,
$n_5 \neq n_6$, $n_5 \neq n_7$, $n_5 \neq n_8$,
$n_6 \neq n_7$, $n_6 \neq n_8$, and
$n_7 \neq n_8\}$,
$\{n_9 \neq n_{10}$, $n_9 \neq n_{11}$, $n_9 \neq n_{12}$, $n_9 \neq n_{13}$, $n_9 \neq n_{14}$, $n_9 \neq n_{15}$, $n_1 \neq n_{16}$,
$n_{10} \neq n_{11}$, $n_{10} \neq n_{12}$, $n_{10} \neq n_{13}$, $n_{10} \neq n_{14}$, $n_{10} \neq n_{15}$, $n_{10} \neq n_{16}$,
$n_{11} \neq n_{12}$, $n_{11} \neq n_{13}$, $n_{11} \neq n_{14}$, $n_{11} \neq n_{15}$, $n_{11} \neq n_{16}$,
$n_{12} \neq n_{13}$, $n_{12} \neq n_{14}$, $n_{12} \neq n_{15}$, $n_{12} \neq n_{16}$,
$n_{13} \neq n_{14}$, $n_{13} \neq n_{15}$, $n_{13} \neq n_{16}$,
$n_{14} \neq n_{15}$, $n_{14} \neq n_{16}$, and
$n_{15} \neq n_{16}\}$, and $\{n_1 \neq n_9$ or $n_2 \neq n_{10}$ or $n_3 \neq n_{11}$ or $n_4 \neq n_{12}$ or $n_5 \neq n_{13}$ or $n_6 \neq n_{14}$ or $n_7 \neq n_{15}$ or $n_8 \neq n_{16}$ holds true$\}$" is satisfied, or "$n_1>0$ (i.e., $n_1$ is a real number greater than 0), $n_2>0$ (i.e., $n_2$ is a real number greater than 0), $n_3>0$ (i.e., $n_3$ is a real number greater than 0), $n_4>0$ (i.e., $n_4$ is a real number greater than 0), $n_5>0$ (i.e., $n_5$ is a real number greater than 0), $n_6>0$ (i.e., $n_6$ is a real number greater than 0), $n_7>0$ (i.e., $n_7$ is a real number greater than 0), $n_8>0$ (i.e., no is a real number greater than 0), $n_9>0$ (i.e., $n_9$ is a real number greater than 0), $n_{10}>0$ (i.e., $n_{10}$ is a real number greater than 0), $n_{11}>0$ (i.e., $n_{11}$ is a real number greater than 0), $n_{12}>0$ (i.e., $n_{12}$ is a real number greater than 0), $n_{13}>0$ (i.e., $n_{13}$ is a real number greater than 0), $n_{14}>0$ (i.e., $n_{14}$ is a real number greater than 0), $n_{15}>0$ (i.e., $n_{15}$ is a real number greater than 0), and $n_{16}>0$ (i.e., $n_{16}$ is a real number greater than 0), $\{n_1 \neq n_2$, $n_1 \neq n_3$, $n_1 \neq n_4$, $n_1 \neq n_5$, $n_1 \neq n_6$, $n_1 \neq n_7$, $n_1 \neq n_8$,
$n_2 \neq n_3$, $n_2 \neq n_4$, $n_2 \neq n_5$, $n_2 \neq n_6$, $n_2 \neq n_7$, $n_2 \neq n_8$,
$n_3 \neq n_4$, $n_3 \neq n_5$, $n_3 \neq n_6$, $n_3 \neq n_7$, $n_3 \neq n_8$,
$n_4 \neq n_5$, $n_4 \neq n_6$, $n_4 \neq n_7$, $n_4 \neq n_8$,
$n_5 \neq n_6$, $n_5 \neq n_7$, $n_5 \neq n_8$,
$n_6 \neq n_7$, $n_6 \neq n_8$, and
$n_7 \neq n_8\}$, $\{n_9 \neq n_{10}$, $n_9 \neq n_{11}$, $n_9 \neq n_{12}$, $n_9 \neq n_{13}$, $n_9 \neq n_{14}$, $n_9 \neq n_{15}$, $n_1 \neq n_{16}$,
$n_{10} \neq n_{11}$, $n_{10} \neq n_{12}$, $n_{10} \neq n_{13}$, $n_{10} \neq n_{14}$, $n_{10} \neq n_{15}$, $n_{10} \neq n_{16}$,
$n_{11} \neq n_{12}$, $n_{11} \neq n_{13}$, $n_{11} \neq n_{14}$, $n_{11} \neq n_{15}$, $n_{11} \neq n_{16}$,
$n_{12} \neq n_{13}$, $n_{12} \neq n_{14}$, $n_{12} \neq n_{15}$, $n_{12} \neq n_{16}$,
$n_{13} \neq n_{14}$, $n_{13} \neq n_{15}$, $n_{13} \neq n_{16}$,
$n_{14} \neq n_{15}$, $n_{14} \neq n_{16}$, and
$n_{15} \neq n_{16}\}$, $\{n_1 \neq n_9$ or $n_2 \neq n_{10}$ or $n_3 \neq n_{11}$ or $n_4 \neq n_{12}$ or $n_5 \neq n_{13}$ or $n_6 \neq n_{14}$ or $n_7 \neq n_{15}$ or $n_8 \neq n_{16}$ holds true$\}$, and $\{n_1 = n_9$ or $n_2 = n_{10}$ or $n_3 = n_{11}$ or $n_4 = n_{12}$ or $n_5 = n_{13}$ or $n_6 = n_{14}$ or $n_7 = n_{15}$ or $n_8 = n_{16}$ holds true$\}$" is satisfied.

Coordinates of the 256 signal points (i.e., the circles in FIG. 121) for 256QAM in the I (in-phase)-Q (quadrature (-phase)) plane are $(n_8 \times w_{256c}, n_{16} \times w_{256c})$, $(n_8 \times w_{256c}, n_{15} \times w_{256c})$, $(n_8 \times w_{256c}, n_{14} \times w_{256c})$, $(n_8 \times w_{256c}, n_{13} \times w_{256c})$, $(n_8 \times w_{256c}, n_{12} \times w_{256c})$, $(n_8 \times w_{256c}, n_{11} \times w_{256c})$, $(n_8 \times w_{256c}, n_{10} \times w_{256c})$, $(n_8 \times w_{256c}, n_9 \times w_{256c})$, $(n_8 \times w_{256c}, -n_{16} \times w_{256c})$, $(n_8 \times w_{256c}, -n_{15} \times w_{256c})$, $(n_8 \times w_{256c}, -n_{14} \times w_{256c})$, $(n_8 \times w_{256c}, -n_{13} \times w_{256c})$, $(n_8 \times w_{256c}, -n_{12} \times w_{256c})$, $(n_8 \times w_{256c}, -n_{11} \times w_{256c})$, $(n_8 \times w_{256c}, -n_{10} \times w_{256c})$, $(n_8 \times w_{256c}, -n_9 \times w_{256c})$, $(n_7 \times w_{256c}, n_{16} \times w_{256c})$, $(n_7 \times w_{256c}, n_{15} \times w_{256c})$, $(n_7 \times w_{256c}, n_{14} \times w_{256c})$, $(n_7 \times w_{256c}, n_{13} \times w_{256c})$, $(n_7 \times w_{256c}, n_{12} \times w_{256c})$, $(n_7 \times w_{256c}, n_{11} \times w_{256c})$, $(n_7 \times w_{256c}, n_{10} \times w_{256c})$, $(n_7 \times w_{256c}, n_9 \times w_{256c})$, $(n_7 \times w_{256c}, -n_{16} \times w_{256c})$, $(n_7 \times w_{256c}, -n_{15} \times w_{256c})$, $(n_7 \times w_{256c}, -n_{14} \times w_{256c})$, $(n_7 \times w_{256c}, -n_{13} \times w_{256c})$, $(n_7 \times w_{256c}, -n_{12} \times w_{256c})$, $(n_7 \times w_{256c}, -n_{11} \times w_{256c})$, $(n_7 \times w_{256c}, -n_{10} \times w_{256c})$, $(n_7 \times w_{256c}, -n_9 \times w_{256c})$, $(n_6 \times w_{256c}, n_{16} \times w_{256c})$, $(n_6 \times w_{256c}, n_{15} \times w_{256c})$, $(n_6 \times w_{256c}, n_{14} \times w_{256c})$, $(n_6 \times w_{256c}, n_{13} \times w_{256c})$, $(n_6 \times w_{256c}, n_{12} \times w_{256c})$, $(n_6 \times w_{256c}, n_{11} \times w_{256c})$, $(n_6 \times w_{256c}, n_{10} \times w_{256c})$, $(n_2 \times w_{256c}, n_9 \times w_{256c})$, $(n_6 \times w_{256c}, -n_{16} \times w_{256c})$, $(n_6 \times w_{256c}, -n_{15} \times w_{256c})$, $(n_6 \times w_{256c}, -n_{14} \times w_{256c})$, $(n_6 \times w_{256c}, -n_{13} \times w_{256c})$, $(n_6 \times w_{256c}, -n_{12} \times w_{256c})$, $(n_6 \times w_{256c}, -n_{11} \times w_{256c})$, $(n_6 \times w_{256c}, -n_{10} \times w_{256c})$, $(n_6 \times w_{256c}, -n_9 \times w_{256c})$, $(n_5 \times w_{256c}, n_{16} \times w_{256c})$, $(n_5 \times w_{256c}, n_{15} \times w_{256c})$, $(n_5 \times w_{256c}, n_{14} \times w_{256c})$, $(n_5 \times w_{256c}, n_{13} \times w_{256c})$, $(n_5 \times w_{256c}, n_{12} \times w_{256c})$, $(n_5 \times w_{256c}, n_{11} \times w_{256c})$, $(n_5 \times w_{256c}, n_{10} \times w_{256c})$, $(n_5 \times w_{256c}, n_9 \times w_{256c})$, $(n_5 \times w_{256c}, -n_{16} \times w_{256c})$, $(n_5 \times w_{256c}, -n_{15} \times w_{256c})$, $(n_5 \times w_{256c}, -n_{14} \times w_{256c})$, $(n_5 \times w_{256c}, -n_{13} \times w_{256c})$, $(n_5 \times w_{256c}, -n_{12} \times w_{256c})$, $(n_5 \times w_{256c}, -n_{11} \times w_{256c})$, $(n_5 \times w_{256c}, -n_{13} \times w_{256c})$, $(n_5 \times w_{256c}, -n_9 \times w_{256c})$, $(n_4 \times w_{256c}, n_{16} \times w_{256c})$, $(n_4 \times w_{256c}, n_{15} \times w_{256c})$, $(n_4 \times w_{256c}, n_{14} \times w_{256c})$, $(n_4 \times w_{256c}, n_{13} \times w_{256c})$, $(n_4 \times w_{256c}, n_{12} \times w_{256c})$, $(n_4 \times w_{256c}, n_{11} \times w_{256c})$, $(n_4 \times w_{256c}, n_{10} \times w_{256c})$, $(n_4 \times w_{256c}, n_9 \times w_{256c})$, $(n_4 \times w_{256c}, -n_{16} \times w_{256c})$, $(n_4 \times w_{256c}, -n_{15} \times w_{256c})$, $(n_4 \times w_{256c}, -n_{14} \times w_{256c})$, $(n_4 \times w_{256c}, -n_{13} \times w_{256c})$, $(n_4 \times w_{256c}, -n_{12} \times w_{256c})$, $(n_4 \times w_{256c}, -n_{11} \times w_{256c})$, $(n_4 \times w_{256c}, -n_{13} \times w_{256c})$, $(n_4 \times w_{256c}, -n_9 \times w_{256c})$, $(n_3 \times w_{256c}, n_{16} \times w_{256c})$, $(n_3 \times w_{256c}, n_{15} \times w_{256c})$, $(n_3 \times w_{256c}, n_{14} \times w_{256c})$, $(n_3 \times w_{256c}, n_{13} \times w_{256c})$, $(n_3 \times w_{256c}, n_{12} \times w_{256c})$, $(n_3 \times w_{256c}, n_{11} \times w_{256c})$, $(n_3 \times w_{256c}, n_{10} \times w_{256c})$, $(n_3 \times w_{256c}, n_9 \times w_{256c})$, $(n_3 \times w_{256c}, -n_{16} \times w_{256c})$, $(n_3 \times w_{256c}, -n_{15} \times w_{256c})$, $(n_3 \times w_{256c}, -n_{14} \times w_{256c})$, $(n_3 \times w_{256c}, -n_{13} \times w_{256c})$, $(n_3 \times w_{256c}, -n_{12} \times w_{256c})$, $(n_3 \times w_{256c}, -n_{11} \times w_{256c})$, $(n_3 \times w_{256c}, -n_{10} \times w_{256c})$, $(n_3 \times w_{256c}, -n_9 \times w_{256c})$, $(n_2 \times w_{256c}, n_{16} \times w_{256c})$, $(n_2 \times w_{256c}, n_{15} \times w_{256c})$, $(n_2 \times w_{256c}, n_{14} \times w_{256c})$, $(n_2 \times w_{256c}, n_{13} \times w_{256c})$, $(n_2 \times w_{256c}, n_{12} \times w_{256c})$, $(n_2 \times w_{256c}, n_{11} \times w_{256c})$, $(n_2 \times w_{256c}, n_{10} \times w_{256c})$, $(n_2 \times w_{256c}, n_9 \times w_{256c})$, $(n_2 \times w_{256c}, -n_{16} \times w_{256c})$, $(n_2 \times w_{256c}, -n_{15} \times w_{256c})$, $(n_2 \times w_{256c}, -n_{14} \times w_{256c})$, $(n_2 \times w_{256c}, -n_{13} \times w_{256c})$, $(n_2 \times w_{256c}, -n_{12} \times w_{256c})$, $(n_2 \times w_{256c}, -n_{11} \times w_{256c})$, $(n_2 \times w_{256c}, -n_{10} \times w_{256c})$, $(n_2 \times w_{256c}, -n_9 \times w_{256c})$, $(n_1 \times w_{256c}, n_{16} \times w_{256c})$, $(n_1 \times w_{256c}, n_{15} \times w_{256c})$, $(n_1 \times w_{256c}, n_{14} \times w_{256c})$, $(n_1 \times w_{256c}, n_{13} \times w_{256c})$, $(n_1 \times w_{256c}, n_{12} \times w_{256c})$, $(n_1 \times w_{256c}, n_{11} \times w_{256c})$, $(n_1 \times w_{256c}, n_{10} \times w_{256c})$, $(n_1 \times w_{256c}, n_9 \times w_{256c})$, $(n_1 \times w_{256c}, -n_{16} \times w_{256c})$, $(n_1 \times w_{256c}, -n_{15} \times w_{256c})$, $(n_1 \times w_{256c}, -n_{14} \times w_{256c})$, $(n_1 \times w_{256c}, -n_{13} \times w_{256c})$, $(n_1 \times w_{256c}, -n_{12} \times w_{256c})$, $(n_1 \times w_{256c}, -n_{11} \times w_{256c})$, $(n_1 \times w_{256c}, -n_{10} \times w_{256c})$, $(n_1 \times w_{256c}, -n_9 \times w_{256c})$, $(-n_8 \times w_{256c}, n_{16} \times w_{256c})$, $(-n_8 \times w_{256c}, n_{15} \times w_{256c})$, $(-n_8 \times w_{256c}, n_{14} \times w_{256c})$, $(-n_8 \times w_{256c}, n_{13} \times w_{256c})$, $(-n_8 \times w_{256c}, n_{12} \times w_{256c})$, $(-n_8 \times w_{256c}, n_{11} \times w_{256c})$, $(-n_8 \times w_{256c}, n_{10} \times w_{256c})$, $(-n_8 \times w_{256c}, n_9 \times w_{256c})$, $(-n_8 \times w_{256c}, -n_{16} \times w_{256c})$, $(-n_8 \times w_{256c}, -n_{15} \times w_{256c})$, $(-n_8 \times w_{256c}, -n_{14} \times w_{256c})$, $(-n_8 \times w_{256c}, -n_{13} \times w_{256c})$, $(-n_8 \times w_{256c}, -n_{12} \times w_{256c})$, $(-n_8 \times w_{256c}, -n_{11} \times w_{256c})$, $(-n_8 \times w_{256c}, -n_{10} \times w_{256c})$, $(-n_8 \times w_{256c}, -n_9 \times w_{256c})$, $(-n_7 \times w_{256c}, n_{16} \times w_{256c})$, $(-n_7 \times w_{256c}, n_{15} \times w_{256c})$, $(-n_7 \times w_{256c}, n_{14} \times w_{256c})$, $(-n_7 \times w_{256c}, n_{13} \times w_{256c})$, $(-n_7 \times w_{256c}, n_{12} \times w_{256c})$, $(-n_7 \times w_{256c}, n_{11} \times w_{256c})$, $(-n_7 \times w_{256c}, n_{10} \times w_{256c})$, $(-n_7 \times w_{256c}, n_9 \times w_{256c})$, $(-n_7 \times w_{256c}, -n_{16} \times w_{256c})$, $(-n_7 \times w_{256c}, -n_{15} \times w_{256c})$, $(-n_7 \times w_{256c}, -n_{14} \times w_{256c})$, $(-n_7 \times w_{256c}, -n_{13} \times w_{256c})$, $(-n_7 \times w_{256c}, -n_{12} \times w_{256c})$, $(-n_7 \times w_{256c}, -n_{11} \times w_{256c})$, $(-n_7 \times w_{256c}, -n_{10} \times w_{256c})$, $(-n_7 \times w_{256c}, -n_9 \times w_{256c})$, $(-n_6 \times w_{256c}, n_{16} \times w_{256c})$, $(-n_6 \times w_{256c}, n_{15} \times w_{256c})$, $(-n_6 \times w_{256c}, n_{14} \times w_{256c})$, $(-n_6 \times w_{256c}, n_{13} \times w_{256c})$, $(-n_6 \times w_{256c}, n_{12} \times w_{256c})$, $(-n_6 \times w_{256c}, n_{11} \times w_{256c})$, $(-n_6 \times w_{256c}, n_{10} \times w_{256c})$, $(-n_2 \times w_{256c}, n_9 \times w_{256c})$, $(-n_6 \times w_{256c}, -n_{16} \times w_{256c})$, $(-n_6 \times w_{256c}, -n_{15} \times w_{256c})$, $(-n_6 \times w_{256c}, -n_{14} \times w_{256c})$, $(-n_6 \times w_{256c}, -n_{13} \times w_{256c})$, $(-n_6 \times w_{256c}, -n_{12} \times w_{256c})$, $(-n_6 \times w_{256c}, -n_{11} \times w_{256c})$, $(-n_6 \times w_{256c}, -n_{10} \times w_{256c})$, $(-n_6 \times w_{256c}, -n_9 \times w_{256c})$, $(-n_5 \times w_{256c}, n_{16} \times w_{256c})$, $(-n_5 \times w_{256c}, n_{15} \times w_{256c})$, $(-n_5 \times w_{256c}, n_{14} \times w_{256c})$, $(-n_5 \times w_{256c}, n_{13} \times w_{256c})$, $(-n_5 \times w_{256c}, n_{12} \times w_{256c})$, $(-n_5 \times w_{256c}, n_{11} \times w_{256c})$, $(-n_5 \times w_{256c}, n_{10} \times w_{256c})$, $(-n_5 \times w_{256c}, n_9 \times w_{256c})$, $(-n_5 \times w_{256c}, -n_{16} \times w_{256c})$, $(-n_5 \times w_{256c}, -n_{15} \times w_{256c})$, $(-n_5 \times w_{256c}, -n_{14} \times w_{256c})$, $(-n_5 \times w_{256c}, -n_{13} \times w_{256c})$, $(-n_5 \times w_{256c}, -n_{12} \times w_{256c})$, $(-n_5 \times w_{256c}, -n_{11} \times w_{256c})$, $(-n_5 \times w_{256c}, -n_{13} \times w_{256c})$, $(-n_5 \times w_{256c}, -n_9 \times w_{256c})$, $(-n_4 \times w_{256c}, n_{16} \times w_{256c})$, $(-n_4 \times w_{256c}, n_{15} \times w_{256c})$, $(-n_4 \times w_{256c}, n_{14} \times w_{256c})$, $(-n_4 \times w_{256c}, n_{13} \times w_{256c})$, $(-n_4 \times w_{256c}, n_{12} \times w_{256c})$, $(-n_4 \times w_{256c}, n_{11} \times w_{256c})$, $(-n_4 \times w_{256c}, n_{10} \times w_{256c})$, $(-n_4 \times w_{256c}, n_9 \times w_{256c})$, $(-n_4 \times w_{256c}, -n_{16} \times w_{256c})$, $(-n_4 \times w_{256c}, -n_{15} \times w_{256c})$, $(-n_4 \times w_{256c}, -n_{14} \times w_{256c})$, $(-n_4 \times w_{256c}, -n_{13} \times w_{256c})$, $(-n_4 \times w_{256c}, -n_{12} \times w_{256c})$, $(-n_4 \times w_{256c}, -n_{11} \times w_{256c})$, $(-n_4 \times w_{256c}, -n_{13} \times w_{256c})$, $(-n_4 \times w_{256c}, -n_9 \times w_{256c})$, $(-n_3\times w_{256c},n_{16}\times w_{256c})$, $(-n_3\times w_{256c},n_{15}\times w_{256c})$, $(-n_3\times w_{256c},n_{14}\times w_{256c})$, $(-n_3\times w_{256c},n_{13}\times w_{256c})$, $(-n_3\times w_{256c},n_{12}\times w_{256c})$, $(-n_3\times w_{256c},n_{11}\times w_{256c})$, $(-n_3\times w_{256c},n_{10}\times w_{256c})$, $(-n_3\times w_{256c},n_9\times w_{256c})$, $(-n_3\times w_{256c},-n_{16}\times w_{256c})$, $(-n_3\times w_{256c},-n_{15}\times w_{256c})$, $(-n_3\times w_{256c},-n_{14}\times w_{256c})$, $(-n_3\times w_{256c},-n_{13}\times w_{256c})$, $(-n_3\times w_{256c},-n_{12}\times w_{256c})$, $(-n_3\times w_{256c},-n_{11}\times w_{256c})$, $(-n_3\times w_{256c},-n_{10}\times w_{256c})$, $(-n_3\times w_{256c},-n_9\times w_{256c})$, $(-n_2\times w_{256c},n_{16}\times w_{256c})$, $(-n_2\times w_{256c},n_{15}\times w_{256c})$, $(-n_2\times w_{256c},n_{14}\times w_{256c})$, $(-n_2\times w_{256c},n_{13}\times w_{256c})$, $(-n_2\times w_{256c},n_{12}\times w_{256c})$, $(-n_2\times w_{256c},n_{11}\times w_{256c})$, $(-n_2\times w_{256c},n_{10}\times w_{256c})$, $(-n_2\times w_{256c},n_9\times w_{256c})$, $(-n_2\times w_{256c},-n_{16}\times w_{256c})$, $(-n_2\times w_{256c},-n_{15}\times w_{256c})$, $(-n_2\times w_{256c},-n_{14}\times w_{256c})$, $(-n_2\times w_{256c},-n_{13}\times w_{256c})$, $(-n_2\times w_{256c},-n_{12}\times w_{256c})$, $(-n_2\times w_{256c},-n_{11}\times w_{256c})$, $(-n_2\times w_{256c},-n_{10}\times w_{256c})$, $(-n_2\times w_{256c},-n_9\times w_{256c})$, $(-n_1\times w_{256c},n_{16}\times w_{256c})$, $(-n_1\times w_{256c},n_{15}\times w_{256c})$, $(-n_1\times w_{256c},n_{14}\times w_{256c})$, $(-n_1\times w_{256c},n_{13}\times w_{256c})$, $(-n_1\times w_{256c},n_{12}\times w_{256c})$, $(-n_1\times w_{256c},n_{11}\times w_{256c})$, $(-n_1\times w_{256c},n_{10}\times w_{256c})$, $(-n_1\times w_{256c},n_9\times w_{256c})$, $(-n_1\times w_{256c},-n_{16}\times w_{256c})$, $(-n_1\times w_{256c},-n_{15}\times w_{256c})$, $(-n_1\times w_{256c},-n_{14}\times w_{256c})$, $(-n_1\times w_{256c},-n_{13}\times w_{256c})$, $(-n_1\times w_{256c},-n_{12}\times w_{256c})$, $(-n_1\times w_{256c},-n_{11}\times w_{256c})$, $(-n_1\times w_{256c},-n_{10}\times w_{256c})$, $(-n_1\times w_{256c},-n_9\times w_{256c})$, where $w_{256c}$ is a real number greater than 0.

Here, transmitted bits (input bits) are represented by b0, b1, b2, b3, b4, b5, b6, and b7. For example, when (b0, b1, b2, b3, b4, b5, b6, b7)=(0, 0, 0, 0, 0, 0, 0, 0) for the transmitted bits, mapping is performed to signal point 12101 in FIG. 121. When an in-phase component and a quadrature component of a baseband signal obtained as a result of mapping are respectively represented by I and Q, $(I, Q)=(n_8\times w_{256c}, n_{16}\times w_{256c})$ is satisfied.

That is to say, the in-phase component I and the quadrature component Q of the baseband signal obtained as a result of mapping (at the time of using 256QAM) are determined based on the transmitted bits (b0, b1, b2, b3, b4, b5, b6, and b7). FIG. 121 shows one example of relationship between values (00000000-11111111) of the set of b0, b1, b2, b3, b4, b5, b6, and b7, and coordinates of the signal points. In FIG. 121, the values 00000000-11111111 of the set of b0, b1, b2, b3, b4, b5, b6, and b7 are shown directly below the 256 signal points (i.e., the circles in FIG. 121) for 256QAM which are $(n_8\times w_{256c},n_{16}\times w_{256c})$, $(n_8\times w_{256c},n_{15}\times w_{256c})$, $(n_8\times w_{256c},n_{14}\times w_{256c})$, $(n_8\times w_{256c},n_{13}\times w_{256c})$, $(n_8\times w_{256c},n_{12}\times w_{256c})$, $(n_8\times w_{256c},n_{11}\times w_{256c})$, $(n_8\times w_{256c},n_{10}\times w_{256c})$, $(n_8\times w_{256c},n_9\times w_{256c})$, $(n_8\times w_{256c},-n_{16}\times w_{256c})$, $(n_8\times w_{256c},-n_{15}\times w_{256c})$, $(n_8\times w_{256c},-n_{14}\times w_{256c})$, $(n_8\times w_{256c},-n_{13}\times w_{256c})$, $(n_8\times w_{256c},-n_{12}\times w_{256c})$, $(n_8\times w_{256c},-n_{11}\times w_{256c})$, $(n_8\times w_{256c},-n_{10}\times w_{256c})$, $(n_8\times w_{256c},-n_9\times w_{256c})$, $(n_7\times w_{256c},n_{16}\times w_{256c})$, $(n_7\times w_{256c},n_{15}\times w_{256c})$, $(n_7\times w_{256c},n_{14}\times w_{256c})$, $(n_7\times w_{256c},n_{13}\times w_{256c})$, $(n_7\times w_{256c},n_{12}\times w_{256c})$, $(n_7\times w_{256c},n_{11}\times w_{256c})$, $(n_7\times w_{256c},n_{10}\times w_{256c})$, $(n_7\times w_{256c},n_9\times w_{256c})$, $(n_7\times w_{256c},-n_{16}\times w_{256c})$, $(n_7\times w_{256c},-n_{15}\times w_{256c})$, $(n_7\times w_{256c},-n_{14}\times w_{256c})$, $(n_7\times w_{256c},-n_{13}\times w_{256c})$, $(n_7\times w_{256c},-n_{12}\times w_{256c})$, $(n_7\times w_{256c},-n_{11}\times w_{256c})$, $(n_7\times w_{256c},-n_{10}\times w_{256c})$, $(n_7\times w_{256c},-n_9\times w_{256c})$, $(n_6\times w_{256c},n_{16}\times w_{256c})$, $(n_6\times w_{256c},n_{15}\times w_{256c})$, $(n_6\times w_{256c},n_{14}\times w_{256c})$, $(n_6\times w_{256c},n_{13}\times w_{256c})$, $(n_6\times w_{256c},n_{12}\times w_{256c})$, $(n_6\times w_{256c},n_{11}\times w_{256c})$, $(n_6\times w_{256c},n_{10}\times w_{256c})$, $(n_2\times w_{256c},n_9\times w_{256c})$, $(n_6\times w_{256c},-n_{16}\times w_{256c})$, $(n_6\times w_{256c},-n_{15}\times w_{256c})$, $(n_6\times w_{256c},-n_{14}\times w_{256c})$, $(n_6\times w_{256c},-n_{13}\times w_{256c})$, $(n_6\times w_{256c},-n_{12}\times w_{256c})$, $(n_6\times w_{256c},-n_{11}\times w_{256c})$, $(n_6\times w_{256c},-n_{10}\times w_{256c})$, $(n_6\times w_{256c},-n_9\times w_{256c})$, $(n_5\times w_{256c},n_{16}\times w_{256c})$, $(n_5\times w_{256c},n_{15}\times w_{256c})$, $(n_5\times w_{256c},n_{14}\times w_{256c})$, $(n_5\times w_{256c},n_{13}\times w_{256c})$, $(n_5\times w_{256c},n_{12}\times w_{256c})$, $(n_5\times w_{256c},n_{11}\times w_{256c})$, $(n_5\times w_{256c},n_{10}\times w_{256c})$, $(n_5\times w_{256c},n_9\times w_{256c})$, $(n_5\times w_{256c},-n_{16}\times w_{256c})$, $(n_5\times w_{256c},-n_{15}\times w_{256c})$, $(n_5\times w_{256c},-n_{14}\times w_{256c})$, $(n_5\times w_{256c},-n_{13}\times w_{256c})$, $(n_5\times w_{256c},-n_{12}\times w_{256c})$, $(n_5\times w_{256c},-n_{11}\times w_{256c})$, $(n_5\times w_{256c},-n_{13}\times w_{256c})$, $(n_5\times w_{256c},-n_9\times w_{256c})$, $(n_4\times w_{256c},n_{16}\times w_{256c})$, $(n_4\times w_{256c},n_{15}\times w_{256c})$, $(n_4\times w_{256c},n_{14}\times w_{256c})$, $(n_4\times w_{256c},n_{13}\times w_{256c})$, $(n_4\times w_{256c},n_{12}\times w_{256c})$, $(n_4\times w_{256c},n_{11}\times w_{256c})$, $(n_4\times w_{256c},n_{10}\times w_{256c})$, $(n_4\times w_{256c},n_9\times w_{256c})$, $(n_4\times w_{256c},-n_{16}\times w_{256c})$, $(n_4\times w_{256c},-n_{15}\times w_{256c})$, $(n_4\times w_{256c},-n_{14}\times w_{256c})$, $(n_4\times w_{256c},-n_{13}\times w_{256c})$, $(n_4\times w_{256c},-n_{12}\times w_{256c})$, $(n_4\times w_{256c},-n_{11}\times w_{256c})$, $(n_4\times w_{256c},-n_{13}\times w_{256c})$, $(n_4\times w_{256c},-n_9\times w_{256c})$, $(n_3\times w_{256c},n_{16}\times w_{256c})$, $(n_3\times w_{256c},n_{15}\times w_{256c})$, $(n_3\times w_{256c},n_{14}\times w_{256c})$, $(n_3\times w_{256c},n_{13}\times w_{256c})$, $(n_3\times w_{256c},n_{12}\times w_{256c})$, $(n_3\times w_{256c},n_{11}\times w_{256c})$, $(n_3\times w_{256c},n_{10}\times w_{256c})$, $(n_3\times w_{256c},n_9\times w_{256c})$, $(n_3\times w_{256c},-n_{16}\times w_{256c})$, $(n_3\times w_{256c},-n_{15}\times w_{256c})$, $(n_3\times w_{256c},-n_{14}\times w_{256c})$, $(n_3\times w_{256c},-n_{13}\times w_{256c})$, $(n_3\times w_{256c},-n_{12}\times w_{256c})$, $(n_3\times w_{256c},-n_{11}\times w_{256c})$, $(n_3\times w_{256c},-n_{10}\times w_{256c})$, $(n_3\times w_{256c},-n_9\times w_{256c})$, $(n_2\times w_{256c},n_{16}\times w_{256c})$, $(n_2\times w_{256c},n_{15}\times w_{256c})$, $(n_2\times w_{256c},n_{14}\times w_{256c})$, $(n_2\times w_{256c},n_{13}\times w_{256c})$, $(n_2\times w_{256c},n_{12}\times w_{256c})$, $(n_2\times w_{256c},n_{11}\times w_{256c})$, $(n_2\times w_{256c},n_{10}\times w_{256c})$, $(n_2\times w_{256c},n_9\times w_{256c})$, $(n_2\times w_{256c},-n_{16}\times w_{256c})$, $(n_2\times w_{256c},-n_{15}\times w_{256c})$, $(n_2\times w_{256c},-n_{14}\times w_{256c})$, $(n_2\times w_{256c},-n_{13}\times w_{256c})$, $(n_2\times w_{256c},-n_{12}\times w_{256c})$, $(n_2\times w_{256c},-n_{11}\times w_{256c})$, $(n_2\times w_{256c},-n_{10}\times w_{256c})$, $(n_2\times w_{256c},-n_9\times w_{256c})$, $(n_1\times w_{256c},n_{16}\times w_{256c})$, $(n_1\times w_{256c},n_{15}\times w_{256c})$, $(n_1\times w_{256c},n_{14}\times w_{256c})$, $(n_1\times w_{256c},n_{13}\times w_{256c})$, $(n_1\times w_{256c},n_{12}\times w_{256c})$, $(n_1\times w_{256c},n_{11}\times w_{256c})$, $(n_1\times w_{256c},n_{10}\times w_{256c})$, $(n_1\times w_{256c},n_9\times w_{256c})$, $(n_1\times w_{256c},-n_{16}\times w_{256c})$, $(n_1\times w_{256c},-n_{15}\times w_{256c})$, $(n_1\times w_{256c},-n_{14}\times w_{256c})$, $(n_1\times w_{256c},-n_{13}\times w_{256c})$, $(n_1\times w_{256c},-n_{12}\times w_{256c})$, $(n_1\times w_{256c},-n_{11}\times w_{256c})$, $(n_1\times w_{256c},-n_{10}\times w_{256c})$, $(n_1\times w_{256c},-n_9\times w_{256c})$, $(-n_8\times w_{256c},n_{16}\times w_{256c})$, $(-n_8\times w_{256c},n_{15}\times w_{256c})$, $(-n_8\times w_{256c},n_{14}\times w_{256c})$, $(-n_8\times w_{256c},n_{13}\times w_{256c})$, $(-n_8\times w_{256c},n_{12}\times w_{256c})$, $(-n_8\times w_{256c},n_{11}\times w_{256c})$, $(-n_8\times w_{256c},n_{10}\times w_{256c})$, $(-n_8\times w_{256c}, n_9\times w_{256c})$, $(-n_8\times w_{256c},-n_{16}\times w_{256c})$, $(-n_8\times w_{256c},-n_{15}\times w_{256c})$, $(-n_8\times w_{256c},-n_{14}\times w_{256c})$, $(-n_8\times w_{256c},-n_{13}\times w_{256c})$, $(-n_8\times w_{256c},-n_{12}\times w_{256c})$, $(-n_8\times w_{256c},-n_{11}\times w_{256c})$, $(-n_8\times w_{256c},-n_{10}\times w_{256c})$, $(-n_8\times w_{256c},-n_9\times w_{256c})$, $(-n_7\times w_{256c},n_{16}\times w_{256c})$, $(-n_7\times w_{256c},n_{15}\times w_{256c})$, $(-n_7\times w_{256c},n_{14}\times w_{256c})$, $(-n_7\times w_{256c},n_{13}\times w_{256c})$, $(-n_7\times w_{256c},n_{12}\times w_{256c})$, $(-n_7\times w_{256c},n_{11}\times w_{256c})$, $(-n_7\times w_{256c},n_{10}\times w_{256c})$, $(-n_7\times w_{256c},n_9\times w_{256c})$, $(-n_7\times w_{256c},-n_{16}\times w_{256c})$, $(-n_7\times w_{256c},-n_{15}\times w_{256c})$, $(-n_7\times w_{256c},-n_{14}\times w_{256c})$, $(-n_7\times w_{256c},-n_{13}\times w_{256c})$, $(-n_7\times w_{256c},-n_{12}\times w_{256c})$, $(-n_7\times w_{256c},-n_{11}\times w_{256c})$, $(-n_7\times w_{256c},-n_{10}\times w_{256c})$, $(-n_7\times w_{256c},-n_9\times w_{256c})$, $(-n_6\times w_{256c},n_{16}\times w_{256c})$, $(-n_6\times w_{256c},n_{15}\times w_{256c})$, $(-n_6\times w_{256c},n_{14}\times w_{256c})$, $(-n_6\times w_{256c},n_{13}\times w_{256c})$, $(-n_6\times w_{256c},n_{12}\times w_{256c})$, $(-n_6\times w_{256c},n_{11}\times w_{256c})$, $(-n_6\times w_{256c},n_{10}\times w_{256c})$, $(-n_2\times w_{256c},n_9\times w_{256c})$, $(-n_6\times w_{256c},-n_{16}\times w_{256c})$, $(-n_6\times w_{256c},-n_{15}\times w_{256c})$, $(-n_6\times w_{256c},-n_{14}\times w_{256c})$, $(-n_6\times w_{256c},-n_{13}\times w_{256c})$, $(-n_6\times w_{256c},-n_{12}\times w_{256c})$, $(-n_6\times w_{256c},-n_{11}\times w_{256c})$, $(-n_6\times w_{256c},-n_{10}\times w_{256c})$, $(-n_6\times w_{256c},-n_9\times w_{256c})$, $(-n_5\times w_{256c},n_{16}\times w_{256c})$, $(-n_5\times w_{256c},n_{15}\times w_{256c})$, $(-n_5\times w_{256c},n_{14}\times w_{256c})$, $(-n_5\times w_{256c},n_{13}\times w_{256c})$, $(-n_5\times w_{256c},n_{12}\times w_{256c})$, $(-n_5\times w_{256c},n_{11}\times w_{256c})$, $(-n_5\times w_{256c},n_{10}\times w_{256c})$, $(-n_5\times w_{256c},n_9\times w_{256c})$, $(-n_5\times w_{256c},-n_{16}\times w_{256c})$, $(-n_5\times w_{256c},-n_{15}\times w_{256c})$, $(-n_5\times w_{256c},-n_{14}\times w_{256c})$, $(-n_5\times w_{256c},-n_{13}\times w_{256c})$, $(-n_5\times w_{256c},-n_{12}\times w_{256c})$, $(-n_5\times w_{256c},-n_{11}\times w_{256c})$, $(-n_5\times w_{256c},-n_{13}\times w_{256c})$, $(-n_5\times w_{256c},-n_9\times w_{256c})$, $(-n_4\times w_{256c},n_{16}\times w_{256c})$, $(-n_4\times w_{256c},n_{15}\times w_{256c})$, $(-n_4\times w_{256c},n_{14}\times w_{256c})$, $(-n_4\times w_{256c},n_{13}\times w_{256c})$, $(-n_4\times w_{256c},n_{12}\times w_{256c})$, $(-n_4\times w_{256c},n_{11}\times w_{256c})$, $(-n_4\times w_{256c},n_{10}\times w_{256c})$, $(-n_4\times w_{256c},n_9\times w_{256c})$, $(-n_4\times w_{256c},-n_{16}\times w_{256c})$, $(-n_4\times w_{256c},-n_{15}\times w_{256c})$, $(-n_4\times w_{256c},-n_{14}\times w_{256c})$, $(-n_4\times w_{256c},-n_{13}\times w_{256c})$, $(-n_4\times w_{256c},-n_{12}\times w_{256c})$, $(-n_4\times w_{256c},-n_{11}\times w_{256c})$, $(-n_4\times w_{256c},-n_{13}\times w_{256c})$, $(-n_4\times w_{256c},-n_9\times w_{256c})$, $(-n_3\times w_{256c},n_{16}\times w_{256c})$, $(-n_3\times w_{256c},n_{15}\times w_{256c})$, $(-n_3\times w_{256c},n_{14}\times w_{256c})$, $(-n_3\times w_{256c},n_{13}\times w_{256c})$, $(-n_3\times w_{256c},n_{12}\times w_{256c})$, $(-n_3\times w_{256c},n_{11}\times w_{256c})$, $(-n_3\times w_{256c},n_{10}\times w_{256c})$, $(-n_3\times w_{256c},n_9\times w_{256c})$, $(-n_3\times w_{256c},-n_{16}\times w_{256c})$, $(-n_3\times w_{256c},-n_{15}\times w_{256c})$, $(-n_3\times w_{256c},-n_{14}\times w_{256c})$, $(-n_3\times w_{256c},-n_{13}\times w_{256c})$, $(-n_3\times w_{256c},-n_{12}\times w_{256c})$, $(-n_3\times w_{256c},-n_{11}\times w_{256c})$, $(-n_3\times w_{256c},-n_{10}\times w_{256c})$, $(-n_3\times w_{256c},-n_9\times w_{256c})$, $(-n_2\times w_{256c},n_{16}\times w_{256c})$, $(-n_2\times w_{256c},n_{15}\times w_{256c})$, $(-n_2\times w_{256c},n_{14}\times w_{256c})$, $(-n_2\times w_{256c},n_{13}\times w_{256c})$, $(-n_2\times w_{256c},n_{12}\times w_{256c})$, $(-n_2\times w_{256c},n_{11}\times w_{256c})$, $(-n_2\times w_{256c},n_{10}\times w_{256c})$, $(-n_2\times w_{256c},n_9\times w_{256c})$, $(-n_2\times w_{256c},-n_{16}\times w_{256c})$, $(-n_2\times w_{256c},-n_{15}\times w_{256c})$, $(-n_2\times w_{256c},-n_{14}\times w_{256c})$, $(-n_2\times w_{256c},-n_{13}\times w_{256c})$, $(-n_2\times w_{256c},-n_{12}\times w_{256c})$, $(-n_2\times w_{256c},-n_{11}\times w_{256c})$, $(-n_2\times w_{256c},-n_{10}\times w_{256c})$, $(-n_2\times w_{256c},-n_9\times w_{256c})$, $(-n_1\times w_{256c},n_{16}\times w_{256c})$, $(-n_1\times w_{256c},n_{15}\times w_{256c})$, $(-n_1\times w_{256c},n_{14}\times w_{256c})$, $(-n_1\times w_{256c},n_{13}\times w_{256c})$, $(-n_1\times w_{256c},n_{12}\times w_{256c})$, $(-n_1\times w_{256c},n_{11}\times w_{256c})$, $(-n_1\times w_{256c},n_{10}\times w_{256c})$, $(-n_1\times w_{256c},n_9\times w_{256c})$, $(-n_1\times w_{256c},-n_{16}\times w_{256c})$, $(-n_1\times w_{256c},-n_{15}\times w_{256c})$, $(-n_1\times w_{256c},-n_{14}\times w_{256c})$, $(-n_1\times w_{256c},-n_{13}\times w_{256c})$, $(-n_1\times w_{256c},-n_{12}\times w_{256c})$, $(-n_1\times w_{256c},-n_{11}\times w_{256c})$, $(-n_1\times w_{256c},-n_{10}\times w_{256c})$, and $(-n_1\times w_{256c},-n_9\times w_{256c})$, Coordinates in the I (in-phase)-Q (quadrature(-phase)) plane of the signal points directly above the values 00000000-11111111 of the set of b0, b1, b2, b3, b4, b5, b6, and b7 indicate the in-phase component I and the quadrature component Q of the baseband signal obtained as a result of mapping. Note that relationship between the values (00000000-11111111) of the set of b0, b1, b2, b3, b4, b5, b6, and b7, and coordinates of the signal points for 256QAM is not limited to the relationship shown in FIG. 121.

The 256 signal points shown in FIG. 121 are assigned names "signal point 1", "signal point 2", and so on up to "signal point 256". In other words, as there are 256 signal points, signal points 1-256 exist. In the I (in-phase)-Q (quadrature(-phase)) plane, a signal point i is separated from the origin by a distance Di. Thus, $w_{256c}$ can be calculated as shown below.

[Math. 373]

$$w_{256c} = \frac{z}{\sqrt{\frac{\sum_{i=1}^{256} D_i^2}{256}}} \quad \text{(H9)}$$

Consequently, the baseband signal obtained as a result of mapping has average power $z^2$. Effects for 256QAM described above are explained in detail further below.

The following explains effects when QAM described above is used.

First, explanation is provided of configuration of a transmission device and a reception device.

FIG. 117 shows one example of configuration of the transmission device. The error correction encoder 11702 receives information 11701 as input, performs error correction encoding using LDPC codes, turbo codes, or the like, and thereby outputs error correction encoded data 11703.

The interleaver 11704 receives the error correction encoded data 11703 as input, performs data interleaving, and thereby outputs interleaved data 11705.

The mapper 11706 receives the interleaved data 11705 as input, performs mapping in accordance with a modulation scheme set by the transmission device, and thereby outputs a quadrature baseband signal (i.e., an in-phase component I and a quadrature component Q) 11707.

The wireless unit 11708 receives the quadrature baseband signal 11707 as input, performs processing such as quadrature modulation, frequency conversion, and amplification, and thereby outputs a transmission signal 11709. Finally, the antenna 11710 outputs the transmission signal 11709 as a radio wave.

FIG. 118 shows one example of configuration of the reception device which receives modulated signals transmitted from the transmission device shown in FIG. 117.

The wireless unit 11803 receives a received signal 11802, received through the antenna 11801, as input, performs processing such as frequency conversion and quadrature demodulation, and thereby outputs a quadrature baseband signal 11804.

The demapper 11805 receives the quadrature baseband signal 11804 as input, and performs frequency offset estimation and elimination, and channel variation (transmission path variation) estimation. The demapper 11805 also, for example, performs log-likelihood ratio estimation for each bit of a data symbol, and thereby outputs a log-likelihood ratio signal 11806.

The deinterleaver 11807 receives the log-likelihood ratio signal 11806 as input, performs deinterleaving, and thereby outputs a deinterleaved log-likelihood ratio signal 11808.

A decoder 11809 receives the deinterleaved log-likelihood ratio signal 11808 as input, performs decoding of the error correction code, and thereby outputs received data 11810.

Effects are explained below using 16QAM as an example. The following compares two different configurations, referred to below as 16QAM #3 and 16QAM #4.

16QAM #3 refers to 16QAM explained in Supplementary Explanation 2, for which the signal point constellation in the I (in-phase)-Q (quadrature(-phase)) plane is as shown in FIG. 111.

16QAM #4 refers to a configuration in which the signal point constellation in the I (in-phase)-Q (quadrature (-phase)) plane is as shown in FIG. 119, and in which, as explained above, $k_1>0$ (i.e., $k_1$ is a real number greater than 0), $k_2>0$ (i.e., $k_2$ is a real number greater than 0), $k_1\neq 1$, $k_2\neq 1$, and $k_1\neq k_2$ are satisfied.

As explained above, in 16QAM four bits b0, b1, b2, and b3 are transmitted. In the case of 16QAM #3, when the reception device calculates a log-likelihood ratio of each bit, the four bits are separated into two high-quality bits and two low-quality bits. On the other hand, in the case of 16QAM #4, due to the condition that "$k_1>0$ (i.e., $k_1$ is a real number greater than 0), $k_2>0$ (i.e., $k_2$ is a real number greater than 0), $k_1\neq 1$, $k_2\neq 1$, and $k_1\neq k_2$ are satisfied", the four bits are separated into one high-quality bit, two medium-quality bits, and one low-quality bit. Therefore, as explained above, 16QAM #3 and 16QAM #4 differ in terms of quality distribution of the four bits. In consideration of the above situation, when the decoder 11809 in FIG. 118 performs decoding of error correction code, depending on error correction code which is used, there is a possibility that 16QAM #4 enables the reception device to achieve better data reception quality.

Note that in the case of 64QAM, when the signal point constellation in the I (in-phase)-Q (quadrature(-phase)) plane is as shown in FIG. 120, in the same way as described above, there is a possibility that the reception device achieves good data reception quality. In such a situation, the condition explained above that either "$m_1>0$ (i.e., $m_1$ is a real number greater than 0), $m_2>0$ (i.e., $m_2$ is a real number greater than 0), $m_3>0$ (i.e., $m_3$ is a real number greater than 0), $m_4>0$ (i.e., $m_4$ is a real number greater than 0), $m_5>0$ (i.e., $m_5$ is a real number greater than 0), $m_6>0$ (i.e., $m_6$ is a real number greater than 0), $m_7>0$ (i.e., $m_7$ is a real number greater than 0), and $m_8>0$ (i.e., $m_8$ is a real number greater than 0), $\{m_1 \neq m_2, m_1 \neq m_3, m_1 \neq m_4, m_2 \neq m_3, m_2 \neq m_4$, and $m_3 \neq m_4\}$, $\{m_5 \neq m_6, m_5 \neq m_7, m_5 \neq m_8, m_6 \neq m_7, m_6 \neq m_5$, and $m_7 \neq m_8\}$, and $\{m_1 \neq m_5$ or $m_2 \neq m_6$ or $m_3 \neq m_7$ or $m_4 \neq m_8$ hold true$\}$" is satisfied, or "$m_1>0$ (i.e., $m_1$ is a real number greater than 0), $m_2>0$ (i.e., $m_2$ is a real number greater than 0), $m_3>0$ (i.e., $m_3$ is a real number greater than 0), $m_4>0$ (i.e., $m_4$ is a real number greater than 0), $m_5>0$ (i.e., $m_5$ is a real number greater than 0), $m_6>0$ (i.e., $m_6$ is a real number greater than 0), $m_7>0$ (i.e., $m_7$ is a real number greater than 0), and $m_8>0$ (i.e., $m_8$ is a real number greater than 0), $\{m_1 \neq m_2, m_1 \neq m_3, m_1 \neq m_4, m_2 \neq m_3, m_2 \neq m_4$, and $m_3 \neq m_4\}$, $\{m_5 \neq m_6, m_5 \neq m_7, m_5 \neq m_8, m_6 \neq m_7, m_6 \neq m_8$, and $m_7 \neq m_8\}$, $\{m_1 \neq m_5$ or $m_2 \neq m_6$ or $m_3 \neq m_7$ or $m_4 \neq m_8\}$, and $\{m_1 = m_5$ or $m_2 = m_6$ or $m_3 = m_7$ or $m_4 = m_8$ holds true$\}$" is satisfied, is an important condition, and the signal point constellation differs from that explained in Supplementary Explanation 2.

Likewise, in the case of 256QAM, when the signal point constellation in the I (in-phase)-Q (quadrature(-phase)) plane is as shown in FIG. 121, in the same way as described above, there is a is possibility that the reception device achieves good data reception quality. In such a situation, the condition explained above that either "$n_1>0$ (i.e., $n_1$ is a real number greater than 0), $n_2>0$ (i.e., $n_2$ is a real number greater than 0), $n_3>0$ (i.e., $n_3$ is a real number greater than 0), $n_4>0$ (i.e., $n_4$ is a real number greater than 0), $n_5>0$ (i.e., $n_5$ is a real number greater than 0), $n_6>0$ (i.e., $n_6$ is a real number greater than 0), $n_7>0$ (i.e., $n_7$ is a real number greater than 0), $n_8>0$ (i.e., $n_8$ is a real number greater than 0), $n_9>0$ (i.e., $n_9$ is a real number greater than 0), $n_{10}>0$ (i.e., $n_{10}$ is a real number greater than 0), $n_{11}>0$ (i.e., $n_{11}$ is a real number greater than 0), $n_{12}>0$ (i.e., $n_{12}$ is a real number greater than 0), $n_{13}>0$ (i.e., $n_{13}$ is a real number greater than 0), $n_{14}>0$ (i.e., $n_{14}$ is a real number greater than 0), $n_{15}>0$ (i.e., $n_{15}$ is a real number greater than 0), and $n_{16}>0$ (i.e., $n_{16}$ is a real number greater than 0), $\{n_1 \neq n_2, n_1 \neq n_3, n_1 \neq n_4, n_1 \neq n_5, n_1 \neq n_6, n_1 \neq n_7, n_1 \neq n_8,$
$n_2 \neq n_3, n_2 \neq n_4, n_2 \neq n_5, n_2 \neq n_6, n_2 \neq n_7, n_2 \neq n_8,$
$n_3 \neq n_4, n_3 \neq n_5, n_3 \neq n_6, n_3 \neq n_7, n_3 \neq n_8,$
$n_4 \neq n_5, n_4 \neq n_6, n_4 \neq n_7, n_4 \neq n_8,$
$n_5 \neq n_6, n_5 \neq n_7, n_5 \neq n_8,$
$n_6 \neq n_7, n_6 \neq n_8$, and
$n_7 \neq n_8\}$,
$\{n_9 \neq n_{10}, n_9 \neq n_{11}, n_9 \neq n_{12}, n_9 \neq n_{13}, n_9 \neq n_{14}, n_9 \neq n_{15}, n_1 \neq n_{16},$
$n_{10} \neq n_{11}, n_{10} \neq n_{12}, n_{10} \neq n_{13}, n_{10} \neq n_{14}, n_{10} \neq n_{15}, n_{10} \neq n_{16},$
$n_{11} \neq n_{12}, n_{11} \neq n_{13}, n_{11} \neq n_{14}, n_{11} \neq n_{15}, n_{11} \neq n_{16},$
$n_{12} \neq n_{13}, n_{12} \neq n_{14}, n_{12} \neq n_{15}, n_{12} \neq n_{16},$
$n_{13} \neq n_{14}, n_{13} \neq n_{15}, n_{13} \neq n_{16},$
$n_{14} \neq n_{15}, n_{14} \neq n_{16}$, and
$n_{15} \neq n_{16}\}$, and $\{n_1 \neq n_9$ or $n_2 \neq n_{10}$ or $n_3 \neq n_{11}$ or $n_4 \neq n_{12}$ or $n_5 \neq n_{13}$ or $n_6 \neq n_{14}$ or $n_7 \neq n_{15}$ or $n_8 \neq n_{16}$ holds true$\}$" is satisfied, or "$n_1>0$ (i.e., $n_1$ is a real number greater than 0), $n_2>0$ (i.e., $n_2$ is a real number greater than 0), $n_3>0$ (i.e., $n_3$ is a real number greater than 0), $n_4>0$ (i.e., $n_4$ is a real number greater than 0), $n_5>0$ (i.e., $n_5$ is a real number greater than 0), $n_6>0$ (i.e., $n_6$ is a real number greater than 0), $n_7>0$ (i.e., $n_7$ is a real number greater than 0), $n_8>0$ (i.e., $n_8$ is a real number greater than 0), $n_9>0$ (i.e., $n_9$ is a real number greater than 0), $n_{10}>0$ (i.e., $n_{10}$ is a real number greater than 0), $n_{11}>0$ (i.e., $n_{11}$ is a real number greater than 0), $n_{12}>0$ (i.e., $n_{12}$ is a real number greater than 0), $n_{13}>0$ (i.e., $n_{13}$ is a real number greater than 0), $n_{14}>0$ (i.e., $n_{14}$ is a real number greater than 0), $n_{15}>0$ (i.e., $n_{15}$ is a real number greater than 0), and $n_{16}>0$ (i.e., $n_{16}$ is a real number greater than 0), $\{n_1 \neq n_2, n_1 \neq n_3, n_1 \neq n_4, n_1 \neq n_5, n_1 \neq n_6, n_1 \neq n_7, n_1 \neq n_8,$
$n_2 \neq n_3, n_2 \neq n_4, n_2 \neq n_5, n_2 \neq n_6, n_2 \neq n_7, n_2 \neq n_8,$
$n_3 \neq n_4, n_3 \neq n_5, n_3 \neq n_6, n_3 \neq n_7, n_3 \neq n_8,$
$n_4 \neq n_5, n_4 \neq n_6, n_4 \neq n_7, n_4 \neq n_8,$
$n_5 \neq n_6, n_5 \neq n_7, n_5 \neq n_8,$
$n_6 \neq n_7, n_6 \neq n_8$, and
$n_7 \neq n_8\}$,
$\{n_9 \neq n_{10}, n_9 \neq n_{11}, n_9 \neq n_{12}, n_9 \neq n_{13}, n_9 \neq n_{14}, n_9 \neq n_{15}, n_1 \neq n_{16},$
$n_{10} \neq n_{11}, n_{10} \neq n_{12}, n_{10} \neq n_{13}, n_{10} \neq n_{14}, n_{10} \neq n_{15}, n_{10} \neq n_{16},$
$n_{11} \neq n_{12}, n_{11} \neq n_{13}, n_{11} \neq n_{14}, n_{11} \neq n_{15}, n_{11} \neq n_{16},$
$n_{12} \neq n_{13}, n_{12} \neq n_{14}, n_{12} \neq n_{15}, n_{12} \neq n_{16},$
$n_{13} \neq n_{14}, n_{13} \neq n_{15}, n_{13} \neq n_{16},$
$n_{14} \neq n_{15}, n_{14} \neq n_{16}$, and
$n_{15} \neq n_{16}\}$, $\{n_1 \neq n_9$ or $n_2 \neq n_{10}$ or $n_3 \neq n_{11}$ or $n_4 \neq n_{12}$ or $n_5 \neq n_{13}$ or $n_6 \neq n_{14}$ or $n_7 \neq n_{15}$ or $n_8 \neq n_{16}$ holds true$\}$, and $\{n_1 = n_9$ or $n_2 = n_{10}$ or $n_3 = n_{11}$ or $n_4 = n_{12}$ or $n_5 = n_{13}$ or $n_6 = n_{14}$ or $n_7 = n_{15}$ or $n_8 = n_{16}$ holds true$\}$" is satisfied, is an important condition, and signal point constellation differs from that explained in Supplementary Explanation 2.

Note that although detailed explanation of configuration is omitted for FIGS. 117 and 118, transmission and reception of modulated signals can be implemented in the same way even when the OFDM scheme or the spread spectrum communication scheme explained in other embodiments in the present Description is used in the transmission and reception of the modulated signals.

Also, there is a possibility of improved data reception being achieved using the 16QAM, 64QAM, and 256QAM explained above, even for a transmission scheme using space-time codes such as space time block codes (note that symbols may alternatively be arranged in the frequency domain), or an MIMO transmission scheme in which pre-coding is or is not performed, such as described in Embodiments 1 to 12.

(Supplementary Explanation 5)

The following explains an example of configuration of a communication-broadcasting system using QAM explained above in Supplementary Explanations 2-4.

Figure 122:
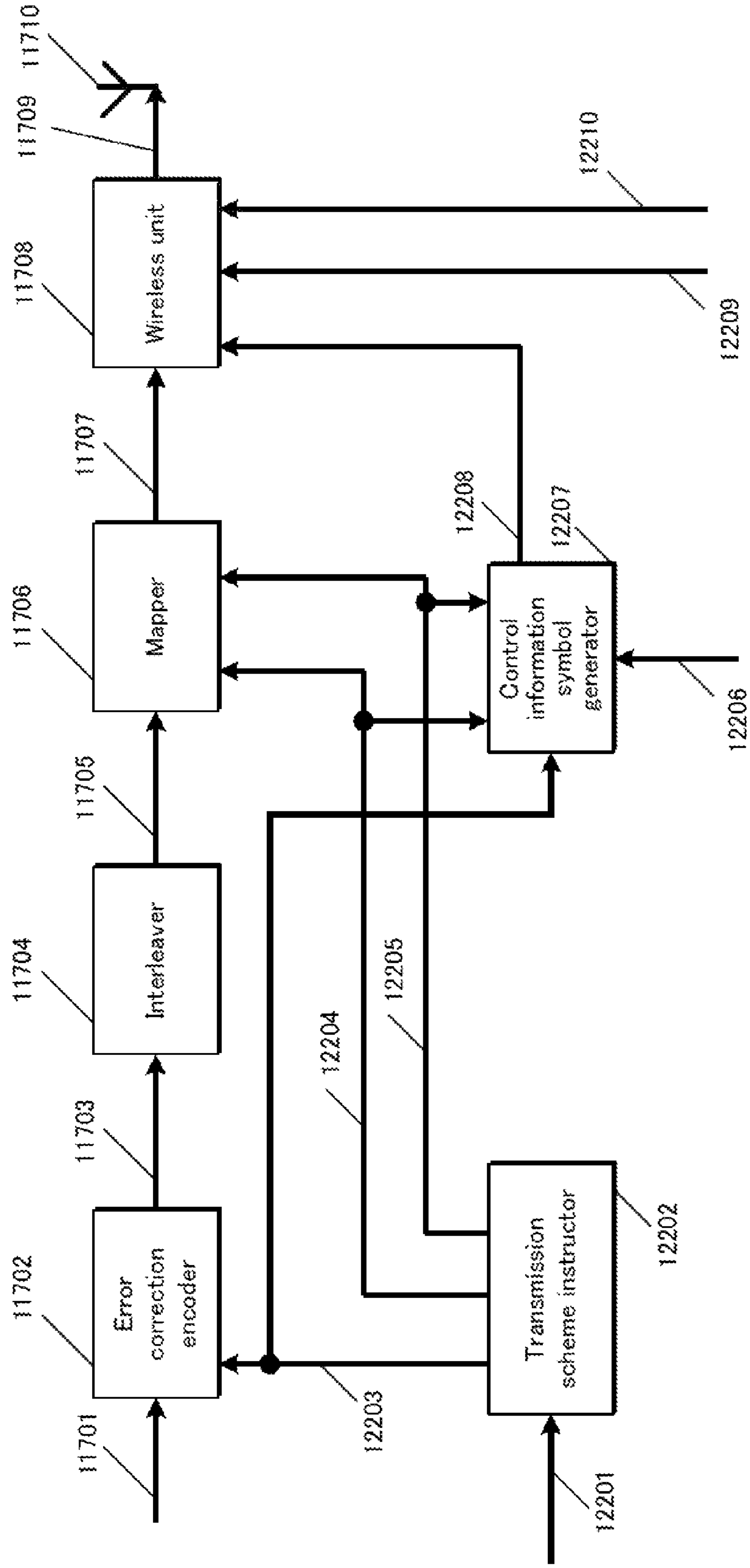

FIG. 122 shows one example of a transmission device. Note that elements that operate the same as elements in FIG. 117 are labeled using the same reference signs.

A transmission scheme instructor 12202 receives an input signal 12201 as input and, based on the input signal 12201, outputs an error correction code information signal 12203 (for example, indicating encoding rate and block length of error correction codes), a modulation scheme information signal 12204 (for example, indicating the modulation scheme), and a modulation scheme parameter information signal 12205 (for example, information relating to amplitude values in the case of QAM), in order to generate data symbols. Note that the input signal 12201 may be generated by a user of the transmission device, or alternatively, in the case of a communication system, the input signal 12201 may be feedback information from a device which is a communication partner of the transmission device.

An error correction encoder 11702 receives information 11701 and the error correction code information signal 12203 as inputs, performs error correction encoding in accordance with the error correction code information signal 12203, and thereby outputs error correction encoded data 11703.

A mapper 11706 receives interleaved data 11705, the modulation scheme information signal 12204, and the modulation scheme parameter information signal 12205 as inputs, performs mapping in accordance with the modulation scheme information signal 12204 and the modulation scheme parameter information signal 12205, and thereby outputs a quadrature baseband signal 11707.

A control information symbol generator 12207 receives the error correction code information signal 12203, the modulation scheme information signal 12204, the modulation scheme parameter information signal 12205, and control data 12206 as inputs, performs processing for error correction encoding and modulation processing such as BPSK or QPSK, and thereby outputs a control information symbol signal 12208.

A wireless unit 11708 receives the quadrature baseband signal 11707, the control information symbol signal 12208, a pilot symbol signal 12209, and a frame structure signal 12210 as inputs, and outputs a transmission signal 11709 in accordance with the frame structure signal 12210. Frame structure is as shown in FIG. 123.

Figure 123:
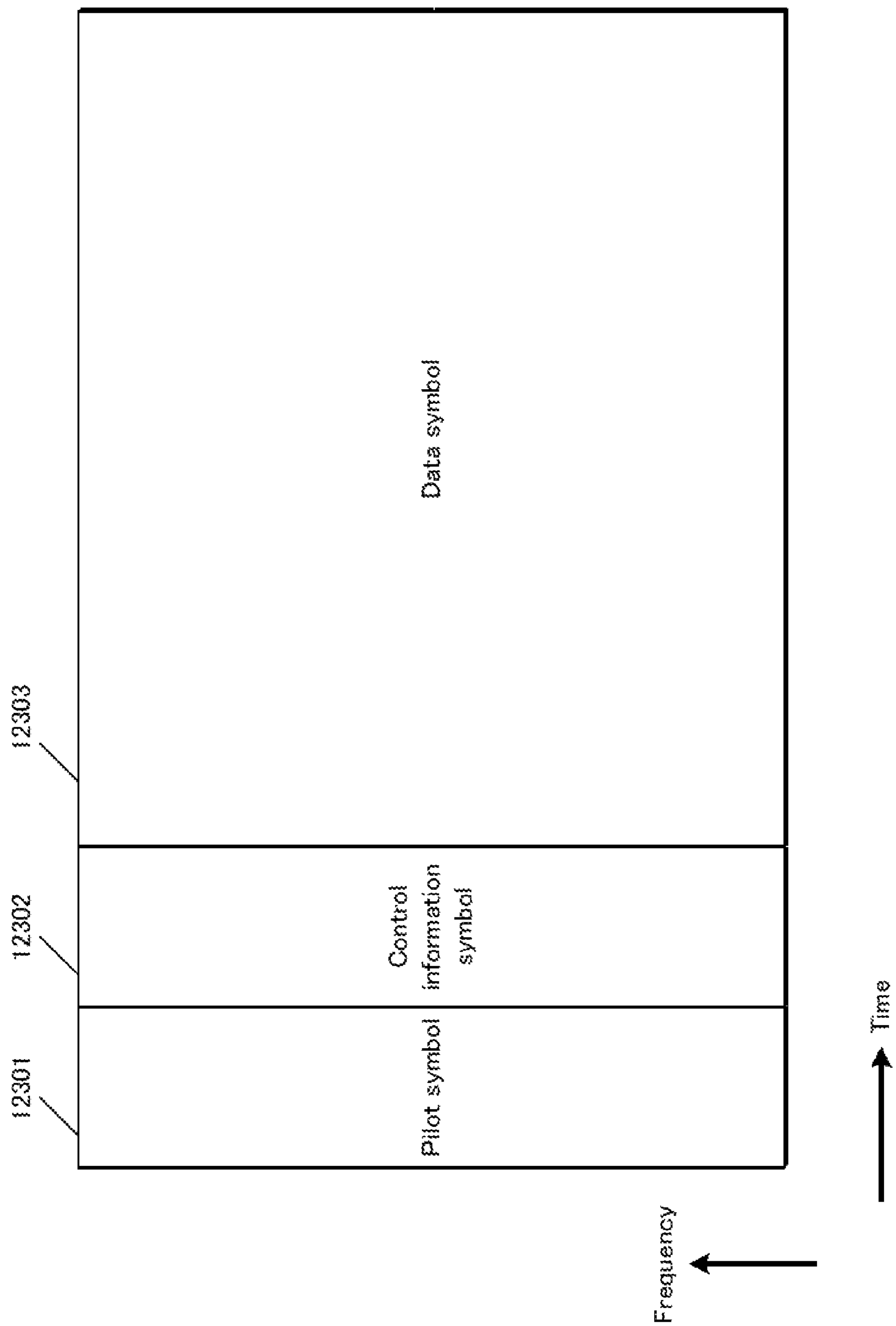

FIG. 123 shows one example of frame structure in which the vertical axis represents frequency and the horizontal axis represents time. FIG. 123 shows a pilot symbol 12301, a control information symbol 12302, and a data symbol 12303. The pilot symbol 12301 corresponds to the pilot symbol signal 12209 shown in FIG. 122. The control information symbol 12302 corresponds to the control information symbol signal 12208 shown in FIG. 122. The data symbol 12303 corresponds to the quadrature baseband signal 11707 shown in FIG. 122.

Figure 124:
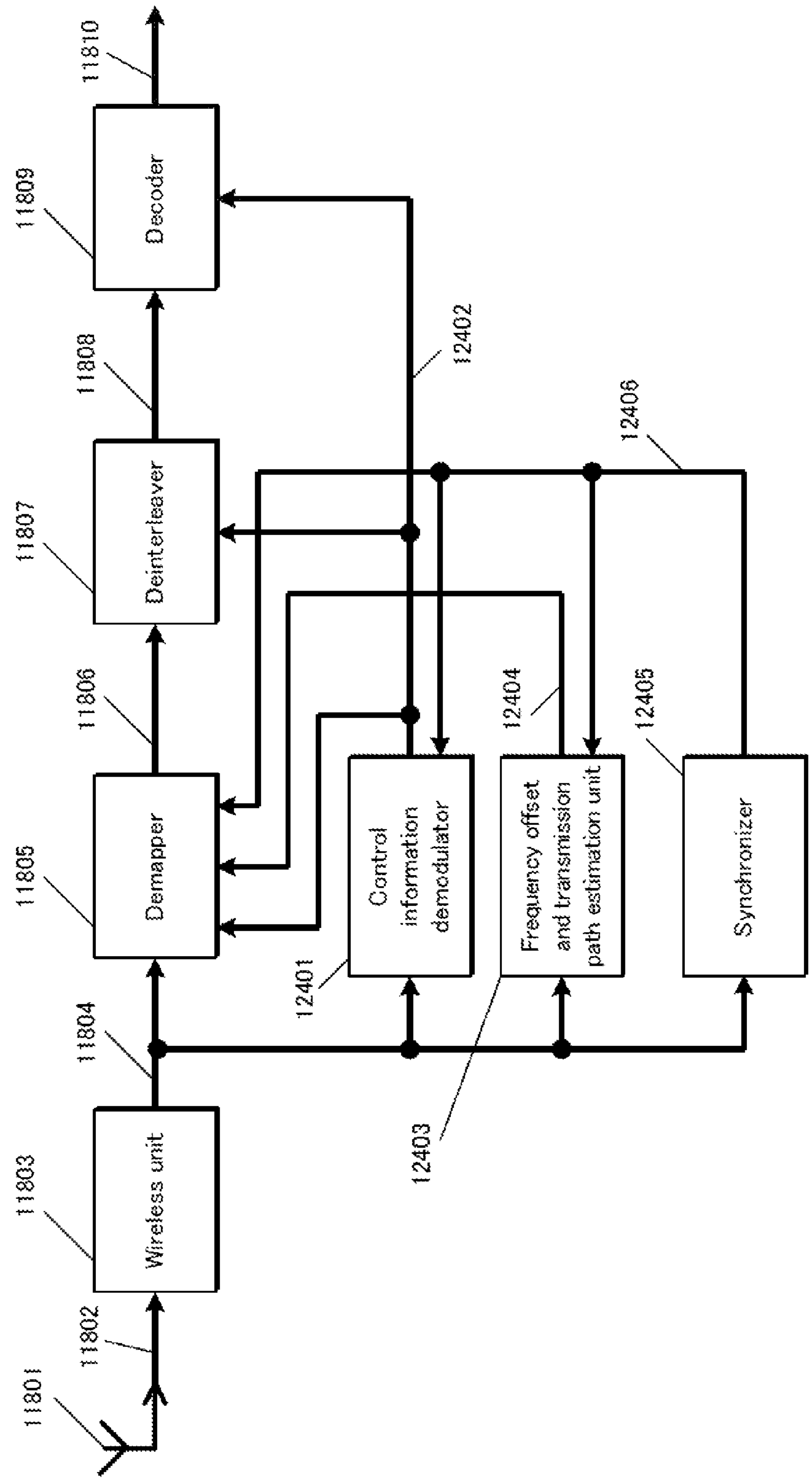

FIG. 124 shows a reception device which receives modulated signals transmitted by the transmission device shown in FIG. 122. Note that elements that operate in the same way as elements shown in FIG. 118 are labeled using the same reference signs.

A synchronizer 12405 receives a quadrature baseband signal 11804 as input, performs frequency synchronization, time synchronization, and frame synchronization, for example by detecting and using the pilot symbol 12301 shown in FIG. 123, and thereby outputs a synchronizing signal 12406.

A control information demodulator 12401 receives the quadrature baseband signal 11804 and the synchronizing signal 12406 as inputs, performs demodulation and error correction decoding of the control information symbol 12302 shown in FIG. 123, and thereby outputs a control information signal 12402.

A frequency offset and transmission path estimation unit 12403 receives the quadrature baseband signal 11804 and the synchronizing signal 12406 as inputs, performs, for example, estimates frequency offset and transmission path variation, due to radio waves, using the pilot symbol 12301 shown in FIG. 123, and thereby outputs a frequency offset and transmission path variation estimated signal 12404.

A demapper 11805 receives the quadrature baseband signal 11804, the control information signal 12402, the frequency offset and transmission path variation estimated signal 12404, and the synchronizing signal 12406 as inputs, judges a modulation scheme of the data symbol 12303 shown in FIG. 123 using the control information signal 12402, calculates a log-likelihood ratio of each bit in the data symbol using the quadrature baseband signal 11804 and the frequency offset and transmission path variation estimated signal 12404, and thereby outputs a log-likelihood ratio signal 11806.

A deinterleaver 11807 receives the log-likelihood ratio signal 11806 and the control information signal 12402 as inputs, uses transmission scheme information included in the control information signal 12402, for example indicating the modulation scheme and the error correction encoding scheme, in order to perform processing using a deinterleaving scheme corresponding to an interleaving scheme used by the transmission device, and thereby outputs a deinterleaved log-likelihood ratio signal 11808.

A decoder 11809 receives the deinterleaved log-likelihood ratio signal 11808 and the control information signal 12402 as inputs, uses information relating to the error correction encoding scheme which is included in the control information signal 12402 in order to perform error correction decoding in accordance with the error correction encoding scheme, and thereby outputs received data 11810.

The following explains examples in which QAM explained in Supplementary Explanations 2-4 is used.

Example 1

The transmission device shown in FIG. 122 can, in terms of error correction codes, transmit a plurality of different block lengths (code lengths).

The transmission device shown in FIG. 122 for example selects either error correction encoding using LDPC (block) codes having a block length (code length) of 16200 bits or error correction encoding using LDPC (block) codes having a block length (code length) of 64800 bits, and performs the error correction encoding which is selected. Thus, the following two error correction schemes are considered.

<Error Correction Scheme #1>

Encoding is performed using LDPC (block) codes having a coding rate of ⅔ and a block length (code length) of 16200 bits (information: 10800 bits, parity: 5400 bits).

<Error Correction Scheme #2>

Encoding is performed using LDPC (block) codes having a coding rate of ⅔ and a block length (code length) of 64800 bits (information: 43200 bits, parity: 21600 bits).

Suppose a situation in which the transmission device shown in FIG. 122 uses 16QAM shown in FIG. 111. In such a situation, when the transmission device in FIG. 122 uses Error Correction Scheme #1, $f=f_{\#1}$ is set with respect to FIG. 111, and when the transmission device uses Error Correction Scheme #2, $f=f_{\#2}$ is set with respect to FIG. 111. In the above situation, the following condition should preferably be satisfied.

<Condition #H1>

$f_{\#1}\neq 1$, $f_{\#2}\neq 1$, and $f_{\#1}\neq f_{\#2}$ are satisfied.

As a result, there is a higher probability that the reception device achieves good data reception quality both when Error Correction Scheme #1 is used and also when Error Correction Scheme #2 is used. Note that Error Correction Scheme #1 and Error Correction Scheme #2 differ in terms of an optimum value off.

Next, suppose a situation in which the transmission device in FIG. 122 uses 64QAM shown in FIG. 112. In such a situation, when the transmission device in FIG. 122 uses Error Correction Scheme #1, $g_1=g_{1,\#1}$, $g_2=g_{2,\#1}$, and $g_3=g_{3,\#1}$ are set with respect to FIG. 112, and when the transmission device uses Error Correction Scheme #2, $g_1=g_{1,\#2}$, $g_2=g_{2,\#2}$, and $g_3=g_{3,\#2}$ are set with respect to FIG. 112. In the above situation, the following condition should preferably be satisfied.

<Condition #H2>

$\{(g_{1,\#1}, g_{2,\#1}, g_{3,\#1})\neq(1, 3, 5)$, $(g_{1,\#1}, g_{2,\#1}, g_{3,\#1})\neq(1, 5, 3)$, $(g_{1,\#1}, g_{2,\#1}, g_{3,\#1})\neq(3, 1, 5)$, $(g_{1,\#1}, g_{2,\#1}, g_{3,\#1})\neq(3, 5, 1)$, $(g_{1,\#1}, g_{2,\#1}, g_{3,\#1})\neq(5, 1, 3)$, and $(g_{1,\#1}, g_{2,\#1}, g_{3,\#1})\neq(5, 3, 1)\}$, $\{(g_{1,\#2}, g_{2,\#2}, g_{3,\#2})\neq(1, 3, 5)$, $(g_{1,\#2}, g_{2,\#2}, g_{3,\#2})\neq(1, 5, 3)$, $(g_{1,\#2}, g_{2,\#2}, g_{3,\#2})\neq(3, 1, 5)$, $(g_{1,\#2}, g_{2,\#2}, g_{3,\#2})\neq(3, 5, 1)$, $(g_{1,\#2}, g_{2,\#2}, g_{3,\#2})\neq(5, 1, 3)$, and $(g_{1,\#2}, g_{2,\#2}, g_{3,\#2})\neq(5, 3, 1)\}$, and $\{g_{1,\#1}\neq g_{1,\#2}$ or $g_{2,\#1}\neq g_{2,\#2}$ or $g_{3,\#1}\neq g_{3\#2}$ holds true$\}$ are satisfied.

As a result, there is a higher probability that the reception device achieves good data reception quality both when Error Correction Scheme #1 is used and also when Error Correction Scheme #2 is used. Note that Error Correction Scheme #1 and Error Correction Scheme #2 differ in terms of an optimum set of $g_1$, $g_2$, and $g_3$.

Next, suppose a situation in which the transmission device in FIG. 122 uses 256QAM shown in FIG. 113. In such a situation, when the transmission device in FIG. 122 uses Error Correction Scheme #1, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ are set with respect to FIG. 113, and when the transmission device uses Error Correction Scheme #2, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ are set with respect to FIG. 113. In the above situation, the following condition should preferably be satisfied.

<Condition #H3>

{When (a1 is an integer greater than 0 and no greater than 7, a2 is an integer greater than 0 and no greater than 7, a3 is an integer greater than 0 and no greater than 7, a4 is an integer greater than 0 and no greater than 7, a5 is an integer greater than 0 and no greater than 7, a6 is an integer greater than 0 and no greater than 7, and a7 is an integer greater than 0 and no greater than 7} and {x is an integer greater than 0 and no greater than 7, and y is an integer greater than 0 and no greater than 7, and satisfying $x\neq y$) hold true, $(h_{a1,\#1}, h_{a2,\#1}, h_{a3,\#1}, h_{a4,\#1}, h_{a5,\#1}, h_{a6,\#1}, h_{a7,\#1})\neq(1, 3, 5, 7, 9, 11, 13)$ holds true when $\{ax\neq ay$ holds true for all x and all y$\}\}$, {when {a1 is an integer greater than 0 and no greater than 7, a2 is an integer greater than 0 and no greater than 7, a3 is an integer greater than 0 and no greater than 7, a4 is an integer greater than 0 and no greater than 7, a5 is an integer greater than 0 and no greater than 7, a6 is an integer greater than 0 and no greater than 7, and a7 is an integer greater than 0 and no greater than 7} and {x is an integer greater than 0 and no greater than 7, and y is an integer greater than 0 and no greater than 7, and satisfying $x\neq y$} hold true, $(h_{a1,\#2}, h_{a2,\#2}, h_{a3,\#2}, h_{a4,\#2}, h_{a5,\#2}, h_{a6,\#2}, h_{a7,\#2})\neq(1, 3, 5, 7, 9, 11, 13)$ holds true when $\{ax\neq ay$ holds true for all x and all y$\}\}$, and $\{h_{1,\#1}\neq h_{1,\#2}$ or $h_{2,\#1}\neq h_{2,\#2}$ or $h_{3,\#1}\neq h_{3,\#2}$ or $h_{4,\#1}\neq h_{4,\#2}$ or $h_{5,\#1}\neq h_{5,\#2}$ or $h_{6,\#1}\neq h_{6,\#2}$ or $h_{7,\#1}\neq h_{7,\#2}$ holds true$\}$ are satisfied.

As a result, there is a higher probability that the reception device achieves good data reception quality both when Error Correction Scheme #1 is used and also when Error Correction Scheme #2 is used. Note that Error Correction Scheme #1 and Error Correction Scheme #2 differ in terms of an optimum set of $h_1$, $h_2$, $h_3$, $h_4$, $h_5$, $h_6$, and $h_7$.

The following summarizes the above explanation.

The following two error correction schemes are considered.

<Error Correction Scheme #1*>

Encoding is performed using block codes having a coding rate A and a block length (code length) of B bits, where A is a real number satisfying $0<A<1$, and B is an integer greater than 0.

<Error Correction Scheme #2*>

Encoding is performed using block codes having a coding rate A and a block length (code length) of C bits, where A is a real number satisfying $0<A<1$, and C is an integer greater than 0 and satisfying B #C.

Suppose a situation in which the transmission device shown in FIG. 122 uses 16QAM shown in FIG. 111. In such a situation, when the transmission device in FIG. 122 uses Error Correction Scheme #1*, $f=f_{\#1}$ is set with respect to FIG. 111, and when the transmission device uses Error Correction Scheme #2*, $f=f_{\#2}$ is set with respect to FIG. 111. In the above situation, preferably Condition #H1 should be satisfied.

Next, suppose a situation in which the transmission device in FIG. 122 uses 64QAM shown in FIG. 112. In such a situation, when the transmission device uses Error Correction Scheme #1*, $g_1=g_{1,\#1}$, $g_2=g_{2,\#1}$, and $g_3=g_{3,\#1}$ are set with respect to FIG. 112, and when the transmission device uses Error Correction Scheme #2*, $g_1=g_{1,\#2}$, $g_2=g_{2,\#2}$ and $g_3=g_{3,\#3}$ are set with respect to FIG. 112. In the above situation, preferably Condition #H2 should be satisfied.

Next, suppose a situation in which the transmission device in FIG. 122 uses 256QAM in FIG. 113. In such a situation, when the transmission device in FIG. 122 uses Error Correction Scheme #1*, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ are set with respect to FIG. 113, and when the transmission device uses Error Correction Scheme #2*, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ are set with respect to FIG. 113. In the above situation, preferably Condition #H3 should be satisfied.

Example 2

The transmission device shown in FIG. 122 can, in terms of error correction codes, transmit a plurality of different block lengths (code lengths).

The transmission device in FIG. 122 for example selects either error correction encoding using LDPC (block) codes having a block length (code length) of 16200 bits or error correction encoding using LDPC (block) codes having a block length (code length) of 64800 bits, and performs the error correction encoding which is selected. Thus, the following two error correction schemes are considered.

<Error Correction Scheme #3>

Encoding is performed using LDPC (block) codes having a coding rate of ⅔ and a block length (code length) of 16200 bits (information: 10800 bits, parity: 5400 bits).

<Error Correction Scheme #4>

Encoding is performed using LDPC (block) codes having a coding rate of ⅔ and a block length (code length) of 64800 bits (information: 43200 bits, parity: 21600 bits).

Suppose a situation in which the transmission device shown in FIG. 122 uses 16QAM in FIG. 114. In such a situation, when the transmission device in FIG. 122 uses Error Correction Scheme #3, $f_1=f_{1,\#1}$ and $f_2=f_{2,\#1}$ are set with respect to FIG. 114, and when the transmission device uses Error Correction Scheme #4, $f_1=f_{1,\#2}$ and $f_2=f_{2,\#2}$ are set with respect to FIG. 114. In the above situation, the following condition should preferably be satisfied.

<Condition #H4>

$\{f_{1,\#1}\neq f_{1,\#2}$ or $f_{2,\#1}\neq f_{2,\#2}\}$ is satisfied.

As a result, there is a higher probability that the reception device achieves good data reception quality both when Error Correction Scheme #3 is used and also when Error Correction Scheme #4 is used.

Note that Error Correction Scheme #3 and Error Correction Scheme #4 differ in terms of an optimum set of $f_1$ and $f_2$.

Next, suppose a situation in which the transmission device in FIG. 122 uses 64QAM shown in FIG. 115. In such a situation, when the transmission device in FIG. 122 uses Error Correction Scheme #3, $g_1=g_{1,\#1}$, $g_2=g_{2,\#1}$, $g_3=_{3,\#1}$, $g_4=g_{4,\#1}$, $g_5=g_{5,\#1}$, and $g_6=g_{6,\#1}$ are set with respect to FIG. 115, and when the transmission device uses Error Correction Scheme #4, $g_1=g_{1,\#2}$, $g_2=g_{2\#2}$, $g_3=g_{3,\#2}$, $g_4=g_{4,\#2}$, $g_5=g_{5,\#2}$, and $g_6=g_{6,\#2}$ are set with respect to FIG. 115. In the above situation, the following condition should preferably be satisfied.

<Condition #H5>

$\{\{\{g_{1,\#1}\neq g_{1,\#2}$, $g_{1,\#1}\neq g_{2,\#2}$, and $g_{1,\#1}\neq g_{3,\#2}\}$ or $\{g_{2,\#1}\neq g_{1,\#2}$, $g_{2,\#1}\neq g_{2,\#2}$, and $g_{2,\#1}\neq g_{3,\#2}\}$ or $\{g_{3,\#1}\neq g_{1,\#2}$, $g_{3,\#1}\neq g_{2,\#2}$, and $g_{3,\#1}\neq g_{3,\#2}\}$ holds true$\}$, or $\{\{g_{4,\#1}\neq g_{4,\#2}$, $g_{4,\#1}\neq g_{5,\#2}$, and $g_{4,\#1}\neq g_{6,\#2}\}$ or $\{g_{5,\#1}\neq g_{4,\#2}$, $g_{5,\#1}\neq g_{5,\#2}$, and $g_{5,\#1}\neq g_{6,\#2}\}$ or $\{g_{6,\#1}\neq g_{4,\#2}$, $g_{6,\#1}\neq g_{5,\#2}$, and $g_{6,\#1}\neq g_{6,\#2}\}$ holds true$\}\}$ is satisfied.

As a result, there is a higher probability that the reception device achieves good data reception quality both when Error Correction Scheme #3 is used and also when Error Correction Scheme #4 is used. Note that Error Correction Scheme #3 and Error Correction Scheme #4 differ in terms of an optimum set of $g_1$, $g_2$, $g_3$, $g_4$, $g_5$, and $g_6$.

Next, suppose a situation in which the transmission device shown in FIG. 122 uses 256QAM shown in FIG. 116. In such a situation, when the transmission device in FIG. 122 uses Error Correction Scheme #3, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, $h_7=h_{7,\#1}$, $h_8=h_{8,\#1}$, $h_9=h_{9,\#1}$, $h_{10}=h_{10,\#1}$, $h_{11}=h_{11,\#1}$, $h_{12}=h_{12,\#1}$, $h_{13}=h_{13,\#1}$, and $h_{14}=h_{14,\#1}$ are set with respect to FIG. 116, and when the transmission device uses Error Correction Scheme #4, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, $h_7=h_{7,\#2}$, $h_8=h_{8,\#2}$, $h_9=h_{9,\#2}$, $h_{10}=h_{10,\#2}$, $h_{11}=h_{11,\#2}$, $h_{12}=h_{12,\#2}$, $h_{13}=h_{13,\#2}$, and $h_{14}=h_{14,\#2}$ are set with respect to FIG. 116. In the above situation, the following condition should preferably be satisfied.

<Condition #H6>

$\{\{(h_{1,\#1}\neq h_{k,\#2}$ holds true for all k, where k is an integer greater than 0 and no greater than $7\}$, or $\{h_{2,\#1}\neq h_{k,\#2}$ holds true for all k, where k is an integer greater than 0 and no greater than $7\}$, or $\{h_{3,\#1}\neq h_{k,\#2}$ holds true for all k, where k is an integer greater than 0 and no greater than $7\}$, or $\{h_{4,\#1}\neq h_{k,\#2}$ holds true for all k, where k is an integer greater than 0 and no greater than $7\}$, or $\{h_{5,\#1}\neq h_{k,\#2}$ holds true for all k, where k is an integer greater than 0 and no greater than $7\}$, or $\{h_{6,\#1}\neq h_{k,\#2}$ holds true for all k, where k is an integer greater than 0 and no greater than $7\}$, or $\{h_{7,\#1}\neq h_{k,\#2}$ holds true for all k, where k is an integer greater than 0 and no greater than $7\}\}$ is satisfied, or $\{\{h_{8,\#1}\neq h_{k,\#2}$ holds true for all k, where k is an integer greater than 7 and no greater than $14\}$, or $\{h_{9,\#1}\neq h_{k,\#2}$ holds true for all k, where k is an integer greater than 7 and no greater than $14\}$, or $\{h_{10,\#1}\neq h_{k,\#2}$ holds true for all k, where k is an integer greater than 7 and no greater than $14\}$, or $\{h_{11,\#1}\neq h_{k,\#2}$ holds true for all k, where k is an integer greater than 7 and no greater than $14\}$, or $\{h_{12,\#1}\neq h_{k,\#2}$ holds true for all k, where k is an integer greater than 7 and no greater than $14\}$, or $\{h_{13,\#1}\neq h_{k,\#2}$ holds true for all k, where k is an integer greater than 7 and no greater than $14\}$, or $\{h_{14,\#1}\neq h_{k,\#2}$ holds true for all k, where k is an integer greater than 7 and no greater than $14\}\}$ is satisfied.

As a result, there is a higher probability that the reception device achieves good data reception quality both when Error Correction Scheme #3 is used and also when Error Correction Scheme #4 is used. Note that Error Correction Scheme #3 and Error Correction Scheme #4 differ in terms of an optimum set of $h_1$, $h_2$, $h_3$, $h_4$, $h_5$, $h_6$, $h_7$, $h_8$, $h_9$, $h_{10}$, $h_{11}$, $h_{12}$, $h_{13}$, and $h_{14}$.

The following summarizes the above explanation.

The following two error correction schemes are considered.

<Error Correction Scheme #3*>

Encoding is performed using block codes having a coding rate A and a block length (code length) of B bits, where A is a real number satisfying 0<A<1, and B is an integer greater than 0.

<Error Correction Scheme #4*>

Encoding is performed using block codes having a coding rate A and a block length (code length) of C bits, where A is a real number satisfying 0<A<1, and C is an integer greater than 0 and satisfying B. C.

Suppose a situation in which the transmission device shown in FIG. 122 uses 16QAM shown in FIG. 114. In such a situation, when the transmission device in FIG. 122 uses Error Correction Scheme #3*, $f_1=f_{1,\#1}$ and $f_2=f_{2,\#1}$ are set with respect to FIG. 114, and when the transmission device uses Error Correction Scheme #4*, $f_1=f_{1,\#2}$ and $f_2=f_{2,\#2}$ are set with respect to FIG. 114. In the above situation, preferably Condition #H4 should be satisfied.

Next, suppose a situation in which the transmission device shown in FIG. 122 uses 64QAM shown in FIG. 115. In such a situation, when the transmission device in FIG. 122 uses Error Correction Scheme #3*, $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ are set with respect to FIG. 115, and when the transmission device uses Error Correction Scheme #4*, $g_1=g_{1,\#2}$, $g_2=g_{2,\#2}$, $g_3=g_{3,\#2}$, $g_4=g_{4,\#2}$, $g_5=g_{5,\#2}$, and $g_6=g_{6,\#2}$ are set with respect to FIG. 115. In the above situation, preferably Condition #H5 should be satisfied.

Next, suppose a situation in which the transmission device shown in FIG. 122 uses 256QAM shown in FIG. 116. In such a situation, when the transmission device in FIG. 122 uses Error Correction Scheme #3*, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ are set with respect to FIG. 116, and when the transmission device uses Error Correction Scheme #4*, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ are set with respect to FIG. 116. In the above situation, preferably Condition #H6 should be satisfied.

Example 3

The transmission device shown in FIG. 122 can, in terms of error correction codes, transmit a plurality of different block lengths (code lengths).

For example, the transmission device in FIG. 122 selects either error correction encoding using LDPC (block) codes having a block length (code length) of 16200 bits or error correction encoding using LDPC (block) codes having a block length (code length) of 64800 bits, and performs the error correction coding which is selected. Thus, the following two error correction schemes are considered.

<Error Correction Scheme #5>

Encoding is performed using LDPC (block) codes having a coding rate of ⅔ and a block length (code length) of 16200 bits (information: 10800 bits, parity: 5400 bits).

<Error Correction Scheme #6>

Encoding is performed using LDPC (block) codes having a coding rate of ⅔ and a block length (code length) of 64800 bits (information: 43200 bits, parity: 21600 bits).

Suppose a situation in which the transmission device shown in FIG. 122 uses 16QAM shown in FIG. 119. In such a situation, when the transmission device in FIG. 122 uses Error Correction Scheme #5, $k_1=k_{1,\#1}$ and $k_2=k_{2,\#1}$ are set with respect to FIG. 119, and when the transmission device uses Error Correction Scheme #6, $k_1=k_{1,\#2}$ and $k_2=k_{2,\#2}$ are set with respect to FIG. 119. In the above situation, the following condition should preferably be satisfied.

<Condition #H7>

$\{k_{1\#1}\neq k_{1,\#2}$ or $k_{2,\#1}\neq k_{2,\#2}\}$ is satisfied.

As a result, there is a higher probability that the reception device achieves good data reception quality both when Error Correction Scheme #5 is used and also when Error Correction Scheme #6 is used. Note that Error Correction Scheme #5 and Error Correction Scheme #6 differ in terms of an optimum set of $k_1$ and $k_2$.

Next, suppose a situation in which the transmission device shown in FIG. 122 uses 64QAM shown in FIG. 120. In such a situation, when the transmission device in FIG. 122 uses Error Correction Scheme #5, $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$ and $m_8=m_{8,\#1}$ are set with respect to FIG. 120, and when the transmission device uses Error Correction Scheme #6, $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$, and $m_8=m_{8,\#2}$ are set with respect to FIG. 120. In the above situation, the following condition should preferably be satisfied.

<Condition #H8>

$\{\{\{m_{1,\#1}\neq m_{1,\#2}$, $m_{1,\#1}\neq m_{2,\#2}$, $m_{1,\#1}\neq m_{3,\#2}$, and $m_{1,\#1}\neq m_{4,\#2}\}$ or $\{m_{2,\#1}\neq m_{1,\#2}$, $m_{2,\#1}\neq m_{2,\#2}$, $m_{2,\#1}\neq m_{3,\#2}$, and $m_{2,\#1}\neq m_{4,\#2}\}$ or $\{m_{3,\#1}\neq m_{1,\#2}$, $m_{3,\#1}\neq m_{2,\#2}$, $m_{3,\#1}\neq m_{3,\#2}$, and $m_{3,\#1}\neq m_{4,\#2}\}$ or $\{m_{4,\#1}\neq m_{1,\#2}$, $m_{4,\#1}\neq m_{2,\#2}$, $m_{4,\#1}\neq m_{3,\#2}$, and $m_{4,\#1}\neq m_{4,\#2}\}$ holds true$\}$, or $\{\{m_{5,\#1}\neq m_{5,\#2}$, $m_{5,\#1}\neq m_{6,\#2}$, $m_{5,\#1}\neq m_{7,\#2}$, and $m_{5,\#1}\neq m_{8,\#2}\}$ or $\{m_{6,\#1}\neq m_{5,\#2}$, $m_{6,\#1}\neq m_{6,\#2}$, $m_{6,\#1}\neq m_{7,\#2}$, and $m_{6,\#1}\neq m_{8,\#2}\}$ or $\{m_{7,\#1}\neq m_{5,\#2}$, $m_{7,\#1}\neq m_{6,\#2}$, $m_{7,\#1}\neq m_{7,\#2}$, and $m_{7,\#1}\neq m_{8,\#2}\}$ or $\{m_{8,\#1}\neq m_{5,\#2}$, $m_{8,\#1}\neq m_{6,\#2}$, $m_{8,\#1}\neq m_{7,\#2}$, and $m_{8,\#1}\neq m_{8,\#2}\}$ holds true$\}\}$ is satisfied.

As a result, there is a higher probability that the reception device achieves good data reception quality both when Error Correction Scheme #5 is used and also when Error Correction Scheme #6 is used. Note that Error Correction Scheme #5 and Error Correction Scheme #6 differ in terms of an optimum set of $m_1$, $m_2$, $m_3$, $m_4$, $m_5$, $m_6$, $m_7$, and $m_8$.

Next, suppose a situation in which the transmission device shown in FIG. 122 uses 256QAM shown in FIG. 121. In such a situation, when the transmission device in FIG. 122 uses Error Correction Scheme #5, $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$ and $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$ and $n_{16}=n_{16,\#1}$ are set with respect to FIG. 121, and when the transmission device uses Error Correction Scheme #6, $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ are set with respect to FIG. 121. In the above situation, the following condition should preferably be satisfied.

<Condition #H9>

$\{\{n_{1,\#1}\neq n_{k,\#2}$ holds true for all k, where k is an integer greater than 0 and no greater than $8\}$, or $\{n_{2,\#1}\neq n_{k,\#2}$ holds true for all k, where k is an integer greater than 0 and no greater than $8\}$, or $\{n_{3,\#1}\neq n_{k,\#2}$ holds true for all k, where k is an integer greater than 0 and no greater than $8\}$, or $\{n_{4,\#1}\neq n_{k,\#2}$ holds true for all k, where k is an integer greater than 0 and no greater than $8\}$, or $\{n_{5,\#1}\neq n_{k,\#2}$ holds true for all k, where k is an integer greater than 0 and no greater than $8\}$, or $\{n_{6,\#1}\neq n_{k,\#2}$ holds true for all k, where k is an integer greater than 0 and no greater than $8\}$, or $\{n_{7,\#1}\neq n_{k,\#2}$ holds true for all k, where k is an integer greater than 0 and no greater than $8\}$, or $\{n_{8,\#1}\neq n_{k,\#2}$ holds true for all k, where k is an integer greater than 0 and no greater than $8\}\}$ is satisfied, or $\{\{n_{9,\#1}\neq n_{k,\#2}$ holds true for all k, where k is an integer greater than 8 and no greater than $16\}$, or $\{n_{10,\#1}\neq n_{k,\#2}$ holds true for all k, where k is an integer greater than 8 and no greater than $16\}$, or $\{n_{11,\#1}\neq n_{k,\#2}$ holds true for all k, where k is an integer greater than 8 and no greater than $16\}$, or $\{n_{12,\#1}\neq n_{k,\#2}$ holds true for all k, where k is an integer greater than 8 and no greater than $16\}$, or $\{n_{13,\#1}\neq n_{k,\#2}$ holds true for all k, where k is an integer greater than 8 and no greater than $16\}$, or $\{n_{14,\#1}\neq n_{k,\#2}$ holds true for all k, where k is an integer greater than 8 and no greater than $16\}$, or $\{n_{15,\#1}\neq n_{k,\#2}$ holds true for all k, where k is an integer greater than 8 and no greater than $16\}$, or $\{n_{16,\#1}\neq n_{k,\#2}$ holds true for all k, where k is an integer greater than 8 and no greater than $16\}\}$ is satisfied.

As a result, there is a higher probability that the reception device achieves good data reception quality both when Error Correction Scheme #5 is used and also when Error Correction Scheme #6 is used. Note that Error Correction Scheme #5 and Error Correction Scheme #6 differ in terms of an optimum set of $n_1$, $n_2$, $n_3$, $n_4$, $n_5$, $n_6$, $n_7$, $n_8$, $n_9$, $n_{10}$, $n_{11}$, $n_{12}$, $n_{13}$, $n_{14}$, $n_{15}$, and $n_{16}$.

The following summarizes the above explanation.

The following two error correction schemes are considered.

<Error Correction Scheme #5*>

Encoding is performed using block codes having a coding rate A and a block length (code length) of B bits, where A is a real number satisfying $0<A<1$, and B is an integer greater than 0.

<Error Correction Scheme #6*>

Encoding is performed using block codes having a coding rate A and a block length (code length) of C bits, where A is a real number satisfying $0<A<1$, and C is an integer greater than 0 and satisfying $B\neq C$.

Suppose a situation in which the transmission device shown in FIG. 122 uses 16QAM shown in FIG. 119. In such a situation, when the transmission device in FIG. 122 uses Error Correction Scheme #5*, $k_1=k_{1,\#1}$ and $k_2=k_{2,\#1}$ are set with respect to FIG. 119, and when the transmission device uses Error Correction Scheme #6', $k_1=k_{1,\#2}$ and $k_2=k_{2,\#2}$ are set with respect to FIG. 119. In the above situation, preferably Condition #H7 should be satisfied.

Next, suppose a situation in which the transmission device shown in FIG. 122 uses 64QAM shown in FIG. 120. In such a situation, when the transmission device in FIG. 122 uses Error Correction Scheme #5*, $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$ and $m_8=m_{8,\#1}$ are set with respect to FIG. 120, and when the transmission device uses Error Correction Scheme #6*, $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$ and $m_8=m_{8,\#2}$ are set with respect to FIG. 120. In the above situation, preferably Condition #H8 should be satisfied.

Next, suppose a situation in which the transmission device shown in FIG. 122 uses 256QAM shown in FIG. 121. In such a situation, when the transmission device in FIG. 122 uses Error Correction Scheme #5*, $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ are set with respect to FIG. 121, and when the transmission device uses Error Correction Scheme #6*, $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ are set with respect to FIG. 121. In the above situation, preferably Condition #H9 should be satisfied.

Note that although detailed explanation of configuration is omitted for FIGS. 122 and 124, transmission and reception of modulated signals can be implemented in the same way even when the OFDM scheme or the spread spectrum communication scheme explained in other embodiments is used in the transmission and reception of the modulated signals.

Also, there is a possibility of improved data reception being achieved using the 16QAM, 64QAM, and 256QAM explained above, even for a transmission scheme using space-time codes such as space-time block codes (note that symbols may alternatively be arranged in the frequency domain), or an MIMO transmission scheme in which precoding is or is not performed, such as described in Embodiments 1 to 12.

Also, when the transmission device performs modulation (mapping) and transmits a modulated signal as described above, the transmission device transmits control information such that a reception device can identify the modulation scheme and parameters of the modulation scheme, and thus acquisition of the control information enables the reception device shown in FIG. 124 to perform demapping (demodulation).

(Supplementary Explanation 6)

The following explains an example of configuration of a communication-broadcasting system using QAM explained in Supplementary Explanations 2-4, and in particular explains an example in which the communication-broadcasting system uses a MIMO transmission scheme.

Figure 125:
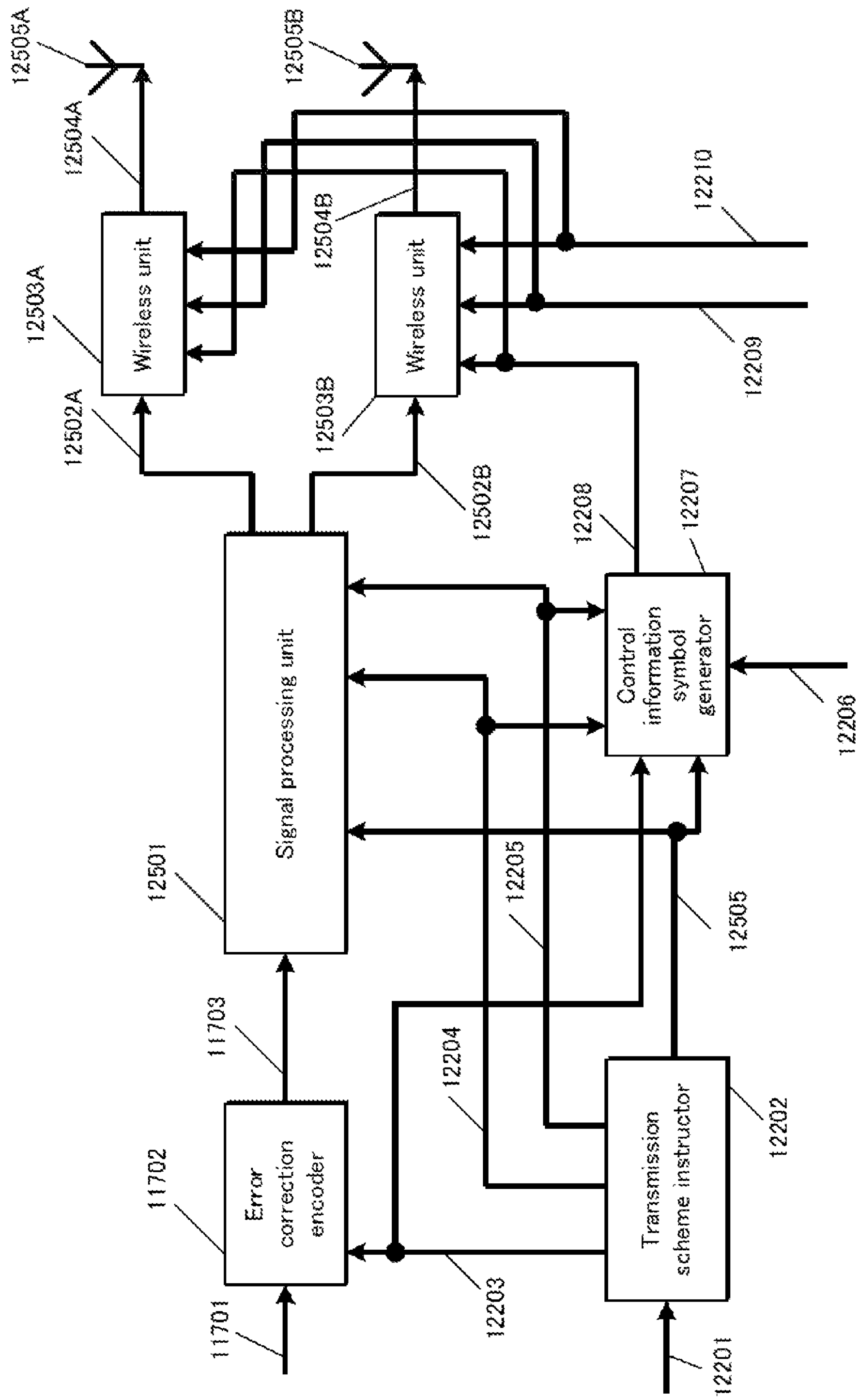

FIG. 125 shows one example of a transmission device. Note that elements that operate the same as elements in FIG. 122 are labeled using the same reference signs.

A transmission scheme instructor 12202 receives an input signal 12201 as input, and, based on the input signal 12201, outputs an error correction code information signal 12203 (for example, indicating a coding rate and a block length of error correction codes), a modulation scheme information signal 12204 (for example, indicating the modulation scheme), a modulation scheme parameter information signal 12205 (for example, information relating to amplitude values in the case of QAM), and a transmission scheme information signal 12505 (for example, information relating to MIMO transmission, single stream transmission, or MISO transmission (transmission using space-time block codes)), in order to generate data symbols. Note that the input signal 12201 may be generated by a user of the transmission device, or alternatively, in the case of a communication system, the input signal 12201 may be feedback information from a device which is a communication partner of the transmission device. Also, in terms of transmission scheme, MIMO transmission, single stream transmission, or MISO transmission (transmission using space-time block codes) can be instructed, and in the present explanation MIMO transmission is assumed to be a transmission scheme explained in Embodiments 1 to 12 in which precoding and phase changing are performed.

An error correction encoder 11702 receives information 11701 and the error correction code information signal 12203 as inputs, performs error correction encoding in accordance with the error correction code information signal 12203, and thereby outputs error correction encoded data 11703.

A signal processing unit 12501 receives the error correction encoded data 11703, the modulation scheme information signal 12204, the modulation scheme parameter information signal 12205, and the transmission scheme information signal 12505 as inputs, and, in accordance with the aforementioned signals, performs processing such as interleaving, mapping, precoding, phase changing, and power changing with respect to the error correction encoded data 11703, and thereby outputs processed baseband signals 12502A and 12502B.

A control information symbol generator 12207 receives the error correction code information signal 12203, the modulation scheme information signal 12204, the modulation scheme parameter information signal 12205, control data 12206, and the transmission scheme information signal 12505 as inputs, performs, for example, processing for error correction encoding and processing for modulation such as BPSK or QPSK, and thereby outputs a control information symbol signal 12208.

A wireless unit 12503A receives the processed baseband signal 12502A, the control information symbol signal 12208, a pilot symbol signal 12209, and a frame structure signal 12210 as inputs, and outputs a transmission signal 12504A in accordance with the frame structure signal 12210. An antenna #1 (12505A) outputs the transmission signal 12504A as a radio wave. Frame structure is as shown in FIG. 126.

A wireless unit 12503B receives the processed baseband signal 12502B, the control information symbol signal 12208, the pilot symbol signal 12209, and the frame structure signal 12210 as inputs, and outputs a transmission signal 12504B in accordance with the frame structure signal 12210. An antenna #2 (12505B) outputs the transmission signal 12504B as a radio wave. Frame structure is as shown in FIG. 126.

Figure 126:
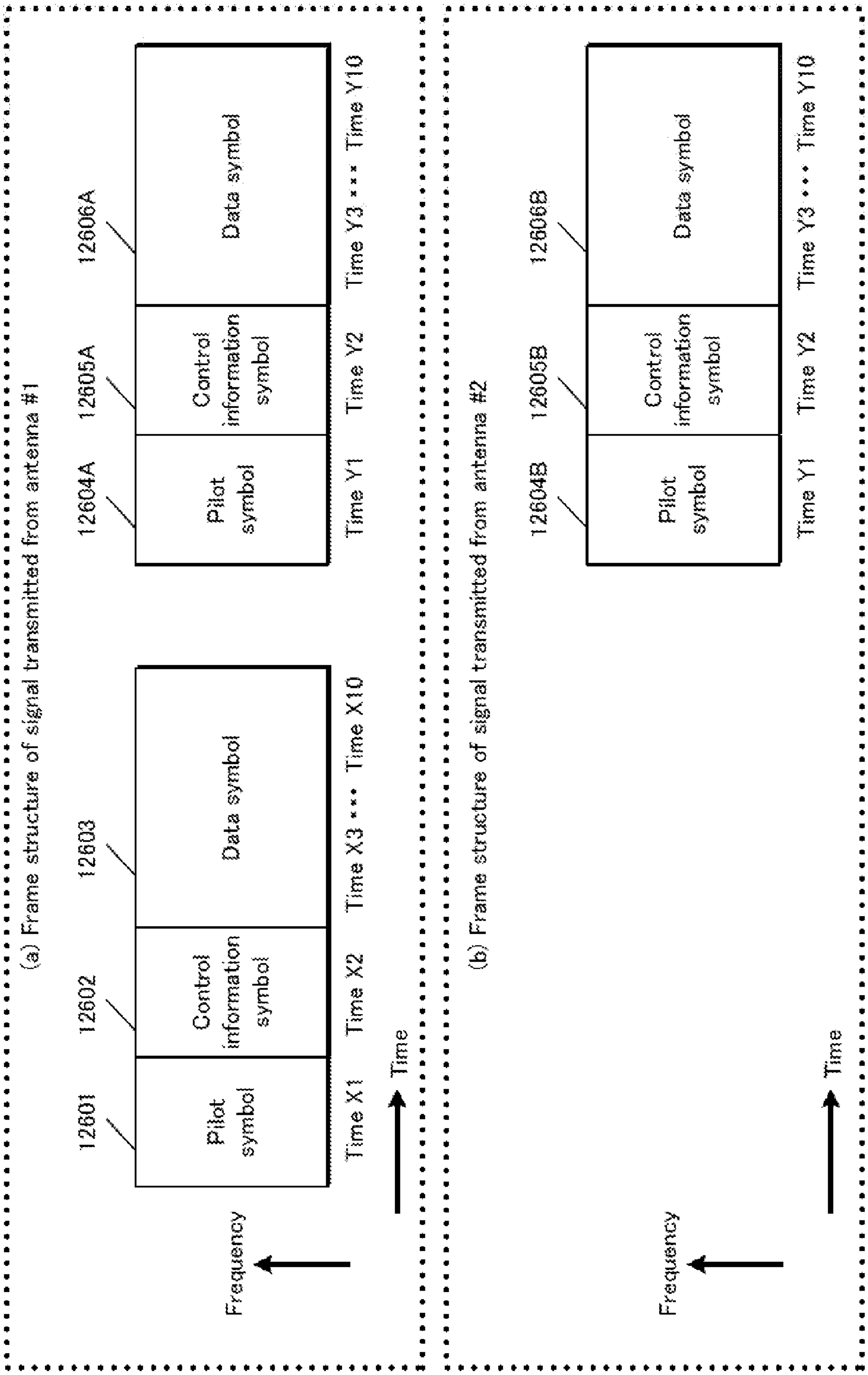

The following explains operation of the signal processing unit 12501 shown in FIG. 125 with reference to FIG. 126.

FIG. 126 shows one example of frame structure in which the vertical axis represents frequency and the horizontal axis represents time. Section (a) of FIG. 126 shows frame structure of a signal transmitted from the antenna #1 (12505A) in FIG. 125 and section (b) of FIG. 126 shows frame structure of a signal transmitted from the antenna #2 (12505B) in FIG. 125.

Explanation is first provided of operation of the transmission device when transmitting a pilot symbol 12601, a control information symbol 12602, and a data symbol 12603 shown in FIG. 126.

In such a situation, in terms of transmission scheme, modulated signals of a single stream are transmitted from the transmission device in FIG. 125. In the above situation, a First Transmission Scheme and a Second Transmission Scheme explained below may be considered.

First Transmission Scheme

The signal processing unit 12501 receives the error correction encoded data 11703, the modulation scheme information signal 12204, the modulation scheme parameter information signal 12205, and the transmission scheme information signal 12505 as inputs, determines a modulation scheme in accordance with at least the modulation scheme information signal 12204 and the modulation scheme parameter information signal 12205, performs mapping in accordance with the modulation scheme, and thereby outputs the processed baseband signal 12502A. In the above situation, the signal processing unit 12501 does not output the processed baseband signal 12502B. Note that it is assumed that the signal processing unit 12501 also performs processing such as interleaving.

The wireless unit 12503A receives the processed baseband signal 12502A, the control information symbol signal 12208, the pilot symbol signal 12209, and the frame structure signal 12210 as inputs, and outputs the transmission signal 12504A in accordance with the frame structure signal 12210. The antenna #1 (12505A) outputs the transmission signal 12504A as a radio wave. Note that in the above situation, the wireless unit 12503B does not operate, and therefore the antenna #2 (12505B) does not output a radio wave.

The following explains the Second Transmission Scheme for a situation in which, in terms of the transmission scheme, modulated signals of a single stream are transmitted from the transmission device in FIG. 125.

Second Transmission Scheme

The signal processing unit 12501 receives the error correction encoded data 11703, the modulation scheme information signal 12204, the modulation scheme parameter information signal 12205, and the transmission scheme information signal 12505 as inputs, determines a modulation scheme in accordance with at least the modulation scheme information signal 12204 and the modulation scheme parameter information signal 12205, performs mapping in accordance which the modulation scheme, and thereby generates a mapped signal.

The signal processing unit 12501 generates two signal strands based on the mapped signal, and thereby outputs the processed baseband signal 12502A and the processed baseband signal 12502B. Note that although the above recites that the signal processing unit 12501 "generates two signal strands based on the mapped signal", more specifically the two signal strands are generated based on the mapped signal by performing, for example, phase changing or power changing. Note that, in the same way as described above, it is assumed that the signal processing unit 12501 also performs processing such as interleaving.

The wireless unit 12503A receives the processed baseband signal 12502A, the control information symbol signal 12208, the pilot symbol signal 12209, and the frame structure signal 12210 as inputs, and outputs a transmission signal 12504A in accordance with the frame structure signal 12210. The antenna #1 (12505A) outputs the transmission signal 12504A as a radio wave.

The wireless unit 12503B receives the processed baseband signal 12502B, the control information symbol signal 12208, the pilot symbol signal 12209, and the frame structure signal 12210 as inputs, and outputs a transmission signal 12504B in accordance with the frame structure signal 12210. The antenna #2 (12505B) outputs the transmission signal 12504B as a radio wave.

The following explains operation of the transmission device when transmitting pilot symbols 12604A and 12604B, control information symbols 12605A and 12605B, and data symbols 12606A and 12606B shown in FIG. 126.

The pilot symbols 12604A and 12604B are symbols that are transmitted from the transmission device at time Y1 using the same frequency (shared/common frequency).

Likewise, the control information symbols 12605A and 12605B are symbols that are transmitted from the transmission device at time Y2 using the same frequency (shared/common frequency).

Also, the data symbols 12606A and 12606B are symbols that are transmitted from the transmission device between time Y3 and time Y10 using the same frequency (shared/common frequency).

The signal processing unit 12501 performs signal processing in accordance with a transmission scheme using space-time codes such as space-time block codes (note that symbols may alternatively be arranged in the frequency domain), or an MIMO transmission scheme in which precoding is or is not performed, such as described in Embodiments 1 to 12. In particular, when performing precoding, phase changing, and power changing, the signal processing unit 12501 for example includes at least the configuration shown in FIG. 97 or FIG. 98, or may alternatively include the configuration shown in any one of FIGS. 5, 6, and 7, with the exception of the encoder.

The signal processing unit 12501 receives the error correction encoded data 11703, the modulation scheme information signal 12204, the modulation scheme parameter information signal 12205, and the transmission scheme information signal 12505 as inputs. When the transmission scheme information signal 12505 is information indicating "perform precoding, phase changing, and power changing", the signal processing unit 12501 operates in the same way as explained in Embodiments 1 to 12 for FIGS. 97 and 98, or alternatively as explained for FIGS. 5, 6, and 7, with the exception of the encoder. The signal processing unit 12501 thereby outputs the processed baseband signals 12502A and 12502B. Note that it is assumed that the signal processing unit 12501 also performs processing such as interleaving.

The wireless unit 12503A receives the processed baseband signal 12502A, the control information symbol signal 12208, the pilot symbol signal 12209, and the frame structure signal 12210 as inputs, and outputs the transmission signal 12504A in accordance with the frame structure signal 12210. The antenna #1 (12505A) outputs the transmission signal 12504A as a radio wave.

The wireless unit 12503B receives the processed baseband signal 12502B, the control information symbol signal 12208, the pilot symbol signal 12209, and the frame structure signal 12210 as inputs, and outputs the transmission signal 12504B in accordance with the frame structure signal 12210. The antenna #2 (12505B) outputs the transmission signal 12504B as a radio wave.

Figure 128:
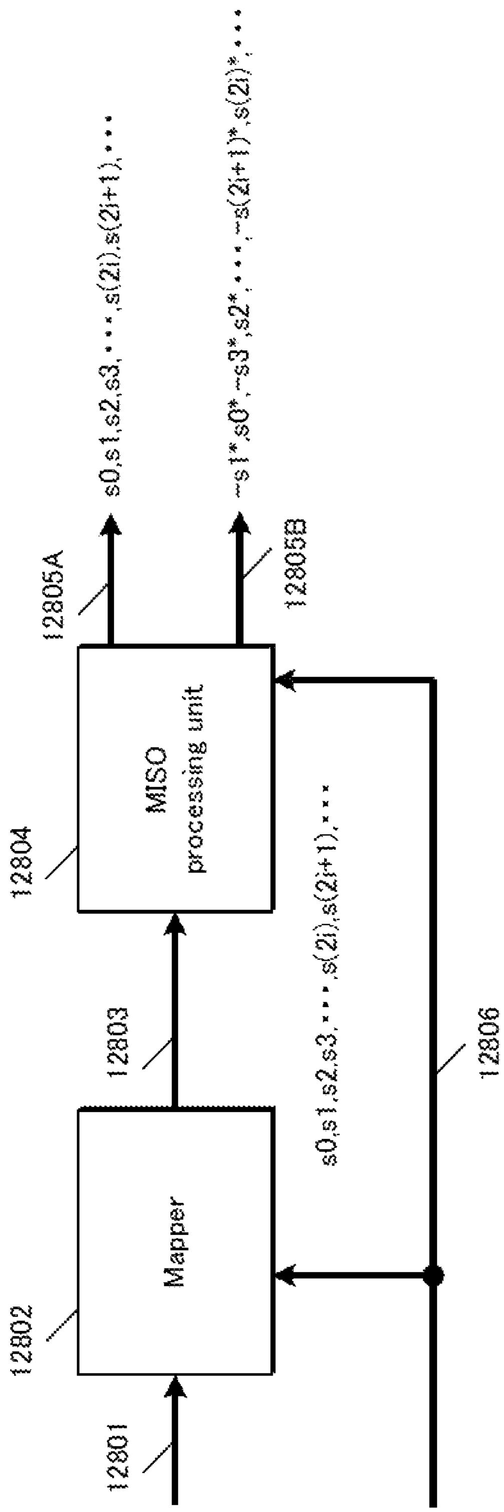

The following explains, with reference to FIG. 128, configuration of the signal processing unit 12501 when a transmission scheme which uses space-time block codes is adopted.

A mapper 12802 receives a data signal (error correction encoded data) 12801 and a control signal 12806 as inputs, performs mapping in accordance with modulation scheme information included in the control signal 12806, and thereby outputs a mapped signal 12803. For example, the mapped signal 12803 may be arranged in an order s0, s1, s2, s3, . . . , s(2*i*), s(2*i*+1), . . . , where i is a non-negative integer.

A MISO processing unit 12804 receives the mapped signal 12803 and the control signal 12806 as inputs, and when the control signal 12806 instructs that transmission is performed by a MISO scheme, the MISO processing unit 12804 outputs MISO processed signals 12805A and 12805B. For example, the MISO processed signal 12805A is s0, s1, s2, s3, . . . , s(2*i*), s(2*i*+1), . . . , and the MISO processed signal 12805B is −s1*, s0*, −s3*, s2*, . . . , −s(2*i*+1)*, s(2*i*)* . . . , where the symbol "*" signifies a complex conjugate.

In the above situation, the MISO processed signals 12805A and 12805B respectively correspond to the processed baseband signals 12502A and 12502B in FIG. 125. Note that a scheme using space-time block codes is not limited to the scheme described above.

The wireless unit 12503A receives the processed baseband signal 12502A, the control information symbol signal 12208, the pilot symbol signal 12209, and the frame structure signal 12210 as inputs, and outputs the transmission signal 12504A in accordance with the frame structure signal 12210. The antenna #1 (12505A) outputs the transmission signal 12504A as a radio wave.

The wireless unit 12503B receives the processed baseband signal 12502B, the control information symbol signal 12208, the pilot symbol signal 12209, and the frame structure signal 12210 as inputs, and outputs the transmission signal 12504B in accordance with the frame structure signal 12210. The antenna #2 (12505B) outputs the transmission signal 12504B as a radio wave.

Figure 127:
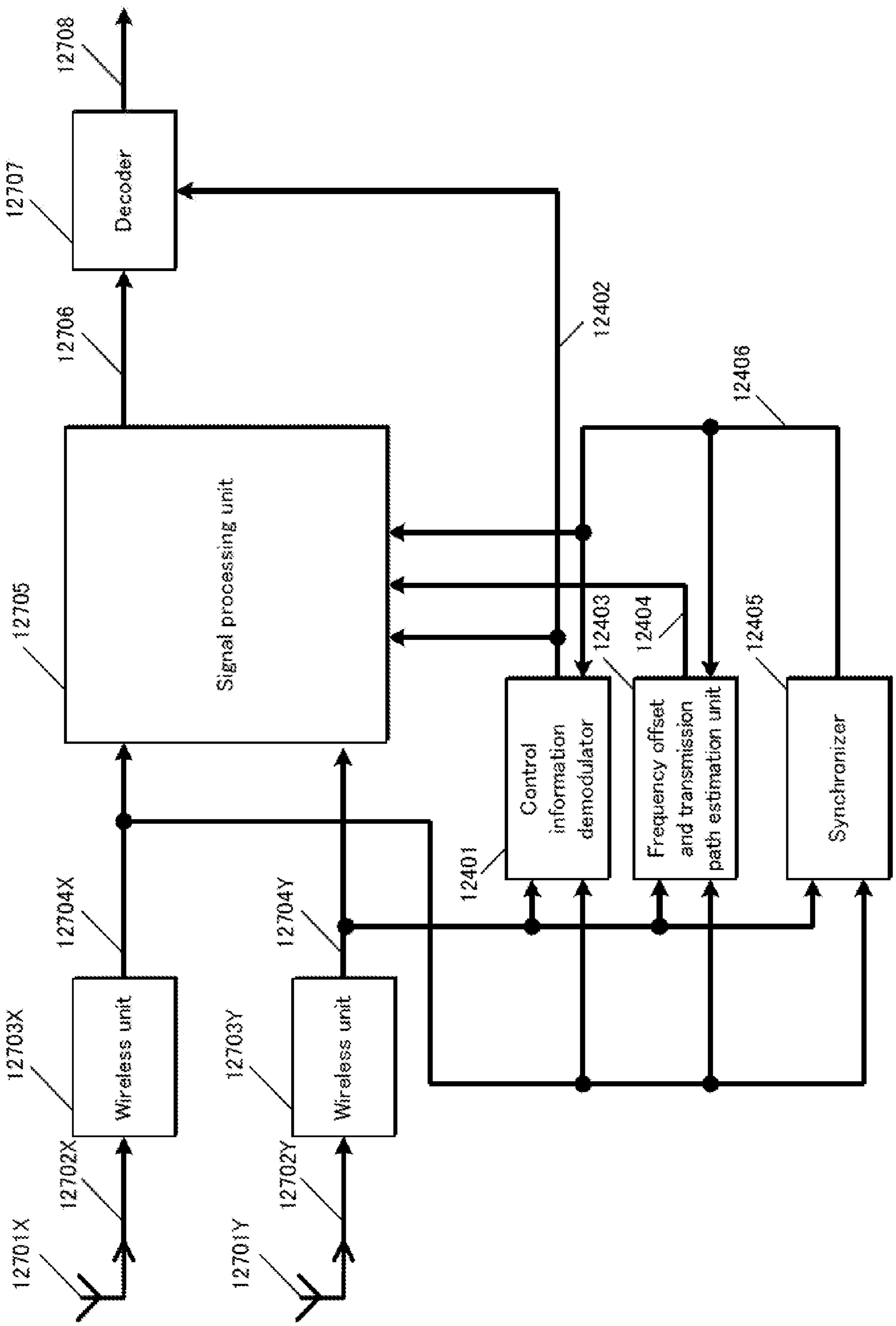

FIG. 127 shows a reception device that receives modulated signals transmitted by the transmission device shown in FIG. 125. Note that elements that operate in the same way as elements shown in FIG. 124 are labeled using the same reference signs.

A synchronizer 12405 receives quadrature baseband signals 12704X and 12704Y as inputs, performs frequency synchronization, time synchronization, and frame synchronization, for example by detecting and using the pilot symbols 12601, 12604A, and 12604B shown in FIG. 126, and thereby outputs a synchronizing signal 12406.

A control information demodulator 12401 receives the quadrature baseband signals 12704X and 12704Y and the synchronizing signal 12406 as inputs, performs demodulation and also error correction decoding of the control information symbols 12602, 12605A, and 12605B shown in FIG. 126, and thereby outputs a control information signal 12402.

A frequency offset and transmission path estimation unit 12403 receives the quadrature baseband signals 12704X and 12704Y and the synchronizing signal 12406 as inputs, for example performs estimation of frequency offset and transmission path variation due to radio waves using the pilot symbols 12601, 12604A, and 12604B shown in FIG. 126, and thereby outputs a frequency offset and transmission path variation estimated signal 12404.

A wireless unit 12703X receives a received signal 12702X, received through an antenna #1 (12701X), as input, performs processing such as frequency conversion, quadrature demodulation, and Fourier transformation, and thereby outputs the quadrature baseband signal 12704X.

In the same way, a wireless unit 12703Y receives a received signal 12702Y, received through an antenna #2 (12701Y), as input, performs processing such as frequency conversion, quadrature demodulation, and Fourier transformation, and thereby outputs the quadrature baseband signal 12704Y.

A signal processing unit 12705 receives the quadrature baseband signals 12704X and 12704Y, the control information signal 12402, the frequency offset and transmission path variation estimated signal 12404, and the synchronizing signal 12406 as inputs, identifies a modulation scheme and a transmission scheme based on the control information signal 12402, performs signal processing and demodulation in accordance with the schemes which are identified, calculates a log-likelihood ratio for each bit included in a data symbol, and thereby outputs a log-likelihood ratio signal 12706. Note that the signal processing unit 12705 may also perform deinterleaving.

A decoder 12707 receives the log-likelihood ratio signal 12706 and the control information signal 12402 as inputs, performs error correction decoding in accordance with an error correction encoding scheme which is indicated by information included in the control information signal 12402, and thereby outputs received data 12708.

The following explains examples in which QAM explained in Supplementary Explanations 2-4 is used.

Example 1

The transmission device shown in FIG. 125 can, in terms of error correction code, transmit a plurality of different block lengths (code lengths).

For example, the transmission device in FIG. 125 selects either error correction encoding using LDPC (block) codes having a block length (code length) of 16200 bits, or error correction encoding using LDPC (block) codes having a block length (code length) of 64800 bits, and performs the error correction encoding which is selected. Thus, the following two error correction schemes are considered.

<Error Correction Scheme #1>

Encoding is performed using LDPC (block) codes having a coding rate of ⅔ and a block length (code length) of 16200 bits (information: 10800 bits, parity: 5400 bits).

<Error Correction Scheme #2>

Encoding is performed using LDPC (block) codes having a coding rate of ⅔ and a block length (code length) of 64800 bits (information: 43200 bits, parity: 21600 bits).

Suppose a situation in which the transmission device shown in FIG. 125 uses 16QAM shown in FIG. 111. In such a situation, when the transmission device in FIG. 125 uses Error Correction Scheme #1, $f=f_{\#1}$ is set with respect to FIG. 111, and when the transmission device uses Error Correction Scheme #2, $f=f_{\#2}$ is set with respect to FIG. 111. In the above situation, the following condition should preferably be satisfied.

<Condition #H10>

In each transmission scheme corresponding to FIG. 125, $f_{\#1}\neq 1$, $f_{\#2}\neq 1$, and $f_{\#1}\neq f_{\#2}$ are satisfied.

As a result, there is a higher probability that the reception device achieves good data reception quality both when Error Correction Scheme #1 is used and also when Error Correction Scheme #2 is used. Note that Error Correction Scheme #1 and Error Correction Scheme #2 differ in terms of an optimum value of f.

Next, suppose a situation in which the transmission device shown in FIG. 125 uses 64QAM shown in FIG. 112. In such a situation, when the transmission device in FIG. 125 uses Error Correction Scheme #1, $g_1=g_{1,\#1}$, $g_2=g_{2,\#1}$, and $g_3=g_{3,\#1}$ are set with respect to FIG. 112, and when the transmission device uses Error Correction Scheme #2, $g_1=g_{1,\#2}$, $g_2=g_{2,\#2}$, and $g_3=g_{3,\#2}$ are set with respect to FIG. 112. In the above situation, the following condition should preferably be satisfied.

<Condition #H11>

In each transmission scheme corresponding to FIG. 125, $\{(g_{1,\#1}, g_{2,\#1}, g_{3,\#1})\neq(1, 3, 5)$, $(g_{1,\#1}, g_{2,\#1}, g_{3,\#1})\neq(1, 5, 3)$, $(g_{1,\#1}, g_{2,\#1}, g_{3,\#1})$, $(3, 1, 5)$, $(g_{1,\#1}, g_{2,\#1}, g_{3,\#1})\neq(3, 5, 1)$, $(g_{1,\#1}, g_{2,\#1}, g_{3,\#1})\neq(5, 1, 3)$, and $(g_{1,\#1}, g_{2,\#1}, g_{3,\#1})\neq(5, 3, 1)\}$, and $\{(g_{1,\#2}, g_{2,\#2}, g_{3,\#2})\neq(1, 3, 5)$, $(g_{1,\#2}, g_{2,\#2}, g_{3,\#2})\neq(1, 5, 3)$, $(g_{1,\#2}, g_{2,\#2}, g_{3,\#2})$, $(3, 1, 5)$, $(g_{1,\#2}, g_{2,\#2}, g_{3,\#2})\neq(3, 5, 1)$, $(g_{1,\#2}, g_{2,\#2}, g_{3,\#2})\neq(5, 1, 3)$, and $(g_{1,\#2}, g_{2,\#2}, g_{3,\#2})\neq(5, 3, 1)\}$, and $\{\{g_{1,\#1}\neq g_{1,\#2}$, or $g_{2,\#1}\neq g_{2,\#2}$ or $g_{3,\#1}\neq g_{3,\#2}\}$ holds true$\}$ are satisfied.

As a result, there is a higher probability that the reception device achieves good data reception quality both when Error Correction Scheme #1 is used and also when Error Correction Scheme #2 is used. Note that Error Correction Scheme #1 and Error Correction Scheme #2 differ in terms of an optimum set of $g_1$, $g_2$, and $g_3$.

Next, suppose a situation in which the transmission device shown in FIG. 125 uses 256QAM shown in FIG. 113. In such a situation, when the transmission device in FIG. 125 uses Error Correction Scheme #1, $h_1=h_{1,\#1}$, $h_2=h_{2\#1}$, $h_3=h_{3,\#1}$, $h_4=h_{4,\#1}$, $h_5=h_{5,\#2}$, $h_6=h_{6,\#2}$, and $h_7=h_{7,\#2}$ are set with respect to FIG. 113, and when the transmission device uses Error Correction Scheme #2, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ are set with respect to FIG. 113. In the above situation, the following condition should preferably be satisfied.

<Condition #H12>

In each transmission scheme corresponding to FIG. 125,

{when {a1 is an integer greater than 0 and no greater than 7, a2 is an integer greater than 0 and no greater than 7, a3 is an integer greater than 0 and no greater than 7, a4 is an integer greater than 0 and no greater than 7, a5 is an integer greater than 0 and no greater than 7, a6 is an integer greater than 0 and no greater than 7, and a7 is an integer greater than 0 and no greater than 7} and {x is an integer greater than 0 and no greater than 7, y is an integer greater than 0 and no greater than 7, and satisfying $x\neq y$}, $(h_{a1,\#1}, h_{a2,\#1}, h_{a3,\#1}, h_{a4,\#1}, h_{a5,\#1}, h_{a6,\#1}, h_{a7,\#1})\neq(1, 3, 5, 7, 9, 11, 13)$ holds true when {$ax\neq ay$ for all x and all y}}, {when {a1 is an integer greater than 0 and no greater than 7, a2 is an integer greater than 0 and no greater than 7, a3 is an integer greater than 0 and no greater than 7, a4 is an integer greater than 0 and no greater than 7, a5 is an integer greater than 0 and no greater than 7, a6 is an integer greater than 0 and no greater than 7, and a7 is an integer greater than 0 and no greater than 7} and {x is an integer greater than 0 and no greater than 7, y is an integer greater than 0 and no greater than 7, and satisfying $x\neq y$}, $(h_{a1,\#2}, h_{a2,\#2}, h_{a3,\#2}, h_{a4,\#2}, h_{a5,\#2}, h_{a6,\#2}, h_{a7,\#2})\neq(1, 3, 5, 7, 9, 11, 13)$ holds true when {$ax\neq ay$ for all x and all y}}, and $\{\{(h_{1,\#1}\neq h_{1,\#2}$ or $h_{2,\#1}\neq h_{2,\#2}$ or $h_{3,\#1}\neq h_{3, \#2}$ or $h_{4,\#1}\neq h_{4,\#2}$ or $h_{5,\#1}\neq h_{5,\#2}$ or $h_{6,\#1}\neq h_{6,\#2}$ or $h_{7,\#1}\neq h_{7,\#2}\}$ holds true$\}$ are satisfied.

As a result, there is a higher probability that the reception device achieves good data reception quality both when Error Correction Scheme #1 is used and also when Error Correction Scheme #2 is used. Note that Error Correction Scheme #1 and Error Correction Scheme #2 differ in terms of an optimum set of $h_1$, $h_2$, $h_3$, $h_4$, $h_5$, $h_6$, and $h_7$.

The following summarizes the above explanation.

The following two error correction schemes are considered.

<Error Correction Scheme #1>

Encoding is performed using block codes having a coding rate A and a block length (code length) of B bits, where A is a real number satisfying $0<A<1$, and B is an integer greater than 0.

<Error Correction Scheme #2*>

Encoding is performed using block codes having a coding rate A and a block length (code length) of C bits, where A is a real number satisfying $0<A<1$, and C is an integer greater than 0 and satisfying $B\neq C$.

Suppose a situation in which the transmission device shown in FIG. 125 uses 16QAM shown in FIG. 11. In such a situation, when the transmission device in FIG. 125 uses Error Correction Scheme #1*, $f=f_{\#1}$ is set with respect to FIG. 111, and when the transmission device uses Error Correction Scheme #2*, $f=f_{\#2}$ is set with respect to FIG. 111. In the above situation, preferably Condition #H10 should be satisfied.

Next, suppose a situation in which the transmission device shown in FIG. 125 uses 64QAM shown in FIG. 112. In such a situation, when the transmission device uses Error Correction Scheme #1*, $g_1=g_{1,\#1}$, $g_2=g_{2,\#1}$, and $g_3=g_{3,\#1}$ are set with respect to FIG. 112, and when the transmission device uses Error Correction Scheme #2*, $g_1=g_{1,\#2}$, $g_2=g_{2,\#2}$, and $g_3=g_{3,\#2}$ are set with respect to FIG. 112. In the above situation, preferably Condition #H11 should be satisfied.

Next, suppose a situation in which the transmission device shown in FIG. 125 uses 256QAM shown in FIG. 113. In such a situation, when the transmission device in FIG. 125 uses Error Correction Scheme #1*, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ are set with respect to FIG. 113, and when the transmission device uses Error Correction Scheme #2*, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ are set with respect to FIG. 113. In the above situation, preferably Condition #H12 should be satisfied.

Example 2

The transmission device shown in FIG. 125 can, in terms of error correction code, transmit a plurality of different block lengths (code lengths).

For example, the transmission device in FIG. 125 selects either error correction encoding using LDPC (block) codes having a block length (code length) of 16200 bits, or error correction encoding using LDPC (block) codes having a block length (code length) of 64800 bits, and performs the error correction encoding which is selected. Thus, the following two error correction schemes are considered.

<Error Correction Scheme #3>

Encoding is performed using LDPC (block) codes having a coding rate of ⅔ and a block length (code length) of 16200 bits (information: 10800 bits, parity: 5400 bits).

<Error Correction Scheme #4>

Encoding is performed using LDPC (block) codes having a coding rate of ⅔ and a block length (code length) of 64800 bits (information: 43200 bits, parity: 21600 bits).

Suppose a situation in which the transmission device shown in FIG. 125 uses 16QAM shown in FIG. 114. In such a situation, when the transmission device in FIG. 125 uses Error Correction Scheme #3, $f_1=f_{1,\#1}$ and $f_2=f_{2,\#1}$ are set with respect to FIG. 114, and when the transmission device uses Error Correction Scheme #4, $f_1=f_{1,\#2}$ and $f_2=f_{2,\#2}$ are set with respect to FIG. 114. In the above situation, the following condition should preferably be satisfied.

<Condition #H13>

In each transmission scheme corresponding to FIG. 125, $\{f_{1,\#1}\neq f_{1,\#2}$ or $f_{2,\#1}\neq f_{2,\#2}\}$ is satisfied.

As a result, there is a higher probability that the reception device achieves good data reception quality both when Error Correction Scheme #3 is used and also when Error Correction Scheme #4 is used. Note that Error Correction Scheme #3 and Error Correction Scheme #4 differ in terms of an optimum set of $f_1$ and $f_2$.

Next, suppose a situation in which the transmission device shown in FIG. 125 uses 64QAM shown in FIG. 115. In such a situation, when the transmission device in FIG. 125 uses Error Correction Scheme #3, $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ are set with respect to FIG. 115, and when the transmission device uses Error Correction Scheme #4, $g_1=g_{1,\#2}$, $g_2=g_{2,\#2}$, $g_3=g_{3,\#2}$, $g_4=g_{4,\#2}$, $g_5=g_{5,\#2}$, and $g_6=g_{6,\#2}$ are set with respect to FIG. 115. In the above situation, the following condition should preferably be satisfied.

<Condition #H14>

In each transmission scheme corresponding to FIG. 125, $\{\{\{g_{1,\#1}\neq g_{1,\#2}$, $g_{1,\#1}\neq g_{2,\#2}$, and $g_{1,\#1}\neq g_{3,\#2}\}$ or $\{g_{2,\#1}\neq g_{1,\#2}$, $g_{2,\#1}\neq g_{2,\#2}$, and $g_{2,\#1}\neq g_{3,\#2}\}$ or $\{g_{3,\#1}\neq g_{1,\#2}$, $g_{3,\#1}\neq g_{2,\#2}$, and $g_{3,\#1}\neq g_{3,\#2}\}$ holds true$\}$, or $\{\{g_{4,\#1}\neq g_{4,\#2}$, $g_{4,\#1}\neq g_{5,\#2}$, and $g_{4,\#1}\neq g_{6,\#2}\}$ or $\{g_{5,\#1}\neq g_{4,\#2}$, $g_{5,\#1}\neq g_{5,\#2}$, and $g_{5,\#1}\neq g_{6,\#2}\}$ or $\{g_{6,\#1}\neq g_{4,\#2}$, $g_{6,\#1}\neq g_{5,\#2}$, and $g_{6,\#1}\neq g_{6,\#2}\}$ holds true$\}\}$ is satisfied.

As a result, there is a higher probability that the reception device achieves good data reception quality both when Error Correction Scheme #3 is used and also when Error Correction Scheme #4 is used. Note that Error Correction Scheme #3 and Error Correction Scheme #4 differ in terms of an optimum set of $g_1$, $g_2$, $g_3$, $g_4$, $g_5$, and $g_6$.

Next, suppose a situation in which the transmission device shown in FIG. 125 uses 256QAM shown in FIG. 116. In such a situation, when the transmission device in FIG. 125 uses Error Correction Scheme #3, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, $h_7=h_{7,\#1}$, $h_8=h_{8,\#1}$, $h_9=h_{9,\#1}$, $h_{10}=h_{10,\#1}$, $h_{11}=h_{11,\#1}$, $h_{12}=h_{12,\#1}$, $h_{13}=h_{13,\#1}$, and $h_{14}=h_{14,\#1}$ are set with respect to FIG. 116, and when the transmission device uses Error Correction Scheme #4, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, $h_7=h_{7,\#2}$, $h_8=h_{8,\#2}$, $h_9=h_{9,\#2}$, $h_{10}=h_{10,\#2}$, $h_{11}=h_{11,\#2}$, $h_{12}=h_{12,\#2}$, $h_{13}=h_{13,\#2}$, and $h_{14}=h_{14,\#2}$ are set with respect to FIG. 116. In the above situation, the following condition should preferably be satisfied.

<Condition #H15>

In each transmission scheme corresponding to FIG. 125, either $\{\{(h_{1,\#1}\neq h_{k,\#2}$ holds true for all k, where k is an integer greater than 0 and no greater than 7$\}$, or $\{h_{2,\#1}\neq h_{k,\#2}$ holds true for all k, where k is an integer greater than 0 and no greater than 7$\}$, or $\{h_{3,\#1}\neq h_{k,\#2}$ holds true for all k, where k is an integer greater than 0 and no greater than 7$\}$, or $\{h_{4,\#1}\neq h_{k,\#2}$ holds true for all k, where k is an integer greater than 0 and no greater than 7$\}$, or $\{h_{5,\#1}\neq h_{k,\#2}$ holds true for all k, where k is an integer greater than 0 and no 5 greater than 7$\}$, or $\{h_{6,\#1}\neq h_{k,\#2}$ holds true for all k, where k is an integer greater than 0 and no greater than 7$\}$, or $\{h_{7,\#1}\neq h_{k,\#2}$ holds true for all k, where k is an integer greater than 0 and no greater than 7$\}\}$ is satisfied, or $\{\{h_{8,\#1}\neq h_{k,\#2}$ holds true for all k, where k is an integer greater than 7 and no greater than 14$\}$, or $\{h_{9,\#1}\neq h_{k,\#2}$ holds true for all k, where k is an integer greater than 7 and no greater than 14$\}$, or $\{h_{10,\#1}\neq h_{k,\#2}$ holds true for all k, where k is an integer greater than 7 and no greater than 14$\}$, or $\{h_{11,\#1}\neq h_{k,\#2}$ holds true for all k, where k is an integer greater than 7 and no greater than 14$\}$, or $\{h_{12,\#1}\neq h_{k,\#2}$ holds true for all k, where k is an integer greater than 7 and no greater than 14$\}$, or $\{h_{13,\#1}\neq h_{k,\#2}$ holds true for all k, where k is an integer greater than 7 and no greater than 14$\}$, or $\{h_{14,\#1}\neq h_{k,\#2}$ holds true for all k, where k is an integer greater than 7 and no greater than 14$\}\}$ is satisfied.

As a result, there is a higher probability that the reception device achieves good data reception quality both when Error Correction Scheme #3 is used and also when Error Correction Scheme #4 is used. Note that Error Correction Scheme #3 and Error Correction Scheme #4 differ in terms of an optimum set of $h_1$, $h_2$, $h_3$, $h_4$, $h_5$, $h_6$, $h_7$, $h_8$, $h_9$, $h_{10}$, $h_{11}$, $h_{12}$, $h_{13}$, and $h_{14}$.

The following summarizes the above explanation.

The following two error correction schemes are considered.

<Error Correction Scheme #3*>

Encoding is performed using block codes having a coding rate A and a block length (code length) of B bits, where A is a real number satisfying $0<A<1$, and B is an integer greater than 0.

<Error Correction Scheme #4*>

Encoding is performed using block codes having a coding rate A and a block length (code length) of C bits, where A is a real number satisfying $0<A<1$, and C is an integer greater than 0 and satisfying $B\neq C$.

Suppose a situation in which the transmission device shown in FIG. 125 uses 16QAM shown in FIG. 114. In such a situation, when the transmission device in FIG. 125 uses Error Correction Scheme #3*, $f_1=f_{1,\#1}$ and $f_2=f_{2,\#1}$ are set with respect to FIG. 114, and when the transmission device uses Error Correction Scheme #4*, $f_1=f_{1,\#2}$ and $f_2=f_{2,\#2}$ are set with respect to FIG. 114. In the above situation, preferably Condition #H13 should be satisfied.

Next, suppose a situation in which the transmission device shown in FIG. 125 uses 64QAM shown in FIG. 115. In such a situation, when the transmission device in FIG. 125 uses Error Correction Scheme #3*, $g_1=g_{1,\#1}$, $g_2=g_{2,\#1}$, $g_3=g_{3,\#1}$, $g_4=g_{4,\#1}$, $g_5=g_{51\#1}$, and $g_6=g_{6,\#1}$ are set with respect to FIG. 115, and when the transmission device uses Error Correction Scheme #4*, $g_1=g_{1,\#2}$, $g_2=g_{2,\#2}$, and $g_3=g_{3,\#2}$, $g_4=g_{4,\#2}$, $g_5=g_{5,\#2}$, and $g_6=g_{6,\#2}$ are set with respect to FIG. 115. In the above situation, preferably Condition #H14 should be satisfied.

Next, suppose a situation in which the transmission device shown in FIG. 125 uses 256QAM shown in FIG. 116. In such a situation, when the transmission device in FIG. 125 uses Error Correction Scheme #3*, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ are set with respect to FIG. 116, and when the transmission device uses Error Correction Scheme #4*, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ are set with respect to FIG. 116. In the above situation, preferably Condition #H15 should be satisfied.

Example 3

The transmission device shown in FIG. 125 can, in terms of error correction code, transmit a plurality of different block lengths (code lengths).

For example, the transmission device in FIG. 125 selects either error correction encoding using LDPC (block) codes having a block length (code length) of 16200 bits or error correction encoding using LDPC (block) codes having a block length (code length) of 64800 bits, and performs the error correction encoding which is selected. Thus, the following two error correction schemes are considered.

<Error Correction Scheme #5>

Encoding is performed using LDPC (block) codes having a coding rate of ⅔ and a block length (code length) of 16200 bits (information: 10800 bits, parity: 5400 bits).

<Error Correction Scheme #6>

Encoding is performed using LDPC (block) codes having a coding rate of ⅔ and a block length (code length) of 64800 bits (information: 43200 bits, parity: 21600 bits).

Suppose a situation in which the transmission device shown in FIG. 125 uses 16QAM shown in FIG. 119. In such a situation, when the transmission device in FIG. 125 uses Error Correction Scheme #5, $k_1=k_{1,\#1}$ and $k_2=k_{2,\#1}$ are set with respect to FIG. 119, and when the transmission device uses Error Correction Scheme #6, $k_1=k_{1,\#2}$ and $k_2=k_{2,\#2}$ are set with respect to FIG. 119. In the above situation, the following condition should preferably be satisfied.

<Condition #H16>

In each transmission scheme corresponding to FIG. 125, $\{k_{1,\#1}\neq k_{1,\#2}$ or $k_{2,\#1}\neq k_{2,\#2}\}$ is satisfied.

As a result, there is a higher probability that the reception device achieves good data reception quality both when Error Correction Scheme #5 is used and also when Error Correction Scheme #6 is used. Note that Error Correction Scheme #5 and Error Correction Scheme #6 differ in terms of an optimum set of $k_1$ and $k_2$.

Next, suppose a situation in which the transmission device shown in FIG. 125 uses 64QAM shown in FIG. 120. In such a situation, when the transmission device in FIG. 125 uses Error Correction Scheme #5, $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$ and $m_8=m_{8,\#1}$ are set with respect to FIG. 120, and when the transmission device uses Error Correction Scheme #6, $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$ and $m_8=m_{8,\#2}$ are set with respect to FIG. 120. In the above situation, the following condition should preferably be satisfied.

<Condition #H17>

In each transmission scheme corresponding to FIG. 125, $\{\{\{m_{1,\#1}\neq m_{1,\#2}$, $m_{1,\#1}\neq m_{2,\#2}$, $m_{1,\#1}\neq m_{3,\#2}$, and $m_{1,\#1}\neq m_{4,\#2}\}$ or $\{m_{2,\#1}\neq m_{1,\#2}$, $m_{2,\#1}\neq m_{2,\#2}$, $m_{2,\#1}\neq m_{3,\#2}$, and $m_{2,\#1}\neq m_{4,\#2}\}$ or $\{m_{3,\#1}\neq m_{1,\#2}$, $m_{3,\#1}\neq m_{2,\#2}$, $m_{3,\#1}\neq m_{3,\#2}$, and $m_{3,\#1}\neq m_{4,\#2}\}$ or $\{m_{4,\#1}\neq m_{1,\#2}$, $m_{4,\#1}\neq m_{2,\#2}$, $m_{4,\#1}\neq m_{3,\#2}$, and $m_{4,\#1}\neq m_{4,\#2}\}$ holds true$\}$, or $\{\{m_{5,\#1}\neq m_{5,\#2}$, $m_{5,\#1}\neq m_{6,\#2}$, $m_{5,\#1}\neq m_{7,\#2}$, and $m_{5,\#1}\neq m_{8,\#2}\}$ or $\{m_{6,\#1}\neq m_{5,\#2}$, $m_{6,\#1}\neq m_{6,\#2}$, $\{m_{6,\#1}\neq m_{7,\#2}$, and $m_{6,\#1}\neq m_{8,\#2}\}$ or $\{m_{7,\#1}\neq m_{5,\#2}$, $m_{7,\#1}\neq m_{6,\#2}$, $m_{7,\#1}\neq m_{7,\#2}$, and $m_{7,\#1}\neq m_{8,\#2}\}$ or $\{m_{8,\#1}\neq m_{5,\#2}$, $m_{8,\#1}\neq m_{6,\#2}$, $m_{8,\#1}\neq m_{7,\#2}$, and $m_{8,\#1}\neq m_{8,\#2}\}$ holds true$\}\}$ is satisfied.

As a result, there is a higher probability that the reception device achieves good data reception quality both when Error Correction Scheme #5 is used and also when Error Correction Scheme #6 is used. Note Error Correction Scheme #5 and Error Correction Scheme #6 differ in terms of an optimum set of $m_1$, $m_2$, $m_3$, $m_4$, $m_5$, $m_6$, $m_7$, and $m_8$.

Next, suppose a situation in which the transmission device shown in FIG. 125 uses 256QAM in FIG. 121. In such a situation, when the transmission device in FIG. 125 uses Error Correction Scheme #5, $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ are set with respect to FIG. 121, and when the transmission device uses Error Correction Scheme #6, $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ are set with respect to FIG. 121. In the above situation, the following condition should preferably be satisfied.

<Condition #H18>

In each transmission scheme corresponding to FIG. 125, either $\{\{n_{1,\#1}\neq n_{k\#2}$ holds true for all k, where k is an integer greater than 0 and no greater than 8$\}$, or $\{n_{2,\#1}\neq n_{k\#2}$ holds true for all k, where k is an integer greater than 0 and no greater than 8$\}$, or $\{n_{3,\#1}\neq n_{k\#2}$ holds true for all k, where k is an integer greater than 0 and no greater than 8$\}$, or $\{n_{4,\#1}\neq n_{k\#2}$ holds true for all k, where k is an integer greater than 0 and no greater than 8$\}$, or $\{n_{5,\#1}\neq n_{k\#2}$ holds true for all k, where k is an integer greater than 0 and no greater than 8$\}$, or $\{\{n_{6,\#1}\neq n_{k\#2}$ holds true for all k, where k is an integer greater than 0 and no greater than 8$\}$, or $\{n_{7,\#1}\neq n_{k\#2}$ holds true for all k, where k is an integer greater than 0 and no greater than 8$\}$, or $\{n_{8,\#1}\neq n_{k\#2}$ holds true for all k, where k is an integer greater than 0 and no greater than 8$\}\}$ is satisfied, or $\{(n_{9,\#1}\neq n_{k\#2}$ holds true for all k, where k is an integer greater than 8 and no greater than 16$\}$, or $\{n_{10,\#1}\neq n_{k\#2}$ holds true for all k, where k is an integer greater than 8 and no greater than 16$\}$, or $\{n_{11,\#1}\neq n_{k\#2}$ holds true for all k, where k is an integer greater than 8 and no greater than 16$\}$, or $\{n_{12,\#1}\neq n_{k\#2}$ holds true for all k, where k is an integer greater than 8 and no greater than 16$\}$, or $\{n_{13,\#1}\neq n_{k\#2}$ holds true for all k, where k is an integer greater than 8 and no greater than 16$\}$, or $\{n_{14,\#1}\neq n_{k\#2}$ holds true for all k, where k is an integer greater than 8 and no greater than 16$\}$, or $\{n_{15,\#1}\neq n_{k\#2}$ holds true for all k, where k is an integer greater than 8 and no greater than 16$\}$, or $\{n_{16,\#1}\neq n_{k\#2}$ holds true for all k, where k is an integer greater than 8 and no greater than 16$\}\}$ is satisfied.

As a result, there is a higher probability that the reception device achieves good data reception quality both when Error Correction Scheme #5 is used and also when Error Correction Scheme #6 is used. Note that Error Correction Scheme #5 and Error Correction Scheme #6 differ in terms of an optimum set of $n_1$, $n_2$, $n_3$, $n_4$, $n_5$, $n_6$, $n_7$, $n_8$, $n_9$, $n_{10}$, $n_{11}$, $n_{12}$, $n_{13}$, $n_{14}$, $n_{15}$, and $n_{16}$.

The following summarizes the above explanation.

The following two error correction schemes are considered.

<Error Correction Scheme #5*>

Encoding is performed using block codes having a coding rate A and a block length (code length) of B bits, where A is a real number satisfying $0<A<1$, and B is an integer greater than 0.

<Error Correction Scheme #6*>

Encoding is performed using block codes having a coding rate A and a block length (code length) of C bits, where A is a real number satisfying $0<A<1$, and C is an integer greater than 0 and satisfying $B\neq C$.

Suppose a situation in which the transmission device shown in FIG. 125 uses 16QAM shown in FIG. 119. In such a situation, when the transmission device in FIG. 125 uses Error Correction Scheme #5*, $k_1=k_{1,\#1}$ and $k_2=k_{2,\#1}$ are set with respect to FIG. 119, and when the transmission device uses Error Correction Scheme #6*, $k_1=k_{1,\#2}$ and $k_2=k_{2,\#2}$ are set with respect to FIG. 119. In the above situation, preferably Condition #H16 should be satisfied.

Next, suppose a situation in which the transmission device shown in FIG. 125 uses 64QAM shown in FIG. 120. In such a situation, when the transmission device in FIG. 125 uses Error Correction Scheme #5*, $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$, and $m_8=m_{8,\#1}$ are set with respect to FIG. 120, and when the transmission device uses Error Correction Scheme #6*, $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$, and $m_8=m_{8,\#2}$ are set with respect to FIG. 120. In the above situation, preferably Condition #H17 should be satisfied.

Next, suppose a situation in which the transmission device shown in FIG. 125 uses 256QAM shown in FIG. 121. In such a situation, when the transmission device in FIG. 125 uses Error Correction Scheme #5*, $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$, and $n_{16}=n_{16,\#1}$ are set with respect to FIG. 121, and when the transmission device uses Error Correction Scheme #6*, $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$, and $n_{16}=n_{16,\#2}$ are set with respect to FIG. 121. In the above situation, preferably Condition #H18 should be satisfied.

Note that although detailed explanation of configuration is omitted for FIGS. 125 and 127, transmission and reception of modulated signals can be implemented in the same way even when the OFDM scheme or the spread spectrum communication scheme explained in other embodiments of the present Description is used in the transmission and reception of the modulated signals.

Example 4

As explained with reference to FIG. 126, the transmission device in FIG. 125 may transmit signals of a single stream using one or more antennas, may perform precoding, phase changing, and power changing, and may adopt a transmission scheme using space-time block codes. Suppose that the transmission device in FIG. 125 performs the following encoding.

"Encoding is performed using block codes having a coding rate A and a block length (code length) of B bits, where A is a real number satisfying $0<A<1$, and B is an integer greater than 0."

Also, the following definitions are made.

Transmission Scheme #1: signals of a single stream are transmitted using one or more antennas.

Transmission Scheme #2: precoding, phase changing, and power changing are performed.

Transmission Scheme #3: space-time block codes are used.

Suppose a situation in which the transmission device shown in FIG. 125 uses 16QAM shown in FIG. 111. In such a situation, when the transmission device in FIG. 125 uses Transmission Scheme #X, $f=f_{\#1}$ is set with respect to FIG. 111, and when the transmission device uses the Transmission Scheme #Y $f=f_{\#2}$ is set with respect to FIG. 111. In the above situation, the following condition should preferably be satisfied.

<Condition #H19>

$f_{\#1}\neq 1$, $f_{\#2}\neq 1$, and $f_{\#1}\neq f_{\#2}$ are satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum value of f.

Next, suppose a situation in which the transmission device shown in FIG. 125 uses 64QAM shown in FIG. 112. In such a situation, when the transmission device in FIG. 125 uses Transmission Scheme #X, $g_1=g_{1,\#1}$, $g_2=g_{2,\#1}$, and $g_3=g_{3,\#1}$ are set with respect to FIG. 112, and when the transmission device uses Transmission Scheme #Y $g_1=g_{1,\#2}$, $g_2=g_{2,\#2}$, and $g_3=g_{3,\#2}$ are set with respect to FIG. 112. In the above situation, the following condition should preferably be satisfied.

<Condition #H20>

{$(g_{1,\#1}, g_{2,\#1}, g_{3,\#1})\neq(1, 3, 5)$, $(g_{1,\#1}, g_{2,\#1}, g_{3,\#1})\neq(1, 5, 3)$, $(g_{1,\#1}, g_{2,\#1}, g_{3,\#1})\neq(3, 1, 5)$, $(g_{1,\#1}, g_{2,\#1}, g_{3,\#1})\neq(3, 5, 1)$, $(g_{1,\#1}, g_{2,\#1}, g_{3,\#1})\neq(5, 1, 3)$, and $(g_{1,\#1}, g_{2,\#1}, g_{3,\#1})\neq(5, 3, 1)$}, {$(g_{1,\#2}, g_{2,\#2}, g_{3,\#2})\neq(1, 3, 5)$, $(g_{1,\#2}, g_{2,\#2}, g_{3,\#2})\neq(1, 5, 3)$, $(g_{1,\#2}, g_{2,\#2}, g_{3,\#2})\neq(3, 1, 5)$, $(g_{1,\#2}, g_{2,\#2}, g_{3,\#2})\neq(3, 5, 1)$, $(g_{1,\#2}, g_{2,\#2}, g_{3,\#2})\neq(5, 1, 3)$, and $(g_{1,\#2}, g_{2,\#2}, g_{3,\#2})\neq(5, 3, 1)$}, and {{$g_{1,\#1}\neq g_{1,\#2}$ or $g_{2,\#1}\neq g_{2,\#2}$ or $g_{3,\#1}\neq g_{3\#2}$} holds true} are satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $g_1$, $g_2$, and $g_3$.

Next, suppose a situation in which the transmission device shown in FIG. 125 uses 256QAM shown in FIG. 113. In such a situation, when the transmission device in FIG. 125 uses Transmission Scheme #X, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, and $h_7=h_{7,\#1}$ are set with respect to FIG. 113, and when the transmission device uses Transmission Scheme #Y, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, and $h_7=h_{7,\#2}$ are set with respect to FIG. 113. In the above situation, the following condition should preferably be satisfied.

<Condition #H21>

{When {a1 is an integer greater than 0 and no greater than 7, a2 is an integer greater than 0 and no greater than 7, a3 is an integer greater than 0 and no greater than 7, a4 is an integer greater than 0 and no greater than 7, a5 is an integer greater than 0 and no greater than 7, a6 is an integer greater than 0 and no greater than 7, and a7 is an integer greater than 0 and no greater than 7} and {x is an integer greater than 0 and no greater than 7, and y is an integer greater than 0 and no greater than 7, where x≠y}, $(h_{a1,\#1}, h_{a2,\#1}, h_{a3,\#1}, h_{a4,\#1}, h_{a5,\#1}, h_{a6,\#1}, h_{a7,\#1})\neq(1, 3, 5, 7, 9, 11, 13)$} holds true when {ax≠ay holds true for all x and all y}}, {when {a1 is an integer greater than 0 and no greater than 7, a2 is an integer greater than 0 and no greater than 7, a3 is an integer greater than 0 and no greater than 7, a4 is an integer greater than 0 and no greater than 7, a5 is an integer greater than 0 and no greater than 7, a6 is an integer greater than 0 and no greater than 7, and a7 is an integer greater than 0 and no greater than 7} and {x is an integer greater than 0 and no greater than 7, and y is an integer greater than 0 and no greater than 7, where x≠y}, $(h_{a1,\#2}, h_{a2,\#2}, h_{a3,\#2}, h_{a4,\#2}, h_{a5,\#2}, h_{a6,\#2}, h_{a7,\#2})\neq(1, 3, 5, 7, 9, 11, 13)$} holds true when {ax≠ay holds true for all x and all y}}, and $\{\{h_{1,\#1} \neq h_{1,\#2}$ or $h_{2,\#1} \neq h_{2,\#2}$ or $h_{3,\#1} \neq h_{3,\#2}$ or $h_{4,\#1} \neq h_{4,\#2}$ or $h_{5,\#1} \neq h_{5,\#2}$ or $h_{6,\#1} \neq h_{6,\#2}$ or $h_{7,\#1} \neq h_{7,\#2}\}$ holds true$\}$ are satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $h_1$, $h_2$, $h_3$, $h_4$, $h_5$, $h_6$, and $h_7$.

Example 5

As explained with reference to FIG. 126, the transmission device shown in FIG. 125 may transmit signals of a single stream using one or more antennas, may perform precoding, phase changing, and power changing, and may adopt a transmission scheme using space-time block codes. Suppose that the transmission device in FIG. 125 performs the following encoding.

"Encoding is performed using block codes having a coding rate A and a block length (code length) of B bits, where A is a real number satisfying $0<A<1$, and B is an integer greater than 0."

Also, the following definitions are made.

Transmission Scheme #1: signals of a single stream are transmitted using one or more antennas.

Transmission Scheme #2: precoding, phase changing, and power changing are performed.

Transmission Scheme #3: space-time block codes are used.

Suppose a situation in which the transmission device shown in FIG. 125 uses 16QAM shown in FIG. 114. In such a situation, when the transmission device in FIG. 125 uses Transmission Scheme #X, $f_1=f_{1,\#1}$, and $f_2=f_{2,\#1}$ are set with respect to FIG. 114, and when the transmission device uses Transmission Scheme #Y, $f_1=f_{1,\#2}$ and $f_2=f_{2,\#2}$ are set with respect to FIG. 114. In the above situation, the following condition should preferably be satisfied.

<Condition #H22>

$\{f_{1,\#1} \neq f_{1,\#2}$ or $f_{2,\#1} \neq f_{2,\#2}\}$ is satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $f_1$ and $f_2$.

Next, suppose a situation in which the transmission device shown in FIG. 125 uses 64QAM shown in FIG. 115. In such a situation, when the transmission device in FIG. 125 uses Transmission Scheme #X, $g_1=g_{1,\#1}$, $g_2=g_{2,\#1}$, $g_3=g_{3,\#1}$, $g_4=g_{4,\#1}$, $g_5=g_{5,\#1}$, and $g_6=g_{6,\#1}$ are set with respect to FIG. 115, and when the transmission device uses Transmission Scheme #Y, $g_1=g_{1,\#2}$, $g_2=g_{2,\#2}$, $g_3=g_{3,\#2}$, $g_4=g_{4,\#2}$, $g_5=g_{5,\#2}$, and $g_6=g_{6,\#2}$ are set with respect to FIG. 115. In the above situation, the following condition should preferably be satisfied.

<Condition #H23>

$\{\{\{g_{1,\#1} \neq g_{1,\#2}$, $g_{1,\#1} \neq g_{2,\#2}$, and $g_{1,\#1} \neq g_{3,\#2}\}$ or $\{g_{2,\#1} \neq g_{1,\#2}$, $g_{2,\#1} \neq g_{2,\#2}$, and $g_{2,\#1} \neq g_{3,\#2}\}$ or $\{g_{3,\#1} \neq g_{1,\#2}$, $g_{3,\#1} \neq g_{2,\#2}$, and $g_{3,\#1} \neq g_{3,\#2}\}$ holds true$\}$, or $\{\{g_{4,\#1} \neq g_{4,\#2}$, $g_{4,\#1} \neq g_{5,\#2}$, and $g_{4,\#1} \neq g_{6,\#2}\}$ or $\{g_{5,\#1} \neq g_{4,\#2}$, $g_{5,\#1} \neq g_{5,\#2}$, and $g_{5,\#1} \neq g_{6,\#2}\}$ or $\{g_{6,\#1} \neq g_{4,\#2}$, $g_{6,\#1} \neq g_{5,\#2}$, and $g_{6,\#1} \neq g_{6,\#2}\}$ holds true$\}\}$ is satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $g_1$, $g_2$, $g_3$, $g_4$, $g_5$, and $g_6$.

Next, suppose a situation in which the transmission device shown in FIG. 125 uses 256QAM shown in FIG. 116. In such a situation, when the transmission device in FIG. 125 uses Transmission Scheme #X, $h_1=h_{1,\#1}$, $h_2=h_{2,\#1}$, $h_3=h_{3,\#1}$, $h_4=h_{4,\#1}$, $h_5=h_{5,\#1}$, $h_6=h_{6,\#1}$, $h_7=h_{7,\#1}$, $h_8=h_{8,\#1}$, $h_9=h_{9,\#1}$, $h_{10}=h_{10,\#1}$, $h_{11}=h_{11,\#1}$, $h_{12}=h_{12,\#1}$, $h_{13}=h_{13,\#1}$, and $h_{14}=h_{14,\#1}$ are set with respect to FIG. 116, and when the transmission device uses Transmission Scheme #Y, $h_1=h_{1,\#2}$, $h_2=h_{2,\#2}$, $h_3=h_{3,\#2}$, $h_4=h_{4,\#2}$, $h_5=h_{5,\#2}$, $h_6=h_{6,\#2}$, $h_7=h_{7,\#2}$, $h_8=h_{8,\#2}$, $h_9=h_{9,\#2}$, $h_{10}=h_{10,\#2}$, $h_{11}=h_{11,\#2}$, $h_{12}=h_{12,\#2}$, $h_{13}=h_{13,\#2}$, and $h_{14}=h_{14,\#2}$ are set with respect to FIG. 116. In the above situation, the following condition should preferably be satisfied.

<Condition #H24>

$\{\{h_{1,\#1} \neq h_{k,\#2}$ holds true for all k, where k is an integer greater than 0 and no greater than 7$\}$, or $\{h_{2,\#1} \neq h_{k,\#2}$ holds true for all k, where k is an integer greater than 0 and no greater than 7$\}$, or $\{h_{3,\#1} \neq h_{k,\#2}$ holds true for all k, where k is an integer greater than 0 and no greater than 7$\}$, or $\{h_{4,\#1} \neq h_{k,\#2}$ holds true for all k, where k is an integer greater than 0 and no greater than 7$\}$, or $\{h_{5,\#1} \neq h_{k,\#2}$ holds true for all k, where k is an integer greater than 0 and no greater than 7$\}$, or $\{h_{6,\#1} \neq h_{k,\#2}$ holds true for all k, where k is an integer greater than 0 and no greater than 7$\}$, or $\{h_{7,\#1} \neq h_{k,\#2}$ holds true for all k, where k is an integer greater than 0 and no greater than 7$\}$ is satisfied, or $\{\{h_{8,\#1} \neq h_{k,\#2}$ holds true for all k, where k is an integer greater than 7 and no greater than 14$\}$, or $\{h_{9,\#1} \neq h_{k,\#2}$ holds true for all k, where k is an integer greater than 7 and no greater than 14$\}$, or $\{h_{10,\#1} \neq h_{k,\#2}$ holds true for all k, where k is an integer greater than 7 and no greater than 14$\}$, or $\{h_{11,\#1} \neq h_{k,\#2}$ holds true for all k, where k is an integer greater than 7 and no greater than 14$\}$, or $\{h_{12,\#1} \neq h_{k,\#2}$ holds true for all k, where k is an integer greater than 7 and no greater than 14$\}$, or $\{h_{13,\#1} \neq h_{k,\#2}$ holds true for all k, where k is an integer greater than 7 and no greater than 14$\}$, or $\{h_{14,\#1} \neq h_{k,\#2}$ holds true for all k, where k is an integer greater than 7 and no greater than 14$\}\}$ is satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $h_1$, $h_2$, $h_3$, $h_4$, $h_5$, $h_6$, $h_7$, $h_8$, $h_9$, $h_{10}$, $h_{11}$, $h_{12}$, $h_{12}$, $h_{13}$ and $h_{14}$.

Example 6

As explained with reference to FIG. 126, the transmission device in FIG. 125 may transmit signals of a single stream using one or more antennas, may perform precoding, phase changing, and power changing, and may adopt a transmission scheme using space-time block codes. Suppose that the transmission device in FIG. 125 performs the following encoding.

"Encoding is performed using block codes having a coding rate A and a block length (code length) of B bits, where A is a real number satisfying 0<A<1, and B is an integer greater than 0."

Also, the following definitions are made.

Transmission Scheme #1: signals of a single stream are transmitted using one or more antennas.

Transmission Scheme #2: precoding, phase changing, and power changing are performed.

Transmission Scheme #3: space-time block codes are used.

Suppose a situation in which the transmission device shown in FIG. 125 uses 16QAM shown in FIG. 119. In such a situation, when the transmission device in FIG. 125 uses Transmission Scheme #X, $k_1=k_{1,\#1}$ and $k_2=k_{2,\#1}$ are set with respect to FIG. 119, and when the transmission device uses Transmission Scheme #Y, $k_1=k_{1,\#2}$ and $k_2=k_{2,\#2}$ are set with respect to FIG. 119. In the above situation, the following condition should preferably be satisfied.

<Condition #H25>

$\{k_{1,\#1}\neq k_{1,\#2}$ or $k_{2,\#1}\neq k_{2,\#2}\}$ is satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $k_1$ and $k_2$.

Next, suppose a situation in which the transmission device shown in FIG. 125 uses 64QAM shown in FIG. 120. In such a situation, when the transmission device in FIG. 125 uses Transmission Scheme #X, $m_1=m_{1,\#1}$, $m_2=m_{2,\#1}$, $m_3=m_{3,\#1}$, $m_4=m_{4,\#1}$, $m_5=m_{5,\#1}$, $m_6=m_{6,\#1}$, $m_7=m_{7,\#1}$ and $m_8=m_{8,\#1}$ are set with respect to FIG. 120, and when the transmission device uses Transmission Scheme #Y, $m_1=m_{1,\#2}$, $m_2=m_{2,\#2}$, $m_3=m_{3,\#2}$, $m_4=m_{4,\#2}$, $m_5=m_{5,\#2}$, $m_6=m_{6,\#2}$, $m_7=m_{7,\#2}$ and $m_8=m_{8,\#2}$ are set with respect to FIG. 120. In the above situation, the following condition should preferably be satisfied.

<Condition #H26>

$\{\{\{m_{1,\#1}\neq m_{1,\#2}$, $m_{1,\#1}\neq m_{2,\#2}$, $m_{1,\#1}\neq m_{3,\#2}$, and $m_{1,\#1}\neq m_{4,\#2}\}$ or $\{m_{2,\#1}\neq m_{1,\#2}$, $m_{2,\#1}\neq m_{2,\#2}$, $m_{2,\#1}\neq m_{3,\#2}$, and $m_{2,\#1}\neq m_{4,\#2}\}$ or $\{m_{3,\#1}\neq m_{1,\#2}$, $m_{3,\#1}\neq m_{2,\#2}$, $m_{3,\#1}\neq m_{3,2}$, and $m_{3,\#1}\neq m_{4,\#2}\}$ or $\{m_{4,\#1}\neq m_{1,\#2}$, $m_{4,\#1}\neq m_{2,\#2}$, $m_{4,\#1}\neq m_{3,\#2}$, and $m_{4,\#1}\neq m_{4,\#2}\}$ holds true$\}$, or $\{\{m_{5,\#1}\neq m_{5,\#2}$, $m_{5,\#1}\neq m_{6,\#2}$, $m_{5,\#1}\neq m_{7,\#2}$, and $m_{5,\#1}\neq m_{8,\#2}\}$ or $\{m_{6,\#1}\neq m_{5,\#2}$, $m_{6,\#1}\neq m_{6,\#2}$, $m_{6,\#1}\neq m_{7,\#2}$, and $m_{6,\#1}\neq m_{8,\#2}\}$ or $\{m_{7,\#1}\neq m_{5,\#2}$, $m_{7,\#1}\neq m_{6,\#2}$, $m_{7,\#1}\neq m_{7,\#2}$, and $m_{7,\#1}\neq m_{8,\#2}\}$ or $\{m_{8,\#1}\neq m_{5,\#2}$, $m_{8,\#1}\neq m_{6,\#2}$, $m_{8,\#1}\neq m_{7,\#2}$, and $m_{8,\#1}\neq m_{8,\#2}\}$ holds true$\}\}$ is satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $m_1$, $m_2$, $m_3$, $m_4$, $m_5$, $m_6$, $m_7$, and $m_8$.

Next, suppose a situation in which the transmission device shown in FIG. 125 uses 256QAM shown in FIG. 121. In such a situation, when the transmission device in FIG. 125 uses Transmission Scheme #X, $n_1=n_{1,\#1}$, $n_2=n_{2,\#1}$, $n_3=n_{3,\#1}$, $n_4=n_{4,\#1}$, $n_5=n_{5,\#1}$, $n_6=n_{6,\#1}$, $n_7=n_{7,\#1}$, $n_8=n_{8,\#1}$, $n_9=n_{9,\#1}$, $n_{10}=n_{10,\#1}$, $n_{11}=n_{11,\#1}$, $n_{12}=n_{12,\#1}$, $n_{13}=n_{13,\#1}$, $n_{14}=n_{14,\#1}$, $n_{15}=n_{15,\#1}$ and $n_{16}=n_{16,\#1}$ are set with respect to FIG. 121, and when the transmission device uses Transmission Scheme #Y, $n_1=n_{1,\#2}$, $n_2=n_{2,\#2}$, $n_3=n_{3,\#2}$, $n_4=n_{4,\#2}$, $n_5=n_{5,\#2}$, $n_6=n_{6,\#2}$, $n_7=n_{7,\#2}$, $n_8=n_{8,\#2}$, $n_9=n_{9,\#2}$, $n_{10}=n_{10,\#2}$, $n_{11}=n_{11,\#2}$, $n_{12}=n_{12,\#2}$, $n_{13}=n_{13,\#2}$, $n_{14}=n_{14,\#2}$, $n_{15}=n_{15,\#2}$ and $n_{16}=n_{16,\#2}$ are set with respect to FIG. 121. In the above situation, the following condition should preferably be satisfied.

<Condition #H27>

$\{\{n_{1,\#}\neq n_{k,\#2}$ holds true for all k, where k is an integer greater than 0 and no greater than 8$\}$, or $\{n_{2,\#}\neq n_{k,\#2}$ holds true for all k, where k is an integer greater than 0 and no greater than 8$\}$, or $\{n_{3,\#}\neq n_{k,\#2}$ holds true for all k, where k is an integer greater than 0 and no greater than 8$\}$, or $\{n_{4,\#}\neq n_{k,\#2}$ holds true for all k, where k is an integer greater than 0 and no greater than 8$\}$, or $\{n_{5,\#}\neq n_{k,\#2}$ holds true for all k, where k is an integer greater than 0 and no greater than 8), or $\{n_{6,\#}\neq n_{k,\#2}$ holds true for all k, where k is an integer greater than 0 and no greater than 8$\}$, or $\{n_{7,\#}\neq n_{k,\#2}$ holds true for all k, where k is an integer greater than 0 and no greater than 8$\}$, or $\{n_{8,\#}\neq n_{k,\#2}$ holds true for all k, where k is an integer greater than 0 and no greater than 8$\}\}$ is satisfied, or $\{\{n_{9,\#}\neq n_{k,\#2}$ holds true for all k, where k is an integer greater than 8 and no greater than 16$\}$, or $\{n_{10,\#}\neq n_{k,\#2}$ holds true for all k, where k is an integer greater than 8 and no greater than 16$\}$, or $\{n_{10,\#}\neq n_{k,\#2}$ holds true for all k, where k is an integer greater than 8 and no greater than 16$\}$, or $\{n_{11,\#}\neq n_{k,\#2}$ holds true for all k, where k is an integer greater than 8 and no greater than 16), or $\{n_{12,\#}\neq n_{k,\#2}$ holds true for all k, where k is an integer greater than 8 and no greater than 16$\}$, or $\{n_{13,\#}\neq n_{k,\#2}$ holds true for all k, where k is an integer greater than 8 and no greater than 16$\}$, or $\{n_{14,\#1}\neq n_{k,\#2}$ holds true for all k, where k is an integer greater than 8 and no greater than 16$\}$, or $\{n_{15,\#1}\neq n_{k,\#2}$ holds true for all k, where k is an integer greater than 8 and no greater than 16$\}$, or $\{n_{16,\#1}\neq n_{k,\#2}$ holds true for all k, where k is an integer greater than 8 and no greater than 16$\}\}$ is satisfied.

However, note that (X, Y)=(1, 2), (1, 3), or (2, 3).

As a result, there is a higher probability that the reception device achieves good data reception quality both when Transmission Scheme #X is used and also when Transmission Scheme #Y is used. Note that Transmission Scheme #X and Transmission Scheme #Y differ in terms of an optimum set of $n_1$, $n_2$, $n_3$, $n_4$, $n_5$, $n_6$, $n_7$, $n_8$, $n_9$, $n_{10}$, $n_{11}$, $n_{12}$, $n_{13}$, $n_{14}$, $n_{15}$, and $n_{16}$.

Note that although detailed explanation of configuration is omitted for FIGS. 125 and 127, transmission and reception of modulated signals can be implemented in the same way even when the OFDM scheme or the spread spectrum communication scheme explained in other embodiments of the present Description is used in the transmission and reception of the modulated signals.

Also, when the transmission device performs modulation (mapping) and transmits a modulated signal as described above, the transmission device transmits control information such that a reception device can identify a modulation scheme and parameters of the modulation scheme, and thus the reception device shown in FIG. 127 can perform signal detection and demapping (demodulation) by acquiring the control information.

(Supplementary Explanation 7)

Of course, contents explained in different embodiments and supplementary explanations of the present Description may be implemented in combination with one another.

Also note that the embodiments and supplementary explanations are merely provided as examples. Thus, although examples are provided of modulation schemes, error correction encoding schemes (for example, error correction codes, code length, and coding rate), control information, and the like, implementation is still possible using the same configuration even if different "modulation schemes, error correction encoding schemes (for example, error correction code, code length, and coding rate), control information, and the like" are adopted.

In terms of modulation scheme, contents described in embodiments and supplementary explanations of the present Description can be implemented even when a modulation scheme is used which is not described in the present Description. For example, amplitude phase shift keying (APSK), such as 16APSK, 64APSK, 128APSK, 256APSK, 1024APSK, or 4096APSK, pulse amplitude modulation (PAM), such as 4PAM, 8PAM, 16PAM, 64PAM, 128PAM, 256PAM, 1024PAM, or 4096PAM, phase shift keying (PSK), such as BPSK, QPSK, 8PSK, 16PSK, 64PSK, 128PSK, 256PSK, 1024PSK, or 4096PSK, or quadrature amplitude modulation (QAM), such as 4QAM, 8QAM, 16QAM, 64QAM, 128QAM, 256QAM, 1024QAM, or 4096QAM, may be used. Also, in each of the aforementioned modulation schemes, uniform mapping or non-uniform mapping may be used.

Also, a constellation of signal points in the I (in-phase)-Q (quadrature(-phase)) plane, such as of 2, 4, 8, 16, 64, 128, 256, or 1024 signal points (i.e., for a modulation scheme having 2, 4, 8, 16, 64, 128, 256, or 1024 signal points), may be switched in accordance with time, frequency, or both time and frequency.

In the present Description, explanation is given for a configuration (for example, as shown in FIGS. 5, 6, 7, 97, and 98) in which processing such as power changing, precoding (weighting), phase changing, and power changing is performed with respect to a modulated signal s1, which is modulated in accordance with a first modulation scheme, and a modulated signal s2, which is modulated in accordance with a second modulation scheme. Note that in implementation of embodiments described in the present Description, processing explained below may be performed instead of the aforementioned processing. The following explains the alternative processing scheme.

Figure 129:
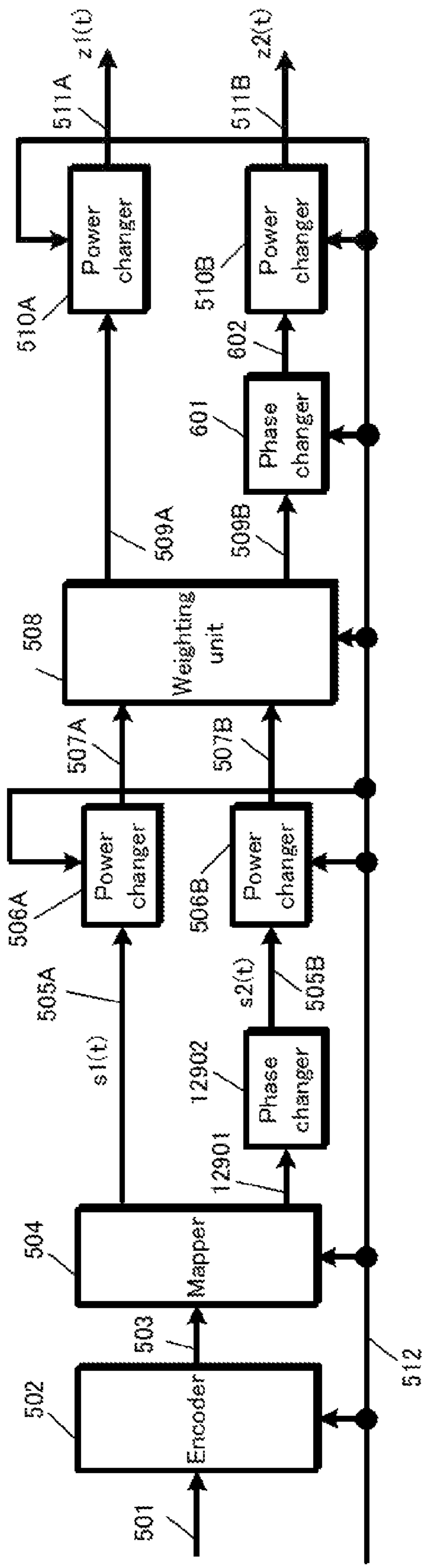
Figure 130:
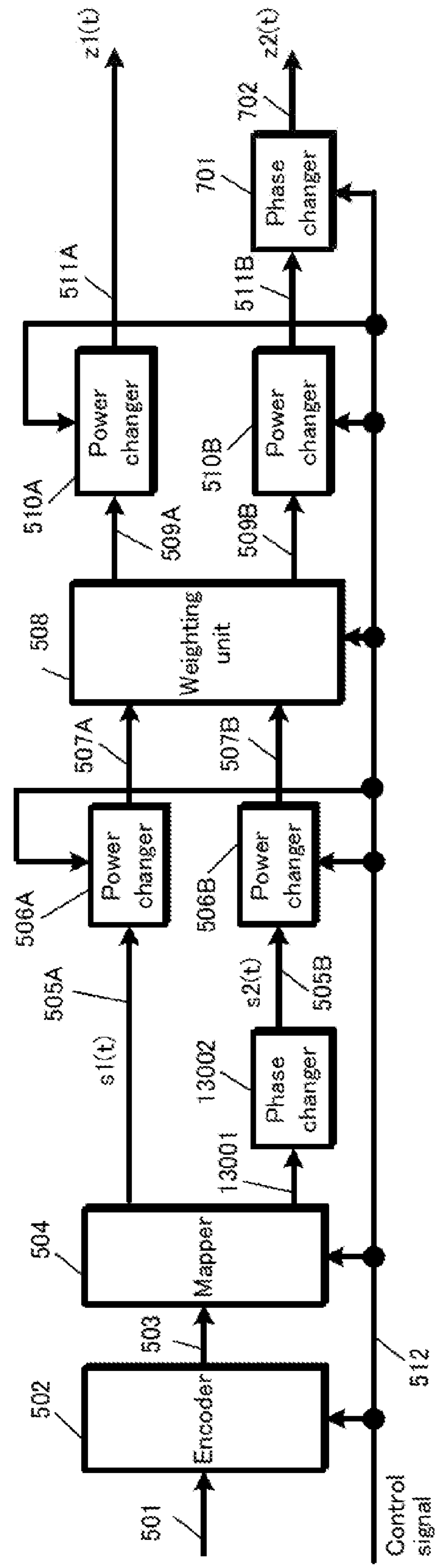

FIGS. 129 and 130 illustrate modified examples of the configuration explained in the present Description in which "processing such as power changing, precoding (weighting), phase changing, and power changing is performed with respect to a modulated signal s1, which is modulated in accordance with a first modulation scheme, and a modulated signal s2, which is modulated in accordance with a second modulation scheme".

FIGS. 129 and 130 each illustrate a configuration in which a phase changer is added prior to weighting (precoding). Note that elements that operate in the same way as elements shown in FIGS. 5, 6, and 7 are labeled using the same reference signs and detailed explanation of operation thereof is omitted.

A phase changer 12902 shown in FIG. 129 performs phase changing on a modulated signal 12901 output from a mapper 504 such that phase thereof differs from phase of a modulated signal 505A, and thereby outputs a phase changed modulated signal s2($t$) (505B) to a power changer 506B.

A phase changer 13002 shown in FIG. 130 performs phase changing on a modulated signal 13001 output from a mapper 504 such that phase thereof differs from phase of a modulated signal 505A, and thereby outputs a phase changed modulated signal s2($t$) (505B) to a power changer 506B.

Figure 131:
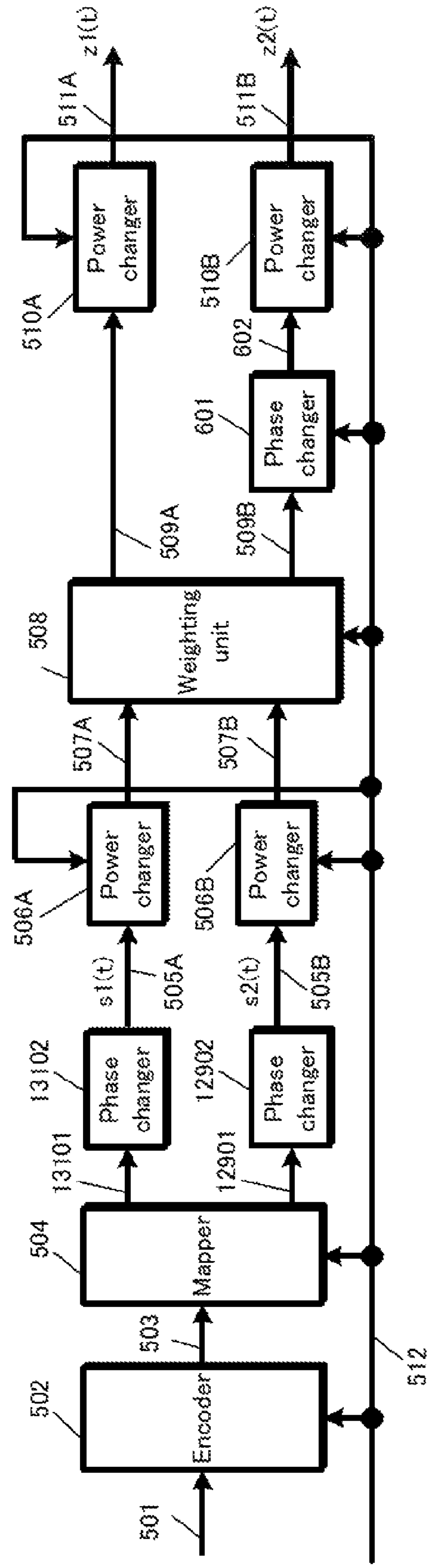

FIG. 131 is a modified example of configuration of the transmission device shown in FIG. 129. FIG. 132 is a modified example of configuration of the transmission device shown in FIG. 130.

In contrast to a phase changer 12902 shown in FIG. 131 which performs first phase changing, a phase changer 13102 shown in FIG. 131 performs second phase changing on a modulated signal 13101 output from a mapper 504, and thereby outputs a phase changed modulated signal s1($t$) (505A) to a power changer 506A.

In contrast to a phase changer 13002 shown in FIG. 132 which performs first phase changing, a phase changer 13202 shown in FIG. 132 performs second phase changing on a modulated signal 13201 output from a mapper 504, and thereby outputs a phase changed modulated signal s1($t$) (505A) to a power changer 506A.

As shown by FIGS. 131 and 132, phase changing may alternatively be performed on both modulated signals output from the mapper, instead of being performed on just one of the modulated signals.

Note that phase changing performed by each phase changer (i.e., phase changers 12902, 13002, 13102, and 13202) can be expressed using the following equation.

$$\begin{pmatrix} I' \\ Q' \end{pmatrix} = \begin{pmatrix} \cos(\lambda(i)) & -\sin(\lambda(i)) \\ \sin(\lambda(i)) & \cos(\lambda(i)) \end{pmatrix} \begin{pmatrix} I \\ Q \end{pmatrix} \quad \text{[Math. 374]}$$

In the above equation λ(i) is a function of i (for example, time, frequency, or slot) representing phase, I and Q respectively represent an in-phase component I and a quadrature component Q of an input signal, and I' and Q' respectively represent an in-phase component I' and a quadrature component Q' of a signal output from the phase changer (i.e., phase changer 12902, 13002, 13102, or 13202).

Of course, a reception device that receives modulated signals transmitted using the transmission device shown in FIG. 129, 130, 131, or 132, performs signal processing corresponding to the signal processing described above, and thereby, for example, calculates a log-likelihood ratio of each bit included in the modulated signal.

Also, a constellation of signal points in the I (in-phase)-Q (quadrature(-phase)) plane, such as of 2, 4, 8, 16, 64, 128, 256, or 1024 signal points (i.e., for a modulation scheme having 2, 4, 8, 16, 64, 128, 256, or 1024 signal points), is not limited to signal point constellations of modulation schemes described in the present Description. Thus, a function of outputting an in-phase component and a quadrature component based on a plurality of bits is a function of the mapper, and subsequent performance of precoding and phase changing is one effective function of the present invention.

In the present embodiments explanation is given for a configuration in which precoding weight and phase are changed in the time domain but, as explained in Embodiment 1, the present embodiments may be implemented in the same way when a multi-carrier transmission scheme such as OFDM transmission is used. In particular, when a precoding switching scheme is only changed in accordance with number of transmission signals, the reception device can identify a precoding weight and phase switching scheme by acquiring information indicating the number of transmission signals that are transmitted from the transmission device.

A transmission device described in the present Description may for example be included in communication or broadcasting equipment such as a broadcasting station, a base station, an access point, a terminal, or a mobile phone. In such a situation, a reception device is included in communication equipment such as a television, a radio, a terminal, a personal computer, a mobile phone, an access point, or a base station. A transmission device or reception device relating to the present invention is equipment having a communication function and such equipment may for example be connected, through an interface, to a device capable of executing an application program such as a television, a radio, a personal computer, or a mobile phone.

Also, in the present embodiments, symbols other than data symbols, such as a pilot symbol (for example, a preamble, unique word, postamble, or reference symbol) or a control information symbol, may be arranged freely in a frame. Note that although the above refers to a pilot symbol and a control information symbol, such symbols may be referred to by different names and it is the respective functions thereof that is important.

In transmission-reception equipment, the pilot symbol should for example be a known symbol which is modulated using PSK modulation (alternatively, reception equipment may be able to identify a symbol transmitted from transmission equipment through synchronization of the reception equipment), and the reception equipment performs frequency synchronization, time synchronization, channel estimation (estimation of channel state information (CSI)) for each modulated signal, signal detection, and the like, using the aforementioned symbol.

The control information symbol is a symbol which is for implementing communications other than of data, such as of an application program, and which is for transferring information such as modulation scheme and error correction encoding scheme used in communication, coding rate of the error correction encoding scheme, and setting information for an upper layer, which is information that it is necessary to transmit to a communication partner.

The present invention is of course not limited to the embodiments, and various modifications from the embodiments may be made when implementing the present invention. For example, each of the embodiments is explained for implementation as a communication device, but implementation may alternatively be as a communication method performed as software.

Explanation is given above for a precoding switching scheme for a configuration in which two modulated signals are transmitted from two antennas, but the above is not a limitation. Alternatively, the precoding switching scheme may be implemented in the same way, by changing precoding weight (matrix) in the same way, for a configuration in which four modulated signals, generated by performing precoding on four mapped signals, are transmitted from four antennas, or likewise in a configuration in which N modulated signals, generated by performing precoding on N mapped signals, are transmitted from N antennas.

The present Description uses terms such as precoding and precoding weight, but alternatively different terms may be used and it is the signal processing itself that is important in implementation of the present invention.

Note that streams $s1(t)$ and $s2(t)$ may be used to transmit different data or alternatively may be used to transmit the same data.

Also, although a transmit antenna of the transmission device and a receive antenna of the reception device are each shown in the drawings as a single antenna, each may alternatively be formed by a plurality of antennas.

It is necessary for the transmission device to notify the reception device of the transmission scheme (for example, MIMO, SISO, space-time block coding, or interleaving scheme), the modulation scheme, and the error correction encoding scheme, although description of the above is omitted in some of the embodiments. The reception device acquires the above information from a frame transmitted by the transmission device, and the reception device changes its own operation in accordance with the acquired information.

Embodiments 1 to 11 explain a bit adjustment scheme and Embodiment 12 explains a situation in which the bit length adjustment scheme, explained in Embodiments 1 to 11, is applied to DVB standards. In Embodiments 1 to 12, the bit length adjustment scheme used by the transmission device is explained with reference to FIGS. 57, 60, 73, 78, 79, 80, 83, 91, and 93, and operation of the reception device is explained with reference to FIGS. 85, 87, 88, and 96. Also, in Embodiments 1 to 12, the MIMO transmission scheme (for example, using precoding (weighting), power changing, and phase changing) is explained with reference to FIGS. 5, 6, 7, 97, and 98.

After processing for bit length adjustment explained in Embodiments 1 to 12 has been performed, instead of using, as the transmission scheme, the MIMO transmission scheme (for example using precoding (weighting), power changing, and phase changing) explained with reference to FIGS. 5, 6, 7, 97, and 98, Embodiments 1 to 12 may alternatively be implemented using the space-time block codes explained with reference to FIG. 128, or space-frequency block codes in which symbols are arranged in the frequency domain. Note that above-described scheme may alternatively be referred to as a MISO transmission scheme or a diversity scheme. In other words, a bit sequence (digital signal) on which bit length adjustment has been performed through a configuration shown in FIG. 57, 60, 73, 78, 79, 80, 83, 91, or 93 corresponds to 1201 shown in FIG. 128, and mapping and MISO processing are subsequently performed as shown in FIG. 128.

Note that a scheme using space-time block codes or space-frequency block codes in which symbols are arranged in the frequency domain (such a scheme may also be referred to as a MISO transmission scheme or a diversity scheme) is not limited to transmission as shown in FIG. 128, and may alternatively be used for transmission as shown in FIG. 133. The following explains FIG. 133. Note that elements shown in FIG. 133 operate in the same way as elements in FIG. 128 and are thus labeled using the same reference signs.

A mapper 12802 receives a data signal (error correction encoded data) 12801 and a control signal 12806 as inputs, performs mapping in accordance with information relating to the modulation scheme in the control signal 12806, and thereby outputs a mapped signal 12803. For example, the mapped signal 12803 may be arranged in an order $s0, s1, s2, s3, \ldots, s(2i), s(2i+1), \ldots$, where i is a non-negative integer.

A MISO processing unit 12804 receives the mapped signal 12803 and the control signal 12806 as inputs, and when the control signal 12806 instructs transmission using a MISO scheme, the MISO processing unit 12804 performs MISO processing, and thereby outputs MISO processed signals 12805A and 12805B. For example, the MISO processed signal 12805A may be $s0, -s1^*, s2, -s3^*, \ldots, s(2i), -s(2i+1)^*, \ldots$, and the MISO processed signal 12805B may be $s1, s0^*, s3, s2^*, \ldots, s(2i+1), s(2i)^*, \ldots$, where the symbol "*" signifies a complex conjugate.

In the above situation, the MISO processed signals 12805A and 12805B respectively correspond to the processed baseband signals 12502A and 12502B in FIG. 125. Note that a scheme using space-time block codes is not limited to the scheme described above. The wireless unit 12503A receives the processed baseband signal 12502A, a control information symbol signal 12208, a pilot symbol signal 12209, and a frame structure signal 12210 as inputs, and outputs a transmission signal 12504A in accordance with the frame structure signal 12210. An antenna #1 (12505A) outputs the transmission signal 12504A as a radio wave.

The wireless unit 12503B receives the processed baseband signal 12502B, the control information symbol signal 12208, the pilot symbol signal 12209, and the frame structure signal 12210 as inputs, and outputs a transmission signal 12504B in accordance with the frame structure signal 12210. An antenna #2 (12505B) outputs the transmission signal 12504B as a radio wave.

Embodiments 1 to 11 explain a bit adjustment scheme and Embodiment 12 explains a situation in which the bit length adjustment scheme, explained in Embodiments 1 to 11, is applied to DVB standards. In Embodiments 1 to 12, the bit length adjustment scheme used by the transmission device is explained with reference to FIGS. 57, 60, 73, 78, 79, 80, 83, 91, and 93, and operation of the reception device is explained with reference to FIGS. 85, 87, 88, and 96. Also, in Embodiments 1 to 12, the MIMO transmission scheme (for example, using precoding (weighting), power changing, and phase changing) is explained with reference to FIGS. 5, 6, 7, 97, and 98.

After processing for bit length adjustment explained in Embodiments 1 to 12 has been performed, instead of using, as the transmission scheme, the MIMO transmission scheme (for example, using precoding (weighting), power changing, and phase changing) explained with reference to FIGS. 5, 6, 7, 97, and 98, Embodiments 1 to 12 may alternatively be implemented for transmission of a single stream.

In other words, a bit sequence (digital signal) on which bit length adjustment has been performed through a configuration shown in FIG. 57, 60, 73, 78, 79, 80, 83, 91, or 93 corresponds to a bit sequence 503 shown in FIG. 5, 6, or 7, or a bit sequence 9701 shown in FIG. 97 or 98, and is input into the mapper 504 shown in FIG. 5, 6, or 7, or the mapper 9702 shown in FIG. 97 or 98.

In such a situation, a modulation scheme α for s1(*t*) is a modulation scheme for transmitting x-bit data, whereas data is not transmitted by s2(*t*) (unmodulated transmission of y=0 bit of data). Thus, in the above situation, x+y recited in the present Description is equivalent to x+0, and thus x+y is equivalent to x (i.e., x+y=x+0=x). If the relationship "x+y=x+0=x" is implemented in Embodiments 1 to 12, Embodiments 1 to 12 can also be implemented for a transmission of a single stream.

(Supplementary Explanation 8)

Note that although a matrix F for weighting (precoding) is described in the present Description, embodiments in the present Description can also be implemented using a precoding matrix F (or F(i)) such as:

[Math. 375]

$$F = \begin{pmatrix} \beta \times e^{j0} & \beta \times \alpha \times e^{j0} \\ \beta \times \alpha \times e^{j0} & \beta \times e^{j\pi} \end{pmatrix} \quad \text{(H10)}$$

or

-continued

[Math. 376]

$$F = \frac{1}{\sqrt{\alpha^2+1}} \begin{pmatrix} e^{j0} & \alpha \times e^{j0} \\ \alpha \times e^{j0} & e^{j\pi} \end{pmatrix} \quad \text{(H11)}$$

or

[Math. 377]

$$F = \begin{pmatrix} \beta \times e^{j0} & \beta \times \alpha \times e^{j\pi} \\ \beta \times \alpha \times e^{j0} & \beta \times e^{j0} \end{pmatrix} \quad \text{(H12)}$$

or

[Math. 378]

$$F = \frac{1}{\sqrt{\alpha^2+1}} \begin{pmatrix} e^{j0} & \alpha \times e^{j\pi} \\ \alpha \times e^{j0} & e^{j0} \end{pmatrix} \quad \text{(H13)}$$

or

[Math. 379]

$$F = \begin{pmatrix} \beta \times \alpha \times e^{j0} & \beta \times e^{j\pi} \\ \beta \times e^{j0} & \beta \times \alpha \times e^{j0} \end{pmatrix} \quad \text{(H14)}$$

or

[Math. 380]

$$F = \frac{1}{\sqrt{\alpha^2+1}} \begin{pmatrix} \alpha \times e^{j0} & e^{j\pi} \\ e^{j0} & \alpha \times e^{j0} \end{pmatrix} \quad \text{(H15)}$$

or

[Math. 381]

$$F = \begin{pmatrix} \beta \times \alpha \times e^{j0} & \beta \times e^{j0} \\ \beta \times e^{j0} & \beta \times \alpha \times e^{j\pi} \end{pmatrix} \quad \text{(H16)}$$

or

[Math. 382]

$$F = \frac{1}{\sqrt{\alpha^2+1}} \begin{pmatrix} \alpha \times e^{j0} & e^{j0} \\ e^{j0} & \alpha \times e^{j\pi} \end{pmatrix} \quad \text{(H17)}$$

(note that in equations H10, H11, H12, H13, H14, H15, H16, and H17, α may be a real number or an imaginary number, and β may be a real number or an imaginary number, however, α is not equal to zero (0), and β is not equal to zero (0))

or

[Math. 383]

$$F = \begin{pmatrix} \beta \times \cos\theta & \beta \times \sin\theta \\ \beta \times \sin\theta & -\beta \times \cos\theta \end{pmatrix} \quad \text{(H18)}$$

or

[Math. 384]

$$F = \begin{pmatrix} \cos\theta & \sin\theta \\ \sin\theta & -\cos\theta \end{pmatrix} \quad \text{(H19)}$$

or

-continued

[Math. 385]

$$F=\begin{pmatrix}\beta\times\cos\theta & -\beta\times\sin\theta\\ \beta\times\sin\theta & \beta\times\cos\theta\end{pmatrix}\tag{H20}$$

or

[Math. 386]

$$F=\begin{pmatrix}\cos\theta & -\sin\theta\\ \sin\theta & \cos\theta\end{pmatrix}\tag{H21}$$

or

[Math. 387]

$$F=\begin{pmatrix}\beta\times\sin\theta & -\beta\times\cos\theta\\ \beta\times\cos\theta & \beta\times\sin\theta\end{pmatrix}\tag{H22}$$

or

[Math. 388]

$$F=\begin{pmatrix}\sin\theta & -\cos\theta\\ \cos\theta & \sin\theta\end{pmatrix}\tag{H23}$$

or

[Math. 389]

$$F=\begin{pmatrix}\beta\times\sin\theta & \beta\times\cos\theta\\ \beta\times\cos\theta & -\beta\times\sin\theta\end{pmatrix}\tag{H24}$$

or

[Math. 390]

$$F=\begin{pmatrix}\sin\theta & \cos\theta\\ \cos\theta & -\sin\theta\end{pmatrix}\tag{H25}$$

(note that in equations H18, H20, H22, and H24, β may be a real number or an imaginary number; however, β is not equal to zero (0)), or

[Math. 391]

$$F(i)=\begin{pmatrix}\beta\times e^{j\theta_{11}(i)} & \beta\times\alpha\times e^{j(\theta_{11}(i)+\lambda)}\\ \beta\times\alpha\times e^{j\theta_{21}(i)} & \beta\times e^{j(\theta_{21}(i)+\lambda+\pi)}\end{pmatrix}\tag{H26}$$

or

[Math. 392]

$$F(i)=\frac{1}{\sqrt{\alpha^2+1}}\begin{pmatrix}e^{j\theta_{11}(i)} & \alpha\times e^{j(\theta_{11}(i)+\lambda)}\\ \alpha\times e^{j\theta_{21}(i)} & e^{j(\theta_{21}(i)+\lambda+\pi)}\end{pmatrix}\tag{H27}$$

or

[Math. 393]

$$F(i)=\begin{pmatrix}\beta\times\alpha\times e^{j\theta_{21}(i)} & \beta\times e^{j(\theta_{21}(i)+\lambda+\pi)}\\ \beta\times e^{j\theta_{11}(i)} & \beta\times\alpha\times e^{j(\theta_{11}(i)+\lambda)}\end{pmatrix}\tag{H28}$$

or

[Math. 394]

$$F(i)=\frac{1}{\sqrt{\alpha^2+1}}\begin{pmatrix}\alpha\times e^{j\theta_{21}(i)} & e^{j(\theta_{21}(i)+\lambda+\pi)}\\ e^{j\theta_{11}(i)} & \alpha\times e^{j(\theta_{11}(i)+\lambda)}\end{pmatrix}\tag{H29}$$

or

[Math. 395]

$$F(i)=\begin{pmatrix}\beta\times e^{j\theta_{11}} & \beta\times\alpha\times e^{j(\theta_{11}+\lambda(i))}\\ \beta\times\alpha\times e^{j\theta_{21}} & \beta\times e^{j(\theta_{21}+\lambda(i)+\pi)}\end{pmatrix}\tag{H30}$$

or

[Math. 396]

$$F(i)=\frac{1}{\sqrt{\alpha^2+1}}\begin{pmatrix}e^{j\theta_{11}} & \alpha\times e^{j(\theta_{11}+\lambda(i))}\\ \alpha\times e^{j\theta_{21}} & e^{j(\theta_{21}+\lambda(i)+\pi)}\end{pmatrix}\tag{H31}$$

or

[Math. 397]

$$F(i)=\begin{pmatrix}\beta\times\alpha\times e^{j\theta_{21}} & \beta\times e^{j(\theta_{21}+\lambda(i)+\pi)}\\ \beta\times e^{j\theta_{11}} & \beta\times\alpha\times e^{j(\theta_{11}+\lambda(i))}\end{pmatrix}\tag{H32}$$

or

[Math. 398]

$$F(i)=\frac{1}{\sqrt{\alpha^2+1}}\begin{pmatrix}\alpha\times e^{j\theta_{21}} & e^{j(\theta_{21}+\lambda(i)+\pi)}\\ e^{j\theta_{11}} & \alpha\times e^{j(\theta_{11}+\lambda(i))}\end{pmatrix}\tag{H33}$$

or

[Math. 399]

$$F=\begin{pmatrix}\beta\times e^{j\theta_{11}} & \beta\times\alpha\times e^{j(\theta_{11}+\lambda)}\\ \beta\times\alpha\times e^{j\theta_{21}} & \beta\times e^{j(\theta_{21}+\lambda+\pi)}\end{pmatrix}\tag{H34}$$

or

[Math. 400]

$$F=\frac{1}{\sqrt{\alpha^2+1}}\begin{pmatrix}e^{j\theta_{11}} & \alpha\times e^{j(\theta_{11}+\lambda)}\\ \alpha\times e^{j\theta_{21}} & e^{j(\theta_{21}+\lambda+\pi)}\end{pmatrix}\tag{H35}$$

or

[Math. 401]

$$F=\begin{pmatrix}\beta\times\alpha\times e^{j\theta_{21}} & \beta\times e^{j(\theta_{21}+\lambda+\pi)}\\ \beta\times e^{j\theta_{11}} & \beta\times\alpha\times e^{j(\theta_{11}+\lambda)}\end{pmatrix}\tag{H36}$$

or

[Math. 402]

$$F=\frac{1}{\sqrt{\alpha^2+1}}\begin{pmatrix}\alpha\times e^{j\theta_{21}} & e^{j(\theta_{21}+\lambda+\pi)}\\ e^{j\theta_{11}} & \alpha\times e^{j(\theta_{11}+\lambda)}\end{pmatrix}\tag{H37}$$

Note that $\theta_{11}(i)$, $\theta_{21}(i)$, and $\lambda(i)$ are functions of i (i.e., time or frequency), and λ is a fixed value. Also, α may be a real number or an imaginary number, and β may be a real number or an imaginary number. However, α is not equal to zero (0) and β is not equal to zero (0).

Also note that embodiments in the present Description may also be implemented using a different precoding matrix to the precoding matrices listed above.

The present invention is widely applicable in wireless systems for transmission of a plurality of different modulated signals from a plurality of antennas. The present invention is also applicable when performing MIMO transmission in a wired communication system having a plurality of transmission locations (for example, a power line communication (PLC) system, an optical communication system, or a digital subscriber line (DSL) system).

INDUSTRIAL APPLICABILITY

The present invention is widely applicable to a wireless system for transmitting a different modulated signal from each of a plurality of antennas. The present invention is also applicable to a wired communication system having a plurality of transmission originations in the case where MIMO transmission is performed, such as a PLC (Power Line Communication) system), an optical communication system, and a DSL (Digital Subscriber Line) system.

REFERENCE SIGNS LIST

502, 502LA encoder
502BI bit interleaver
5701, 6001, 7301, and 8001 bit length adjuster
504 mapper

The invention claimed is:

1. A transmission signal generation device, comprising:
an encoder configured to generate a first bit sequence that is an N-bit codeword from a K-bit information bit sequence, where K and N are each an integer greater than or equal to 1;
a bit adjuster configured to (i) judge whether or not to add a known bit sequence to the first bit sequence, and (ii) when judging negatively, output the first bit sequence, and when judging affirmatively, output a second bit sequence that is obtained by adding the known bit sequence to the first bit sequence; and
a mapper configured to modulate the first bit sequence of N bits or the second bit sequence using a modulation scheme selected from among a plurality of modulation schemes, wherein
a modulation symbol of the selected modulation scheme has X bits, where X is an integer greater than or equal to 1,
when N is an integral multiple of X, the bit adjuster does not add the known bit, and
when N is not the integral multiple of X, the bit adjuster adds the known bit of α×X−N bits to the first bit sequence, where α and α×X−N are each an integer greater than or equal to 1.

2. The transmission signal generation device of claim 1, wherein
the modulation schemes includes any of 16QAM, 64QAM, 128APSK, and 256QAM.

3. A transmission signal generation scheme comprising the steps of:
generating a first bit sequence that is an N-bit codeword from a K-bit information bit sequence, where K and N are each an integer greater than or equal to 1;
judging whether or not to add a known bit sequence to the first bit sequence, and when judging negatively, outputting the first bit sequence, and when judging affirmatively, outputting a second bit sequence that is obtained by adding the known bit sequence to the first bit sequence; and
modulating the first bit sequence of N bits or the second bit sequence using a modulation scheme selected from among a plurality of modulation schemes, wherein
a modulation symbol of the selected modulation scheme has X bits, where X is an integer greater than or equal to 1,
when N is an integral multiple of X, the known bit is not added, and
when N is not the integral multiple of X, the known bit of α×X−N bits is added to the first bit sequence, where α and α×X−N are each an integer greater than or equal to 1.

4. The transmission signal generation scheme of claim 3, wherein
the modulation schemes includes any of 16QAM, 64QAM, 128APSK, and 256QAM.

5. A reception signal generation device comprising:
a demodulator configured to demodulate a reception signal and output a first bit sequence or a second bit sequence including a known bit;
a bit adjuster configured, when the demodulator outputs the second bit sequence, to output a third bit sequence that is obtained by removing the known bit from the second bit sequence; and
a decoder configured to decode the first bit sequence or the third bit sequence, wherein
the first bit sequence is an N-bit codeword that is generated from a K-bit information bit sequence, where K and N are each an integer greater than or equal to 1,
the second bit sequence is a bit sequence that is obtained by adding the known bit sequence to the first bit sequence,
the reception signal is a signal obtained by modulating the first bit sequence of N bits or the second bit sequence using a modulation scheme selected from among a plurality of modulation schemes,
a modulation symbol of the selected modulation scheme has X bits, where X is an integer greater than or equal to 1, and
when N is not an integral multiple of X, the known bit of α×X−N bits is added to the first bit sequence, where α and α×X−N are each an integer greater than or equal to 1.

6. The reception signal generation device of claim 5, wherein
the modulation schemes includes any of 16QAM, 64QAM, 128APSK, and 256QAM.

7. A reception signal generation scheme comprising the steps of:
demodulating a reception signal and outputting a first bit sequence or a second bit sequence including a known bit;
outputting, when the second bit sequence is output, a third bit sequence that is obtained by removing the known bit from the second bit sequence; and
decoding the first bit sequence or the third bit sequence, wherein
the first bit sequence is an N-bit codeword that is generated from a K-bit information bit sequence, where K and N are each an integer greater than or equal to 1,
the second bit sequence is a bit sequence that is obtained by adding the known bit sequence to the first bit sequence,
the reception signal is a signal obtained by modulating the first bit sequence of N bits or the second bit sequence using a modulation scheme selected from among a plurality of modulation schemes,
a modulation symbol of the selected modulation scheme has X bits, where X is an integer greater than or equal to 1, and
when N is not an integral multiple of X, the known bit of α×X−N bits is added to the first bit sequence, where α and α×X−N are each an integer greater than or equal to 1.

8. The reception signal generation scheme of claim 7, wherein the modulation schemes includes any of 16QAM, 64QAM, 128APSK, and 256QAM.

* * * * *